US010644251B2

(12) United States Patent
Xia et al.

(10) Patent No.: US 10,644,251 B2
(45) Date of Patent: May 5, 2020

(54) ORGANIC ELECTROLUMINESCENT MATERIALS AND DEVICES

(71) Applicant: Universal Display Corporation, Ewing, NJ (US)

(72) Inventors: Chuanjun Xia, Lawrenceville, NJ (US); Chun Lin, Yardley, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 718 days.

(21) Appl. No.: 14/096,458

(22) Filed: Dec. 4, 2013

(65) Prior Publication Data

US 2015/0155501 A1 Jun. 4, 2015

(51) Int. Cl.

*H01L 51/00* (2006.01)
*C07F 13/00* (2006.01)
*H01L 51/50* (2006.01)

(52) U.S. Cl.

CPC .......... *H01L 51/0084* (2013.01); *C07F 13/00* (2013.01); *H01L 51/5016* (2013.01); *H01L 51/5024* (2013.01)

(58) Field of Classification Search

CPC .................................................. H01L 51/0084
See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0118866 | A1* | 6/2003 | Oh ...................... H01L 51/0058 428/690 |
| 2003/0138657 | A1 | 7/2003 | Li et al. |
| 2003/0151042 | A1 | 8/2003 | Marks et al. |
| 2003/0152802 | A1 | 8/2003 | Tsuboyama et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1* | 11/2005 | Walters .................. C09K 11/06 428/690 |
| 2006/0008670 | A1 | 1/2006 | Lin et al. |

(Continued)

FOREIGN PATENT DOCUMENTS

| | | | |
|---|---|---|---|
| EP | 0650955 | | 5/1995 |
| EP | 0674176 | A1 | 9/1995 |

(Continued)

OTHER PUBLICATIONS

Helberg, Lisa E. et al, "Coordination Chemistry of Low-Valent Rhenium Polypyridyl Complexes: Synthesis, Reactivity, and Eletrochemistry," Inorg. Chem. 1996, 35, 5584-5594.

Lee, Po-I et al., Phosphorescent polymer light-emitting diodes based on an end-capped polyfluorene with Rhenium (I) chromophores, Synthetic Metals, 156, 2006, 907-910.

Li, Xiao et al., "Very high-efficiency organic light-emitting diodes based on cyclometallated rhenium (I) complex," Applied Physics Letters, 92, 083302 (2008).

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

(Continued)

*Primary Examiner* — Austin Murata

(74) *Attorney, Agent, or Firm* — Duane Morris LLP

(57) ABSTRACT

A novel compound having a formula $Re(L_A)(L_B)$, wherein Re is a Rhenium(I) metal, wherein $L_A$ is a monoanionic tridentate ligand, wherein $L_B$ is a neutral tridentate ligand, and wherein $L_A$ and $L_B$ are optionally linked together to form a hexadentate ligand is disclosed.

20 Claims, 2 Drawing Sheets

(56) References Cited

U.S. PATENT DOCUMENTS

2006/0099450 A1* 5/2006 Ogasawara ............... B32B 7/02 428/690
2006/0182992 A1* 8/2006 Nii ........................ C07C 251/24 428/690
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1* 12/2006 Kwong ................... C07C 13/62 428/690
2007/0141397 A1* 6/2007 Watanabe ............ C07D 213/81 428/690
2007/0190359 A1 8/2007 Knowles et al.
2007/0278938 A1 12/2007 Yabunouchi et al.
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.
2008/0220265 A1 9/2008 Xia et al.
2008/0297033 A1 12/2008 Knowles et al.
2009/0008605 A1 1/2009 Kawamura et al.
2009/0009065 A1 1/2009 Nishimura et al.
2009/0017330 A1 1/2009 Iwakuma et al.
2009/0030202 A1 1/2009 Iwakuma et al.
2009/0039776 A1 2/2009 Yamada et al.
2009/0045730 A1 2/2009 Nishimura et al.
2009/0045731 A1 2/2009 Nishimura et al.
2009/0101870 A1 4/2009 Pakash et al.
2009/0108737 A1 4/2009 Kwong et al.
2009/0115316 A1 5/2009 Zheng et al.
2009/0165846 A1 7/2009 Johannes et al.
2009/0167162 A1 7/2009 Lin et al.
2009/0179554 A1 7/2009 Kuma et al.
2010/0237334 A1* 9/2010 Ma ....................... C07D 307/91 257/40
2012/0215000 A1* 8/2012 Tsai ....................... H05B 33/14 546/4

FOREIGN PATENT DOCUMENTS

EP 1725079 11/2006
EP 2034538 3/2009
JP 200511610 1/2005
JP 2007123392 5/2007
JP 2007254297 10/2007
JP 2008074939 4/2008
WO 2001039234 5/2001
WO 2002002714 1/2002
WO 200215645 2/2002
WO 2003040257 5/2003
WO 2003060956 7/2003
WO 2004093207 10/2004
WO 2004107822 12/2004
WO 2005014551 2/2005
WO 2005019373 3/2005
WO 2005030900 4/2005
WO 2005089025 9/2005
WO 2005123873 12/2005
WO 2006009024 1/2006
WO 2006056418 6/2006
WO 2006072002 7/2006
WO 2006082742 8/2006
WO 2006098120 9/2006
WO 2006100298 9/2006
WO 2006103874 10/2006
WO 2006114966 11/2006
WO 2006132173 12/2006
WO 2007002683 1/2007
WO 2007004380 1/2007
WO 2007063754 6/2007
WO 2007063796 6/2007
WO 2008056746 5/2008
WO 2008101842 8/2008
WO 2008132085 11/2008
WO 2009000673 12/2008
WO 2009003898 1/2009
WO 2009008311 1/2009
WO 2009018009 2/2009
WO 2009050290 4/2009
WO 2009021126 5/2009
WO 2009062578 5/2009
WO 2009063833 5/2009
WO 2009066778 5/2009
WO 2009066779 5/2009
WO 2009086028 7/2009
WO 2009100991 8/2009

OTHER PUBLICATIONS

Adachi, Chihaya et al., "High-Efficiency Red Electrophosphorescence Devices," Appl. Phys. Lett., 78(11)1622-1624 (2001).
Aonuma, Masaki et al., "Material Design of Hole Transport Materials Capable of Thick-Film Formation in Organic Light Emitting Diodes," Appl. Phys. Lett., 90:183503-1-183503-3.
Baldo et al., Highly Efficient Phosphorescent Emission from Organic Electroluminescent Devices, Nature, vol. 395, 151-154, (1998).
Baldo et al., Very high-efficiency green organic light-emitting devices based on electrophosphorescence, Appl. Phys. Lett., vol. 75, No. 3, 4-6 (1999).
Gao, Zhiqiang et al., "Bright-Blue Electroluminescence From a Silyl-Substituted ter-(phenylene-vinylene) derivative," Appl. Phys. Lett., 74(6): 865-867 (1999).
Guo, Tzung-Fang et al., "Highly Efficient Electrophosphorescent Polymer Light-Emitting Devices," Organic Electronics, 115-20 (2000).
Hamada, Yuji et al., "High Luminance in Organic Electroluminescent Devices with Bis(10-hydroxybenzo[h]quinolinato) beryllium as an Emitter, " Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivates," Adv. Mater, 19:739-743 (2007).
Huang, Wei-Sheng et al., "Highly Phosphorescent Bis-Cyclometalated Iridium Complexes Containing Benzoimidazole-Based Ligands," Chem. Mater, 16(12):2480-2488 (2004).
Hung, L.S. et al., "Anode Modification in Organic Light-Emitting Diodes by Low-Frequency Plasma Polymerization of CHF3," Appl. Phys. Lett, 78(5):673-675 (2001).
Ikai, Masamichi and Tokito, Shizuo, "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

(56) References Cited

OTHER PUBLICATIONS

Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett, 77(15)2280-2282 (2000).
Lo, Shih-Chun et al., "Blue Phosphorescence from Iridium(III) Complexes at Room Temperature," Chem. Mater., 18 (21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylbory1)-2,2'-bithiophene and 5,5"-Bis (dimesitylbory1)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91209-215 (1997).
Shirota, Yasuhiko et al., "Starburst Molecules Based on p-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 87:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett, 69 (15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

ORGANIC ELECTROLUMINESCENT MATERIALS AND DEVICES

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to electroluminescent compounds for use as emitters and devices, such as organic light emitting diodes, including the same. More particularly, the compounds disclosed herein are novel Rhenium(I) metal complexes.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

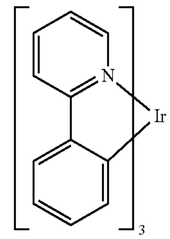

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment of the present disclosure, a novel compound that is useful in organic electroluminescent devices is disclosed. The compound has a formula $Re(L_A)(L_B)$, wherein Re is a Rhenium(I) metal; wherein $L_A$ is a monoanionic tridentate ligand; wherein $L_B$ is a neutral tridentate ligand; and wherein $L_A$ and $L_B$ are optionally linked together to form a hexadentate ligand.

According to an aspect of the present disclosure, an organic electroluminescent device, such as an organic light emitting device, incorporating the novel compound is disclosed. A formulation comprising the novel compound is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75. No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
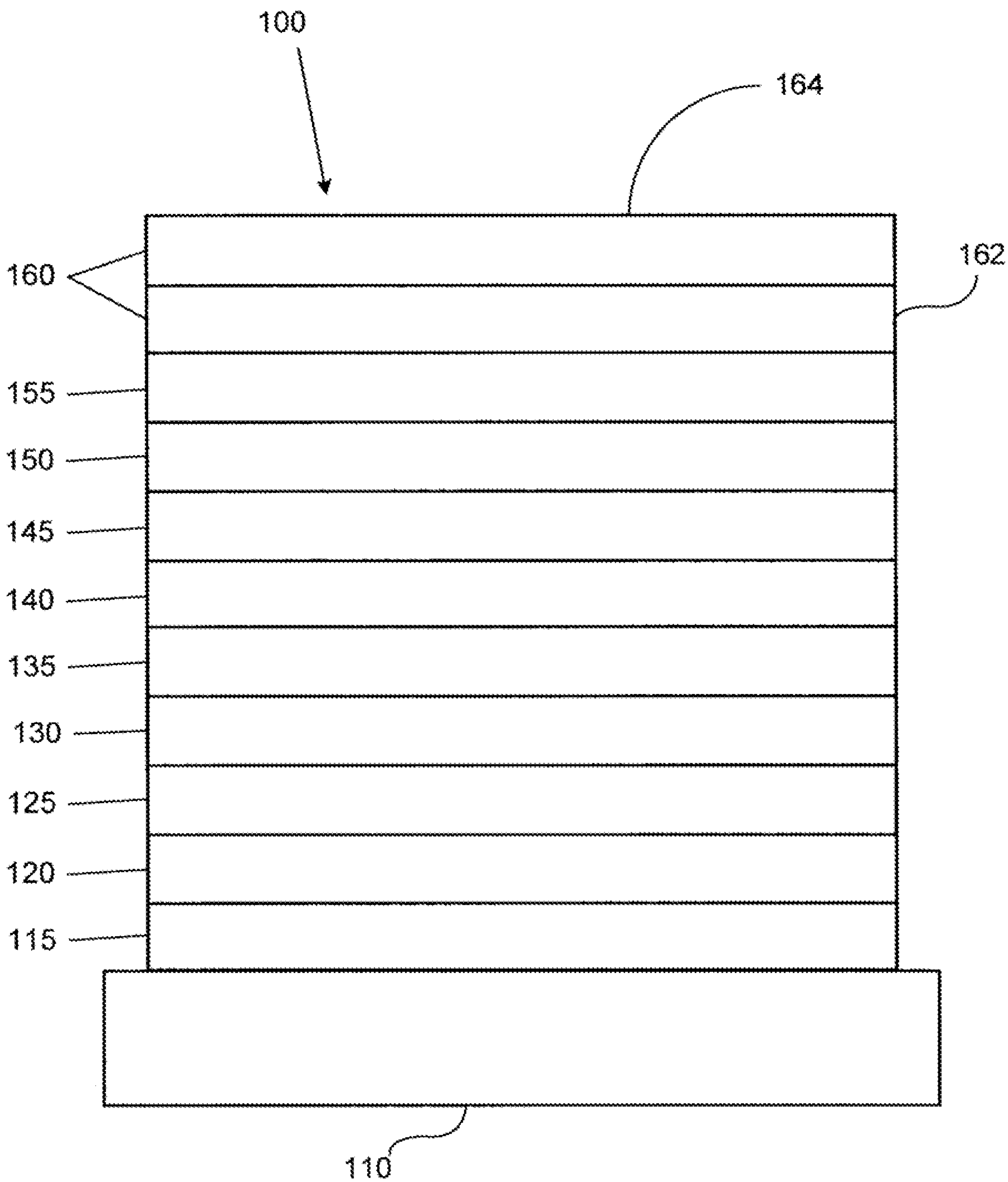
FIG. 1 shows an organic light emitting device that can incorporate the inventive compound disclosed herein.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
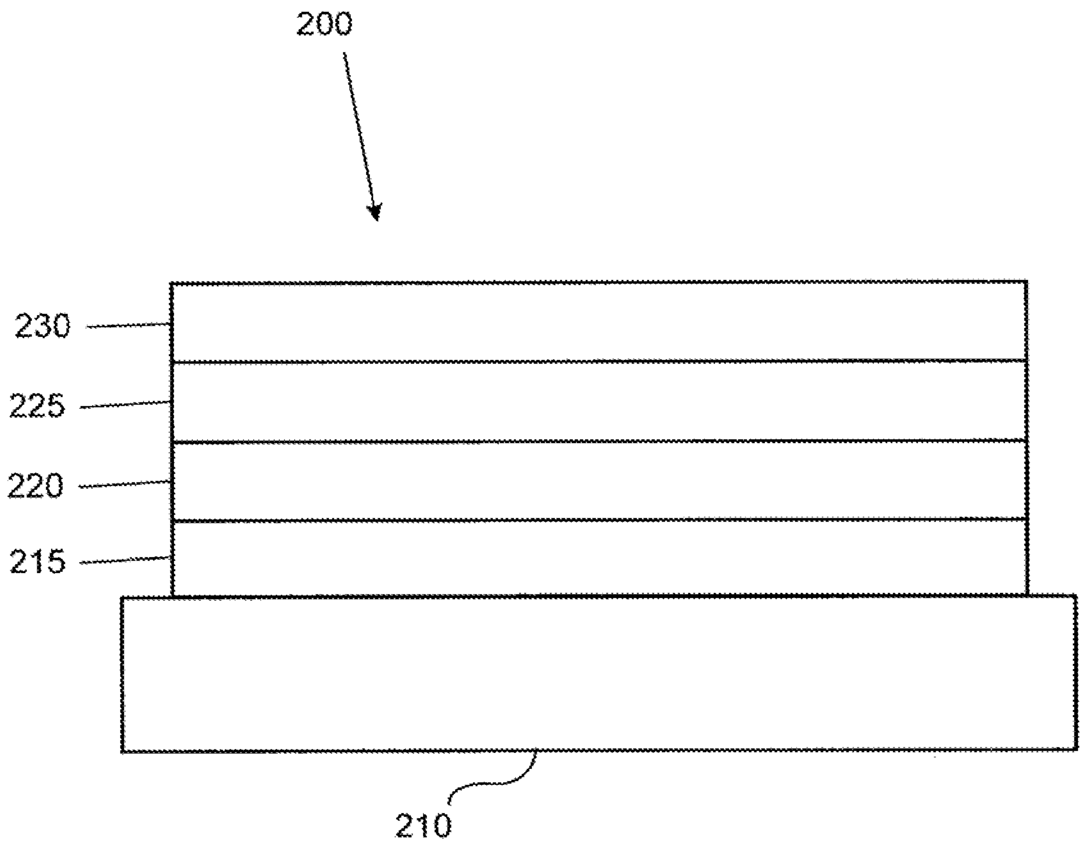
FIG. 2 shows an inverted organic light emitting device that can incorporate the inventive compound disclosed herein.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used.

Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al. which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

As used herein, "substituted" indicates that a substituent other than H is bonded to the relevant carbon. Thus, where $R^2$ is monosubstituted, then one $R^2$ must be other than H. Similarly, where $R^3$ is disubstituted, then two of $R^3$ must be other than H. Similarly, where $R^2$ is unsubstituted $R^2$ is hydrogen for all available positions.

According to an embodiment of the present disclosure, a novel compound that is useful in organic electroluminescent devices is disclosed. The compound has a formula $Re(L_A)(L_B)$, wherein Re is a Rhenium(I) metal; wherein $L_A$ is a monoanionic tridentate ligand; wherein $L_B$ is a neutral tridentate ligand; and wherein $L_A$ and $L_B$ are optionally linked together to form a hexadentate ligand.

In one embodiment of the compound, the ligand $L_A$ has a formula selected from the group consisting of:

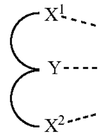

and

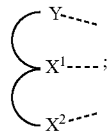

the ligand $L_B$ has a formula:

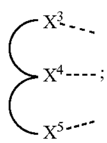

wherein $X^1$, $X^2$, $X^3$, $X^4$, and $X^5$ are each independently a neutral coordinating atom selected from the group consisting of carbon, phosphorus, and nitrogen;

wherein Y is a monoanionic coordinating atom selected from the group consisting of carbon, oxygen, sulfur, and nitrogen; and wherein the dash lines show the connection points to Re.

In one embodiment, the neutral carbon is N-heterocyclic carbene; the neutral phosphorus is a phosphorus atom of a trisubstituted phosphine; and the neutral nitrogen is an $sp^2$ nitrogen atom of N-heterocyclic ring selected from the group consisting of pyridine, pyrimidine, imidazole, benzoimidazole, pyrazole, oxazole, and triazole. The monoanionic coordinating carbon is an $sp^2$ carbon atom selected from the group consisting of benzene, pyridine, furan, thiophene, and pyrrole. The monoanionic coordinating nitrogen is an $sp^2$ nitrogen atom of N-heterocyclic ring selected from the group consisting of imidazole, benzoimidazole, pyrazole, and triazole. The monoanionic oxygen atom is oxygen atom from carboxylic acid or ether.

In one embodiment, the ligand $L_A$ has a formula selected from the group consisting of:

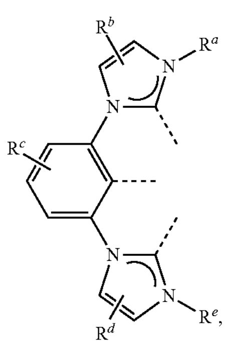

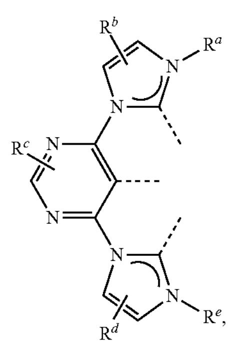

-continued

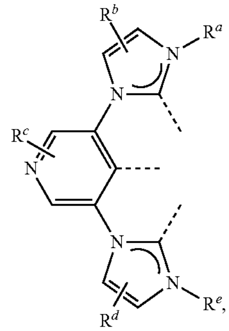

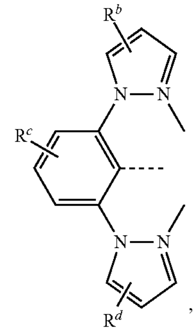

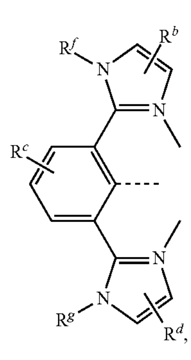

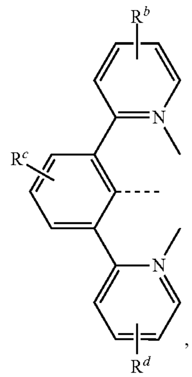

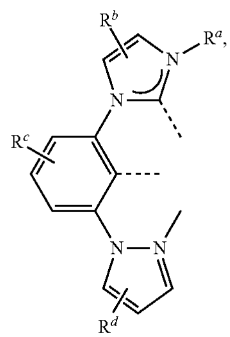

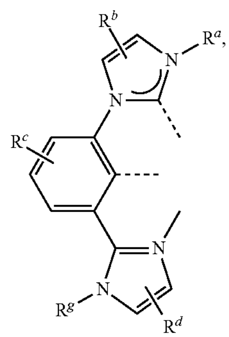

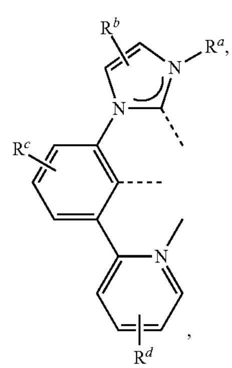

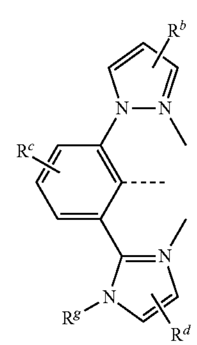

-continued

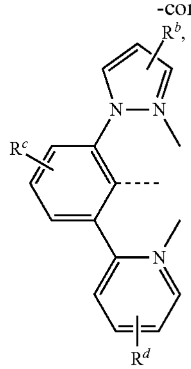

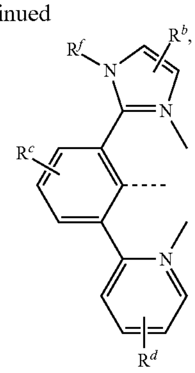

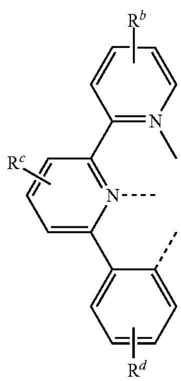

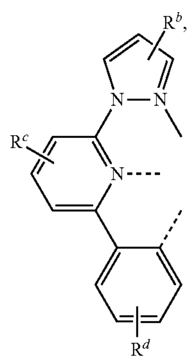

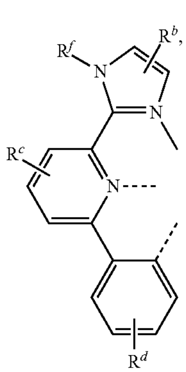

and

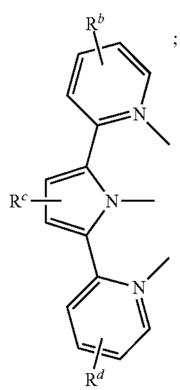

;

wherein $R^b$, $R^c$, and $R^d$ may represent from mono-substitution to the possible maximum number of substitution, or no substitution;

wherein $R^a$, $R^b$, $R^c$, $R^d$, $R^e$, $R^f$ and $R^g$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein two adjacent substituents of $R^a$, $R^b$, $R^c$, $R^d$, $R^e$, $R^f$ and $R^g$ are optionally joined to form a ring or form a multidentate ligand.

In one embodiment, the ligand $L_A$ has a formula selected from the group consisting of:

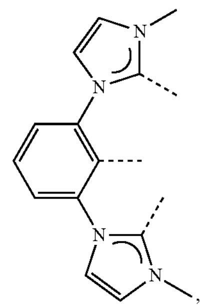

$L_{A1}$

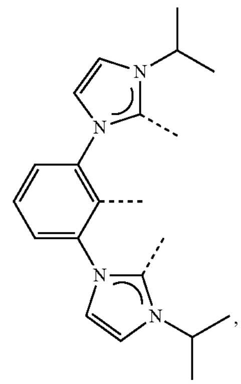

$L_{A2}$

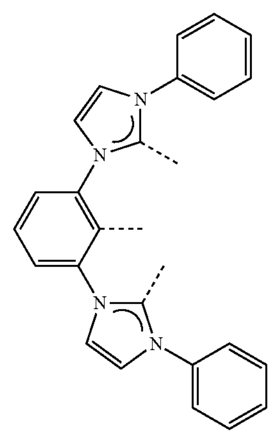

$L_{A3}$

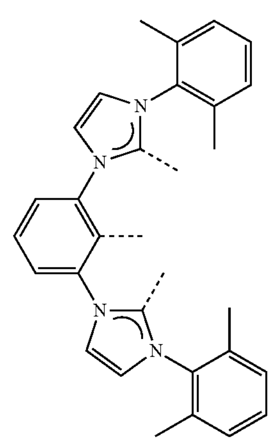

$L_{A4}$

-continued
$L_{A5}$
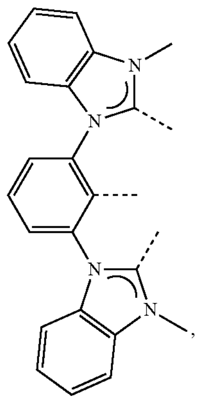
$L_{A6}$
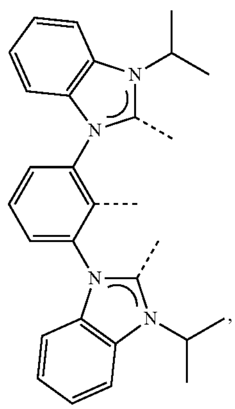
$L_{A7}$
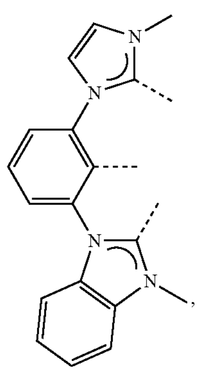
$L_{A8}$
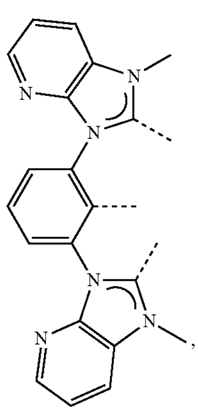
-continued
$L_{A9}$
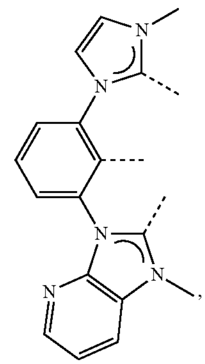
$L_{A10}$
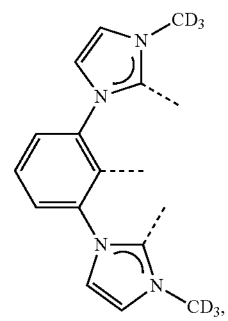
$L_{A11}$
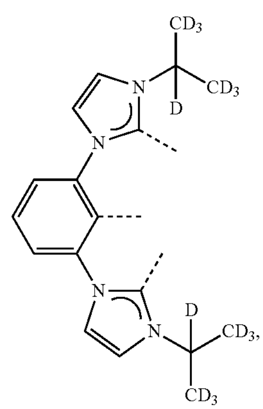
$L_{A12}$
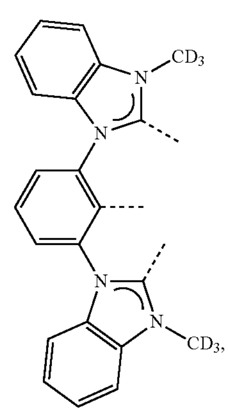

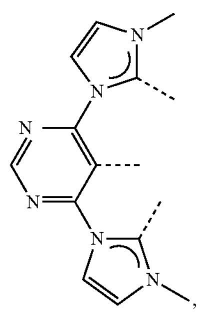
$L_{A13}$
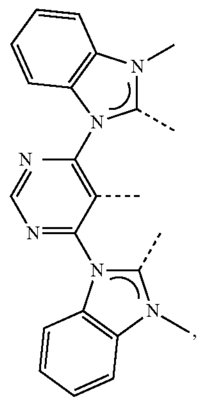
$L_{A14}$
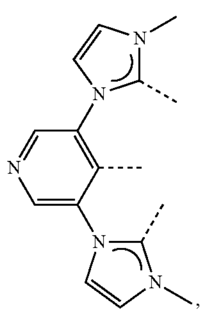
$L_{A15}$
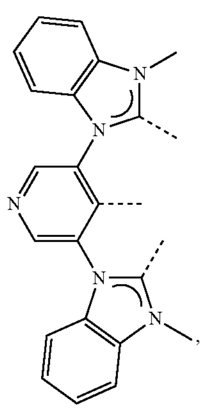
$L_{A16}$
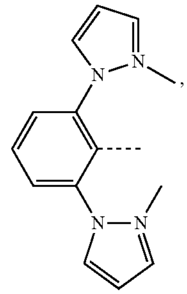
$L_{A17}$
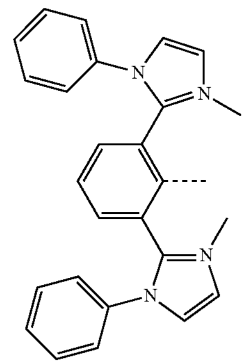
$L_{A18}$
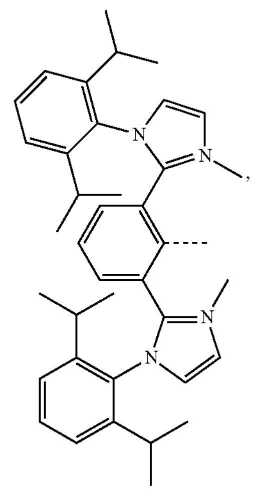
$L_{A19}$
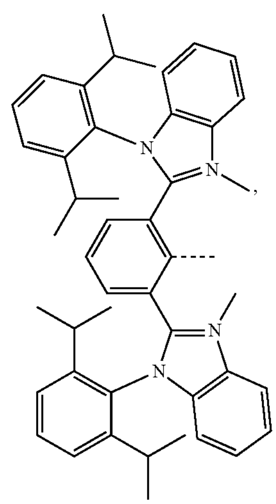
$L_{A20}$ -continued
$L_{A21}$
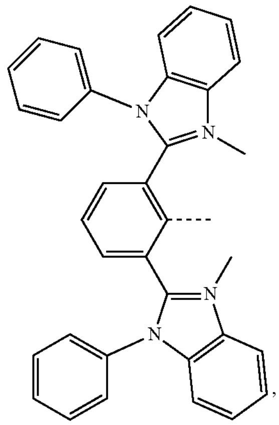
$L_{A22}$
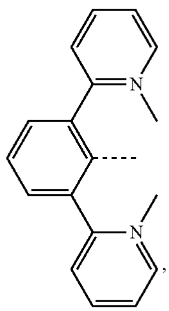
$L_{A23}$
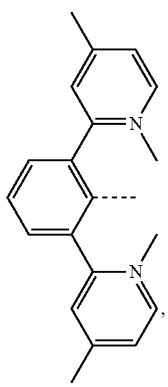
$L_{A24}$
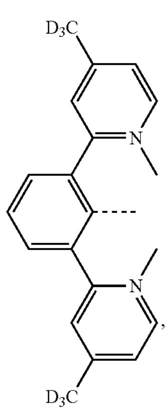
-continued
$L_{A25}$
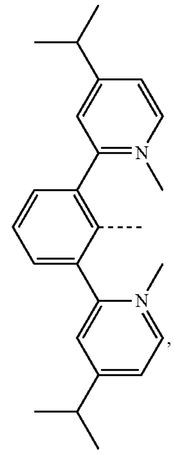
$L_{A26}$
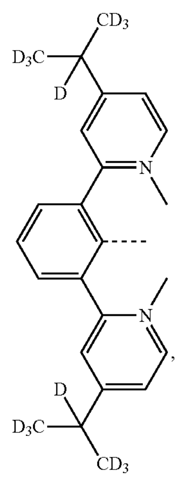
$L_{A27}$
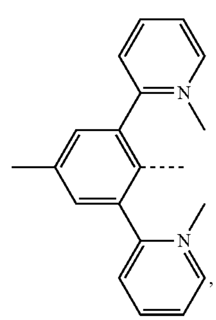

-continued
$L_{A28}$
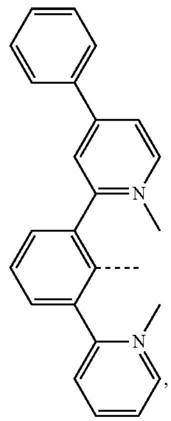
$L_{A29}$
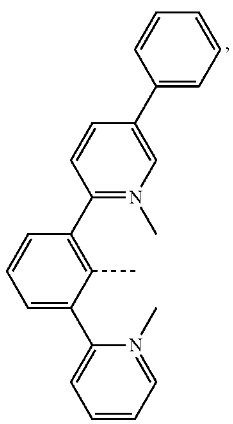
$L_{A30}$
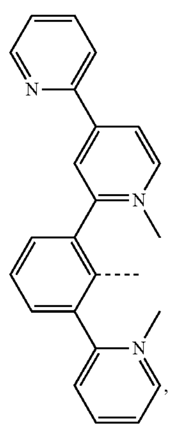
-continued
$L_{A31}$
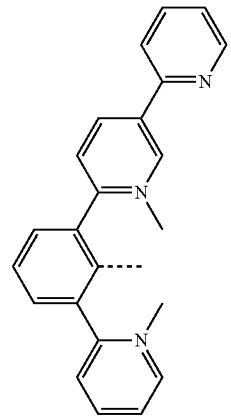
$L_{A32}$
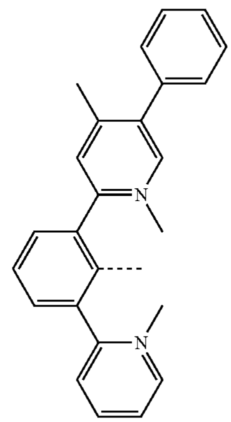
$L_{A33}$
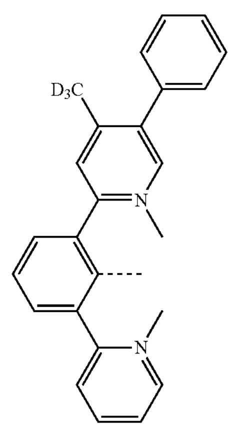
$L_{A34}$
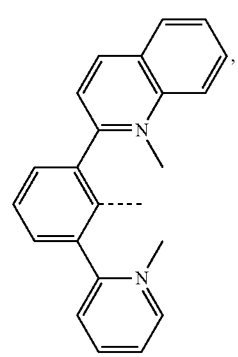

-continued
$L_{A35}$
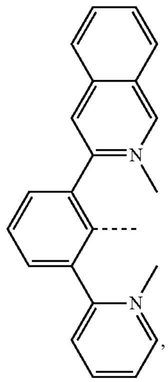
$L_{A36}$
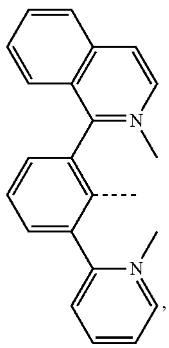
$L_{A37}$
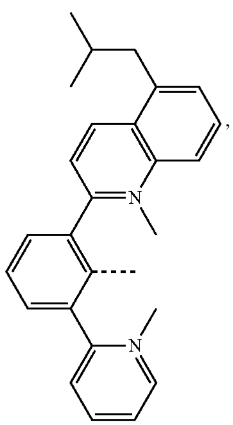
$L_{A38}$
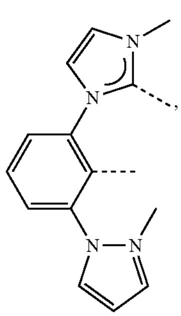
-continued
$L_{A39}$
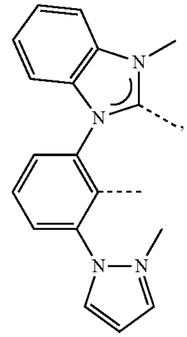
$L_{A40}$
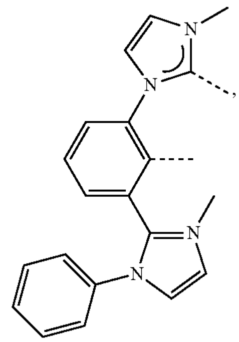
$L_{A41}$
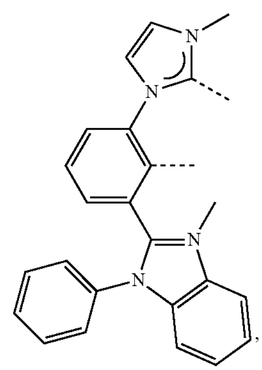
$L_{A42}$
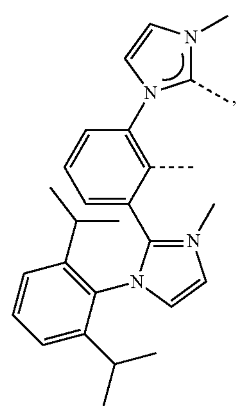

-continued
$L_{A43}$
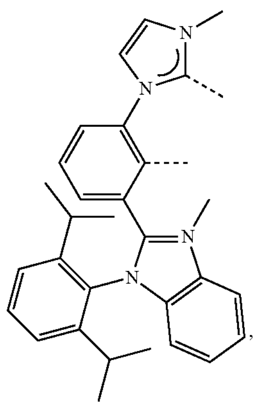
$L_{A44}$
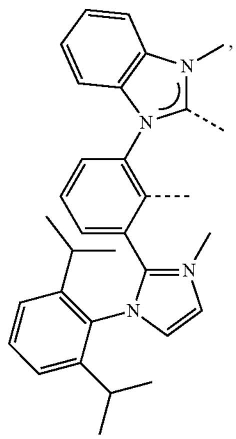
$L_{A45}$
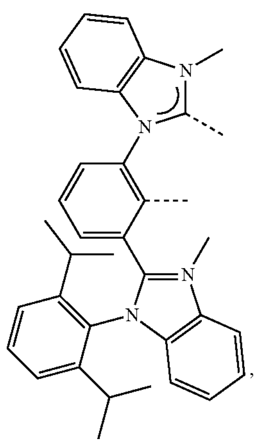
$L_{A46}$
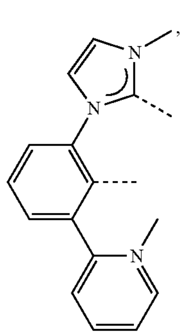
-continued
$L_{A47}$
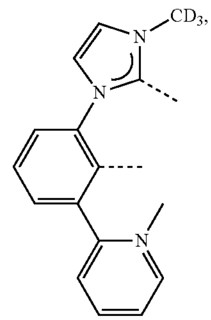
$L_{A48}$
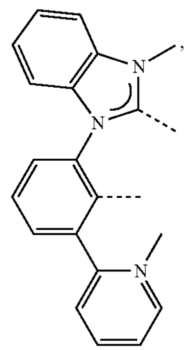
$L_{A49}$
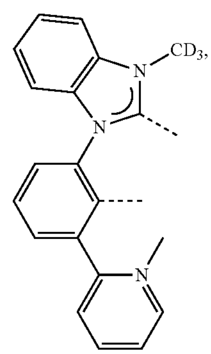
$L_{A50}$
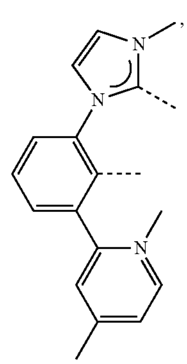

-continued
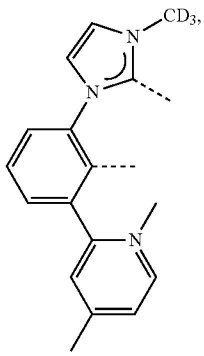
$L_{A51}$
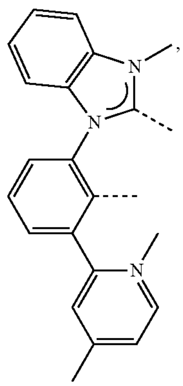
$L_{A52}$
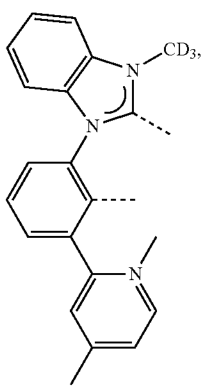
$L_{A53}$
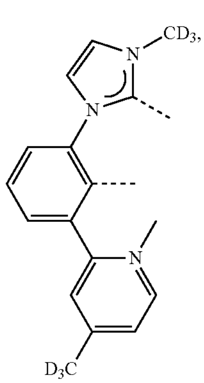
$L_{A54}$
-continued
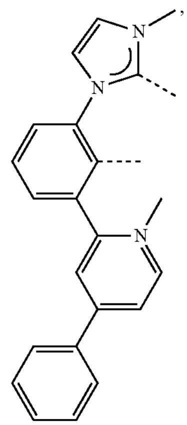
$L_{A55}$
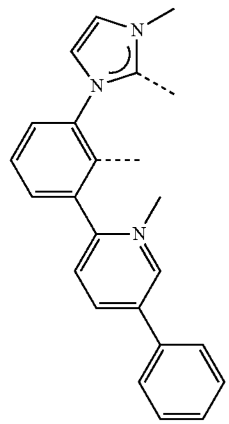
$L_{A56}$
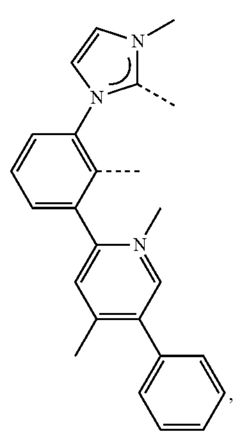
$L_{A57}$ -continued
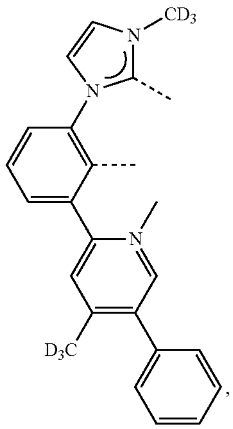
$L_{A58}$
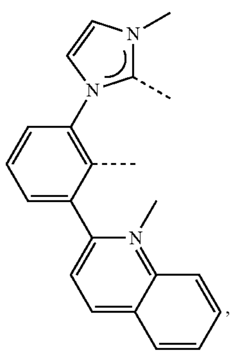
$L_{A59}$
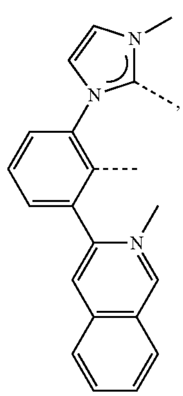
$L_{A60}$
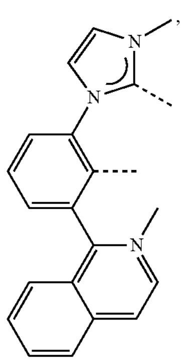
$L_{A61}$
-continued
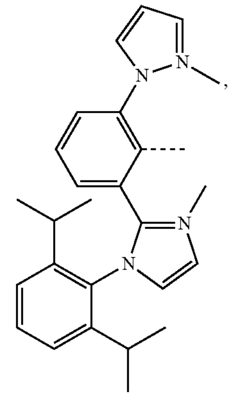
$L_{A62}$
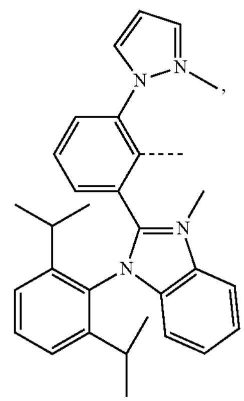
$L_{A63}$
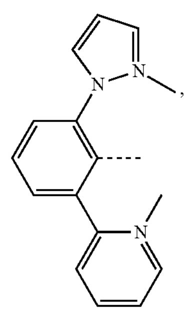
$L_{A64}$
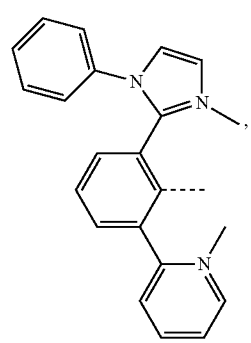
$L_{A65}$ $L_{A66}$
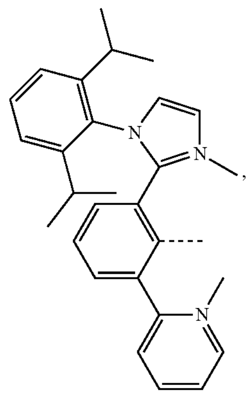
$L_{A67}$
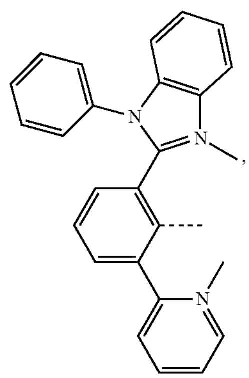
$L_{A68}$
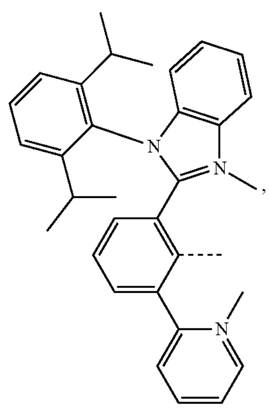
$L_{A69}$
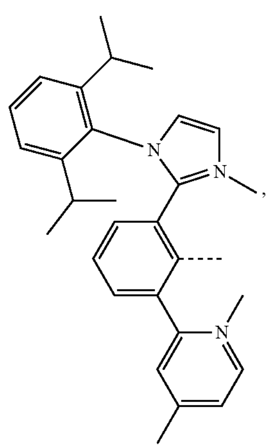
$L_{A70}$
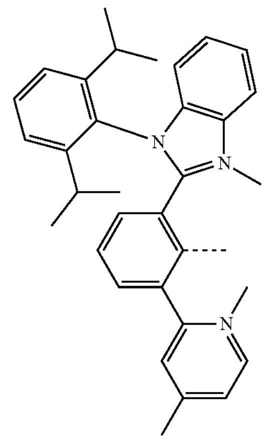
$L_{A71}$
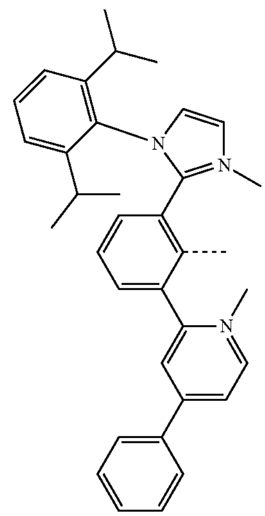
$L_{A72}$
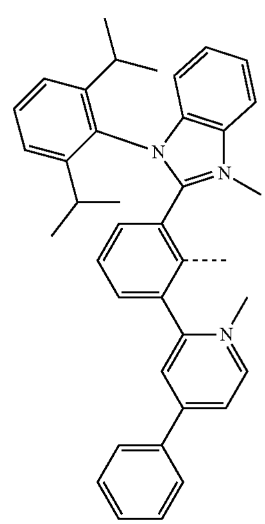

-continued
$L_{A73}$
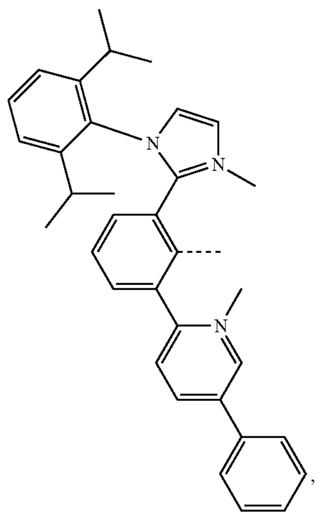
$L_{A74}$
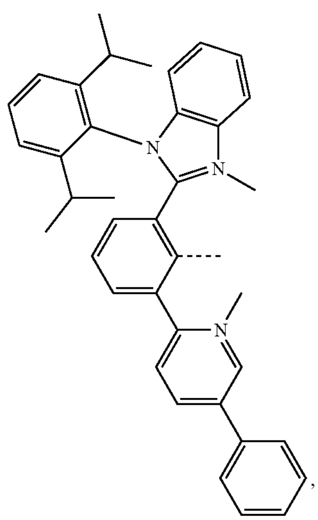
$L_{A75}$
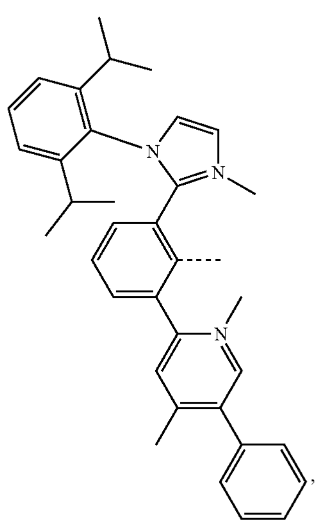
-continued
$L_{A76}$
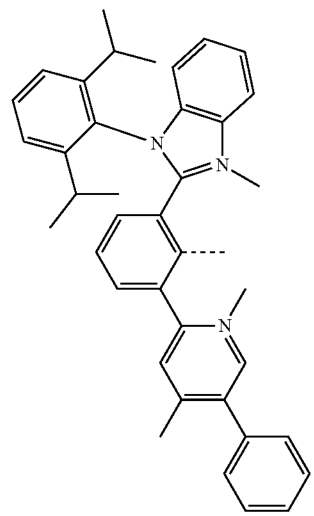
$L_{A77}$
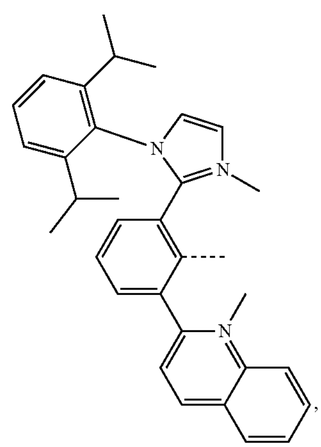
$L_{A78}$
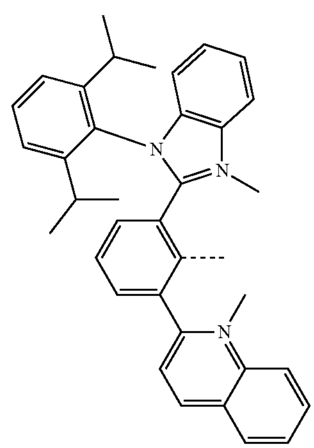

L$_{A79}$
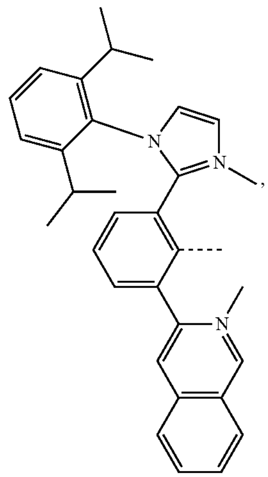
L$_{A80}$
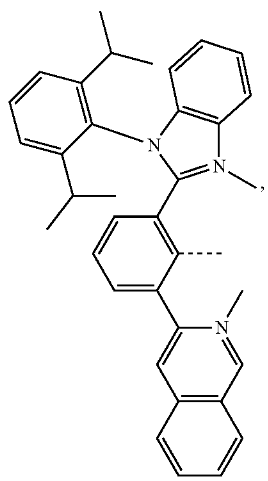
L$_{A81}$
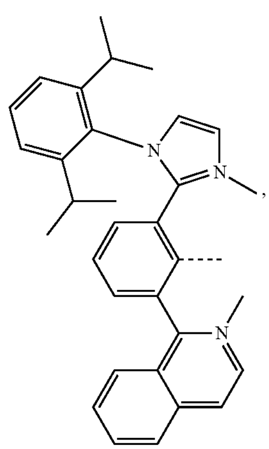
L$_{A82}$
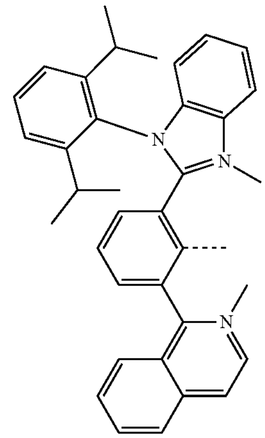
L$_{A83}$
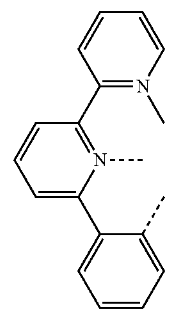
L$_{A84}$
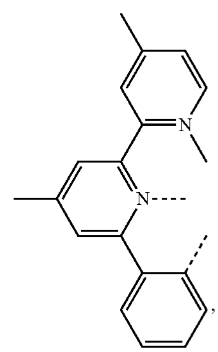
L$_{A85}$
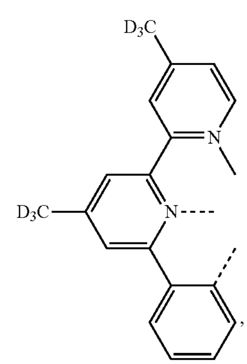

-continued
L$_{A86}$
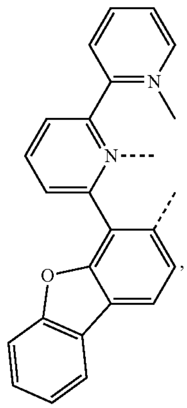
L$_{A87}$
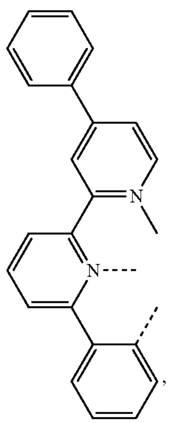
L$_{A88}$
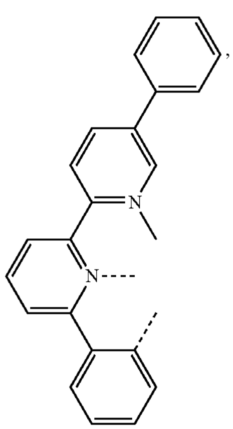
-continued
L$_{A89}$
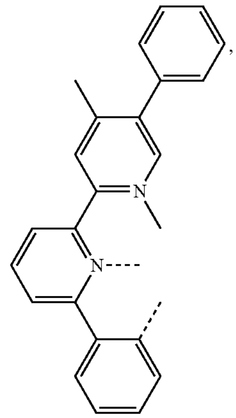
L$_{A90}$
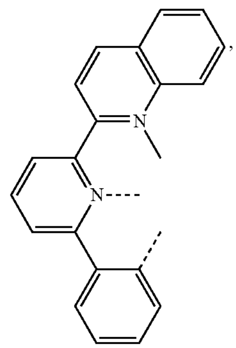
L$_{A91}$
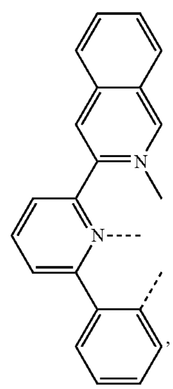
L$_{A92}$
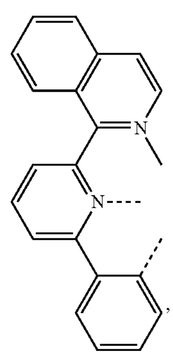

-continued

L$_{A93}$

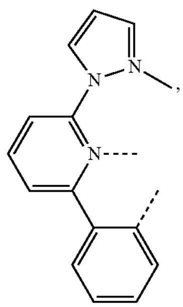

L$_{A94}$

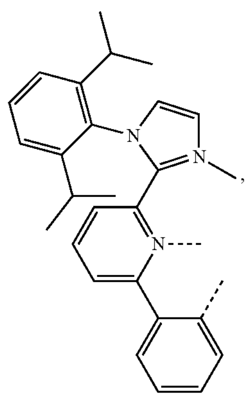

and

L$_{A95}$

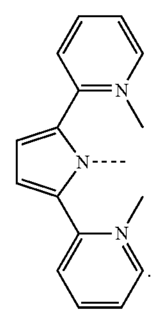

In one embodiment, the ligand L$_B$ has a formula selected from the group consisting of:

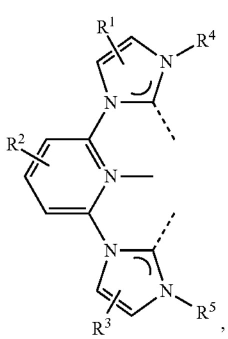

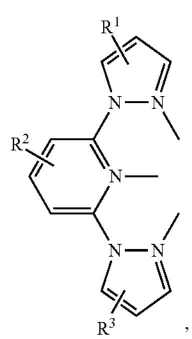

-continued

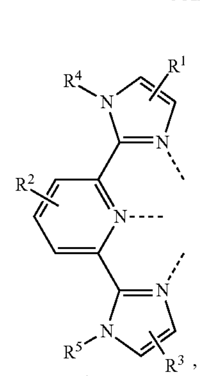

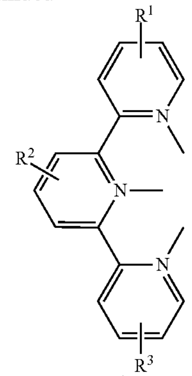

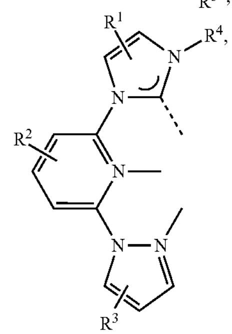

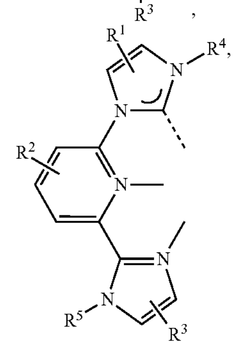

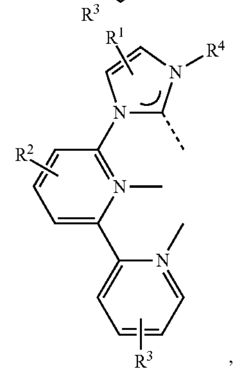

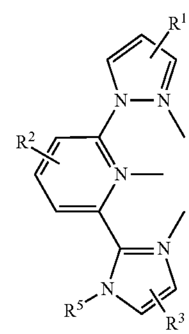

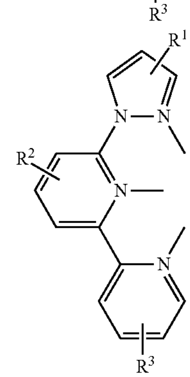

and

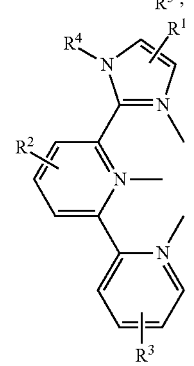

wherein R$^1$, R$^2$, and R$^3$ may represent from mono-substitution to the possible maximum number of substitution, or no substitution;

wherein R$^1$, R$^2$, R$^3$, R$^4$, and R$^5$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein two adjacent substituents of $R^1$, $R^2$, $R^3$, $R^4$, and $R^5$ are optionally joined to form a ring or form a multidentate ligand.
In another embodiment, the ligand $L_B$ has a formula selected from the group consisting of:
$L_{B1}$
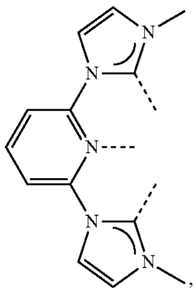
$L_{B2}$
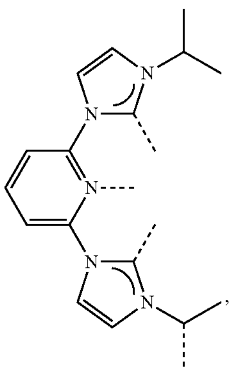
$L_{B3}$
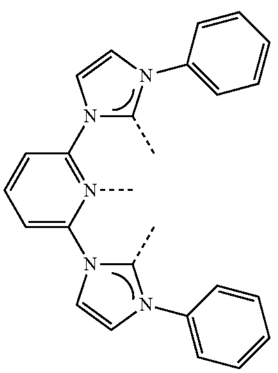
$L_{B4}$
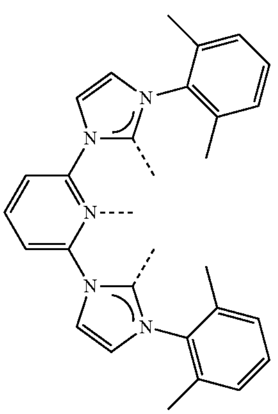
-continued
$L_{B5}$
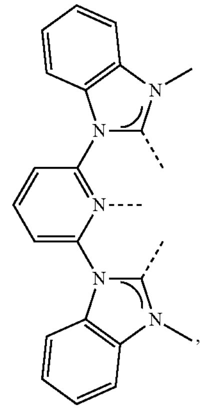
$L_{B6}$
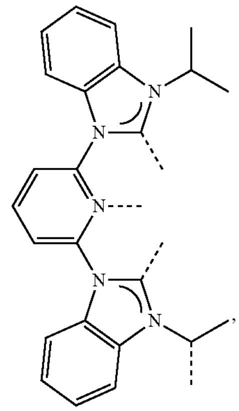
$L_{B7}$
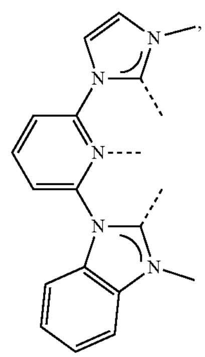
$L_{B8}$
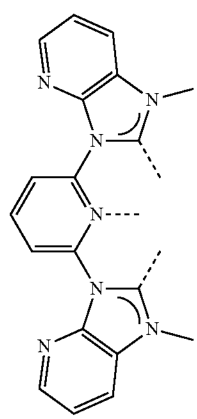

-continued
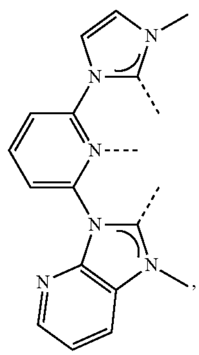
$L_{B9}$
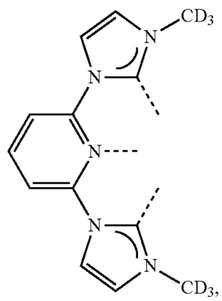
$L_{B10}$
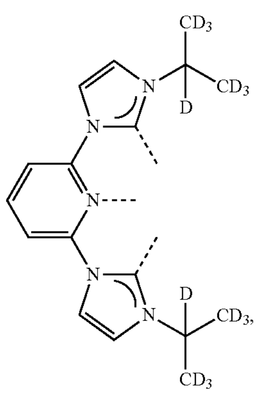
$L_{B11}$
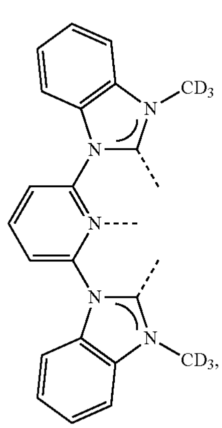
$L_{B12}$
-continued
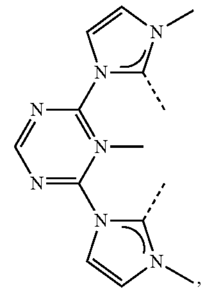
$L_{B13}$
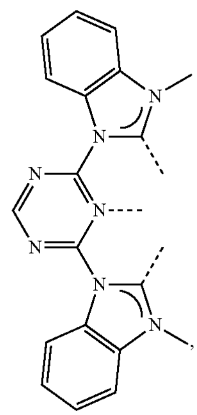
$L_{B14}$
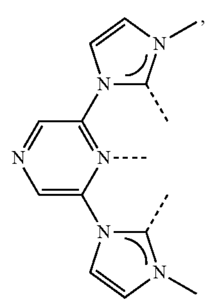
$L_{B15}$
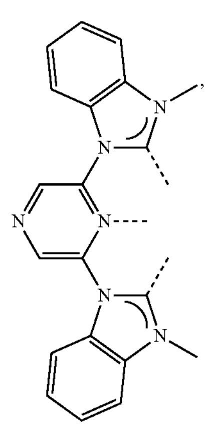
$L_{B16}$

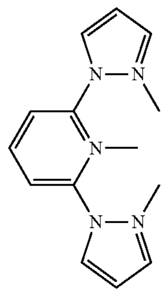
$L_{B17}$
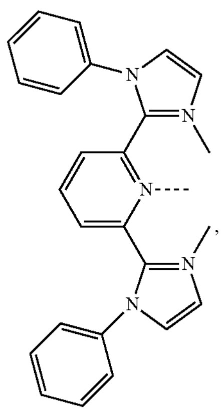
$L_{B18}$
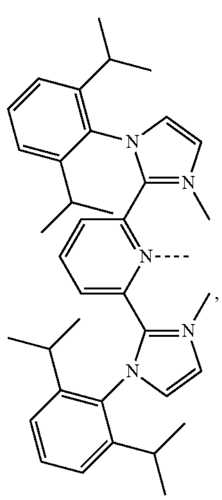
$L_{B19}$
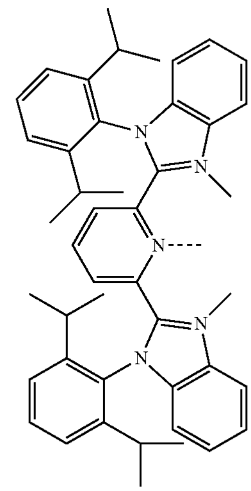
$L_{B20}$
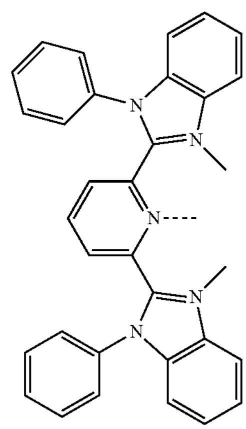
$L_{B21}$
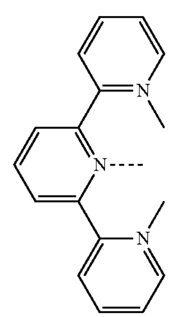
$L_{B22}$
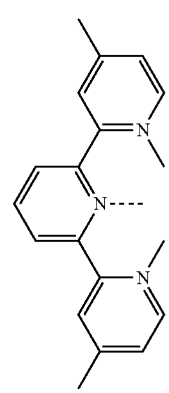
$L_{B23}$ L$_{B24}$
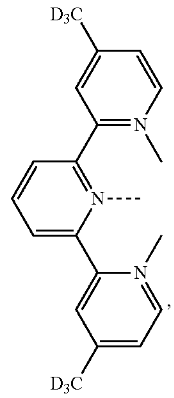
L$_{B25}$
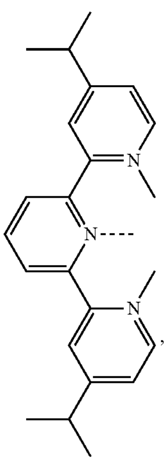
L$_{B26}$
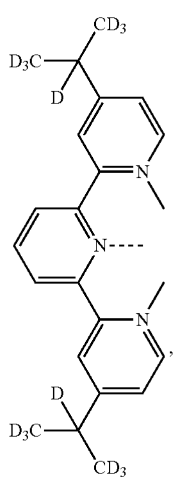
L$_{B27}$
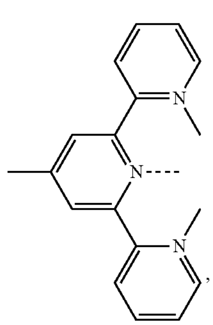
L$_{B28}$
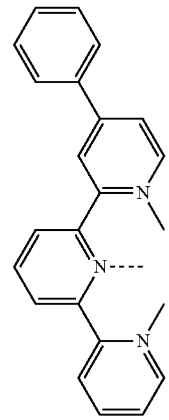
L$_{B29}$
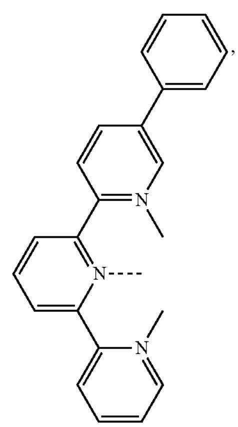
L$_{B30}$
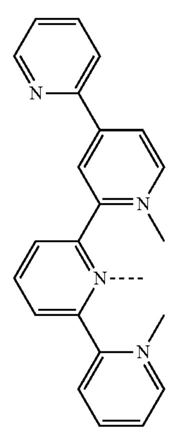

-continued
$L_{B31}$
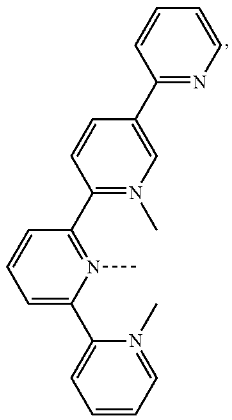
$L_{B32}$
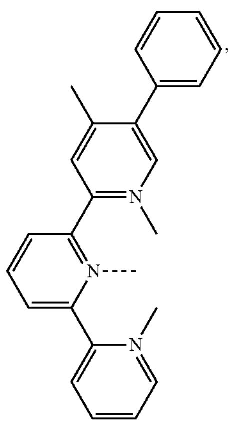
$L_{B33}$
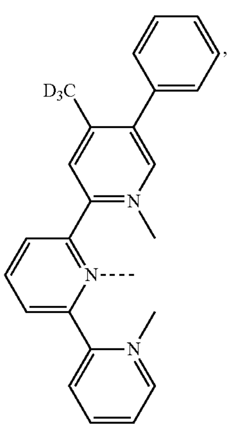
$L_{B34}$
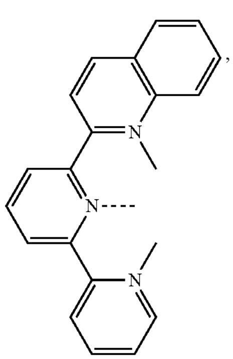
-continued
$L_{B35}$
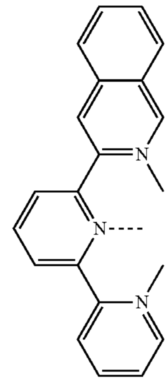
$L_{B36}$
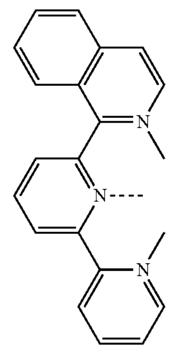
$L_{B37}$
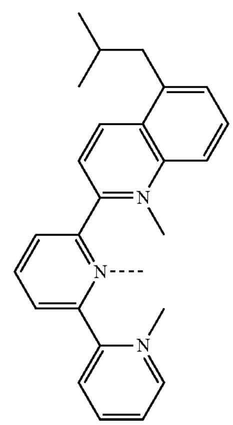
$L_{B38}$
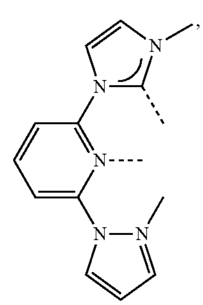

-continued
$L_{B39}$
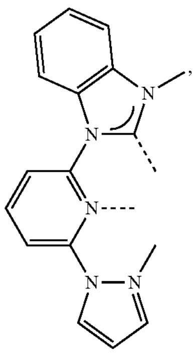
$L_{B40}$
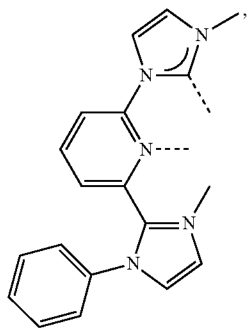
$L_{B41}$
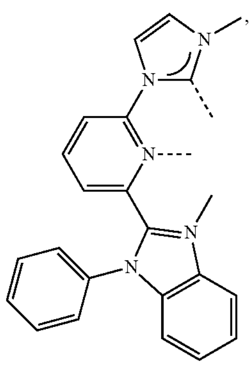
$L_{B42}$
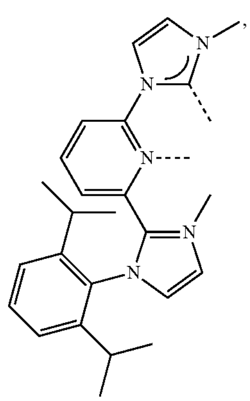
-continued
$L_{B43}$
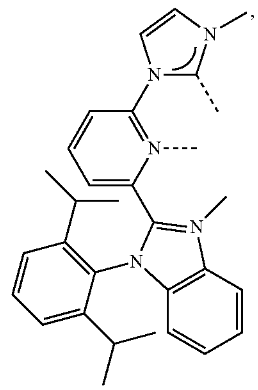
$L_{B44}$
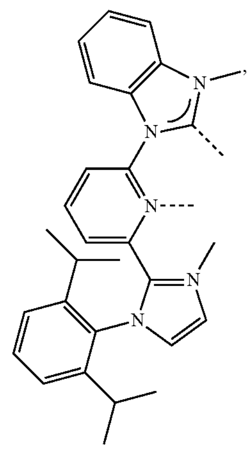
$L_{B45}$
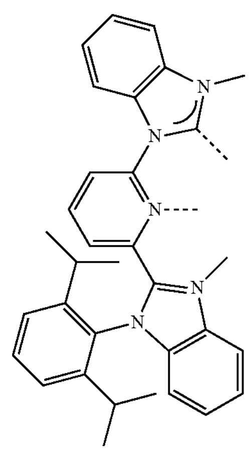
$L_{B46}$
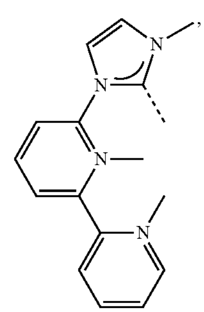

$L_{B47}$
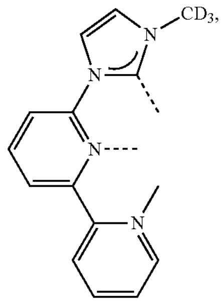
$L_{B48}$
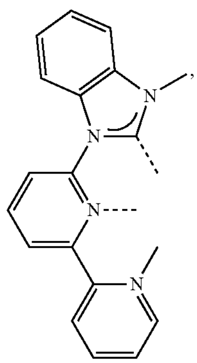
$L_{B49}$
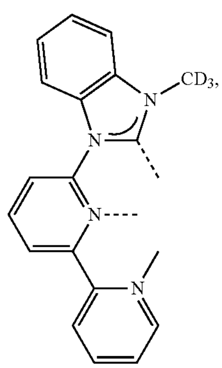
$L_{B50}$
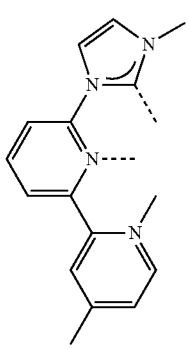
$L_{B51}$
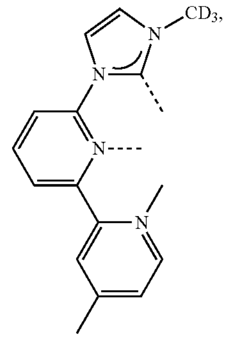
$L_{B52}$
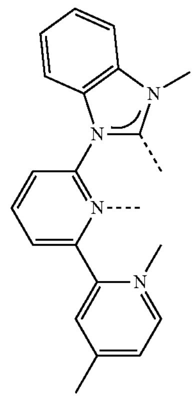
$L_{B53}$
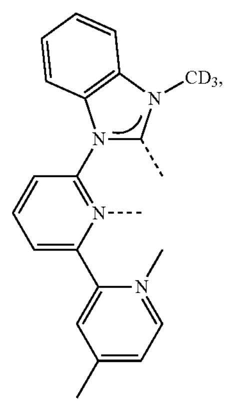
$L_{B54}$
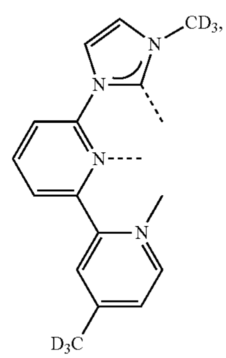

-continued
$L_{B55}$
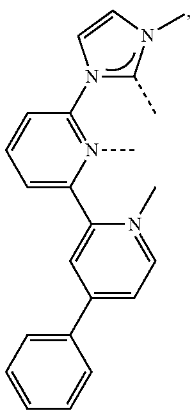
$L_{B56}$
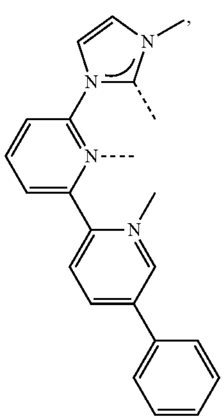
$L_{B57}$
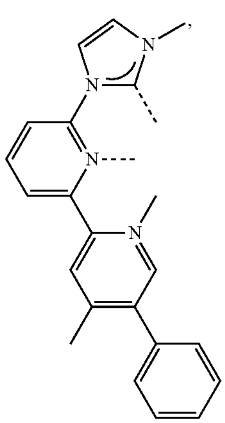
-continued
$L_{B58}$
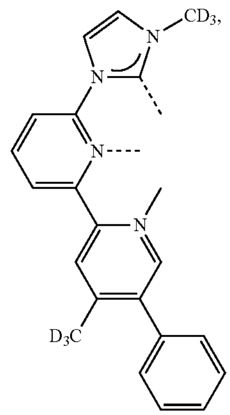
$L_{B59}$
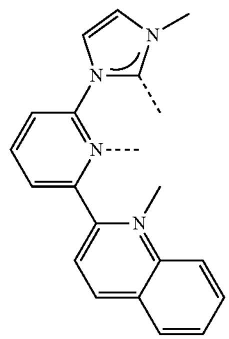
$L_{B60}$
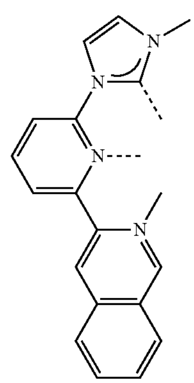
$L_{B61}$
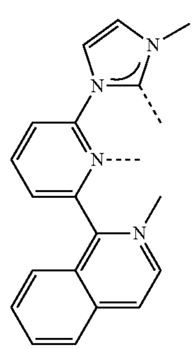

-continued
$L_{B62}$
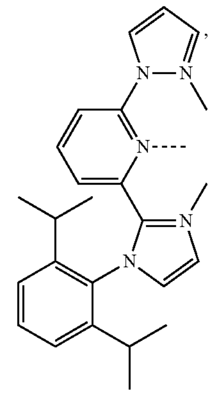
$L_{B63}$
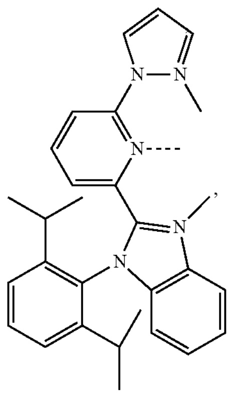
$L_{B64}$
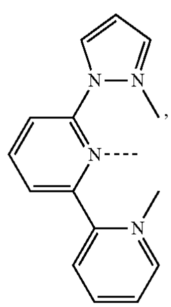
$L_{B65}$
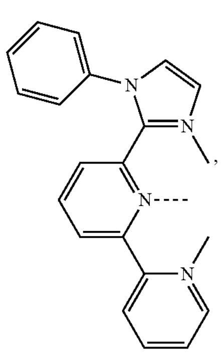
-continued
$L_{B66}$
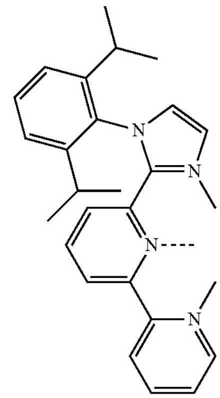
$L_{B67}$
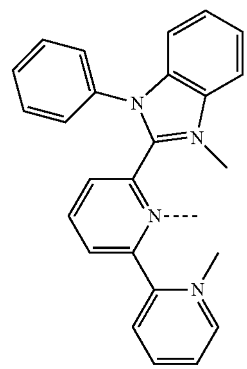
$L_{B68}$
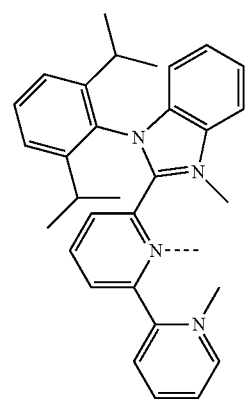
$L_{B69}$
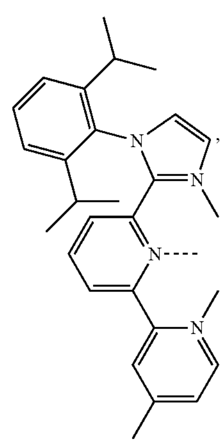

-continued
$L_{B70}$
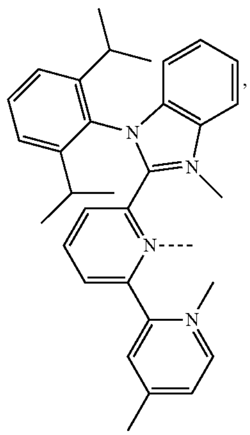
$L_{B71}$
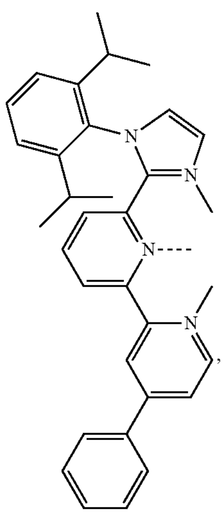
$L_{B72}$
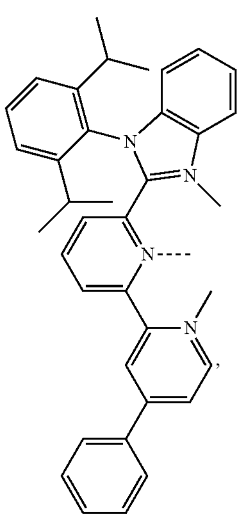
-continued
$L_{B73}$
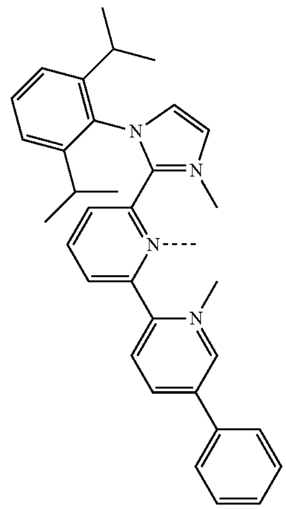
$L_{B74}$
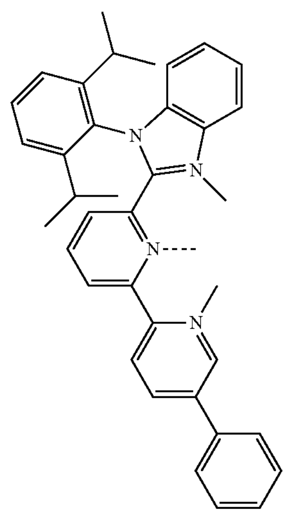
$L_{B75}$
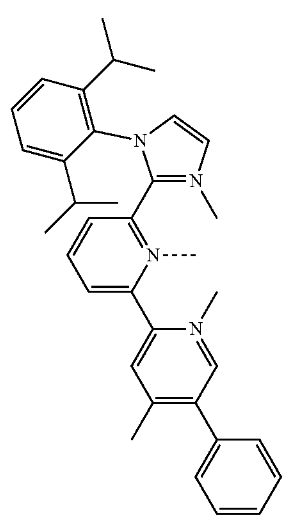

-continued
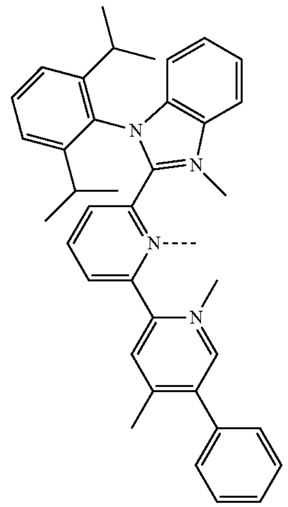
$L_{B76}$
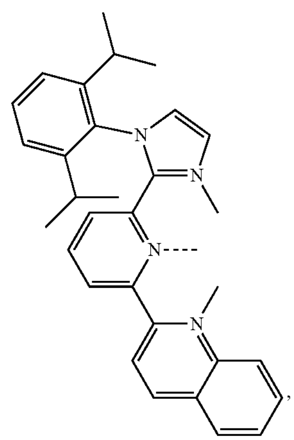
$L_{B77}$
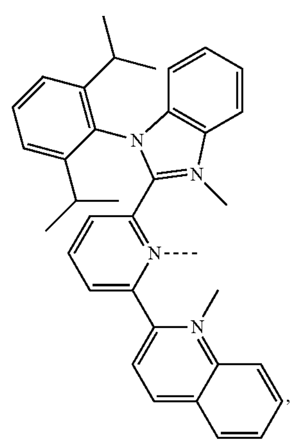
$L_{B78}$
-continued
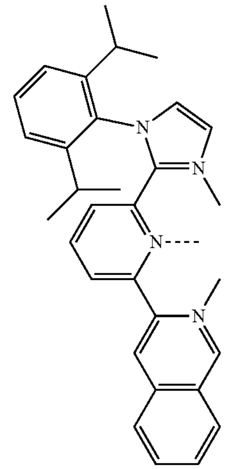
$L_{B79}$
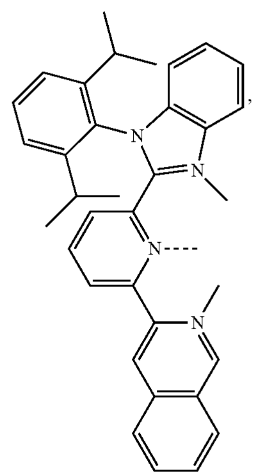
$L_{B80}$
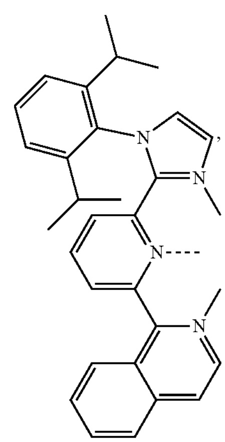
$L_{B81}$ -continued $L_{B82}$

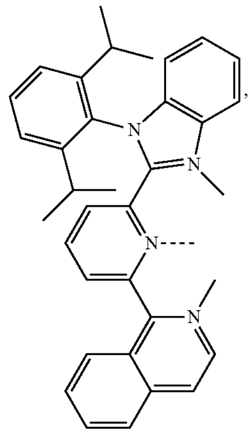

, and $L_{B86}$

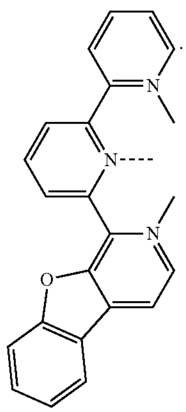

.

According to another embodiment, the compound having the formula $Re(L_A)(L_B)$, where Re is a Rhenium(I) metal and $L_A$ and $L_B$ are as defined herein, is selected from the group consisting of Compounds 1 through 8170 listed in the following Table 1:

TABLE 1

| Cpd # | $L_A$ | $L_B$ |
|---|---|---|
| 1. | $L_{A1}$ | $L_{B1}$ |
| 2. | $L_{A2}$ | $L_{B1}$ |
| 3. | $L_{A3}$ | $L_{B1}$ |
| 4. | $L_{A4}$ | $L_{B1}$ |
| 5. | $L_{A5}$ | $L_{B1}$ |
| 6. | $L_{A6}$ | $L_{B1}$ |
| 7. | $L_{A7}$ | $L_{B1}$ |
| 8. | $L_{A8}$ | $L_{B1}$ |
| 9. | $L_{A9}$ | $L_{B1}$ |
| 10. | $L_{A10}$ | $L_{B1}$ |
| 11. | $L_{A11}$ | $L_{B1}$ |
| 12. | $L_{A12}$ | $L_{B1}$ |
| 13. | $L_{A13}$ | $L_{B1}$ |
| 14. | $L_{A14}$ | $L_{B1}$ |
| 15. | $L_{A15}$ | $L_{B1}$ |
| 16. | $L_{A16}$ | $L_{B1}$ |
| 17. | $L_{A17}$ | $L_{B1}$ |
| 18. | $L_{A18}$ | $L_{B1}$ |
| 19. | $L_{A19}$ | $L_{B1}$ |
| 20. | $L_{A20}$ | $L_{B1}$ |
| 21. | $L_{A21}$ | $L_{B1}$ |
| 22. | $L_{A22}$ | $L_{B1}$ |
| 23. | $L_{A23}$ | $L_{B1}$ |
| 24. | $L_{A24}$ | $L_{B1}$ |
| 25. | $L_{A25}$ | $L_{B1}$ |
| 26. | $L_{A26}$ | $L_{B1}$ |

TABLE 1-continued

| Cpd # | $L_A$ | $L_B$ |
|---|---|---|
| 27. | $L_{A27}$ | $L_{B1}$ |
| 28. | $L_{A28}$ | $L_{B1}$ |
| 29. | $L_{A29}$ | $L_{B1}$ |
| 30. | $L_{A30}$ | $L_{B1}$ |
| 31. | $L_{A31}$ | $L_{B1}$ |
| 32. | $L_{A32}$ | $L_{B1}$ |
| 33. | $L_{A33}$ | $L_{B1}$ |
| 34. | $L_{A34}$ | $L_{B1}$ |
| 35. | $L_{A35}$ | $L_{B1}$ |
| 36. | $L_{A36}$ | $L_{B1}$ |
| 37. | $L_{A37}$ | $L_{B1}$ |
| 38. | $L_{A38}$ | $L_{B1}$ |
| 39. | $L_{A39}$ | $L_{B1}$ |
| 40. | $L_{A40}$ | $L_{B1}$ |
| 41. | $L_{A41}$ | $L_{B1}$ |
| 42. | $L_{A42}$ | $L_{B1}$ |
| 43. | $L_{A43}$ | $L_{B1}$ |
| 44. | $L_{A44}$ | $L_{B1}$ |
| 45. | $L_{A45}$ | $L_{B1}$ |
| 46. | $L_{A46}$ | $L_{B1}$ |
| 47. | $L_{A47}$ | $L_{B1}$ |
| 48. | $L_{A48}$ | $L_{B1}$ |
| 49. | $L_{A49}$ | $L_{B1}$ |
| 50. | $L_{A50}$ | $L_{B1}$ |
| 51. | $L_{A51}$ | $L_{B1}$ |
| 52. | $L_{A52}$ | $L_{B1}$ |
| 53. | $L_{A53}$ | $L_{B1}$ |
| 54. | $L_{A54}$ | $L_{B1}$ |
| 55. | $L_{A55}$ | $L_{B1}$ |
| 56. | $L_{A56}$ | $L_{B1}$ |
| 57. | $L_{A57}$ | $L_{B1}$ |
| 58. | $L_{A58}$ | $L_{B1}$ |
| 59. | $L_{A59}$ | $L_{B1}$ |
| 60. | $L_{A60}$ | $L_{B1}$ |
| 61. | $L_{A61}$ | $L_{B1}$ |
| 62. | $L_{A62}$ | $L_{B1}$ |
| 63. | $L_{A63}$ | $L_{B1}$ |
| 64. | $L_{A64}$ | $L_{B1}$ |
| 65. | $L_{A65}$ | $L_{B1}$ |
| 66. | $L_{A66}$ | $L_{B1}$ |
| 67. | $L_{A67}$ | $L_{B1}$ |
| 68. | $L_{A68}$ | $L_{B1}$ |
| 69. | $L_{A69}$ | $L_{B1}$ |
| 70. | $L_{A70}$ | $L_{B1}$ |
| 71. | $L_{A71}$ | $L_{B1}$ |
| 72. | $L_{A72}$ | $L_{B1}$ |
| 73. | $L_{A73}$ | $L_{B1}$ |
| 74. | $L_{A74}$ | $L_{B1}$ |
| 75. | $L_{A75}$ | $L_{B1}$ |
| 76. | $L_{A76}$ | $L_{B1}$ |
| 77. | $L_{A77}$ | $L_{B1}$ |
| 78. | $L_{A78}$ | $L_{B1}$ |
| 79. | $L_{A79}$ | $L_{B1}$ |
| 80. | $L_{A80}$ | $L_{B1}$ |
| 81. | $L_{A81}$ | $L_{B1}$ |
| 82. | $L_{A82}$ | $L_{B1}$ |
| 83. | $L_{A83}$ | $L_{B1}$ |
| 84. | $L_{A84}$ | $L_{B1}$ |
| 85. | $L_{A85}$ | $L_{B1}$ |
| 86. | $L_{A86}$ | $L_{B1}$ |
| 87. | $L_{A87}$ | $L_{B1}$ |
| 88. | $L_{A88}$ | $L_{B1}$ |
| 89. | $L_{A89}$ | $L_{B1}$ |
| 90. | $L_{A90}$ | $L_{B1}$ |
| 91. | $L_{A91}$ | $L_{B1}$ |
| 92. | $L_{A92}$ | $L_{B1}$ |
| 93. | $L_{A93}$ | $L_{B1}$ |
| 94. | $L_{A94}$ | $L_{B1}$ |
| 95. | $L_{A95}$ | $L_{B1}$ |
| 96. | $L_{A1}$ | $L_{B2}$ |
| 97. | $L_{A2}$ | $L_{B2}$ |
| 98. | $L_{A3}$ | $L_{B2}$ |
| 99. | $L_{A4}$ | $L_{B2}$ |
| 100. | $L_{A5}$ | $L_{B2}$ |
| 101. | $L_{A6}$ | $L_{B2}$ |
| 102. | $L_{A7}$ | $L_{B2}$ |
| 103. | $L_{A8}$ | $L_{B2}$ |
| 104. | $L_{A9}$ | $L_{B2}$ |

TABLE 1-continued

| Cpd # | $L_A$ | $L_B$ |
|---|---|---|
| 105. | $L_{A10}$ | $L_{B2}$ |
| 106. | $L_{A11}$ | $L_{B2}$ |
| 107. | $L_{A12}$ | $L_{B2}$ |
| 108. | $L_{A13}$ | $L_{B2}$ |
| 109. | $L_{A14}$ | $L_{B2}$ |
| 110. | $L_{A15}$ | $L_{B2}$ |
| 111. | $L_{A16}$ | $L_{B2}$ |
| 112. | $L_{A17}$ | $L_{B2}$ |
| 113. | $L_{A18}$ | $L_{B2}$ |
| 114. | $L_{A19}$ | $L_{B2}$ |
| 115. | $L_{A20}$ | $L_{B2}$ |
| 116. | $L_{A21}$ | $L_{B2}$ |
| 117. | $L_{A22}$ | $L_{B2}$ |
| 118. | $L_{A23}$ | $L_{B2}$ |
| 119. | $L_{A24}$ | $L_{B2}$ |
| 120. | $L_{A25}$ | $L_{B2}$ |
| 121. | $L_{A26}$ | $L_{B2}$ |
| 122. | $L_{A27}$ | $L_{B2}$ |
| 123. | $L_{A28}$ | $L_{B2}$ |
| 124. | $L_{A29}$ | $L_{B2}$ |
| 125. | $L_{A30}$ | $L_{B2}$ |
| 126. | $L_{A31}$ | $L_{B2}$ |
| 127. | $L_{A32}$ | $L_{B2}$ |
| 128. | $L_{A33}$ | $L_{B2}$ |
| 129. | $L_{A34}$ | $L_{B2}$ |
| 130. | $L_{A35}$ | $L_{B2}$ |
| 131. | $L_{A36}$ | $L_{B2}$ |
| 132. | $L_{A37}$ | $L_{B2}$ |
| 133. | $L_{A38}$ | $L_{B2}$ |
| 134. | $L_{A39}$ | $L_{B2}$ |
| 135. | $L_{A40}$ | $L_{B2}$ |
| 136. | $L_{A41}$ | $L_{B2}$ |
| 137. | $L_{A42}$ | $L_{B2}$ |
| 138. | $L_{A43}$ | $L_{B2}$ |
| 139. | $L_{A44}$ | $L_{B2}$ |
| 140. | $L_{A45}$ | $L_{B2}$ |
| 141. | $L_{A46}$ | $L_{B2}$ |
| 142. | $L_{A47}$ | $L_{B2}$ |
| 143. | $L_{A48}$ | $L_{B2}$ |
| 144. | $L_{A49}$ | $L_{B2}$ |
| 145. | $L_{A50}$ | $L_{B2}$ |
| 146. | $L_{A51}$ | $L_{B2}$ |
| 147. | $L_{A52}$ | $L_{B2}$ |
| 148. | $L_{A53}$ | $L_{B2}$ |
| 149. | $L_{A54}$ | $L_{B2}$ |
| 150. | $L_{A55}$ | $L_{B2}$ |
| 151. | $L_{A56}$ | $L_{B2}$ |
| 152. | $L_{A57}$ | $L_{B2}$ |
| 153. | $L_{A58}$ | $L_{B2}$ |
| 154. | $L_{A59}$ | $L_{B2}$ |
| 155. | $L_{A60}$ | $L_{B2}$ |
| 156. | $L_{A61}$ | $L_{B2}$ |
| 157. | $L_{A62}$ | $L_{B2}$ |
| 158. | $L_{A63}$ | $L_{B2}$ |
| 159. | $L_{A64}$ | $L_{B2}$ |
| 160. | $L_{A65}$ | $L_{B2}$ |
| 161. | $L_{A66}$ | $L_{B2}$ |
| 162. | $L_{A67}$ | $L_{B2}$ |
| 163. | $L_{A68}$ | $L_{B2}$ |
| 164. | $L_{A69}$ | $L_{B2}$ |
| 165. | $L_{A70}$ | $L_{B2}$ |
| 166. | $L_{A71}$ | $L_{B2}$ |
| 167. | $L_{A72}$ | $L_{B2}$ |
| 168. | $L_{A73}$ | $L_{B2}$ |
| 169. | $L_{A74}$ | $L_{B2}$ |
| 170. | $L_{A75}$ | $L_{B2}$ |
| 171. | $L_{A76}$ | $L_{B2}$ |
| 172. | $L_{A77}$ | $L_{B2}$ |
| 173. | $L_{A78}$ | $L_{B2}$ |
| 174. | $L_{A79}$ | $L_{B2}$ |
| 175. | $L_{A80}$ | $L_{B2}$ |
| 176. | $L_{A81}$ | $L_{B2}$ |
| 177. | $L_{A82}$ | $L_{B2}$ |
| 178. | $L_{A83}$ | $L_{B2}$ |
| 179. | $L_{A84}$ | $L_{B2}$ |
| 180. | $L_{A85}$ | $L_{B2}$ |
| 181. | $L_{A86}$ | $L_{B2}$ |
| 182. | $L_{A87}$ | $L_{B2}$ |

TABLE 1-continued

| Cpd # | $L_A$ | $L_B$ |
|---|---|---|
| 183. | $L_{A88}$ | $L_{B2}$ |
| 184. | $L_{A89}$ | $L_{B2}$ |
| 185. | $L_{A90}$ | $L_{B2}$ |
| 186. | $L_{A91}$ | $L_{B2}$ |
| 187. | $L_{A92}$ | $L_{B2}$ |
| 188. | $L_{A93}$ | $L_{B2}$ |
| 189. | $L_{A94}$ | $L_{B2}$ |
| 190. | $L_{A95}$ | $L_{B2}$ |
| 191. | $L_{A1}$ | $L_{B3}$ |
| 192. | $L_{A2}$ | $L_{B3}$ |
| 193. | $L_{A3}$ | $L_{B3}$ |
| 194. | $L_{A4}$ | $L_{B3}$ |
| 195. | $L_{A5}$ | $L_{B3}$ |
| 196. | $L_{A6}$ | $L_{B3}$ |
| 197. | $L_{A7}$ | $L_{B3}$ |
| 198. | $L_{A8}$ | $L_{B3}$ |
| 199. | $L_{A9}$ | $L_{B3}$ |
| 200. | $L_{A10}$ | $L_{B3}$ |
| 201. | $L_{A11}$ | $L_{B3}$ |
| 202. | $L_{A12}$ | $L_{B3}$ |
| 203. | $L_{A13}$ | $L_{B3}$ |
| 204. | $L_{A14}$ | $L_{B3}$ |
| 205. | $L_{A15}$ | $L_{B3}$ |
| 206. | $L_{A16}$ | $L_{B3}$ |
| 207. | $L_{A17}$ | $L_{B3}$ |
| 208. | $L_{A18}$ | $L_{B3}$ |
| 209. | $L_{A19}$ | $L_{B3}$ |
| 210. | $L_{A20}$ | $L_{B3}$ |
| 211. | $L_{A21}$ | $L_{B3}$ |
| 212. | $L_{A22}$ | $L_{B3}$ |
| 213. | $L_{A23}$ | $L_{B3}$ |
| 214. | $L_{A24}$ | $L_{B3}$ |
| 215. | $L_{A25}$ | $L_{B3}$ |
| 216. | $L_{A26}$ | $L_{B3}$ |
| 217. | $L_{A27}$ | $L_{B3}$ |
| 218. | $L_{A28}$ | $L_{B3}$ |
| 219. | $L_{A29}$ | $L_{B3}$ |
| 220. | $L_{A30}$ | $L_{B3}$ |
| 221. | $L_{A31}$ | $L_{B3}$ |
| 222. | $L_{A32}$ | $L_{B3}$ |
| 223. | $L_{A33}$ | $L_{B3}$ |
| 224. | $L_{A34}$ | $L_{B3}$ |
| 225. | $L_{A35}$ | $L_{B3}$ |
| 226. | $L_{A36}$ | $L_{B3}$ |
| 227. | $L_{A37}$ | $L_{B3}$ |
| 228. | $L_{A38}$ | $L_{B3}$ |
| 229. | $L_{A39}$ | $L_{B3}$ |
| 230. | $L_{A40}$ | $L_{B3}$ |
| 231. | $L_{A41}$ | $L_{B3}$ |
| 232. | $L_{A42}$ | $L_{B3}$ |
| 233. | $L_{A43}$ | $L_{B3}$ |
| 234. | $L_{A44}$ | $L_{B3}$ |
| 235. | $L_{A45}$ | $L_{B3}$ |
| 236. | $L_{A46}$ | $L_{B3}$ |
| 237. | $L_{A47}$ | $L_{B3}$ |
| 238. | $L_{A48}$ | $L_{B3}$ |
| 239. | $L_{A49}$ | $L_{B3}$ |
| 240. | $L_{A50}$ | $L_{B3}$ |
| 241. | $L_{A51}$ | $L_{B3}$ |
| 242. | $L_{A52}$ | $L_{B3}$ |
| 243. | $L_{A53}$ | $L_{B3}$ |
| 244. | $L_{A54}$ | $L_{B3}$ |
| 245. | $L_{A55}$ | $L_{B3}$ |
| 246. | $L_{A56}$ | $L_{B3}$ |
| 247. | $L_{A57}$ | $L_{B3}$ |
| 248. | $L_{A58}$ | $L_{B3}$ |
| 249. | $L_{A59}$ | $L_{B3}$ |
| 250. | $L_{A60}$ | $L_{B3}$ |
| 251. | $L_{A61}$ | $L_{B3}$ |
| 252. | $L_{A62}$ | $L_{B3}$ |
| 253. | $L_{A63}$ | $L_{B3}$ |
| 254. | $L_{A64}$ | $L_{B3}$ |
| 255. | $L_{A65}$ | $L_{B3}$ |
| 256. | $L_{A66}$ | $L_{B3}$ |
| 257. | $L_{A67}$ | $L_{B3}$ |
| 258. | $L_{A68}$ | $L_{B3}$ |
| 259. | $L_{A69}$ | $L_{B3}$ |
| 260. | $L_{A70}$ | $L_{B3}$ |

TABLE 1-continued

| Cpd # | $L_A$ | $L_B$ |
|---|---|---|
| 261. | $L_{A71}$ | $L_{B3}$ |
| 262. | $L_{A72}$ | $L_{B3}$ |
| 263. | $L_{A73}$ | $L_{B3}$ |
| 264. | $L_{A74}$ | $L_{B3}$ |
| 265. | $L_{A75}$ | $L_{B3}$ |
| 266. | $L_{A76}$ | $L_{B3}$ |
| 267. | $L_{A77}$ | $L_{B3}$ |
| 268. | $L_{A78}$ | $L_{B3}$ |
| 269. | $L_{A79}$ | $L_{B3}$ |
| 270. | $L_{A80}$ | $L_{B3}$ |
| 271. | $L_{A81}$ | $L_{B3}$ |
| 272. | $L_{A82}$ | $L_{B3}$ |
| 273. | $L_{A83}$ | $L_{B3}$ |
| 274. | $L_{A84}$ | $L_{B3}$ |
| 275. | $L_{A85}$ | $L_{B3}$ |
| 276. | $L_{A86}$ | $L_{B3}$ |
| 277. | $L_{A87}$ | $L_{B3}$ |
| 278. | $L_{A88}$ | $L_{B3}$ |
| 279. | $L_{A89}$ | $L_{B3}$ |
| 280. | $L_{A90}$ | $L_{B3}$ |
| 281. | $L_{A91}$ | $L_{B3}$ |
| 282. | $L_{A92}$ | $L_{B3}$ |
| 283. | $L_{A93}$ | $L_{B3}$ |
| 284. | $L_{A94}$ | $L_{B3}$ |
| 285. | $L_{A95}$ | $L_{B3}$ |
| 286. | $L_{A1}$ | $L_{B4}$ |
| 287. | $L_{A2}$ | $L_{B4}$ |
| 288. | $L_{A3}$ | $L_{B4}$ |
| 289. | $L_{A4}$ | $L_{B4}$ |
| 290. | $L_{A5}$ | $L_{B4}$ |
| 291. | $L_{A6}$ | $L_{B4}$ |
| 292. | $L_{A7}$ | $L_{B4}$ |
| 293. | $L_{A8}$ | $L_{B4}$ |
| 294. | $L_{A9}$ | $L_{B4}$ |
| 295. | $L_{A10}$ | $L_{B4}$ |
| 296. | $L_{A11}$ | $L_{B4}$ |
| 297. | $L_{A12}$ | $L_{B4}$ |
| 298. | $L_{A13}$ | $L_{B4}$ |
| 299. | $L_{A14}$ | $L_{B4}$ |
| 300. | $L_{A15}$ | $L_{B4}$ |
| 301. | $L_{A16}$ | $L_{B4}$ |
| 302. | $L_{A17}$ | $L_{B4}$ |
| 303. | $L_{A18}$ | $L_{B4}$ |
| 304. | $L_{A19}$ | $L_{B4}$ |
| 305. | $L_{A20}$ | $L_{B4}$ |
| 306. | $L_{A21}$ | $L_{B4}$ |
| 307. | $L_{A22}$ | $L_{B4}$ |
| 308. | $L_{A23}$ | $L_{B4}$ |
| 309. | $L_{A24}$ | $L_{B4}$ |
| 310. | $L_{A25}$ | $L_{B4}$ |
| 311. | $L_{A26}$ | $L_{B4}$ |
| 312. | $L_{A27}$ | $L_{B4}$ |
| 313. | $L_{A28}$ | $L_{B4}$ |
| 314. | $L_{A29}$ | $L_{B4}$ |
| 315. | $L_{A30}$ | $L_{B4}$ |
| 316. | $L_{A31}$ | $L_{B4}$ |
| 317. | $L_{A32}$ | $L_{B4}$ |
| 318. | $L_{A33}$ | $L_{B4}$ |
| 319. | $L_{A34}$ | $L_{B4}$ |
| 320. | $L_{A35}$ | $L_{B4}$ |
| 321. | $L_{A36}$ | $L_{B4}$ |
| 322. | $L_{A37}$ | $L_{B4}$ |
| 323. | $L_{A38}$ | $L_{B4}$ |
| 324. | $L_{A39}$ | $L_{B4}$ |
| 325. | $L_{A40}$ | $L_{B4}$ |
| 326. | $L_{A41}$ | $L_{B4}$ |
| 327. | $L_{A42}$ | $L_{B4}$ |
| 328. | $L_{A43}$ | $L_{B4}$ |
| 329. | $L_{A44}$ | $L_{B4}$ |
| 330. | $L_{A45}$ | $L_{B4}$ |
| 331. | $L_{A46}$ | $L_{B4}$ |
| 332. | $L_{A47}$ | $L_{B4}$ |
| 333. | $L_{A48}$ | $L_{B4}$ |
| 334. | $L_{A49}$ | $L_{B4}$ |
| 335. | $L_{A50}$ | $L_{B4}$ |
| 336. | $L_{A51}$ | $L_{B4}$ |
| 337. | $L_{A52}$ | $L_{B4}$ |
| 338. | $L_{A53}$ | $L_{B4}$ |

TABLE 1-continued

| Cpd # | $L_A$ | $L_B$ |
|---|---|---|
| 339. | $L_{A54}$ | $L_{B4}$ |
| 340. | $L_{A55}$ | $L_{B4}$ |
| 341. | $L_{A56}$ | $L_{B4}$ |
| 342. | $L_{A57}$ | $L_{B4}$ |
| 343. | $L_{A55}$ | $L_{B4}$ |
| 344. | $L_{A59}$ | $L_{B4}$ |
| 345. | $L_{A60}$ | $L_{B4}$ |
| 346. | $L_{A61}$ | $L_{B4}$ |
| 347. | $L_{A62}$ | $L_{B4}$ |
| 348. | $L_{A63}$ | $L_{B4}$ |
| 349. | $L_{A64}$ | $L_{B4}$ |
| 350. | $L_{A65}$ | $L_{B4}$ |
| 351. | $L_{A66}$ | $L_{B4}$ |
| 352. | $L_{A67}$ | $L_{B4}$ |
| 353. | $L_{A68}$ | $L_{B4}$ |
| 354. | $L_{A69}$ | $L_{B4}$ |
| 355. | $L_{A70}$ | $L_{B4}$ |
| 356. | $L_{A71}$ | $L_{B4}$ |
| 357. | $L_{A72}$ | $L_{B4}$ |
| 358. | $L_{A73}$ | $L_{B4}$ |
| 359. | $L_{A74}$ | $L_{B4}$ |
| 360. | $L_{A75}$ | $L_{B4}$ |
| 361. | $L_{A76}$ | $L_{B4}$ |
| 362. | $L_{A77}$ | $L_{B4}$ |
| 363. | $L_{A78}$ | $L_{B4}$ |
| 364. | $L_{A79}$ | $L_{B4}$ |
| 365. | $L_{A80}$ | $L_{B4}$ |
| 366. | $L_{A81}$ | $L_{B4}$ |
| 367. | $L_{A82}$ | $L_{B4}$ |
| 368. | $L_{A83}$ | $L_{B4}$ |
| 369. | $L_{A84}$ | $L_{B4}$ |
| 370. | $L_{A85}$ | $L_{B4}$ |
| 371. | $L_{A86}$ | $L_{B4}$ |
| 372. | $L_{A87}$ | $L_{B4}$ |
| 373. | $L_{A88}$ | $L_{B4}$ |
| 374. | $L_{A89}$ | $L_{B4}$ |
| 375. | $L_{A90}$ | $L_{B4}$ |
| 376. | $L_{A91}$ | $L_{B4}$ |
| 377. | $L_{A92}$ | $L_{B4}$ |
| 378. | $L_{A93}$ | $L_{B4}$ |
| 379. | $L_{A94}$ | $L_{B4}$ |
| 380. | $L_{A95}$ | $L_{B4}$ |
| 381. | $L_{A1}$ | $L_{B5}$ |
| 382. | $L_{A2}$ | $L_{B5}$ |
| 383. | $L_{A3}$ | $L_{B5}$ |
| 384. | $L_{A4}$ | $L_{B5}$ |
| 385. | $L_{A5}$ | $L_{B5}$ |
| 386. | $L_{A6}$ | $L_{B5}$ |
| 387. | $L_{A7}$ | $L_{B5}$ |
| 388. | $L_{A8}$ | $L_{B5}$ |
| 389. | $L_{A9}$ | $L_{B5}$ |
| 390. | $L_{A10}$ | $L_{B5}$ |
| 391. | $L_{A11}$ | $L_{B5}$ |
| 392. | $L_{A12}$ | $L_{B5}$ |
| 393. | $L_{A13}$ | $L_{B5}$ |
| 394. | $L_{A14}$ | $L_{B5}$ |
| 395. | $L_{A15}$ | $L_{B5}$ |
| 396. | $L_{A16}$ | $L_{B5}$ |
| 397. | $L_{A17}$ | $L_{B5}$ |
| 398. | $L_{A18}$ | $L_{B5}$ |
| 399. | $L_{A19}$ | $L_{B5}$ |
| 400. | $L_{A20}$ | $L_{B5}$ |
| 401. | $L_{A21}$ | $L_{B5}$ |
| 402. | $L_{A22}$ | $L_{B5}$ |
| 403. | $L_{A23}$ | $L_{B5}$ |
| 404. | $L_{A24}$ | $L_{B5}$ |
| 405. | $L_{A25}$ | $L_{B5}$ |
| 406. | $L_{A26}$ | $L_{B5}$ |
| 407. | $L_{A27}$ | $L_{B5}$ |
| 408. | $L_{A28}$ | $L_{B5}$ |
| 409. | $L_{A29}$ | $L_{B5}$ |
| 410. | $L_{A30}$ | $L_{B5}$ |
| 411. | $L_{A31}$ | $L_{B5}$ |
| 412. | $L_{A32}$ | $L_{B5}$ |
| 413. | $L_{A33}$ | $L_{B5}$ |
| 414. | $L_{A34}$ | $L_{B5}$ |
| 415. | $L_{A35}$ | $L_{B5}$ |
| 416. | $L_{A36}$ | $L_{B5}$ |

TABLE 1-continued

| Cpd # | $L_A$ | $L_B$ |
|---|---|---|
| 417. | $L_{A37}$ | $L_{B5}$ |
| 418. | $L_{A38}$ | $L_{B5}$ |
| 419. | $L_{A39}$ | $L_{B5}$ |
| 420. | $L_{A40}$ | $L_{B5}$ |
| 421. | $L_{A41}$ | $L_{B5}$ |
| 422. | $L_{A42}$ | $L_{B5}$ |
| 423. | $L_{A43}$ | $L_{B5}$ |
| 424. | $L_{A44}$ | $L_{B5}$ |
| 425. | $L_{A45}$ | $L_{B5}$ |
| 426. | $L_{A46}$ | $L_{B5}$ |
| 427. | $L_{A47}$ | $L_{B5}$ |
| 428. | $L_{A48}$ | $L_{B5}$ |
| 429. | $L_{A49}$ | $L_{B5}$ |
| 430. | $L_{A50}$ | $L_{B5}$ |
| 431. | $L_{A51}$ | $L_{B5}$ |
| 432. | $L_{A52}$ | $L_{B5}$ |
| 433. | $L_{A53}$ | $L_{B5}$ |
| 434. | $L_{A54}$ | $L_{B5}$ |
| 435. | $L_{A55}$ | $L_{B5}$ |
| 436. | $L_{A56}$ | $L_{B5}$ |
| 437. | $L_{A57}$ | $L_{B5}$ |
| 438. | $L_{A58}$ | $L_{B5}$ |
| 439. | $L_{A59}$ | $L_{B5}$ |
| 440. | $L_{A60}$ | $L_{B5}$ |
| 441. | $L_{A61}$ | $L_{B5}$ |
| 442. | $L_{A62}$ | $L_{B5}$ |
| 443. | $L_{A63}$ | $L_{B5}$ |
| 444. | $L_{A64}$ | $L_{B5}$ |
| 445. | $L_{A65}$ | $L_{B5}$ |
| 446. | $L_{A66}$ | $L_{B5}$ |
| 447. | $L_{A67}$ | $L_{B5}$ |
| 448. | $L_{A68}$ | $L_{B5}$ |
| 449. | $L_{A69}$ | $L_{B5}$ |
| 450. | $L_{A70}$ | $L_{B5}$ |
| 451. | $L_{A71}$ | $L_{B5}$ |
| 452. | $L_{A72}$ | $L_{B5}$ |
| 453. | $L_{A73}$ | $L_{B5}$ |
| 454. | $L_{A74}$ | $L_{B5}$ |
| 455. | $L_{A75}$ | $L_{B5}$ |
| 456. | $L_{A76}$ | $L_{B5}$ |
| 457. | $L_{A77}$ | $L_{B5}$ |
| 458. | $L_{A78}$ | $L_{B5}$ |
| 459. | $L_{A79}$ | $L_{B5}$ |
| 460. | $L_{A80}$ | $L_{B5}$ |
| 461. | $L_{A81}$ | $L_{B5}$ |
| 462. | $L_{A82}$ | $L_{B5}$ |
| 463. | $L_{A83}$ | $L_{B5}$ |
| 464. | $L_{A84}$ | $L_{B5}$ |
| 465. | $L_{A85}$ | $L_{B5}$ |
| 466. | $L_{A86}$ | $L_{B5}$ |
| 467. | $L_{A87}$ | $L_{B5}$ |
| 468. | $L_{A88}$ | $L_{B5}$ |
| 469. | $L_{A89}$ | $L_{B5}$ |
| 470. | $L_{A90}$ | $L_{B5}$ |
| 471. | $L_{A91}$ | $L_{B5}$ |
| 472. | $L_{A92}$ | $L_{B5}$ |
| 473. | $L_{A93}$ | $L_{B5}$ |
| 474. | $L_{A94}$ | $L_{B5}$ |
| 475. | $L_{A95}$ | $L_{B5}$ |
| 476. | $L_{A1}$ | $L_{B6}$ |
| 477. | $L_{A2}$ | $L_{B6}$ |
| 478. | $L_{A3}$ | $L_{B6}$ |
| 479. | $L_{A4}$ | $L_{B6}$ |
| 480. | $L_{A5}$ | $L_{B6}$ |
| 481. | $L_{A6}$ | $L_{B6}$ |
| 482. | $L_{A7}$ | $L_{B6}$ |
| 483. | $L_{A8}$ | $L_{B6}$ |
| 484. | $L_{A9}$ | $L_{B6}$ |
| 485. | $L_{A10}$ | $L_{B6}$ |
| 486. | $L_{A11}$ | $L_{B6}$ |
| 487. | $L_{A12}$ | $L_{B6}$ |
| 488. | $L_{A13}$ | $L_{B6}$ |
| 489. | $L_{A14}$ | $L_{B6}$ |
| 490. | $L_{A15}$ | $L_{B6}$ |
| 491. | $L_{A16}$ | $L_{B6}$ |
| 492. | $L_{A17}$ | $L_{B6}$ |
| 493. | $L_{A18}$ | $L_{B6}$ |
| 494. | $L_{A19}$ | $L_{B6}$ |

TABLE 1-continued

| Cpd # | $L_A$ | $L_B$ |
|---|---|---|
| 495. | $L_{A20}$ | $L_{B6}$ |
| 496. | $L_{A21}$ | $L_{B6}$ |
| 497. | $L_{A22}$ | $L_{B6}$ |
| 498. | $L_{A23}$ | $L_{B6}$ |
| 499. | $L_{A24}$ | $L_{B6}$ |
| 500. | $L_{A25}$ | $L_{B6}$ |
| 501. | $L_{A26}$ | $L_{B6}$ |
| 502. | $L_{A27}$ | $L_{B6}$ |
| 503. | $L_{A28}$ | $L_{B6}$ |
| 504. | $L_{A29}$ | $L_{B6}$ |
| 505. | $L_{A30}$ | $L_{B6}$ |
| 506. | $L_{A31}$ | $L_{B6}$ |
| 507. | $L_{A32}$ | $L_{B6}$ |
| 508. | $L_{A33}$ | $L_{B6}$ |
| 509. | $L_{A34}$ | $L_{B6}$ |
| 510. | $L_{A35}$ | $L_{B6}$ |
| 511. | $L_{A36}$ | $L_{B6}$ |
| 512. | $L_{A37}$ | $L_{B6}$ |
| 513. | $L_{A38}$ | $L_{B6}$ |
| 514. | $L_{A39}$ | $L_{B6}$ |
| 515. | $L_{A40}$ | $L_{B6}$ |
| 516. | $L_{A41}$ | $L_{B6}$ |
| 517. | $L_{A42}$ | $L_{B6}$ |
| 518. | $L_{A43}$ | $L_{B6}$ |
| 519. | $L_{A44}$ | $L_{B6}$ |
| 520. | $L_{A45}$ | $L_{B6}$ |
| 521. | $L_{A46}$ | $L_{B6}$ |
| 522. | $L_{A47}$ | $L_{B6}$ |
| 523. | $L_{A48}$ | $L_{B6}$ |
| 524. | $L_{A49}$ | $L_{B6}$ |
| 525. | $L_{A50}$ | $L_{B6}$ |
| 526. | $L_{A51}$ | $L_{B6}$ |
| 527. | $L_{A52}$ | $L_{B6}$ |
| 528. | $L_{A53}$ | $L_{B6}$ |
| 529. | $L_{A54}$ | $L_{B6}$ |
| 530. | $L_{A55}$ | $L_{B6}$ |
| 531. | $L_{A56}$ | $L_{B6}$ |
| 532. | $L_{A57}$ | $L_{B6}$ |
| 533. | $L_{A58}$ | $L_{B6}$ |
| 534. | $L_{A59}$ | $L_{B6}$ |
| 535. | $L_{A60}$ | $L_{B6}$ |
| 536. | $L_{A61}$ | $L_{B6}$ |
| 537. | $L_{A62}$ | $L_{B6}$ |
| 538. | $L_{A63}$ | $L_{B6}$ |
| 539. | $L_{A64}$ | $L_{B6}$ |
| 540. | $L_{A65}$ | $L_{B6}$ |
| 541. | $L_{A66}$ | $L_{B6}$ |
| 542. | $L_{A67}$ | $L_{B6}$ |
| 543. | $L_{A68}$ | $L_{B6}$ |
| 544. | $L_{A69}$ | $L_{B6}$ |
| 545. | $L_{A70}$ | $L_{B6}$ |
| 546. | $L_{A71}$ | $L_{B6}$ |
| 547. | $L_{A72}$ | $L_{B6}$ |
| 548. | $L_{A73}$ | $L_{B6}$ |
| 549. | $L_{A74}$ | $L_{B6}$ |
| 550. | $L_{A75}$ | $L_{B6}$ |
| 551. | $L_{A76}$ | $L_{B6}$ |
| 552. | $L_{A77}$ | $L_{B6}$ |
| 553. | $L_{A78}$ | $L_{B6}$ |
| 554. | $L_{A79}$ | $L_{B6}$ |
| 555. | $L_{A80}$ | $L_{B6}$ |
| 556. | $L_{A81}$ | $L_{B6}$ |
| 557. | $L_{A82}$ | $L_{B6}$ |
| 558. | $L_{A83}$ | $L_{B6}$ |
| 559. | $L_{A84}$ | $L_{B6}$ |
| 560. | $L_{A85}$ | $L_{B6}$ |
| 561. | $L_{A86}$ | $L_{B6}$ |
| 562. | $L_{A87}$ | $L_{B6}$ |
| 563. | $L_{A88}$ | $L_{B6}$ |
| 564. | $L_{A89}$ | $L_{B6}$ |
| 565. | $L_{A90}$ | $L_{B6}$ |
| 566. | $L_{A91}$ | $L_{B6}$ |
| 567. | $L_{A92}$ | $L_{B6}$ |
| 568. | $L_{A93}$ | $L_{B6}$ |
| 569. | $L_{A94}$ | $L_{B6}$ |
| 570. | $L_{A95}$ | $L_{B6}$ |
| 571. | $L_{A1}$ | $L_{B7}$ |
| 572. | $L_{A2}$ | $L_{B7}$ |

TABLE 1-continued

| Cpd # | $L_A$ | $L_B$ |
|---|---|---|
| 573. | $L_{A3}$ | $L_{B7}$ |
| 574. | $L_{A4}$ | $L_{B7}$ |
| 575. | $L_{A5}$ | $L_{B7}$ |
| 576. | $L_{A6}$ | $L_{B7}$ |
| 577. | $L_{A7}$ | $L_{B7}$ |
| 578. | $L_{A8}$ | $L_{B7}$ |
| 579. | $L_{A9}$ | $L_{B7}$ |
| 580. | $L_{A10}$ | $L_{B7}$ |
| 581. | $L_{A11}$ | $L_{B7}$ |
| 582. | $L_{A12}$ | $L_{B7}$ |
| 583. | $L_{A13}$ | $L_{B7}$ |
| 584. | $L_{A14}$ | $L_{B7}$ |
| 585. | $L_{A15}$ | $L_{B7}$ |
| 586. | $L_{A16}$ | $L_{B7}$ |
| 587. | $L_{A17}$ | $L_{B7}$ |
| 588. | $L_{A18}$ | $L_{B7}$ |
| 589. | $L_{A19}$ | $L_{B7}$ |
| 590. | $L_{A20}$ | $L_{B7}$ |
| 591. | $L_{A21}$ | $L_{B7}$ |
| 592. | $L_{A22}$ | $L_{B7}$ |
| 593. | $L_{A23}$ | $L_{B7}$ |
| 594. | $L_{A24}$ | $L_{B7}$ |
| 595. | $L_{A25}$ | $L_{B7}$ |
| 596. | $L_{A26}$ | $L_{B7}$ |
| 597. | $L_{A27}$ | $L_{B7}$ |
| 598. | $L_{A28}$ | $L_{B7}$ |
| 599. | $L_{A29}$ | $L_{B7}$ |
| 600. | $L_{A30}$ | $L_{B7}$ |
| 601. | $L_{A31}$ | $L_{B7}$ |
| 602. | $L_{A32}$ | $L_{B7}$ |
| 603. | $L_{A33}$ | $L_{B7}$ |
| 604. | $L_{A34}$ | $L_{B7}$ |
| 605. | $L_{A35}$ | $L_{B7}$ |
| 606. | $L_{A36}$ | $L_{B7}$ |
| 607. | $L_{A37}$ | $L_{B7}$ |
| 608. | $L_{A38}$ | $L_{B7}$ |
| 609. | $L_{A39}$ | $L_{B7}$ |
| 610. | $L_{A40}$ | $L_{B7}$ |
| 611. | $L_{A41}$ | $L_{B7}$ |
| 612. | $L_{A42}$ | $L_{B7}$ |
| 613. | $L_{A43}$ | $L_{B7}$ |
| 614. | $L_{A44}$ | $L_{B7}$ |
| 615. | $L_{A45}$ | $L_{B7}$ |
| 616. | $L_{A46}$ | $L_{B7}$ |
| 617. | $L_{A47}$ | $L_{B7}$ |
| 618. | $L_{A48}$ | $L_{B7}$ |
| 619. | $L_{A49}$ | $L_{B7}$ |
| 620. | $L_{A50}$ | $L_{B7}$ |
| 621. | $L_{A51}$ | $L_{B7}$ |
| 622. | $L_{A52}$ | $L_{B7}$ |
| 623. | $L_{A53}$ | $L_{B7}$ |
| 624. | $L_{A54}$ | $L_{B7}$ |
| 625. | $L_{A55}$ | $L_{B7}$ |
| 626. | $L_{A56}$ | $L_{B7}$ |
| 627. | $L_{A57}$ | $L_{B7}$ |
| 628. | $L_{A58}$ | $L_{B7}$ |
| 629. | $L_{A59}$ | $L_{B7}$ |
| 630. | $L_{A60}$ | $L_{B7}$ |
| 631. | $L_{A61}$ | $L_{B7}$ |
| 632. | $L_{A62}$ | $L_{B7}$ |
| 633. | $L_{A63}$ | $L_{B7}$ |
| 634. | $L_{A64}$ | $L_{B7}$ |
| 635. | $L_{A65}$ | $L_{B7}$ |
| 636. | $L_{A66}$ | $L_{B7}$ |
| 637. | $L_{A67}$ | $L_{B7}$ |
| 638. | $L_{A68}$ | $L_{B7}$ |
| 639. | $L_{A69}$ | $L_{B7}$ |
| 640. | $L_{A70}$ | $L_{B7}$ |
| 641. | $L_{A71}$ | $L_{B7}$ |
| 642. | $L_{A72}$ | $L_{B7}$ |
| 643. | $L_{A73}$ | $L_{B7}$ |
| 644. | $L_{A74}$ | $L_{B7}$ |
| 645. | $L_{A75}$ | $L_{B7}$ |
| 646. | $L_{A76}$ | $L_{B7}$ |
| 647. | $L_{A77}$ | $L_{B7}$ |
| 648. | $L_{A78}$ | $L_{B7}$ |
| 649. | $L_{A79}$ | $L_{B7}$ |
| 650. | $L_{A80}$ | $L_{B7}$ |
| 651. | $L_{A81}$ | $L_{B7}$ |
| 652. | $L_{A82}$ | $L_{B7}$ |
| 653. | $L_{A83}$ | $L_{B7}$ |
| 654. | $L_{A84}$ | $L_{B7}$ |
| 655. | $L_{A85}$ | $L_{B7}$ |
| 656. | $L_{A86}$ | $L_{B7}$ |
| 657. | $L_{A87}$ | $L_{B7}$ |
| 658. | $L_{A88}$ | $L_{B7}$ |
| 659. | $L_{A89}$ | $L_{B7}$ |
| 660. | $L_{A90}$ | $L_{B7}$ |
| 661. | $L_{A91}$ | $L_{B7}$ |
| 662. | $L_{A92}$ | $L_{B7}$ |
| 663. | $L_{A93}$ | $L_{B7}$ |
| 664. | $L_{A94}$ | $L_{B7}$ |
| 665. | $L_{A95}$ | $L_{B7}$ |
| 666. | $L_{A1}$ | $L_{B8}$ |
| 667. | $L_{A2}$ | $L_{B8}$ |
| 668. | $L_{A3}$ | $L_{B8}$ |
| 669. | $L_{A4}$ | $L_{B8}$ |
| 670. | $L_{A5}$ | $L_{B8}$ |
| 671. | $L_{A6}$ | $L_{B8}$ |
| 672. | $L_{A7}$ | $L_{B8}$ |
| 673. | $L_{A8}$ | $L_{B8}$ |
| 674. | $L_{A9}$ | $L_{B8}$ |
| 675. | $L_{A10}$ | $L_{B8}$ |
| 676. | $L_{A11}$ | $L_{B8}$ |
| 677. | $L_{A12}$ | $L_{B8}$ |
| 678. | $L_{A13}$ | $L_{B8}$ |
| 679. | $L_{A14}$ | $L_{B8}$ |
| 680. | $L_{A15}$ | $L_{B8}$ |
| 681. | $L_{A16}$ | $L_{B8}$ |
| 682. | $L_{A17}$ | $L_{B8}$ |
| 683. | $L_{A18}$ | $L_{B8}$ |
| 684. | $L_{A19}$ | $L_{B8}$ |
| 685. | $L_{A20}$ | $L_{B8}$ |
| 686. | $L_{A21}$ | $L_{B8}$ |
| 687. | $L_{A22}$ | $L_{B8}$ |
| 688. | $L_{A23}$ | $L_{B8}$ |
| 689. | $L_{A24}$ | $L_{B8}$ |
| 690. | $L_{A25}$ | $L_{B8}$ |
| 691. | $L_{A26}$ | $L_{B8}$ |
| 692. | $L_{A27}$ | $L_{B8}$ |
| 693. | $L_{A28}$ | $L_{B8}$ |
| 694. | $L_{A29}$ | $L_{B8}$ |
| 695. | $L_{A30}$ | $L_{B8}$ |
| 696. | $L_{A31}$ | $L_{B8}$ |
| 697. | $L_{A32}$ | $L_{B8}$ |
| 698. | $L_{A33}$ | $L_{B8}$ |
| 699. | $L_{A34}$ | $L_{B8}$ |
| 700. | $L_{A35}$ | $L_{B8}$ |
| 701. | $L_{A36}$ | $L_{B8}$ |
| 702. | $L_{A37}$ | $L_{B8}$ |
| 703. | $L_{A38}$ | $L_{B8}$ |
| 704. | $L_{A39}$ | $L_{B8}$ |
| 705. | $L_{A40}$ | $L_{B8}$ |
| 706. | $L_{A41}$ | $L_{B8}$ |
| 707. | $L_{A42}$ | $L_{B8}$ |
| 708. | $L_{A43}$ | $L_{B8}$ |
| 709. | $L_{A44}$ | $L_{B8}$ |
| 710. | $L_{A45}$ | $L_{B8}$ |
| 711. | $L_{A46}$ | $L_{B8}$ |
| 712. | $L_{A47}$ | $L_{B8}$ |
| 713. | $L_{A48}$ | $L_{B8}$ |
| 714. | $L_{A49}$ | $L_{B8}$ |
| 715. | $L_{A50}$ | $L_{B8}$ |
| 716. | $L_{A51}$ | $L_{B8}$ |
| 717. | $L_{A52}$ | $L_{B8}$ |
| 718. | $L_{A53}$ | $L_{B8}$ |
| 719. | $L_{A54}$ | $L_{B8}$ |
| 720. | $L_{A55}$ | $L_{B8}$ |
| 721. | $L_{A56}$ | $L_{B8}$ |
| 722. | $L_{A57}$ | $L_{B8}$ |
| 723. | $L_{A58}$ | $L_{B8}$ |
| 724. | $L_{A59}$ | $L_{B8}$ |
| 725. | $L_{A60}$ | $L_{B8}$ |
| 726. | $L_{A61}$ | $L_{B8}$ |
| 727. | $L_{A62}$ | $L_{B8}$ |
| 728. | $L_{A63}$ | $L_{B8}$ |

TABLE 1-continued

| Cpd # | $L_A$ | $L_B$ |
|---|---|---|
| 729. | $L_{A64}$ | $L_{B8}$ |
| 730. | $L_{A65}$ | $L_{B8}$ |
| 731. | $L_{A66}$ | $L_{B8}$ |
| 732. | $L_{A67}$ | $L_{B8}$ |
| 733. | $L_{A68}$ | $L_{B8}$ |
| 734. | $L_{A69}$ | $L_{B8}$ |
| 735. | $L_{A70}$ | $L_{B8}$ |
| 736. | $L_{A71}$ | $L_{B8}$ |
| 737. | $L_{A72}$ | $L_{B8}$ |
| 738. | $L_{A73}$ | $L_{B8}$ |
| 739. | $L_{A74}$ | $L_{B8}$ |
| 740. | $L_{A75}$ | $L_{B8}$ |
| 741. | $L_{A76}$ | $L_{B8}$ |
| 742. | $L_{A77}$ | $L_{B8}$ |
| 743. | $L_{A78}$ | $L_{B8}$ |
| 744. | $L_{A79}$ | $L_{B8}$ |
| 745. | $L_{A80}$ | $L_{B8}$ |
| 746. | $L_{A81}$ | $L_{B8}$ |
| 747. | $L_{A82}$ | $L_{B8}$ |
| 748. | $L_{A83}$ | $L_{B8}$ |
| 749. | $L_{A84}$ | $L_{B8}$ |
| 750. | $L_{A85}$ | $L_{B8}$ |
| 751. | $L_{A86}$ | $L_{B8}$ |
| 752. | $L_{A87}$ | $L_{B8}$ |
| 753. | $L_{A88}$ | $L_{B8}$ |
| 754. | $L_{A89}$ | $L_{B8}$ |
| 755. | $L_{A90}$ | $L_{B8}$ |
| 756. | $L_{A91}$ | $L_{B8}$ |
| 757. | $L_{A92}$ | $L_{B8}$ |
| 758. | $L_{A93}$ | $L_{B8}$ |
| 759. | $L_{A94}$ | $L_{B8}$ |
| 760. | $L_{A95}$ | $L_{B8}$ |
| 761. | $L_{A1}$ | $L_{B9}$ |
| 762. | $L_{A2}$ | $L_{B9}$ |
| 763. | $L_{A3}$ | $L_{B9}$ |
| 764. | $L_{A4}$ | $L_{B9}$ |
| 765. | $L_{A5}$ | $L_{B9}$ |
| 766. | $L_{A6}$ | $L_{B9}$ |
| 767. | $L_{A7}$ | $L_{B9}$ |
| 768. | $L_{A8}$ | $L_{B9}$ |
| 769. | $L_{A9}$ | $L_{B9}$ |
| 770. | $L_{A10}$ | $L_{B9}$ |
| 771. | $L_{A11}$ | $L_{B9}$ |
| 772. | $L_{A12}$ | $L_{B9}$ |
| 773. | $L_{A13}$ | $L_{B9}$ |
| 774. | $L_{A14}$ | $L_{B9}$ |
| 775. | $L_{A15}$ | $L_{B9}$ |
| 776. | $L_{A16}$ | $L_{B9}$ |
| 777. | $L_{A17}$ | $L_{B9}$ |
| 778. | $L_{A18}$ | $L_{B9}$ |
| 779. | $L_{A19}$ | $L_{B9}$ |
| 780. | $L_{A20}$ | $L_{B9}$ |
| 781. | $L_{A21}$ | $L_{B9}$ |
| 782. | $L_{A22}$ | $L_{B9}$ |
| 783. | $L_{A23}$ | $L_{B9}$ |
| 784. | $L_{A24}$ | $L_{B9}$ |
| 785. | $L_{A25}$ | $L_{B9}$ |
| 786. | $L_{A26}$ | $L_{B9}$ |
| 787. | $L_{A27}$ | $L_{B9}$ |
| 788. | $L_{A28}$ | $L_{B9}$ |
| 789. | $L_{A29}$ | $L_{B9}$ |
| 790. | $L_{A30}$ | $L_{B9}$ |
| 791. | $L_{A31}$ | $L_{B9}$ |
| 792. | $L_{A32}$ | $L_{B9}$ |
| 793. | $L_{A33}$ | $L_{B9}$ |
| 794. | $L_{A34}$ | $L_{B9}$ |
| 795. | $L_{A35}$ | $L_{B9}$ |
| 796. | $L_{A36}$ | $L_{B9}$ |
| 797. | $L_{A37}$ | $L_{B9}$ |
| 798. | $L_{A38}$ | $L_{B9}$ |
| 799. | $L_{A39}$ | $L_{B9}$ |
| 800. | $L_{A40}$ | $L_{B9}$ |
| 801. | $L_{A41}$ | $L_{B9}$ |
| 802. | $L_{A42}$ | $L_{B9}$ |
| 803. | $L_{A43}$ | $L_{B9}$ |
| 804. | $L_{A44}$ | $L_{B9}$ |
| 805. | $L_{A45}$ | $L_{B9}$ |
| 806. | $L_{A46}$ | $L_{B9}$ |
| 807. | $L_{A47}$ | $L_{B9}$ |
| 808. | $L_{A48}$ | $L_{B9}$ |
| 809. | $L_{A49}$ | $L_{B9}$ |
| 810. | $L_{A50}$ | $L_{B9}$ |
| 811. | $L_{A51}$ | $L_{B9}$ |
| 812. | $L_{A52}$ | $L_{B9}$ |
| 813. | $L_{A53}$ | $L_{B9}$ |
| 814. | $L_{A54}$ | $L_{B9}$ |
| 815. | $L_{A55}$ | $L_{B9}$ |
| 816. | $L_{A56}$ | $L_{B9}$ |
| 817. | $L_{A57}$ | $L_{B9}$ |
| 818. | $L_{A58}$ | $L_{B9}$ |
| 819. | $L_{A59}$ | $L_{B9}$ |
| 820. | $L_{A60}$ | $L_{B9}$ |
| 821. | $L_{A61}$ | $L_{B9}$ |
| 822. | $L_{A62}$ | $L_{B9}$ |
| 823. | $L_{A63}$ | $L_{B9}$ |
| 824. | $L_{A64}$ | $L_{B9}$ |
| 825. | $L_{A65}$ | $L_{B9}$ |
| 826. | $L_{A66}$ | $L_{B9}$ |
| 827. | $L_{A67}$ | $L_{B9}$ |
| 828. | $L_{A68}$ | $L_{B9}$ |
| 829. | $L_{A69}$ | $L_{B9}$ |
| 830. | $L_{A70}$ | $L_{B9}$ |
| 831. | $L_{A71}$ | $L_{B9}$ |
| 832. | $L_{A72}$ | $L_{B9}$ |
| 833. | $L_{A73}$ | $L_{B9}$ |
| 834. | $L_{A74}$ | $L_{B9}$ |
| 835. | $L_{A75}$ | $L_{B9}$ |
| 836. | $L_{A76}$ | $L_{B9}$ |
| 837. | $L_{A77}$ | $L_{B9}$ |
| 838. | $L_{A78}$ | $L_{B9}$ |
| 839. | $L_{A79}$ | $L_{B9}$ |
| 840. | $L_{A80}$ | $L_{B9}$ |
| 841. | $L_{A81}$ | $L_{B9}$ |
| 842. | $L_{A82}$ | $L_{B9}$ |
| 843. | $L_{A83}$ | $L_{B9}$ |
| 844. | $L_{A84}$ | $L_{B9}$ |
| 845. | $L_{A85}$ | $L_{B9}$ |
| 846. | $L_{A86}$ | $L_{B9}$ |
| 847. | $L_{A87}$ | $L_{B9}$ |
| 848. | $L_{A88}$ | $L_{B9}$ |
| 849. | $L_{A89}$ | $L_{B9}$ |
| 850. | $L_{A90}$ | $L_{B9}$ |
| 851. | $L_{A91}$ | $L_{B9}$ |
| 852. | $L_{A92}$ | $L_{B9}$ |
| 853. | $L_{A93}$ | $L_{B9}$ |
| 854. | $L_{A94}$ | $L_{B9}$ |
| 855. | $L_{A95}$ | $L_{B9}$ |
| 856. | $L_{A1}$ | $L_{B10}$ |
| 857. | $L_{A2}$ | $L_{B10}$ |
| 858. | $L_{A3}$ | $L_{B10}$ |
| 859. | $L_{A4}$ | $L_{B10}$ |
| 860. | $L_{A5}$ | $L_{B10}$ |
| 861. | $L_{A6}$ | $L_{B10}$ |
| 862. | $L_{A7}$ | $L_{B10}$ |
| 863. | $L_{A8}$ | $L_{B10}$ |
| 864. | $L_{A9}$ | $L_{B10}$ |
| 865. | $L_{A10}$ | $L_{B10}$ |
| 866. | $L_{A11}$ | $L_{B10}$ |
| 867. | $L_{A12}$ | $L_{B10}$ |
| 868. | $L_{A13}$ | $L_{B10}$ |
| 869. | $L_{A14}$ | $L_{B10}$ |
| 870. | $L_{A15}$ | $L_{B10}$ |
| 871. | $L_{A16}$ | $L_{B10}$ |
| 872. | $L_{A17}$ | $L_{B10}$ |
| 873. | $L_{A18}$ | $L_{B10}$ |
| 874. | $L_{A19}$ | $L_{B10}$ |
| 875. | $L_{A20}$ | $L_{B10}$ |
| 876. | $L_{A21}$ | $L_{B10}$ |
| 877. | $L_{A22}$ | $L_{B10}$ |
| 878. | $L_{A23}$ | $L_{B10}$ |
| 879. | $L_{A24}$ | $L_{B10}$ |
| 880. | $L_{A25}$ | $L_{B10}$ |
| 881. | $L_{A26}$ | $L_{B10}$ |
| 882. | $L_{A27}$ | $L_{B10}$ |
| 883. | $L_{A28}$ | $L_{B10}$ |
| 884. | $L_{A29}$ | $L_{B10}$ |

TABLE 1-continued

| Cpd # | $L_A$ | $L_B$ |
|---|---|---|
| 885. | $L_{A30}$ | $L_{B10}$ |
| 886. | $L_{A31}$ | $L_{B10}$ |
| 887. | $L_{A32}$ | $L_{B10}$ |
| 888. | $L_{A33}$ | $L_{B10}$ |
| 889. | $L_{A34}$ | $L_{B10}$ |
| 890. | $L_{A35}$ | $L_{B10}$ |
| 891. | $L_{A36}$ | $L_{B10}$ |
| 892. | $L_{A37}$ | $L_{B10}$ |
| 893. | $L_{A38}$ | $L_{B10}$ |
| 894. | $L_{A39}$ | $L_{B10}$ |
| 895. | $L_{A40}$ | $L_{B10}$ |
| 896. | $L_{A41}$ | $L_{B10}$ |
| 897. | $L_{A42}$ | $L_{B10}$ |
| 898. | $L_{A43}$ | $L_{B10}$ |
| 899. | $L_{A44}$ | $L_{B10}$ |
| 900. | $L_{A45}$ | $L_{B10}$ |
| 901. | $L_{A46}$ | $L_{B10}$ |
| 902. | $L_{A47}$ | $L_{B10}$ |
| 903. | $L_{A48}$ | $L_{B10}$ |
| 904. | $L_{A49}$ | $L_{B10}$ |
| 905. | $L_{A50}$ | $L_{B10}$ |
| 906. | $L_{A51}$ | $L_{B10}$ |
| 907. | $L_{A52}$ | $L_{B10}$ |
| 908. | $L_{A53}$ | $L_{B10}$ |
| 909. | $L_{A54}$ | $L_{B10}$ |
| 910. | $L_{A55}$ | $L_{B10}$ |
| 911. | $L_{A56}$ | $L_{B10}$ |
| 912. | $L_{A57}$ | $L_{B10}$ |
| 913. | $L_{A58}$ | $L_{B10}$ |
| 914. | $L_{A59}$ | $L_{B10}$ |
| 915. | $L_{A60}$ | $L_{B10}$ |
| 916. | $L_{A61}$ | $L_{B10}$ |
| 917. | $L_{A62}$ | $L_{B10}$ |
| 918. | $L_{A63}$ | $L_{B10}$ |
| 919. | $L_{A64}$ | $L_{B10}$ |
| 920. | $L_{A65}$ | $L_{B10}$ |
| 921. | $L_{A66}$ | $L_{B10}$ |
| 922. | $L_{A67}$ | $L_{B10}$ |
| 923. | $L_{A68}$ | $L_{B10}$ |
| 924. | $L_{A69}$ | $L_{B10}$ |
| 925. | $L_{A70}$ | $L_{B10}$ |
| 926. | $L_{A71}$ | $L_{B10}$ |
| 927. | $L_{A72}$ | $L_{B10}$ |
| 928. | $L_{A73}$ | $L_{B10}$ |
| 929. | $L_{A74}$ | $L_{B10}$ |
| 930. | $L_{A75}$ | $L_{B10}$ |
| 931. | $L_{A76}$ | $L_{B10}$ |
| 932. | $L_{A77}$ | $L_{B10}$ |
| 933. | $L_{A78}$ | $L_{B10}$ |
| 934. | $L_{A79}$ | $L_{B10}$ |
| 935. | $L_{A80}$ | $L_{B10}$ |
| 936. | $L_{A81}$ | $L_{B10}$ |
| 937. | $L_{A82}$ | $L_{B10}$ |
| 938. | $L_{A83}$ | $L_{B10}$ |
| 939. | $L_{A84}$ | $L_{B10}$ |
| 940. | $L_{A85}$ | $L_{B10}$ |
| 941. | $L_{A86}$ | $L_{B10}$ |
| 942. | $L_{A87}$ | $L_{B10}$ |
| 943. | $L_{A88}$ | $L_{B10}$ |
| 944. | $L_{A89}$ | $L_{B10}$ |
| 945. | $L_{A90}$ | $L_{B10}$ |
| 946. | $L_{A91}$ | $L_{B10}$ |
| 947. | $L_{A92}$ | $L_{B10}$ |
| 948. | $L_{A93}$ | $L_{B10}$ |
| 949. | $L_{A94}$ | $L_{B10}$ |
| 950. | $L_{A95}$ | $L_{B10}$ |
| 951. | $L_{A1}$ | $L_{B11}$ |
| 952. | $L_{A2}$ | $L_{B11}$ |
| 953. | $L_{A3}$ | $L_{B11}$ |
| 954. | $L_{A4}$ | $L_{B11}$ |
| 955. | $L_{A5}$ | $L_{B11}$ |
| 956. | $L_{A6}$ | $L_{B11}$ |
| 957. | $L_{A7}$ | $L_{B11}$ |
| 958. | $L_{A8}$ | $L_{B11}$ |
| 959. | $L_{A9}$ | $L_{B11}$ |
| 960. | $L_{A10}$ | $L_{B11}$ |
| 961. | $L_{A11}$ | $L_{B11}$ |
| 962. | $L_{A12}$ | $L_{B11}$ |

TABLE 1-continued

| Cpd # | $L_A$ | $L_B$ |
|---|---|---|
| 963. | $L_{A13}$ | $L_{B11}$ |
| 964. | $L_{A14}$ | $L_{B11}$ |
| 965. | $L_{A15}$ | $L_{B11}$ |
| 966. | $L_{A16}$ | $L_{B11}$ |
| 967. | $L_{A17}$ | $L_{B11}$ |
| 968. | $L_{A18}$ | $L_{B11}$ |
| 969. | $L_{A19}$ | $L_{B11}$ |
| 970. | $L_{A20}$ | $L_{B11}$ |
| 971. | $L_{A21}$ | $L_{B11}$ |
| 972. | $L_{A22}$ | $L_{B11}$ |
| 973. | $L_{A23}$ | $L_{B11}$ |
| 974. | $L_{A24}$ | $L_{B11}$ |
| 975. | $L_{A25}$ | $L_{B11}$ |
| 976. | $L_{A26}$ | $L_{B11}$ |
| 977. | $L_{A27}$ | $L_{B11}$ |
| 978. | $L_{A28}$ | $L_{B11}$ |
| 979. | $L_{A29}$ | $L_{B11}$ |
| 980. | $L_{A30}$ | $L_{B11}$ |
| 981. | $L_{A31}$ | $L_{B11}$ |
| 982. | $L_{A32}$ | $L_{B11}$ |
| 983. | $L_{A33}$ | $L_{B11}$ |
| 984. | $L_{A34}$ | $L_{B11}$ |
| 985. | $L_{A35}$ | $L_{B11}$ |
| 986. | $L_{A36}$ | $L_{B11}$ |
| 987. | $L_{A37}$ | $L_{B11}$ |
| 988. | $L_{A38}$ | $L_{B11}$ |
| 989. | $L_{A39}$ | $L_{B11}$ |
| 990. | $L_{A40}$ | $L_{B11}$ |
| 991. | $L_{A41}$ | $L_{B11}$ |
| 992. | $L_{A42}$ | $L_{B11}$ |
| 993. | $L_{A43}$ | $L_{B11}$ |
| 994. | $L_{A44}$ | $L_{B11}$ |
| 995. | $L_{A45}$ | $L_{B11}$ |
| 996. | $L_{A46}$ | $L_{B11}$ |
| 997. | $L_{A47}$ | $L_{B11}$ |
| 998. | $L_{A48}$ | $L_{B11}$ |
| 999. | $L_{A49}$ | $L_{B11}$ |
| 1000. | $L_{A50}$ | $L_{B11}$ |
| 1001. | $L_{A51}$ | $L_{B11}$ |
| 1002. | $L_{A52}$ | $L_{B11}$ |
| 1003. | $L_{A53}$ | $L_{B11}$ |
| 1004. | $L_{A54}$ | $L_{B11}$ |
| 1005. | $L_{A55}$ | $L_{B11}$ |
| 1006. | $L_{A56}$ | $L_{B11}$ |
| 1007. | $L_{A57}$ | $L_{B11}$ |
| 1008. | $L_{A58}$ | $L_{B11}$ |
| 1009. | $L_{A59}$ | $L_{B11}$ |
| 1010. | $L_{A60}$ | $L_{B11}$ |
| 1011. | $L_{A61}$ | $L_{B11}$ |
| 1012. | $L_{A62}$ | $L_{B11}$ |
| 1013. | $L_{A63}$ | $L_{B11}$ |
| 1014. | $L_{A64}$ | $L_{B11}$ |
| 1015. | $L_{A65}$ | $L_{B11}$ |
| 1016. | $L_{A66}$ | $L_{B11}$ |
| 1017. | $L_{A67}$ | $L_{B11}$ |
| 1018. | $L_{A68}$ | $L_{B11}$ |
| 1019. | $L_{A69}$ | $L_{B11}$ |
| 1020. | $L_{A70}$ | $L_{B11}$ |
| 1021. | $L_{A71}$ | $L_{B11}$ |
| 1022. | $L_{A72}$ | $L_{B11}$ |
| 1023. | $L_{A73}$ | $L_{B11}$ |
| 1024. | $L_{A74}$ | $L_{B11}$ |
| 1025. | $L_{A75}$ | $L_{B11}$ |
| 1026. | $L_{A76}$ | $L_{B11}$ |
| 1027. | $L_{A77}$ | $L_{B11}$ |
| 1028. | $L_{A78}$ | $L_{B11}$ |
| 1029. | $L_{A79}$ | $L_{B11}$ |
| 1030. | $L_{A80}$ | $L_{B11}$ |
| 1031. | $L_{A81}$ | $L_{B11}$ |
| 1032. | $L_{A82}$ | $L_{B11}$ |
| 1033. | $L_{A83}$ | $L_{B11}$ |
| 1034. | $L_{A84}$ | $L_{B11}$ |
| 1035. | $L_{A85}$ | $L_{B11}$ |
| 1036. | $L_{A86}$ | $L_{B11}$ |
| 1037. | $L_{A87}$ | $L_{B11}$ |
| 1038. | $L_{A88}$ | $L_{B11}$ |
| 1039. | $L_{A89}$ | $L_{B11}$ |
| 1040. | $L_{A90}$ | $L_{B11}$ |

TABLE 1-continued

| Cpd # | $L_A$ | $L_B$ |
|---|---|---|
| 1041. | $L_{A91}$ | $L_{B11}$ |
| 1042. | $L_{A92}$ | $L_{B11}$ |
| 1043. | $L_{A93}$ | $L_{B11}$ |
| 1044. | $L_{A94}$ | $L_{B11}$ |
| 1045. | $L_{A95}$ | $L_{B11}$ |
| 1046. | $L_{A1}$ | $L_{B12}$ |
| 1047. | $L_{A2}$ | $L_{B12}$ |
| 1048. | $L_{A3}$ | $L_{B12}$ |
| 1049. | $L_{A4}$ | $L_{B12}$ |
| 1050. | $L_{A5}$ | $L_{B12}$ |
| 1051. | $L_{A6}$ | $L_{B12}$ |
| 1052. | $L_{A7}$ | $L_{B12}$ |
| 1053. | $L_{A8}$ | $L_{B12}$ |
| 1054. | $L_{A9}$ | $L_{B12}$ |
| 1055. | $L_{A10}$ | $L_{B12}$ |
| 1056. | $L_{A11}$ | $L_{B12}$ |
| 1057. | $L_{A12}$ | $L_{B12}$ |
| 1058. | $L_{A13}$ | $L_{B12}$ |
| 1059. | $L_{A14}$ | $L_{B12}$ |
| 1060. | $L_{A15}$ | $L_{B12}$ |
| 1061. | $L_{A16}$ | $L_{B12}$ |
| 1062. | $L_{A17}$ | $L_{B12}$ |
| 1063. | $L_{A18}$ | $L_{B12}$ |
| 1064. | $L_{A19}$ | $L_{B12}$ |
| 1065. | $L_{A20}$ | $L_{B12}$ |
| 1066. | $L_{A21}$ | $L_{B12}$ |
| 1067. | $L_{A22}$ | $L_{B12}$ |
| 1068. | $L_{A23}$ | $L_{B12}$ |
| 1069. | $L_{A24}$ | $L_{B12}$ |
| 1070. | $L_{A25}$ | $L_{B12}$ |
| 1071. | $L_{A26}$ | $L_{B12}$ |
| 1072. | $L_{A27}$ | $L_{B12}$ |
| 1073. | $L_{A28}$ | $L_{B12}$ |
| 1074. | $L_{A29}$ | $L_{B12}$ |
| 1075. | $L_{A30}$ | $L_{B12}$ |
| 1076. | $L_{A31}$ | $L_{B12}$ |
| 1077. | $L_{A32}$ | $L_{B12}$ |
| 1078. | $L_{A33}$ | $L_{B12}$ |
| 1079. | $L_{A34}$ | $L_{B12}$ |
| 1080. | $L_{A35}$ | $L_{B12}$ |
| 1081. | $L_{A36}$ | $L_{B12}$ |
| 1082. | $L_{A37}$ | $L_{B12}$ |
| 1083. | $L_{A38}$ | $L_{B12}$ |
| 1084. | $L_{A39}$ | $L_{B12}$ |
| 1085. | $L_{A40}$ | $L_{B12}$ |
| 1086. | $L_{A41}$ | $L_{B12}$ |
| 1087. | $L_{A42}$ | $L_{B12}$ |
| 1088. | $L_{A43}$ | $L_{B12}$ |
| 1089. | $L_{A44}$ | $L_{B12}$ |
| 1090. | $L_{A45}$ | $L_{B12}$ |
| 1091. | $L_{A46}$ | $L_{B12}$ |
| 1092. | $L_{A47}$ | $L_{B12}$ |
| 1093. | $L_{A48}$ | $L_{B12}$ |
| 1094. | $L_{A49}$ | $L_{B12}$ |
| 1095. | $L_{A50}$ | $L_{B12}$ |
| 1096. | $L_{A51}$ | $L_{B12}$ |
| 1097. | $L_{A52}$ | $L_{B12}$ |
| 1098. | $L_{A53}$ | $L_{B12}$ |
| 1099. | $L_{A54}$ | $L_{B12}$ |
| 1100. | $L_{A55}$ | $L_{B12}$ |
| 1101. | $L_{A56}$ | $L_{B12}$ |
| 1102. | $L_{A57}$ | $L_{B12}$ |
| 1103. | $L_{A58}$ | $L_{B12}$ |
| 1104. | $L_{A59}$ | $L_{B12}$ |
| 1105. | $L_{A60}$ | $L_{B12}$ |
| 1106. | $L_{A61}$ | $L_{B12}$ |
| 1107. | $L_{A62}$ | $L_{B12}$ |
| 1108. | $L_{A63}$ | $L_{B12}$ |
| 1109. | $L_{A64}$ | $L_{B12}$ |
| 1110. | $L_{A65}$ | $L_{B12}$ |
| 1111. | $L_{A66}$ | $L_{B12}$ |
| 1112. | $L_{A67}$ | $L_{B12}$ |
| 1113. | $L_{A68}$ | $L_{B12}$ |
| 1114. | $L_{A69}$ | $L_{B12}$ |
| 1115. | $L_{A70}$ | $L_{B12}$ |
| 1116. | $L_{A71}$ | $L_{B12}$ |
| 1117. | $L_{A72}$ | $L_{B12}$ |
| 1118. | $L_{A73}$ | $L_{B12}$ |
| 1119. | $L_{A74}$ | $L_{B12}$ |
| 1120. | $L_{A75}$ | $L_{B12}$ |
| 1121. | $L_{A76}$ | $L_{B12}$ |
| 1122. | $L_{A77}$ | $L_{B12}$ |
| 1123. | $L_{A78}$ | $L_{B12}$ |
| 1124. | $L_{A79}$ | $L_{B12}$ |
| 1125. | $L_{A80}$ | $L_{B12}$ |
| 1126. | $L_{A81}$ | $L_{B12}$ |
| 1127. | $L_{A82}$ | $L_{B12}$ |
| 1128. | $L_{A83}$ | $L_{B12}$ |
| 1129. | $L_{A84}$ | $L_{B12}$ |
| 1130. | $L_{A85}$ | $L_{B12}$ |
| 1131. | $L_{A86}$ | $L_{B12}$ |
| 1132. | $L_{A87}$ | $L_{B12}$ |
| 1133. | $L_{A88}$ | $L_{B12}$ |
| 1134. | $L_{A89}$ | $L_{B12}$ |
| 1135. | $L_{A90}$ | $L_{B12}$ |
| 1136. | $L_{A91}$ | $L_{B12}$ |
| 1137. | $L_{A92}$ | $L_{B12}$ |
| 1138. | $L_{A93}$ | $L_{B12}$ |
| 1139. | $L_{A94}$ | $L_{B12}$ |
| 1140. | $L_{A95}$ | $L_{B12}$ |
| 1141. | $L_{A1}$ | $L_{B13}$ |
| 1142. | $L_{A2}$ | $L_{B13}$ |
| 1143. | $L_{A3}$ | $L_{B13}$ |
| 1144. | $L_{A4}$ | $L_{B13}$ |
| 1145. | $L_{A5}$ | $L_{B13}$ |
| 1146. | $L_{A6}$ | $L_{B13}$ |
| 1147. | $L_{A7}$ | $L_{B13}$ |
| 1148. | $L_{A8}$ | $L_{B13}$ |
| 1149. | $L_{A9}$ | $L_{B13}$ |
| 1150. | $L_{A10}$ | $L_{B13}$ |
| 1151. | $L_{A11}$ | $L_{B13}$ |
| 1152. | $L_{A12}$ | $L_{B13}$ |
| 1153. | $L_{A13}$ | $L_{B13}$ |
| 1154. | $L_{A14}$ | $L_{B13}$ |
| 1155. | $L_{A15}$ | $L_{B13}$ |
| 1156. | $L_{A16}$ | $L_{B13}$ |
| 1157. | $L_{A17}$ | $L_{B13}$ |
| 1158. | $L_{A18}$ | $L_{B13}$ |
| 1159. | $L_{A19}$ | $L_{B13}$ |
| 1160. | $L_{A20}$ | $L_{B13}$ |
| 1161. | $L_{A21}$ | $L_{B13}$ |
| 1162. | $L_{A22}$ | $L_{B13}$ |
| 1163. | $L_{A23}$ | $L_{B13}$ |
| 1164. | $L_{A24}$ | $L_{B13}$ |
| 1165. | $L_{A25}$ | $L_{B13}$ |
| 1166. | $L_{A26}$ | $L_{B13}$ |
| 1167. | $L_{A27}$ | $L_{B13}$ |
| 1168. | $L_{A28}$ | $L_{B13}$ |
| 1169. | $L_{A29}$ | $L_{B13}$ |
| 1170. | $L_{A30}$ | $L_{B13}$ |
| 1171. | $L_{A31}$ | $L_{B13}$ |
| 1172. | $L_{A32}$ | $L_{B13}$ |
| 1173. | $L_{A33}$ | $L_{B13}$ |
| 1174. | $L_{A34}$ | $L_{B13}$ |
| 1175. | $L_{A35}$ | $L_{B13}$ |
| 1176. | $L_{A36}$ | $L_{B13}$ |
| 1177. | $L_{A37}$ | $L_{B13}$ |
| 1178. | $L_{A38}$ | $L_{B13}$ |
| 1179. | $L_{A39}$ | $L_{B13}$ |
| 1180. | $L_{A40}$ | $L_{B13}$ |
| 1181. | $L_{A41}$ | $L_{B13}$ |
| 1182. | $L_{A42}$ | $L_{B13}$ |
| 1183. | $L_{A43}$ | $L_{B13}$ |
| 1184. | $L_{A44}$ | $L_{B13}$ |
| 1185. | $L_{A45}$ | $L_{B13}$ |
| 1186. | $L_{A46}$ | $L_{B13}$ |
| 1187. | $L_{A47}$ | $L_{B13}$ |
| 1188. | $L_{A48}$ | $L_{B13}$ |
| 1189. | $L_{A49}$ | $L_{B13}$ |
| 1190. | $L_{A50}$ | $L_{B13}$ |
| 1191. | $L_{A51}$ | $L_{B13}$ |
| 1192. | $L_{A52}$ | $L_{B13}$ |
| 1193. | $L_{A53}$ | $L_{B13}$ |
| 1194. | $L_{A54}$ | $L_{B13}$ |
| 1195. | $L_{A55}$ | $L_{B13}$ |
| 1196. | $L_{A56}$ | $L_{B13}$ |

TABLE 1-continued

| Cpd # | $L_A$ | $L_B$ |
|---|---|---|
| 1197. | $L_{A57}$ | $L_{B13}$ |
| 1198. | $L_{A58}$ | $L_{B13}$ |
| 1199. | $L_{A59}$ | $L_{B13}$ |
| 1200. | $L_{A60}$ | $L_{B13}$ |
| 1201. | $L_{A61}$ | $L_{B13}$ |
| 1202. | $L_{A62}$ | $L_{B13}$ |
| 1203. | $L_{A63}$ | $L_{B13}$ |
| 1204. | $L_{A64}$ | $L_{B13}$ |
| 1205. | $L_{A65}$ | $L_{B13}$ |
| 1206. | $L_{A66}$ | $L_{B13}$ |
| 1207. | $L_{A67}$ | $L_{B13}$ |
| 1208. | $L_{A68}$ | $L_{B13}$ |
| 1209. | $L_{A69}$ | $L_{B13}$ |
| 1210. | $L_{A70}$ | $L_{B13}$ |
| 1211. | $L_{A71}$ | $L_{B13}$ |
| 1212. | $L_{A72}$ | $L_{B13}$ |
| 1213. | $L_{A73}$ | $L_{B13}$ |
| 1214. | $L_{A74}$ | $L_{B13}$ |
| 1215. | $L_{A75}$ | $L_{B13}$ |
| 1216. | $L_{A76}$ | $L_{B13}$ |
| 1217. | $L_{A77}$ | $L_{B13}$ |
| 1218. | $L_{A78}$ | $L_{B13}$ |
| 1219. | $L_{A79}$ | $L_{B13}$ |
| 1220. | $L_{A80}$ | $L_{B13}$ |
| 1221. | $L_{A81}$ | $L_{B13}$ |
| 1222. | $L_{A82}$ | $L_{B13}$ |
| 1223. | $L_{A83}$ | $L_{B13}$ |
| 1224. | $L_{A84}$ | $L_{B13}$ |
| 1225. | $L_{A85}$ | $L_{B13}$ |
| 1226. | $L_{A86}$ | $L_{B13}$ |
| 1227. | $L_{A87}$ | $L_{B13}$ |
| 1228. | $L_{A88}$ | $L_{B13}$ |
| 1229. | $L_{A89}$ | $L_{B13}$ |
| 1230. | $L_{A90}$ | $L_{B13}$ |
| 1231. | $L_{A91}$ | $L_{B13}$ |
| 1232. | $L_{A92}$ | $L_{B13}$ |
| 1233. | $L_{A93}$ | $L_{B13}$ |
| 1234. | $L_{A94}$ | $L_{B13}$ |
| 1235. | $L_{A95}$ | $L_{B13}$ |
| 1236. | $L_{A1}$ | $L_{B14}$ |
| 1237. | $L_{A2}$ | $L_{B14}$ |
| 1238. | $L_{A3}$ | $L_{B14}$ |
| 1239. | $L_{A4}$ | $L_{B14}$ |
| 1240. | $L_{A5}$ | $L_{B14}$ |
| 1241. | $L_{A6}$ | $L_{B14}$ |
| 1242. | $L_{A7}$ | $L_{B14}$ |
| 1243. | $L_{A8}$ | $L_{B14}$ |
| 1244. | $L_{A9}$ | $L_{B14}$ |
| 1245. | $L_{A10}$ | $L_{B14}$ |
| 1246. | $L_{A11}$ | $L_{B14}$ |
| 1247. | $L_{A12}$ | $L_{B14}$ |
| 1248. | $L_{A13}$ | $L_{B14}$ |
| 1249. | $L_{A14}$ | $L_{B14}$ |
| 1250. | $L_{A15}$ | $L_{B14}$ |
| 1251. | $L_{A16}$ | $L_{B14}$ |
| 1252. | $L_{A17}$ | $L_{B14}$ |
| 1253. | $L_{A18}$ | $L_{B14}$ |
| 1254. | $L_{A19}$ | $L_{B14}$ |
| 1255. | $L_{A20}$ | $L_{B14}$ |
| 1256. | $L_{A21}$ | $L_{B14}$ |
| 1257. | $L_{A22}$ | $L_{B14}$ |
| 1258. | $L_{A23}$ | $L_{B14}$ |
| 1259. | $L_{A24}$ | $L_{B14}$ |
| 1260. | $L_{A25}$ | $L_{B14}$ |
| 1261. | $L_{A26}$ | $L_{B14}$ |
| 1262. | $L_{A27}$ | $L_{B14}$ |
| 1263. | $L_{A28}$ | $L_{B14}$ |
| 1264. | $L_{A29}$ | $L_{B14}$ |
| 1265. | $L_{A30}$ | $L_{B14}$ |
| 1266. | $L_{A31}$ | $L_{B14}$ |
| 1267. | $L_{A32}$ | $L_{B14}$ |
| 1268. | $L_{A33}$ | $L_{B14}$ |
| 1269. | $L_{A34}$ | $L_{B14}$ |
| 1270. | $L_{A35}$ | $L_{B14}$ |
| 1271. | $L_{A36}$ | $L_{B14}$ |
| 1272. | $L_{A37}$ | $L_{B14}$ |
| 1273. | $L_{A38}$ | $L_{B14}$ |
| 1274. | $L_{A39}$ | $L_{B14}$ |

TABLE 1-continued

| Cpd # | $L_A$ | $L_B$ |
|---|---|---|
| 1275. | $L_{A40}$ | $L_{B14}$ |
| 1276. | $L_{A41}$ | $L_{B14}$ |
| 1277. | $L_{A42}$ | $L_{B14}$ |
| 1278. | $L_{A43}$ | $L_{B14}$ |
| 1279. | $L_{A44}$ | $L_{B14}$ |
| 1280. | $L_{A45}$ | $L_{B14}$ |
| 1281. | $L_{A46}$ | $L_{B14}$ |
| 1282. | $L_{A47}$ | $L_{B14}$ |
| 1283. | $L_{A48}$ | $L_{B14}$ |
| 1284. | $L_{A49}$ | $L_{B14}$ |
| 1285. | $L_{A50}$ | $L_{B14}$ |
| 1286. | $L_{A51}$ | $L_{B14}$ |
| 1287. | $L_{A52}$ | $L_{B14}$ |
| 1288. | $L_{A53}$ | $L_{B14}$ |
| 1289. | $L_{A54}$ | $L_{B14}$ |
| 1290. | $L_{A55}$ | $L_{B14}$ |
| 1291. | $L_{A56}$ | $L_{B14}$ |
| 1292. | $L_{A57}$ | $L_{B14}$ |
| 1293. | $L_{A58}$ | $L_{B14}$ |
| 1294. | $L_{A59}$ | $L_{B14}$ |
| 1295. | $L_{A60}$ | $L_{B14}$ |
| 1296. | $L_{A61}$ | $L_{B14}$ |
| 1297. | $L_{A62}$ | $L_{B14}$ |
| 1298. | $L_{A63}$ | $L_{B14}$ |
| 1299. | $L_{A64}$ | $L_{B14}$ |
| 1300. | $L_{A65}$ | $L_{B14}$ |
| 1301. | $L_{A66}$ | $L_{B14}$ |
| 1302. | $L_{A67}$ | $L_{B14}$ |
| 1303. | $L_{A68}$ | $L_{B14}$ |
| 1304. | $L_{A69}$ | $L_{B14}$ |
| 1305. | $L_{A70}$ | $L_{B14}$ |
| 1306. | $L_{A71}$ | $L_{B14}$ |
| 1307. | $L_{A72}$ | $L_{B14}$ |
| 1308. | $L_{A73}$ | $L_{B14}$ |
| 1309. | $L_{A74}$ | $L_{B14}$ |
| 1310. | $L_{A75}$ | $L_{B14}$ |
| 1311. | $L_{A76}$ | $L_{B14}$ |
| 1312. | $L_{A77}$ | $L_{B14}$ |
| 1313. | $L_{A78}$ | $L_{B14}$ |
| 1314. | $L_{A79}$ | $L_{B14}$ |
| 1315. | $L_{A80}$ | $L_{B14}$ |
| 1316. | $L_{A81}$ | $L_{B14}$ |
| 1317. | $L_{A82}$ | $L_{B14}$ |
| 1318. | $L_{A83}$ | $L_{B14}$ |
| 1319. | $L_{A84}$ | $L_{B14}$ |
| 1320. | $L_{A85}$ | $L_{B14}$ |
| 1321. | $L_{A86}$ | $L_{B14}$ |
| 1322. | $L_{A87}$ | $L_{B14}$ |
| 1323. | $L_{A88}$ | $L_{B14}$ |
| 1324. | $L_{A89}$ | $L_{B14}$ |
| 1325. | $L_{A90}$ | $L_{B14}$ |
| 1326. | $L_{A91}$ | $L_{B14}$ |
| 1327. | $L_{A92}$ | $L_{B14}$ |
| 1328. | $L_{A93}$ | $L_{B14}$ |
| 1329. | $L_{A94}$ | $L_{B14}$ |
| 1330. | $L_{A95}$ | $L_{B14}$ |
| 1331. | $L_{A1}$ | $L_{B15}$ |
| 1332. | $L_{A2}$ | $L_{B15}$ |
| 1333. | $L_{A3}$ | $L_{B15}$ |
| 1334. | $L_{A4}$ | $L_{B15}$ |
| 1335. | $L_{A5}$ | $L_{B15}$ |
| 1336. | $L_{A6}$ | $L_{B15}$ |
| 1337. | $L_{A7}$ | $L_{B15}$ |
| 1338. | $L_{A8}$ | $L_{B15}$ |
| 1339. | $L_{A9}$ | $L_{B15}$ |
| 1340. | $L_{A10}$ | $L_{B15}$ |
| 1341. | $L_{A11}$ | $L_{B15}$ |
| 1342. | $L_{A12}$ | $L_{B15}$ |
| 1343. | $L_{A13}$ | $L_{B15}$ |
| 1344. | $L_{A14}$ | $L_{B15}$ |
| 1345. | $L_{A15}$ | $L_{B15}$ |
| 1346. | $L_{A16}$ | $L_{B15}$ |
| 1347. | $L_{A17}$ | $L_{B15}$ |
| 1348. | $L_{A18}$ | $L_{B15}$ |
| 1349. | $L_{A19}$ | $L_{B15}$ |
| 1350. | $L_{A20}$ | $L_{B15}$ |
| 1351. | $L_{A21}$ | $L_{B15}$ |
| 1352. | $L_{A22}$ | $L_{B15}$ |

TABLE 1-continued

| Cpd # | $L_A$ | $L_B$ |
|---|---|---|
| 1353. | $L_{A23}$ | $L_{B15}$ |
| 1354. | $L_{A24}$ | $L_{B15}$ |
| 1355. | $L_{A25}$ | $L_{B15}$ |
| 1356. | $L_{A26}$ | $L_{B15}$ |
| 1357. | $L_{A27}$ | $L_{B15}$ |
| 1358. | $L_{A28}$ | $L_{B15}$ |
| 1359. | $L_{A29}$ | $L_{B15}$ |
| 1360. | $L_{A30}$ | $L_{B15}$ |
| 1361. | $L_{A31}$ | $L_{B15}$ |
| 1362. | $L_{A32}$ | $L_{B15}$ |
| 1363. | $L_{A33}$ | $L_{B15}$ |
| 1364. | $L_{A34}$ | $L_{B15}$ |
| 1365. | $L_{A35}$ | $L_{B15}$ |
| 1366. | $L_{A36}$ | $L_{B15}$ |
| 1367. | $L_{A37}$ | $L_{B15}$ |
| 1368. | $L_{A38}$ | $L_{B15}$ |
| 1369. | $L_{A39}$ | $L_{B15}$ |
| 1370. | $L_{A40}$ | $L_{B15}$ |
| 1371. | $L_{A41}$ | $L_{B15}$ |
| 1372. | $L_{A42}$ | $L_{B15}$ |
| 1373. | $L_{A43}$ | $L_{B15}$ |
| 1374. | $L_{A44}$ | $L_{B15}$ |
| 1375. | $L_{A45}$ | $L_{B15}$ |
| 1376. | $L_{A46}$ | $L_{B15}$ |
| 1377. | $L_{A47}$ | $L_{B15}$ |
| 1378. | $L_{A48}$ | $L_{B15}$ |
| 1379. | $L_{A49}$ | $L_{B15}$ |
| 1380. | $L_{A50}$ | $L_{B15}$ |
| 1381. | $L_{A51}$ | $L_{B15}$ |
| 1382. | $L_{A52}$ | $L_{B15}$ |
| 1383. | $L_{A53}$ | $L_{B15}$ |
| 1384. | $L_{A54}$ | $L_{B15}$ |
| 1385. | $L_{A55}$ | $L_{B15}$ |
| 1386. | $L_{A56}$ | $L_{B15}$ |
| 1387. | $L_{A57}$ | $L_{B15}$ |
| 1388. | $L_{A58}$ | $L_{B15}$ |
| 1389. | $L_{A59}$ | $L_{B15}$ |
| 1390. | $L_{A60}$ | $L_{B15}$ |
| 1391. | $L_{A61}$ | $L_{B15}$ |
| 1392. | $L_{A62}$ | $L_{B15}$ |
| 1393. | $L_{A63}$ | $L_{B15}$ |
| 1394. | $L_{A64}$ | $L_{B15}$ |
| 1395. | $L_{A65}$ | $L_{B15}$ |
| 1396. | $L_{A66}$ | $L_{B15}$ |
| 1397. | $L_{A67}$ | $L_{B15}$ |
| 1398. | $L_{A68}$ | $L_{B15}$ |
| 1399. | $L_{A69}$ | $L_{B15}$ |
| 1400. | $L_{A70}$ | $L_{B15}$ |
| 1401. | $L_{A71}$ | $L_{B15}$ |
| 1402. | $L_{A72}$ | $L_{B15}$ |
| 1403. | $L_{A73}$ | $L_{B15}$ |
| 1404. | $L_{A74}$ | $L_{B15}$ |
| 1405. | $L_{A75}$ | $L_{B15}$ |
| 1406. | $L_{A76}$ | $L_{B15}$ |
| 1407. | $L_{A77}$ | $L_{B15}$ |
| 1408. | $L_{A78}$ | $L_{B15}$ |
| 1409. | $L_{A79}$ | $L_{B15}$ |
| 1410. | $L_{A80}$ | $L_{B15}$ |
| 1411. | $L_{A81}$ | $L_{B15}$ |
| 1412. | $L_{A82}$ | $L_{B15}$ |
| 1413. | $L_{A83}$ | $L_{B15}$ |
| 1414. | $L_{A84}$ | $L_{B15}$ |
| 1415. | $L_{A85}$ | $L_{B15}$ |
| 1416. | $L_{A86}$ | $L_{B15}$ |
| 1417. | $L_{A87}$ | $L_{B15}$ |
| 1418. | $L_{A88}$ | $L_{B15}$ |
| 1419. | $L_{A89}$ | $L_{B15}$ |
| 1420. | $L_{A90}$ | $L_{B15}$ |
| 1421. | $L_{A91}$ | $L_{B15}$ |
| 1422. | $L_{A92}$ | $L_{B15}$ |
| 1423. | $L_{A93}$ | $L_{B15}$ |
| 1424. | $L_{A94}$ | $L_{B15}$ |
| 1425. | $L_{A95}$ | $L_{B15}$ |
| 1426. | $L_{A1}$ | $L_{B16}$ |
| 1427. | $L_{A2}$ | $L_{B16}$ |
| 1428. | $L_{A3}$ | $L_{B16}$ |
| 1429. | $L_{A4}$ | $L_{B16}$ |
| 1430. | $L_{A5}$ | $L_{B16}$ |

TABLE 1-continued

| Cpd # | $L_A$ | $L_B$ |
|---|---|---|
| 1431. | $L_{A6}$ | $L_{B16}$ |
| 1432. | $L_{A7}$ | $L_{B16}$ |
| 1433. | $L_{A8}$ | $L_{B16}$ |
| 1434. | $L_{A9}$ | $L_{B16}$ |
| 1435. | $L_{A10}$ | $L_{B16}$ |
| 1436. | $L_{A11}$ | $L_{B16}$ |
| 1437. | $L_{A12}$ | $L_{B16}$ |
| 1438. | $L_{A13}$ | $L_{B16}$ |
| 1439. | $L_{A14}$ | $L_{B16}$ |
| 1440. | $L_{A15}$ | $L_{B16}$ |
| 1441. | $L_{A16}$ | $L_{B16}$ |
| 1442. | $L_{A17}$ | $L_{B16}$ |
| 1443. | $L_{A18}$ | $L_{B16}$ |
| 1444. | $L_{A19}$ | $L_{B16}$ |
| 1445. | $L_{A20}$ | $L_{B16}$ |
| 1446. | $L_{A21}$ | $L_{B16}$ |
| 1447. | $L_{A22}$ | $L_{B16}$ |
| 1448. | $L_{A23}$ | $L_{B16}$ |
| 1449. | $L_{A24}$ | $L_{B16}$ |
| 1450. | $L_{A25}$ | $L_{B16}$ |
| 1451. | $L_{A26}$ | $L_{B16}$ |
| 1452. | $L_{A27}$ | $L_{B16}$ |
| 1453. | $L_{A28}$ | $L_{B16}$ |
| 1454. | $L_{A29}$ | $L_{B16}$ |
| 1455. | $L_{A30}$ | $L_{B16}$ |
| 1456. | $L_{A31}$ | $L_{B16}$ |
| 1457. | $L_{A32}$ | $L_{B16}$ |
| 1458. | $L_{A33}$ | $L_{B16}$ |
| 1459. | $L_{A34}$ | $L_{B16}$ |
| 1460. | $L_{A35}$ | $L_{B16}$ |
| 1461. | $L_{A36}$ | $L_{B16}$ |
| 1462. | $L_{A37}$ | $L_{B16}$ |
| 1463. | $L_{A38}$ | $L_{B16}$ |
| 1464. | $L_{A39}$ | $L_{B16}$ |
| 1465. | $L_{A40}$ | $L_{B16}$ |
| 1466. | $L_{A41}$ | $L_{B16}$ |
| 1467. | $L_{A42}$ | $L_{B16}$ |
| 1468. | $L_{A43}$ | $L_{B16}$ |
| 1469. | $L_{A44}$ | $L_{B16}$ |
| 1470. | $L_{A45}$ | $L_{B16}$ |
| 1471. | $L_{A46}$ | $L_{B16}$ |
| 1472. | $L_{A47}$ | $L_{B16}$ |
| 1473. | $L_{A48}$ | $L_{B16}$ |
| 1474. | $L_{A49}$ | $L_{B16}$ |
| 1475. | $L_{A50}$ | $L_{B16}$ |
| 1476. | $L_{A51}$ | $L_{B16}$ |
| 1477. | $L_{A52}$ | $L_{B16}$ |
| 1478. | $L_{A53}$ | $L_{B16}$ |
| 1479. | $L_{A54}$ | $L_{B16}$ |
| 1480. | $L_{A55}$ | $L_{B16}$ |
| 1481. | $L_{A56}$ | $L_{B16}$ |
| 1482. | $L_{A57}$ | $L_{B16}$ |
| 1483. | $L_{A58}$ | $L_{B16}$ |
| 1484. | $L_{A59}$ | $L_{B16}$ |
| 1485. | $L_{A60}$ | $L_{B16}$ |
| 1486. | $L_{A61}$ | $L_{B16}$ |
| 1487. | $L_{A62}$ | $L_{B16}$ |
| 1488. | $L_{A63}$ | $L_{B16}$ |
| 1489. | $L_{A64}$ | $L_{B16}$ |
| 1490. | $L_{A65}$ | $L_{B16}$ |
| 1491. | $L_{A66}$ | $L_{B16}$ |
| 1492. | $L_{A67}$ | $L_{B16}$ |
| 1493. | $L_{A68}$ | $L_{B16}$ |
| 1494. | $L_{A69}$ | $L_{B16}$ |
| 1495. | $L_{A70}$ | $L_{B16}$ |
| 1496. | $L_{A71}$ | $L_{B16}$ |
| 1497. | $L_{A72}$ | $L_{B16}$ |
| 1498. | $L_{A73}$ | $L_{B16}$ |
| 1499. | $L_{A74}$ | $L_{B16}$ |
| 1500. | $L_{A75}$ | $L_{B16}$ |
| 1501. | $L_{A76}$ | $L_{B16}$ |
| 1502. | $L_{A77}$ | $L_{B16}$ |
| 1503. | $L_{A78}$ | $L_{B16}$ |
| 1504. | $L_{A79}$ | $L_{B16}$ |
| 1505. | $L_{A80}$ | $L_{B16}$ |
| 1506. | $L_{A81}$ | $L_{B16}$ |
| 1507. | $L_{A82}$ | $L_{B16}$ |
| 1508. | $L_{A83}$ | $L_{B16}$ |

TABLE 1-continued

| Cpd # | $L_A$ | $L_B$ |
|---|---|---|
| 1509. | $L_{A84}$ | $L_{B16}$ |
| 1510. | $L_{A85}$ | $L_{B16}$ |
| 1511. | $L_{A86}$ | $L_{B16}$ |
| 1512. | $L_{A87}$ | $L_{B16}$ |
| 1513. | $L_{A88}$ | $L_{B16}$ |
| 1514. | $L_{A89}$ | $L_{B16}$ |
| 1515. | $L_{A90}$ | $L_{B16}$ |
| 1516. | $L_{A91}$ | $L_{B16}$ |
| 1517. | $L_{A92}$ | $L_{B16}$ |
| 1518. | $L_{A93}$ | $L_{B16}$ |
| 1519. | $L_{A94}$ | $L_{B16}$ |
| 1520. | $L_{A95}$ | $L_{B16}$ |
| 1521. | $L_{A1}$ | $L_{B17}$ |
| 1522. | $L_{A2}$ | $L_{B17}$ |
| 1523. | $L_{A3}$ | $L_{B17}$ |
| 1524. | $L_{A4}$ | $L_{B17}$ |
| 1525. | $L_{A5}$ | $L_{B17}$ |
| 1526. | $L_{A6}$ | $L_{B17}$ |
| 1527. | $L_{A7}$ | $L_{B17}$ |
| 1528. | $L_{A8}$ | $L_{B17}$ |
| 1529. | $L_{A9}$ | $L_{B17}$ |
| 1530. | $L_{A10}$ | $L_{B17}$ |
| 1531. | $L_{A11}$ | $L_{B17}$ |
| 1532. | $L_{A12}$ | $L_{B17}$ |
| 1533. | $L_{A13}$ | $L_{B17}$ |
| 1534. | $L_{A14}$ | $L_{B17}$ |
| 1535. | $L_{A15}$ | $L_{B17}$ |
| 1536. | $L_{A16}$ | $L_{B17}$ |
| 1537. | $L_{A17}$ | $L_{B17}$ |
| 1538. | $L_{A18}$ | $L_{B17}$ |
| 1539. | $L_{A19}$ | $L_{B17}$ |
| 1540. | $L_{A20}$ | $L_{B17}$ |
| 1541. | $L_{A21}$ | $L_{B17}$ |
| 1542. | $L_{A22}$ | $L_{B17}$ |
| 1543. | $L_{A23}$ | $L_{B17}$ |
| 1544. | $L_{A24}$ | $L_{B17}$ |
| 1545. | $L_{A25}$ | $L_{B17}$ |
| 1546. | $L_{A26}$ | $L_{B17}$ |
| 1547. | $L_{A27}$ | $L_{B17}$ |
| 1548. | $L_{A28}$ | $L_{B17}$ |
| 1549. | $L_{A29}$ | $L_{B17}$ |
| 1550. | $L_{A30}$ | $L_{B17}$ |
| 1551. | $L_{A31}$ | $L_{B17}$ |
| 1552. | $L_{A32}$ | $L_{B17}$ |
| 1553. | $L_{A33}$ | $L_{B17}$ |
| 1554. | $L_{A34}$ | $L_{B17}$ |
| 1555. | $L_{A35}$ | $L_{B17}$ |
| 1556. | $L_{A36}$ | $L_{B17}$ |
| 1557. | $L_{A37}$ | $L_{B17}$ |
| 1558. | $L_{A38}$ | $L_{B17}$ |
| 1559. | $L_{A39}$ | $L_{B17}$ |
| 1560. | $L_{A40}$ | $L_{B17}$ |
| 1561. | $L_{A41}$ | $L_{B17}$ |
| 1562. | $L_{A42}$ | $L_{B17}$ |
| 1563. | $L_{A43}$ | $L_{B17}$ |
| 1564. | $L_{A44}$ | $L_{B17}$ |
| 1565. | $L_{A45}$ | $L_{B17}$ |
| 1566. | $L_{A46}$ | $L_{B17}$ |
| 1567. | $L_{A47}$ | $L_{B17}$ |
| 1568. | $L_{A48}$ | $L_{B17}$ |
| 1569. | $L_{A49}$ | $L_{B17}$ |
| 1570. | $L_{A50}$ | $L_{B17}$ |
| 1571. | $L_{A51}$ | $L_{B17}$ |
| 1572. | $L_{A52}$ | $L_{B17}$ |
| 1573. | $L_{A53}$ | $L_{B17}$ |
| 1574. | $L_{A54}$ | $L_{B17}$ |
| 1575. | $L_{A55}$ | $L_{B17}$ |
| 1576. | $L_{A56}$ | $L_{B17}$ |
| 1577. | $L_{A57}$ | $L_{B17}$ |
| 1578. | $L_{A58}$ | $L_{B17}$ |
| 1579. | $L_{A59}$ | $L_{B17}$ |
| 1580. | $L_{A60}$ | $L_{B17}$ |
| 1581. | $L_{A61}$ | $L_{B17}$ |
| 1582. | $L_{A62}$ | $L_{B17}$ |
| 1583. | $L_{A63}$ | $L_{B17}$ |
| 1584. | $L_{A64}$ | $L_{B17}$ |
| 1585. | $L_{A65}$ | $L_{B17}$ |
| 1586. | $L_{A66}$ | $L_{B17}$ |
| 1587. | $L_{A67}$ | $L_{B17}$ |
| 1588. | $L_{A68}$ | $L_{B17}$ |
| 1589. | $L_{A69}$ | $L_{B17}$ |
| 1590. | $L_{A70}$ | $L_{B17}$ |
| 1591. | $L_{A71}$ | $L_{B17}$ |
| 1592. | $L_{A72}$ | $L_{B17}$ |
| 1593. | $L_{A73}$ | $L_{B17}$ |
| 1594. | $L_{A74}$ | $L_{B17}$ |
| 1595. | $L_{A75}$ | $L_{B17}$ |
| 1596. | $L_{A76}$ | $L_{B17}$ |
| 1597. | $L_{A77}$ | $L_{B17}$ |
| 1598. | $L_{A78}$ | $L_{B17}$ |
| 1599. | $L_{A79}$ | $L_{B17}$ |
| 1600. | $L_{A80}$ | $L_{B17}$ |
| 1601. | $L_{A81}$ | $L_{B17}$ |
| 1602. | $L_{A82}$ | $L_{B17}$ |
| 1603. | $L_{A83}$ | $L_{B17}$ |
| 1604. | $L_{A84}$ | $L_{B17}$ |
| 1605. | $L_{A85}$ | $L_{B17}$ |
| 1606. | $L_{A86}$ | $L_{B17}$ |
| 1607. | $L_{A87}$ | $L_{B17}$ |
| 1608. | $L_{A88}$ | $L_{B17}$ |
| 1609. | $L_{A89}$ | $L_{B17}$ |
| 1610. | $L_{A90}$ | $L_{B17}$ |
| 1611. | $L_{A91}$ | $L_{B17}$ |
| 1612. | $L_{A92}$ | $L_{B17}$ |
| 1613. | $L_{A93}$ | $L_{B17}$ |
| 1614. | $L_{A94}$ | $L_{B17}$ |
| 1615. | $L_{A95}$ | $L_{B17}$ |
| 1616. | $L_{A1}$ | $L_{B18}$ |
| 1617. | $L_{A2}$ | $L_{B18}$ |
| 1618. | $L_{A3}$ | $L_{B18}$ |
| 1619. | $L_{A4}$ | $L_{B18}$ |
| 1620. | $L_{A5}$ | $L_{B18}$ |
| 1621. | $L_{A6}$ | $L_{B18}$ |
| 1622. | $L_{A7}$ | $L_{B18}$ |
| 1623. | $L_{A8}$ | $L_{B18}$ |
| 1624. | $L_{A9}$ | $L_{B18}$ |
| 1625. | $L_{A10}$ | $L_{B18}$ |
| 1626. | $L_{A11}$ | $L_{B18}$ |
| 1627. | $L_{A12}$ | $L_{B18}$ |
| 1628. | $L_{A13}$ | $L_{B18}$ |
| 1629. | $L_{A14}$ | $L_{B18}$ |
| 1630. | $L_{A15}$ | $L_{B18}$ |
| 1631. | $L_{A16}$ | $L_{B18}$ |
| 1632. | $L_{A17}$ | $L_{B18}$ |
| 1633. | $L_{A18}$ | $L_{B18}$ |
| 1634. | $L_{A19}$ | $L_{B18}$ |
| 1635. | $L_{A20}$ | $L_{B18}$ |
| 1636. | $L_{A21}$ | $L_{B18}$ |
| 1637. | $L_{A22}$ | $L_{B18}$ |
| 1638. | $L_{A23}$ | $L_{B18}$ |
| 1639. | $L_{A24}$ | $L_{B18}$ |
| 1640. | $L_{A25}$ | $L_{B18}$ |
| 1641. | $L_{A26}$ | $L_{B18}$ |
| 1642. | $L_{A27}$ | $L_{B18}$ |
| 1643. | $L_{A28}$ | $L_{B18}$ |
| 1644. | $L_{A29}$ | $L_{B18}$ |
| 1645. | $L_{A30}$ | $L_{B18}$ |
| 1646. | $L_{A31}$ | $L_{B18}$ |
| 1647. | $L_{A32}$ | $L_{B18}$ |
| 1648. | $L_{A33}$ | $L_{B18}$ |
| 1649. | $L_{A34}$ | $L_{B18}$ |
| 1650. | $L_{A35}$ | $L_{B18}$ |
| 1651. | $L_{A36}$ | $L_{B18}$ |
| 1652. | $L_{A37}$ | $L_{B18}$ |
| 1653. | $L_{A38}$ | $L_{B18}$ |
| 1654. | $L_{A39}$ | $L_{B18}$ |
| 1655. | $L_{A40}$ | $L_{B18}$ |
| 1656. | $L_{A41}$ | $L_{B18}$ |
| 1657. | $L_{A42}$ | $L_{B18}$ |
| 1658. | $L_{A43}$ | $L_{B18}$ |
| 1659. | $L_{A44}$ | $L_{B18}$ |
| 1660. | $L_{A45}$ | $L_{B18}$ |
| 1661. | $L_{A46}$ | $L_{B18}$ |
| 1662. | $L_{A47}$ | $L_{B18}$ |
| 1663. | $L_{A48}$ | $L_{B18}$ |
| 1664. | $L_{A49}$ | $L_{B18}$ |

TABLE 1-continued

| Cpd # | $L_A$ | $L_B$ |
|---|---|---|
| 1665. | $L_{A50}$ | $L_{B18}$ |
| 1666. | $L_{A51}$ | $L_{B18}$ |
| 1667. | $L_{A52}$ | $L_{B18}$ |
| 1668. | $L_{A53}$ | $L_{B18}$ |
| 1669. | $L_{A54}$ | $L_{B18}$ |
| 1670. | $L_{A55}$ | $L_{B18}$ |
| 1671. | $L_{A56}$ | $L_{B18}$ |
| 1672. | $L_{A57}$ | $L_{B18}$ |
| 1673. | $L_{A58}$ | $L_{B18}$ |
| 1674. | $L_{A59}$ | $L_{B18}$ |
| 1675. | $L_{A60}$ | $L_{B18}$ |
| 1676. | $L_{A61}$ | $L_{B18}$ |
| 1677. | $L_{A62}$ | $L_{B18}$ |
| 1678. | $L_{A63}$ | $L_{B18}$ |
| 1679. | $L_{A64}$ | $L_{B18}$ |
| 1680. | $L_{A65}$ | $L_{B18}$ |
| 1681. | $L_{A66}$ | $L_{B18}$ |
| 1682. | $L_{A67}$ | $L_{B18}$ |
| 1683. | $L_{A68}$ | $L_{B18}$ |
| 1684. | $L_{A69}$ | $L_{B18}$ |
| 1685. | $L_{A70}$ | $L_{B18}$ |
| 1686. | $L_{A71}$ | $L_{B18}$ |
| 1687. | $L_{A72}$ | $L_{B18}$ |
| 1688. | $L_{A73}$ | $L_{B18}$ |
| 1689. | $L_{A74}$ | $L_{B18}$ |
| 1690. | $L_{A75}$ | $L_{B18}$ |
| 1691. | $L_{A76}$ | $L_{B18}$ |
| 1692. | $L_{A77}$ | $L_{B18}$ |
| 1693. | $L_{A78}$ | $L_{B18}$ |
| 1694. | $L_{A79}$ | $L_{B18}$ |
| 1695. | $L_{A80}$ | $L_{B18}$ |
| 1696. | $L_{A81}$ | $L_{B18}$ |
| 1697. | $L_{A82}$ | $L_{B18}$ |
| 1698. | $L_{A83}$ | $L_{B18}$ |
| 1699. | $L_{A84}$ | $L_{B18}$ |
| 1700. | $L_{A85}$ | $L_{B18}$ |
| 1701. | $L_{A86}$ | $L_{B18}$ |
| 1702. | $L_{A87}$ | $L_{B18}$ |
| 1703. | $L_{A88}$ | $L_{B18}$ |
| 1704. | $L_{A89}$ | $L_{B18}$ |
| 1705. | $L_{A90}$ | $L_{B18}$ |
| 1706. | $L_{A91}$ | $L_{B18}$ |
| 1707. | $L_{A92}$ | $L_{B18}$ |
| 1708. | $L_{A93}$ | $L_{B18}$ |
| 1709. | $L_{A94}$ | $L_{B18}$ |
| 1710. | $L_{A95}$ | $L_{B18}$ |
| 1711. | $L_{A1}$ | $L_{B19}$ |
| 1712. | $L_{A2}$ | $L_{B19}$ |
| 1713. | $L_{A3}$ | $L_{B19}$ |
| 1714. | $L_{A4}$ | $L_{B19}$ |
| 1715. | $L_{A5}$ | $L_{B19}$ |
| 1716. | $L_{A6}$ | $L_{B19}$ |
| 1717. | $L_{A7}$ | $L_{B19}$ |
| 1718. | $L_{A8}$ | $L_{B19}$ |
| 1719. | $L_{A9}$ | $L_{B19}$ |
| 1720. | $L_{A10}$ | $L_{B19}$ |
| 1721. | $L_{A11}$ | $L_{B19}$ |
| 1722. | $L_{A12}$ | $L_{B19}$ |
| 1723. | $L_{A13}$ | $L_{B19}$ |
| 1724. | $L_{A14}$ | $L_{B19}$ |
| 1725. | $L_{A15}$ | $L_{B19}$ |
| 1726. | $L_{A16}$ | $L_{B19}$ |
| 1727. | $L_{A17}$ | $L_{B19}$ |
| 1728. | $L_{A18}$ | $L_{B19}$ |
| 1729. | $L_{A19}$ | $L_{B19}$ |
| 1730. | $L_{A20}$ | $L_{B19}$ |
| 1731. | $L_{A21}$ | $L_{B19}$ |
| 1732. | $L_{A22}$ | $L_{B19}$ |
| 1733. | $L_{A23}$ | $L_{B19}$ |
| 1734. | $L_{A24}$ | $L_{B19}$ |
| 1735. | $L_{A25}$ | $L_{B19}$ |
| 1736. | $L_{A26}$ | $L_{B19}$ |
| 1737. | $L_{A27}$ | $L_{B19}$ |
| 1738. | $L_{A28}$ | $L_{B19}$ |
| 1739. | $L_{A29}$ | $L_{B19}$ |
| 1740. | $L_{A30}$ | $L_{B19}$ |
| 1741. | $L_{A31}$ | $L_{B19}$ |
| 1742. | $L_{A32}$ | $L_{B19}$ |

TABLE 1-continued

| Cpd # | $L_A$ | $L_B$ |
|---|---|---|
| 1743. | $L_{A33}$ | $L_{B19}$ |
| 1744. | $L_{A34}$ | $L_{B19}$ |
| 1745. | $L_{A35}$ | $L_{B19}$ |
| 1746. | $L_{A36}$ | $L_{B19}$ |
| 1747. | $L_{A37}$ | $L_{B19}$ |
| 1748. | $L_{A38}$ | $L_{B19}$ |
| 1749. | $L_{A39}$ | $L_{B19}$ |
| 1750. | $L_{A40}$ | $L_{B19}$ |
| 1751. | $L_{A41}$ | $L_{B19}$ |
| 1752. | $L_{A42}$ | $L_{B19}$ |
| 1753. | $L_{A43}$ | $L_{B19}$ |
| 1754. | $L_{A44}$ | $L_{B19}$ |
| 1755. | $L_{A45}$ | $L_{B19}$ |
| 1756. | $L_{A46}$ | $L_{B19}$ |
| 1757. | $L_{A47}$ | $L_{B19}$ |
| 1758. | $L_{A48}$ | $L_{B19}$ |
| 1759. | $L_{A49}$ | $L_{B19}$ |
| 1760. | $L_{A50}$ | $L_{B19}$ |
| 1761. | $L_{A51}$ | $L_{B19}$ |
| 1762. | $L_{A52}$ | $L_{B19}$ |
| 1763. | $L_{A53}$ | $L_{B19}$ |
| 1764. | $L_{A54}$ | $L_{B19}$ |
| 1765. | $L_{A55}$ | $L_{B19}$ |
| 1766. | $L_{A56}$ | $L_{B19}$ |
| 1767. | $L_{A57}$ | $L_{B19}$ |
| 1768. | $L_{A58}$ | $L_{B19}$ |
| 1769. | $L_{A59}$ | $L_{B19}$ |
| 1770. | $L_{A60}$ | $L_{B19}$ |
| 1771. | $L_{A61}$ | $L_{B19}$ |
| 1772. | $L_{A62}$ | $L_{B19}$ |
| 1773. | $L_{A63}$ | $L_{B19}$ |
| 1774. | $L_{A64}$ | $L_{B19}$ |
| 1775. | $L_{A65}$ | $L_{B19}$ |
| 1776. | $L_{A66}$ | $L_{B19}$ |
| 1777. | $L_{A67}$ | $L_{B19}$ |
| 1778. | $L_{A68}$ | $L_{B19}$ |
| 1779. | $L_{A69}$ | $L_{B19}$ |
| 1780. | $L_{A70}$ | $L_{B19}$ |
| 1781. | $L_{A71}$ | $L_{B19}$ |
| 1782. | $L_{A72}$ | $L_{B19}$ |
| 1783. | $L_{A73}$ | $L_{B19}$ |
| 1784. | $L_{A74}$ | $L_{B19}$ |
| 1785. | $L_{A75}$ | $L_{B19}$ |
| 1786. | $L_{A76}$ | $L_{B19}$ |
| 1787. | $L_{A77}$ | $L_{B19}$ |
| 1788. | $L_{A78}$ | $L_{B19}$ |
| 1789. | $L_{A79}$ | $L_{B19}$ |
| 1790. | $L_{A80}$ | $L_{B19}$ |
| 1791. | $L_{A81}$ | $L_{B19}$ |
| 1792. | $L_{A82}$ | $L_{B19}$ |
| 1793. | $L_{A83}$ | $L_{B19}$ |
| 1794. | $L_{A84}$ | $L_{B19}$ |
| 1795. | $L_{A85}$ | $L_{B19}$ |
| 1796. | $L_{A86}$ | $L_{B19}$ |
| 1797. | $L_{A87}$ | $L_{B19}$ |
| 1798. | $L_{A88}$ | $L_{B19}$ |
| 1799. | $L_{A89}$ | $L_{B19}$ |
| 1800. | $L_{A90}$ | $L_{B19}$ |
| 1801. | $L_{A91}$ | $L_{B19}$ |
| 1802. | $L_{A92}$ | $L_{B19}$ |
| 1803. | $L_{A93}$ | $L_{B19}$ |
| 1804. | $L_{A94}$ | $L_{B19}$ |
| 1805. | $L_{A95}$ | $L_{B19}$ |
| 1806. | $L_{A1}$ | $L_{B20}$ |
| 1807. | $L_{A2}$ | $L_{B20}$ |
| 1808. | $L_{A3}$ | $L_{B20}$ |
| 1809. | $L_{A4}$ | $L_{B20}$ |
| 1810. | $L_{A5}$ | $L_{B20}$ |
| 1811. | $L_{A6}$ | $L_{B20}$ |
| 1812. | $L_{A7}$ | $L_{B20}$ |
| 1813. | $L_{A8}$ | $L_{B20}$ |
| 1814. | $L_{A9}$ | $L_{B20}$ |
| 1815. | $L_{A10}$ | $L_{B20}$ |
| 1816. | $L_{A11}$ | $L_{B20}$ |
| 1817. | $L_{A12}$ | $L_{B20}$ |
| 1818. | $L_{A13}$ | $L_{B20}$ |
| 1819. | $L_{A14}$ | $L_{B20}$ |
| 1820. | $L_{A15}$ | $L_{B20}$ |

TABLE 1-continued

| Cpd # | $L_A$ | $L_B$ |
|---|---|---|
| 1821. | $L_{A16}$ | $L_{B20}$ |
| 1822. | $L_{A17}$ | $L_{B20}$ |
| 1823. | $L_{A18}$ | $L_{B20}$ |
| 1824. | $L_{A19}$ | $L_{B20}$ |
| 1825. | $L_{A20}$ | $L_{B20}$ |
| 1826. | $L_{A21}$ | $L_{B20}$ |
| 1827. | $L_{A22}$ | $L_{B20}$ |
| 1828. | $L_{A23}$ | $L_{B20}$ |
| 1829. | $L_{A24}$ | $L_{B20}$ |
| 1830. | $L_{A25}$ | $L_{B20}$ |
| 1831. | $L_{A26}$ | $L_{B20}$ |
| 1832. | $L_{A27}$ | $L_{B20}$ |
| 1833. | $L_{A28}$ | $L_{B20}$ |
| 1834. | $L_{A29}$ | $L_{B20}$ |
| 1835. | $L_{A30}$ | $L_{B20}$ |
| 1836. | $L_{A31}$ | $L_{B20}$ |
| 1837. | $L_{A32}$ | $L_{B20}$ |
| 1838. | $L_{A33}$ | $L_{B20}$ |
| 1839. | $L_{A34}$ | $L_{B20}$ |
| 1840. | $L_{A35}$ | $L_{B20}$ |
| 1841. | $L_{A36}$ | $L_{B20}$ |
| 1842. | $L_{A37}$ | $L_{B20}$ |
| 1843. | $L_{A38}$ | $L_{B20}$ |
| 1844. | $L_{A39}$ | $L_{B20}$ |
| 1845. | $L_{A40}$ | $L_{B20}$ |
| 1846. | $L_{A41}$ | $L_{B20}$ |
| 1847. | $L_{A42}$ | $L_{B20}$ |
| 1848. | $L_{A43}$ | $L_{B20}$ |
| 1849. | $L_{A44}$ | $L_{B20}$ |
| 1850. | $L_{A45}$ | $L_{B20}$ |
| 1851. | $L_{A46}$ | $L_{B20}$ |
| 1852. | $L_{A47}$ | $L_{B20}$ |
| 1853. | $L_{A48}$ | $L_{B20}$ |
| 1854. | $L_{A49}$ | $L_{B20}$ |
| 1855. | $L_{A50}$ | $L_{B20}$ |
| 1856. | $L_{A51}$ | $L_{B20}$ |
| 1857. | $L_{A52}$ | $L_{B20}$ |
| 1858. | $L_{A53}$ | $L_{B20}$ |
| 1859. | $L_{A54}$ | $L_{B20}$ |
| 1860. | $L_{A55}$ | $L_{B20}$ |
| 1861. | $L_{A56}$ | $L_{B20}$ |
| 1862. | $L_{A57}$ | $L_{B20}$ |
| 1863. | $L_{A58}$ | $L_{B20}$ |
| 1864. | $L_{A59}$ | $L_{B20}$ |
| 1865. | $L_{A60}$ | $L_{B20}$ |
| 1866. | $L_{A61}$ | $L_{B20}$ |
| 1867. | $L_{A62}$ | $L_{B20}$ |
| 1868. | $L_{A63}$ | $L_{B20}$ |
| 1869. | $L_{A64}$ | $L_{B20}$ |
| 1870. | $L_{A65}$ | $L_{B20}$ |
| 1871. | $L_{A66}$ | $L_{B20}$ |
| 1872. | $L_{A67}$ | $L_{B20}$ |
| 1873. | $L_{A68}$ | $L_{B20}$ |
| 1874. | $L_{A69}$ | $L_{B20}$ |
| 1875. | $L_{A70}$ | $L_{B20}$ |
| 1876. | $L_{A71}$ | $L_{B20}$ |
| 1877. | $L_{A72}$ | $L_{B20}$ |
| 1878. | $L_{A73}$ | $L_{B20}$ |
| 1879. | $L_{A74}$ | $L_{B20}$ |
| 1880. | $L_{A75}$ | $L_{B20}$ |
| 1881. | $L_{A76}$ | $L_{B20}$ |
| 1882. | $L_{A77}$ | $L_{B20}$ |
| 1883. | $L_{A78}$ | $L_{B20}$ |
| 1884. | $L_{A79}$ | $L_{B20}$ |
| 1885. | $L_{A80}$ | $L_{B20}$ |
| 1886. | $L_{A81}$ | $L_{B20}$ |
| 1887. | $L_{A82}$ | $L_{B20}$ |
| 1888. | $L_{A83}$ | $L_{B20}$ |
| 1889. | $L_{A84}$ | $L_{B20}$ |
| 1890. | $L_{A85}$ | $L_{B20}$ |
| 1891. | $L_{A86}$ | $L_{B20}$ |
| 1892. | $L_{A87}$ | $L_{B20}$ |
| 1893. | $L_{A88}$ | $L_{B20}$ |
| 1894. | $L_{A89}$ | $L_{B20}$ |
| 1895. | $L_{A90}$ | $L_{B20}$ |
| 1896. | $L_{A91}$ | $L_{B20}$ |
| 1897. | $L_{A92}$ | $L_{B20}$ |
| 1898. | $L_{A93}$ | $L_{B20}$ |

TABLE 1-continued

| Cpd # | $L_A$ | $L_B$ |
|---|---|---|
| 1899. | $L_{A94}$ | $L_{B20}$ |
| 1900. | $L_{A95}$ | $L_{B20}$ |
| 1901. | $L_{A1}$ | $L_{B21}$ |
| 1902. | $L_{A2}$ | $L_{B21}$ |
| 1903. | $L_{A3}$ | $L_{B21}$ |
| 1904. | $L_{A4}$ | $L_{B21}$ |
| 1905. | $L_{A5}$ | $L_{B21}$ |
| 1906. | $L_{A6}$ | $L_{B21}$ |
| 1907. | $L_{A7}$ | $L_{B21}$ |
| 1908. | $L_{A8}$ | $L_{B21}$ |
| 1909. | $L_{A9}$ | $L_{B21}$ |
| 1910. | $L_{A10}$ | $L_{B21}$ |
| 1911. | $L_{A11}$ | $L_{B21}$ |
| 1912. | $L_{A12}$ | $L_{B21}$ |
| 1913. | $L_{A13}$ | $L_{B21}$ |
| 1914. | $L_{A14}$ | $L_{B21}$ |
| 1915. | $L_{A15}$ | $L_{B21}$ |
| 1916. | $L_{A16}$ | $L_{B21}$ |
| 1917. | $L_{A17}$ | $L_{B21}$ |
| 1918. | $L_{A18}$ | $L_{B21}$ |
| 1919. | $L_{A19}$ | $L_{B21}$ |
| 1920. | $L_{A20}$ | $L_{B21}$ |
| 1921. | $L_{A21}$ | $L_{B21}$ |
| 1922. | $L_{A22}$ | $L_{B21}$ |
| 1923. | $L_{A23}$ | $L_{B21}$ |
| 1924. | $L_{A24}$ | $L_{B21}$ |
| 1925. | $L_{A25}$ | $L_{B21}$ |
| 1926. | $L_{A26}$ | $L_{B21}$ |
| 1927. | $L_{A27}$ | $L_{B21}$ |
| 1928. | $L_{A28}$ | $L_{B21}$ |
| 1929. | $L_{A29}$ | $L_{B21}$ |
| 1930. | $L_{A30}$ | $L_{B21}$ |
| 1931. | $L_{A31}$ | $L_{B21}$ |
| 1932. | $L_{A32}$ | $L_{B21}$ |
| 1933. | $L_{A33}$ | $L_{B21}$ |
| 1934. | $L_{A34}$ | $L_{B21}$ |
| 1935. | $L_{A35}$ | $L_{B21}$ |
| 1936. | $L_{A36}$ | $L_{B21}$ |
| 1937. | $L_{A37}$ | $L_{B21}$ |
| 1938. | $L_{A38}$ | $L_{B21}$ |
| 1939. | $L_{A39}$ | $L_{B21}$ |
| 1940. | $L_{A40}$ | $L_{B21}$ |
| 1941. | $L_{A41}$ | $L_{B21}$ |
| 1942. | $L_{A42}$ | $L_{B21}$ |
| 1943. | $L_{A43}$ | $L_{B21}$ |
| 1944. | $L_{A44}$ | $L_{B21}$ |
| 1945. | $L_{A45}$ | $L_{B21}$ |
| 1946. | $L_{A46}$ | $L_{B21}$ |
| 1947. | $L_{A47}$ | $L_{B21}$ |
| 1948. | $L_{A48}$ | $L_{B21}$ |
| 1949. | $L_{A49}$ | $L_{B21}$ |
| 1950. | $L_{A50}$ | $L_{B21}$ |
| 1951. | $L_{A51}$ | $L_{B21}$ |
| 1952. | $L_{A52}$ | $L_{B21}$ |
| 1953. | $L_{A53}$ | $L_{B21}$ |
| 1954. | $L_{A54}$ | $L_{B21}$ |
| 1955. | $L_{A55}$ | $L_{B21}$ |
| 1956. | $L_{A56}$ | $L_{B21}$ |
| 1957. | $L_{A57}$ | $L_{B21}$ |
| 1958. | $L_{A58}$ | $L_{B21}$ |
| 1959. | $L_{A59}$ | $L_{B21}$ |
| 1960. | $L_{A60}$ | $L_{B21}$ |
| 1961. | $L_{A61}$ | $L_{B21}$ |
| 1962. | $L_{A62}$ | $L_{B21}$ |
| 1963. | $L_{A63}$ | $L_{B21}$ |
| 1964. | $L_{A64}$ | $L_{B21}$ |
| 1965. | $L_{A65}$ | $L_{B21}$ |
| 1966. | $L_{A66}$ | $L_{B21}$ |
| 1967. | $L_{A67}$ | $L_{B21}$ |
| 1968. | $L_{A68}$ | $L_{B21}$ |
| 1969. | $L_{A69}$ | $L_{B21}$ |
| 1970. | $L_{A70}$ | $L_{B21}$ |
| 1971. | $L_{A71}$ | $L_{B21}$ |
| 1972. | $L_{A72}$ | $L_{B21}$ |
| 1973. | $L_{A73}$ | $L_{B21}$ |
| 1974. | $L_{A74}$ | $L_{B21}$ |
| 1975. | $L_{A75}$ | $L_{B21}$ |
| 1976. | $L_{A76}$ | $L_{B21}$ |

TABLE 1-continued

| Cpd # | $L_A$ | $L_B$ |
|---|---|---|
| 1977. | $L_{A77}$ | $L_{B21}$ |
| 1978. | $L_{A78}$ | $L_{B21}$ |
| 1979. | $L_{A79}$ | $L_{B21}$ |
| 1980. | $L_{A80}$ | $L_{B21}$ |
| 1981. | $L_{A81}$ | $L_{B21}$ |
| 1982. | $L_{A82}$ | $L_{B21}$ |
| 1983. | $L_{A83}$ | $L_{B21}$ |
| 1984. | $L_{A84}$ | $L_{B21}$ |
| 1985. | $L_{A85}$ | $L_{B21}$ |
| 1986. | $L_{A86}$ | $L_{B21}$ |
| 1987. | $L_{A87}$ | $L_{B21}$ |
| 1988. | $L_{A88}$ | $L_{B21}$ |
| 1989. | $L_{A89}$ | $L_{B21}$ |
| 1990. | $L_{A90}$ | $L_{B21}$ |
| 1991. | $L_{A91}$ | $L_{B21}$ |
| 1992. | $L_{A92}$ | $L_{B21}$ |
| 1993. | $L_{A93}$ | $L_{B21}$ |
| 1994. | $L_{A94}$ | $L_{B21}$ |
| 1995. | $L_{A95}$ | $L_{B21}$ |
| 1996. | $L_{A1}$ | $L_{B22}$ |
| 1997. | $L_{A2}$ | $L_{B22}$ |
| 1998. | $L_{A3}$ | $L_{B22}$ |
| 1999. | $L_{A4}$ | $L_{B22}$ |
| 2000. | $L_{A5}$ | $L_{B22}$ |
| 2001. | $L_{A6}$ | $L_{B22}$ |
| 2002. | $L_{A7}$ | $L_{B22}$ |
| 2003. | $L_{A8}$ | $L_{B22}$ |
| 2004. | $L_{A9}$ | $L_{B22}$ |
| 2005. | $L_{A10}$ | $L_{B22}$ |
| 2006. | $L_{A11}$ | $L_{B22}$ |
| 2007. | $L_{A12}$ | $L_{B22}$ |
| 2008. | $L_{A13}$ | $L_{B22}$ |
| 2009. | $L_{A14}$ | $L_{B22}$ |
| 2010. | $L_{A15}$ | $L_{B22}$ |
| 2011. | $L_{A16}$ | $L_{B22}$ |
| 2012. | $L_{A17}$ | $L_{B22}$ |
| 2013. | $L_{A18}$ | $L_{B22}$ |
| 2014. | $L_{A19}$ | $L_{B22}$ |
| 2015. | $L_{A20}$ | $L_{B22}$ |
| 2016. | $L_{A21}$ | $L_{B22}$ |
| 2017. | $L_{A22}$ | $L_{B22}$ |
| 2018. | $L_{A23}$ | $L_{B22}$ |
| 2019. | $L_{A24}$ | $L_{B22}$ |
| 2020. | $L_{A25}$ | $L_{B22}$ |
| 2021. | $L_{A26}$ | $L_{B22}$ |
| 2022. | $L_{A27}$ | $L_{B22}$ |
| 2023. | $L_{A28}$ | $L_{B22}$ |
| 2024. | $L_{A29}$ | $L_{B22}$ |
| 2025. | $L_{A30}$ | $L_{B22}$ |
| 2026. | $L_{A31}$ | $L_{B22}$ |
| 2027. | $L_{A32}$ | $L_{B22}$ |
| 2028. | $L_{A33}$ | $L_{B22}$ |
| 2029. | $L_{A34}$ | $L_{B22}$ |
| 2030. | $L_{A35}$ | $L_{B22}$ |
| 2031. | $L_{A36}$ | $L_{B22}$ |
| 2032. | $L_{A37}$ | $L_{B22}$ |
| 2033. | $L_{A38}$ | $L_{B22}$ |
| 2034. | $L_{A39}$ | $L_{B22}$ |
| 2035. | $L_{A40}$ | $L_{B22}$ |
| 2036. | $L_{A41}$ | $L_{B22}$ |
| 2037. | $L_{A42}$ | $L_{B22}$ |
| 2038. | $L_{A43}$ | $L_{B22}$ |
| 2039. | $L_{A44}$ | $L_{B22}$ |
| 2040. | $L_{A45}$ | $L_{B22}$ |
| 2041. | $L_{A46}$ | $L_{B22}$ |
| 2042. | $L_{A47}$ | $L_{B22}$ |
| 2043. | $L_{A48}$ | $L_{B22}$ |
| 2044. | $L_{A49}$ | $L_{B22}$ |
| 2045. | $L_{A50}$ | $L_{B22}$ |
| 2046. | $L_{A51}$ | $L_{B22}$ |
| 2047. | $L_{A52}$ | $L_{B22}$ |
| 2048. | $L_{A53}$ | $L_{B22}$ |
| 2049. | $L_{A54}$ | $L_{B22}$ |
| 2050. | $L_{A55}$ | $L_{B22}$ |
| 2051. | $L_{A56}$ | $L_{B22}$ |
| 2052. | $L_{A57}$ | $L_{B22}$ |
| 2053. | $L_{A58}$ | $L_{B22}$ |
| 2054. | $L_{A59}$ | $L_{B22}$ |

TABLE 1-continued

| Cpd # | $L_A$ | $L_B$ |
|---|---|---|
| 2055. | $L_{A60}$ | $L_{B22}$ |
| 2056. | $L_{A61}$ | $L_{B22}$ |
| 2057. | $L_{A62}$ | $L_{B22}$ |
| 2058. | $L_{A63}$ | $L_{B22}$ |
| 2059. | $L_{A64}$ | $L_{B22}$ |
| 2060. | $L_{A65}$ | $L_{B22}$ |
| 2061. | $L_{A66}$ | $L_{B22}$ |
| 2062. | $L_{A67}$ | $L_{B22}$ |
| 2063. | $L_{A68}$ | $L_{B22}$ |
| 2064. | $L_{A69}$ | $L_{B22}$ |
| 2065. | $L_{A70}$ | $L_{B22}$ |
| 2066. | $L_{A71}$ | $L_{B22}$ |
| 2067. | $L_{A72}$ | $L_{B22}$ |
| 2068. | $L_{A73}$ | $L_{B22}$ |
| 2069. | $L_{A74}$ | $L_{B22}$ |
| 2070. | $L_{A75}$ | $L_{B22}$ |
| 2071. | $L_{A76}$ | $L_{B22}$ |
| 2072. | $L_{A77}$ | $L_{B22}$ |
| 2073. | $L_{A78}$ | $L_{B22}$ |
| 2074. | $L_{A79}$ | $L_{B22}$ |
| 2075. | $L_{A80}$ | $L_{B22}$ |
| 2076. | $L_{A81}$ | $L_{B22}$ |
| 2077. | $L_{A82}$ | $L_{B22}$ |
| 2078. | $L_{A83}$ | $L_{B22}$ |
| 2079. | $L_{A84}$ | $L_{B22}$ |
| 2080. | $L_{A85}$ | $L_{B22}$ |
| 2081. | $L_{A86}$ | $L_{B22}$ |
| 2082. | $L_{A87}$ | $L_{B22}$ |
| 2083. | $L_{A88}$ | $L_{B22}$ |
| 2084. | $L_{A89}$ | $L_{B22}$ |
| 2085. | $L_{A90}$ | $L_{B22}$ |
| 2086. | $L_{A91}$ | $L_{B22}$ |
| 2087. | $L_{A92}$ | $L_{B22}$ |
| 2088. | $L_{A93}$ | $L_{B22}$ |
| 2089. | $L_{A94}$ | $L_{B22}$ |
| 2090. | $L_{A95}$ | $L_{B22}$ |
| 2091. | $L_{A1}$ | $L_{B23}$ |
| 2092. | $L_{A2}$ | $L_{B23}$ |
| 2093. | $L_{A3}$ | $L_{B23}$ |
| 2094. | $L_{A4}$ | $L_{B23}$ |
| 2095. | $L_{A5}$ | $L_{B23}$ |
| 2096. | $L_{A6}$ | $L_{B23}$ |
| 2097. | $L_{A7}$ | $L_{B23}$ |
| 2098. | $L_{A8}$ | $L_{B23}$ |
| 2099. | $L_{A9}$ | $L_{B23}$ |
| 2100. | $L_{A10}$ | $L_{B23}$ |
| 2101. | $L_{A11}$ | $L_{B23}$ |
| 2102. | $L_{A12}$ | $L_{B23}$ |
| 2103. | $L_{A13}$ | $L_{B23}$ |
| 2104. | $L_{A14}$ | $L_{B23}$ |
| 2105. | $L_{A15}$ | $L_{B23}$ |
| 2106. | $L_{A16}$ | $L_{B23}$ |
| 2107. | $L_{A17}$ | $L_{B23}$ |
| 2108. | $L_{A18}$ | $L_{B23}$ |
| 2109. | $L_{A19}$ | $L_{B23}$ |
| 2110. | $L_{A20}$ | $L_{B23}$ |
| 2111. | $L_{A21}$ | $L_{B23}$ |
| 2112. | $L_{A22}$ | $L_{B23}$ |
| 2113. | $L_{A23}$ | $L_{B23}$ |
| 2114. | $L_{A24}$ | $L_{B23}$ |
| 2115. | $L_{A25}$ | $L_{B23}$ |
| 2116. | $L_{A26}$ | $L_{B23}$ |
| 2117. | $L_{A27}$ | $L_{B23}$ |
| 2118. | $L_{A28}$ | $L_{B23}$ |
| 2119. | $L_{A29}$ | $L_{B23}$ |
| 2120. | $L_{A30}$ | $L_{B23}$ |
| 2121. | $L_{A31}$ | $L_{B23}$ |
| 2122. | $L_{A32}$ | $L_{B23}$ |
| 2123. | $L_{A33}$ | $L_{B23}$ |
| 2124. | $L_{A34}$ | $L_{B23}$ |
| 2125. | $L_{A35}$ | $L_{B23}$ |
| 2126. | $L_{A36}$ | $L_{B23}$ |
| 2127. | $L_{A37}$ | $L_{B23}$ |
| 2128. | $L_{A38}$ | $L_{B23}$ |
| 2129. | $L_{A39}$ | $L_{B23}$ |
| 2130. | $L_{A40}$ | $L_{B23}$ |
| 2131. | $L_{A41}$ | $L_{B23}$ |
| 2132. | $L_{A42}$ | $L_{B23}$ |

TABLE 1-continued

| Cpd # | $L_A$ | $L_B$ |
|---|---|---|
| 2133. | $L_{A43}$ | $L_{B23}$ |
| 2134. | $L_{A44}$ | $L_{B23}$ |
| 2135. | $L_{A45}$ | $L_{B23}$ |
| 2136. | $L_{A46}$ | $L_{B23}$ |
| 2137. | $L_{A47}$ | $L_{B23}$ |
| 2138. | $L_{A48}$ | $L_{B23}$ |
| 2139. | $L_{A49}$ | $L_{B23}$ |
| 2140. | $L_{A50}$ | $L_{B23}$ |
| 2141. | $L_{A51}$ | $L_{B23}$ |
| 2142. | $L_{A52}$ | $L_{B23}$ |
| 2143. | $L_{A53}$ | $L_{B23}$ |
| 2144. | $L_{A54}$ | $L_{B23}$ |
| 2145. | $L_{A55}$ | $L_{B23}$ |
| 2146. | $L_{A56}$ | $L_{B23}$ |
| 2147. | $L_{A57}$ | $L_{B23}$ |
| 2148. | $L_{A58}$ | $L_{B23}$ |
| 2149. | $L_{A59}$ | $L_{B23}$ |
| 2150. | $L_{A60}$ | $L_{B23}$ |
| 2151. | $L_{A61}$ | $L_{B23}$ |
| 2152. | $L_{A62}$ | $L_{B23}$ |
| 2153. | $L_{A63}$ | $L_{B23}$ |
| 2154. | $L_{A64}$ | $L_{B23}$ |
| 2155. | $L_{A65}$ | $L_{B23}$ |
| 2156. | $L_{A66}$ | $L_{B23}$ |
| 2157. | $L_{A67}$ | $L_{B23}$ |
| 2158. | $L_{A68}$ | $L_{B23}$ |
| 2159. | $L_{A69}$ | $L_{B23}$ |
| 2160. | $L_{A70}$ | $L_{B23}$ |
| 2161. | $L_{A71}$ | $L_{B23}$ |
| 2162. | $L_{A72}$ | $L_{B23}$ |
| 2163. | $L_{A73}$ | $L_{B23}$ |
| 2164. | $L_{A74}$ | $L_{B23}$ |
| 2165. | $L_{A75}$ | $L_{B23}$ |
| 2166. | $L_{A76}$ | $L_{B23}$ |
| 2167. | $L_{A77}$ | $L_{B23}$ |
| 2168. | $L_{A78}$ | $L_{B23}$ |
| 2169. | $L_{A79}$ | $L_{B23}$ |
| 2170. | $L_{A80}$ | $L_{B23}$ |
| 2171. | $L_{A81}$ | $L_{B23}$ |
| 2172. | $L_{A82}$ | $L_{B23}$ |
| 2173. | $L_{A83}$ | $L_{B23}$ |
| 2174. | $L_{A84}$ | $L_{B23}$ |
| 2175. | $L_{A85}$ | $L_{B23}$ |
| 2176. | $L_{A86}$ | $L_{B23}$ |
| 2177. | $L_{A87}$ | $L_{B23}$ |
| 2178. | $L_{A88}$ | $L_{B23}$ |
| 2179. | $L_{A89}$ | $L_{B23}$ |
| 2180. | $L_{A90}$ | $L_{B23}$ |
| 2181. | $L_{A91}$ | $L_{B23}$ |
| 2182. | $L_{A92}$ | $L_{B23}$ |
| 2183. | $L_{A93}$ | $L_{B23}$ |
| 2184. | $L_{A94}$ | $L_{B23}$ |
| 2185. | $L_{A95}$ | $L_{B23}$ |
| 2186. | $L_{A1}$ | $L_{B24}$ |
| 2187. | $L_{A2}$ | $L_{B24}$ |
| 2188. | $L_{A3}$ | $L_{B24}$ |
| 2189. | $L_{A4}$ | $L_{B24}$ |
| 2190. | $L_{A5}$ | $L_{B24}$ |
| 2191. | $L_{A6}$ | $L_{B24}$ |
| 2192. | $L_{A7}$ | $L_{B24}$ |
| 2193. | $L_{A8}$ | $L_{B24}$ |
| 2194. | $L_{A9}$ | $L_{B24}$ |
| 2195. | $L_{A10}$ | $L_{B24}$ |
| 2196. | $L_{A11}$ | $L_{B24}$ |
| 2197. | $L_{A12}$ | $L_{B24}$ |
| 2198. | $L_{A13}$ | $L_{B24}$ |
| 2199. | $L_{A14}$ | $L_{B24}$ |
| 2200. | $L_{A15}$ | $L_{B24}$ |
| 2201. | $L_{A16}$ | $L_{B24}$ |
| 2202. | $L_{A17}$ | $L_{B24}$ |
| 2203. | $L_{A18}$ | $L_{B24}$ |
| 2204. | $L_{A19}$ | $L_{B24}$ |
| 2205. | $L_{A20}$ | $L_{B24}$ |
| 2206. | $L_{A21}$ | $L_{B24}$ |
| 2207. | $L_{A22}$ | $L_{B24}$ |
| 2208. | $L_{A23}$ | $L_{B24}$ |
| 2209. | $L_{A24}$ | $L_{B24}$ |
| 2210. | $L_{A25}$ | $L_{B24}$ |

TABLE 1-continued

| Cpd # | $L_A$ | $L_B$ |
|---|---|---|
| 2211. | $L_{A26}$ | $L_{B24}$ |
| 2212. | $L_{A27}$ | $L_{B24}$ |
| 2213. | $L_{A28}$ | $L_{B24}$ |
| 2214. | $L_{A29}$ | $L_{B24}$ |
| 2215. | $L_{A30}$ | $L_{B24}$ |
| 2216. | $L_{A31}$ | $L_{B24}$ |
| 2217. | $L_{A32}$ | $L_{B24}$ |
| 2218. | $L_{A33}$ | $L_{B24}$ |
| 2219. | $L_{A34}$ | $L_{B24}$ |
| 2220. | $L_{A35}$ | $L_{B24}$ |
| 2221. | $L_{A36}$ | $L_{B24}$ |
| 2222. | $L_{A37}$ | $L_{B24}$ |
| 2223. | $L_{A38}$ | $L_{B24}$ |
| 2224. | $L_{A39}$ | $L_{B24}$ |
| 2225. | $L_{A40}$ | $L_{B24}$ |
| 2226. | $L_{A41}$ | $L_{B24}$ |
| 2227. | $L_{A42}$ | $L_{B24}$ |
| 2228. | $L_{A43}$ | $L_{B24}$ |
| 2229. | $L_{A44}$ | $L_{B24}$ |
| 2230. | $L_{A45}$ | $L_{B24}$ |
| 2231. | $L_{A46}$ | $L_{B24}$ |
| 2232. | $L_{A47}$ | $L_{B24}$ |
| 2233. | $L_{A48}$ | $L_{B24}$ |
| 2234. | $L_{A49}$ | $L_{B24}$ |
| 2235. | $L_{A50}$ | $L_{B24}$ |
| 2236. | $L_{A51}$ | $L_{B24}$ |
| 2237. | $L_{A52}$ | $L_{B24}$ |
| 2238. | $L_{A53}$ | $L_{B24}$ |
| 2239. | $L_{A54}$ | $L_{B24}$ |
| 2240. | $L_{A55}$ | $L_{B24}$ |
| 2241. | $L_{A56}$ | $L_{B24}$ |
| 2242. | $L_{A57}$ | $L_{B24}$ |
| 2243. | $L_{A58}$ | $L_{B24}$ |
| 2244. | $L_{A59}$ | $L_{B24}$ |
| 2245. | $L_{A60}$ | $L_{B24}$ |
| 2246. | $L_{A61}$ | $L_{B24}$ |
| 2247. | $L_{A62}$ | $L_{B24}$ |
| 2248. | $L_{A63}$ | $L_{B24}$ |
| 2249. | $L_{A64}$ | $L_{B24}$ |
| 2250. | $L_{A65}$ | $L_{B24}$ |
| 2251. | $L_{A66}$ | $L_{B24}$ |
| 2252. | $L_{A67}$ | $L_{B24}$ |
| 2253. | $L_{A68}$ | $L_{B24}$ |
| 2254. | $L_{A69}$ | $L_{B24}$ |
| 2255. | $L_{A70}$ | $L_{B24}$ |
| 2256. | $L_{A71}$ | $L_{B24}$ |
| 2257. | $L_{A72}$ | $L_{B24}$ |
| 2258. | $L_{A73}$ | $L_{B24}$ |
| 2259. | $L_{A74}$ | $L_{B24}$ |
| 2260. | $L_{A75}$ | $L_{B24}$ |
| 2261. | $L_{A76}$ | $L_{B24}$ |
| 2262. | $L_{A77}$ | $L_{B24}$ |
| 2263. | $L_{A78}$ | $L_{B24}$ |
| 2264. | $L_{A79}$ | $L_{B24}$ |
| 2265. | $L_{A80}$ | $L_{B24}$ |
| 2266. | $L_{A81}$ | $L_{B24}$ |
| 2267. | $L_{A82}$ | $L_{B24}$ |
| 2268. | $L_{A83}$ | $L_{B24}$ |
| 2269. | $L_{A84}$ | $L_{B24}$ |
| 2270. | $L_{A85}$ | $L_{B24}$ |
| 2271. | $L_{A86}$ | $L_{B24}$ |
| 2272. | $L_{A87}$ | $L_{B24}$ |
| 2273. | $L_{A88}$ | $L_{B24}$ |
| 2274. | $L_{A89}$ | $L_{B24}$ |
| 2275. | $L_{A90}$ | $L_{B24}$ |
| 2276. | $L_{A91}$ | $L_{B24}$ |
| 2277. | $L_{A92}$ | $L_{B24}$ |
| 2278. | $L_{A93}$ | $L_{B24}$ |
| 2279. | $L_{A94}$ | $L_{B24}$ |
| 2280. | $L_{A95}$ | $L_{B24}$ |
| 2281. | $L_{A1}$ | $L_{B25}$ |
| 2282. | $L_{A2}$ | $L_{B25}$ |
| 2283. | $L_{A3}$ | $L_{B25}$ |
| 2284. | $L_{A4}$ | $L_{B25}$ |
| 2285. | $L_{A5}$ | $L_{B25}$ |
| 2286. | $L_{A6}$ | $L_{B25}$ |
| 2287. | $L_{A7}$ | $L_{B25}$ |
| 2288. | $L_{A8}$ | $L_{B25}$ |

TABLE 1-continued

| Cpd # | $L_A$ | $L_B$ |
|---|---|---|
| 2289. | $L_{A9}$ | $L_{B25}$ |
| 2290. | $L_{A10}$ | $L_{B25}$ |
| 2291. | $L_{A11}$ | $L_{B25}$ |
| 2292. | $L_{A12}$ | $L_{B25}$ |
| 2293. | $L_{A13}$ | $L_{B25}$ |
| 2294. | $L_{A14}$ | $L_{B25}$ |
| 2295. | $L_{A15}$ | $L_{B25}$ |
| 2296. | $L_{A16}$ | $L_{B25}$ |
| 2297. | $L_{A17}$ | $L_{B25}$ |
| 2298. | $L_{A18}$ | $L_{B25}$ |
| 2299. | $L_{A19}$ | $L_{B25}$ |
| 2300. | $L_{A20}$ | $L_{B25}$ |
| 2301. | $L_{A21}$ | $L_{B25}$ |
| 2302. | $L_{A22}$ | $L_{B25}$ |
| 2303. | $L_{A23}$ | $L_{B25}$ |
| 2304. | $L_{A24}$ | $L_{B25}$ |
| 2305. | $L_{A25}$ | $L_{B25}$ |
| 2306. | $L_{A26}$ | $L_{B25}$ |
| 2307. | $L_{A27}$ | $L_{B25}$ |
| 2308. | $L_{A28}$ | $L_{B25}$ |
| 2309. | $L_{A29}$ | $L_{B25}$ |
| 2310. | $L_{A30}$ | $L_{B25}$ |
| 2311. | $L_{A31}$ | $L_{B25}$ |
| 2312. | $L_{A32}$ | $L_{B25}$ |
| 2313. | $L_{A33}$ | $L_{B25}$ |
| 2314. | $L_{A34}$ | $L_{B25}$ |
| 2315. | $L_{A35}$ | $L_{B25}$ |
| 2316. | $L_{A36}$ | $L_{B25}$ |
| 2317. | $L_{A37}$ | $L_{B25}$ |
| 2318. | $L_{A38}$ | $L_{B25}$ |
| 2319. | $L_{A39}$ | $L_{B25}$ |
| 2320. | $L_{A40}$ | $L_{B25}$ |
| 2321. | $L_{A41}$ | $L_{B25}$ |
| 2322. | $L_{A42}$ | $L_{B25}$ |
| 2323. | $L_{A43}$ | $L_{B25}$ |
| 2324. | $L_{A44}$ | $L_{B25}$ |
| 2325. | $L_{A45}$ | $L_{B25}$ |
| 2326. | $L_{A46}$ | $L_{B25}$ |
| 2327. | $L_{A47}$ | $L_{B25}$ |
| 2328. | $L_{A48}$ | $L_{B25}$ |
| 2329. | $L_{A49}$ | $L_{B25}$ |
| 2330. | $L_{A50}$ | $L_{B25}$ |
| 2331. | $L_{A51}$ | $L_{B25}$ |
| 2332. | $L_{A52}$ | $L_{B25}$ |
| 2333. | $L_{A53}$ | $L_{B25}$ |
| 2334. | $L_{A54}$ | $L_{B25}$ |
| 2335. | $L_{A55}$ | $L_{B25}$ |
| 2336. | $L_{A56}$ | $L_{B25}$ |
| 2337. | $L_{A57}$ | $L_{B25}$ |
| 2338. | $L_{A58}$ | $L_{B25}$ |
| 2339. | $L_{A59}$ | $L_{B25}$ |
| 2340. | $L_{A60}$ | $L_{B25}$ |
| 2341. | $L_{A61}$ | $L_{B25}$ |
| 2342. | $L_{A62}$ | $L_{B25}$ |
| 2343. | $L_{A63}$ | $L_{B25}$ |
| 2344. | $L_{A64}$ | $L_{B25}$ |
| 2345. | $L_{A65}$ | $L_{B25}$ |
| 2346. | $L_{A66}$ | $L_{B25}$ |
| 2347. | $L_{A67}$ | $L_{B25}$ |
| 2348. | $L_{A68}$ | $L_{B25}$ |
| 2349. | $L_{A69}$ | $L_{B25}$ |
| 2350. | $L_{A70}$ | $L_{B25}$ |
| 2351. | $L_{A71}$ | $L_{B25}$ |
| 2352. | $L_{A72}$ | $L_{B25}$ |
| 2353. | $L_{A73}$ | $L_{B25}$ |
| 2354. | $L_{A74}$ | $L_{B25}$ |
| 2355. | $L_{A75}$ | $L_{B25}$ |
| 2356. | $L_{A76}$ | $L_{B25}$ |
| 2357. | $L_{A77}$ | $L_{B25}$ |
| 2358. | $L_{A78}$ | $L_{B25}$ |
| 2359. | $L_{A79}$ | $L_{B25}$ |
| 2360. | $L_{A80}$ | $L_{B25}$ |
| 2361. | $L_{A81}$ | $L_{B25}$ |
| 2362. | $L_{A82}$ | $L_{B25}$ |
| 2363. | $L_{A83}$ | $L_{B25}$ |
| 2364. | $L_{A84}$ | $L_{B25}$ |
| 2365. | $L_{A85}$ | $L_{B25}$ |
| 2366. | $L_{A86}$ | $L_{B25}$ |

TABLE 1-continued

| Cpd # | $L_A$ | $L_B$ |
|---|---|---|
| 2367. | $L_{A87}$ | $L_{B25}$ |
| 2368. | $L_{A88}$ | $L_{B25}$ |
| 2369. | $L_{A89}$ | $L_{B25}$ |
| 2370. | $L_{A90}$ | $L_{B25}$ |
| 2371. | $L_{A91}$ | $L_{B25}$ |
| 2372. | $L_{A92}$ | $L_{B25}$ |
| 2373. | $L_{A93}$ | $L_{B25}$ |
| 2374. | $L_{A94}$ | $L_{B25}$ |
| 2375. | $L_{A95}$ | $L_{B25}$ |
| 2376. | $L_{A1}$ | $L_{B26}$ |
| 2377. | $L_{A2}$ | $L_{B26}$ |
| 2378. | $L_{A3}$ | $L_{B26}$ |
| 2379. | $L_{A4}$ | $L_{B26}$ |
| 2380. | $L_{A5}$ | $L_{B26}$ |
| 2381. | $L_{A6}$ | $L_{B26}$ |
| 2382. | $L_{A7}$ | $L_{B26}$ |
| 2383. | $L_{A8}$ | $L_{B26}$ |
| 2384. | $L_{A9}$ | $L_{B26}$ |
| 2385. | $L_{A10}$ | $L_{B26}$ |
| 2386. | $L_{A11}$ | $L_{B26}$ |
| 2387. | $L_{A12}$ | $L_{B26}$ |
| 2388. | $L_{A13}$ | $L_{B26}$ |
| 2389. | $L_{A14}$ | $L_{B26}$ |
| 2390. | $L_{A15}$ | $L_{B26}$ |
| 2391. | $L_{A16}$ | $L_{B26}$ |
| 2392. | $L_{A17}$ | $L_{B26}$ |
| 2393. | $L_{A18}$ | $L_{B26}$ |
| 2394. | $L_{A19}$ | $L_{B26}$ |
| 2395. | $L_{A20}$ | $L_{B26}$ |
| 2396. | $L_{A21}$ | $L_{B26}$ |
| 2397. | $L_{A22}$ | $L_{B26}$ |
| 2398. | $L_{A23}$ | $L_{B26}$ |
| 2399. | $L_{A24}$ | $L_{B26}$ |
| 2400. | $L_{A25}$ | $L_{B26}$ |
| 2401. | $L_{A26}$ | $L_{B26}$ |
| 2402. | $L_{A27}$ | $L_{B26}$ |
| 2403. | $L_{A28}$ | $L_{B26}$ |
| 2404. | $L_{A29}$ | $L_{B26}$ |
| 2405. | $L_{A30}$ | $L_{B26}$ |
| 2406. | $L_{A31}$ | $L_{B26}$ |
| 2407. | $L_{A32}$ | $L_{B26}$ |
| 2408. | $L_{A33}$ | $L_{B26}$ |
| 2409. | $L_{A34}$ | $L_{B26}$ |
| 2410. | $L_{A35}$ | $L_{B26}$ |
| 2411. | $L_{A36}$ | $L_{B26}$ |
| 2412. | $L_{A37}$ | $L_{B26}$ |
| 2413. | $L_{A38}$ | $L_{B26}$ |
| 2414. | $L_{A39}$ | $L_{B26}$ |
| 2415. | $L_{A40}$ | $L_{B26}$ |
| 2416. | $L_{A41}$ | $L_{B26}$ |
| 2417. | $L_{A42}$ | $L_{B26}$ |
| 2418. | $L_{A43}$ | $L_{B26}$ |
| 2419. | $L_{A44}$ | $L_{B26}$ |
| 2420. | $L_{A45}$ | $L_{B26}$ |
| 2421. | $L_{A46}$ | $L_{B26}$ |
| 2422. | $L_{A47}$ | $L_{B26}$ |
| 2423. | $L_{A48}$ | $L_{B26}$ |
| 2424. | $L_{A49}$ | $L_{B26}$ |
| 2425. | $L_{A50}$ | $L_{B26}$ |
| 2426. | $L_{A51}$ | $L_{B26}$ |
| 2427. | $L_{A52}$ | $L_{B26}$ |
| 2428. | $L_{A53}$ | $L_{B26}$ |
| 2429. | $L_{A54}$ | $L_{B26}$ |
| 2430. | $L_{A55}$ | $L_{B26}$ |
| 2431. | $L_{A56}$ | $L_{B26}$ |
| 2432. | $L_{A57}$ | $L_{B26}$ |
| 2433. | $L_{A58}$ | $L_{B26}$ |
| 2434. | $L_{A59}$ | $L_{B26}$ |
| 2435. | $L_{A60}$ | $L_{B26}$ |
| 2436. | $L_{A61}$ | $L_{B26}$ |
| 2437. | $L_{A62}$ | $L_{B26}$ |
| 2438. | $L_{A63}$ | $L_{B26}$ |
| 2439. | $L_{A64}$ | $L_{B26}$ |
| 2440. | $L_{A65}$ | $L_{B26}$ |
| 2441. | $L_{A66}$ | $L_{B26}$ |
| 2442. | $L_{A67}$ | $L_{B26}$ |
| 2443. | $L_{A68}$ | $L_{B26}$ |
| 2444. | $L_{A69}$ | $L_{B26}$ |

TABLE 1-continued

| Cpd # | $L_A$ | $L_B$ |
|---|---|---|
| 2445. | $L_{A70}$ | $L_{B26}$ |
| 2446. | $L_{A71}$ | $L_{B26}$ |
| 2447. | $L_{A72}$ | $L_{B26}$ |
| 2448. | $L_{A73}$ | $L_{B26}$ |
| 2449. | $L_{A74}$ | $L_{B26}$ |
| 2450. | $L_{A75}$ | $L_{B26}$ |
| 2451. | $L_{A76}$ | $L_{B26}$ |
| 2452. | $L_{A77}$ | $L_{B26}$ |
| 2453. | $L_{A78}$ | $L_{B26}$ |
| 2454. | $L_{A79}$ | $L_{B26}$ |
| 2455. | $L_{A80}$ | $L_{B26}$ |
| 2456. | $L_{A81}$ | $L_{B26}$ |
| 2457. | $L_{A82}$ | $L_{B26}$ |
| 2458. | $L_{A83}$ | $L_{B26}$ |
| 2459. | $L_{A84}$ | $L_{B26}$ |
| 2460. | $L_{A85}$ | $L_{B26}$ |
| 2461. | $L_{A86}$ | $L_{B26}$ |
| 2462. | $L_{A87}$ | $L_{B26}$ |
| 2463. | $L_{A88}$ | $L_{B26}$ |
| 2464. | $L_{A89}$ | $L_{B26}$ |
| 2465. | $L_{A90}$ | $L_{B26}$ |
| 2466. | $L_{A91}$ | $L_{B26}$ |
| 2467. | $L_{A92}$ | $L_{B26}$ |
| 2468. | $L_{A93}$ | $L_{B26}$ |
| 2469. | $L_{A94}$ | $L_{B26}$ |
| 2470. | $L_{A95}$ | $L_{B26}$ |
| 2471. | $L_{A1}$ | $L_{B27}$ |
| 2472. | $L_{A2}$ | $L_{B27}$ |
| 2473. | $L_{A3}$ | $L_{B27}$ |
| 2474. | $L_{A4}$ | $L_{B27}$ |
| 2475. | $L_{A5}$ | $L_{B27}$ |
| 2476. | $L_{A6}$ | $L_{B27}$ |
| 2477. | $L_{A7}$ | $L_{B27}$ |
| 2478. | $L_{A8}$ | $L_{B27}$ |
| 2479. | $L_{A9}$ | $L_{B27}$ |
| 2480. | $L_{A10}$ | $L_{B27}$ |
| 2481. | $L_{A11}$ | $L_{B27}$ |
| 2482. | $L_{A12}$ | $L_{B27}$ |
| 2483. | $L_{A13}$ | $L_{B27}$ |
| 2484. | $L_{A14}$ | $L_{B27}$ |
| 2485. | $L_{A15}$ | $L_{B27}$ |
| 2486. | $L_{A16}$ | $L_{B27}$ |
| 2487. | $L_{A17}$ | $L_{B27}$ |
| 2488. | $L_{A18}$ | $L_{B27}$ |
| 2489. | $L_{A19}$ | $L_{B27}$ |
| 2490. | $L_{A20}$ | $L_{B27}$ |
| 2491. | $L_{A21}$ | $L_{B27}$ |
| 2492. | $L_{A22}$ | $L_{B27}$ |
| 2493. | $L_{A23}$ | $L_{B27}$ |
| 2494. | $L_{A24}$ | $L_{B27}$ |
| 2495. | $L_{A25}$ | $L_{B27}$ |
| 2496. | $L_{A26}$ | $L_{B27}$ |
| 2497. | $L_{A27}$ | $L_{B27}$ |
| 2498. | $L_{A28}$ | $L_{B27}$ |
| 2499. | $L_{A29}$ | $L_{B27}$ |
| 2500. | $L_{A30}$ | $L_{B27}$ |
| 2501. | $L_{A31}$ | $L_{B27}$ |
| 2502. | $L_{A32}$ | $L_{B27}$ |
| 2503. | $L_{A33}$ | $L_{B27}$ |
| 2504. | $L_{A34}$ | $L_{B27}$ |
| 2505. | $L_{A35}$ | $L_{B27}$ |
| 2506. | $L_{A36}$ | $L_{B27}$ |
| 2507. | $L_{A37}$ | $L_{B27}$ |
| 2508. | $L_{A38}$ | $L_{B27}$ |
| 2509. | $L_{A39}$ | $L_{B27}$ |
| 2510. | $L_{A40}$ | $L_{B27}$ |
| 2511. | $L_{A41}$ | $L_{B27}$ |
| 2512. | $L_{A42}$ | $L_{B27}$ |
| 2513. | $L_{A43}$ | $L_{B27}$ |
| 2514. | $L_{A44}$ | $L_{B27}$ |
| 2515. | $L_{A45}$ | $L_{B27}$ |
| 2516. | $L_{A46}$ | $L_{B27}$ |
| 2517. | $L_{A47}$ | $L_{B27}$ |
| 2518. | $L_{A48}$ | $L_{B27}$ |
| 2519. | $L_{A49}$ | $L_{B27}$ |
| 2520. | $L_{A50}$ | $L_{B27}$ |
| 2521. | $L_{A51}$ | $L_{B27}$ |
| 2522. | $L_{A52}$ | $L_{B27}$ |

TABLE 1-continued

| Cpd # | $L_A$ | $L_B$ |
|---|---|---|
| 2523. | $L_{A53}$ | $L_{B27}$ |
| 2524. | $L_{A54}$ | $L_{B27}$ |
| 2525. | $L_{A55}$ | $L_{B27}$ |
| 2526. | $L_{A56}$ | $L_{B27}$ |
| 2527. | $L_{A57}$ | $L_{B27}$ |
| 2528. | $L_{A58}$ | $L_{B27}$ |
| 2529. | $L_{A59}$ | $L_{B27}$ |
| 2530. | $L_{A60}$ | $L_{B27}$ |
| 2531. | $L_{A61}$ | $L_{B27}$ |
| 2532. | $L_{A62}$ | $L_{B27}$ |
| 2533. | $L_{A63}$ | $L_{B27}$ |
| 2534. | $L_{A64}$ | $L_{B27}$ |
| 2535. | $L_{A65}$ | $L_{B27}$ |
| 2536. | $L_{A66}$ | $L_{B27}$ |
| 2537. | $L_{A67}$ | $L_{B27}$ |
| 2538. | $L_{A68}$ | $L_{B27}$ |
| 2539. | $L_{A69}$ | $L_{B27}$ |
| 2540. | $L_{A70}$ | $L_{B27}$ |
| 2541. | $L_{A71}$ | $L_{B27}$ |
| 2542. | $L_{A72}$ | $L_{B27}$ |
| 2543. | $L_{A73}$ | $L_{B27}$ |
| 2544. | $L_{A74}$ | $L_{B27}$ |
| 2545. | $L_{A75}$ | $L_{B27}$ |
| 2546. | $L_{A76}$ | $L_{B27}$ |
| 2547. | $L_{A77}$ | $L_{B27}$ |
| 2548. | $L_{A78}$ | $L_{B27}$ |
| 2549. | $L_{A79}$ | $L_{B27}$ |
| 2550. | $L_{A80}$ | $L_{B27}$ |
| 2551. | $L_{A81}$ | $L_{B27}$ |
| 2552. | $L_{A82}$ | $L_{B27}$ |
| 2553. | $L_{A83}$ | $L_{B27}$ |
| 2554. | $L_{A84}$ | $L_{B27}$ |
| 2555. | $L_{A85}$ | $L_{B27}$ |
| 2556. | $L_{A86}$ | $L_{B27}$ |
| 2557. | $L_{A87}$ | $L_{B27}$ |
| 2558. | $L_{A88}$ | $L_{B27}$ |
| 2559. | $L_{A89}$ | $L_{B27}$ |
| 2560. | $L_{A90}$ | $L_{B27}$ |
| 2561. | $L_{A91}$ | $L_{B27}$ |
| 2562. | $L_{A92}$ | $L_{B27}$ |
| 2563. | $L_{A93}$ | $L_{B27}$ |
| 2564. | $L_{A94}$ | $L_{B27}$ |
| 2565. | $L_{A95}$ | $L_{B27}$ |
| 2566. | $L_{A1}$ | $L_{B28}$ |
| 2567. | $L_{A2}$ | $L_{B28}$ |
| 2568. | $L_{A3}$ | $L_{B28}$ |
| 2569. | $L_{A4}$ | $L_{B28}$ |
| 2570. | $L_{A5}$ | $L_{B28}$ |
| 2571. | $L_{A6}$ | $L_{B28}$ |
| 2572. | $L_{A7}$ | $L_{B28}$ |
| 2573. | $L_{A8}$ | $L_{B28}$ |
| 2574. | $L_{A9}$ | $L_{B28}$ |
| 2575. | $L_{A10}$ | $L_{B28}$ |
| 2576. | $L_{A11}$ | $L_{B28}$ |
| 2577. | $L_{A12}$ | $L_{B28}$ |
| 2578. | $L_{A13}$ | $L_{B28}$ |
| 2579. | $L_{A14}$ | $L_{B28}$ |
| 2580. | $L_{A15}$ | $L_{B28}$ |
| 2581. | $L_{A16}$ | $L_{B28}$ |
| 2582. | $L_{A17}$ | $L_{B28}$ |
| 2583. | $L_{A18}$ | $L_{B28}$ |
| 2584. | $L_{A19}$ | $L_{B28}$ |
| 2585. | $L_{A20}$ | $L_{B28}$ |
| 2586. | $L_{A21}$ | $L_{B28}$ |
| 2587. | $L_{A22}$ | $L_{B28}$ |
| 2588. | $L_{A23}$ | $L_{B28}$ |
| 2589. | $L_{A24}$ | $L_{B28}$ |
| 2590. | $L_{A25}$ | $L_{B28}$ |
| 2591. | $L_{A26}$ | $L_{B28}$ |
| 2592. | $L_{A27}$ | $L_{B28}$ |
| 2593. | $L_{A28}$ | $L_{B28}$ |
| 2594. | $L_{A29}$ | $L_{B28}$ |
| 2595. | $L_{A30}$ | $L_{B28}$ |
| 2596. | $L_{A31}$ | $L_{B28}$ |
| 2597. | $L_{A32}$ | $L_{B28}$ |
| 2598. | $L_{A33}$ | $L_{B28}$ |
| 2599. | $L_{A34}$ | $L_{B28}$ |
| 2600. | $L_{A35}$ | $L_{B28}$ |

TABLE 1-continued

| Cpd # | $L_A$ | $L_B$ |
| --- | --- | --- |
| 2601. | $L_{A36}$ | $L_{B28}$ |
| 2602. | $L_{A37}$ | $L_{B28}$ |
| 2603. | $L_{A38}$ | $L_{B28}$ |
| 2604. | $L_{A39}$ | $L_{B28}$ |
| 2605. | $L_{A40}$ | $L_{B28}$ |
| 2606. | $L_{A41}$ | $L_{B28}$ |
| 2607. | $L_{A42}$ | $L_{B28}$ |
| 2608. | $L_{A43}$ | $L_{B28}$ |
| 2609. | $L_{A44}$ | $L_{B28}$ |
| 2610. | $L_{A45}$ | $L_{B28}$ |
| 2611. | $L_{A46}$ | $L_{B28}$ |
| 2612. | $L_{A47}$ | $L_{B28}$ |
| 2613. | $L_{A48}$ | $L_{B28}$ |
| 2614. | $L_{A49}$ | $L_{B28}$ |
| 2615. | $L_{A50}$ | $L_{B28}$ |
| 2616. | $L_{A51}$ | $L_{B28}$ |
| 2617. | $L_{A52}$ | $L_{B28}$ |
| 2618. | $L_{A53}$ | $L_{B28}$ |
| 2619. | $L_{A54}$ | $L_{B28}$ |
| 2620. | $L_{A55}$ | $L_{B28}$ |
| 2621. | $L_{A56}$ | $L_{B28}$ |
| 2622. | $L_{A57}$ | $L_{B28}$ |
| 2623. | $L_{A58}$ | $L_{B28}$ |
| 2624. | $L_{A59}$ | $L_{B28}$ |
| 2625. | $L_{A60}$ | $L_{B28}$ |
| 2626. | $L_{A61}$ | $L_{B28}$ |
| 2627. | $L_{A62}$ | $L_{B28}$ |
| 2628. | $L_{A63}$ | $L_{B28}$ |
| 2629. | $L_{A64}$ | $L_{B28}$ |
| 2630. | $L_{A65}$ | $L_{B28}$ |
| 2631. | $L_{A66}$ | $L_{B28}$ |
| 2632. | $L_{A67}$ | $L_{B28}$ |
| 2633. | $L_{A68}$ | $L_{B28}$ |
| 2634. | $L_{A69}$ | $L_{B28}$ |
| 2635. | $L_{A70}$ | $L_{B28}$ |
| 2636. | $L_{A71}$ | $L_{B28}$ |
| 2637. | $L_{A72}$ | $L_{B28}$ |
| 2638. | $L_{A73}$ | $L_{B28}$ |
| 2639. | $L_{A74}$ | $L_{B28}$ |
| 2640. | $L_{A75}$ | $L_{B28}$ |
| 2641. | $L_{A76}$ | $L_{B28}$ |
| 2642. | $L_{A77}$ | $L_{B28}$ |
| 2643. | $L_{A78}$ | $L_{B28}$ |
| 2644. | $L_{A79}$ | $L_{B28}$ |
| 2645. | $L_{A80}$ | $L_{B28}$ |
| 2646. | $L_{A81}$ | $L_{B28}$ |
| 2647. | $L_{A82}$ | $L_{B28}$ |
| 2648. | $L_{A83}$ | $L_{B28}$ |
| 2649. | $L_{A84}$ | $L_{B28}$ |
| 2650. | $L_{A85}$ | $L_{B28}$ |
| 2651. | $L_{A86}$ | $L_{B28}$ |
| 2652. | $L_{A87}$ | $L_{B28}$ |
| 2653. | $L_{A88}$ | $L_{B28}$ |
| 2654. | $L_{A89}$ | $L_{B28}$ |
| 2655. | $L_{A90}$ | $L_{B28}$ |
| 2656. | $L_{A91}$ | $L_{B28}$ |
| 2657. | $L_{A92}$ | $L_{B28}$ |
| 2658. | $L_{A93}$ | $L_{B28}$ |
| 2659. | $L_{A94}$ | $L_{B28}$ |
| 2660. | $L_{A95}$ | $L_{B28}$ |
| 2661. | $L_{A1}$ | $L_{B29}$ |
| 2662. | $L_{A2}$ | $L_{B29}$ |
| 2663. | $L_{A3}$ | $L_{B29}$ |
| 2664. | $L_{A4}$ | $L_{B29}$ |
| 2665. | $L_{A5}$ | $L_{B29}$ |
| 2666. | $L_{A6}$ | $L_{B29}$ |
| 2667. | $L_{A7}$ | $L_{B29}$ |
| 2668. | $L_{A8}$ | $L_{B29}$ |
| 2669. | $L_{A9}$ | $L_{B29}$ |
| 2670. | $L_{A10}$ | $L_{B29}$ |
| 2671. | $L_{A11}$ | $L_{B29}$ |
| 2672. | $L_{A12}$ | $L_{B29}$ |
| 2673. | $L_{A13}$ | $L_{B29}$ |
| 2674. | $L_{A14}$ | $L_{B29}$ |
| 2675. | $L_{A15}$ | $L_{B29}$ |
| 2676. | $L_{A16}$ | $L_{B29}$ |
| 2677. | $L_{A17}$ | $L_{B29}$ |
| 2678. | $L_{A18}$ | $L_{B29}$ |

TABLE 1-continued

| Cpd # | $L_A$ | $L_B$ |
| --- | --- | --- |
| 2679. | $L_{A19}$ | $L_{B29}$ |
| 2680. | $L_{A20}$ | $L_{B29}$ |
| 2681. | $L_{A21}$ | $L_{B29}$ |
| 2682. | $L_{A22}$ | $L_{B29}$ |
| 2683. | $L_{A23}$ | $L_{B29}$ |
| 2684. | $L_{A24}$ | $L_{B29}$ |
| 2685. | $L_{A25}$ | $L_{B29}$ |
| 2686. | $L_{A26}$ | $L_{B29}$ |
| 2687. | $L_{A27}$ | $L_{B29}$ |
| 2688. | $L_{A28}$ | $L_{B29}$ |
| 2689. | $L_{A29}$ | $L_{B29}$ |
| 2690. | $L_{A30}$ | $L_{B29}$ |
| 2691. | $L_{A31}$ | $L_{B29}$ |
| 2692. | $L_{A32}$ | $L_{B29}$ |
| 2693. | $L_{A33}$ | $L_{B29}$ |
| 2694. | $L_{A34}$ | $L_{B29}$ |
| 2695. | $L_{A35}$ | $L_{B29}$ |
| 2696. | $L_{A36}$ | $L_{B29}$ |
| 2697. | $L_{A37}$ | $L_{B29}$ |
| 2698. | $L_{A38}$ | $L_{B29}$ |
| 2699. | $L_{A39}$ | $L_{B29}$ |
| 2700. | $L_{A40}$ | $L_{B29}$ |
| 2701. | $L_{A41}$ | $L_{B29}$ |
| 2702. | $L_{A42}$ | $L_{B29}$ |
| 2703. | $L_{A43}$ | $L_{B29}$ |
| 2704. | $L_{A44}$ | $L_{B29}$ |
| 2705. | $L_{A45}$ | $L_{B29}$ |
| 2706. | $L_{A46}$ | $L_{B29}$ |
| 2707. | $L_{A47}$ | $L_{B29}$ |
| 2708. | $L_{A48}$ | $L_{B29}$ |
| 2709. | $L_{A49}$ | $L_{B29}$ |
| 2710. | $L_{A50}$ | $L_{B29}$ |
| 2711. | $L_{A51}$ | $L_{B29}$ |
| 2712. | $L_{A52}$ | $L_{B29}$ |
| 2713. | $L_{A53}$ | $L_{B29}$ |
| 2714. | $L_{A54}$ | $L_{B29}$ |
| 2715. | $L_{A55}$ | $L_{B29}$ |
| 2716. | $L_{A56}$ | $L_{B29}$ |
| 2717. | $L_{A57}$ | $L_{B29}$ |
| 2718. | $L_{A58}$ | $L_{B29}$ |
| 2719. | $L_{A59}$ | $L_{B29}$ |
| 2720. | $L_{A60}$ | $L_{B29}$ |
| 2721. | $L_{A61}$ | $L_{B29}$ |
| 2722. | $L_{A62}$ | $L_{B29}$ |
| 2723. | $L_{A63}$ | $L_{B29}$ |
| 2724. | $L_{A64}$ | $L_{B29}$ |
| 2725. | $L_{A65}$ | $L_{B29}$ |
| 2726. | $L_{A66}$ | $L_{B29}$ |
| 2727. | $L_{A67}$ | $L_{B29}$ |
| 2728. | $L_{A68}$ | $L_{B29}$ |
| 2729. | $L_{A69}$ | $L_{B29}$ |
| 2730. | $L_{A70}$ | $L_{B29}$ |
| 2731. | $L_{A71}$ | $L_{B29}$ |
| 2732. | $L_{A72}$ | $L_{B29}$ |
| 2733. | $L_{A73}$ | $L_{B29}$ |
| 2734. | $L_{A74}$ | $L_{B29}$ |
| 2735. | $L_{A75}$ | $L_{B29}$ |
| 2736. | $L_{A76}$ | $L_{B29}$ |
| 2737. | $L_{A77}$ | $L_{B29}$ |
| 2738. | $L_{A78}$ | $L_{B29}$ |
| 2739. | $L_{A79}$ | $L_{B29}$ |
| 2740. | $L_{A80}$ | $L_{B29}$ |
| 2741. | $L_{A81}$ | $L_{B29}$ |
| 2742. | $L_{A82}$ | $L_{B29}$ |
| 2743. | $L_{A83}$ | $L_{B29}$ |
| 2744. | $L_{A84}$ | $L_{B29}$ |
| 2745. | $L_{A85}$ | $L_{B29}$ |
| 2746. | $L_{A86}$ | $L_{B29}$ |
| 2747. | $L_{A87}$ | $L_{B29}$ |
| 2748. | $L_{A88}$ | $L_{B29}$ |
| 2749. | $L_{A89}$ | $L_{B29}$ |
| 2750. | $L_{A90}$ | $L_{B29}$ |
| 2751. | $L_{A91}$ | $L_{B29}$ |
| 2752. | $L_{A92}$ | $L_{B29}$ |
| 2753. | $L_{A93}$ | $L_{B29}$ |
| 2754. | $L_{A94}$ | $L_{B29}$ |
| 2755. | $L_{A95}$ | $L_{B29}$ |
| 2756. | $L_{A1}$ | $L_{B30}$ |

TABLE 1-continued

| Cpd # | $L_A$ | $L_B$ |
|---|---|---|
| 2757. | $L_{A2}$ | $L_{B30}$ |
| 2758. | $L_{A3}$ | $L_{B30}$ |
| 2759. | $L_{A4}$ | $L_{B30}$ |
| 2760. | $L_{A5}$ | $L_{B30}$ |
| 2761. | $L_{A6}$ | $L_{B30}$ |
| 2762. | $L_{A7}$ | $L_{B30}$ |
| 2763. | $L_{A8}$ | $L_{B30}$ |
| 2764. | $L_{A9}$ | $L_{B30}$ |
| 2765. | $L_{A10}$ | $L_{B30}$ |
| 2766. | $L_{A11}$ | $L_{B30}$ |
| 2767. | $L_{A12}$ | $L_{B30}$ |
| 2768. | $L_{A13}$ | $L_{B30}$ |
| 2769. | $L_{A14}$ | $L_{B30}$ |
| 2770. | $L_{A15}$ | $L_{B30}$ |
| 2771. | $L_{A16}$ | $L_{B30}$ |
| 2772. | $L_{A17}$ | $L_{B30}$ |
| 2773. | $L_{A18}$ | $L_{B30}$ |
| 2774. | $L_{A19}$ | $L_{B30}$ |
| 2775. | $L_{A20}$ | $L_{B30}$ |
| 2776. | $L_{A21}$ | $L_{B30}$ |
| 2777. | $L_{A22}$ | $L_{B30}$ |
| 2778. | $L_{A23}$ | $L_{B30}$ |
| 2779. | $L_{A24}$ | $L_{B30}$ |
| 2780. | $L_{A25}$ | $L_{B30}$ |
| 2781. | $L_{A26}$ | $L_{B30}$ |
| 2782. | $L_{A27}$ | $L_{B30}$ |
| 2783. | $L_{A28}$ | $L_{B30}$ |
| 2784. | $L_{A29}$ | $L_{B30}$ |
| 2785. | $L_{A30}$ | $L_{B30}$ |
| 2786. | $L_{A31}$ | $L_{B30}$ |
| 2787. | $L_{A32}$ | $L_{B30}$ |
| 2788. | $L_{A33}$ | $L_{B30}$ |
| 2789. | $L_{A34}$ | $L_{B30}$ |
| 2790. | $L_{A35}$ | $L_{B30}$ |
| 2791. | $L_{A36}$ | $L_{B30}$ |
| 2792. | $L_{A37}$ | $L_{B30}$ |
| 2793. | $L_{A38}$ | $L_{B30}$ |
| 2794. | $L_{A39}$ | $L_{B30}$ |
| 2795. | $L_{A40}$ | $L_{B30}$ |
| 2796. | $L_{A41}$ | $L_{B30}$ |
| 2797. | $L_{A42}$ | $L_{B30}$ |
| 2798. | $L_{A43}$ | $L_{B30}$ |
| 2799. | $L_{A44}$ | $L_{B30}$ |
| 2800. | $L_{A45}$ | $L_{B30}$ |
| 2801. | $L_{A46}$ | $L_{B30}$ |
| 2802. | $L_{A47}$ | $L_{B30}$ |
| 2803. | $L_{A48}$ | $L_{B30}$ |
| 2804. | $L_{A49}$ | $L_{B30}$ |
| 2805. | $L_{A50}$ | $L_{B30}$ |
| 2806. | $L_{A51}$ | $L_{B30}$ |
| 2807. | $L_{A52}$ | $L_{B30}$ |
| 2808. | $L_{A53}$ | $L_{B30}$ |
| 2809. | $L_{A54}$ | $L_{B30}$ |
| 2810. | $L_{A55}$ | $L_{B30}$ |
| 2811. | $L_{A56}$ | $L_{B30}$ |
| 2812. | $L_{A57}$ | $L_{B30}$ |
| 2813. | $L_{A58}$ | $L_{B30}$ |
| 2814. | $L_{A59}$ | $L_{B30}$ |
| 2815. | $L_{A60}$ | $L_{B30}$ |
| 2816. | $L_{A61}$ | $L_{B30}$ |
| 2817. | $L_{A62}$ | $L_{B30}$ |
| 2818. | $L_{A63}$ | $L_{B30}$ |
| 2819. | $L_{A64}$ | $L_{B30}$ |
| 2820. | $L_{A65}$ | $L_{B30}$ |
| 2821. | $L_{A66}$ | $L_{B30}$ |
| 2822. | $L_{A67}$ | $L_{B30}$ |
| 2823. | $L_{A68}$ | $L_{B30}$ |
| 2824. | $L_{A69}$ | $L_{B30}$ |
| 2825. | $L_{A70}$ | $L_{B30}$ |
| 2826. | $L_{A71}$ | $L_{B30}$ |
| 2827. | $L_{A72}$ | $L_{B30}$ |
| 2828. | $L_{A73}$ | $L_{B30}$ |
| 2829. | $L_{A74}$ | $L_{B30}$ |
| 2830. | $L_{A75}$ | $L_{B30}$ |
| 2831. | $L_{A76}$ | $L_{B30}$ |
| 2832. | $L_{A77}$ | $L_{B30}$ |
| 2833. | $L_{A78}$ | $L_{B30}$ |
| 2834. | $L_{A79}$ | $L_{B30}$ |

TABLE 1-continued

| Cpd # | $L_A$ | $L_B$ |
|---|---|---|
| 2835. | $L_{A80}$ | $L_{B30}$ |
| 2836. | $L_{A81}$ | $L_{B30}$ |
| 2837. | $L_{A82}$ | $L_{B30}$ |
| 2838. | $L_{A83}$ | $L_{B30}$ |
| 2839. | $L_{A84}$ | $L_{B30}$ |
| 2840. | $L_{A85}$ | $L_{B30}$ |
| 2841. | $L_{A86}$ | $L_{B30}$ |
| 2842. | $L_{A87}$ | $L_{B30}$ |
| 2843. | $L_{A88}$ | $L_{B30}$ |
| 2844. | $L_{A89}$ | $L_{B30}$ |
| 2845. | $L_{A90}$ | $L_{B30}$ |
| 2846. | $L_{A91}$ | $L_{B30}$ |
| 2847. | $L_{A92}$ | $L_{B30}$ |
| 2848. | $L_{A93}$ | $L_{B30}$ |
| 2849. | $L_{A94}$ | $L_{B30}$ |
| 2850. | $L_{A95}$ | $L_{B30}$ |
| 2851. | $L_{A1}$ | $L_{B31}$ |
| 2852. | $L_{A2}$ | $L_{B31}$ |
| 2853. | $L_{A3}$ | $L_{B31}$ |
| 2854. | $L_{A4}$ | $L_{B31}$ |
| 2855. | $L_{A5}$ | $L_{B31}$ |
| 2856. | $L_{A6}$ | $L_{B31}$ |
| 2857. | $L_{A7}$ | $L_{B31}$ |
| 2858. | $L_{A8}$ | $L_{B31}$ |
| 2859. | $L_{A9}$ | $L_{B31}$ |
| 2860. | $L_{A10}$ | $L_{B31}$ |
| 2861. | $L_{A11}$ | $L_{B31}$ |
| 2862. | $L_{A12}$ | $L_{B31}$ |
| 2863. | $L_{A13}$ | $L_{B31}$ |
| 2864. | $L_{A14}$ | $L_{B31}$ |
| 2865. | $L_{A15}$ | $L_{B31}$ |
| 2866. | $L_{A16}$ | $L_{B31}$ |
| 2867. | $L_{A17}$ | $L_{B31}$ |
| 2868. | $L_{A18}$ | $L_{B31}$ |
| 2869. | $L_{A19}$ | $L_{B31}$ |
| 2870. | $L_{A20}$ | $L_{B31}$ |
| 2871. | $L_{A21}$ | $L_{B31}$ |
| 2872. | $L_{A22}$ | $L_{B31}$ |
| 2873. | $L_{A23}$ | $L_{B31}$ |
| 2874. | $L_{A24}$ | $L_{B31}$ |
| 2875. | $L_{A25}$ | $L_{B31}$ |
| 2876. | $L_{A26}$ | $L_{B31}$ |
| 2877. | $L_{A27}$ | $L_{B31}$ |
| 2878. | $L_{A28}$ | $L_{B31}$ |
| 2879. | $L_{A29}$ | $L_{B31}$ |
| 2880. | $L_{A30}$ | $L_{B31}$ |
| 2881. | $L_{A31}$ | $L_{B31}$ |
| 2882. | $L_{A32}$ | $L_{B31}$ |
| 2883. | $L_{A33}$ | $L_{B31}$ |
| 2884. | $L_{A34}$ | $L_{B31}$ |
| 2885. | $L_{A35}$ | $L_{B31}$ |
| 2886. | $L_{A36}$ | $L_{B31}$ |
| 2887. | $L_{A37}$ | $L_{B31}$ |
| 2888. | $L_{A38}$ | $L_{B31}$ |
| 2889. | $L_{A39}$ | $L_{B31}$ |
| 2890. | $L_{A40}$ | $L_{B31}$ |
| 2891. | $L_{A41}$ | $L_{B31}$ |
| 2892. | $L_{A42}$ | $L_{B31}$ |
| 2893. | $L_{A43}$ | $L_{B31}$ |
| 2894. | $L_{A44}$ | $L_{B31}$ |
| 2895. | $L_{A45}$ | $L_{B31}$ |
| 2896. | $L_{A46}$ | $L_{B31}$ |
| 2897. | $L_{A47}$ | $L_{B31}$ |
| 2898. | $L_{A48}$ | $L_{B31}$ |
| 2899. | $L_{A49}$ | $L_{B31}$ |
| 2900. | $L_{A50}$ | $L_{B31}$ |
| 2901. | $L_{A51}$ | $L_{B31}$ |
| 2902. | $L_{A52}$ | $L_{B31}$ |
| 2903. | $L_{A53}$ | $L_{B31}$ |
| 2904. | $L_{A54}$ | $L_{B31}$ |
| 2905. | $L_{A55}$ | $L_{B31}$ |
| 2906. | $L_{A56}$ | $L_{B31}$ |
| 2907. | $L_{A57}$ | $L_{B31}$ |
| 2908. | $L_{A58}$ | $L_{B31}$ |
| 2909. | $L_{A59}$ | $L_{B31}$ |
| 2910. | $L_{A60}$ | $L_{B31}$ |
| 2911. | $L_{A61}$ | $L_{B31}$ |
| 2912. | $L_{A62}$ | $L_{B31}$ |

TABLE 1-continued

| Cpd # | $L_A$ | $L_B$ |
|---|---|---|
| 2913. | $L_{A63}$ | $L_{B31}$ |
| 2914. | $L_{A64}$ | $L_{B31}$ |
| 2915. | $L_{A65}$ | $L_{B31}$ |
| 2916. | $L_{A66}$ | $L_{B31}$ |
| 2917. | $L_{A67}$ | $L_{B31}$ |
| 2918. | $L_{A68}$ | $L_{B31}$ |
| 2919. | $L_{A69}$ | $L_{B31}$ |
| 2920. | $L_{A70}$ | $L_{B31}$ |
| 2921. | $L_{A71}$ | $L_{B31}$ |
| 2922. | $L_{A72}$ | $L_{B31}$ |
| 2923. | $L_{A73}$ | $L_{B31}$ |
| 2924. | $L_{A74}$ | $L_{B31}$ |
| 2925. | $L_{A75}$ | $L_{B31}$ |
| 2926. | $L_{A76}$ | $L_{B31}$ |
| 2927. | $L_{A77}$ | $L_{B31}$ |
| 2928. | $L_{A78}$ | $L_{B31}$ |
| 2929. | $L_{A79}$ | $L_{B31}$ |
| 2930. | $L_{A80}$ | $L_{B31}$ |
| 2931. | $L_{A81}$ | $L_{B31}$ |
| 2932. | $L_{A82}$ | $L_{B31}$ |
| 2933. | $L_{A83}$ | $L_{B31}$ |
| 2934. | $L_{A84}$ | $L_{B31}$ |
| 2935. | $L_{A85}$ | $L_{B31}$ |
| 2936. | $L_{A86}$ | $L_{B31}$ |
| 2937. | $L_{A87}$ | $L_{B31}$ |
| 2938. | $L_{A88}$ | $L_{B31}$ |
| 2939. | $L_{A89}$ | $L_{B31}$ |
| 2940. | $L_{A90}$ | $L_{B31}$ |
| 2941. | $L_{A91}$ | $L_{B31}$ |
| 2942. | $L_{A92}$ | $L_{B31}$ |
| 2943. | $L_{A93}$ | $L_{B31}$ |
| 2944. | $L_{A94}$ | $L_{B31}$ |
| 2945. | $L_{A95}$ | $L_{B31}$ |
| 2946. | $L_{A1}$ | $L_{B32}$ |
| 2947. | $L_{A2}$ | $L_{B32}$ |
| 2948. | $L_{A3}$ | $L_{B32}$ |
| 2949. | $L_{A4}$ | $L_{B32}$ |
| 2950. | $L_{A5}$ | $L_{B32}$ |
| 2951. | $L_{A6}$ | $L_{B32}$ |
| 2952. | $L_{A7}$ | $L_{B32}$ |
| 2953. | $L_{A8}$ | $L_{B32}$ |
| 2954. | $L_{A9}$ | $L_{B32}$ |
| 2955. | $L_{A10}$ | $L_{B32}$ |
| 2956. | $L_{A11}$ | $L_{B32}$ |
| 2957. | $L_{A12}$ | $L_{B32}$ |
| 2958. | $L_{A13}$ | $L_{B32}$ |
| 2959. | $L_{A14}$ | $L_{B32}$ |
| 2960. | $L_{A15}$ | $L_{B32}$ |
| 2961. | $L_{A16}$ | $L_{B32}$ |
| 2962. | $L_{A17}$ | $L_{B32}$ |
| 2963. | $L_{A18}$ | $L_{B32}$ |
| 2964. | $L_{A19}$ | $L_{B32}$ |
| 2965. | $L_{A20}$ | $L_{B32}$ |
| 2966. | $L_{A21}$ | $L_{B32}$ |
| 2967. | $L_{A22}$ | $L_{B32}$ |
| 2968. | $L_{A23}$ | $L_{B32}$ |
| 2969. | $L_{A24}$ | $L_{B32}$ |
| 2970. | $L_{A25}$ | $L_{B32}$ |
| 2971. | $L_{A26}$ | $L_{B32}$ |
| 2972. | $L_{A27}$ | $L_{B32}$ |
| 2973. | $L_{A28}$ | $L_{B32}$ |
| 2974. | $L_{A29}$ | $L_{B32}$ |
| 2975. | $L_{A30}$ | $L_{B32}$ |
| 2976. | $L_{A31}$ | $L_{B32}$ |
| 2977. | $L_{A32}$ | $L_{B32}$ |
| 2978. | $L_{A33}$ | $L_{B32}$ |
| 2979. | $L_{A34}$ | $L_{B32}$ |
| 2980. | $L_{A35}$ | $L_{B32}$ |
| 2981. | $L_{A36}$ | $L_{B32}$ |
| 2982. | $L_{A37}$ | $L_{B32}$ |
| 2983. | $L_{A38}$ | $L_{B32}$ |
| 2984. | $L_{A39}$ | $L_{B32}$ |
| 2985. | $L_{A40}$ | $L_{B32}$ |
| 2986. | $L_{A41}$ | $L_{B32}$ |
| 2987. | $L_{A42}$ | $L_{B32}$ |
| 2988. | $L_{A43}$ | $L_{B32}$ |
| 2989. | $L_{A44}$ | $L_{B32}$ |
| 2990. | $L_{A45}$ | $L_{B32}$ |

TABLE 1-continued

| Cpd # | $L_A$ | $L_B$ |
|---|---|---|
| 2991. | $L_{A46}$ | $L_{B32}$ |
| 2992. | $L_{A47}$ | $L_{B32}$ |
| 2993. | $L_{A48}$ | $L_{B32}$ |
| 2994. | $L_{A49}$ | $L_{B32}$ |
| 2995. | $L_{A50}$ | $L_{B32}$ |
| 2996. | $L_{A51}$ | $L_{B32}$ |
| 2997. | $L_{A52}$ | $L_{B32}$ |
| 2998. | $L_{A53}$ | $L_{B32}$ |
| 2999. | $L_{A54}$ | $L_{B32}$ |
| 3000. | $L_{A55}$ | $L_{B32}$ |
| 3001. | $L_{A56}$ | $L_{B32}$ |
| 3002. | $L_{A57}$ | $L_{B32}$ |
| 3003. | $L_{A58}$ | $L_{B32}$ |
| 3004. | $L_{A59}$ | $L_{B32}$ |
| 3005. | $L_{A60}$ | $L_{B32}$ |
| 3006. | $L_{A61}$ | $L_{B32}$ |
| 3007. | $L_{A62}$ | $L_{B32}$ |
| 3008. | $L_{A63}$ | $L_{B32}$ |
| 3009. | $L_{A64}$ | $L_{B32}$ |
| 3010. | $L_{A65}$ | $L_{B32}$ |
| 3011. | $L_{A66}$ | $L_{B32}$ |
| 3012. | $L_{A67}$ | $L_{B32}$ |
| 3013. | $L_{A68}$ | $L_{B32}$ |
| 3014. | $L_{A69}$ | $L_{B32}$ |
| 3015. | $L_{A70}$ | $L_{B32}$ |
| 3016. | $L_{A71}$ | $L_{B32}$ |
| 3017. | $L_{A72}$ | $L_{B32}$ |
| 3018. | $L_{A73}$ | $L_{B32}$ |
| 3019. | $L_{A74}$ | $L_{B32}$ |
| 3020. | $L_{A75}$ | $L_{B32}$ |
| 3021. | $L_{A76}$ | $L_{B32}$ |
| 3022. | $L_{A77}$ | $L_{B32}$ |
| 3023. | $L_{A78}$ | $L_{B32}$ |
| 3024. | $L_{A79}$ | $L_{B32}$ |
| 3025. | $L_{A80}$ | $L_{B32}$ |
| 3026. | $L_{A81}$ | $L_{B32}$ |
| 3027. | $L_{A82}$ | $L_{B32}$ |
| 3028. | $L_{A83}$ | $L_{B32}$ |
| 3029. | $L_{A84}$ | $L_{B32}$ |
| 3030. | $L_{A85}$ | $L_{B32}$ |
| 3031. | $L_{A86}$ | $L_{B32}$ |
| 3032. | $L_{A87}$ | $L_{B32}$ |
| 3033. | $L_{A88}$ | $L_{B32}$ |
| 3034. | $L_{A89}$ | $L_{B32}$ |
| 3035. | $L_{A90}$ | $L_{B32}$ |
| 3036. | $L_{A91}$ | $L_{B32}$ |
| 3037. | $L_{A92}$ | $L_{B32}$ |
| 3038. | $L_{A93}$ | $L_{B32}$ |
| 3039. | $L_{A94}$ | $L_{B32}$ |
| 3040. | $L_{A95}$ | $L_{B32}$ |
| 3041. | $L_{A1}$ | $L_{B33}$ |
| 3042. | $L_{A2}$ | $L_{B33}$ |
| 3043. | $L_{A3}$ | $L_{B33}$ |
| 3044. | $L_{A4}$ | $L_{B33}$ |
| 3045. | $L_{A5}$ | $L_{B33}$ |
| 3046. | $L_{A6}$ | $L_{B33}$ |
| 3047. | $L_{A7}$ | $L_{B33}$ |
| 3048. | $L_{A8}$ | $L_{B33}$ |
| 3049. | $L_{A9}$ | $L_{B33}$ |
| 3050. | $L_{A10}$ | $L_{B33}$ |
| 3051. | $L_{A11}$ | $L_{B33}$ |
| 3052. | $L_{A12}$ | $L_{B33}$ |
| 3053. | $L_{A13}$ | $L_{B33}$ |
| 3054. | $L_{A14}$ | $L_{B33}$ |
| 3055. | $L_{A15}$ | $L_{B33}$ |
| 3056. | $L_{A16}$ | $L_{B33}$ |
| 3057. | $L_{A17}$ | $L_{B33}$ |
| 3058. | $L_{A18}$ | $L_{B33}$ |
| 3059. | $L_{A19}$ | $L_{B33}$ |
| 3060. | $L_{A20}$ | $L_{B33}$ |
| 3061. | $L_{A21}$ | $L_{B33}$ |
| 3062. | $L_{A22}$ | $L_{B33}$ |
| 3063. | $L_{A23}$ | $L_{B33}$ |
| 3064. | $L_{A24}$ | $L_{B33}$ |
| 3065. | $L_{A25}$ | $L_{B33}$ |
| 3066. | $L_{A26}$ | $L_{B33}$ |
| 3067. | $L_{A27}$ | $L_{B33}$ |
| 3068. | $L_{A28}$ | $L_{B33}$ |

TABLE 1-continued

| Cpd # | $L_A$ | $L_B$ |
|---|---|---|
| 3069. | $L_{A29}$ | $L_{B33}$ |
| 3070. | $L_{A30}$ | $L_{B33}$ |
| 3071. | $L_{A31}$ | $L_{B33}$ |
| 3072. | $L_{A32}$ | $L_{B33}$ |
| 3073. | $L_{A33}$ | $L_{B33}$ |
| 3074. | $L_{A34}$ | $L_{B33}$ |
| 3075. | $L_{A35}$ | $L_{B33}$ |
| 3076. | $L_{A36}$ | $L_{B33}$ |
| 3077. | $L_{A37}$ | $L_{B33}$ |
| 3078. | $L_{A38}$ | $L_{B33}$ |
| 3079. | $L_{A39}$ | $L_{B33}$ |
| 3080. | $L_{A40}$ | $L_{B33}$ |
| 3081. | $L_{A41}$ | $L_{B33}$ |
| 3082. | $L_{A42}$ | $L_{B33}$ |
| 3083. | $L_{A43}$ | $L_{B33}$ |
| 3084. | $L_{A44}$ | $L_{B33}$ |
| 3085. | $L_{A45}$ | $L_{B33}$ |
| 3086. | $L_{A46}$ | $L_{B33}$ |
| 3087. | $L_{A47}$ | $L_{B33}$ |
| 3088. | $L_{A48}$ | $L_{B33}$ |
| 3089. | $L_{A49}$ | $L_{B33}$ |
| 3090. | $L_{A50}$ | $L_{B33}$ |
| 3091. | $L_{A51}$ | $L_{B33}$ |
| 3092. | $L_{A52}$ | $L_{B33}$ |
| 3093. | $L_{A53}$ | $L_{B33}$ |
| 3094. | $L_{A54}$ | $L_{B33}$ |
| 3095. | $L_{A55}$ | $L_{B33}$ |
| 3096. | $L_{A56}$ | $L_{B33}$ |
| 3097. | $L_{A57}$ | $L_{B33}$ |
| 3098. | $L_{A58}$ | $L_{B33}$ |
| 3099. | $L_{A59}$ | $L_{B33}$ |
| 3100. | $L_{A60}$ | $L_{B33}$ |
| 3101. | $L_{A61}$ | $L_{B33}$ |
| 3102. | $L_{A62}$ | $L_{B33}$ |
| 3103. | $L_{A63}$ | $L_{B33}$ |
| 3104. | $L_{A64}$ | $L_{B33}$ |
| 3105. | $L_{A65}$ | $L_{B33}$ |
| 3106. | $L_{A66}$ | $L_{B33}$ |
| 3107. | $L_{A67}$ | $L_{B33}$ |
| 3108. | $L_{A68}$ | $L_{B33}$ |
| 3109. | $L_{A69}$ | $L_{B33}$ |
| 3110. | $L_{A70}$ | $L_{B33}$ |
| 3111. | $L_{A71}$ | $L_{B33}$ |
| 3112. | $L_{A72}$ | $L_{B33}$ |
| 3113. | $L_{A73}$ | $L_{B33}$ |
| 3114. | $L_{A74}$ | $L_{B33}$ |
| 3115. | $L_{A75}$ | $L_{B33}$ |
| 3116. | $L_{A76}$ | $L_{B33}$ |
| 3117. | $L_{A77}$ | $L_{B33}$ |
| 3118. | $L_{A78}$ | $L_{B33}$ |
| 3119. | $L_{A79}$ | $L_{B33}$ |
| 3120. | $L_{A80}$ | $L_{B33}$ |
| 3121. | $L_{A81}$ | $L_{B33}$ |
| 3122. | $L_{A82}$ | $L_{B33}$ |
| 3123. | $L_{A83}$ | $L_{B33}$ |
| 3124. | $L_{A84}$ | $L_{B33}$ |
| 3125. | $L_{A85}$ | $L_{B33}$ |
| 3126. | $L_{A86}$ | $L_{B33}$ |
| 3127. | $L_{A87}$ | $L_{B33}$ |
| 3128. | $L_{A88}$ | $L_{B33}$ |
| 3129. | $L_{A89}$ | $L_{B33}$ |
| 3130. | $L_{A90}$ | $L_{B33}$ |
| 3131. | $L_{A91}$ | $L_{B33}$ |
| 3132. | $L_{A92}$ | $L_{B33}$ |
| 3133. | $L_{A93}$ | $L_{B33}$ |
| 3134. | $L_{A94}$ | $L_{B33}$ |
| 3135. | $L_{A95}$ | $L_{B33}$ |
| 3136. | $L_{A1}$ | $L_{B34}$ |
| 3137. | $L_{A2}$ | $L_{B34}$ |
| 3138. | $L_{A3}$ | $L_{B34}$ |
| 3139. | $L_{A4}$ | $L_{B34}$ |
| 3140. | $L_{A5}$ | $L_{B34}$ |
| 3141. | $L_{A6}$ | $L_{B34}$ |
| 3142. | $L_{A7}$ | $L_{B34}$ |
| 3143. | $L_{A8}$ | $L_{B34}$ |
| 3144. | $L_{A9}$ | $L_{B34}$ |
| 3145. | $L_{A10}$ | $L_{B34}$ |
| 3146. | $L_{A11}$ | $L_{B34}$ |

TABLE 1-continued

| Cpd # | $L_A$ | $L_B$ |
|---|---|---|
| 3147. | $L_{A12}$ | $L_{B34}$ |
| 3148. | $L_{A13}$ | $L_{B34}$ |
| 3149. | $L_{A14}$ | $L_{B34}$ |
| 3150. | $L_{A15}$ | $L_{B34}$ |
| 3151. | $L_{A16}$ | $L_{B34}$ |
| 3152. | $L_{A17}$ | $L_{B34}$ |
| 3153. | $L_{A18}$ | $L_{B34}$ |
| 3154. | $L_{A19}$ | $L_{B34}$ |
| 3155. | $L_{A20}$ | $L_{B34}$ |
| 3156. | $L_{A21}$ | $L_{B34}$ |
| 3157. | $L_{A22}$ | $L_{B34}$ |
| 3158. | $L_{A23}$ | $L_{B34}$ |
| 3159. | $L_{A24}$ | $L_{B34}$ |
| 3160. | $L_{A25}$ | $L_{B34}$ |
| 3161. | $L_{A26}$ | $L_{B34}$ |
| 3162. | $L_{A27}$ | $L_{B34}$ |
| 3163. | $L_{A28}$ | $L_{B34}$ |
| 3164. | $L_{A29}$ | $L_{B34}$ |
| 3165. | $L_{A30}$ | $L_{B34}$ |
| 3166. | $L_{A31}$ | $L_{B34}$ |
| 3167. | $L_{A32}$ | $L_{B34}$ |
| 3168. | $L_{A33}$ | $L_{B34}$ |
| 3169. | $L_{A34}$ | $L_{B34}$ |
| 3170. | $L_{A35}$ | $L_{B34}$ |
| 3171. | $L_{A36}$ | $L_{B34}$ |
| 3172. | $L_{A37}$ | $L_{B34}$ |
| 3173. | $L_{A38}$ | $L_{B34}$ |
| 3174. | $L_{A39}$ | $L_{B34}$ |
| 3175. | $L_{A40}$ | $L_{B34}$ |
| 3176. | $L_{A41}$ | $L_{B34}$ |
| 3177. | $L_{A42}$ | $L_{B34}$ |
| 3178. | $L_{A43}$ | $L_{B34}$ |
| 3179. | $L_{A44}$ | $L_{B34}$ |
| 3180. | $L_{A45}$ | $L_{B34}$ |
| 3181. | $L_{A46}$ | $L_{B34}$ |
| 3182. | $L_{A47}$ | $L_{B34}$ |
| 3183. | $L_{A48}$ | $L_{B34}$ |
| 3184. | $L_{A49}$ | $L_{B34}$ |
| 3185. | $L_{A50}$ | $L_{B34}$ |
| 3186. | $L_{A51}$ | $L_{B34}$ |
| 3187. | $L_{A52}$ | $L_{B34}$ |
| 3188. | $L_{A53}$ | $L_{B34}$ |
| 3189. | $L_{A54}$ | $L_{B34}$ |
| 3190. | $L_{A55}$ | $L_{B34}$ |
| 3191. | $L_{A56}$ | $L_{B34}$ |
| 3192. | $L_{A57}$ | $L_{B34}$ |
| 3193. | $L_{A58}$ | $L_{B34}$ |
| 3194. | $L_{A59}$ | $L_{B34}$ |
| 3195. | $L_{A60}$ | $L_{B34}$ |
| 3196. | $L_{A61}$ | $L_{B34}$ |
| 3197. | $L_{A62}$ | $L_{B34}$ |
| 3198. | $L_{A63}$ | $L_{B34}$ |
| 3199. | $L_{A64}$ | $L_{B34}$ |
| 3200. | $L_{A65}$ | $L_{B34}$ |
| 3201. | $L_{A66}$ | $L_{B34}$ |
| 3202. | $L_{A67}$ | $L_{B34}$ |
| 3203. | $L_{A68}$ | $L_{B34}$ |
| 3204. | $L_{A69}$ | $L_{B34}$ |
| 3205. | $L_{A70}$ | $L_{B34}$ |
| 3206. | $L_{A71}$ | $L_{B34}$ |
| 3207. | $L_{A72}$ | $L_{B34}$ |
| 3208. | $L_{A73}$ | $L_{B34}$ |
| 3209. | $L_{A74}$ | $L_{B34}$ |
| 3210. | $L_{A75}$ | $L_{B34}$ |
| 3211. | $L_{A76}$ | $L_{B34}$ |
| 3212. | $L_{A77}$ | $L_{B34}$ |
| 3213. | $L_{A78}$ | $L_{B34}$ |
| 3214. | $L_{A79}$ | $L_{B34}$ |
| 3215. | $L_{A80}$ | $L_{B34}$ |
| 3216. | $L_{A81}$ | $L_{B34}$ |
| 3217. | $L_{A82}$ | $L_{B34}$ |
| 3218. | $L_{A83}$ | $L_{B34}$ |
| 3219. | $L_{A84}$ | $L_{B34}$ |
| 3220. | $L_{A85}$ | $L_{B34}$ |
| 3221. | $L_{A86}$ | $L_{B34}$ |
| 3222. | $L_{A87}$ | $L_{B34}$ |
| 3223. | $L_{A88}$ | $L_{B34}$ |
| 3224. | $L_{A89}$ | $L_{B34}$ |

TABLE 1-continued

| Cpd # | $L_A$ | $L_B$ |
|---|---|---|
| 3225. | $L_{A90}$ | $L_{B34}$ |
| 3226. | $L_{A91}$ | $L_{B34}$ |
| 3227. | $L_{A92}$ | $L_{B34}$ |
| 3228. | $L_{A93}$ | $L_{B34}$ |
| 3229. | $L_{A94}$ | $L_{B34}$ |
| 3230. | $L_{A95}$ | $L_{B34}$ |
| 3231. | $L_{A1}$ | $L_{B35}$ |
| 3232. | $L_{A2}$ | $L_{B35}$ |
| 3233. | $L_{A3}$ | $L_{B35}$ |
| 3234. | $L_{A4}$ | $L_{B35}$ |
| 3235. | $L_{A5}$ | $L_{B35}$ |
| 3236. | $L_{A6}$ | $L_{B35}$ |
| 3237. | $L_{A7}$ | $L_{B35}$ |
| 3238. | $L_{A8}$ | $L_{B35}$ |
| 3239. | $L_{A9}$ | $L_{B35}$ |
| 3240. | $L_{A10}$ | $L_{B35}$ |
| 3241. | $L_{A11}$ | $L_{B35}$ |
| 3242. | $L_{A12}$ | $L_{B35}$ |
| 3243. | $L_{A13}$ | $L_{B35}$ |
| 3244. | $L_{A14}$ | $L_{B35}$ |
| 3245. | $L_{A15}$ | $L_{B35}$ |
| 3246. | $L_{A16}$ | $L_{B35}$ |
| 3247. | $L_{A17}$ | $L_{B35}$ |
| 3248. | $L_{A18}$ | $L_{B35}$ |
| 3249. | $L_{A19}$ | $L_{B35}$ |
| 3250. | $L_{A20}$ | $L_{B35}$ |
| 3251. | $L_{A21}$ | $L_{B35}$ |
| 3252. | $L_{A22}$ | $L_{B35}$ |
| 3253. | $L_{A23}$ | $L_{B35}$ |
| 3254. | $L_{A24}$ | $L_{B35}$ |
| 3255. | $L_{A25}$ | $L_{B35}$ |
| 3256. | $L_{A26}$ | $L_{B35}$ |
| 3257. | $L_{A27}$ | $L_{B35}$ |
| 3258. | $L_{A28}$ | $L_{B35}$ |
| 3259. | $L_{A29}$ | $L_{B35}$ |
| 3260. | $L_{A30}$ | $L_{B35}$ |
| 3261. | $L_{A31}$ | $L_{B35}$ |
| 3262. | $L_{A32}$ | $L_{B35}$ |
| 3263. | $L_{A33}$ | $L_{B35}$ |
| 3264. | $L_{A34}$ | $L_{B35}$ |
| 3265. | $L_{A35}$ | $L_{B35}$ |
| 3266. | $L_{A36}$ | $L_{B35}$ |
| 3267. | $L_{A37}$ | $L_{B35}$ |
| 3268. | $L_{A38}$ | $L_{B35}$ |
| 3269. | $L_{A39}$ | $L_{B35}$ |
| 3270. | $L_{A40}$ | $L_{B35}$ |
| 3271. | $L_{A41}$ | $L_{B35}$ |
| 3272. | $L_{A42}$ | $L_{B35}$ |
| 3273. | $L_{A43}$ | $L_{B35}$ |
| 3274. | $L_{A44}$ | $L_{B35}$ |
| 3275. | $L_{A45}$ | $L_{B35}$ |
| 3276. | $L_{A46}$ | $L_{B35}$ |
| 3277. | $L_{A47}$ | $L_{B35}$ |
| 3278. | $L_{A48}$ | $L_{B35}$ |
| 3279. | $L_{A49}$ | $L_{B35}$ |
| 3280. | $L_{A50}$ | $L_{B35}$ |
| 3281. | $L_{A51}$ | $L_{B35}$ |
| 3282. | $L_{A52}$ | $L_{B35}$ |
| 3283. | $L_{A53}$ | $L_{B35}$ |
| 3284. | $L_{A54}$ | $L_{B35}$ |
| 3285. | $L_{A55}$ | $L_{B35}$ |
| 3286. | $L_{A56}$ | $L_{B35}$ |
| 3287. | $L_{A57}$ | $L_{B35}$ |
| 3288. | $L_{A58}$ | $L_{B35}$ |
| 3289. | $L_{A59}$ | $L_{B35}$ |
| 3290. | $L_{A60}$ | $L_{B35}$ |
| 3291. | $L_{A61}$ | $L_{B35}$ |
| 3292. | $L_{A62}$ | $L_{B35}$ |
| 3293. | $L_{A63}$ | $L_{B35}$ |
| 3294. | $L_{A64}$ | $L_{B35}$ |
| 3295. | $L_{A65}$ | $L_{B35}$ |
| 3296. | $L_{A66}$ | $L_{B35}$ |
| 3297. | $L_{A67}$ | $L_{B35}$ |
| 3298. | $L_{A68}$ | $L_{B35}$ |
| 3299. | $L_{A69}$ | $L_{B35}$ |
| 3300. | $L_{A70}$ | $L_{B35}$ |
| 3301. | $L_{A71}$ | $L_{B35}$ |
| 3302. | $L_{A72}$ | $L_{B35}$ |

TABLE 1-continued

| Cpd # | $L_A$ | $L_B$ |
|---|---|---|
| 3303. | $L_{A73}$ | $L_{B35}$ |
| 3304. | $L_{A74}$ | $L_{B35}$ |
| 3305. | $L_{A75}$ | $L_{B35}$ |
| 3306. | $L_{A76}$ | $L_{B35}$ |
| 3307. | $L_{A77}$ | $L_{B35}$ |
| 3308. | $L_{A78}$ | $L_{B35}$ |
| 3309. | $L_{A79}$ | $L_{B35}$ |
| 3310. | $L_{A80}$ | $L_{B35}$ |
| 3311. | $L_{A81}$ | $L_{B35}$ |
| 3312. | $L_{A82}$ | $L_{B35}$ |
| 3313. | $L_{A83}$ | $L_{B35}$ |
| 3314. | $L_{A84}$ | $L_{B35}$ |
| 3315. | $L_{A85}$ | $L_{B35}$ |
| 3316. | $L_{A86}$ | $L_{B35}$ |
| 3317. | $L_{A87}$ | $L_{B35}$ |
| 3318. | $L_{A88}$ | $L_{B35}$ |
| 3319. | $L_{A89}$ | $L_{B35}$ |
| 3320. | $L_{A90}$ | $L_{B35}$ |
| 3321. | $L_{A91}$ | $L_{B35}$ |
| 3322. | $L_{A92}$ | $L_{B35}$ |
| 3323. | $L_{A93}$ | $L_{B35}$ |
| 3324. | $L_{A94}$ | $L_{B35}$ |
| 3325. | $L_{A95}$ | $L_{B35}$ |
| 3326. | $L_{A1}$ | $L_{B36}$ |
| 3327. | $L_{A2}$ | $L_{B36}$ |
| 3328. | $L_{A3}$ | $L_{B36}$ |
| 3329. | $L_{A4}$ | $L_{B36}$ |
| 3330. | $L_{A5}$ | $L_{B36}$ |
| 3331. | $L_{A6}$ | $L_{B36}$ |
| 3332. | $L_{A7}$ | $L_{B36}$ |
| 3333. | $L_{A8}$ | $L_{B36}$ |
| 3334. | $L_{A9}$ | $L_{B36}$ |
| 3335. | $L_{A10}$ | $L_{B36}$ |
| 3336. | $L_{A11}$ | $L_{B36}$ |
| 3337. | $L_{A12}$ | $L_{B36}$ |
| 3338. | $L_{A13}$ | $L_{B36}$ |
| 3339. | $L_{A14}$ | $L_{B36}$ |
| 3340. | $L_{A15}$ | $L_{B36}$ |
| 3341. | $L_{A16}$ | $L_{B36}$ |
| 3342. | $L_{A17}$ | $L_{B36}$ |
| 3343. | $L_{A18}$ | $L_{B36}$ |
| 3344. | $L_{A19}$ | $L_{B36}$ |
| 3345. | $L_{A20}$ | $L_{B36}$ |
| 3346. | $L_{A21}$ | $L_{B36}$ |
| 3347. | $L_{A22}$ | $L_{B36}$ |
| 3348. | $L_{A23}$ | $L_{B36}$ |
| 3349. | $L_{A24}$ | $L_{B36}$ |
| 3350. | $L_{A25}$ | $L_{B36}$ |
| 3351. | $L_{A26}$ | $L_{B36}$ |
| 3352. | $L_{A27}$ | $L_{B36}$ |
| 3353. | $L_{A28}$ | $L_{B36}$ |
| 3354. | $L_{A29}$ | $L_{B36}$ |
| 3355. | $L_{A30}$ | $L_{B36}$ |
| 3356. | $L_{A31}$ | $L_{B36}$ |
| 3357. | $L_{A32}$ | $L_{B36}$ |
| 3358. | $L_{A33}$ | $L_{B36}$ |
| 3359. | $L_{A34}$ | $L_{B36}$ |
| 3360. | $L_{A35}$ | $L_{B36}$ |
| 3361. | $L_{A36}$ | $L_{B36}$ |
| 3362. | $L_{A37}$ | $L_{B36}$ |
| 3363. | $L_{A38}$ | $L_{B36}$ |
| 3364. | $L_{A39}$ | $L_{B36}$ |
| 3365. | $L_{A40}$ | $L_{B36}$ |
| 3366. | $L_{A41}$ | $L_{B36}$ |
| 3367. | $L_{A42}$ | $L_{B36}$ |
| 3368. | $L_{A43}$ | $L_{B36}$ |
| 3369. | $L_{A44}$ | $L_{B36}$ |
| 3370. | $L_{A45}$ | $L_{B36}$ |
| 3371. | $L_{A46}$ | $L_{B36}$ |
| 3372. | $L_{A47}$ | $L_{B36}$ |
| 3373. | $L_{A48}$ | $L_{B36}$ |
| 3374. | $L_{A49}$ | $L_{B36}$ |
| 3375. | $L_{A50}$ | $L_{B36}$ |
| 3376. | $L_{A51}$ | $L_{B36}$ |
| 3377. | $L_{A52}$ | $L_{B36}$ |
| 3378. | $L_{A53}$ | $L_{B36}$ |
| 3379. | $L_{A54}$ | $L_{B36}$ |
| 3380. | $L_{A55}$ | $L_{B36}$ |

TABLE 1-continued

| Cpd # | $L_A$ | $L_B$ |
|---|---|---|
| 3381. | $L_{A56}$ | $L_{B36}$ |
| 3382. | $L_{A57}$ | $L_{B36}$ |
| 3383. | $L_{A58}$ | $L_{B36}$ |
| 3384. | $L_{A59}$ | $L_{B36}$ |
| 3385. | $L_{A60}$ | $L_{B36}$ |
| 3386. | $L_{A61}$ | $L_{B36}$ |
| 3387. | $L_{A62}$ | $L_{B36}$ |
| 3388. | $L_{A63}$ | $L_{B36}$ |
| 3389. | $L_{A64}$ | $L_{B36}$ |
| 3390. | $L_{A65}$ | $L_{B36}$ |
| 3391. | $L_{A66}$ | $L_{B36}$ |
| 3392. | $L_{A67}$ | $L_{B36}$ |
| 3393. | $L_{A68}$ | $L_{B36}$ |
| 3394. | $L_{A69}$ | $L_{B36}$ |
| 3395. | $L_{A70}$ | $L_{B36}$ |
| 3396. | $L_{A71}$ | $L_{B36}$ |
| 3397. | $L_{A72}$ | $L_{B36}$ |
| 3398. | $L_{A73}$ | $L_{B36}$ |
| 3399. | $L_{A74}$ | $L_{B36}$ |
| 3400. | $L_{A75}$ | $L_{B36}$ |
| 3401. | $L_{A76}$ | $L_{B36}$ |
| 3402. | $L_{A77}$ | $L_{B36}$ |
| 3403. | $L_{A78}$ | $L_{B36}$ |
| 3404. | $L_{A79}$ | $L_{B36}$ |
| 3405. | $L_{A80}$ | $L_{B36}$ |
| 3406. | $L_{A81}$ | $L_{B36}$ |
| 3407. | $L_{A82}$ | $L_{B36}$ |
| 3408. | $L_{A83}$ | $L_{B36}$ |
| 3409. | $L_{A84}$ | $L_{B36}$ |
| 3410. | $L_{A85}$ | $L_{B36}$ |
| 3411. | $L_{A86}$ | $L_{B36}$ |
| 3412. | $L_{A87}$ | $L_{B36}$ |
| 3413. | $L_{A88}$ | $L_{B36}$ |
| 3414. | $L_{A89}$ | $L_{B36}$ |
| 3415. | $L_{A90}$ | $L_{B36}$ |
| 3416. | $L_{A91}$ | $L_{B36}$ |
| 3417. | $L_{A92}$ | $L_{B36}$ |
| 3418. | $L_{A93}$ | $L_{B36}$ |
| 3419. | $L_{A94}$ | $L_{B36}$ |
| 3420. | $L_{A95}$ | $L_{B36}$ |
| 3421. | $L_{A1}$ | $L_{B37}$ |
| 3422. | $L_{A2}$ | $L_{B37}$ |
| 3423. | $L_{A3}$ | $L_{B37}$ |
| 3424. | $L_{A4}$ | $L_{B37}$ |
| 3425. | $L_{A5}$ | $L_{B37}$ |
| 3426. | $L_{A6}$ | $L_{B37}$ |
| 3427. | $L_{A7}$ | $L_{B37}$ |
| 3428. | $L_{A8}$ | $L_{B37}$ |
| 3429. | $L_{A9}$ | $L_{B37}$ |
| 3430. | $L_{A10}$ | $L_{B37}$ |
| 3431. | $L_{A11}$ | $L_{B37}$ |
| 3432. | $L_{A12}$ | $L_{B37}$ |
| 3433. | $L_{A13}$ | $L_{B37}$ |
| 3434. | $L_{A14}$ | $L_{B37}$ |
| 3435. | $L_{A15}$ | $L_{B37}$ |
| 3436. | $L_{A16}$ | $L_{B37}$ |
| 3437. | $L_{A17}$ | $L_{B37}$ |
| 3438. | $L_{A18}$ | $L_{B37}$ |
| 3439. | $L_{A19}$ | $L_{B37}$ |
| 3440. | $L_{A20}$ | $L_{B37}$ |
| 3441. | $L_{A21}$ | $L_{B37}$ |
| 3442. | $L_{A22}$ | $L_{B37}$ |
| 3443. | $L_{A23}$ | $L_{B37}$ |
| 3444. | $L_{A24}$ | $L_{B37}$ |
| 3445. | $L_{A25}$ | $L_{B37}$ |
| 3446. | $L_{A26}$ | $L_{B37}$ |
| 3447. | $L_{A27}$ | $L_{B37}$ |
| 3448. | $L_{A28}$ | $L_{B37}$ |
| 3449. | $L_{A29}$ | $L_{B37}$ |
| 3450. | $L_{A30}$ | $L_{B37}$ |
| 3451. | $L_{A31}$ | $L_{B37}$ |
| 3452. | $L_{A32}$ | $L_{B37}$ |
| 3453. | $L_{A33}$ | $L_{B37}$ |
| 3454. | $L_{A34}$ | $L_{B37}$ |
| 3455. | $L_{A35}$ | $L_{B37}$ |
| 3456. | $L_{A36}$ | $L_{B37}$ |
| 3457. | $L_{A37}$ | $L_{B37}$ |
| 3458. | $L_{A38}$ | $L_{B37}$ |

TABLE 1-continued

| Cpd # | $L_A$ | $L_B$ |
|---|---|---|
| 3459. | $L_{A39}$ | $L_{B37}$ |
| 3460. | $L_{A40}$ | $L_{B37}$ |
| 3461. | $L_{A41}$ | $L_{B37}$ |
| 3462. | $L_{A42}$ | $L_{B37}$ |
| 3463. | $L_{A43}$ | $L_{B37}$ |
| 3464. | $L_{A44}$ | $L_{B37}$ |
| 3465. | $L_{A45}$ | $L_{B37}$ |
| 3466. | $L_{A46}$ | $L_{B37}$ |
| 3467. | $L_{A47}$ | $L_{B37}$ |
| 3468. | $L_{A48}$ | $L_{B37}$ |
| 3469. | $L_{A49}$ | $L_{B37}$ |
| 3470. | $L_{A50}$ | $L_{B37}$ |
| 3471. | $L_{A51}$ | $L_{B37}$ |
| 3472. | $L_{A52}$ | $L_{B37}$ |
| 3473. | $L_{A53}$ | $L_{B37}$ |
| 3474. | $L_{A54}$ | $L_{B37}$ |
| 3475. | $L_{A55}$ | $L_{B37}$ |
| 3476. | $L_{A56}$ | $L_{B37}$ |
| 3477. | $L_{A57}$ | $L_{B37}$ |
| 3478. | $L_{A58}$ | $L_{B37}$ |
| 3479. | $L_{A59}$ | $L_{B37}$ |
| 3480. | $L_{A60}$ | $L_{B37}$ |
| 3481. | $L_{A61}$ | $L_{B37}$ |
| 3482. | $L_{A62}$ | $L_{B37}$ |
| 3483. | $L_{A63}$ | $L_{B37}$ |
| 3484. | $L_{A64}$ | $L_{B37}$ |
| 3485. | $L_{A65}$ | $L_{B37}$ |
| 3486. | $L_{A66}$ | $L_{B37}$ |
| 3487. | $L_{A67}$ | $L_{B37}$ |
| 3488. | $L_{A68}$ | $L_{B37}$ |
| 3489. | $L_{A69}$ | $L_{B37}$ |
| 3490. | $L_{A70}$ | $L_{B37}$ |
| 3491. | $L_{A71}$ | $L_{B37}$ |
| 3492. | $L_{A72}$ | $L_{B37}$ |
| 3493. | $L_{A73}$ | $L_{B37}$ |
| 3494. | $L_{A74}$ | $L_{B37}$ |
| 3495. | $L_{A75}$ | $L_{B37}$ |
| 3496. | $L_{A76}$ | $L_{B37}$ |
| 3497. | $L_{A77}$ | $L_{B37}$ |
| 3498. | $L_{A78}$ | $L_{B37}$ |
| 3499. | $L_{A79}$ | $L_{B37}$ |
| 3500. | $L_{A80}$ | $L_{B37}$ |
| 3501. | $L_{A81}$ | $L_{B37}$ |
| 3502. | $L_{A82}$ | $L_{B37}$ |
| 3503. | $L_{A83}$ | $L_{B37}$ |
| 3504. | $L_{A84}$ | $L_{B37}$ |
| 3505. | $L_{A85}$ | $L_{B37}$ |
| 3506. | $L_{A86}$ | $L_{B37}$ |
| 3507. | $L_{A87}$ | $L_{B37}$ |
| 3508. | $L_{A88}$ | $L_{B37}$ |
| 3509. | $L_{A89}$ | $L_{B37}$ |
| 3510. | $L_{A90}$ | $L_{B37}$ |
| 3511. | $L_{A91}$ | $L_{B37}$ |
| 3512. | $L_{A92}$ | $L_{B37}$ |
| 3513. | $L_{A93}$ | $L_{B37}$ |
| 3514. | $L_{A94}$ | $L_{B37}$ |
| 3515. | $L_{A95}$ | $L_{B37}$ |
| 3516. | $L_{A1}$ | $L_{B38}$ |
| 3517. | $L_{A2}$ | $L_{B38}$ |
| 3518. | $L_{A3}$ | $L_{B38}$ |
| 3519. | $L_{A4}$ | $L_{B38}$ |
| 3520. | $L_{A5}$ | $L_{B38}$ |
| 3521. | $L_{A6}$ | $L_{B38}$ |
| 3522. | $L_{A7}$ | $L_{B38}$ |
| 3523. | $L_{A8}$ | $L_{B38}$ |
| 3524. | $L_{A9}$ | $L_{B38}$ |
| 3525. | $L_{A10}$ | $L_{B38}$ |
| 3526. | $L_{A11}$ | $L_{B38}$ |
| 3527. | $L_{A12}$ | $L_{B38}$ |
| 3528. | $L_{A13}$ | $L_{B38}$ |
| 3529. | $L_{A14}$ | $L_{B38}$ |
| 3530. | $L_{A15}$ | $L_{B38}$ |
| 3531. | $L_{A16}$ | $L_{B38}$ |
| 3532. | $L_{A17}$ | $L_{B38}$ |
| 3533. | $L_{A18}$ | $L_{B38}$ |
| 3534. | $L_{A19}$ | $L_{B38}$ |
| 3535. | $L_{A20}$ | $L_{B38}$ |
| 3536. | $L_{A21}$ | $L_{B38}$ |

TABLE 1-continued

| Cpd # | $L_A$ | $L_B$ |
|---|---|---|
| 3537. | $L_{A22}$ | $L_{B38}$ |
| 3538. | $L_{A23}$ | $L_{B38}$ |
| 3539. | $L_{A24}$ | $L_{B38}$ |
| 3540. | $L_{A25}$ | $L_{B38}$ |
| 3541. | $L_{A26}$ | $L_{B38}$ |
| 3542. | $L_{A27}$ | $L_{B38}$ |
| 3543. | $L_{A28}$ | $L_{B38}$ |
| 3544. | $L_{A29}$ | $L_{B38}$ |
| 3545. | $L_{A30}$ | $L_{B38}$ |
| 3546. | $L_{A31}$ | $L_{B38}$ |
| 3547. | $L_{A32}$ | $L_{B38}$ |
| 3548. | $L_{A33}$ | $L_{B38}$ |
| 3549. | $L_{A34}$ | $L_{B38}$ |
| 3550. | $L_{A35}$ | $L_{B38}$ |
| 3551. | $L_{A36}$ | $L_{B38}$ |
| 3552. | $L_{A37}$ | $L_{B38}$ |
| 3553. | $L_{A38}$ | $L_{B38}$ |
| 3554. | $L_{A39}$ | $L_{B38}$ |
| 3555. | $L_{A40}$ | $L_{B38}$ |
| 3556. | $L_{A41}$ | $L_{B38}$ |
| 3557. | $L_{A42}$ | $L_{B38}$ |
| 3558. | $L_{A43}$ | $L_{B38}$ |
| 3559. | $L_{A44}$ | $L_{B38}$ |
| 3560. | $L_{A45}$ | $L_{B38}$ |
| 3561. | $L_{A46}$ | $L_{B38}$ |
| 3562. | $L_{A47}$ | $L_{B38}$ |
| 3563. | $L_{A48}$ | $L_{B38}$ |
| 3564. | $L_{A49}$ | $L_{B38}$ |
| 3565. | $L_{A50}$ | $L_{B38}$ |
| 3566. | $L_{A51}$ | $L_{B38}$ |
| 3567. | $L_{A52}$ | $L_{B38}$ |
| 3568. | $L_{A53}$ | $L_{B38}$ |
| 3569. | $L_{A54}$ | $L_{B38}$ |
| 3570. | $L_{A55}$ | $L_{B38}$ |
| 3571. | $L_{A56}$ | $L_{B38}$ |
| 3572. | $L_{A57}$ | $L_{B38}$ |
| 3573. | $L_{A58}$ | $L_{B38}$ |
| 3574. | $L_{A59}$ | $L_{B38}$ |
| 3575. | $L_{A60}$ | $L_{B38}$ |
| 3576. | $L_{A61}$ | $L_{B38}$ |
| 3577. | $L_{A62}$ | $L_{B38}$ |
| 3578. | $L_{A63}$ | $L_{B38}$ |
| 3579. | $L_{A64}$ | $L_{B38}$ |
| 3580. | $L_{A65}$ | $L_{B38}$ |
| 3581. | $L_{A66}$ | $L_{B38}$ |
| 3582. | $L_{A67}$ | $L_{B38}$ |
| 3583. | $L_{A68}$ | $L_{B38}$ |
| 3584. | $L_{A69}$ | $L_{B38}$ |
| 3585. | $L_{A70}$ | $L_{B38}$ |
| 3586. | $L_{A71}$ | $L_{B38}$ |
| 3587. | $L_{A72}$ | $L_{B38}$ |
| 3588. | $L_{A73}$ | $L_{B38}$ |
| 3589. | $L_{A74}$ | $L_{B38}$ |
| 3590. | $L_{A75}$ | $L_{B38}$ |
| 3591. | $L_{A76}$ | $L_{B38}$ |
| 3592. | $L_{A77}$ | $L_{B38}$ |
| 3593. | $L_{A78}$ | $L_{B38}$ |
| 3594. | $L_{A79}$ | $L_{B38}$ |
| 3595. | $L_{A80}$ | $L_{B38}$ |
| 3596. | $L_{A81}$ | $L_{B38}$ |
| 3597. | $L_{A82}$ | $L_{B38}$ |
| 3598. | $L_{A83}$ | $L_{B38}$ |
| 3599. | $L_{A84}$ | $L_{B38}$ |
| 3600. | $L_{A85}$ | $L_{B38}$ |
| 3601. | $L_{A86}$ | $L_{B38}$ |
| 3602. | $L_{A87}$ | $L_{B38}$ |
| 3603. | $L_{A88}$ | $L_{B38}$ |
| 3604. | $L_{A89}$ | $L_{B38}$ |
| 3605. | $L_{A90}$ | $L_{B38}$ |
| 3606. | $L_{A91}$ | $L_{B38}$ |
| 3607. | $L_{A92}$ | $L_{B38}$ |
| 3608. | $L_{A93}$ | $L_{B38}$ |
| 3609. | $L_{A94}$ | $L_{B38}$ |
| 3610. | $L_{A95}$ | $L_{B38}$ |
| 3611. | $L_{A1}$ | $L_{B39}$ |
| 3612. | $L_{A2}$ | $L_{B39}$ |
| 3613. | $L_{A3}$ | $L_{B39}$ |
| 3614. | $L_{A4}$ | $L_{B39}$ |

TABLE 1-continued

| Cpd # | $L_A$ | $L_B$ |
|---|---|---|
| 3615. | $L_{A5}$ | $L_{B39}$ |
| 3616. | $L_{A6}$ | $L_{B39}$ |
| 3617. | $L_{A7}$ | $L_{B39}$ |
| 3618. | $L_{A8}$ | $L_{B39}$ |
| 3619. | $L_{A9}$ | $L_{B39}$ |
| 3620. | $L_{A10}$ | $L_{B39}$ |
| 3621. | $L_{A11}$ | $L_{B39}$ |
| 3622. | $L_{A12}$ | $L_{B39}$ |
| 3623. | $L_{A13}$ | $L_{B39}$ |
| 3624. | $L_{A14}$ | $L_{B39}$ |
| 3625. | $L_{A15}$ | $L_{B39}$ |
| 3626. | $L_{A16}$ | $L_{B39}$ |
| 3627. | $L_{A17}$ | $L_{B39}$ |
| 3628. | $L_{A18}$ | $L_{B39}$ |
| 3629. | $L_{A19}$ | $L_{B39}$ |
| 3630. | $L_{A20}$ | $L_{B39}$ |
| 3631. | $L_{A21}$ | $L_{B39}$ |
| 3632. | $L_{A22}$ | $L_{B39}$ |
| 3633. | $L_{A23}$ | $L_{B39}$ |
| 3634. | $L_{A24}$ | $L_{B39}$ |
| 3635. | $L_{A25}$ | $L_{B39}$ |
| 3636. | $L_{A26}$ | $L_{B39}$ |
| 3637. | $L_{A27}$ | $L_{B39}$ |
| 3638. | $L_{A28}$ | $L_{B39}$ |
| 3639. | $L_{A29}$ | $L_{B39}$ |
| 3640. | $L_{A30}$ | $L_{B39}$ |
| 3641. | $L_{A31}$ | $L_{B39}$ |
| 3642. | $L_{A32}$ | $L_{B39}$ |
| 3643. | $L_{A33}$ | $L_{B39}$ |
| 3644. | $L_{A34}$ | $L_{B39}$ |
| 3645. | $L_{A35}$ | $L_{B39}$ |
| 3646. | $L_{A36}$ | $L_{B39}$ |
| 3647. | $L_{A37}$ | $L_{B39}$ |
| 3648. | $L_{A38}$ | $L_{B39}$ |
| 3649. | $L_{A39}$ | $L_{B39}$ |
| 3650. | $L_{A40}$ | $L_{B39}$ |
| 3651. | $L_{A41}$ | $L_{B39}$ |
| 3652. | $L_{A42}$ | $L_{B39}$ |
| 3653. | $L_{A43}$ | $L_{B39}$ |
| 3654. | $L_{A44}$ | $L_{B39}$ |
| 3655. | $L_{A45}$ | $L_{B39}$ |
| 3656. | $L_{A46}$ | $L_{B39}$ |
| 3657. | $L_{A47}$ | $L_{B39}$ |
| 3658. | $L_{A48}$ | $L_{B39}$ |
| 3659. | $L_{A49}$ | $L_{B39}$ |
| 3660. | $L_{A50}$ | $L_{B39}$ |
| 3661. | $L_{A51}$ | $L_{B39}$ |
| 3662. | $L_{A52}$ | $L_{B39}$ |
| 3663. | $L_{A53}$ | $L_{B39}$ |
| 3664. | $L_{A54}$ | $L_{B39}$ |
| 3665. | $L_{A55}$ | $L_{B39}$ |
| 3666. | $L_{A56}$ | $L_{B39}$ |
| 3667. | $L_{A57}$ | $L_{B39}$ |
| 3668. | $L_{A58}$ | $L_{B39}$ |
| 3669. | $L_{A59}$ | $L_{B39}$ |
| 3670. | $L_{A60}$ | $L_{B39}$ |
| 3671. | $L_{A61}$ | $L_{B39}$ |
| 3672. | $L_{A62}$ | $L_{B39}$ |
| 3673. | $L_{A63}$ | $L_{B39}$ |
| 3674. | $L_{A64}$ | $L_{B39}$ |
| 3675. | $L_{A65}$ | $L_{B39}$ |
| 3676. | $L_{A66}$ | $L_{B39}$ |
| 3677. | $L_{A67}$ | $L_{B39}$ |
| 3678. | $L_{A68}$ | $L_{B39}$ |
| 3679. | $L_{A69}$ | $L_{B39}$ |
| 3680. | $L_{A70}$ | $L_{B39}$ |
| 3681. | $L_{A71}$ | $L_{B39}$ |
| 3682. | $L_{A72}$ | $L_{B39}$ |
| 3683. | $L_{A73}$ | $L_{B39}$ |
| 3684. | $L_{A74}$ | $L_{B39}$ |
| 3685. | $L_{A75}$ | $L_{B39}$ |
| 3686. | $L_{A76}$ | $L_{B39}$ |
| 3687. | $L_{A77}$ | $L_{B39}$ |
| 3688. | $L_{A78}$ | $L_{B39}$ |
| 3689. | $L_{A79}$ | $L_{B39}$ |
| 3690. | $L_{A80}$ | $L_{B39}$ |
| 3691. | $L_{A81}$ | $L_{B39}$ |
| 3692. | $L_{A82}$ | $L_{B39}$ |

TABLE 1-continued

| Cpd # | $L_A$ | $L_B$ |
|---|---|---|
| 3693. | $L_{A83}$ | $L_{B39}$ |
| 3694. | $L_{A84}$ | $L_{B39}$ |
| 3695. | $L_{A85}$ | $L_{B39}$ |
| 3696. | $L_{A86}$ | $L_{B39}$ |
| 3697. | $L_{A87}$ | $L_{B39}$ |
| 3698. | $L_{A88}$ | $L_{B39}$ |
| 3699. | $L_{A89}$ | $L_{B39}$ |
| 3700. | $L_{A90}$ | $L_{B39}$ |
| 3701. | $L_{A91}$ | $L_{B39}$ |
| 3702. | $L_{A92}$ | $L_{B39}$ |
| 3703. | $L_{A93}$ | $L_{B39}$ |
| 3704. | $L_{A94}$ | $L_{B39}$ |
| 3705. | $L_{A95}$ | $L_{B39}$ |
| 3706. | $L_{A1}$ | $L_{B40}$ |
| 3707. | $L_{A2}$ | $L_{B40}$ |
| 3708. | $L_{A3}$ | $L_{B40}$ |
| 3709. | $L_{A4}$ | $L_{B40}$ |
| 3710. | $L_{A5}$ | $L_{B40}$ |
| 3711. | $L_{A6}$ | $L_{B40}$ |
| 3712. | $L_{A7}$ | $L_{B40}$ |
| 3713. | $L_{A8}$ | $L_{B40}$ |
| 3714. | $L_{A9}$ | $L_{B40}$ |
| 3715. | $L_{A10}$ | $L_{B40}$ |
| 3716. | $L_{A11}$ | $L_{B40}$ |
| 3717. | $L_{A12}$ | $L_{B40}$ |
| 3718. | $L_{A13}$ | $L_{B40}$ |
| 3719. | $L_{A14}$ | $L_{B40}$ |
| 3720. | $L_{A15}$ | $L_{B40}$ |
| 3721. | $L_{A16}$ | $L_{B40}$ |
| 3722. | $L_{A17}$ | $L_{B40}$ |
| 3723. | $L_{A18}$ | $L_{B40}$ |
| 3724. | $L_{A19}$ | $L_{B40}$ |
| 3725. | $L_{A20}$ | $L_{B40}$ |
| 3726. | $L_{A21}$ | $L_{B40}$ |
| 3727. | $L_{A22}$ | $L_{B40}$ |
| 3728. | $L_{A23}$ | $L_{B40}$ |
| 3729. | $L_{A24}$ | $L_{B40}$ |
| 3730. | $L_{A25}$ | $L_{B40}$ |
| 3731. | $L_{A26}$ | $L_{B40}$ |
| 3732. | $L_{A27}$ | $L_{B40}$ |
| 3733. | $L_{A28}$ | $L_{B40}$ |
| 3734. | $L_{A29}$ | $L_{B40}$ |
| 3735. | $L_{A30}$ | $L_{B40}$ |
| 3736. | $L_{A31}$ | $L_{B40}$ |
| 3737. | $L_{A32}$ | $L_{B40}$ |
| 3738. | $L_{A33}$ | $L_{B40}$ |
| 3739. | $L_{A34}$ | $L_{B40}$ |
| 3740. | $L_{A35}$ | $L_{B40}$ |
| 3741. | $L_{A36}$ | $L_{B40}$ |
| 3742. | $L_{A37}$ | $L_{B40}$ |
| 3743. | $L_{A38}$ | $L_{B40}$ |
| 3744. | $L_{A39}$ | $L_{B40}$ |
| 3745. | $L_{A40}$ | $L_{B40}$ |
| 3746. | $L_{A41}$ | $L_{B40}$ |
| 3747. | $L_{A42}$ | $L_{B40}$ |
| 3748. | $L_{A43}$ | $L_{B40}$ |
| 3749. | $L_{A44}$ | $L_{B40}$ |
| 3750. | $L_{A45}$ | $L_{B40}$ |
| 3751. | $L_{A46}$ | $L_{B40}$ |
| 3752. | $L_{A47}$ | $L_{B40}$ |
| 3753. | $L_{A48}$ | $L_{B40}$ |
| 3754. | $L_{A49}$ | $L_{B40}$ |
| 3755. | $L_{A50}$ | $L_{B40}$ |
| 3756. | $L_{A51}$ | $L_{B40}$ |
| 3757. | $L_{A52}$ | $L_{B40}$ |
| 3758. | $L_{A53}$ | $L_{B40}$ |
| 3759. | $L_{A54}$ | $L_{B40}$ |
| 3760. | $L_{A55}$ | $L_{B40}$ |
| 3761. | $L_{A56}$ | $L_{B40}$ |
| 3762. | $L_{A57}$ | $L_{B40}$ |
| 3763. | $L_{A58}$ | $L_{B40}$ |
| 3764. | $L_{A59}$ | $L_{B40}$ |
| 3765. | $L_{A60}$ | $L_{B40}$ |
| 3766. | $L_{A61}$ | $L_{B40}$ |
| 3767. | $L_{A62}$ | $L_{B40}$ |
| 3768. | $L_{A63}$ | $L_{B40}$ |
| 3769. | $L_{A64}$ | $L_{B40}$ |
| 3770. | $L_{A65}$ | $L_{B40}$ |

TABLE 1-continued

| Cpd # | $L_A$ | $L_B$ |
|---|---|---|
| 3771. | $L_{A66}$ | $L_{B40}$ |
| 3772. | $L_{A67}$ | $L_{B40}$ |
| 3773. | $L_{A68}$ | $L_{B40}$ |
| 3774. | $L_{A69}$ | $L_{B40}$ |
| 3775. | $L_{A70}$ | $L_{B40}$ |
| 3776. | $L_{A71}$ | $L_{B40}$ |
| 3777. | $L_{A72}$ | $L_{B40}$ |
| 3778. | $L_{A73}$ | $L_{B40}$ |
| 3779. | $L_{A74}$ | $L_{B40}$ |
| 3780. | $L_{A75}$ | $L_{B40}$ |
| 3781. | $L_{A76}$ | $L_{B40}$ |
| 3782. | $L_{A77}$ | $L_{B40}$ |
| 3783. | $L_{A78}$ | $L_{B40}$ |
| 3784. | $L_{A79}$ | $L_{B40}$ |
| 3785. | $L_{A80}$ | $L_{B40}$ |
| 3786. | $L_{A81}$ | $L_{B40}$ |
| 3787. | $L_{A82}$ | $L_{B40}$ |
| 3788. | $L_{A83}$ | $L_{B40}$ |
| 3789. | $L_{A84}$ | $L_{B40}$ |
| 3790. | $L_{A85}$ | $L_{B40}$ |
| 3791. | $L_{A86}$ | $L_{B40}$ |
| 3792. | $L_{A87}$ | $L_{B40}$ |
| 3793. | $L_{A88}$ | $L_{B40}$ |
| 3794. | $L_{A89}$ | $L_{B40}$ |
| 3795. | $L_{A90}$ | $L_{B40}$ |
| 3796. | $L_{A91}$ | $L_{B40}$ |
| 3797. | $L_{A92}$ | $L_{B40}$ |
| 3798. | $L_{A93}$ | $L_{B40}$ |
| 3799. | $L_{A94}$ | $L_{B40}$ |
| 3800. | $L_{A95}$ | $L_{B40}$ |
| 3801. | $L_{A1}$ | $L_{B41}$ |
| 3802. | $L_{A2}$ | $L_{B41}$ |
| 3803. | $L_{A3}$ | $L_{B41}$ |
| 3804. | $L_{A4}$ | $L_{B41}$ |
| 3805. | $L_{A5}$ | $L_{B41}$ |
| 3806. | $L_{A6}$ | $L_{B41}$ |
| 3807. | $L_{A7}$ | $L_{B41}$ |
| 3808. | $L_{A8}$ | $L_{B41}$ |
| 3809. | $L_{A9}$ | $L_{B41}$ |
| 3810. | $L_{A10}$ | $L_{B41}$ |
| 3811. | $L_{A11}$ | $L_{B41}$ |
| 3812. | $L_{A12}$ | $L_{B41}$ |
| 3813. | $L_{A13}$ | $L_{B41}$ |
| 3814. | $L_{A14}$ | $L_{B41}$ |
| 3815. | $L_{A15}$ | $L_{B41}$ |
| 3816. | $L_{A16}$ | $L_{B41}$ |
| 3817. | $L_{A17}$ | $L_{B41}$ |
| 3818. | $L_{A18}$ | $L_{B41}$ |
| 3819. | $L_{A19}$ | $L_{B41}$ |
| 3820. | $L_{A20}$ | $L_{B41}$ |
| 3821. | $L_{A21}$ | $L_{B41}$ |
| 3822. | $L_{A22}$ | $L_{B41}$ |
| 3823. | $L_{A23}$ | $L_{B41}$ |
| 3824. | $L_{A24}$ | $L_{B41}$ |
| 3825. | $L_{A25}$ | $L_{B41}$ |
| 3826. | $L_{A26}$ | $L_{B41}$ |
| 3827. | $L_{A27}$ | $L_{B41}$ |
| 3828. | $L_{A28}$ | $L_{B41}$ |
| 3829. | $L_{A29}$ | $L_{B41}$ |
| 3830. | $L_{A30}$ | $L_{B41}$ |
| 3831. | $L_{A31}$ | $L_{B41}$ |
| 3832. | $L_{A32}$ | $L_{B41}$ |
| 3833. | $L_{A33}$ | $L_{B41}$ |
| 3834. | $L_{A34}$ | $L_{B41}$ |
| 3835. | $L_{A35}$ | $L_{B41}$ |
| 3836. | $L_{A36}$ | $L_{B41}$ |
| 3837. | $L_{A37}$ | $L_{B41}$ |
| 3838. | $L_{A38}$ | $L_{B41}$ |
| 3839. | $L_{A39}$ | $L_{B41}$ |
| 3840. | $L_{A40}$ | $L_{B41}$ |
| 3841. | $L_{A41}$ | $L_{B41}$ |
| 3842. | $L_{A42}$ | $L_{B41}$ |
| 3843. | $L_{A43}$ | $L_{B41}$ |
| 3844. | $L_{A44}$ | $L_{B41}$ |
| 3845. | $L_{A45}$ | $L_{B41}$ |
| 3846. | $L_{A46}$ | $L_{B41}$ |
| 3847. | $L_{A47}$ | $L_{B41}$ |
| 3848. | $L_{A48}$ | $L_{B41}$ |

TABLE 1-continued

| Cpd # | $L_A$ | $L_B$ |
|---|---|---|
| 3849. | $L_{A49}$ | $L_{B41}$ |
| 3850. | $L_{A50}$ | $L_{B41}$ |
| 3851. | $L_{A51}$ | $L_{B41}$ |
| 3852. | $L_{A52}$ | $L_{B41}$ |
| 3853. | $L_{A53}$ | $L_{B41}$ |
| 3854. | $L_{A54}$ | $L_{B41}$ |
| 3855. | $L_{A55}$ | $L_{B41}$ |
| 3856. | $L_{A56}$ | $L_{B41}$ |
| 3857. | $L_{A57}$ | $L_{B41}$ |
| 3858. | $L_{A58}$ | $L_{B41}$ |
| 3859. | $L_{A59}$ | $L_{B41}$ |
| 3860. | $L_{A60}$ | $L_{B41}$ |
| 3861. | $L_{A61}$ | $L_{B41}$ |
| 3862. | $L_{A62}$ | $L_{B41}$ |
| 3863. | $L_{A63}$ | $L_{B41}$ |
| 3864. | $L_{A64}$ | $L_{B41}$ |
| 3865. | $L_{A65}$ | $L_{B41}$ |
| 3866. | $L_{A66}$ | $L_{B41}$ |
| 3867. | $L_{A67}$ | $L_{B41}$ |
| 3868. | $L_{A68}$ | $L_{B41}$ |
| 3869. | $L_{A69}$ | $L_{B41}$ |
| 3870. | $L_{A70}$ | $L_{B41}$ |
| 3871. | $L_{A71}$ | $L_{B41}$ |
| 3872. | $L_{A72}$ | $L_{B41}$ |
| 3873. | $L_{A73}$ | $L_{B41}$ |
| 3874. | $L_{A74}$ | $L_{B41}$ |
| 3875. | $L_{A75}$ | $L_{B41}$ |
| 3876. | $L_{A76}$ | $L_{B41}$ |
| 3877. | $L_{A77}$ | $L_{B41}$ |
| 3878. | $L_{A78}$ | $L_{B41}$ |
| 3879. | $L_{A79}$ | $L_{B41}$ |
| 3880. | $L_{A80}$ | $L_{B41}$ |
| 3881. | $L_{A81}$ | $L_{B41}$ |
| 3882. | $L_{A82}$ | $L_{B41}$ |
| 3883. | $L_{A83}$ | $L_{B41}$ |
| 3884. | $L_{A84}$ | $L_{B41}$ |
| 3885. | $L_{A85}$ | $L_{B41}$ |
| 3886. | $L_{A86}$ | $L_{B41}$ |
| 3887. | $L_{A87}$ | $L_{B41}$ |
| 3888. | $L_{A88}$ | $L_{B41}$ |
| 3889. | $L_{A89}$ | $L_{B41}$ |
| 3890. | $L_{A90}$ | $L_{B41}$ |
| 3891. | $L_{A91}$ | $L_{B41}$ |
| 3892. | $L_{A92}$ | $L_{B41}$ |
| 3893. | $L_{A93}$ | $L_{B41}$ |
| 3894. | $L_{A94}$ | $L_{B41}$ |
| 3895. | $L_{A95}$ | $L_{B41}$ |
| 3896. | $L_{A1}$ | $L_{B42}$ |
| 3897. | $L_{A2}$ | $L_{B42}$ |
| 3898. | $L_{A3}$ | $L_{B42}$ |
| 3899. | $L_{A4}$ | $L_{B42}$ |
| 3900. | $L_{A5}$ | $L_{B42}$ |
| 3901. | $L_{A6}$ | $L_{B42}$ |
| 3902. | $L_{A7}$ | $L_{B42}$ |
| 3903. | $L_{A8}$ | $L_{B42}$ |
| 3904. | $L_{A9}$ | $L_{B42}$ |
| 3905. | $L_{A10}$ | $L_{B42}$ |
| 3906. | $L_{A11}$ | $L_{B42}$ |
| 3907. | $L_{A12}$ | $L_{B42}$ |
| 3908. | $L_{A13}$ | $L_{B42}$ |
| 3909. | $L_{A14}$ | $L_{B42}$ |
| 3910. | $L_{A15}$ | $L_{B42}$ |
| 3911. | $L_{A16}$ | $L_{B42}$ |
| 3912. | $L_{A17}$ | $L_{B42}$ |
| 3913. | $L_{A18}$ | $L_{B42}$ |
| 3914. | $L_{A19}$ | $L_{B42}$ |
| 3915. | $L_{A20}$ | $L_{B42}$ |
| 3916. | $L_{A21}$ | $L_{B42}$ |
| 3917. | $L_{A22}$ | $L_{B42}$ |
| 3918. | $L_{A23}$ | $L_{B42}$ |
| 3919. | $L_{A24}$ | $L_{B42}$ |
| 3920. | $L_{A25}$ | $L_{B42}$ |
| 3921. | $L_{A26}$ | $L_{B42}$ |
| 3922. | $L_{A27}$ | $L_{B42}$ |
| 3923. | $L_{A28}$ | $L_{B42}$ |
| 3924. | $L_{A29}$ | $L_{B42}$ |
| 3925. | $L_{A30}$ | $L_{B42}$ |
| 3926. | $L_{A31}$ | $L_{B42}$ |

TABLE 1-continued

| Cpd # | $L_A$ | $L_B$ |
|---|---|---|
| 3927. | $L_{A32}$ | $L_{B42}$ |
| 3928. | $L_{A33}$ | $L_{B42}$ |
| 3929. | $L_{A34}$ | $L_{B42}$ |
| 3930. | $L_{A35}$ | $L_{B42}$ |
| 3931. | $L_{A36}$ | $L_{B42}$ |
| 3932. | $L_{A37}$ | $L_{B42}$ |
| 3933. | $L_{A38}$ | $L_{B42}$ |
| 3934. | $L_{A39}$ | $L_{B42}$ |
| 3935. | $L_{A40}$ | $L_{B42}$ |
| 3936. | $L_{A41}$ | $L_{B42}$ |
| 3937. | $L_{A42}$ | $L_{B42}$ |
| 3938. | $L_{A43}$ | $L_{B42}$ |
| 3939. | $L_{A44}$ | $L_{B42}$ |
| 3940. | $L_{A45}$ | $L_{B42}$ |
| 3941. | $L_{A46}$ | $L_{B42}$ |
| 3942. | $L_{A47}$ | $L_{B42}$ |
| 3943. | $L_{A48}$ | $L_{B42}$ |
| 3944. | $L_{A49}$ | $L_{B42}$ |
| 3945. | $L_{A50}$ | $L_{B42}$ |
| 3946. | $L_{A51}$ | $L_{B42}$ |
| 3947. | $L_{A52}$ | $L_{B42}$ |
| 3948. | $L_{A53}$ | $L_{B42}$ |
| 3949. | $L_{A54}$ | $L_{B42}$ |
| 3950. | $L_{A55}$ | $L_{B42}$ |
| 3951. | $L_{A56}$ | $L_{B42}$ |
| 3952. | $L_{A57}$ | $L_{B42}$ |
| 3953. | $L_{A58}$ | $L_{B42}$ |
| 3954. | $L_{A59}$ | $L_{B42}$ |
| 3955. | $L_{A60}$ | $L_{B42}$ |
| 3956. | $L_{A61}$ | $L_{B42}$ |
| 3957. | $L_{A62}$ | $L_{B42}$ |
| 3958. | $L_{A63}$ | $L_{B42}$ |
| 3959. | $L_{A64}$ | $L_{B42}$ |
| 3960. | $L_{A65}$ | $L_{B42}$ |
| 3961. | $L_{A66}$ | $L_{B42}$ |
| 3962. | $L_{A67}$ | $L_{B42}$ |
| 3963. | $L_{A68}$ | $L_{B42}$ |
| 3964. | $L_{A69}$ | $L_{B42}$ |
| 3965. | $L_{A70}$ | $L_{B42}$ |
| 3966. | $L_{A71}$ | $L_{B42}$ |
| 3967. | $L_{A72}$ | $L_{B42}$ |
| 3968. | $L_{A73}$ | $L_{B42}$ |
| 3969. | $L_{A74}$ | $L_{B42}$ |
| 3970. | $L_{A75}$ | $L_{B42}$ |
| 3971. | $L_{A76}$ | $L_{B42}$ |
| 3972. | $L_{A77}$ | $L_{B42}$ |
| 3973. | $L_{A78}$ | $L_{B42}$ |
| 3974. | $L_{A79}$ | $L_{B42}$ |
| 3975. | $L_{A80}$ | $L_{B42}$ |
| 3976. | $L_{A81}$ | $L_{B42}$ |
| 3977. | $L_{A82}$ | $L_{B42}$ |
| 3978. | $L_{A83}$ | $L_{B42}$ |
| 3979. | $L_{A84}$ | $L_{B42}$ |
| 3980. | $L_{A85}$ | $L_{B42}$ |
| 3981. | $L_{A86}$ | $L_{B42}$ |
| 3982. | $L_{A87}$ | $L_{B42}$ |
| 3983. | $L_{A88}$ | $L_{B42}$ |
| 3984. | $L_{A89}$ | $L_{B42}$ |
| 3985. | $L_{A90}$ | $L_{B42}$ |
| 3986. | $L_{A91}$ | $L_{B42}$ |
| 3987. | $L_{A92}$ | $L_{B42}$ |
| 3988. | $L_{A93}$ | $L_{B42}$ |
| 3989. | $L_{A94}$ | $L_{B42}$ |
| 3990. | $L_{A95}$ | $L_{B42}$ |
| 3991. | $L_{A1}$ | $L_{B43}$ |
| 3992. | $L_{A2}$ | $L_{B43}$ |
| 3993. | $L_{A3}$ | $L_{B43}$ |
| 3994. | $L_{A4}$ | $L_{B43}$ |
| 3995. | $L_{A5}$ | $L_{B43}$ |
| 3996. | $L_{A6}$ | $L_{B43}$ |
| 3997. | $L_{A7}$ | $L_{B43}$ |
| 3998. | $L_{A8}$ | $L_{B43}$ |
| 3999. | $L_{A9}$ | $L_{B43}$ |
| 4000. | $L_{A10}$ | $L_{B43}$ |
| 4001. | $L_{A11}$ | $L_{B43}$ |
| 4002. | $L_{A12}$ | $L_{B43}$ |
| 4003. | $L_{A13}$ | $L_{B43}$ |
| 4004. | $L_{A14}$ | $L_{B43}$ |

TABLE 1-continued

| Cpd # | $L_A$ | $L_B$ |
|---|---|---|
| 4005. | $L_{A15}$ | $L_{B43}$ |
| 4006. | $L_{A16}$ | $L_{B43}$ |
| 4007. | $L_{A17}$ | $L_{B43}$ |
| 4008. | $L_{A18}$ | $L_{B43}$ |
| 4009. | $L_{A19}$ | $L_{B43}$ |
| 4010. | $L_{A20}$ | $L_{B43}$ |
| 4011. | $L_{A21}$ | $L_{B43}$ |
| 4012. | $L_{A22}$ | $L_{B43}$ |
| 4013. | $L_{A23}$ | $L_{B43}$ |
| 4014. | $L_{A24}$ | $L_{B43}$ |
| 4015. | $L_{A25}$ | $L_{B43}$ |
| 4016. | $L_{A26}$ | $L_{B43}$ |
| 4017. | $L_{A27}$ | $L_{B43}$ |
| 4018. | $L_{A28}$ | $L_{B43}$ |
| 4019. | $L_{A29}$ | $L_{B43}$ |
| 4020. | $L_{A30}$ | $L_{B43}$ |
| 4021. | $L_{A31}$ | $L_{B43}$ |
| 4022. | $L_{A32}$ | $L_{B43}$ |
| 4023. | $L_{A33}$ | $L_{B43}$ |
| 4024. | $L_{A34}$ | $L_{B43}$ |
| 4025. | $L_{A35}$ | $L_{B43}$ |
| 4026. | $L_{A36}$ | $L_{B43}$ |
| 4027. | $L_{A37}$ | $L_{B43}$ |
| 4028. | $L_{A38}$ | $L_{B43}$ |
| 4029. | $L_{A39}$ | $L_{B43}$ |
| 4030. | $L_{A40}$ | $L_{B43}$ |
| 4031. | $L_{A41}$ | $L_{B43}$ |
| 4032. | $L_{A42}$ | $L_{B43}$ |
| 4033. | $L_{A43}$ | $L_{B43}$ |
| 4034. | $L_{A44}$ | $L_{B43}$ |
| 4035. | $L_{A45}$ | $L_{B43}$ |
| 4036. | $L_{A46}$ | $L_{B43}$ |
| 4037. | $L_{A47}$ | $L_{B43}$ |
| 4038. | $L_{A48}$ | $L_{B43}$ |
| 4039. | $L_{A49}$ | $L_{B43}$ |
| 4040. | $L_{A50}$ | $L_{B43}$ |
| 4041. | $L_{A51}$ | $L_{B43}$ |
| 4042. | $L_{A52}$ | $L_{B43}$ |
| 4043. | $L_{A53}$ | $L_{B43}$ |
| 4044. | $L_{A54}$ | $L_{B43}$ |
| 4045. | $L_{A55}$ | $L_{B43}$ |
| 4046. | $L_{A56}$ | $L_{B43}$ |
| 4047. | $L_{A57}$ | $L_{B43}$ |
| 4048. | $L_{A58}$ | $L_{B43}$ |
| 4049. | $L_{A59}$ | $L_{B43}$ |
| 4050. | $L_{A60}$ | $L_{B43}$ |
| 4051. | $L_{A61}$ | $L_{B43}$ |
| 4052. | $L_{A62}$ | $L_{B43}$ |
| 4053. | $L_{A63}$ | $L_{B43}$ |
| 4054. | $L_{A64}$ | $L_{B43}$ |
| 4055. | $L_{A65}$ | $L_{B43}$ |
| 4056. | $L_{A66}$ | $L_{B43}$ |
| 4057. | $L_{A67}$ | $L_{B43}$ |
| 4058. | $L_{A68}$ | $L_{B43}$ |
| 4059. | $L_{A69}$ | $L_{B43}$ |
| 4060. | $L_{A70}$ | $L_{B43}$ |
| 4061. | $L_{A71}$ | $L_{B43}$ |
| 4062. | $L_{A72}$ | $L_{B43}$ |
| 4063. | $L_{A73}$ | $L_{B43}$ |
| 4064. | $L_{A74}$ | $L_{B43}$ |
| 4065. | $L_{A75}$ | $L_{B43}$ |
| 4066. | $L_{A76}$ | $L_{B43}$ |
| 4067. | $L_{A77}$ | $L_{B43}$ |
| 4068. | $L_{A78}$ | $L_{B43}$ |
| 4069. | $L_{A79}$ | $L_{B43}$ |
| 4070. | $L_{A80}$ | $L_{B43}$ |
| 4071. | $L_{A81}$ | $L_{B43}$ |
| 4072. | $L_{A82}$ | $L_{B43}$ |
| 4073. | $L_{A83}$ | $L_{B43}$ |
| 4074. | $L_{A84}$ | $L_{B43}$ |
| 4075. | $L_{A85}$ | $L_{B43}$ |
| 4076. | $L_{A86}$ | $L_{B43}$ |
| 4077. | $L_{A87}$ | $L_{B43}$ |
| 4078. | $L_{A88}$ | $L_{B43}$ |
| 4079. | $L_{A89}$ | $L_{B43}$ |
| 4080. | $L_{A90}$ | $L_{B43}$ |
| 4081. | $L_{A91}$ | $L_{B43}$ |
| 4082. | $L_{A92}$ | $L_{B43}$ |
| 4083. | $L_{A93}$ | $L_{B43}$ |
| 4084. | $L_{A94}$ | $L_{B43}$ |
| 4085. | $L_{A95}$ | $L_{B43}$ |
| 4086. | $L_{A1}$ | $L_{B44}$ |
| 4087. | $L_{A2}$ | $L_{B44}$ |
| 4088. | $L_{A3}$ | $L_{B44}$ |
| 4089. | $L_{A4}$ | $L_{B44}$ |
| 4090. | $L_{A5}$ | $L_{B44}$ |
| 4091. | $L_{A6}$ | $L_{B44}$ |
| 4092. | $L_{A7}$ | $L_{B44}$ |
| 4093. | $L_{A8}$ | $L_{B44}$ |
| 4094. | $L_{A9}$ | $L_{B44}$ |
| 4095. | $L_{A10}$ | $L_{B44}$ |
| 4096. | $L_{A11}$ | $L_{B44}$ |
| 4097. | $L_{A12}$ | $L_{B44}$ |
| 4098. | $L_{A13}$ | $L_{B44}$ |
| 4099. | $L_{A14}$ | $L_{B44}$ |
| 4100. | $L_{A15}$ | $L_{B44}$ |
| 4101. | $L_{A16}$ | $L_{B44}$ |
| 4102. | $L_{A17}$ | $L_{B44}$ |
| 4103. | $L_{A18}$ | $L_{B44}$ |
| 4104. | $L_{A19}$ | $L_{B44}$ |
| 4105. | $L_{A20}$ | $L_{B44}$ |
| 4106. | $L_{A21}$ | $L_{B44}$ |
| 4107. | $L_{A22}$ | $L_{B44}$ |
| 4108. | $L_{A23}$ | $L_{B44}$ |
| 4109. | $L_{A24}$ | $L_{B44}$ |
| 4110. | $L_{A25}$ | $L_{B44}$ |
| 4111. | $L_{A26}$ | $L_{B44}$ |
| 4112. | $L_{A27}$ | $L_{B44}$ |
| 4113. | $L_{A28}$ | $L_{B44}$ |
| 4114. | $L_{A29}$ | $L_{B44}$ |
| 4115. | $L_{A30}$ | $L_{B44}$ |
| 4116. | $L_{A31}$ | $L_{B44}$ |
| 4117. | $L_{A32}$ | $L_{B44}$ |
| 4118. | $L_{A33}$ | $L_{B44}$ |
| 4119. | $L_{A34}$ | $L_{B44}$ |
| 4120. | $L_{A35}$ | $L_{B44}$ |
| 4121. | $L_{A36}$ | $L_{B44}$ |
| 4122. | $L_{A37}$ | $L_{B44}$ |
| 4123. | $L_{A38}$ | $L_{B44}$ |
| 4124. | $L_{A39}$ | $L_{B44}$ |
| 4125. | $L_{A40}$ | $L_{B44}$ |
| 4126. | $L_{A41}$ | $L_{B44}$ |
| 4127. | $L_{A42}$ | $L_{B44}$ |
| 4128. | $L_{A43}$ | $L_{B44}$ |
| 4129. | $L_{A44}$ | $L_{B44}$ |
| 4130. | $L_{A45}$ | $L_{B44}$ |
| 4131. | $L_{A46}$ | $L_{B44}$ |
| 4132. | $L_{A47}$ | $L_{B44}$ |
| 4133. | $L_{A48}$ | $L_{B44}$ |
| 4134. | $L_{A49}$ | $L_{B44}$ |
| 4135. | $L_{A50}$ | $L_{B44}$ |
| 4136. | $L_{A51}$ | $L_{B44}$ |
| 4137. | $L_{A52}$ | $L_{B44}$ |
| 4138. | $L_{A53}$ | $L_{B44}$ |
| 4139. | $L_{A54}$ | $L_{B44}$ |
| 4140. | $L_{A55}$ | $L_{B44}$ |
| 4141. | $L_{A56}$ | $L_{B44}$ |
| 4142. | $L_{A57}$ | $L_{B44}$ |
| 4143. | $L_{A58}$ | $L_{B44}$ |
| 4144. | $L_{A59}$ | $L_{B44}$ |
| 4145. | $L_{A60}$ | $L_{B44}$ |
| 4146. | $L_{A61}$ | $L_{B44}$ |
| 4147. | $L_{A62}$ | $L_{B44}$ |
| 4148. | $L_{A63}$ | $L_{B44}$ |
| 4149. | $L_{A64}$ | $L_{B44}$ |
| 4150. | $L_{A65}$ | $L_{B44}$ |
| 4151. | $L_{A66}$ | $L_{B44}$ |
| 4152. | $L_{A67}$ | $L_{B44}$ |
| 4153. | $L_{A68}$ | $L_{B44}$ |
| 4154. | $L_{A69}$ | $L_{B44}$ |
| 4155. | $L_{A70}$ | $L_{B44}$ |
| 4156. | $L_{A71}$ | $L_{B44}$ |
| 4157. | $L_{A72}$ | $L_{B44}$ |
| 4158. | $L_{A73}$ | $L_{B44}$ |
| 4159. | $L_{A74}$ | $L_{B44}$ |
| 4160. | $L_{A75}$ | $L_{B44}$ |

TABLE 1-continued

| Cpd # | $L_A$ | $L_B$ |
|---|---|---|
| 4161. | $L_{A76}$ | $L_{B44}$ |
| 4162. | $L_{A77}$ | $L_{B44}$ |
| 4163. | $L_{A78}$ | $L_{B44}$ |
| 4164. | $L_{A79}$ | $L_{B44}$ |
| 4165. | $L_{A80}$ | $L_{B44}$ |
| 4166. | $L_{A81}$ | $L_{B44}$ |
| 4167. | $L_{A82}$ | $L_{B44}$ |
| 4168. | $L_{A83}$ | $L_{B44}$ |
| 4169. | $L_{A84}$ | $L_{B44}$ |
| 4170. | $L_{A85}$ | $L_{B44}$ |
| 4171. | $L_{A86}$ | $L_{B44}$ |
| 4172. | $L_{A87}$ | $L_{B44}$ |
| 4173. | $L_{A88}$ | $L_{B44}$ |
| 4174. | $L_{A89}$ | $L_{B44}$ |
| 4175. | $L_{A90}$ | $L_{B44}$ |
| 4176. | $L_{A91}$ | $L_{B44}$ |
| 4177. | $L_{A92}$ | $L_{B44}$ |
| 4178. | $L_{A93}$ | $L_{B44}$ |
| 4179. | $L_{A94}$ | $L_{B44}$ |
| 4180. | $L_{A95}$ | $L_{B44}$ |
| 4181. | $L_{A1}$ | $L_{B45}$ |
| 4182. | $L_{A2}$ | $L_{B45}$ |
| 4183. | $L_{A3}$ | $L_{B45}$ |
| 4184. | $L_{A4}$ | $L_{B45}$ |
| 4185. | $L_{A5}$ | $L_{B45}$ |
| 4186. | $L_{A6}$ | $L_{B45}$ |
| 4187. | $L_{A7}$ | $L_{B45}$ |
| 4188. | $L_{A8}$ | $L_{B45}$ |
| 4189. | $L_{A9}$ | $L_{B45}$ |
| 4190. | $L_{A10}$ | $L_{B45}$ |
| 4191. | $L_{A11}$ | $L_{B45}$ |
| 4192. | $L_{A12}$ | $L_{B45}$ |
| 4193. | $L_{A13}$ | $L_{B45}$ |
| 4194. | $L_{A14}$ | $L_{B45}$ |
| 4195. | $L_{A15}$ | $L_{B45}$ |
| 4196. | $L_{A16}$ | $L_{B45}$ |
| 4197. | $L_{A17}$ | $L_{B45}$ |
| 4198. | $L_{A18}$ | $L_{B45}$ |
| 4199. | $L_{A19}$ | $L_{B45}$ |
| 4200. | $L_{A20}$ | $L_{B45}$ |
| 4201. | $L_{A21}$ | $L_{B45}$ |
| 4202. | $L_{A22}$ | $L_{B45}$ |
| 4203. | $L_{A23}$ | $L_{B45}$ |
| 4204. | $L_{A24}$ | $L_{B45}$ |
| 4205. | $L_{A25}$ | $L_{B45}$ |
| 4206. | $L_{A26}$ | $L_{B45}$ |
| 4207. | $L_{A27}$ | $L_{B45}$ |
| 4208. | $L_{A28}$ | $L_{B45}$ |
| 4209. | $L_{A29}$ | $L_{B45}$ |
| 4210. | $L_{A30}$ | $L_{B45}$ |
| 4211. | $L_{A31}$ | $L_{B45}$ |
| 4212. | $L_{A32}$ | $L_{B45}$ |
| 4213. | $L_{A33}$ | $L_{B45}$ |
| 4214. | $L_{A34}$ | $L_{B45}$ |
| 4215. | $L_{A35}$ | $L_{B45}$ |
| 4216. | $L_{A36}$ | $L_{B45}$ |
| 4217. | $L_{A37}$ | $L_{B45}$ |
| 4218. | $L_{A38}$ | $L_{B45}$ |
| 4219. | $L_{A39}$ | $L_{B45}$ |
| 4220. | $L_{A40}$ | $L_{B45}$ |
| 4221. | $L_{A41}$ | $L_{B45}$ |
| 4222. | $L_{A42}$ | $L_{B45}$ |
| 4223. | $L_{A43}$ | $L_{B45}$ |
| 4224. | $L_{A44}$ | $L_{B45}$ |
| 4225. | $L_{A45}$ | $L_{B45}$ |
| 4226. | $L_{A46}$ | $L_{B45}$ |
| 4227. | $L_{A47}$ | $L_{B45}$ |
| 4228. | $L_{A48}$ | $L_{B45}$ |
| 4229. | $L_{A49}$ | $L_{B45}$ |
| 4230. | $L_{A50}$ | $L_{B45}$ |
| 4231. | $L_{A51}$ | $L_{B45}$ |
| 4232. | $L_{A52}$ | $L_{B45}$ |
| 4233. | $L_{A53}$ | $L_{B45}$ |
| 4234. | $L_{A54}$ | $L_{B45}$ |
| 4235. | $L_{A55}$ | $L_{B45}$ |
| 4236. | $L_{A56}$ | $L_{B45}$ |
| 4237. | $L_{A57}$ | $L_{B45}$ |
| 4238. | $L_{A58}$ | $L_{B45}$ |

TABLE 1-continued

| Cpd # | $L_A$ | $L_B$ |
|---|---|---|
| 4239. | $L_{A59}$ | $L_{B45}$ |
| 4240. | $L_{A60}$ | $L_{B45}$ |
| 4241. | $L_{A61}$ | $L_{B45}$ |
| 4242. | $L_{A62}$ | $L_{B45}$ |
| 4243. | $L_{A63}$ | $L_{B45}$ |
| 4244. | $L_{A64}$ | $L_{B45}$ |
| 4245. | $L_{A65}$ | $L_{B45}$ |
| 4246. | $L_{A66}$ | $L_{B45}$ |
| 4247. | $L_{A67}$ | $L_{B45}$ |
| 4248. | $L_{A68}$ | $L_{B45}$ |
| 4249. | $L_{A69}$ | $L_{B45}$ |
| 4250. | $L_{A70}$ | $L_{B45}$ |
| 4251. | $L_{A71}$ | $L_{B45}$ |
| 4252. | $L_{A72}$ | $L_{B45}$ |
| 4253. | $L_{A73}$ | $L_{B45}$ |
| 4254. | $L_{A74}$ | $L_{B45}$ |
| 4255. | $L_{A75}$ | $L_{B45}$ |
| 4256. | $L_{A76}$ | $L_{B45}$ |
| 4257. | $L_{A77}$ | $L_{B45}$ |
| 4258. | $L_{A78}$ | $L_{B45}$ |
| 4259. | $L_{A79}$ | $L_{B45}$ |
| 4260. | $L_{A80}$ | $L_{B45}$ |
| 4261. | $L_{A81}$ | $L_{B45}$ |
| 4262. | $L_{A82}$ | $L_{B45}$ |
| 4263. | $L_{A83}$ | $L_{B45}$ |
| 4264. | $L_{A84}$ | $L_{B45}$ |
| 4265. | $L_{A85}$ | $L_{B45}$ |
| 4266. | $L_{A86}$ | $L_{B45}$ |
| 4267. | $L_{A87}$ | $L_{B45}$ |
| 4268. | $L_{A88}$ | $L_{B45}$ |
| 4269. | $L_{A89}$ | $L_{B45}$ |
| 4270. | $L_{A90}$ | $L_{B45}$ |
| 4271. | $L_{A91}$ | $L_{B45}$ |
| 4272. | $L_{A92}$ | $L_{B45}$ |
| 4273. | $L_{A93}$ | $L_{B45}$ |
| 4274. | $L_{A94}$ | $L_{B45}$ |
| 4275. | $L_{A95}$ | $L_{B45}$ |
| 4276. | $L_{A1}$ | $L_{B46}$ |
| 4277. | $L_{A2}$ | $L_{B46}$ |
| 4278. | $L_{A3}$ | $L_{B46}$ |
| 4279. | $L_{A4}$ | $L_{B46}$ |
| 4280. | $L_{A5}$ | $L_{B46}$ |
| 4281. | $L_{A6}$ | $L_{B46}$ |
| 4282. | $L_{A7}$ | $L_{B46}$ |
| 4283. | $L_{A8}$ | $L_{B46}$ |
| 4284. | $L_{A9}$ | $L_{B46}$ |
| 4285. | $L_{A10}$ | $L_{B46}$ |
| 4286. | $L_{A11}$ | $L_{B46}$ |
| 4287. | $L_{A12}$ | $L_{B46}$ |
| 4288. | $L_{A13}$ | $L_{B46}$ |
| 4289. | $L_{A14}$ | $L_{B46}$ |
| 4290. | $L_{A15}$ | $L_{B46}$ |
| 4291. | $L_{A16}$ | $L_{B46}$ |
| 4292. | $L_{A17}$ | $L_{B46}$ |
| 4293. | $L_{A18}$ | $L_{B46}$ |
| 4294. | $L_{A19}$ | $L_{B46}$ |
| 4295. | $L_{A20}$ | $L_{B46}$ |
| 4296. | $L_{A21}$ | $L_{B46}$ |
| 4297. | $L_{A22}$ | $L_{B46}$ |
| 4298. | $L_{A23}$ | $L_{B46}$ |
| 4299. | $L_{A24}$ | $L_{B46}$ |
| 4300. | $L_{A25}$ | $L_{B46}$ |
| 4301. | $L_{A26}$ | $L_{B46}$ |
| 4302. | $L_{A27}$ | $L_{B46}$ |
| 4303. | $L_{A28}$ | $L_{B46}$ |
| 4304. | $L_{A29}$ | $L_{B46}$ |
| 4305. | $L_{A30}$ | $L_{B46}$ |
| 4306. | $L_{A31}$ | $L_{B46}$ |
| 4307. | $L_{A32}$ | $L_{B46}$ |
| 4308. | $L_{A33}$ | $L_{B46}$ |
| 4309. | $L_{A34}$ | $L_{B46}$ |
| 4310. | $L_{A35}$ | $L_{B46}$ |
| 4311. | $L_{A36}$ | $L_{B46}$ |
| 4312. | $L_{A37}$ | $L_{B46}$ |
| 4313. | $L_{A38}$ | $L_{B46}$ |
| 4314. | $L_{A39}$ | $L_{B46}$ |
| 4315. | $L_{A40}$ | $L_{B46}$ |
| 4316. | $L_{A41}$ | $L_{B46}$ |

TABLE 1-continued

| Cpd # | $L_A$ | $L_B$ |
|---|---|---|
| 4317. | $L_{A42}$ | $L_{B46}$ |
| 4318. | $L_{A43}$ | $L_{B46}$ |
| 4319. | $L_{A44}$ | $L_{B46}$ |
| 4320. | $L_{A45}$ | $L_{B46}$ |
| 4321. | $L_{A46}$ | $L_{B46}$ |
| 4322. | $L_{A47}$ | $L_{B46}$ |
| 4323. | $L_{A48}$ | $L_{B46}$ |
| 4324. | $L_{A49}$ | $L_{B46}$ |
| 4325. | $L_{A50}$ | $L_{B46}$ |
| 4326. | $L_{A51}$ | $L_{B46}$ |
| 4327. | $L_{A52}$ | $L_{B46}$ |
| 4328. | $L_{A53}$ | $L_{B46}$ |
| 4329. | $L_{A54}$ | $L_{B46}$ |
| 4330. | $L_{A55}$ | $L_{B46}$ |
| 4331. | $L_{A56}$ | $L_{B46}$ |
| 4332. | $L_{A57}$ | $L_{B46}$ |
| 4333. | $L_{A58}$ | $L_{B46}$ |
| 4334. | $L_{A59}$ | $L_{B46}$ |
| 4335. | $L_{A60}$ | $L_{B46}$ |
| 4336. | $L_{A61}$ | $L_{B46}$ |
| 4337. | $L_{A62}$ | $L_{B46}$ |
| 4338. | $L_{A63}$ | $L_{B46}$ |
| 4339. | $L_{A64}$ | $L_{B46}$ |
| 4340. | $L_{A65}$ | $L_{B46}$ |
| 4341. | $L_{A66}$ | $L_{B46}$ |
| 4342. | $L_{A67}$ | $L_{B46}$ |
| 4343. | $L_{A68}$ | $L_{B46}$ |
| 4344. | $L_{A69}$ | $L_{B46}$ |
| 4345. | $L_{A70}$ | $L_{B46}$ |
| 4346. | $L_{A71}$ | $L_{B46}$ |
| 4347. | $L_{A72}$ | $L_{B46}$ |
| 4348. | $L_{A73}$ | $L_{B46}$ |
| 4349. | $L_{A74}$ | $L_{B46}$ |
| 4350. | $L_{A75}$ | $L_{B46}$ |
| 4351. | $L_{A76}$ | $L_{B46}$ |
| 4352. | $L_{A77}$ | $L_{B46}$ |
| 4353. | $L_{A78}$ | $L_{B46}$ |
| 4354. | $L_{A79}$ | $L_{B46}$ |
| 4355. | $L_{A80}$ | $L_{B46}$ |
| 4356. | $L_{A81}$ | $L_{B46}$ |
| 4357. | $L_{A82}$ | $L_{B46}$ |
| 4358. | $L_{A83}$ | $L_{B46}$ |
| 4359. | $L_{A84}$ | $L_{B46}$ |
| 4360. | $L_{A85}$ | $L_{B46}$ |
| 4361. | $L_{A86}$ | $L_{B46}$ |
| 4362. | $L_{A87}$ | $L_{B46}$ |
| 4363. | $L_{A88}$ | $L_{B46}$ |
| 4364. | $L_{A89}$ | $L_{B46}$ |
| 4365. | $L_{A90}$ | $L_{B46}$ |
| 4366. | $L_{A91}$ | $L_{B46}$ |
| 4367. | $L_{A92}$ | $L_{B46}$ |
| 4368. | $L_{A93}$ | $L_{B46}$ |
| 4369. | $L_{A94}$ | $L_{B46}$ |
| 4370. | $L_{A95}$ | $L_{B46}$ |
| 4371. | $L_{A1}$ | $L_{B47}$ |
| 4372. | $L_{A2}$ | $L_{B47}$ |
| 4373. | $L_{A3}$ | $L_{B47}$ |
| 4374. | $L_{A4}$ | $L_{B47}$ |
| 4375. | $L_{A5}$ | $L_{B47}$ |
| 4376. | $L_{A6}$ | $L_{B47}$ |
| 4377. | $L_{A7}$ | $L_{B47}$ |
| 4378. | $L_{A8}$ | $L_{B47}$ |
| 4379. | $L_{A9}$ | $L_{B47}$ |
| 4380. | $L_{A10}$ | $L_{B47}$ |
| 4381. | $L_{A11}$ | $L_{B47}$ |
| 4382. | $L_{A12}$ | $L_{B47}$ |
| 4383. | $L_{A13}$ | $L_{B47}$ |
| 4384. | $L_{A14}$ | $L_{B47}$ |
| 4385. | $L_{A15}$ | $L_{B47}$ |
| 4386. | $L_{A16}$ | $L_{B47}$ |
| 4387. | $L_{A17}$ | $L_{B47}$ |
| 4388. | $L_{A18}$ | $L_{B47}$ |
| 4389. | $L_{A19}$ | $L_{B47}$ |
| 4390. | $L_{A20}$ | $L_{B47}$ |
| 4391. | $L_{A21}$ | $L_{B47}$ |
| 4392. | $L_{A22}$ | $L_{B47}$ |
| 4393. | $L_{A23}$ | $L_{B47}$ |
| 4394. | $L_{A24}$ | $L_{B47}$ |

TABLE 1-continued

| Cpd # | $L_A$ | $L_B$ |
|---|---|---|
| 4395. | $L_{A25}$ | $L_{B47}$ |
| 4396. | $L_{A26}$ | $L_{B47}$ |
| 4397. | $L_{A27}$ | $L_{B47}$ |
| 4398. | $L_{A28}$ | $L_{B47}$ |
| 4399. | $L_{A29}$ | $L_{B47}$ |
| 4400. | $L_{A30}$ | $L_{B47}$ |
| 4401. | $L_{A31}$ | $L_{B47}$ |
| 4402. | $L_{A32}$ | $L_{B47}$ |
| 4403. | $L_{A33}$ | $L_{B47}$ |
| 4404. | $L_{A34}$ | $L_{B47}$ |
| 4405. | $L_{A35}$ | $L_{B47}$ |
| 4406. | $L_{A36}$ | $L_{B47}$ |
| 4407. | $L_{A37}$ | $L_{B47}$ |
| 4408. | $L_{A38}$ | $L_{B47}$ |
| 4409. | $L_{A39}$ | $L_{B47}$ |
| 4410. | $L_{A40}$ | $L_{B47}$ |
| 4411. | $L_{A41}$ | $L_{B47}$ |
| 4412. | $L_{A42}$ | $L_{B47}$ |
| 4413. | $L_{A43}$ | $L_{B47}$ |
| 4414. | $L_{A44}$ | $L_{B47}$ |
| 4415. | $L_{A45}$ | $L_{B47}$ |
| 4416. | $L_{A46}$ | $L_{B47}$ |
| 4417. | $L_{A47}$ | $L_{B47}$ |
| 4418. | $L_{A48}$ | $L_{B47}$ |
| 4419. | $L_{A49}$ | $L_{B47}$ |
| 4420. | $L_{A50}$ | $L_{B47}$ |
| 4421. | $L_{A51}$ | $L_{B47}$ |
| 4422. | $L_{A52}$ | $L_{B47}$ |
| 4423. | $L_{A53}$ | $L_{B47}$ |
| 4424. | $L_{A54}$ | $L_{B47}$ |
| 4425. | $L_{A55}$ | $L_{B47}$ |
| 4426. | $L_{A56}$ | $L_{B47}$ |
| 4427. | $L_{A57}$ | $L_{B47}$ |
| 4428. | $L_{A58}$ | $L_{B47}$ |
| 4429. | $L_{A59}$ | $L_{B47}$ |
| 4430. | $L_{A60}$ | $L_{B47}$ |
| 4431. | $L_{A61}$ | $L_{B47}$ |
| 4432. | $L_{A62}$ | $L_{B47}$ |
| 4433. | $L_{A63}$ | $L_{B47}$ |
| 4434. | $L_{A64}$ | $L_{B47}$ |
| 4435. | $L_{A65}$ | $L_{B47}$ |
| 4436. | $L_{A66}$ | $L_{B47}$ |
| 4437. | $L_{A67}$ | $L_{B47}$ |
| 4438. | $L_{A68}$ | $L_{B47}$ |
| 4439. | $L_{A69}$ | $L_{B47}$ |
| 4440. | $L_{A70}$ | $L_{B47}$ |
| 4441. | $L_{A71}$ | $L_{B47}$ |
| 4442. | $L_{A72}$ | $L_{B47}$ |
| 4443. | $L_{A73}$ | $L_{B47}$ |
| 4444. | $L_{A74}$ | $L_{B47}$ |
| 4445. | $L_{A75}$ | $L_{B47}$ |
| 4446. | $L_{A76}$ | $L_{B47}$ |
| 4447. | $L_{A77}$ | $L_{B47}$ |
| 4448. | $L_{A78}$ | $L_{B47}$ |
| 4449. | $L_{A79}$ | $L_{B47}$ |
| 4450. | $L_{A80}$ | $L_{B47}$ |
| 4451. | $L_{A81}$ | $L_{B47}$ |
| 4452. | $L_{A82}$ | $L_{B47}$ |
| 4453. | $L_{A83}$ | $L_{B47}$ |
| 4454. | $L_{A84}$ | $L_{B47}$ |
| 4455. | $L_{A85}$ | $L_{B47}$ |
| 4456. | $L_{A86}$ | $L_{B47}$ |
| 4457. | $L_{A87}$ | $L_{B47}$ |
| 4458. | $L_{A88}$ | $L_{B47}$ |
| 4459. | $L_{A89}$ | $L_{B47}$ |
| 4460. | $L_{A90}$ | $L_{B47}$ |
| 4461. | $L_{A91}$ | $L_{B47}$ |
| 4462. | $L_{A92}$ | $L_{B47}$ |
| 4463. | $L_{A93}$ | $L_{B47}$ |
| 4464. | $L_{A94}$ | $L_{B47}$ |
| 4465. | $L_{A95}$ | $L_{B47}$ |
| 4466. | $L_{A1}$ | $L_{B48}$ |
| 4467. | $L_{A2}$ | $L_{B48}$ |
| 4468. | $L_{A3}$ | $L_{B48}$ |
| 4469. | $L_{A4}$ | $L_{B48}$ |
| 4470. | $L_{A5}$ | $L_{B48}$ |
| 4471. | $L_{A6}$ | $L_{B48}$ |
| 4472. | $L_{A7}$ | $L_{B48}$ |

TABLE 1-continued

| Cpd # | $L_A$ | $L_B$ |
|---|---|---|
| 4473. | $L_{A8}$ | $L_{B48}$ |
| 4474. | $L_{A9}$ | $L_{B48}$ |
| 4475. | $L_{A10}$ | $L_{B48}$ |
| 4476. | $L_{A11}$ | $L_{B48}$ |
| 4477. | $L_{A12}$ | $L_{B48}$ |
| 4478. | $L_{A13}$ | $L_{B48}$ |
| 4479. | $L_{A14}$ | $L_{B48}$ |
| 4480. | $L_{A15}$ | $L_{B48}$ |
| 4481. | $L_{A16}$ | $L_{B48}$ |
| 4482. | $L_{A17}$ | $L_{B48}$ |
| 4483. | $L_{A18}$ | $L_{B48}$ |
| 4484. | $L_{A19}$ | $L_{B48}$ |
| 4485. | $L_{A20}$ | $L_{B48}$ |
| 4486. | $L_{A21}$ | $L_{B48}$ |
| 4487. | $L_{A22}$ | $L_{B48}$ |
| 4488. | $L_{A23}$ | $L_{B48}$ |
| 4489. | $L_{A24}$ | $L_{B48}$ |
| 4490. | $L_{A25}$ | $L_{B48}$ |
| 4491. | $L_{A26}$ | $L_{B48}$ |
| 4492. | $L_{A27}$ | $L_{B48}$ |
| 4493. | $L_{A28}$ | $L_{B48}$ |
| 4494. | $L_{A29}$ | $L_{B48}$ |
| 4495. | $L_{A30}$ | $L_{B48}$ |
| 4496. | $L_{A31}$ | $L_{B48}$ |
| 4497. | $L_{A32}$ | $L_{B48}$ |
| 4498. | $L_{A33}$ | $L_{B48}$ |
| 4499. | $L_{A34}$ | $L_{B48}$ |
| 4500. | $L_{A35}$ | $L_{B48}$ |
| 4501. | $L_{A36}$ | $L_{B48}$ |
| 4502. | $L_{A37}$ | $L_{B48}$ |
| 4503. | $L_{A38}$ | $L_{B48}$ |
| 4504. | $L_{A39}$ | $L_{B48}$ |
| 4505. | $L_{A40}$ | $L_{B48}$ |
| 4506. | $L_{A41}$ | $L_{B48}$ |
| 4507. | $L_{A42}$ | $L_{B48}$ |
| 4508. | $L_{A43}$ | $L_{B48}$ |
| 4509. | $L_{A44}$ | $L_{B48}$ |
| 4510. | $L_{A45}$ | $L_{B48}$ |
| 4511. | $L_{A46}$ | $L_{B48}$ |
| 4512. | $L_{A47}$ | $L_{B48}$ |
| 4513. | $L_{A48}$ | $L_{B48}$ |
| 4514. | $L_{A49}$ | $L_{B48}$ |
| 4515. | $L_{A50}$ | $L_{B48}$ |
| 4516. | $L_{A51}$ | $L_{B48}$ |
| 4517. | $L_{A52}$ | $L_{B48}$ |
| 4518. | $L_{A53}$ | $L_{B48}$ |
| 4519. | $L_{A54}$ | $L_{B48}$ |
| 4520. | $L_{A55}$ | $L_{B48}$ |
| 4521. | $L_{A56}$ | $L_{B48}$ |
| 4522. | $L_{A57}$ | $L_{B48}$ |
| 4523. | $L_{A58}$ | $L_{B48}$ |
| 4524. | $L_{A59}$ | $L_{B48}$ |
| 4525. | $L_{A60}$ | $L_{B48}$ |
| 4526. | $L_{A61}$ | $L_{B48}$ |
| 4527. | $L_{A62}$ | $L_{B48}$ |
| 4528. | $L_{A63}$ | $L_{B48}$ |
| 4529. | $L_{A64}$ | $L_{B48}$ |
| 4530. | $L_{A65}$ | $L_{B48}$ |
| 4531. | $L_{A66}$ | $L_{B48}$ |
| 4532. | $L_{A67}$ | $L_{B48}$ |
| 4533. | $L_{A68}$ | $L_{B48}$ |
| 4534. | $L_{A69}$ | $L_{B48}$ |
| 4535. | $L_{A70}$ | $L_{B48}$ |
| 4536. | $L_{A71}$ | $L_{B48}$ |
| 4537. | $L_{A72}$ | $L_{B48}$ |
| 4538. | $L_{A73}$ | $L_{B48}$ |
| 4539. | $L_{A74}$ | $L_{B48}$ |
| 4540. | $L_{A75}$ | $L_{B48}$ |
| 4541. | $L_{A76}$ | $L_{B48}$ |
| 4542. | $L_{A77}$ | $L_{B48}$ |
| 4543. | $L_{A78}$ | $L_{B48}$ |
| 4544. | $L_{A79}$ | $L_{B48}$ |
| 4545. | $L_{A80}$ | $L_{B48}$ |
| 4546. | $L_{A81}$ | $L_{B48}$ |
| 4547. | $L_{A82}$ | $L_{B48}$ |
| 4548. | $L_{A83}$ | $L_{B48}$ |
| 4549. | $L_{A84}$ | $L_{B48}$ |
| 4550. | $L_{A85}$ | $L_{B48}$ |

TABLE 1-continued

| Cpd # | $L_A$ | $L_B$ |
|---|---|---|
| 4551. | $L_{A86}$ | $L_{B48}$ |
| 4552. | $L_{A87}$ | $L_{B48}$ |
| 4553. | $L_{A88}$ | $L_{B48}$ |
| 4554. | $L_{A89}$ | $L_{B48}$ |
| 4555. | $L_{A90}$ | $L_{B48}$ |
| 4556. | $L_{A91}$ | $L_{B48}$ |
| 4557. | $L_{A92}$ | $L_{B48}$ |
| 4558. | $L_{A93}$ | $L_{B48}$ |
| 4559. | $L_{A94}$ | $L_{B48}$ |
| 4560. | $L_{A95}$ | $L_{B48}$ |
| 4561. | $L_{A1}$ | $L_{B49}$ |
| 4562. | $L_{A2}$ | $L_{B49}$ |
| 4563. | $L_{A3}$ | $L_{B49}$ |
| 4564. | $L_{A4}$ | $L_{B49}$ |
| 4565. | $L_{A5}$ | $L_{B49}$ |
| 4566. | $L_{A6}$ | $L_{B49}$ |
| 4567. | $L_{A7}$ | $L_{B49}$ |
| 4568. | $L_{A8}$ | $L_{B49}$ |
| 4569. | $L_{A9}$ | $L_{B49}$ |
| 4570. | $L_{A10}$ | $L_{B49}$ |
| 4571. | $L_{A11}$ | $L_{B49}$ |
| 4572. | $L_{A12}$ | $L_{B49}$ |
| 4573. | $L_{A13}$ | $L_{B49}$ |
| 4574. | $L_{A14}$ | $L_{B49}$ |
| 4575. | $L_{A15}$ | $L_{B49}$ |
| 4576. | $L_{A16}$ | $L_{B49}$ |
| 4577. | $L_{A17}$ | $L_{B49}$ |
| 4578. | $L_{A18}$ | $L_{B49}$ |
| 4579. | $L_{A19}$ | $L_{B49}$ |
| 4580. | $L_{A20}$ | $L_{B49}$ |
| 4581. | $L_{A21}$ | $L_{B49}$ |
| 4582. | $L_{A22}$ | $L_{B49}$ |
| 4583. | $L_{A23}$ | $L_{B49}$ |
| 4584. | $L_{A24}$ | $L_{B49}$ |
| 4585. | $L_{A25}$ | $L_{B49}$ |
| 4586. | $L_{A26}$ | $L_{B49}$ |
| 4587. | $L_{A27}$ | $L_{B49}$ |
| 4588. | $L_{A28}$ | $L_{B49}$ |
| 4589. | $L_{A29}$ | $L_{B49}$ |
| 4590. | $L_{A30}$ | $L_{B49}$ |
| 4591. | $L_{A31}$ | $L_{B49}$ |
| 4592. | $L_{A32}$ | $L_{B49}$ |
| 4593. | $L_{A33}$ | $L_{B49}$ |
| 4594. | $L_{A34}$ | $L_{B49}$ |
| 4595. | $L_{A35}$ | $L_{B49}$ |
| 4596. | $L_{A36}$ | $L_{B49}$ |
| 4597. | $L_{A37}$ | $L_{B49}$ |
| 4598. | $L_{A38}$ | $L_{B49}$ |
| 4599. | $L_{A39}$ | $L_{B49}$ |
| 4600. | $L_{A40}$ | $L_{B49}$ |
| 4601. | $L_{A41}$ | $L_{B49}$ |
| 4602. | $L_{A42}$ | $L_{B49}$ |
| 4603. | $L_{A43}$ | $L_{B49}$ |
| 4604. | $L_{A44}$ | $L_{B49}$ |
| 4605. | $L_{A45}$ | $L_{B49}$ |
| 4606. | $L_{A46}$ | $L_{B49}$ |
| 4607. | $L_{A47}$ | $L_{B49}$ |
| 4608. | $L_{A48}$ | $L_{B49}$ |
| 4609. | $L_{A49}$ | $L_{B49}$ |
| 4610. | $L_{A50}$ | $L_{B49}$ |
| 4611. | $L_{A51}$ | $L_{B49}$ |
| 4612. | $L_{A52}$ | $L_{B49}$ |
| 4613. | $L_{A53}$ | $L_{B49}$ |
| 4614. | $L_{A54}$ | $L_{B49}$ |
| 4615. | $L_{A55}$ | $L_{B49}$ |
| 4616. | $L_{A56}$ | $L_{B49}$ |
| 4617. | $L_{A57}$ | $L_{B49}$ |
| 4618. | $L_{A58}$ | $L_{B49}$ |
| 4619. | $L_{A59}$ | $L_{B49}$ |
| 4620. | $L_{A60}$ | $L_{B49}$ |
| 4621. | $L_{A61}$ | $L_{B49}$ |
| 4622. | $L_{A62}$ | $L_{B49}$ |
| 4623. | $L_{A63}$ | $L_{B49}$ |
| 4624. | $L_{A64}$ | $L_{B49}$ |
| 4625. | $L_{A65}$ | $L_{B49}$ |
| 4626. | $L_{A66}$ | $L_{B49}$ |
| 4627. | $L_{A67}$ | $L_{B49}$ |
| 4628. | $L_{A68}$ | $L_{B49}$ |

TABLE 1-continued

| Cpd # | $L_A$ | $L_B$ |
|---|---|---|
| 4629. | $L_{A69}$ | $L_{B49}$ |
| 4630. | $L_{A70}$ | $L_{B49}$ |
| 4631. | $L_{A71}$ | $L_{B49}$ |
| 4632. | $L_{A72}$ | $L_{B49}$ |
| 4633. | $L_{A73}$ | $L_{B49}$ |
| 4634. | $L_{A74}$ | $L_{B49}$ |
| 4635. | $L_{A75}$ | $L_{B49}$ |
| 4636. | $L_{A76}$ | $L_{B49}$ |
| 4637. | $L_{A77}$ | $L_{B49}$ |
| 4638. | $L_{A78}$ | $L_{B49}$ |
| 4639. | $L_{A79}$ | $L_{B49}$ |
| 4640. | $L_{A80}$ | $L_{B49}$ |
| 4641. | $L_{A81}$ | $L_{B49}$ |
| 4642. | $L_{A82}$ | $L_{B49}$ |
| 4643. | $L_{A83}$ | $L_{B49}$ |
| 4644. | $L_{A84}$ | $L_{B49}$ |
| 4645. | $L_{A85}$ | $L_{B49}$ |
| 4646. | $L_{A86}$ | $L_{B49}$ |
| 4647. | $L_{A87}$ | $L_{B49}$ |
| 4648. | $L_{A88}$ | $L_{B49}$ |
| 4649. | $L_{A89}$ | $L_{B49}$ |
| 4650. | $L_{A90}$ | $L_{B49}$ |
| 4651. | $L_{A91}$ | $L_{B49}$ |
| 4652. | $L_{A92}$ | $L_{B49}$ |
| 4653. | $L_{A93}$ | $L_{B49}$ |
| 4654. | $L_{A94}$ | $L_{B49}$ |
| 4655. | $L_{A95}$ | $L_{B49}$ |
| 4656. | $L_{A1}$ | $L_{B50}$ |
| 4657. | $L_{A2}$ | $L_{B50}$ |
| 4658. | $L_{A3}$ | $L_{B50}$ |
| 4659. | $L_{A4}$ | $L_{B50}$ |
| 4660. | $L_{A5}$ | $L_{B50}$ |
| 4661. | $L_{A6}$ | $L_{B50}$ |
| 4662. | $L_{A7}$ | $L_{B50}$ |
| 4663. | $L_{A8}$ | $L_{B50}$ |
| 4664. | $L_{A9}$ | $L_{B50}$ |
| 4665. | $L_{A10}$ | $L_{B50}$ |
| 4666. | $L_{A11}$ | $L_{B50}$ |
| 4667. | $L_{A12}$ | $L_{B50}$ |
| 4668. | $L_{A13}$ | $L_{B50}$ |
| 4669. | $L_{A14}$ | $L_{B50}$ |
| 4670. | $L_{A15}$ | $L_{B50}$ |
| 4671. | $L_{A16}$ | $L_{B50}$ |
| 4672. | $L_{A17}$ | $L_{B50}$ |
| 4673. | $L_{A18}$ | $L_{B50}$ |
| 4674. | $L_{A19}$ | $L_{B50}$ |
| 4675. | $L_{A20}$ | $L_{B50}$ |
| 4676. | $L_{A21}$ | $L_{B50}$ |
| 4677. | $L_{A22}$ | $L_{B50}$ |
| 4678. | $L_{A23}$ | $L_{B50}$ |
| 4679. | $L_{A24}$ | $L_{B50}$ |
| 4680. | $L_{A25}$ | $L_{B50}$ |
| 4681. | $L_{A26}$ | $L_{B50}$ |
| 4682. | $L_{A27}$ | $L_{B50}$ |
| 4683. | $L_{A28}$ | $L_{B50}$ |
| 4684. | $L_{A29}$ | $L_{B50}$ |
| 4685. | $L_{A30}$ | $L_{B50}$ |
| 4686. | $L_{A31}$ | $L_{B50}$ |
| 4687. | $L_{A32}$ | $L_{B50}$ |
| 4688. | $L_{A33}$ | $L_{B50}$ |
| 4689. | $L_{A34}$ | $L_{B50}$ |
| 4690. | $L_{A35}$ | $L_{B50}$ |
| 4691. | $L_{A36}$ | $L_{B50}$ |
| 4692. | $L_{A37}$ | $L_{B50}$ |
| 4693. | $L_{A38}$ | $L_{B50}$ |
| 4694. | $L_{A39}$ | $L_{B50}$ |
| 4695. | $L_{A40}$ | $L_{B50}$ |
| 4696. | $L_{A41}$ | $L_{B50}$ |
| 4697. | $L_{A42}$ | $L_{B50}$ |
| 4698. | $L_{A43}$ | $L_{B50}$ |
| 4699. | $L_{A44}$ | $L_{B50}$ |
| 4700. | $L_{A45}$ | $L_{B50}$ |
| 4701. | $L_{A46}$ | $L_{B50}$ |
| 4702. | $L_{A47}$ | $L_{B50}$ |
| 4703. | $L_{A48}$ | $L_{B50}$ |
| 4704. | $L_{A49}$ | $L_{B50}$ |
| 4705. | $L_{A50}$ | $L_{B50}$ |
| 4706. | $L_{A51}$ | $L_{B50}$ |
| 4707. | $L_{A52}$ | $L_{B50}$ |
| 4708. | $L_{A53}$ | $L_{B50}$ |
| 4709. | $L_{A54}$ | $L_{B50}$ |
| 4710. | $L_{A55}$ | $L_{B50}$ |
| 4711. | $L_{A56}$ | $L_{B50}$ |
| 4712. | $L_{A57}$ | $L_{B50}$ |
| 4713. | $L_{A58}$ | $L_{B50}$ |
| 4714. | $L_{A59}$ | $L_{B50}$ |
| 4715. | $L_{A60}$ | $L_{B50}$ |
| 4716. | $L_{A61}$ | $L_{B50}$ |
| 4717. | $L_{A62}$ | $L_{B50}$ |
| 4718. | $L_{A63}$ | $L_{B50}$ |
| 4719. | $L_{A64}$ | $L_{B50}$ |
| 4720. | $L_{A65}$ | $L_{B50}$ |
| 4721. | $L_{A66}$ | $L_{B50}$ |
| 4722. | $L_{A67}$ | $L_{B50}$ |
| 4723. | $L_{A68}$ | $L_{B50}$ |
| 4724. | $L_{A69}$ | $L_{B50}$ |
| 4725. | $L_{A70}$ | $L_{B50}$ |
| 4726. | $L_{A71}$ | $L_{B50}$ |
| 4727. | $L_{A72}$ | $L_{B50}$ |
| 4728. | $L_{A73}$ | $L_{B50}$ |
| 4729. | $L_{A74}$ | $L_{B50}$ |
| 4730. | $L_{A75}$ | $L_{B50}$ |
| 4731. | $L_{A76}$ | $L_{B50}$ |
| 4732. | $L_{A77}$ | $L_{B50}$ |
| 4733. | $L_{A78}$ | $L_{B50}$ |
| 4734. | $L_{A79}$ | $L_{B50}$ |
| 4735. | $L_{A80}$ | $L_{B50}$ |
| 4736. | $L_{A81}$ | $L_{B50}$ |
| 4737. | $L_{A82}$ | $L_{B50}$ |
| 4738. | $L_{A83}$ | $L_{B50}$ |
| 4739. | $L_{A84}$ | $L_{B50}$ |
| 4740. | $L_{A85}$ | $L_{B50}$ |
| 4741. | $L_{A86}$ | $L_{B50}$ |
| 4742. | $L_{A87}$ | $L_{B50}$ |
| 4743. | $L_{A88}$ | $L_{B50}$ |
| 4744. | $L_{A89}$ | $L_{B50}$ |
| 4745. | $L_{A90}$ | $L_{B50}$ |
| 4746. | $L_{A91}$ | $L_{B50}$ |
| 4747. | $L_{A92}$ | $L_{B50}$ |
| 4748. | $L_{A93}$ | $L_{B50}$ |
| 4749. | $L_{A94}$ | $L_{B50}$ |
| 4750. | $L_{A95}$ | $L_{B50}$ |
| 4751. | $L_{A1}$ | $L_{B51}$ |
| 4752. | $L_{A2}$ | $L_{B51}$ |
| 4753. | $L_{A3}$ | $L_{B51}$ |
| 4754. | $L_{A4}$ | $L_{B51}$ |
| 4755. | $L_{A5}$ | $L_{B51}$ |
| 4756. | $L_{A6}$ | $L_{B51}$ |
| 4757. | $L_{A7}$ | $L_{B51}$ |
| 4758. | $L_{A8}$ | $L_{B51}$ |
| 4759. | $L_{A9}$ | $L_{B51}$ |
| 4760. | $L_{A10}$ | $L_{B51}$ |
| 4761. | $L_{A11}$ | $L_{B51}$ |
| 4762. | $L_{A12}$ | $L_{B51}$ |
| 4763. | $L_{A13}$ | $L_{B51}$ |
| 4764. | $L_{A14}$ | $L_{B51}$ |
| 4765. | $L_{A15}$ | $L_{B51}$ |
| 4766. | $L_{A16}$ | $L_{B51}$ |
| 4767. | $L_{A17}$ | $L_{B51}$ |
| 4768. | $L_{A18}$ | $L_{B51}$ |
| 4769. | $L_{A19}$ | $L_{B51}$ |
| 4770. | $L_{A20}$ | $L_{B51}$ |
| 4771. | $L_{A21}$ | $L_{B51}$ |
| 4772. | $L_{A22}$ | $L_{B51}$ |
| 4773. | $L_{A23}$ | $L_{B51}$ |
| 4774. | $L_{A24}$ | $L_{B51}$ |
| 4775. | $L_{A25}$ | $L_{B51}$ |
| 4776. | $L_{A26}$ | $L_{B51}$ |
| 4777. | $L_{A27}$ | $L_{B51}$ |
| 4778. | $L_{A28}$ | $L_{B51}$ |
| 4779. | $L_{A29}$ | $L_{B51}$ |
| 4780. | $L_{A30}$ | $L_{B51}$ |
| 4781. | $L_{A31}$ | $L_{B51}$ |
| 4782. | $L_{A32}$ | $L_{B51}$ |
| 4783. | $L_{A33}$ | $L_{B51}$ |
| 4784. | $L_{A34}$ | $L_{B51}$ |

TABLE 1-continued

| Cpd # | $L_A$ | $L_B$ |
|---|---|---|
| 4785. | $L_{A35}$ | $L_{B51}$ |
| 4786. | $L_{A36}$ | $L_{B51}$ |
| 4787. | $L_{A37}$ | $L_{B51}$ |
| 4788. | $L_{A38}$ | $L_{B51}$ |
| 4789. | $L_{A39}$ | $L_{B51}$ |
| 4790. | $L_{A40}$ | $L_{B51}$ |
| 4791. | $L_{A41}$ | $L_{B51}$ |
| 4792. | $L_{A42}$ | $L_{B51}$ |
| 4793. | $L_{A43}$ | $L_{B51}$ |
| 4794. | $L_{A44}$ | $L_{B51}$ |
| 4795. | $L_{A45}$ | $L_{B51}$ |
| 4796. | $L_{A46}$ | $L_{B51}$ |
| 4797. | $L_{A47}$ | $L_{B51}$ |
| 4798. | $L_{A48}$ | $L_{B51}$ |
| 4799. | $L_{A49}$ | $L_{B51}$ |
| 4800. | $L_{A50}$ | $L_{B51}$ |
| 4801. | $L_{A51}$ | $L_{B51}$ |
| 4802. | $L_{A52}$ | $L_{B51}$ |
| 4803. | $L_{A53}$ | $L_{B51}$ |
| 4804. | $L_{A54}$ | $L_{B51}$ |
| 4805. | $L_{A55}$ | $L_{B51}$ |
| 4806. | $L_{A56}$ | $L_{B51}$ |
| 4807. | $L_{A57}$ | $L_{B51}$ |
| 4808. | $L_{A58}$ | $L_{B51}$ |
| 4809. | $L_{A59}$ | $L_{B51}$ |
| 4810. | $L_{A60}$ | $L_{B51}$ |
| 4811. | $L_{A61}$ | $L_{B51}$ |
| 4812. | $L_{A62}$ | $L_{B51}$ |
| 4813. | $L_{A63}$ | $L_{B51}$ |
| 4814. | $L_{A64}$ | $L_{B51}$ |
| 4815. | $L_{A65}$ | $L_{B51}$ |
| 4816. | $L_{A66}$ | $L_{B51}$ |
| 4817. | $L_{A67}$ | $L_{B51}$ |
| 4818. | $L_{A68}$ | $L_{B51}$ |
| 4819. | $L_{A69}$ | $L_{B51}$ |
| 4820. | $L_{A70}$ | $L_{B51}$ |
| 4821. | $L_{A71}$ | $L_{B51}$ |
| 4822. | $L_{A72}$ | $L_{B51}$ |
| 4823. | $L_{A73}$ | $L_{B51}$ |
| 4824. | $L_{A74}$ | $L_{B51}$ |
| 4825. | $L_{A75}$ | $L_{B51}$ |
| 4826. | $L_{A76}$ | $L_{B51}$ |
| 4827. | $L_{A77}$ | $L_{B51}$ |
| 4828. | $L_{A78}$ | $L_{B51}$ |
| 4829. | $L_{A79}$ | $L_{B51}$ |
| 4830. | $L_{A80}$ | $L_{B51}$ |
| 4831. | $L_{A81}$ | $L_{B51}$ |
| 4832. | $L_{A82}$ | $L_{B51}$ |
| 4833. | $L_{A83}$ | $L_{B51}$ |
| 4834. | $L_{A84}$ | $L_{B51}$ |
| 4835. | $L_{A85}$ | $L_{B51}$ |
| 4836. | $L_{A86}$ | $L_{B51}$ |
| 4837. | $L_{A87}$ | $L_{B51}$ |
| 4838. | $L_{A88}$ | $L_{B51}$ |
| 4839. | $L_{A89}$ | $L_{B51}$ |
| 4840. | $L_{A90}$ | $L_{B51}$ |
| 4841. | $L_{A91}$ | $L_{B51}$ |
| 4842. | $L_{A92}$ | $L_{B51}$ |
| 4843. | $L_{A93}$ | $L_{B51}$ |
| 4844. | $L_{A94}$ | $L_{B51}$ |
| 4845. | $L_{A95}$ | $L_{B51}$ |
| 4846. | $L_{A1}$ | $L_{B52}$ |
| 4847. | $L_{A2}$ | $L_{B52}$ |
| 4848. | $L_{A3}$ | $L_{B52}$ |
| 4849. | $L_{A4}$ | $L_{B52}$ |
| 4850. | $L_{A5}$ | $L_{B52}$ |
| 4851. | $L_{A6}$ | $L_{B52}$ |
| 4852. | $L_{A7}$ | $L_{B52}$ |
| 4853. | $L_{A8}$ | $L_{B52}$ |
| 4854. | $L_{A9}$ | $L_{B52}$ |
| 4855. | $L_{A10}$ | $L_{B52}$ |
| 4856. | $L_{A11}$ | $L_{B52}$ |
| 4857. | $L_{A12}$ | $L_{B52}$ |
| 4858. | $L_{A13}$ | $L_{B52}$ |
| 4859. | $L_{A14}$ | $L_{B52}$ |
| 4860. | $L_{A15}$ | $L_{B52}$ |
| 4861. | $L_{A16}$ | $L_{B52}$ |
| 4862. | $L_{A17}$ | $L_{B52}$ |

TABLE 1-continued

| Cpd # | $L_A$ | $L_B$ |
|---|---|---|
| 4863. | $L_{A18}$ | $L_{B52}$ |
| 4864. | $L_{A19}$ | $L_{B52}$ |
| 4865. | $L_{A20}$ | $L_{B52}$ |
| 4866. | $L_{A21}$ | $L_{B52}$ |
| 4867. | $L_{A22}$ | $L_{B52}$ |
| 4868. | $L_{A23}$ | $L_{B52}$ |
| 4869. | $L_{A24}$ | $L_{B52}$ |
| 4870. | $L_{A25}$ | $L_{B52}$ |
| 4871. | $L_{A26}$ | $L_{B52}$ |
| 4872. | $L_{A27}$ | $L_{B52}$ |
| 4873. | $L_{A28}$ | $L_{B52}$ |
| 4874. | $L_{A29}$ | $L_{B52}$ |
| 4875. | $L_{A30}$ | $L_{B52}$ |
| 4876. | $L_{A31}$ | $L_{B52}$ |
| 4877. | $L_{A32}$ | $L_{B52}$ |
| 4878. | $L_{A33}$ | $L_{B52}$ |
| 4879. | $L_{A34}$ | $L_{B52}$ |
| 4880. | $L_{A35}$ | $L_{B52}$ |
| 4881. | $L_{A36}$ | $L_{B52}$ |
| 4882. | $L_{A37}$ | $L_{B52}$ |
| 4883. | $L_{A38}$ | $L_{B52}$ |
| 4884. | $L_{A39}$ | $L_{B52}$ |
| 4885. | $L_{A40}$ | $L_{B52}$ |
| 4886. | $L_{A41}$ | $L_{B52}$ |
| 4887. | $L_{A42}$ | $L_{B52}$ |
| 4888. | $L_{A43}$ | $L_{B52}$ |
| 4889. | $L_{A44}$ | $L_{B52}$ |
| 4890. | $L_{A45}$ | $L_{B52}$ |
| 4891. | $L_{A46}$ | $L_{B52}$ |
| 4892. | $L_{A47}$ | $L_{B52}$ |
| 4893. | $L_{A48}$ | $L_{B52}$ |
| 4894. | $L_{A49}$ | $L_{B52}$ |
| 4895. | $L_{A50}$ | $L_{B52}$ |
| 4896. | $L_{A51}$ | $L_{B52}$ |
| 4897. | $L_{A52}$ | $L_{B52}$ |
| 4898. | $L_{A53}$ | $L_{B52}$ |
| 4899. | $L_{A54}$ | $L_{B52}$ |
| 4900. | $L_{A55}$ | $L_{B52}$ |
| 4901. | $L_{A56}$ | $L_{B52}$ |
| 4902. | $L_{A57}$ | $L_{B52}$ |
| 4903. | $L_{A58}$ | $L_{B52}$ |
| 4904. | $L_{A59}$ | $L_{B52}$ |
| 4905. | $L_{A60}$ | $L_{B52}$ |
| 4906. | $L_{A61}$ | $L_{B52}$ |
| 4907. | $L_{A62}$ | $L_{B52}$ |
| 4908. | $L_{A63}$ | $L_{B52}$ |
| 4909. | $L_{A64}$ | $L_{B52}$ |
| 4910. | $L_{A65}$ | $L_{B52}$ |
| 4911. | $L_{A66}$ | $L_{B52}$ |
| 4912. | $L_{A67}$ | $L_{B52}$ |
| 4913. | $L_{A68}$ | $L_{B52}$ |
| 4914. | $L_{A69}$ | $L_{B52}$ |
| 4915. | $L_{A70}$ | $L_{B52}$ |
| 4916. | $L_{A71}$ | $L_{B52}$ |
| 4917. | $L_{A72}$ | $L_{B52}$ |
| 4918. | $L_{A73}$ | $L_{B52}$ |
| 4919. | $L_{A74}$ | $L_{B52}$ |
| 4920. | $L_{A75}$ | $L_{B52}$ |
| 4921. | $L_{A76}$ | $L_{B52}$ |
| 4922. | $L_{A77}$ | $L_{B52}$ |
| 4923. | $L_{A78}$ | $L_{B52}$ |
| 4924. | $L_{A79}$ | $L_{B52}$ |
| 4925. | $L_{A80}$ | $L_{B52}$ |
| 4926. | $L_{A81}$ | $L_{B52}$ |
| 4927. | $L_{A82}$ | $L_{B52}$ |
| 4928. | $L_{A83}$ | $L_{B52}$ |
| 4929. | $L_{A84}$ | $L_{B52}$ |
| 4930. | $L_{A85}$ | $L_{B52}$ |
| 4931. | $L_{A86}$ | $L_{B52}$ |
| 4932. | $L_{A87}$ | $L_{B52}$ |
| 4933. | $L_{A88}$ | $L_{B52}$ |
| 4934. | $L_{A89}$ | $L_{B52}$ |
| 4935. | $L_{A90}$ | $L_{B52}$ |
| 4936. | $L_{A91}$ | $L_{B52}$ |
| 4937. | $L_{A92}$ | $L_{B52}$ |
| 4938. | $L_{A93}$ | $L_{B52}$ |
| 4939. | $L_{A94}$ | $L_{B52}$ |
| 4940. | $L_{A95}$ | $L_{B52}$ |

TABLE 1-continued

| Cpd # | $L_A$ | $L_B$ |
|---|---|---|
| 4941. | $L_{A1}$ | $L_{B53}$ |
| 4942. | $L_{A2}$ | $L_{B53}$ |
| 4943. | $L_{A3}$ | $L_{B53}$ |
| 4944. | $L_{A4}$ | $L_{B53}$ |
| 4945. | $L_{A5}$ | $L_{B53}$ |
| 4946. | $L_{A6}$ | $L_{B53}$ |
| 4947. | $L_{A7}$ | $L_{B53}$ |
| 4948. | $L_{A8}$ | $L_{B53}$ |
| 4949. | $L_{A9}$ | $L_{B53}$ |
| 4950. | $L_{A10}$ | $L_{B53}$ |
| 4951. | $L_{A11}$ | $L_{B53}$ |
| 4952. | $L_{A12}$ | $L_{B53}$ |
| 4953. | $L_{A13}$ | $L_{B53}$ |
| 4954. | $L_{A14}$ | $L_{B53}$ |
| 4955. | $L_{A15}$ | $L_{B53}$ |
| 4956. | $L_{A16}$ | $L_{B53}$ |
| 4957. | $L_{A17}$ | $L_{B53}$ |
| 4958. | $L_{A18}$ | $L_{B53}$ |
| 4959. | $L_{A19}$ | $L_{B53}$ |
| 4960. | $L_{A20}$ | $L_{B53}$ |
| 4961. | $L_{A21}$ | $L_{B53}$ |
| 4962. | $L_{A22}$ | $L_{B53}$ |
| 4963. | $L_{A23}$ | $L_{B53}$ |
| 4964. | $L_{A24}$ | $L_{B53}$ |
| 4965. | $L_{A25}$ | $L_{B53}$ |
| 4966. | $L_{A26}$ | $L_{B53}$ |
| 4967. | $L_{A27}$ | $L_{B53}$ |
| 4968. | $L_{A28}$ | $L_{B53}$ |
| 4969. | $L_{A29}$ | $L_{B53}$ |
| 4970. | $L_{A30}$ | $L_{B53}$ |
| 4971. | $L_{A31}$ | $L_{B53}$ |
| 4972. | $L_{A32}$ | $L_{B53}$ |
| 4973. | $L_{A33}$ | $L_{B53}$ |
| 4974. | $L_{A34}$ | $L_{B53}$ |
| 4975. | $L_{A35}$ | $L_{B53}$ |
| 4976. | $L_{A36}$ | $L_{B53}$ |
| 4977. | $L_{A37}$ | $L_{B53}$ |
| 4978. | $L_{A38}$ | $L_{B53}$ |
| 4979. | $L_{A39}$ | $L_{B53}$ |
| 4980. | $L_{A40}$ | $L_{B53}$ |
| 4981. | $L_{A41}$ | $L_{B53}$ |
| 4982. | $L_{A42}$ | $L_{B53}$ |
| 4983. | $L_{A43}$ | $L_{B53}$ |
| 4984. | $L_{A44}$ | $L_{B53}$ |
| 4985. | $L_{A45}$ | $L_{B53}$ |
| 4986. | $L_{A46}$ | $L_{B53}$ |
| 4987. | $L_{A47}$ | $L_{B53}$ |
| 4988. | $L_{A48}$ | $L_{B53}$ |
| 4989. | $L_{A49}$ | $L_{B53}$ |
| 4990. | $L_{A50}$ | $L_{B53}$ |
| 4991. | $L_{A51}$ | $L_{B53}$ |
| 4992. | $L_{A52}$ | $L_{B53}$ |
| 4993. | $L_{A53}$ | $L_{B53}$ |
| 4994. | $L_{A54}$ | $L_{B53}$ |
| 4995. | $L_{A55}$ | $L_{B53}$ |
| 4996. | $L_{A56}$ | $L_{B53}$ |
| 4997. | $L_{A57}$ | $L_{B53}$ |
| 4998. | $L_{A58}$ | $L_{B53}$ |
| 4999. | $L_{A59}$ | $L_{B53}$ |
| 5000. | $L_{A60}$ | $L_{B53}$ |
| 5001. | $L_{A61}$ | $L_{B53}$ |
| 5002. | $L_{A62}$ | $L_{B53}$ |
| 5003. | $L_{A63}$ | $L_{B53}$ |
| 5004. | $L_{A64}$ | $L_{B53}$ |
| 5005. | $L_{A65}$ | $L_{B53}$ |
| 5006. | $L_{A66}$ | $L_{B53}$ |
| 5007. | $L_{A67}$ | $L_{B53}$ |
| 5008. | $L_{A68}$ | $L_{B53}$ |
| 5009. | $L_{A69}$ | $L_{B53}$ |
| 5010. | $L_{A70}$ | $L_{B53}$ |
| 5011. | $L_{A71}$ | $L_{B53}$ |
| 5012. | $L_{A72}$ | $L_{B53}$ |
| 5013. | $L_{A73}$ | $L_{B53}$ |
| 5014. | $L_{A74}$ | $L_{B53}$ |
| 5015. | $L_{A75}$ | $L_{B53}$ |
| 5016. | $L_{A76}$ | $L_{B53}$ |
| 5017. | $L_{A77}$ | $L_{B53}$ |
| 5018. | $L_{A78}$ | $L_{B53}$ |
| 5019. | $L_{A79}$ | $L_{B53}$ |
| 5020. | $L_{A80}$ | $L_{B53}$ |
| 5021. | $L_{A81}$ | $L_{B53}$ |
| 5022. | $L_{A82}$ | $L_{B53}$ |
| 5023. | $L_{A83}$ | $L_{B53}$ |
| 5024. | $L_{A84}$ | $L_{B53}$ |
| 5025. | $L_{A85}$ | $L_{B53}$ |
| 5026. | $L_{A86}$ | $L_{B53}$ |
| 5027. | $L_{A87}$ | $L_{B53}$ |
| 5028. | $L_{A88}$ | $L_{B53}$ |
| 5029. | $L_{A89}$ | $L_{B53}$ |
| 5030. | $L_{A90}$ | $L_{B53}$ |
| 5031. | $L_{A91}$ | $L_{B53}$ |
| 5032. | $L_{A92}$ | $L_{B53}$ |
| 5033. | $L_{A93}$ | $L_{B53}$ |
| 5034. | $L_{A94}$ | $L_{B53}$ |
| 5035. | $L_{A95}$ | $L_{B53}$ |
| 5036. | $L_{A1}$ | $L_{B54}$ |
| 5037. | $L_{A2}$ | $L_{B54}$ |
| 5038. | $L_{A3}$ | $L_{B54}$ |
| 5039. | $L_{A4}$ | $L_{B54}$ |
| 5040. | $L_{A5}$ | $L_{B54}$ |
| 5041. | $L_{A6}$ | $L_{B54}$ |
| 5042. | $L_{A7}$ | $L_{B54}$ |
| 5043. | $L_{A8}$ | $L_{B54}$ |
| 5044. | $L_{A9}$ | $L_{B54}$ |
| 5045. | $L_{A10}$ | $L_{B54}$ |
| 5046. | $L_{A11}$ | $L_{B54}$ |
| 5047. | $L_{A12}$ | $L_{B54}$ |
| 5048. | $L_{A13}$ | $L_{B54}$ |
| 5049. | $L_{A14}$ | $L_{B54}$ |
| 5050. | $L_{A15}$ | $L_{B54}$ |
| 5051. | $L_{A16}$ | $L_{B54}$ |
| 5052. | $L_{A17}$ | $L_{B54}$ |
| 5053. | $L_{A18}$ | $L_{B54}$ |
| 5054. | $L_{A19}$ | $L_{B54}$ |
| 5055. | $L_{A20}$ | $L_{B54}$ |
| 5056. | $L_{A21}$ | $L_{B54}$ |
| 5057. | $L_{A22}$ | $L_{B54}$ |
| 5058. | $L_{A23}$ | $L_{B54}$ |
| 5059. | $L_{A24}$ | $L_{B54}$ |
| 5060. | $L_{A25}$ | $L_{B54}$ |
| 5061. | $L_{A26}$ | $L_{B54}$ |
| 5062. | $L_{A27}$ | $L_{B54}$ |
| 5063. | $L_{A28}$ | $L_{B54}$ |
| 5064. | $L_{A29}$ | $L_{B54}$ |
| 5065. | $L_{A30}$ | $L_{B54}$ |
| 5066. | $L_{A31}$ | $L_{B54}$ |
| 5067. | $L_{A32}$ | $L_{B54}$ |
| 5068. | $L_{A33}$ | $L_{B54}$ |
| 5069. | $L_{A34}$ | $L_{B54}$ |
| 5070. | $L_{A35}$ | $L_{B54}$ |
| 5071. | $L_{A36}$ | $L_{B54}$ |
| 5072. | $L_{A37}$ | $L_{B54}$ |
| 5073. | $L_{A38}$ | $L_{B54}$ |
| 5074. | $L_{A39}$ | $L_{B54}$ |
| 5075. | $L_{A40}$ | $L_{B54}$ |
| 5076. | $L_{A41}$ | $L_{B54}$ |
| 5077. | $L_{A42}$ | $L_{B54}$ |
| 5078. | $L_{A43}$ | $L_{B54}$ |
| 5079. | $L_{A44}$ | $L_{B54}$ |
| 5080. | $L_{A45}$ | $L_{B54}$ |
| 5081. | $L_{A46}$ | $L_{B54}$ |
| 5082. | $L_{A47}$ | $L_{B54}$ |
| 5083. | $L_{A48}$ | $L_{B54}$ |
| 5084. | $L_{A49}$ | $L_{B54}$ |
| 5085. | $L_{A50}$ | $L_{B54}$ |
| 5086. | $L_{A51}$ | $L_{B54}$ |
| 5087. | $L_{A52}$ | $L_{B54}$ |
| 5088. | $L_{A53}$ | $L_{B54}$ |
| 5089. | $L_{A54}$ | $L_{B54}$ |
| 5090. | $L_{A55}$ | $L_{B54}$ |
| 5091. | $L_{A56}$ | $L_{B54}$ |
| 5092. | $L_{A57}$ | $L_{B54}$ |
| 5093. | $L_{A58}$ | $L_{B54}$ |
| 5094. | $L_{A59}$ | $L_{B54}$ |
| 5095. | $L_{A60}$ | $L_{B54}$ |
| 5096. | $L_{A61}$ | $L_{B54}$ |

TABLE 1-continued

| Cpd # | $L_A$ | $L_B$ |
|---|---|---|
| 5097. | $L_{A62}$ | $L_{B54}$ |
| 5098. | $L_{A63}$ | $L_{B54}$ |
| 5099. | $L_{A64}$ | $L_{B54}$ |
| 5100. | $L_{A65}$ | $L_{B54}$ |
| 5101. | $L_{A66}$ | $L_{B54}$ |
| 5102. | $L_{A67}$ | $L_{B54}$ |
| 5103. | $L_{A68}$ | $L_{B54}$ |
| 5104. | $L_{A69}$ | $L_{B54}$ |
| 5105. | $L_{A70}$ | $L_{B54}$ |
| 5106. | $L_{A71}$ | $L_{B54}$ |
| 5107. | $L_{A72}$ | $L_{B54}$ |
| 5108. | $L_{A73}$ | $L_{B54}$ |
| 5109. | $L_{A74}$ | $L_{B54}$ |
| 5110. | $L_{A75}$ | $L_{B54}$ |
| 5111. | $L_{A76}$ | $L_{B54}$ |
| 5112. | $L_{A77}$ | $L_{B54}$ |
| 5113. | $L_{A78}$ | $L_{B54}$ |
| 5114. | $L_{A79}$ | $L_{B54}$ |
| 5115. | $L_{A80}$ | $L_{B54}$ |
| 5116. | $L_{A81}$ | $L_{B54}$ |
| 5117. | $L_{A82}$ | $L_{B54}$ |
| 5118. | $L_{A83}$ | $L_{B54}$ |
| 5119. | $L_{A84}$ | $L_{B54}$ |
| 5120. | $L_{A85}$ | $L_{B54}$ |
| 5121. | $L_{A86}$ | $L_{B54}$ |
| 5122. | $L_{A87}$ | $L_{B54}$ |
| 5123. | $L_{A88}$ | $L_{B54}$ |
| 5124. | $L_{A89}$ | $L_{B54}$ |
| 5125. | $L_{A90}$ | $L_{B54}$ |
| 5126. | $L_{A91}$ | $L_{B54}$ |
| 5127. | $L_{A92}$ | $L_{B54}$ |
| 5128. | $L_{A93}$ | $L_{B54}$ |
| 5129. | $L_{A94}$ | $L_{B54}$ |
| 5130. | $L_{A95}$ | $L_{B54}$ |
| 5131. | $L_{A1}$ | $L_{B55}$ |
| 5132. | $L_{A2}$ | $L_{B55}$ |
| 5133. | $L_{A3}$ | $L_{B55}$ |
| 5134. | $L_{A4}$ | $L_{B55}$ |
| 5135. | $L_{A5}$ | $L_{B55}$ |
| 5136. | $L_{A6}$ | $L_{B55}$ |
| 5137. | $L_{A7}$ | $L_{B55}$ |
| 5138. | $L_{A8}$ | $L_{B55}$ |
| 5139. | $L_{A9}$ | $L_{B55}$ |
| 5140. | $L_{A10}$ | $L_{B55}$ |
| 5141. | $L_{A11}$ | $L_{B55}$ |
| 5142. | $L_{A12}$ | $L_{B55}$ |
| 5143. | $L_{A13}$ | $L_{B55}$ |
| 5144. | $L_{A14}$ | $L_{B55}$ |
| 5145. | $L_{A15}$ | $L_{B55}$ |
| 5146. | $L_{A16}$ | $L_{B55}$ |
| 5147. | $L_{A17}$ | $L_{B55}$ |
| 5148. | $L_{A18}$ | $L_{B55}$ |
| 5149. | $L_{A19}$ | $L_{B55}$ |
| 5150. | $L_{A20}$ | $L_{B55}$ |
| 5151. | $L_{A21}$ | $L_{B55}$ |
| 5152. | $L_{A22}$ | $L_{B55}$ |
| 5153. | $L_{A23}$ | $L_{B55}$ |
| 5154. | $L_{A24}$ | $L_{B55}$ |
| 5155. | $L_{A25}$ | $L_{B55}$ |
| 5156. | $L_{A26}$ | $L_{B55}$ |
| 5157. | $L_{A27}$ | $L_{B55}$ |
| 5158. | $L_{A28}$ | $L_{B55}$ |
| 5159. | $L_{A29}$ | $L_{B55}$ |
| 5160. | $L_{A30}$ | $L_{B55}$ |
| 5161. | $L_{A31}$ | $L_{B55}$ |
| 5162. | $L_{A32}$ | $L_{B55}$ |
| 5163. | $L_{A33}$ | $L_{B55}$ |
| 5164. | $L_{A34}$ | $L_{B55}$ |
| 5165. | $L_{A35}$ | $L_{B55}$ |
| 5166. | $L_{A36}$ | $L_{B55}$ |
| 5167. | $L_{A37}$ | $L_{B55}$ |
| 5168. | $L_{A38}$ | $L_{B55}$ |
| 5169. | $L_{A39}$ | $L_{B55}$ |
| 5170. | $L_{A40}$ | $L_{B55}$ |
| 5171. | $L_{A41}$ | $L_{B55}$ |
| 5172. | $L_{A42}$ | $L_{B55}$ |
| 5173. | $L_{A43}$ | $L_{B55}$ |
| 5174. | $L_{A44}$ | $L_{B55}$ |

TABLE 1-continued

| Cpd # | $L_A$ | $L_B$ |
|---|---|---|
| 5175. | $L_{A45}$ | $L_{B55}$ |
| 5176. | $L_{A46}$ | $L_{B55}$ |
| 5177. | $L_{A47}$ | $L_{B55}$ |
| 5178. | $L_{A48}$ | $L_{B55}$ |
| 5179. | $L_{A49}$ | $L_{B55}$ |
| 5180. | $L_{A50}$ | $L_{B55}$ |
| 5181. | $L_{A51}$ | $L_{B55}$ |
| 5182. | $L_{A52}$ | $L_{B55}$ |
| 5183. | $L_{A53}$ | $L_{B55}$ |
| 5184. | $L_{A54}$ | $L_{B55}$ |
| 5185. | $L_{A55}$ | $L_{B55}$ |
| 5186. | $L_{A56}$ | $L_{B55}$ |
| 5187. | $L_{A57}$ | $L_{B55}$ |
| 5188. | $L_{A58}$ | $L_{B55}$ |
| 5189. | $L_{A59}$ | $L_{B55}$ |
| 5190. | $L_{A60}$ | $L_{B55}$ |
| 5191. | $L_{A61}$ | $L_{B55}$ |
| 5192. | $L_{A62}$ | $L_{B55}$ |
| 5193. | $L_{A63}$ | $L_{B55}$ |
| 5194. | $L_{A64}$ | $L_{B55}$ |
| 5195. | $L_{A65}$ | $L_{B55}$ |
| 5196. | $L_{A66}$ | $L_{B55}$ |
| 5197. | $L_{A67}$ | $L_{B55}$ |
| 5198. | $L_{A68}$ | $L_{B55}$ |
| 5199. | $L_{A69}$ | $L_{B55}$ |
| 5200. | $L_{A70}$ | $L_{B55}$ |
| 5201. | $L_{A71}$ | $L_{B55}$ |
| 5202. | $L_{A72}$ | $L_{B55}$ |
| 5203. | $L_{A73}$ | $L_{B55}$ |
| 5204. | $L_{A74}$ | $L_{B55}$ |
| 5205. | $L_{A75}$ | $L_{B55}$ |
| 5206. | $L_{A76}$ | $L_{B55}$ |
| 5207. | $L_{A77}$ | $L_{B55}$ |
| 5208. | $L_{A78}$ | $L_{B55}$ |
| 5209. | $L_{A79}$ | $L_{B55}$ |
| 5210. | $L_{A80}$ | $L_{B55}$ |
| 5211. | $L_{A81}$ | $L_{B55}$ |
| 5212. | $L_{A82}$ | $L_{B55}$ |
| 5213. | $L_{A83}$ | $L_{B55}$ |
| 5214. | $L_{A84}$ | $L_{B55}$ |
| 5215. | $L_{A85}$ | $L_{B55}$ |
| 5216. | $L_{A86}$ | $L_{B55}$ |
| 5217. | $L_{A87}$ | $L_{B55}$ |
| 5218. | $L_{A88}$ | $L_{B55}$ |
| 5219. | $L_{A89}$ | $L_{B55}$ |
| 5220. | $L_{A90}$ | $L_{B55}$ |
| 5221. | $L_{A91}$ | $L_{B55}$ |
| 5222. | $L_{A92}$ | $L_{B55}$ |
| 5223. | $L_{A93}$ | $L_{B55}$ |
| 5224. | $L_{A94}$ | $L_{B55}$ |
| 5225. | $L_{A95}$ | $L_{B55}$ |
| 5226. | $L_{A1}$ | $L_{B56}$ |
| 5227. | $L_{A2}$ | $L_{B56}$ |
| 5228. | $L_{A3}$ | $L_{B56}$ |
| 5229. | $L_{A4}$ | $L_{B56}$ |
| 5230. | $L_{A5}$ | $L_{B56}$ |
| 5231. | $L_{A6}$ | $L_{B56}$ |
| 5232. | $L_{A7}$ | $L_{B56}$ |
| 5233. | $L_{A8}$ | $L_{B56}$ |
| 5234. | $L_{A9}$ | $L_{B56}$ |
| 5235. | $L_{A10}$ | $L_{B56}$ |
| 5236. | $L_{A11}$ | $L_{B56}$ |
| 5237. | $L_{A12}$ | $L_{B56}$ |
| 5238. | $L_{A13}$ | $L_{B56}$ |
| 5239. | $L_{A14}$ | $L_{B56}$ |
| 5240. | $L_{A15}$ | $L_{B56}$ |
| 5241. | $L_{A16}$ | $L_{B56}$ |
| 5242. | $L_{A17}$ | $L_{B56}$ |
| 5243. | $L_{A18}$ | $L_{B56}$ |
| 5244. | $L_{A19}$ | $L_{B56}$ |
| 5245. | $L_{A20}$ | $L_{B56}$ |
| 5246. | $L_{A21}$ | $L_{B56}$ |
| 5247. | $L_{A22}$ | $L_{B56}$ |
| 5248. | $L_{A23}$ | $L_{B56}$ |
| 5249. | $L_{A24}$ | $L_{B56}$ |
| 5250. | $L_{A25}$ | $L_{B56}$ |
| 5251. | $L_{A26}$ | $L_{B56}$ |
| 5252. | $L_{A27}$ | $L_{B56}$ |

TABLE 1-continued

| Cpd # | $L_A$ | $L_B$ |
|---|---|---|
| 5253. | $L_{A28}$ | $L_{B56}$ |
| 5254. | $L_{A29}$ | $L_{B56}$ |
| 5255. | $L_{A30}$ | $L_{B56}$ |
| 5256. | $L_{A31}$ | $L_{B56}$ |
| 5257. | $L_{A32}$ | $L_{B56}$ |
| 5258. | $L_{A33}$ | $L_{B56}$ |
| 5259. | $L_{A34}$ | $L_{B56}$ |
| 5260. | $L_{A35}$ | $L_{B56}$ |
| 5261. | $L_{A36}$ | $L_{B56}$ |
| 5262. | $L_{A37}$ | $L_{B56}$ |
| 5263. | $L_{A38}$ | $L_{B56}$ |
| 5264. | $L_{A39}$ | $L_{B56}$ |
| 5265. | $L_{A40}$ | $L_{B56}$ |
| 5266. | $L_{A41}$ | $L_{B56}$ |
| 5267. | $L_{A42}$ | $L_{B56}$ |
| 5268. | $L_{A43}$ | $L_{B56}$ |
| 5269. | $L_{A44}$ | $L_{B56}$ |
| 5270. | $L_{A45}$ | $L_{B56}$ |
| 5271. | $L_{A46}$ | $L_{B56}$ |
| 5272. | $L_{A47}$ | $L_{B56}$ |
| 5273. | $L_{A48}$ | $L_{B56}$ |
| 5274. | $L_{A49}$ | $L_{B56}$ |
| 5275. | $L_{A50}$ | $L_{B56}$ |
| 5276. | $L_{A51}$ | $L_{B56}$ |
| 5277. | $L_{A52}$ | $L_{B56}$ |
| 5278. | $L_{A53}$ | $L_{B56}$ |
| 5279. | $L_{A54}$ | $L_{B56}$ |
| 5280. | $L_{A55}$ | $L_{B56}$ |
| 5281. | $L_{A56}$ | $L_{B56}$ |
| 5282. | $L_{A57}$ | $L_{B56}$ |
| 5283. | $L_{A58}$ | $L_{B56}$ |
| 5284. | $L_{A59}$ | $L_{B56}$ |
| 5285. | $L_{A60}$ | $L_{B56}$ |
| 5286. | $L_{A61}$ | $L_{B56}$ |
| 5287. | $L_{A62}$ | $L_{B56}$ |
| 5288. | $L_{A63}$ | $L_{B56}$ |
| 5289. | $L_{A64}$ | $L_{B56}$ |
| 5290. | $L_{A65}$ | $L_{B56}$ |
| 5291. | $L_{A66}$ | $L_{B56}$ |
| 5292. | $L_{A67}$ | $L_{B56}$ |
| 5293. | $L_{A68}$ | $L_{B56}$ |
| 5294. | $L_{A69}$ | $L_{B56}$ |
| 5295. | $L_{A70}$ | $L_{B56}$ |
| 5296. | $L_{A71}$ | $L_{B56}$ |
| 5297. | $L_{A72}$ | $L_{B56}$ |
| 5298. | $L_{A73}$ | $L_{B56}$ |
| 5299. | $L_{A74}$ | $L_{B56}$ |
| 5300. | $L_{A75}$ | $L_{B56}$ |
| 5301. | $L_{A76}$ | $L_{B56}$ |
| 5302. | $L_{A77}$ | $L_{B56}$ |
| 5303. | $L_{A78}$ | $L_{B56}$ |
| 5304. | $L_{A79}$ | $L_{B56}$ |
| 5305. | $L_{A80}$ | $L_{B56}$ |
| 5306. | $L_{A81}$ | $L_{B56}$ |
| 5307. | $L_{A82}$ | $L_{B56}$ |
| 5308. | $L_{A83}$ | $L_{B56}$ |
| 5309. | $L_{A84}$ | $L_{B56}$ |
| 5310. | $L_{A85}$ | $L_{B56}$ |
| 5311. | $L_{A86}$ | $L_{B56}$ |
| 5312. | $L_{A87}$ | $L_{B56}$ |
| 5313. | $L_{A88}$ | $L_{B56}$ |
| 5314. | $L_{A89}$ | $L_{B56}$ |
| 5315. | $L_{A90}$ | $L_{B56}$ |
| 5316. | $L_{A91}$ | $L_{B56}$ |
| 5317. | $L_{A92}$ | $L_{B56}$ |
| 5318. | $L_{A93}$ | $L_{B56}$ |
| 5319. | $L_{A94}$ | $L_{B56}$ |
| 5320. | $L_{A95}$ | $L_{B56}$ |
| 5321. | $L_{A1}$ | $L_{B57}$ |
| 5322. | $L_{A2}$ | $L_{B57}$ |
| 5323. | $L_{A3}$ | $L_{B57}$ |
| 5324. | $L_{A4}$ | $L_{B57}$ |
| 5325. | $L_{A5}$ | $L_{B57}$ |
| 5326. | $L_{A6}$ | $L_{B57}$ |
| 5327. | $L_{A7}$ | $L_{B57}$ |
| 5328. | $L_{A8}$ | $L_{B57}$ |
| 5329. | $L_{A9}$ | $L_{B57}$ |
| 5330. | $L_{A10}$ | $L_{B57}$ |

TABLE 1-continued

| Cpd # | $L_A$ | $L_B$ |
|---|---|---|
| 5331. | $L_{A11}$ | $L_{B57}$ |
| 5332. | $L_{A12}$ | $L_{B57}$ |
| 5333. | $L_{A13}$ | $L_{B57}$ |
| 5334. | $L_{A14}$ | $L_{B57}$ |
| 5335. | $L_{A15}$ | $L_{B57}$ |
| 5336. | $L_{A16}$ | $L_{B57}$ |
| 5337. | $L_{A17}$ | $L_{B57}$ |
| 5338. | $L_{A18}$ | $L_{B57}$ |
| 5339. | $L_{A19}$ | $L_{B57}$ |
| 5340. | $L_{A20}$ | $L_{B57}$ |
| 5341. | $L_{A21}$ | $L_{B57}$ |
| 5342. | $L_{A22}$ | $L_{B57}$ |
| 5343. | $L_{A23}$ | $L_{B57}$ |
| 5344. | $L_{A24}$ | $L_{B57}$ |
| 5345. | $L_{A25}$ | $L_{B57}$ |
| 5346. | $L_{A26}$ | $L_{B57}$ |
| 5347. | $L_{A27}$ | $L_{B57}$ |
| 5348. | $L_{A28}$ | $L_{B57}$ |
| 5349. | $L_{A29}$ | $L_{B57}$ |
| 5350. | $L_{A30}$ | $L_{B57}$ |
| 5351. | $L_{A31}$ | $L_{B57}$ |
| 5352. | $L_{A32}$ | $L_{B57}$ |
| 5353. | $L_{A33}$ | $L_{B57}$ |
| 5354. | $L_{A34}$ | $L_{B57}$ |
| 5355. | $L_{A35}$ | $L_{B57}$ |
| 5356. | $L_{A36}$ | $L_{B57}$ |
| 5357. | $L_{A37}$ | $L_{B57}$ |
| 5358. | $L_{A38}$ | $L_{B57}$ |
| 5359. | $L_{A39}$ | $L_{B57}$ |
| 5360. | $L_{A40}$ | $L_{B57}$ |
| 5361. | $L_{A41}$ | $L_{B57}$ |
| 5362. | $L_{A42}$ | $L_{B57}$ |
| 5363. | $L_{A43}$ | $L_{B57}$ |
| 5364. | $L_{A44}$ | $L_{B57}$ |
| 5365. | $L_{A45}$ | $L_{B57}$ |
| 5366. | $L_{A46}$ | $L_{B57}$ |
| 5367. | $L_{A47}$ | $L_{B57}$ |
| 5368. | $L_{A48}$ | $L_{B57}$ |
| 5369. | $L_{A49}$ | $L_{B57}$ |
| 5370. | $L_{A50}$ | $L_{B57}$ |
| 5371. | $L_{A51}$ | $L_{B57}$ |
| 5372. | $L_{A52}$ | $L_{B57}$ |
| 5373. | $L_{A53}$ | $L_{B57}$ |
| 5374. | $L_{A54}$ | $L_{B57}$ |
| 5375. | $L_{A55}$ | $L_{B57}$ |
| 5376. | $L_{A56}$ | $L_{B57}$ |
| 5377. | $L_{A57}$ | $L_{B57}$ |
| 5378. | $L_{A58}$ | $L_{B57}$ |
| 5379. | $L_{A59}$ | $L_{B57}$ |
| 5380. | $L_{A60}$ | $L_{B57}$ |
| 5381. | $L_{A61}$ | $L_{B57}$ |
| 5382. | $L_{A62}$ | $L_{B57}$ |
| 5383. | $L_{A63}$ | $L_{B57}$ |
| 5384. | $L_{A64}$ | $L_{B57}$ |
| 5385. | $L_{A65}$ | $L_{B57}$ |
| 5386. | $L_{A66}$ | $L_{B57}$ |
| 5387. | $L_{A67}$ | $L_{B57}$ |
| 5388. | $L_{A68}$ | $L_{B57}$ |
| 5389. | $L_{A69}$ | $L_{B57}$ |
| 5390. | $L_{A70}$ | $L_{B57}$ |
| 5391. | $L_{A71}$ | $L_{B57}$ |
| 5392. | $L_{A72}$ | $L_{B57}$ |
| 5393. | $L_{A73}$ | $L_{B57}$ |
| 5394. | $L_{A74}$ | $L_{B57}$ |
| 5395. | $L_{A75}$ | $L_{B57}$ |
| 5396. | $L_{A76}$ | $L_{B57}$ |
| 5397. | $L_{A77}$ | $L_{B57}$ |
| 5398. | $L_{A78}$ | $L_{B57}$ |
| 5399. | $L_{A79}$ | $L_{B57}$ |
| 5400. | $L_{A80}$ | $L_{B57}$ |
| 5401. | $L_{A81}$ | $L_{B57}$ |
| 5402. | $L_{A82}$ | $L_{B57}$ |
| 5403. | $L_{A83}$ | $L_{B57}$ |
| 5404. | $L_{A84}$ | $L_{B57}$ |
| 5405. | $L_{A85}$ | $L_{B57}$ |
| 5406. | $L_{A86}$ | $L_{B57}$ |
| 5407. | $L_{A87}$ | $L_{B57}$ |
| 5408. | $L_{A88}$ | $L_{B57}$ |

TABLE 1-continued

| Cpd # | $L_A$ | $L_B$ |
| --- | --- | --- |
| 5409. | $L_{A89}$ | $L_{B57}$ |
| 5410. | $L_{A90}$ | $L_{B57}$ |
| 5411. | $L_{A91}$ | $L_{B57}$ |
| 5412. | $L_{A92}$ | $L_{B57}$ |
| 5413. | $L_{A93}$ | $L_{B57}$ |
| 5414. | $L_{A94}$ | $L_{B57}$ |
| 5415. | $L_{A95}$ | $L_{B57}$ |
| 5416. | $L_{A1}$ | $L_{B58}$ |
| 5417. | $L_{A2}$ | $L_{B58}$ |
| 5418. | $L_{A3}$ | $L_{B58}$ |
| 5419. | $L_{A4}$ | $L_{B58}$ |
| 5420. | $L_{A5}$ | $L_{B58}$ |
| 5421. | $L_{A6}$ | $L_{B58}$ |
| 5422. | $L_{A7}$ | $L_{B58}$ |
| 5423. | $L_{A8}$ | $L_{B58}$ |
| 5424. | $L_{A9}$ | $L_{B58}$ |
| 5425. | $L_{A10}$ | $L_{B58}$ |
| 5426. | $L_{A11}$ | $L_{B58}$ |
| 5427. | $L_{A12}$ | $L_{B58}$ |
| 5428. | $L_{A13}$ | $L_{B58}$ |
| 5429. | $L_{A14}$ | $L_{B58}$ |
| 5430. | $L_{A15}$ | $L_{B58}$ |
| 5431. | $L_{A16}$ | $L_{B58}$ |
| 5432. | $L_{A17}$ | $L_{B58}$ |
| 5433. | $L_{A18}$ | $L_{B58}$ |
| 5434. | $L_{A19}$ | $L_{B58}$ |
| 5435. | $L_{A20}$ | $L_{B58}$ |
| 5436. | $L_{A21}$ | $L_{B58}$ |
| 5437. | $L_{A22}$ | $L_{B58}$ |
| 5438. | $L_{A23}$ | $L_{B58}$ |
| 5439. | $L_{A24}$ | $L_{B58}$ |
| 5440. | $L_{A25}$ | $L_{B58}$ |
| 5441. | $L_{A26}$ | $L_{B58}$ |
| 5442. | $L_{A27}$ | $L_{B58}$ |
| 5443. | $L_{A28}$ | $L_{B58}$ |
| 5444. | $L_{A29}$ | $L_{B58}$ |
| 5445. | $L_{A30}$ | $L_{B58}$ |
| 5446. | $L_{A31}$ | $L_{B58}$ |
| 5447. | $L_{A32}$ | $L_{B58}$ |
| 5448. | $L_{A33}$ | $L_{B58}$ |
| 5449. | $L_{A34}$ | $L_{B58}$ |
| 5450. | $L_{A35}$ | $L_{B58}$ |
| 5451. | $L_{A36}$ | $L_{B58}$ |
| 5452. | $L_{A37}$ | $L_{B58}$ |
| 5453. | $L_{A38}$ | $L_{B58}$ |
| 5454. | $L_{A39}$ | $L_{B58}$ |
| 5455. | $L_{A40}$ | $L_{B58}$ |
| 5456. | $L_{A41}$ | $L_{B58}$ |
| 5457. | $L_{A42}$ | $L_{B58}$ |
| 5458. | $L_{A43}$ | $L_{B58}$ |
| 5459. | $L_{A44}$ | $L_{B58}$ |
| 5460. | $L_{A45}$ | $L_{B58}$ |
| 5461. | $L_{A46}$ | $L_{B58}$ |
| 5462. | $L_{A47}$ | $L_{B58}$ |
| 5463. | $L_{A48}$ | $L_{B58}$ |
| 5464. | $L_{A49}$ | $L_{B58}$ |
| 5465. | $L_{A50}$ | $L_{B58}$ |
| 5466. | $L_{A51}$ | $L_{B58}$ |
| 5467. | $L_{A52}$ | $L_{B58}$ |
| 5468. | $L_{A53}$ | $L_{B58}$ |
| 5469. | $L_{A54}$ | $L_{B58}$ |
| 5470. | $L_{A55}$ | $L_{B58}$ |
| 5471. | $L_{A56}$ | $L_{B58}$ |
| 5472. | $L_{A57}$ | $L_{B58}$ |
| 5473. | $L_{A58}$ | $L_{B58}$ |
| 5474. | $L_{A59}$ | $L_{B58}$ |
| 5475. | $L_{A60}$ | $L_{B58}$ |
| 5476. | $L_{A61}$ | $L_{B58}$ |
| 5477. | $L_{A62}$ | $L_{B58}$ |
| 5478. | $L_{A63}$ | $L_{B58}$ |
| 5479. | $L_{A64}$ | $L_{B58}$ |
| 5480. | $L_{A65}$ | $L_{B58}$ |
| 5481. | $L_{A66}$ | $L_{B58}$ |
| 5482. | $L_{A67}$ | $L_{B58}$ |
| 5483. | $L_{A68}$ | $L_{B58}$ |
| 5484. | $L_{A69}$ | $L_{B58}$ |
| 5485. | $L_{A70}$ | $L_{B58}$ |
| 5486. | $L_{A71}$ | $L_{B58}$ |

TABLE 1-continued

| Cpd # | $L_A$ | $L_B$ |
| --- | --- | --- |
| 5487. | $L_{A72}$ | $L_{B58}$ |
| 5488. | $L_{A73}$ | $L_{B58}$ |
| 5489. | $L_{A74}$ | $L_{B58}$ |
| 5490. | $L_{A75}$ | $L_{B58}$ |
| 5491. | $L_{A76}$ | $L_{B58}$ |
| 5492. | $L_{A77}$ | $L_{B58}$ |
| 5493. | $L_{A78}$ | $L_{B58}$ |
| 5494. | $L_{A79}$ | $L_{B58}$ |
| 5495. | $L_{A80}$ | $L_{B58}$ |
| 5496. | $L_{A81}$ | $L_{B58}$ |
| 5497. | $L_{A82}$ | $L_{B58}$ |
| 5498. | $L_{A83}$ | $L_{B58}$ |
| 5499. | $L_{A84}$ | $L_{B58}$ |
| 5500. | $L_{A85}$ | $L_{B58}$ |
| 5501. | $L_{A86}$ | $L_{B58}$ |
| 5502. | $L_{A87}$ | $L_{B58}$ |
| 5503. | $L_{A88}$ | $L_{B58}$ |
| 5504. | $L_{A89}$ | $L_{B58}$ |
| 5505. | $L_{A90}$ | $L_{B58}$ |
| 5506. | $L_{A91}$ | $L_{B58}$ |
| 5507. | $L_{A92}$ | $L_{B58}$ |
| 5508. | $L_{A93}$ | $L_{B58}$ |
| 5509. | $L_{A94}$ | $L_{B58}$ |
| 5510. | $L_{A95}$ | $L_{B58}$ |
| 5511. | $L_{A1}$ | $L_{B59}$ |
| 5512. | $L_{A2}$ | $L_{B59}$ |
| 5513. | $L_{A3}$ | $L_{B59}$ |
| 5514. | $L_{A4}$ | $L_{B59}$ |
| 5515. | $L_{A5}$ | $L_{B59}$ |
| 5516. | $L_{A6}$ | $L_{B59}$ |
| 5517. | $L_{A7}$ | $L_{B59}$ |
| 5518. | $L_{A8}$ | $L_{B59}$ |
| 5519. | $L_{A9}$ | $L_{B59}$ |
| 5520. | $L_{A10}$ | $L_{B59}$ |
| 5521. | $L_{A11}$ | $L_{B59}$ |
| 5522. | $L_{A12}$ | $L_{B59}$ |
| 5523. | $L_{A13}$ | $L_{B59}$ |
| 5524. | $L_{A14}$ | $L_{B59}$ |
| 5525. | $L_{A15}$ | $L_{B59}$ |
| 5526. | $L_{A16}$ | $L_{B59}$ |
| 5527. | $L_{A17}$ | $L_{B59}$ |
| 5528. | $L_{A18}$ | $L_{B59}$ |
| 5529. | $L_{A19}$ | $L_{B59}$ |
| 5530. | $L_{A20}$ | $L_{B59}$ |
| 5531. | $L_{A21}$ | $L_{B59}$ |
| 5532. | $L_{A22}$ | $L_{B59}$ |
| 5533. | $L_{A23}$ | $L_{B59}$ |
| 5534. | $L_{A24}$ | $L_{B59}$ |
| 5535. | $L_{A25}$ | $L_{B59}$ |
| 5536. | $L_{A26}$ | $L_{B59}$ |
| 5537. | $L_{A27}$ | $L_{B59}$ |
| 5538. | $L_{A28}$ | $L_{B59}$ |
| 5539. | $L_{A29}$ | $L_{B59}$ |
| 5540. | $L_{A30}$ | $L_{B59}$ |
| 5541. | $L_{A31}$ | $L_{B59}$ |
| 5542. | $L_{A32}$ | $L_{B59}$ |
| 5543. | $L_{A33}$ | $L_{B59}$ |
| 5544. | $L_{A34}$ | $L_{B59}$ |
| 5545. | $L_{A35}$ | $L_{B59}$ |
| 5546. | $L_{A36}$ | $L_{B59}$ |
| 5547. | $L_{A37}$ | $L_{B59}$ |
| 5548. | $L_{A38}$ | $L_{B59}$ |
| 5549. | $L_{A39}$ | $L_{B59}$ |
| 5550. | $L_{A40}$ | $L_{B59}$ |
| 5551. | $L_{A41}$ | $L_{B59}$ |
| 5552. | $L_{A42}$ | $L_{B59}$ |
| 5553. | $L_{A43}$ | $L_{B59}$ |
| 5554. | $L_{A44}$ | $L_{B59}$ |
| 5555. | $L_{A45}$ | $L_{B59}$ |
| 5556. | $L_{A46}$ | $L_{B59}$ |
| 5557. | $L_{A47}$ | $L_{B59}$ |
| 5558. | $L_{A48}$ | $L_{B59}$ |
| 5559. | $L_{A49}$ | $L_{B59}$ |
| 5560. | $L_{A50}$ | $L_{B59}$ |
| 5561. | $L_{A51}$ | $L_{B59}$ |
| 5562. | $L_{A52}$ | $L_{B59}$ |
| 5563. | $L_{A53}$ | $L_{B59}$ |
| 5564. | $L_{A54}$ | $L_{B59}$ |

TABLE 1-continued

| Cpd # | $L_A$ | $L_B$ |
|---|---|---|
| 5565. | $L_{A55}$ | $L_{B59}$ |
| 5566. | $L_{A56}$ | $L_{B59}$ |
| 5567. | $L_{A57}$ | $L_{B59}$ |
| 5568. | $L_{A58}$ | $L_{B59}$ |
| 5569. | $L_{A59}$ | $L_{B59}$ |
| 5570. | $L_{A60}$ | $L_{B59}$ |
| 5571. | $L_{A61}$ | $L_{B59}$ |
| 5572. | $L_{A62}$ | $L_{B59}$ |
| 5573. | $L_{A63}$ | $L_{B59}$ |
| 5574. | $L_{A64}$ | $L_{B59}$ |
| 5575. | $L_{A65}$ | $L_{B59}$ |
| 5576. | $L_{A66}$ | $L_{B59}$ |
| 5577. | $L_{A67}$ | $L_{B59}$ |
| 5578. | $L_{A68}$ | $L_{B59}$ |
| 5579. | $L_{A69}$ | $L_{B59}$ |
| 5580. | $L_{A70}$ | $L_{B59}$ |
| 5581. | $L_{A71}$ | $L_{B59}$ |
| 5582. | $L_{A72}$ | $L_{B59}$ |
| 5583. | $L_{A73}$ | $L_{B59}$ |
| 5584. | $L_{A74}$ | $L_{B59}$ |
| 5585. | $L_{A75}$ | $L_{B59}$ |
| 5586. | $L_{A76}$ | $L_{B59}$ |
| 5587. | $L_{A77}$ | $L_{B59}$ |
| 5588. | $L_{A78}$ | $L_{B59}$ |
| 5589. | $L_{A79}$ | $L_{B59}$ |
| 5590. | $L_{A80}$ | $L_{B59}$ |
| 5591. | $L_{A81}$ | $L_{B59}$ |
| 5592. | $L_{A82}$ | $L_{B59}$ |
| 5593. | $L_{A83}$ | $L_{B59}$ |
| 5594. | $L_{A84}$ | $L_{B59}$ |
| 5595. | $L_{A85}$ | $L_{B59}$ |
| 5596. | $L_{A86}$ | $L_{B59}$ |
| 5597. | $L_{A87}$ | $L_{B59}$ |
| 5598. | $L_{A88}$ | $L_{B59}$ |
| 5599. | $L_{A89}$ | $L_{B59}$ |
| 5600. | $L_{A90}$ | $L_{B59}$ |
| 5601. | $L_{A91}$ | $L_{B59}$ |
| 5602. | $L_{A92}$ | $L_{B59}$ |
| 5603. | $L_{A93}$ | $L_{B59}$ |
| 5604. | $L_{A94}$ | $L_{B59}$ |
| 5605. | $L_{A95}$ | $L_{B59}$ |
| 5606. | $L_{A1}$ | $L_{B60}$ |
| 5607. | $L_{A2}$ | $L_{B60}$ |
| 5608. | $L_{A3}$ | $L_{B60}$ |
| 5609. | $L_{A4}$ | $L_{B60}$ |
| 5610. | $L_{A5}$ | $L_{B60}$ |
| 5611. | $L_{A6}$ | $L_{B60}$ |
| 5612. | $L_{A7}$ | $L_{B60}$ |
| 5613. | $L_{A8}$ | $L_{B60}$ |
| 5614. | $L_{A9}$ | $L_{B60}$ |
| 5615. | $L_{A10}$ | $L_{B60}$ |
| 5616. | $L_{A11}$ | $L_{B60}$ |
| 5617. | $L_{A12}$ | $L_{B60}$ |
| 5618. | $L_{A13}$ | $L_{B60}$ |
| 5619. | $L_{A14}$ | $L_{B60}$ |
| 5620. | $L_{A15}$ | $L_{B60}$ |
| 5621. | $L_{A16}$ | $L_{B60}$ |
| 5622. | $L_{A17}$ | $L_{B60}$ |
| 5623. | $L_{A18}$ | $L_{B60}$ |
| 5624. | $L_{A19}$ | $L_{B60}$ |
| 5625. | $L_{A20}$ | $L_{B60}$ |
| 5626. | $L_{A21}$ | $L_{B60}$ |
| 5627. | $L_{A22}$ | $L_{B60}$ |
| 5628. | $L_{A23}$ | $L_{B60}$ |
| 5629. | $L_{A24}$ | $L_{B60}$ |
| 5630. | $L_{A25}$ | $L_{B60}$ |
| 5631. | $L_{A26}$ | $L_{B60}$ |
| 5632. | $L_{A27}$ | $L_{B60}$ |
| 5633. | $L_{A28}$ | $L_{B60}$ |
| 5634. | $L_{A29}$ | $L_{B60}$ |
| 5635. | $L_{A30}$ | $L_{B60}$ |
| 5636. | $L_{A31}$ | $L_{B60}$ |
| 5637. | $L_{A32}$ | $L_{B60}$ |
| 5638. | $L_{A33}$ | $L_{B60}$ |
| 5639. | $L_{A34}$ | $L_{B60}$ |
| 5640. | $L_{A35}$ | $L_{B60}$ |
| 5641. | $L_{A36}$ | $L_{B60}$ |
| 5642. | $L_{A37}$ | $L_{B60}$ |

TABLE 1-continued

| Cpd # | $L_A$ | $L_B$ |
|---|---|---|
| 5643. | $L_{A38}$ | $L_{B60}$ |
| 5644. | $L_{A39}$ | $L_{B60}$ |
| 5645. | $L_{A40}$ | $L_{B60}$ |
| 5646. | $L_{A41}$ | $L_{B60}$ |
| 5647. | $L_{A42}$ | $L_{B60}$ |
| 5648. | $L_{A43}$ | $L_{B60}$ |
| 5649. | $L_{A44}$ | $L_{B60}$ |
| 5650. | $L_{A45}$ | $L_{B60}$ |
| 5651. | $L_{A46}$ | $L_{B60}$ |
| 5652. | $L_{A47}$ | $L_{B60}$ |
| 5653. | $L_{A48}$ | $L_{B60}$ |
| 5654. | $L_{A49}$ | $L_{B60}$ |
| 5655. | $L_{A50}$ | $L_{B60}$ |
| 5656. | $L_{A51}$ | $L_{B60}$ |
| 5657. | $L_{A52}$ | $L_{B60}$ |
| 5658. | $L_{A53}$ | $L_{B60}$ |
| 5659. | $L_{A54}$ | $L_{B60}$ |
| 5660. | $L_{A55}$ | $L_{B60}$ |
| 5661. | $L_{A56}$ | $L_{B60}$ |
| 5662. | $L_{A57}$ | $L_{B60}$ |
| 5663. | $L_{A58}$ | $L_{B60}$ |
| 5664. | $L_{A59}$ | $L_{B60}$ |
| 5665. | $L_{A60}$ | $L_{B60}$ |
| 5666. | $L_{A61}$ | $L_{B60}$ |
| 5667. | $L_{A62}$ | $L_{B60}$ |
| 5668. | $L_{A63}$ | $L_{B60}$ |
| 5669. | $L_{A64}$ | $L_{B60}$ |
| 5670. | $L_{A65}$ | $L_{B60}$ |
| 5671. | $L_{A66}$ | $L_{B60}$ |
| 5672. | $L_{A67}$ | $L_{B60}$ |
| 5673. | $L_{A68}$ | $L_{B60}$ |
| 5674. | $L_{A69}$ | $L_{B60}$ |
| 5675. | $L_{A70}$ | $L_{B60}$ |
| 5676. | $L_{A71}$ | $L_{B60}$ |
| 5677. | $L_{A72}$ | $L_{B60}$ |
| 5678. | $L_{A73}$ | $L_{B60}$ |
| 5679. | $L_{A74}$ | $L_{B60}$ |
| 5680. | $L_{A75}$ | $L_{B60}$ |
| 5681. | $L_{A76}$ | $L_{B60}$ |
| 5682. | $L_{A77}$ | $L_{B60}$ |
| 5683. | $L_{A78}$ | $L_{B60}$ |
| 5684. | $L_{A79}$ | $L_{B60}$ |
| 5685. | $L_{A80}$ | $L_{B60}$ |
| 5686. | $L_{A81}$ | $L_{B60}$ |
| 5687. | $L_{A82}$ | $L_{B60}$ |
| 5688. | $L_{A83}$ | $L_{B60}$ |
| 5689. | $L_{A84}$ | $L_{B60}$ |
| 5690. | $L_{A85}$ | $L_{B60}$ |
| 5691. | $L_{A86}$ | $L_{B60}$ |
| 5692. | $L_{A87}$ | $L_{B60}$ |
| 5693. | $L_{A88}$ | $L_{B60}$ |
| 5694. | $L_{A89}$ | $L_{B60}$ |
| 5695. | $L_{A90}$ | $L_{B60}$ |
| 5696. | $L_{A91}$ | $L_{B60}$ |
| 5697. | $L_{A92}$ | $L_{B60}$ |
| 5698. | $L_{A93}$ | $L_{B60}$ |
| 5699. | $L_{A94}$ | $L_{B60}$ |
| 5700. | $L_{A95}$ | $L_{B60}$ |
| 5701. | $L_{A1}$ | $L_{B61}$ |
| 5702. | $L_{A2}$ | $L_{B61}$ |
| 5703. | $L_{A3}$ | $L_{B61}$ |
| 5704. | $L_{A4}$ | $L_{B61}$ |
| 5705. | $L_{A5}$ | $L_{B61}$ |
| 5706. | $L_{A6}$ | $L_{B61}$ |
| 5707. | $L_{A7}$ | $L_{B61}$ |
| 5708. | $L_{A8}$ | $L_{B61}$ |
| 5709. | $L_{A9}$ | $L_{B61}$ |
| 5710. | $L_{A10}$ | $L_{B61}$ |
| 5711. | $L_{A11}$ | $L_{B61}$ |
| 5712. | $L_{A12}$ | $L_{B61}$ |
| 5713. | $L_{A13}$ | $L_{B61}$ |
| 5714. | $L_{A14}$ | $L_{B61}$ |
| 5715. | $L_{A15}$ | $L_{B61}$ |
| 5716. | $L_{A16}$ | $L_{B61}$ |
| 5717. | $L_{A17}$ | $L_{B61}$ |
| 5718. | $L_{A18}$ | $L_{B61}$ |
| 5719. | $L_{A19}$ | $L_{B61}$ |
| 5720. | $L_{A20}$ | $L_{B61}$ |

TABLE 1-continued

| Cpd # | $L_A$ | $L_B$ |
|---|---|---|
| 5721. | $L_{A21}$ | $L_{B61}$ |
| 5722. | $L_{A22}$ | $L_{B61}$ |
| 5723. | $L_{A23}$ | $L_{B61}$ |
| 5724. | $L_{A24}$ | $L_{B61}$ |
| 5725. | $L_{A25}$ | $L_{B61}$ |
| 5726. | $L_{A26}$ | $L_{B61}$ |
| 5727. | $L_{A27}$ | $L_{B61}$ |
| 5728. | $L_{A28}$ | $L_{B61}$ |
| 5729. | $L_{A29}$ | $L_{B61}$ |
| 5730. | $L_{A30}$ | $L_{B61}$ |
| 5731. | $L_{A31}$ | $L_{B61}$ |
| 5732. | $L_{A32}$ | $L_{B61}$ |
| 5733. | $L_{A33}$ | $L_{B61}$ |
| 5734. | $L_{A34}$ | $L_{B61}$ |
| 5735. | $L_{A35}$ | $L_{B61}$ |
| 5736. | $L_{A36}$ | $L_{B61}$ |
| 5737. | $L_{A37}$ | $L_{B61}$ |
| 5738. | $L_{A38}$ | $L_{B61}$ |
| 5739. | $L_{A39}$ | $L_{B61}$ |
| 5740. | $L_{A40}$ | $L_{B61}$ |
| 5741. | $L_{A41}$ | $L_{B61}$ |
| 5742. | $L_{A42}$ | $L_{B61}$ |
| 5743. | $L_{A43}$ | $L_{B61}$ |
| 5744. | $L_{A44}$ | $L_{B61}$ |
| 5745. | $L_{A45}$ | $L_{B61}$ |
| 5746. | $L_{A46}$ | $L_{B61}$ |
| 5747. | $L_{A47}$ | $L_{B61}$ |
| 5748. | $L_{A48}$ | $L_{B61}$ |
| 5749. | $L_{A49}$ | $L_{B61}$ |
| 5750. | $L_{A50}$ | $L_{B61}$ |
| 5751. | $L_{A51}$ | $L_{B61}$ |
| 5752. | $L_{A52}$ | $L_{B61}$ |
| 5753. | $L_{A53}$ | $L_{B61}$ |
| 5754. | $L_{A54}$ | $L_{B61}$ |
| 5755. | $L_{A55}$ | $L_{B61}$ |
| 5756. | $L_{A56}$ | $L_{B61}$ |
| 5757. | $L_{A57}$ | $L_{B61}$ |
| 5758. | $L_{A58}$ | $L_{B61}$ |
| 5759. | $L_{A59}$ | $L_{B61}$ |
| 5760. | $L_{A60}$ | $L_{B61}$ |
| 5761. | $L_{A61}$ | $L_{B61}$ |
| 5762. | $L_{A62}$ | $L_{B61}$ |
| 5763. | $L_{A63}$ | $L_{B61}$ |
| 5764. | $L_{A64}$ | $L_{B61}$ |
| 5765. | $L_{A65}$ | $L_{B61}$ |
| 5766. | $L_{A66}$ | $L_{B61}$ |
| 5767. | $L_{A67}$ | $L_{B61}$ |
| 5768. | $L_{A68}$ | $L_{B61}$ |
| 5769. | $L_{A69}$ | $L_{B61}$ |
| 5770. | $L_{A70}$ | $L_{B61}$ |
| 5771. | $L_{A71}$ | $L_{B61}$ |
| 5772. | $L_{A72}$ | $L_{B61}$ |
| 5773. | $L_{A73}$ | $L_{B61}$ |
| 5774. | $L_{A74}$ | $L_{B61}$ |
| 5775. | $L_{A75}$ | $L_{B61}$ |
| 5776. | $L_{A76}$ | $L_{B61}$ |
| 5777. | $L_{A77}$ | $L_{B61}$ |
| 5778. | $L_{A78}$ | $L_{B61}$ |
| 5779. | $L_{A79}$ | $L_{B61}$ |
| 5780. | $L_{A80}$ | $L_{B61}$ |
| 5781. | $L_{A81}$ | $L_{B61}$ |
| 5782. | $L_{A82}$ | $L_{B61}$ |
| 5783. | $L_{A83}$ | $L_{B61}$ |
| 5784. | $L_{A84}$ | $L_{B61}$ |
| 5785. | $L_{A85}$ | $L_{B61}$ |
| 5786. | $L_{A86}$ | $L_{B61}$ |
| 5787. | $L_{A87}$ | $L_{B61}$ |
| 5788. | $L_{A88}$ | $L_{B61}$ |
| 5789. | $L_{A89}$ | $L_{B61}$ |
| 5790. | $L_{A90}$ | $L_{B61}$ |
| 5791. | $L_{A91}$ | $L_{B61}$ |
| 5792. | $L_{A92}$ | $L_{B61}$ |
| 5793. | $L_{A93}$ | $L_{B61}$ |
| 5794. | $L_{A94}$ | $L_{B61}$ |
| 5795. | $L_{A95}$ | $L_{B61}$ |
| 5796. | $L_{A1}$ | $L_{B62}$ |
| 5797. | $L_{A2}$ | $L_{B62}$ |
| 5798. | $L_{A3}$ | $L_{B62}$ |

TABLE 1-continued

| Cpd # | $L_A$ | $L_B$ |
|---|---|---|
| 5799. | $L_{A4}$ | $L_{B62}$ |
| 5800. | $L_{A5}$ | $L_{B62}$ |
| 5801. | $L_{A6}$ | $L_{B62}$ |
| 5802. | $L_{A7}$ | $L_{B62}$ |
| 5803. | $L_{A8}$ | $L_{B62}$ |
| 5804. | $L_{A9}$ | $L_{B62}$ |
| 5805. | $L_{A10}$ | $L_{B62}$ |
| 5806. | $L_{A11}$ | $L_{B62}$ |
| 5807. | $L_{A12}$ | $L_{B62}$ |
| 5808. | $L_{A13}$ | $L_{B62}$ |
| 5809. | $L_{A14}$ | $L_{B62}$ |
| 5810. | $L_{A15}$ | $L_{B62}$ |
| 5811. | $L_{A16}$ | $L_{B62}$ |
| 5812. | $L_{A17}$ | $L_{B62}$ |
| 5813. | $L_{A18}$ | $L_{B62}$ |
| 5814. | $L_{A19}$ | $L_{B62}$ |
| 5815. | $L_{A20}$ | $L_{B62}$ |
| 5816. | $L_{A21}$ | $L_{B62}$ |
| 5817. | $L_{A22}$ | $L_{B62}$ |
| 5818. | $L_{A23}$ | $L_{B62}$ |
| 5819. | $L_{A24}$ | $L_{B62}$ |
| 5820. | $L_{A25}$ | $L_{B62}$ |
| 5821. | $L_{A26}$ | $L_{B62}$ |
| 5822. | $L_{A27}$ | $L_{B62}$ |
| 5823. | $L_{A28}$ | $L_{B62}$ |
| 5824. | $L_{A29}$ | $L_{B62}$ |
| 5825. | $L_{A30}$ | $L_{B62}$ |
| 5826. | $L_{A31}$ | $L_{B62}$ |
| 5827. | $L_{A32}$ | $L_{B62}$ |
| 5828. | $L_{A33}$ | $L_{B62}$ |
| 5829. | $L_{A34}$ | $L_{B62}$ |
| 5830. | $L_{A35}$ | $L_{B62}$ |
| 5831. | $L_{A36}$ | $L_{B62}$ |
| 5832. | $L_{A37}$ | $L_{B62}$ |
| 5833. | $L_{A38}$ | $L_{B62}$ |
| 5834. | $L_{A39}$ | $L_{B62}$ |
| 5835. | $L_{A40}$ | $L_{B62}$ |
| 5836. | $L_{A41}$ | $L_{B62}$ |
| 5837. | $L_{A42}$ | $L_{B62}$ |
| 5838. | $L_{A43}$ | $L_{B62}$ |
| 5839. | $L_{A44}$ | $L_{B62}$ |
| 5840. | $L_{A45}$ | $L_{B62}$ |
| 5841. | $L_{A46}$ | $L_{B62}$ |
| 5842. | $L_{A47}$ | $L_{B62}$ |
| 5843. | $L_{A48}$ | $L_{B62}$ |
| 5844. | $L_{A49}$ | $L_{B62}$ |
| 5845. | $L_{A50}$ | $L_{B62}$ |
| 5846. | $L_{A51}$ | $L_{B62}$ |
| 5847. | $L_{A52}$ | $L_{B62}$ |
| 5848. | $L_{A53}$ | $L_{B62}$ |
| 5849. | $L_{A54}$ | $L_{B62}$ |
| 5850. | $L_{A55}$ | $L_{B62}$ |
| 5851. | $L_{A56}$ | $L_{B62}$ |
| 5852. | $L_{A57}$ | $L_{B62}$ |
| 5853. | $L_{A58}$ | $L_{B62}$ |
| 5854. | $L_{A59}$ | $L_{B62}$ |
| 5855. | $L_{A60}$ | $L_{B62}$ |
| 5856. | $L_{A61}$ | $L_{B62}$ |
| 5857. | $L_{A62}$ | $L_{B62}$ |
| 5858. | $L_{A63}$ | $L_{B62}$ |
| 5859. | $L_{A64}$ | $L_{B62}$ |
| 5860. | $L_{A65}$ | $L_{B62}$ |
| 5861. | $L_{A66}$ | $L_{B62}$ |
| 5862. | $L_{A67}$ | $L_{B62}$ |
| 5863. | $L_{A68}$ | $L_{B62}$ |
| 5864. | $L_{A69}$ | $L_{B62}$ |
| 5865. | $L_{A70}$ | $L_{B62}$ |
| 5866. | $L_{A71}$ | $L_{B62}$ |
| 5867. | $L_{A72}$ | $L_{B62}$ |
| 5868. | $L_{A73}$ | $L_{B62}$ |
| 5869. | $L_{A74}$ | $L_{B62}$ |
| 5870. | $L_{A75}$ | $L_{B62}$ |
| 5871. | $L_{A76}$ | $L_{B62}$ |
| 5872. | $L_{A77}$ | $L_{B62}$ |
| 5873. | $L_{A78}$ | $L_{B62}$ |
| 5874. | $L_{A79}$ | $L_{B62}$ |
| 5875. | $L_{A80}$ | $L_{B62}$ |
| 5876. | $L_{A81}$ | $L_{B62}$ |

TABLE 1-continued

| Cpd # | $L_A$ | $L_B$ |
|---|---|---|
| 5877. | $L_{A82}$ | $L_{B62}$ |
| 5878. | $L_{A83}$ | $L_{B62}$ |
| 5879. | $L_{A84}$ | $L_{B62}$ |
| 5880. | $L_{A85}$ | $L_{B62}$ |
| 5881. | $L_{A86}$ | $L_{B62}$ |
| 5882. | $L_{A87}$ | $L_{B62}$ |
| 5883. | $L_{A88}$ | $L_{B62}$ |
| 5884. | $L_{A89}$ | $L_{B62}$ |
| 5885. | $L_{A90}$ | $L_{B62}$ |
| 5886. | $L_{A91}$ | $L_{B62}$ |
| 5887. | $L_{A92}$ | $L_{B62}$ |
| 5888. | $L_{A93}$ | $L_{B62}$ |
| 5889. | $L_{A94}$ | $L_{B62}$ |
| 5890. | $L_{A95}$ | $L_{B62}$ |
| 5891. | $L_{A1}$ | $L_{B63}$ |
| 5892. | $L_{A2}$ | $L_{B63}$ |
| 5893. | $L_{A3}$ | $L_{B63}$ |
| 5894. | $L_{A4}$ | $L_{B63}$ |
| 5895. | $L_{A5}$ | $L_{B63}$ |
| 5896. | $L_{A6}$ | $L_{B63}$ |
| 5897. | $L_{A7}$ | $L_{B63}$ |
| 5898. | $L_{A8}$ | $L_{B63}$ |
| 5899. | $L_{A9}$ | $L_{B63}$ |
| 5900. | $L_{A10}$ | $L_{B63}$ |
| 5901. | $L_{A11}$ | $L_{B63}$ |
| 5902. | $L_{A12}$ | $L_{B63}$ |
| 5903. | $L_{A13}$ | $L_{B63}$ |
| 5904. | $L_{A14}$ | $L_{B63}$ |
| 5905. | $L_{A15}$ | $L_{B63}$ |
| 5906. | $L_{A16}$ | $L_{B63}$ |
| 5907. | $L_{A17}$ | $L_{B63}$ |
| 5908. | $L_{A18}$ | $L_{B63}$ |
| 5909. | $L_{A19}$ | $L_{B63}$ |
| 5910. | $L_{A20}$ | $L_{B63}$ |
| 5911. | $L_{A21}$ | $L_{B63}$ |
| 5912. | $L_{A22}$ | $L_{B63}$ |
| 5913. | $L_{A23}$ | $L_{B63}$ |
| 5914. | $L_{A24}$ | $L_{B63}$ |
| 5915. | $L_{A25}$ | $L_{B63}$ |
| 5916. | $L_{A26}$ | $L_{B63}$ |
| 5917. | $L_{A27}$ | $L_{B63}$ |
| 5918. | $L_{A28}$ | $L_{B63}$ |
| 5919. | $L_{A29}$ | $L_{B63}$ |
| 5920. | $L_{A30}$ | $L_{B63}$ |
| 5921. | $L_{A31}$ | $L_{B63}$ |
| 5922. | $L_{A32}$ | $L_{B63}$ |
| 5923. | $L_{A33}$ | $L_{B63}$ |
| 5924. | $L_{A34}$ | $L_{B63}$ |
| 5925. | $L_{A35}$ | $L_{B63}$ |
| 5926. | $L_{A36}$ | $L_{B63}$ |
| 5927. | $L_{A37}$ | $L_{B63}$ |
| 5928. | $L_{A38}$ | $L_{B63}$ |
| 5929. | $L_{A39}$ | $L_{B63}$ |
| 5930. | $L_{A40}$ | $L_{B63}$ |
| 5931. | $L_{A41}$ | $L_{B63}$ |
| 5932. | $L_{A42}$ | $L_{B63}$ |
| 5933. | $L_{A43}$ | $L_{B63}$ |
| 5934. | $L_{A44}$ | $L_{B63}$ |
| 5935. | $L_{A45}$ | $L_{B63}$ |
| 5936. | $L_{A46}$ | $L_{B63}$ |
| 5937. | $L_{A47}$ | $L_{B63}$ |
| 5938. | $L_{A48}$ | $L_{B63}$ |
| 5939. | $L_{A49}$ | $L_{B63}$ |
| 5940. | $L_{A50}$ | $L_{B63}$ |
| 5941. | $L_{A51}$ | $L_{B63}$ |
| 5942. | $L_{A52}$ | $L_{B63}$ |
| 5943. | $L_{A53}$ | $L_{B63}$ |
| 5944. | $L_{A54}$ | $L_{B63}$ |
| 5945. | $L_{A55}$ | $L_{B63}$ |
| 5946. | $L_{A56}$ | $L_{B63}$ |
| 5947. | $L_{A57}$ | $L_{B63}$ |
| 5948. | $L_{A58}$ | $L_{B63}$ |
| 5949. | $L_{A59}$ | $L_{B63}$ |
| 5950. | $L_{A60}$ | $L_{B63}$ |
| 5951. | $L_{A61}$ | $L_{B63}$ |
| 5952. | $L_{A62}$ | $L_{B63}$ |
| 5953. | $L_{A63}$ | $L_{B63}$ |
| 5954. | $L_{A64}$ | $L_{B63}$ |

TABLE 1-continued

| Cpd # | $L_A$ | $L_B$ |
|---|---|---|
| 5955. | $L_{A65}$ | $L_{B63}$ |
| 5956. | $L_{A66}$ | $L_{B63}$ |
| 5957. | $L_{A67}$ | $L_{B63}$ |
| 5958. | $L_{A68}$ | $L_{B63}$ |
| 5959. | $L_{A69}$ | $L_{B63}$ |
| 5960. | $L_{A70}$ | $L_{B63}$ |
| 5961. | $L_{A71}$ | $L_{B63}$ |
| 5962. | $L_{A72}$ | $L_{B63}$ |
| 5963. | $L_{A73}$ | $L_{B63}$ |
| 5964. | $L_{A74}$ | $L_{B63}$ |
| 5965. | $L_{A75}$ | $L_{B63}$ |
| 5966. | $L_{A76}$ | $L_{B63}$ |
| 5967. | $L_{A77}$ | $L_{B63}$ |
| 5968. | $L_{A78}$ | $L_{B63}$ |
| 5969. | $L_{A79}$ | $L_{B63}$ |
| 5970. | $L_{A80}$ | $L_{B63}$ |
| 5971. | $L_{A81}$ | $L_{B63}$ |
| 5972. | $L_{A82}$ | $L_{B63}$ |
| 5973. | $L_{A83}$ | $L_{B63}$ |
| 5974. | $L_{A84}$ | $L_{B63}$ |
| 5975. | $L_{A85}$ | $L_{B63}$ |
| 5976. | $L_{A86}$ | $L_{B63}$ |
| 5977. | $L_{A87}$ | $L_{B63}$ |
| 5978. | $L_{A88}$ | $L_{B63}$ |
| 5979. | $L_{A89}$ | $L_{B63}$ |
| 5980. | $L_{A90}$ | $L_{B63}$ |
| 5981. | $L_{A91}$ | $L_{B63}$ |
| 5982. | $L_{A92}$ | $L_{B63}$ |
| 5983. | $L_{A93}$ | $L_{B63}$ |
| 5984. | $L_{A94}$ | $L_{B63}$ |
| 5985. | $L_{A95}$ | $L_{B63}$ |
| 5986. | $L_{A1}$ | $L_{B64}$ |
| 5987. | $L_{A2}$ | $L_{B64}$ |
| 5988. | $L_{A3}$ | $L_{B64}$ |
| 5989. | $L_{A4}$ | $L_{B64}$ |
| 5990. | $L_{A5}$ | $L_{B64}$ |
| 5991. | $L_{A6}$ | $L_{B64}$ |
| 5992. | $L_{A7}$ | $L_{B64}$ |
| 5993. | $L_{A8}$ | $L_{B64}$ |
| 5994. | $L_{A9}$ | $L_{B64}$ |
| 5995. | $L_{A10}$ | $L_{B64}$ |
| 5996. | $L_{A11}$ | $L_{B64}$ |
| 5997. | $L_{A12}$ | $L_{B64}$ |
| 5998. | $L_{A13}$ | $L_{B64}$ |
| 5999. | $L_{A14}$ | $L_{B64}$ |
| 6000. | $L_{A15}$ | $L_{B64}$ |
| 6001. | $L_{A16}$ | $L_{B64}$ |
| 6002. | $L_{A17}$ | $L_{B64}$ |
| 6003. | $L_{A18}$ | $L_{B64}$ |
| 6004. | $L_{A19}$ | $L_{B64}$ |
| 6005. | $L_{A20}$ | $L_{B64}$ |
| 6006. | $L_{A21}$ | $L_{B64}$ |
| 6007. | $L_{A22}$ | $L_{B64}$ |
| 6008. | $L_{A23}$ | $L_{B64}$ |
| 6009. | $L_{A24}$ | $L_{B64}$ |
| 6010. | $L_{A25}$ | $L_{B64}$ |
| 6011. | $L_{A26}$ | $L_{B64}$ |
| 6012. | $L_{A27}$ | $L_{B64}$ |
| 6013. | $L_{A28}$ | $L_{B64}$ |
| 6014. | $L_{A29}$ | $L_{B64}$ |
| 6015. | $L_{A30}$ | $L_{B64}$ |
| 6016. | $L_{A31}$ | $L_{B64}$ |
| 6017. | $L_{A32}$ | $L_{B64}$ |
| 6018. | $L_{A33}$ | $L_{B64}$ |
| 6019. | $L_{A34}$ | $L_{B64}$ |
| 6020. | $L_{A35}$ | $L_{B64}$ |
| 6021. | $L_{A36}$ | $L_{B64}$ |
| 6022. | $L_{A37}$ | $L_{B64}$ |
| 6023. | $L_{A38}$ | $L_{B64}$ |
| 6024. | $L_{A39}$ | $L_{B64}$ |
| 6025. | $L_{A40}$ | $L_{B64}$ |
| 6026. | $L_{A41}$ | $L_{B64}$ |
| 6027. | $L_{A42}$ | $L_{B64}$ |
| 6028. | $L_{A43}$ | $L_{B64}$ |
| 6029. | $L_{A44}$ | $L_{B64}$ |
| 6030. | $L_{A45}$ | $L_{B64}$ |
| 6031. | $L_{A46}$ | $L_{B64}$ |
| 6032. | $L_{A47}$ | $L_{B64}$ |

TABLE 1-continued

| Cpd # | $L_A$ | $L_B$ |
|---|---|---|
| 6033. | $L_{A48}$ | $L_{B64}$ |
| 6034. | $L_{A49}$ | $L_{B64}$ |
| 6035. | $L_{A50}$ | $L_{B64}$ |
| 6036. | $L_{A51}$ | $L_{B64}$ |
| 6037. | $L_{A52}$ | $L_{B64}$ |
| 6038. | $L_{A53}$ | $L_{B64}$ |
| 6039. | $L_{A54}$ | $L_{B64}$ |
| 6040. | $L_{A55}$ | $L_{B64}$ |
| 6041. | $L_{A56}$ | $L_{B64}$ |
| 6042. | $L_{A57}$ | $L_{B64}$ |
| 6043. | $L_{A58}$ | $L_{B64}$ |
| 6044. | $L_{A59}$ | $L_{B64}$ |
| 6045. | $L_{A60}$ | $L_{B64}$ |
| 6046. | $L_{A61}$ | $L_{B64}$ |
| 6047. | $L_{A62}$ | $L_{B64}$ |
| 6048. | $L_{A63}$ | $L_{B64}$ |
| 6049. | $L_{A64}$ | $L_{B64}$ |
| 6050. | $L_{A65}$ | $L_{B64}$ |
| 6051. | $L_{A66}$ | $L_{B64}$ |
| 6052. | $L_{A67}$ | $L_{B64}$ |
| 6053. | $L_{A68}$ | $L_{B64}$ |
| 6054. | $L_{A69}$ | $L_{B64}$ |
| 6055. | $L_{A70}$ | $L_{B64}$ |
| 6056. | $L_{A71}$ | $L_{B64}$ |
| 6057. | $L_{A72}$ | $L_{B64}$ |
| 6058. | $L_{A73}$ | $L_{B64}$ |
| 6059. | $L_{A74}$ | $L_{B64}$ |
| 6060. | $L_{A75}$ | $L_{B64}$ |
| 6061. | $L_{A76}$ | $L_{B64}$ |
| 6062. | $L_{A77}$ | $L_{B64}$ |
| 6063. | $L_{A78}$ | $L_{B64}$ |
| 6064. | $L_{A79}$ | $L_{B64}$ |
| 6065. | $L_{A80}$ | $L_{B64}$ |
| 6066. | $L_{A81}$ | $L_{B64}$ |
| 6067. | $L_{A82}$ | $L_{B64}$ |
| 6068. | $L_{A83}$ | $L_{B64}$ |
| 6069. | $L_{A84}$ | $L_{B64}$ |
| 6070. | $L_{A85}$ | $L_{B64}$ |
| 6071. | $L_{A86}$ | $L_{B64}$ |
| 6072. | $L_{A87}$ | $L_{B64}$ |
| 6073. | $L_{A88}$ | $L_{B64}$ |
| 6074. | $L_{A89}$ | $L_{B64}$ |
| 6075. | $L_{A90}$ | $L_{B64}$ |
| 6076. | $L_{A91}$ | $L_{B64}$ |
| 6077. | $L_{A92}$ | $L_{B64}$ |
| 6078. | $L_{A93}$ | $L_{B64}$ |
| 6079. | $L_{A94}$ | $L_{B64}$ |
| 6080. | $L_{A95}$ | $L_{B64}$ |
| 6081. | $L_{A1}$ | $L_{B65}$ |
| 6082. | $L_{A2}$ | $L_{B65}$ |
| 6083. | $L_{A3}$ | $L_{B65}$ |
| 6084. | $L_{A4}$ | $L_{B65}$ |
| 6085. | $L_{A5}$ | $L_{B65}$ |
| 6086. | $L_{A6}$ | $L_{B65}$ |
| 6087. | $L_{A7}$ | $L_{B65}$ |
| 6088. | $L_{A8}$ | $L_{B65}$ |
| 6089. | $L_{A9}$ | $L_{B65}$ |
| 6090. | $L_{A10}$ | $L_{B65}$ |
| 6091. | $L_{A11}$ | $L_{B65}$ |
| 6092. | $L_{A12}$ | $L_{B65}$ |
| 6093. | $L_{A13}$ | $L_{B65}$ |
| 6094. | $L_{A14}$ | $L_{B65}$ |
| 6095. | $L_{A15}$ | $L_{B65}$ |
| 6096. | $L_{A16}$ | $L_{B65}$ |
| 6097. | $L_{A17}$ | $L_{B65}$ |
| 6098. | $L_{A18}$ | $L_{B65}$ |
| 6099. | $L_{A19}$ | $L_{B65}$ |
| 6100. | $L_{A20}$ | $L_{B65}$ |
| 6101. | $L_{A21}$ | $L_{B65}$ |
| 6102. | $L_{A22}$ | $L_{B65}$ |
| 6103. | $L_{A23}$ | $L_{B65}$ |
| 6104. | $L_{A24}$ | $L_{B65}$ |
| 6105. | $L_{A25}$ | $L_{B65}$ |
| 6106. | $L_{A26}$ | $L_{B65}$ |
| 6107. | $L_{A27}$ | $L_{B65}$ |
| 6108. | $L_{A28}$ | $L_{B65}$ |
| 6109. | $L_{A29}$ | $L_{B65}$ |
| 6110. | $L_{A30}$ | $L_{B65}$ |

TABLE 1-continued

| Cpd # | $L_A$ | $L_B$ |
|---|---|---|
| 6111. | $L_{A31}$ | $L_{B65}$ |
| 6112. | $L_{A32}$ | $L_{B65}$ |
| 6113. | $L_{A33}$ | $L_{B65}$ |
| 6114. | $L_{A34}$ | $L_{B65}$ |
| 6115. | $L_{A35}$ | $L_{B65}$ |
| 6116. | $L_{A36}$ | $L_{B65}$ |
| 6117. | $L_{A37}$ | $L_{B65}$ |
| 6118. | $L_{A38}$ | $L_{B65}$ |
| 6119. | $L_{A39}$ | $L_{B65}$ |
| 6120. | $L_{A40}$ | $L_{B65}$ |
| 6121. | $L_{A41}$ | $L_{B65}$ |
| 6122. | $L_{A42}$ | $L_{B65}$ |
| 6123. | $L_{A43}$ | $L_{B65}$ |
| 6124. | $L_{A44}$ | $L_{B65}$ |
| 6125. | $L_{A45}$ | $L_{B65}$ |
| 6126. | $L_{A46}$ | $L_{B65}$ |
| 6127. | $L_{A47}$ | $L_{B65}$ |
| 6128. | $L_{A48}$ | $L_{B65}$ |
| 6129. | $L_{A49}$ | $L_{B65}$ |
| 6130. | $L_{A50}$ | $L_{B65}$ |
| 6131. | $L_{A51}$ | $L_{B65}$ |
| 6132. | $L_{A52}$ | $L_{B65}$ |
| 6133. | $L_{A53}$ | $L_{B65}$ |
| 6134. | $L_{A54}$ | $L_{B65}$ |
| 6135. | $L_{A55}$ | $L_{B65}$ |
| 6136. | $L_{A56}$ | $L_{B65}$ |
| 6137. | $L_{A57}$ | $L_{B65}$ |
| 6138. | $L_{A58}$ | $L_{B65}$ |
| 6139. | $L_{A59}$ | $L_{B65}$ |
| 6140. | $L_{A60}$ | $L_{B65}$ |
| 6141. | $L_{A61}$ | $L_{B65}$ |
| 6142. | $L_{A62}$ | $L_{B65}$ |
| 6143. | $L_{A63}$ | $L_{B65}$ |
| 6144. | $L_{A64}$ | $L_{B65}$ |
| 6145. | $L_{A65}$ | $L_{B65}$ |
| 6146. | $L_{A66}$ | $L_{B65}$ |
| 6147. | $L_{A67}$ | $L_{B65}$ |
| 6148. | $L_{A68}$ | $L_{B65}$ |
| 6149. | $L_{A69}$ | $L_{B65}$ |
| 6150. | $L_{A70}$ | $L_{B65}$ |
| 6151. | $L_{A71}$ | $L_{B65}$ |
| 6152. | $L_{A72}$ | $L_{B65}$ |
| 6153. | $L_{A73}$ | $L_{B65}$ |
| 6154. | $L_{A74}$ | $L_{B65}$ |
| 6155. | $L_{A75}$ | $L_{B65}$ |
| 6156. | $L_{A76}$ | $L_{B65}$ |
| 6157. | $L_{A77}$ | $L_{B65}$ |
| 6158. | $L_{A78}$ | $L_{B65}$ |
| 6159. | $L_{A79}$ | $L_{B65}$ |
| 6160. | $L_{A80}$ | $L_{B65}$ |
| 6161. | $L_{A81}$ | $L_{B65}$ |
| 6162. | $L_{A82}$ | $L_{B65}$ |
| 6163. | $L_{A83}$ | $L_{B65}$ |
| 6164. | $L_{A84}$ | $L_{B65}$ |
| 6165. | $L_{A85}$ | $L_{B65}$ |
| 6166. | $L_{A86}$ | $L_{B65}$ |
| 6167. | $L_{A87}$ | $L_{B65}$ |
| 6168. | $L_{A88}$ | $L_{B65}$ |
| 6169. | $L_{A89}$ | $L_{B65}$ |
| 6170. | $L_{A90}$ | $L_{B65}$ |
| 6171. | $L_{A91}$ | $L_{B65}$ |
| 6172. | $L_{A92}$ | $L_{B65}$ |
| 6173. | $L_{A93}$ | $L_{B65}$ |
| 6174. | $L_{A94}$ | $L_{B65}$ |
| 6175. | $L_{A95}$ | $L_{B65}$ |
| 6176. | $L_{A1}$ | $L_{B66}$ |
| 6177. | $L_{A2}$ | $L_{B66}$ |
| 6178. | $L_{A3}$ | $L_{B66}$ |
| 6179. | $L_{A4}$ | $L_{B66}$ |
| 6180. | $L_{A5}$ | $L_{B66}$ |
| 6181. | $L_{A6}$ | $L_{B66}$ |
| 6182. | $L_{A7}$ | $L_{B66}$ |
| 6183. | $L_{A8}$ | $L_{B66}$ |
| 6184. | $L_{A9}$ | $L_{B66}$ |
| 6185. | $L_{A10}$ | $L_{B66}$ |
| 6186. | $L_{A11}$ | $L_{B66}$ |
| 6187. | $L_{A12}$ | $L_{B66}$ |
| 6188. | $L_{A13}$ | $L_{B66}$ |

TABLE 1-continued

| Cpd # | $L_A$ | $L_B$ |
|---|---|---|
| 6189. | $L_{A14}$ | $L_{B66}$ |
| 6190. | $L_{A15}$ | $L_{B66}$ |
| 6191. | $L_{A16}$ | $L_{B66}$ |
| 6192. | $L_{A17}$ | $L_{B66}$ |
| 6193. | $L_{A18}$ | $L_{B66}$ |
| 6194. | $L_{A19}$ | $L_{B66}$ |
| 6195. | $L_{A20}$ | $L_{B66}$ |
| 6196. | $L_{A21}$ | $L_{B66}$ |
| 6197. | $L_{A22}$ | $L_{B66}$ |
| 6198. | $L_{A23}$ | $L_{B66}$ |
| 6199. | $L_{A24}$ | $L_{B66}$ |
| 6200. | $L_{A25}$ | $L_{B66}$ |
| 6201. | $L_{A26}$ | $L_{B66}$ |
| 6202. | $L_{A27}$ | $L_{B66}$ |
| 6203. | $L_{A28}$ | $L_{B66}$ |
| 6204. | $L_{A29}$ | $L_{B66}$ |
| 6205. | $L_{A30}$ | $L_{B66}$ |
| 6206. | $L_{A31}$ | $L_{B66}$ |
| 6207. | $L_{A32}$ | $L_{B66}$ |
| 6208. | $L_{A33}$ | $L_{B66}$ |
| 6209. | $L_{A34}$ | $L_{B66}$ |
| 6210. | $L_{A35}$ | $L_{B66}$ |
| 6211. | $L_{A36}$ | $L_{B66}$ |
| 6212. | $L_{A37}$ | $L_{B66}$ |
| 6213. | $L_{A38}$ | $L_{B66}$ |
| 6214. | $L_{A39}$ | $L_{B66}$ |
| 6215. | $L_{A40}$ | $L_{B66}$ |
| 6216. | $L_{A41}$ | $L_{B66}$ |
| 6217. | $L_{A42}$ | $L_{B66}$ |
| 6218. | $L_{A43}$ | $L_{B66}$ |
| 6219. | $L_{A44}$ | $L_{B66}$ |
| 6220. | $L_{A45}$ | $L_{B66}$ |
| 6221. | $L_{A46}$ | $L_{B66}$ |
| 6222. | $L_{A47}$ | $L_{B66}$ |
| 6223. | $L_{A48}$ | $L_{B66}$ |
| 6224. | $L_{A49}$ | $L_{B66}$ |
| 6225. | $L_{A50}$ | $L_{B66}$ |
| 6226. | $L_{A51}$ | $L_{B66}$ |
| 6227. | $L_{A52}$ | $L_{B66}$ |
| 6228. | $L_{A53}$ | $L_{B66}$ |
| 6229. | $L_{A54}$ | $L_{B66}$ |
| 6230. | $L_{A55}$ | $L_{B66}$ |
| 6231. | $L_{A56}$ | $L_{B66}$ |
| 6232. | $L_{A57}$ | $L_{B66}$ |
| 6233. | $L_{A58}$ | $L_{B66}$ |
| 6234. | $L_{A59}$ | $L_{B66}$ |
| 6235. | $L_{A60}$ | $L_{B66}$ |
| 6236. | $L_{A61}$ | $L_{B66}$ |
| 6237. | $L_{A62}$ | $L_{B66}$ |
| 6238. | $L_{A63}$ | $L_{B66}$ |
| 6239. | $L_{A64}$ | $L_{B66}$ |
| 6240. | $L_{A65}$ | $L_{B66}$ |
| 6241. | $L_{A66}$ | $L_{B66}$ |
| 6242. | $L_{A67}$ | $L_{B66}$ |
| 6243. | $L_{A68}$ | $L_{B66}$ |
| 6244. | $L_{A69}$ | $L_{B66}$ |
| 6245. | $L_{A70}$ | $L_{B66}$ |
| 6246. | $L_{A71}$ | $L_{B66}$ |
| 6247. | $L_{A72}$ | $L_{B66}$ |
| 6248. | $L_{A73}$ | $L_{B66}$ |
| 6249. | $L_{A74}$ | $L_{B66}$ |
| 6250. | $L_{A75}$ | $L_{B66}$ |
| 6251. | $L_{A76}$ | $L_{B66}$ |
| 6252. | $L_{A77}$ | $L_{B66}$ |
| 6253. | $L_{A78}$ | $L_{B66}$ |
| 6254. | $L_{A79}$ | $L_{B66}$ |
| 6255. | $L_{A80}$ | $L_{B66}$ |
| 6256. | $L_{A81}$ | $L_{B66}$ |
| 6257. | $L_{A82}$ | $L_{B66}$ |
| 6258. | $L_{A83}$ | $L_{B66}$ |
| 6259. | $L_{A84}$ | $L_{B66}$ |
| 6260. | $L_{A85}$ | $L_{B66}$ |
| 6261. | $L_{A86}$ | $L_{B66}$ |
| 6262. | $L_{A87}$ | $L_{B66}$ |
| 6263. | $L_{A88}$ | $L_{B66}$ |
| 6264. | $L_{A89}$ | $L_{B66}$ |
| 6265. | $L_{A90}$ | $L_{B66}$ |
| 6266. | $L_{A91}$ | $L_{B66}$ |

TABLE 1-continued

| Cpd # | $L_A$ | $L_B$ |
|---|---|---|
| 6267. | $L_{A92}$ | $L_{B66}$ |
| 6268. | $L_{A93}$ | $L_{B66}$ |
| 6269. | $L_{A94}$ | $L_{B66}$ |
| 6270. | $L_{A95}$ | $L_{B66}$ |
| 6271. | $L_{A1}$ | $L_{B67}$ |
| 6272. | $L_{A2}$ | $L_{B67}$ |
| 6273. | $L_{A3}$ | $L_{B67}$ |
| 6274. | $L_{A4}$ | $L_{B67}$ |
| 6275. | $L_{A5}$ | $L_{B67}$ |
| 6276. | $L_{A6}$ | $L_{B67}$ |
| 6277. | $L_{A7}$ | $L_{B67}$ |
| 6278. | $L_{A8}$ | $L_{B67}$ |
| 6279. | $L_{A9}$ | $L_{B67}$ |
| 6280. | $L_{A10}$ | $L_{B67}$ |
| 6281. | $L_{A11}$ | $L_{B67}$ |
| 6282. | $L_{A12}$ | $L_{B67}$ |
| 6283. | $L_{A13}$ | $L_{B67}$ |
| 6284. | $L_{A14}$ | $L_{B67}$ |
| 6285. | $L_{A15}$ | $L_{B67}$ |
| 6286. | $L_{A16}$ | $L_{B67}$ |
| 6287. | $L_{A17}$ | $L_{B67}$ |
| 6288. | $L_{A18}$ | $L_{B67}$ |
| 6289. | $L_{A19}$ | $L_{B67}$ |
| 6290. | $L_{A20}$ | $L_{B67}$ |
| 6291. | $L_{A21}$ | $L_{B67}$ |
| 6292. | $L_{A22}$ | $L_{B67}$ |
| 6293. | $L_{A23}$ | $L_{B67}$ |
| 6294. | $L_{A24}$ | $L_{B67}$ |
| 6295. | $L_{A25}$ | $L_{B67}$ |
| 6296. | $L_{A26}$ | $L_{B67}$ |
| 6297. | $L_{A27}$ | $L_{B67}$ |
| 6298. | $L_{A28}$ | $L_{B67}$ |
| 6299. | $L_{A29}$ | $L_{B67}$ |
| 6300. | $L_{A30}$ | $L_{B67}$ |
| 6301. | $L_{A31}$ | $L_{B67}$ |
| 6302. | $L_{A32}$ | $L_{B67}$ |
| 6303. | $L_{A33}$ | $L_{B67}$ |
| 6304. | $L_{A34}$ | $L_{B67}$ |
| 6305. | $L_{A35}$ | $L_{B67}$ |
| 6306. | $L_{A36}$ | $L_{B67}$ |
| 6307. | $L_{A37}$ | $L_{B67}$ |
| 6308. | $L_{A38}$ | $L_{B67}$ |
| 6309. | $L_{A39}$ | $L_{B67}$ |
| 6310. | $L_{A40}$ | $L_{B67}$ |
| 6311. | $L_{A41}$ | $L_{B67}$ |
| 6312. | $L_{A42}$ | $L_{B67}$ |
| 6313. | $L_{A43}$ | $L_{B67}$ |
| 6314. | $L_{A44}$ | $L_{B67}$ |
| 6315. | $L_{A45}$ | $L_{B67}$ |
| 6316. | $L_{A46}$ | $L_{B67}$ |
| 6317. | $L_{A47}$ | $L_{B67}$ |
| 6318. | $L_{A48}$ | $L_{B67}$ |
| 6319. | $L_{A49}$ | $L_{B67}$ |
| 6320. | $L_{A50}$ | $L_{B67}$ |
| 6321. | $L_{A51}$ | $L_{B67}$ |
| 6322. | $L_{A52}$ | $L_{B67}$ |
| 6323. | $L_{A53}$ | $L_{B67}$ |
| 6324. | $L_{A54}$ | $L_{B67}$ |
| 6325. | $L_{A55}$ | $L_{B67}$ |
| 6326. | $L_{A56}$ | $L_{B67}$ |
| 6327. | $L_{A57}$ | $L_{B67}$ |
| 6328. | $L_{A58}$ | $L_{B67}$ |
| 6329. | $L_{A59}$ | $L_{B67}$ |
| 6330. | $L_{A60}$ | $L_{B67}$ |
| 6331. | $L_{A61}$ | $L_{B67}$ |
| 6332. | $L_{A62}$ | $L_{B67}$ |
| 6333. | $L_{A63}$ | $L_{B67}$ |
| 6334. | $L_{A64}$ | $L_{B67}$ |
| 6335. | $L_{A65}$ | $L_{B67}$ |
| 6336. | $L_{A66}$ | $L_{B67}$ |
| 6337. | $L_{A67}$ | $L_{B67}$ |
| 6338. | $L_{A68}$ | $L_{B67}$ |
| 6339. | $L_{A69}$ | $L_{B67}$ |
| 6340. | $L_{A70}$ | $L_{B67}$ |
| 6341. | $L_{A71}$ | $L_{B67}$ |
| 6342. | $L_{A72}$ | $L_{B67}$ |
| 6343. | $L_{A73}$ | $L_{B67}$ |
| 6344. | $L_{A74}$ | $L_{B67}$ |

TABLE 1-continued

| Cpd # | $L_A$ | $L_B$ |
|---|---|---|
| 6345. | $L_{A75}$ | $L_{B67}$ |
| 6346. | $L_{A76}$ | $L_{B67}$ |
| 6347. | $L_{A77}$ | $L_{B67}$ |
| 6348. | $L_{A78}$ | $L_{B67}$ |
| 6349. | $L_{A79}$ | $L_{B67}$ |
| 6350. | $L_{A80}$ | $L_{B67}$ |
| 6351. | $L_{A81}$ | $L_{B67}$ |
| 6352. | $L_{A82}$ | $L_{B67}$ |
| 6353. | $L_{A83}$ | $L_{B67}$ |
| 6354. | $L_{A84}$ | $L_{B67}$ |
| 6355. | $L_{A85}$ | $L_{B67}$ |
| 6356. | $L_{A86}$ | $L_{B67}$ |
| 6357. | $L_{A87}$ | $L_{B67}$ |
| 6358. | $L_{A88}$ | $L_{B67}$ |
| 6359. | $L_{A89}$ | $L_{B67}$ |
| 6360. | $L_{A90}$ | $L_{B67}$ |
| 6361. | $L_{A91}$ | $L_{B67}$ |
| 6362. | $L_{A92}$ | $L_{B67}$ |
| 6363. | $L_{A93}$ | $L_{B67}$ |
| 6364. | $L_{A94}$ | $L_{B67}$ |
| 6365. | $L_{A95}$ | $L_{B67}$ |
| 6366. | $L_{A1}$ | $L_{B68}$ |
| 6367. | $L_{A2}$ | $L_{B68}$ |
| 6368. | $L_{A3}$ | $L_{B68}$ |
| 6369. | $L_{A4}$ | $L_{B68}$ |
| 6370. | $L_{A5}$ | $L_{B68}$ |
| 6371. | $L_{A6}$ | $L_{B68}$ |
| 6372. | $L_{A7}$ | $L_{B68}$ |
| 6373. | $L_{A8}$ | $L_{B68}$ |
| 6374. | $L_{A9}$ | $L_{B68}$ |
| 6375. | $L_{A10}$ | $L_{B68}$ |
| 6376. | $L_{A11}$ | $L_{B68}$ |
| 6377. | $L_{A12}$ | $L_{B68}$ |
| 6378. | $L_{A13}$ | $L_{B68}$ |
| 6379. | $L_{A14}$ | $L_{B68}$ |
| 6380. | $L_{A15}$ | $L_{B68}$ |
| 6381. | $L_{A16}$ | $L_{B68}$ |
| 6382. | $L_{A17}$ | $L_{B68}$ |
| 6383. | $L_{A18}$ | $L_{B68}$ |
| 6384. | $L_{A19}$ | $L_{B68}$ |
| 6385. | $L_{A20}$ | $L_{B68}$ |
| 6386. | $L_{A21}$ | $L_{B68}$ |
| 6387. | $L_{A22}$ | $L_{B68}$ |
| 6388. | $L_{A23}$ | $L_{B68}$ |
| 6389. | $L_{A24}$ | $L_{B68}$ |
| 6390. | $L_{A25}$ | $L_{B68}$ |
| 6391. | $L_{A26}$ | $L_{B68}$ |
| 6392. | $L_{A27}$ | $L_{B68}$ |
| 6393. | $L_{A28}$ | $L_{B68}$ |
| 6394. | $L_{A29}$ | $L_{B68}$ |
| 6395. | $L_{A30}$ | $L_{B68}$ |
| 6396. | $L_{A31}$ | $L_{B68}$ |
| 6397. | $L_{A32}$ | $L_{B68}$ |
| 6398. | $L_{A33}$ | $L_{B68}$ |
| 6399. | $L_{A34}$ | $L_{B68}$ |
| 6400. | $L_{A35}$ | $L_{B68}$ |
| 6401. | $L_{A36}$ | $L_{B68}$ |
| 6402. | $L_{A37}$ | $L_{B68}$ |
| 6403. | $L_{A38}$ | $L_{B68}$ |
| 6404. | $L_{A39}$ | $L_{B68}$ |
| 6405. | $L_{A40}$ | $L_{B68}$ |
| 6406. | $L_{A41}$ | $L_{B68}$ |
| 6407. | $L_{A42}$ | $L_{B68}$ |
| 6408. | $L_{A43}$ | $L_{B68}$ |
| 6409. | $L_{A44}$ | $L_{B68}$ |
| 6410. | $L_{A45}$ | $L_{B68}$ |
| 6411. | $L_{A46}$ | $L_{B68}$ |
| 6412. | $L_{A47}$ | $L_{B68}$ |
| 6413. | $L_{A48}$ | $L_{B68}$ |
| 6414. | $L_{A49}$ | $L_{B68}$ |
| 6415. | $L_{A50}$ | $L_{B68}$ |
| 6416. | $L_{A51}$ | $L_{B68}$ |
| 6417. | $L_{A52}$ | $L_{B68}$ |
| 6418. | $L_{A53}$ | $L_{B68}$ |
| 6419. | $L_{A54}$ | $L_{B68}$ |
| 6420. | $L_{A55}$ | $L_{B68}$ |
| 6421. | $L_{A56}$ | $L_{B68}$ |
| 6422. | $L_{A57}$ | $L_{B68}$ |

TABLE 1-continued

| Cpd # | $L_A$ | $L_B$ |
|---|---|---|
| 6423. | $L_{A58}$ | $L_{B68}$ |
| 6424. | $L_{A59}$ | $L_{B68}$ |
| 6425. | $L_{A60}$ | $L_{B68}$ |
| 6426. | $L_{A61}$ | $L_{B68}$ |
| 6427. | $L_{A62}$ | $L_{B68}$ |
| 6428. | $L_{A63}$ | $L_{B68}$ |
| 6429. | $L_{A64}$ | $L_{B68}$ |
| 6430. | $L_{A65}$ | $L_{B68}$ |
| 6431. | $L_{A66}$ | $L_{B68}$ |
| 6432. | $L_{A67}$ | $L_{B68}$ |
| 6433. | $L_{A68}$ | $L_{B68}$ |
| 6434. | $L_{A69}$ | $L_{B68}$ |
| 6435. | $L_{A70}$ | $L_{B68}$ |
| 6436. | $L_{A71}$ | $L_{B68}$ |
| 6437. | $L_{A72}$ | $L_{B68}$ |
| 6438. | $L_{A73}$ | $L_{B68}$ |
| 6439. | $L_{A74}$ | $L_{B68}$ |
| 6440. | $L_{A75}$ | $L_{B68}$ |
| 6441. | $L_{A76}$ | $L_{B68}$ |
| 6442. | $L_{A77}$ | $L_{B68}$ |
| 6443. | $L_{A78}$ | $L_{B68}$ |
| 6444. | $L_{A79}$ | $L_{B68}$ |
| 6445. | $L_{A80}$ | $L_{B68}$ |
| 6446. | $L_{A81}$ | $L_{B68}$ |
| 6447. | $L_{A82}$ | $L_{B68}$ |
| 6448. | $L_{A83}$ | $L_{B68}$ |
| 6449. | $L_{A84}$ | $L_{B68}$ |
| 6450. | $L_{A85}$ | $L_{B68}$ |
| 6451. | $L_{A86}$ | $L_{B68}$ |
| 6452. | $L_{A87}$ | $L_{B68}$ |
| 6453. | $L_{A88}$ | $L_{B68}$ |
| 6454. | $L_{A89}$ | $L_{B68}$ |
| 6455. | $L_{A90}$ | $L_{B68}$ |
| 6456. | $L_{A91}$ | $L_{B68}$ |
| 6457. | $L_{A92}$ | $L_{B68}$ |
| 6458. | $L_{A93}$ | $L_{B68}$ |
| 6459. | $L_{A94}$ | $L_{B68}$ |
| 6460. | $L_{A95}$ | $L_{B68}$ |
| 6461. | $L_{A1}$ | $L_{B69}$ |
| 6462. | $L_{A2}$ | $L_{B69}$ |
| 6463. | $L_{A3}$ | $L_{B69}$ |
| 6464. | $L_{A4}$ | $L_{B69}$ |
| 6465. | $L_{A5}$ | $L_{B69}$ |
| 6466. | $L_{A6}$ | $L_{B69}$ |
| 6467. | $L_{A7}$ | $L_{B69}$ |
| 6468. | $L_{A8}$ | $L_{B69}$ |
| 6469. | $L_{A9}$ | $L_{B69}$ |
| 6470. | $L_{A10}$ | $L_{B69}$ |
| 6471. | $L_{A11}$ | $L_{B69}$ |
| 6472. | $L_{A12}$ | $L_{B69}$ |
| 6473. | $L_{A13}$ | $L_{B69}$ |
| 6474. | $L_{A14}$ | $L_{B69}$ |
| 6475. | $L_{A15}$ | $L_{B69}$ |
| 6476. | $L_{A16}$ | $L_{B69}$ |
| 6477. | $L_{A17}$ | $L_{B69}$ |
| 6478. | $L_{A18}$ | $L_{B69}$ |
| 6479. | $L_{A19}$ | $L_{B69}$ |
| 6480. | $L_{A20}$ | $L_{B69}$ |
| 6481. | $L_{A21}$ | $L_{B69}$ |
| 6482. | $L_{A22}$ | $L_{B69}$ |
| 6483. | $L_{A23}$ | $L_{B69}$ |
| 6484. | $L_{A24}$ | $L_{B69}$ |
| 6485. | $L_{A25}$ | $L_{B69}$ |
| 6486. | $L_{A26}$ | $L_{B69}$ |
| 6487. | $L_{A27}$ | $L_{B69}$ |
| 6488. | $L_{A28}$ | $L_{B69}$ |
| 6489. | $L_{A29}$ | $L_{B69}$ |
| 6490. | $L_{A30}$ | $L_{B69}$ |
| 6491. | $L_{A31}$ | $L_{B69}$ |
| 6492. | $L_{A32}$ | $L_{B69}$ |
| 6493. | $L_{A33}$ | $L_{B69}$ |
| 6494. | $L_{A34}$ | $L_{B69}$ |
| 6495. | $L_{A35}$ | $L_{B69}$ |
| 6496. | $L_{A36}$ | $L_{B69}$ |
| 6497. | $L_{A37}$ | $L_{B69}$ |
| 6498. | $L_{A38}$ | $L_{B69}$ |
| 6499. | $L_{A39}$ | $L_{B69}$ |
| 6500. | $L_{A40}$ | $L_{B69}$ |

TABLE 1-continued

| Cpd # | $L_A$ | $L_B$ |
|---|---|---|
| 6501. | $L_{A41}$ | $L_{B69}$ |
| 6502. | $L_{A42}$ | $L_{B69}$ |
| 6503. | $L_{A43}$ | $L_{B69}$ |
| 6504. | $L_{A44}$ | $L_{B69}$ |
| 6505. | $L_{A45}$ | $L_{B69}$ |
| 6506. | $L_{A46}$ | $L_{B69}$ |
| 6507. | $L_{A47}$ | $L_{B69}$ |
| 6508. | $L_{A48}$ | $L_{B69}$ |
| 6509. | $L_{A49}$ | $L_{B69}$ |
| 6510. | $L_{A50}$ | $L_{B69}$ |
| 6511. | $L_{A51}$ | $L_{B69}$ |
| 6512. | $L_{A52}$ | $L_{B69}$ |
| 6513. | $L_{A53}$ | $L_{B69}$ |
| 6514. | $L_{A54}$ | $L_{B69}$ |
| 6515. | $L_{A55}$ | $L_{B69}$ |
| 6516. | $L_{A56}$ | $L_{B69}$ |
| 6517. | $L_{A57}$ | $L_{B69}$ |
| 6518. | $L_{A58}$ | $L_{B69}$ |
| 6519. | $L_{A59}$ | $L_{B69}$ |
| 6520. | $L_{A60}$ | $L_{B69}$ |
| 6521. | $L_{A61}$ | $L_{B69}$ |
| 6522. | $L_{A62}$ | $L_{B69}$ |
| 6523. | $L_{A63}$ | $L_{B69}$ |
| 6524. | $L_{A64}$ | $L_{B69}$ |
| 6525. | $L_{A65}$ | $L_{B69}$ |
| 6526. | $L_{A66}$ | $L_{B69}$ |
| 6527. | $L_{A67}$ | $L_{B69}$ |
| 6528. | $L_{A68}$ | $L_{B69}$ |
| 6529. | $L_{A69}$ | $L_{B69}$ |
| 6530. | $L_{A70}$ | $L_{B69}$ |
| 6531. | $L_{A71}$ | $L_{B69}$ |
| 6532. | $L_{A72}$ | $L_{B69}$ |
| 6533. | $L_{A73}$ | $L_{B69}$ |
| 6534. | $L_{A74}$ | $L_{B69}$ |
| 6535. | $L_{A75}$ | $L_{B69}$ |
| 6536. | $L_{A76}$ | $L_{B69}$ |
| 6537. | $L_{A77}$ | $L_{B69}$ |
| 6538. | $L_{A78}$ | $L_{B69}$ |
| 6539. | $L_{A79}$ | $L_{B69}$ |
| 6540. | $L_{A80}$ | $L_{B69}$ |
| 6541. | $L_{A81}$ | $L_{B69}$ |
| 6542. | $L_{A82}$ | $L_{B69}$ |
| 6543. | $L_{A83}$ | $L_{B69}$ |
| 6544. | $L_{A84}$ | $L_{B69}$ |
| 6545. | $L_{A85}$ | $L_{B69}$ |
| 6546. | $L_{A86}$ | $L_{B69}$ |
| 6547. | $L_{A87}$ | $L_{B69}$ |
| 6548. | $L_{A88}$ | $L_{B69}$ |
| 6549. | $L_{A89}$ | $L_{B69}$ |
| 6550. | $L_{A90}$ | $L_{B69}$ |
| 6551. | $L_{A91}$ | $L_{B69}$ |
| 6552. | $L_{A92}$ | $L_{B69}$ |
| 6553. | $L_{A93}$ | $L_{B69}$ |
| 6554. | $L_{A94}$ | $L_{B69}$ |
| 6555. | $L_{A95}$ | $L_{B69}$ |
| 6556. | $L_{A1}$ | $L_{B70}$ |
| 6557. | $L_{A2}$ | $L_{B70}$ |
| 6558. | $L_{A3}$ | $L_{B70}$ |
| 6559. | $L_{A4}$ | $L_{B70}$ |
| 6560. | $L_{A5}$ | $L_{B70}$ |
| 6561. | $L_{A6}$ | $L_{B70}$ |
| 6562. | $L_{A7}$ | $L_{B70}$ |
| 6563. | $L_{A8}$ | $L_{B70}$ |
| 6564. | $L_{A9}$ | $L_{B70}$ |
| 6565. | $L_{A10}$ | $L_{B70}$ |
| 6566. | $L_{A11}$ | $L_{B70}$ |
| 6567. | $L_{A12}$ | $L_{B70}$ |
| 6568. | $L_{A13}$ | $L_{B70}$ |
| 6569. | $L_{A14}$ | $L_{B70}$ |
| 6570. | $L_{A15}$ | $L_{B70}$ |
| 6571. | $L_{A16}$ | $L_{B70}$ |
| 6572. | $L_{A17}$ | $L_{B70}$ |
| 6573. | $L_{A18}$ | $L_{B70}$ |
| 6574. | $L_{A19}$ | $L_{B70}$ |
| 6575. | $L_{A20}$ | $L_{B70}$ |
| 6576. | $L_{A21}$ | $L_{B70}$ |
| 6577. | $L_{A22}$ | $L_{B70}$ |
| 6578. | $L_{A23}$ | $L_{B70}$ |

TABLE 1-continued

| Cpd # | $L_A$ | $L_B$ |
|---|---|---|
| 6579. | $L_{A24}$ | $L_{B70}$ |
| 6580. | $L_{A25}$ | $L_{B70}$ |
| 6581. | $L_{A26}$ | $L_{B70}$ |
| 6582. | $L_{A27}$ | $L_{B70}$ |
| 6583. | $L_{A28}$ | $L_{B70}$ |
| 6584. | $L_{A29}$ | $L_{B70}$ |
| 6585. | $L_{A30}$ | $L_{B70}$ |
| 6586. | $L_{A31}$ | $L_{B70}$ |
| 6587. | $L_{A32}$ | $L_{B70}$ |
| 6588. | $L_{A33}$ | $L_{B70}$ |
| 6589. | $L_{A34}$ | $L_{B70}$ |
| 6590. | $L_{A35}$ | $L_{B70}$ |
| 6591. | $L_{A36}$ | $L_{B70}$ |
| 6592. | $L_{A37}$ | $L_{B70}$ |
| 6593. | $L_{A38}$ | $L_{B70}$ |
| 6594. | $L_{A39}$ | $L_{B70}$ |
| 6595. | $L_{A40}$ | $L_{B70}$ |
| 6596. | $L_{A41}$ | $L_{B70}$ |
| 6597. | $L_{A42}$ | $L_{B70}$ |
| 6598. | $L_{A43}$ | $L_{B70}$ |
| 6599. | $L_{A44}$ | $L_{B70}$ |
| 6600. | $L_{A45}$ | $L_{B70}$ |
| 6601. | $L_{A46}$ | $L_{B70}$ |
| 6602. | $L_{A47}$ | $L_{B70}$ |
| 6603. | $L_{A48}$ | $L_{B70}$ |
| 6604. | $L_{A49}$ | $L_{B70}$ |
| 6605. | $L_{A50}$ | $L_{B70}$ |
| 6606. | $L_{A51}$ | $L_{B70}$ |
| 6607. | $L_{A52}$ | $L_{B70}$ |
| 6608. | $L_{A53}$ | $L_{B70}$ |
| 6609. | $L_{A54}$ | $L_{B70}$ |
| 6610. | $L_{A55}$ | $L_{B70}$ |
| 6611. | $L_{A56}$ | $L_{B70}$ |
| 6612. | $L_{A57}$ | $L_{B70}$ |
| 6613. | $L_{A58}$ | $L_{B70}$ |
| 6614. | $L_{A59}$ | $L_{B70}$ |
| 6615. | $L_{A60}$ | $L_{B70}$ |
| 6616. | $L_{A61}$ | $L_{B70}$ |
| 6617. | $L_{A62}$ | $L_{B70}$ |
| 6618. | $L_{A63}$ | $L_{B70}$ |
| 6619. | $L_{A64}$ | $L_{B70}$ |
| 6620. | $L_{A65}$ | $L_{B70}$ |
| 6621. | $L_{A66}$ | $L_{B70}$ |
| 6622. | $L_{A67}$ | $L_{B70}$ |
| 6623. | $L_{A68}$ | $L_{B70}$ |
| 6624. | $L_{A69}$ | $L_{B70}$ |
| 6625. | $L_{A70}$ | $L_{B70}$ |
| 6626. | $L_{A71}$ | $L_{B70}$ |
| 6627. | $L_{A72}$ | $L_{B70}$ |
| 6628. | $L_{A73}$ | $L_{B70}$ |
| 6629. | $L_{A74}$ | $L_{B70}$ |
| 6630. | $L_{A75}$ | $L_{B70}$ |
| 6631. | $L_{A76}$ | $L_{B70}$ |
| 6632. | $L_{A77}$ | $L_{B70}$ |
| 6633. | $L_{A78}$ | $L_{B70}$ |
| 6634. | $L_{A79}$ | $L_{B70}$ |
| 6635. | $L_{A80}$ | $L_{B70}$ |
| 6636. | $L_{A81}$ | $L_{B70}$ |
| 6637. | $L_{A82}$ | $L_{B70}$ |
| 6638. | $L_{A83}$ | $L_{B70}$ |
| 6639. | $L_{A84}$ | $L_{B70}$ |
| 6640. | $L_{A85}$ | $L_{B70}$ |
| 6641. | $L_{A86}$ | $L_{B70}$ |
| 6642. | $L_{A87}$ | $L_{B70}$ |
| 6643. | $L_{A88}$ | $L_{B70}$ |
| 6644. | $L_{A89}$ | $L_{B70}$ |
| 6645. | $L_{A90}$ | $L_{B70}$ |
| 6646. | $L_{A91}$ | $L_{B70}$ |
| 6647. | $L_{A92}$ | $L_{B70}$ |
| 6648. | $L_{A93}$ | $L_{B70}$ |
| 6649. | $L_{A94}$ | $L_{B70}$ |
| 6650. | $L_{A95}$ | $L_{B70}$ |
| 6651. | $L_{A1}$ | $L_{B71}$ |
| 6652. | $L_{A2}$ | $L_{B71}$ |
| 6653. | $L_{A3}$ | $L_{B71}$ |
| 6654. | $L_{A4}$ | $L_{B71}$ |
| 6655. | $L_{A5}$ | $L_{B71}$ |
| 6656. | $L_{A6}$ | $L_{B71}$ |

TABLE 1-continued

| Cpd # | $L_A$ | $L_B$ |
|---|---|---|
| 6657. | $L_{A7}$ | $L_{B71}$ |
| 6658. | $L_{A8}$ | $L_{B71}$ |
| 6659. | $L_{A9}$ | $L_{B71}$ |
| 6660. | $L_{A10}$ | $L_{B71}$ |
| 6661. | $L_{A11}$ | $L_{B71}$ |
| 6662. | $L_{A12}$ | $L_{B71}$ |
| 6663. | $L_{A13}$ | $L_{B71}$ |
| 6664. | $L_{A14}$ | $L_{B71}$ |
| 6665. | $L_{A15}$ | $L_{B71}$ |
| 6666. | $L_{A16}$ | $L_{B71}$ |
| 6667. | $L_{A17}$ | $L_{B71}$ |
| 6668. | $L_{A18}$ | $L_{B71}$ |
| 6669. | $L_{A19}$ | $L_{B71}$ |
| 6670. | $L_{A20}$ | $L_{B71}$ |
| 6671. | $L_{A21}$ | $L_{B71}$ |
| 6672. | $L_{A22}$ | $L_{B71}$ |
| 6673. | $L_{A23}$ | $L_{B71}$ |
| 6674. | $L_{A24}$ | $L_{B71}$ |
| 6675. | $L_{A25}$ | $L_{B71}$ |
| 6676. | $L_{A26}$ | $L_{B71}$ |
| 6677. | $L_{A27}$ | $L_{B71}$ |
| 6678. | $L_{A28}$ | $L_{B71}$ |
| 6679. | $L_{A29}$ | $L_{B71}$ |
| 6680. | $L_{A30}$ | $L_{B71}$ |
| 6681. | $L_{A31}$ | $L_{B71}$ |
| 6682. | $L_{A32}$ | $L_{B71}$ |
| 6683. | $L_{A33}$ | $L_{B71}$ |
| 6684. | $L_{A34}$ | $L_{B71}$ |
| 6685. | $L_{A35}$ | $L_{B71}$ |
| 6686. | $L_{A36}$ | $L_{B71}$ |
| 6687. | $L_{A37}$ | $L_{B71}$ |
| 6688. | $L_{A38}$ | $L_{B71}$ |
| 6689. | $L_{A39}$ | $L_{B71}$ |
| 6690. | $L_{A40}$ | $L_{B71}$ |
| 6691. | $L_{A41}$ | $L_{B71}$ |
| 6692. | $L_{A42}$ | $L_{B71}$ |
| 6693. | $L_{A43}$ | $L_{B71}$ |
| 6694. | $L_{A44}$ | $L_{B71}$ |
| 6695. | $L_{A45}$ | $L_{B71}$ |
| 6696. | $L_{A46}$ | $L_{B71}$ |
| 6697. | $L_{A47}$ | $L_{B71}$ |
| 6698. | $L_{A48}$ | $L_{B71}$ |
| 6699. | $L_{A49}$ | $L_{B71}$ |
| 6700. | $L_{A50}$ | $L_{B71}$ |
| 6701. | $L_{A51}$ | $L_{B71}$ |
| 6702. | $L_{A52}$ | $L_{B71}$ |
| 6703. | $L_{A53}$ | $L_{B71}$ |
| 6704. | $L_{A54}$ | $L_{B71}$ |
| 6705. | $L_{A55}$ | $L_{B71}$ |
| 6706. | $L_{A56}$ | $L_{B71}$ |
| 6707. | $L_{A57}$ | $L_{B71}$ |
| 6708. | $L_{A58}$ | $L_{B71}$ |
| 6709. | $L_{A59}$ | $L_{B71}$ |
| 6710. | $L_{A60}$ | $L_{B71}$ |
| 6711. | $L_{A61}$ | $L_{B71}$ |
| 6712. | $L_{A62}$ | $L_{B71}$ |
| 6713. | $L_{A63}$ | $L_{B71}$ |
| 6714. | $L_{A64}$ | $L_{B71}$ |
| 6715. | $L_{A65}$ | $L_{B71}$ |
| 6716. | $L_{A66}$ | $L_{B71}$ |
| 6717. | $L_{A67}$ | $L_{B71}$ |
| 6718. | $L_{A68}$ | $L_{B71}$ |
| 6719. | $L_{A69}$ | $L_{B71}$ |
| 6720. | $L_{A70}$ | $L_{B71}$ |
| 6721. | $L_{A71}$ | $L_{B71}$ |
| 6722. | $L_{A72}$ | $L_{B71}$ |
| 6723. | $L_{A73}$ | $L_{B71}$ |
| 6724. | $L_{A74}$ | $L_{B71}$ |
| 6725. | $L_{A75}$ | $L_{B71}$ |
| 6726. | $L_{A76}$ | $L_{B71}$ |
| 6727. | $L_{A77}$ | $L_{B71}$ |
| 6728. | $L_{A78}$ | $L_{B71}$ |
| 6729. | $L_{A79}$ | $L_{B71}$ |
| 6730. | $L_{A80}$ | $L_{B71}$ |
| 6731. | $L_{A81}$ | $L_{B71}$ |
| 6732. | $L_{A82}$ | $L_{B71}$ |
| 6733. | $L_{A83}$ | $L_{B71}$ |
| 6734. | $L_{A84}$ | $L_{B71}$ |

TABLE 1-continued

| Cpd # | $L_A$ | $L_B$ |
|---|---|---|
| 6735. | $L_{A85}$ | $L_{B71}$ |
| 6736. | $L_{A86}$ | $L_{B71}$ |
| 6737. | $L_{A87}$ | $L_{B71}$ |
| 6738. | $L_{A88}$ | $L_{B71}$ |
| 6739. | $L_{A89}$ | $L_{B71}$ |
| 6740. | $L_{A90}$ | $L_{B71}$ |
| 6741. | $L_{A91}$ | $L_{B71}$ |
| 6742. | $L_{A92}$ | $L_{B71}$ |
| 6743. | $L_{A93}$ | $L_{B71}$ |
| 6744. | $L_{A94}$ | $L_{B71}$ |
| 6745. | $L_{A95}$ | $L_{B71}$ |
| 6746. | $L_{A1}$ | $L_{B72}$ |
| 6747. | $L_{A2}$ | $L_{B72}$ |
| 6748. | $L_{A3}$ | $L_{B72}$ |
| 6749. | $L_{A4}$ | $L_{B72}$ |
| 6750. | $L_{A5}$ | $L_{B72}$ |
| 6751. | $L_{A6}$ | $L_{B72}$ |
| 6752. | $L_{A7}$ | $L_{B72}$ |
| 6753. | $L_{A8}$ | $L_{B72}$ |
| 6754. | $L_{A9}$ | $L_{B72}$ |
| 6755. | $L_{A10}$ | $L_{B72}$ |
| 6756. | $L_{A11}$ | $L_{B72}$ |
| 6757. | $L_{A12}$ | $L_{B72}$ |
| 6758. | $L_{A13}$ | $L_{B72}$ |
| 6759. | $L_{A14}$ | $L_{B72}$ |
| 6760. | $L_{A15}$ | $L_{B72}$ |
| 6761. | $L_{A16}$ | $L_{B72}$ |
| 6762. | $L_{A17}$ | $L_{B72}$ |
| 6763. | $L_{A18}$ | $L_{B72}$ |
| 6764. | $L_{A19}$ | $L_{B72}$ |
| 6765. | $L_{A20}$ | $L_{B72}$ |
| 6766. | $L_{A21}$ | $L_{B72}$ |
| 6767. | $L_{A22}$ | $L_{B72}$ |
| 6768. | $L_{A23}$ | $L_{B72}$ |
| 6769. | $L_{A24}$ | $L_{B72}$ |
| 6770. | $L_{A25}$ | $L_{B72}$ |
| 6771. | $L_{A26}$ | $L_{B72}$ |
| 6772. | $L_{A27}$ | $L_{B72}$ |
| 6773. | $L_{A28}$ | $L_{B72}$ |
| 6774. | $L_{A29}$ | $L_{B72}$ |
| 6775. | $L_{A30}$ | $L_{B72}$ |
| 6776. | $L_{A31}$ | $L_{B72}$ |
| 6777. | $L_{A32}$ | $L_{B72}$ |
| 6778. | $L_{A33}$ | $L_{B72}$ |
| 6779. | $L_{A34}$ | $L_{B72}$ |
| 6780. | $L_{A35}$ | $L_{B72}$ |
| 6781. | $L_{A36}$ | $L_{B72}$ |
| 6782. | $L_{A37}$ | $L_{B72}$ |
| 6783. | $L_{A38}$ | $L_{B72}$ |
| 6784. | $L_{A39}$ | $L_{B72}$ |
| 6785. | $L_{A40}$ | $L_{B72}$ |
| 6786. | $L_{A41}$ | $L_{B72}$ |
| 6787. | $L_{A42}$ | $L_{B72}$ |
| 6788. | $L_{A43}$ | $L_{B72}$ |
| 6789. | $L_{A44}$ | $L_{B72}$ |
| 6790. | $L_{A45}$ | $L_{B72}$ |
| 6791. | $L_{A46}$ | $L_{B72}$ |
| 6792. | $L_{A47}$ | $L_{B72}$ |
| 6793. | $L_{A48}$ | $L_{B72}$ |
| 6794. | $L_{A49}$ | $L_{B72}$ |
| 6795. | $L_{A50}$ | $L_{B72}$ |
| 6796. | $L_{A51}$ | $L_{B72}$ |
| 6797. | $L_{A52}$ | $L_{B72}$ |
| 6798. | $L_{A53}$ | $L_{B72}$ |
| 6799. | $L_{A54}$ | $L_{B72}$ |
| 6800. | $L_{A55}$ | $L_{B72}$ |
| 6801. | $L_{A56}$ | $L_{B72}$ |
| 6802. | $L_{A57}$ | $L_{B72}$ |
| 6803. | $L_{A58}$ | $L_{B72}$ |
| 6804. | $L_{A59}$ | $L_{B72}$ |
| 6805. | $L_{A60}$ | $L_{B72}$ |
| 6806. | $L_{A61}$ | $L_{B72}$ |
| 6807. | $L_{A62}$ | $L_{B72}$ |
| 6808. | $L_{A63}$ | $L_{B72}$ |
| 6809. | $L_{A64}$ | $L_{B72}$ |
| 6810. | $L_{A65}$ | $L_{B72}$ |
| 6811. | $L_{A66}$ | $L_{B72}$ |
| 6812. | $L_{A67}$ | $L_{B72}$ |

TABLE 1-continued

| Cpd # | $L_A$ | $L_B$ |
|---|---|---|
| 6813. | $L_{A68}$ | $L_{B72}$ |
| 6814. | $L_{A69}$ | $L_{B72}$ |
| 6815. | $L_{A70}$ | $L_{B72}$ |
| 6816. | $L_{A71}$ | $L_{B72}$ |
| 6817. | $L_{A72}$ | $L_{B72}$ |
| 6818. | $L_{A73}$ | $L_{B72}$ |
| 6819. | $L_{A74}$ | $L_{B72}$ |
| 6820. | $L_{A75}$ | $L_{B72}$ |
| 6821. | $L_{A76}$ | $L_{B72}$ |
| 6822. | $L_{A77}$ | $L_{B72}$ |
| 6823. | $L_{A78}$ | $L_{B72}$ |
| 6824. | $L_{A79}$ | $L_{B72}$ |
| 6825. | $L_{A80}$ | $L_{B72}$ |
| 6826. | $L_{A81}$ | $L_{B72}$ |
| 6827. | $L_{A82}$ | $L_{B72}$ |
| 6828. | $L_{A83}$ | $L_{B72}$ |
| 6829. | $L_{A84}$ | $L_{B72}$ |
| 6830. | $L_{A85}$ | $L_{B72}$ |
| 6831. | $L_{A86}$ | $L_{B72}$ |
| 6832. | $L_{A87}$ | $L_{B72}$ |
| 6833. | $L_{A88}$ | $L_{B72}$ |
| 6834. | $L_{A89}$ | $L_{B72}$ |
| 6835. | $L_{A90}$ | $L_{B72}$ |
| 6836. | $L_{A91}$ | $L_{B72}$ |
| 6837. | $L_{A92}$ | $L_{B72}$ |
| 6838. | $L_{A93}$ | $L_{B72}$ |
| 6839. | $L_{A94}$ | $L_{B72}$ |
| 6840. | $L_{A95}$ | $L_{B72}$ |
| 6841. | $L_{A1}$ | $L_{B73}$ |
| 6842. | $L_{A2}$ | $L_{B73}$ |
| 6843. | $L_{A3}$ | $L_{B73}$ |
| 6844. | $L_{A4}$ | $L_{B73}$ |
| 6845. | $L_{A5}$ | $L_{B73}$ |
| 6846. | $L_{A6}$ | $L_{B73}$ |
| 6847. | $L_{A7}$ | $L_{B73}$ |
| 6848. | $L_{A8}$ | $L_{B73}$ |
| 6849. | $L_{A9}$ | $L_{B73}$ |
| 6850. | $L_{A10}$ | $L_{B73}$ |
| 6851. | $L_{A11}$ | $L_{B73}$ |
| 6852. | $L_{A12}$ | $L_{B73}$ |
| 6853. | $L_{A13}$ | $L_{B73}$ |
| 6854. | $L_{A14}$ | $L_{B73}$ |
| 6855. | $L_{A15}$ | $L_{B73}$ |
| 6856. | $L_{A16}$ | $L_{B73}$ |
| 6857. | $L_{A17}$ | $L_{B73}$ |
| 6858. | $L_{A18}$ | $L_{B73}$ |
| 6859. | $L_{A19}$ | $L_{B73}$ |
| 6860. | $L_{A20}$ | $L_{B73}$ |
| 6861. | $L_{A21}$ | $L_{B73}$ |
| 6862. | $L_{A22}$ | $L_{B73}$ |
| 6863. | $L_{A23}$ | $L_{B73}$ |
| 6864. | $L_{A24}$ | $L_{B73}$ |
| 6865. | $L_{A25}$ | $L_{B73}$ |
| 6866. | $L_{A26}$ | $L_{B73}$ |
| 6867. | $L_{A27}$ | $L_{B73}$ |
| 6868. | $L_{A28}$ | $L_{B73}$ |
| 6869. | $L_{A29}$ | $L_{B73}$ |
| 6870. | $L_{A30}$ | $L_{B73}$ |
| 6871. | $L_{A31}$ | $L_{B73}$ |
| 6872. | $L_{A32}$ | $L_{B73}$ |
| 6873. | $L_{A33}$ | $L_{B73}$ |
| 6874. | $L_{A34}$ | $L_{B73}$ |
| 6875. | $L_{A35}$ | $L_{B73}$ |
| 6876. | $L_{A36}$ | $L_{B73}$ |
| 6877. | $L_{A37}$ | $L_{B73}$ |
| 6878. | $L_{A38}$ | $L_{B73}$ |
| 6879. | $L_{A39}$ | $L_{B73}$ |
| 6880. | $L_{A40}$ | $L_{B73}$ |
| 6881. | $L_{A41}$ | $L_{B73}$ |
| 6882. | $L_{A42}$ | $L_{B73}$ |
| 6883. | $L_{A43}$ | $L_{B73}$ |
| 6884. | $L_{A44}$ | $L_{B73}$ |
| 6885. | $L_{A45}$ | $L_{B73}$ |
| 6886. | $L_{A46}$ | $L_{B73}$ |
| 6887. | $L_{A47}$ | $L_{B73}$ |
| 6888. | $L_{A48}$ | $L_{B73}$ |
| 6889. | $L_{A49}$ | $L_{B73}$ |
| 6890. | $L_{A50}$ | $L_{B73}$ |

TABLE 1-continued

| Cpd # | $L_A$ | $L_B$ |
|---|---|---|
| 6891. | $L_{A51}$ | $L_{B73}$ |
| 6892. | $L_{A52}$ | $L_{B73}$ |
| 6893. | $L_{A53}$ | $L_{B73}$ |
| 6894. | $L_{A54}$ | $L_{B73}$ |
| 6895. | $L_{A55}$ | $L_{B73}$ |
| 6896. | $L_{A56}$ | $L_{B73}$ |
| 6897. | $L_{A57}$ | $L_{B73}$ |
| 6898. | $L_{A58}$ | $L_{B73}$ |
| 6899. | $L_{A59}$ | $L_{B73}$ |
| 6900. | $L_{A60}$ | $L_{B73}$ |
| 6901. | $L_{A61}$ | $L_{B73}$ |
| 6902. | $L_{A62}$ | $L_{B73}$ |
| 6903. | $L_{A63}$ | $L_{B73}$ |
| 6904. | $L_{A64}$ | $L_{B73}$ |
| 6905. | $L_{A65}$ | $L_{B73}$ |
| 6906. | $L_{A66}$ | $L_{B73}$ |
| 6907. | $L_{A67}$ | $L_{B73}$ |
| 6908. | $L_{A68}$ | $L_{B73}$ |
| 6909. | $L_{A69}$ | $L_{B73}$ |
| 6910. | $L_{A70}$ | $L_{B73}$ |
| 6911. | $L_{A71}$ | $L_{B73}$ |
| 6912. | $L_{A72}$ | $L_{B73}$ |
| 6913. | $L_{A73}$ | $L_{B73}$ |
| 6914. | $L_{A74}$ | $L_{B73}$ |
| 6915. | $L_{A75}$ | $L_{B73}$ |
| 6916. | $L_{A76}$ | $L_{B73}$ |
| 6917. | $L_{A77}$ | $L_{B73}$ |
| 6918. | $L_{A78}$ | $L_{B73}$ |
| 6919. | $L_{A79}$ | $L_{B73}$ |
| 6920. | $L_{A80}$ | $L_{B73}$ |
| 6921. | $L_{A81}$ | $L_{B73}$ |
| 6922. | $L_{A82}$ | $L_{B73}$ |
| 6923. | $L_{A83}$ | $L_{B73}$ |
| 6924. | $L_{A84}$ | $L_{B73}$ |
| 6925. | $L_{A85}$ | $L_{B73}$ |
| 6926. | $L_{A86}$ | $L_{B73}$ |
| 6927. | $L_{A87}$ | $L_{B73}$ |
| 6928. | $L_{A88}$ | $L_{B73}$ |
| 6929. | $L_{A89}$ | $L_{B73}$ |
| 6930. | $L_{A90}$ | $L_{B73}$ |
| 6931. | $L_{A91}$ | $L_{B73}$ |
| 6932. | $L_{A92}$ | $L_{B73}$ |
| 6933. | $L_{A93}$ | $L_{B73}$ |
| 6934. | $L_{A94}$ | $L_{B73}$ |
| 6935. | $L_{A95}$ | $L_{B73}$ |
| 6936. | $L_{A1}$ | $L_{B74}$ |
| 6937. | $L_{A2}$ | $L_{B74}$ |
| 6938. | $L_{A3}$ | $L_{B74}$ |
| 6939. | $L_{A4}$ | $L_{B74}$ |
| 6940. | $L_{A5}$ | $L_{B74}$ |
| 6941. | $L_{A6}$ | $L_{B74}$ |
| 6942. | $L_{A7}$ | $L_{B74}$ |
| 6943. | $L_{A8}$ | $L_{B74}$ |
| 6944. | $L_{A9}$ | $L_{B74}$ |
| 6945. | $L_{A10}$ | $L_{B74}$ |
| 6946. | $L_{A11}$ | $L_{B74}$ |
| 6947. | $L_{A12}$ | $L_{B74}$ |
| 6948. | $L_{A13}$ | $L_{B74}$ |
| 6949. | $L_{A14}$ | $L_{B74}$ |
| 6950. | $L_{A15}$ | $L_{B74}$ |
| 6951. | $L_{A16}$ | $L_{B74}$ |
| 6952. | $L_{A17}$ | $L_{B74}$ |
| 6953. | $L_{A18}$ | $L_{B74}$ |
| 6954. | $L_{A19}$ | $L_{B74}$ |
| 6955. | $L_{A20}$ | $L_{B74}$ |
| 6956. | $L_{A21}$ | $L_{B74}$ |
| 6957. | $L_{A22}$ | $L_{B74}$ |
| 6958. | $L_{A23}$ | $L_{B74}$ |
| 6959. | $L_{A24}$ | $L_{B74}$ |
| 6960. | $L_{A25}$ | $L_{B74}$ |
| 6961. | $L_{A26}$ | $L_{B74}$ |
| 6962. | $L_{A27}$ | $L_{B74}$ |
| 6963. | $L_{A28}$ | $L_{B74}$ |
| 6964. | $L_{A29}$ | $L_{B74}$ |
| 6965. | $L_{A30}$ | $L_{B74}$ |
| 6966. | $L_{A31}$ | $L_{B74}$ |
| 6967. | $L_{A32}$ | $L_{B74}$ |
| 6968. | $L_{A33}$ | $L_{B74}$ |

TABLE 1-continued

| Cpd # | $L_A$ | $L_B$ |
|---|---|---|
| 6969. | $L_{A34}$ | $L_{B74}$ |
| 6970. | $L_{A35}$ | $L_{B74}$ |
| 6971. | $L_{A36}$ | $L_{B74}$ |
| 6972. | $L_{A37}$ | $L_{B74}$ |
| 6973. | $L_{A38}$ | $L_{B74}$ |
| 6974. | $L_{A39}$ | $L_{B74}$ |
| 6975. | $L_{A40}$ | $L_{B74}$ |
| 6976. | $L_{A41}$ | $L_{B74}$ |
| 6977. | $L_{A42}$ | $L_{B74}$ |
| 6978. | $L_{A43}$ | $L_{B74}$ |
| 6979. | $L_{A44}$ | $L_{B74}$ |
| 6980. | $L_{A45}$ | $L_{B74}$ |
| 6981. | $L_{A46}$ | $L_{B74}$ |
| 6982. | $L_{A47}$ | $L_{B74}$ |
| 6983. | $L_{A48}$ | $L_{B74}$ |
| 6984. | $L_{A49}$ | $L_{B74}$ |
| 6985. | $L_{A50}$ | $L_{B74}$ |
| 6986. | $L_{A51}$ | $L_{B74}$ |
| 6987. | $L_{A52}$ | $L_{B74}$ |
| 6988. | $L_{A53}$ | $L_{B74}$ |
| 6989. | $L_{A54}$ | $L_{B74}$ |
| 6990. | $L_{A55}$ | $L_{B74}$ |
| 6991. | $L_{A56}$ | $L_{B74}$ |
| 6992. | $L_{A57}$ | $L_{B74}$ |
| 6993. | $L_{A58}$ | $L_{B74}$ |
| 6994. | $L_{A59}$ | $L_{B74}$ |
| 6995. | $L_{A60}$ | $L_{B74}$ |
| 6996. | $L_{A61}$ | $L_{B74}$ |
| 6997. | $L_{A62}$ | $L_{B74}$ |
| 6998. | $L_{A63}$ | $L_{B74}$ |
| 6999. | $L_{A64}$ | $L_{B74}$ |
| 7000. | $L_{A65}$ | $L_{B74}$ |
| 7001. | $L_{A66}$ | $L_{B74}$ |
| 7002. | $L_{A67}$ | $L_{B74}$ |
| 7003. | $L_{A68}$ | $L_{B74}$ |
| 7004. | $L_{A69}$ | $L_{B74}$ |
| 7005. | $L_{A70}$ | $L_{B74}$ |
| 7006. | $L_{A71}$ | $L_{B74}$ |
| 7007. | $L_{A72}$ | $L_{B74}$ |
| 7008. | $L_{A73}$ | $L_{B74}$ |
| 7009. | $L_{A74}$ | $L_{B74}$ |
| 7010. | $L_{A75}$ | $L_{B74}$ |
| 7011. | $L_{A76}$ | $L_{B74}$ |
| 7012. | $L_{A77}$ | $L_{B74}$ |
| 7013. | $L_{A78}$ | $L_{B74}$ |
| 7014. | $L_{A79}$ | $L_{B74}$ |
| 7015. | $L_{A80}$ | $L_{B74}$ |
| 7016. | $L_{A81}$ | $L_{B74}$ |
| 7017. | $L_{A82}$ | $L_{B74}$ |
| 7018. | $L_{A83}$ | $L_{B74}$ |
| 7019. | $L_{A84}$ | $L_{B74}$ |
| 7020. | $L_{A85}$ | $L_{B74}$ |
| 7021. | $L_{A86}$ | $L_{B74}$ |
| 7022. | $L_{A87}$ | $L_{B74}$ |
| 7023. | $L_{A88}$ | $L_{B74}$ |
| 7024. | $L_{A89}$ | $L_{B74}$ |
| 7025. | $L_{A90}$ | $L_{B74}$ |
| 7026. | $L_{A91}$ | $L_{B74}$ |
| 7027. | $L_{A92}$ | $L_{B74}$ |
| 7028. | $L_{A93}$ | $L_{B74}$ |
| 7029. | $L_{A94}$ | $L_{B74}$ |
| 7030. | $L_{A95}$ | $L_{B74}$ |
| 7031. | $L_{A1}$ | $L_{B75}$ |
| 7032. | $L_{A2}$ | $L_{B75}$ |
| 7033. | $L_{A3}$ | $L_{B75}$ |
| 7034. | $L_{A4}$ | $L_{B75}$ |
| 7035. | $L_{A5}$ | $L_{B75}$ |
| 7036. | $L_{A6}$ | $L_{B75}$ |
| 7037. | $L_{A7}$ | $L_{B75}$ |
| 7038. | $L_{A8}$ | $L_{B75}$ |
| 7039. | $L_{A9}$ | $L_{B75}$ |
| 7040. | $L_{A10}$ | $L_{B75}$ |
| 7041. | $L_{A11}$ | $L_{B75}$ |
| 7042. | $L_{A12}$ | $L_{B75}$ |
| 7043. | $L_{A13}$ | $L_{B75}$ |
| 7044. | $L_{A14}$ | $L_{B75}$ |
| 7045. | $L_{A15}$ | $L_{B75}$ |
| 7046. | $L_{A16}$ | $L_{B75}$ |
| 7047. | $L_{A17}$ | $L_{B75}$ |
| 7048. | $L_{A18}$ | $L_{B75}$ |
| 7049. | $L_{A19}$ | $L_{B75}$ |
| 7050. | $L_{A20}$ | $L_{B75}$ |
| 7051. | $L_{A21}$ | $L_{B75}$ |
| 7052. | $L_{A22}$ | $L_{B75}$ |
| 7053. | $L_{A23}$ | $L_{B75}$ |
| 7054. | $L_{A24}$ | $L_{B75}$ |
| 7055. | $L_{A25}$ | $L_{B75}$ |
| 7056. | $L_{A26}$ | $L_{B75}$ |
| 7057. | $L_{A27}$ | $L_{B75}$ |
| 7058. | $L_{A28}$ | $L_{B75}$ |
| 7059. | $L_{A29}$ | $L_{B75}$ |
| 7060. | $L_{A30}$ | $L_{B75}$ |
| 7061. | $L_{A31}$ | $L_{B75}$ |
| 7062. | $L_{A32}$ | $L_{B75}$ |
| 7063. | $L_{A33}$ | $L_{B75}$ |
| 7064. | $L_{A34}$ | $L_{B75}$ |
| 7065. | $L_{A35}$ | $L_{B75}$ |
| 7066. | $L_{A36}$ | $L_{B75}$ |
| 7067. | $L_{A37}$ | $L_{B75}$ |
| 7068. | $L_{A38}$ | $L_{B75}$ |
| 7069. | $L_{A39}$ | $L_{B75}$ |
| 7070. | $L_{A40}$ | $L_{B75}$ |
| 7071. | $L_{A41}$ | $L_{B75}$ |
| 7072. | $L_{A42}$ | $L_{B75}$ |
| 7073. | $L_{A43}$ | $L_{B75}$ |
| 7074. | $L_{A44}$ | $L_{B75}$ |
| 7075. | $L_{A45}$ | $L_{B75}$ |
| 7076. | $L_{A46}$ | $L_{B75}$ |
| 7077. | $L_{A47}$ | $L_{B75}$ |
| 7078. | $L_{A48}$ | $L_{B75}$ |
| 7079. | $L_{A49}$ | $L_{B75}$ |
| 7080. | $L_{A50}$ | $L_{B75}$ |
| 7081. | $L_{A51}$ | $L_{B75}$ |
| 7082. | $L_{A52}$ | $L_{B75}$ |
| 7083. | $L_{A53}$ | $L_{B75}$ |
| 7084. | $L_{A54}$ | $L_{B75}$ |
| 7085. | $L_{A55}$ | $L_{B75}$ |
| 7086. | $L_{A56}$ | $L_{B75}$ |
| 7087. | $L_{A57}$ | $L_{B75}$ |
| 7088. | $L_{A58}$ | $L_{B75}$ |
| 7089. | $L_{A59}$ | $L_{B75}$ |
| 7090. | $L_{A60}$ | $L_{B75}$ |
| 7091. | $L_{A61}$ | $L_{B75}$ |
| 7092. | $L_{A62}$ | $L_{B75}$ |
| 7093. | $L_{A63}$ | $L_{B75}$ |
| 7094. | $L_{A64}$ | $L_{B75}$ |
| 7095. | $L_{A65}$ | $L_{B75}$ |
| 7096. | $L_{A66}$ | $L_{B75}$ |
| 7097. | $L_{A67}$ | $L_{B75}$ |
| 7098. | $L_{A68}$ | $L_{B75}$ |
| 7099. | $L_{A69}$ | $L_{B75}$ |
| 7100. | $L_{A70}$ | $L_{B75}$ |
| 7101. | $L_{A71}$ | $L_{B75}$ |
| 7102. | $L_{A72}$ | $L_{B75}$ |
| 7103. | $L_{A73}$ | $L_{B75}$ |
| 7104. | $L_{A74}$ | $L_{B75}$ |
| 7105. | $L_{A75}$ | $L_{B75}$ |
| 7106. | $L_{A76}$ | $L_{B75}$ |
| 7107. | $L_{A77}$ | $L_{B75}$ |
| 7108. | $L_{A78}$ | $L_{B75}$ |
| 7109. | $L_{A79}$ | $L_{B75}$ |
| 7110. | $L_{A80}$ | $L_{B75}$ |
| 7111. | $L_{A81}$ | $L_{B75}$ |
| 7112. | $L_{A82}$ | $L_{B75}$ |
| 7113. | $L_{A83}$ | $L_{B75}$ |
| 7114. | $L_{A84}$ | $L_{B75}$ |
| 7115. | $L_{A85}$ | $L_{B75}$ |
| 7116. | $L_{A86}$ | $L_{B75}$ |
| 7117. | $L_{A87}$ | $L_{B75}$ |
| 7118. | $L_{A88}$ | $L_{B75}$ |
| 7119. | $L_{A89}$ | $L_{B75}$ |
| 7120. | $L_{A90}$ | $L_{B75}$ |
| 7121. | $L_{A91}$ | $L_{B75}$ |
| 7122. | $L_{A92}$ | $L_{B75}$ |
| 7123. | $L_{A93}$ | $L_{B75}$ |
| 7124. | $L_{A94}$ | $L_{B75}$ |

TABLE 1-continued

| Cpd # | $L_A$ | $L_B$ |
|---|---|---|
| 7125. | $L_{A95}$ | $L_{B75}$ |
| 7126. | $L_{A1}$ | $L_{B76}$ |
| 7127. | $L_{A2}$ | $L_{B76}$ |
| 7128. | $L_{A3}$ | $L_{B76}$ |
| 7129. | $L_{A4}$ | $L_{B76}$ |
| 7130. | $L_{A5}$ | $L_{B76}$ |
| 7131. | $L_{A6}$ | $L_{B76}$ |
| 7132. | $L_{A7}$ | $L_{B76}$ |
| 7133. | $L_{A8}$ | $L_{B76}$ |
| 7134. | $L_{A9}$ | $L_{B76}$ |
| 7135. | $L_{A10}$ | $L_{B76}$ |
| 7136. | $L_{A11}$ | $L_{B76}$ |
| 7137. | $L_{A12}$ | $L_{B76}$ |
| 7138. | $L_{A13}$ | $L_{B76}$ |
| 7139. | $L_{A14}$ | $L_{B76}$ |
| 7140. | $L_{A15}$ | $L_{B76}$ |
| 7141. | $L_{A16}$ | $L_{B76}$ |
| 7142. | $L_{A17}$ | $L_{B76}$ |
| 7143. | $L_{A18}$ | $L_{B76}$ |
| 7144. | $L_{A19}$ | $L_{B76}$ |
| 7145. | $L_{A20}$ | $L_{B76}$ |
| 7146. | $L_{A21}$ | $L_{B76}$ |
| 7147. | $L_{A22}$ | $L_{B76}$ |
| 7148. | $L_{A23}$ | $L_{B76}$ |
| 7149. | $L_{A24}$ | $L_{B76}$ |
| 7150. | $L_{A25}$ | $L_{B76}$ |
| 7151. | $L_{A26}$ | $L_{B76}$ |
| 7152. | $L_{A27}$ | $L_{B76}$ |
| 7153. | $L_{A28}$ | $L_{B76}$ |
| 7154. | $L_{A29}$ | $L_{B76}$ |
| 7155. | $L_{A30}$ | $L_{B76}$ |
| 7156. | $L_{A31}$ | $L_{B76}$ |
| 7157. | $L_{A32}$ | $L_{B76}$ |
| 7158. | $L_{A33}$ | $L_{B76}$ |
| 7159. | $L_{A34}$ | $L_{B76}$ |
| 7160. | $L_{A35}$ | $L_{B76}$ |
| 7161. | $L_{A36}$ | $L_{B76}$ |
| 7162. | $L_{A37}$ | $L_{B76}$ |
| 7163. | $L_{A38}$ | $L_{B76}$ |
| 7164. | $L_{A39}$ | $L_{B76}$ |
| 7165. | $L_{A40}$ | $L_{B76}$ |
| 7166. | $L_{A41}$ | $L_{B76}$ |
| 7167. | $L_{A42}$ | $L_{B76}$ |
| 7168. | $L_{A43}$ | $L_{B76}$ |
| 7169. | $L_{A44}$ | $L_{B76}$ |
| 7170. | $L_{A45}$ | $L_{B76}$ |
| 7171. | $L_{A46}$ | $L_{B76}$ |
| 7172. | $L_{A47}$ | $L_{B76}$ |
| 7173. | $L_{A48}$ | $L_{B76}$ |
| 7174. | $L_{A49}$ | $L_{B76}$ |
| 7175. | $L_{A50}$ | $L_{B76}$ |
| 7176. | $L_{A51}$ | $L_{B76}$ |
| 7177. | $L_{A52}$ | $L_{B76}$ |
| 7178. | $L_{A53}$ | $L_{B76}$ |
| 7179. | $L_{A54}$ | $L_{B76}$ |
| 7180. | $L_{A55}$ | $L_{B76}$ |
| 7181. | $L_{A56}$ | $L_{B76}$ |
| 7182. | $L_{A57}$ | $L_{B76}$ |
| 7183. | $L_{A58}$ | $L_{B76}$ |
| 7184. | $L_{A59}$ | $L_{B76}$ |
| 7185. | $L_{A60}$ | $L_{B76}$ |
| 7186. | $L_{A61}$ | $L_{B76}$ |
| 7187. | $L_{A62}$ | $L_{B76}$ |
| 7188. | $L_{A63}$ | $L_{B76}$ |
| 7189. | $L_{A64}$ | $L_{B76}$ |
| 7190. | $L_{A65}$ | $L_{B76}$ |
| 7191. | $L_{A66}$ | $L_{B76}$ |
| 7192. | $L_{A67}$ | $L_{B76}$ |
| 7193. | $L_{A68}$ | $L_{B76}$ |
| 7194. | $L_{A69}$ | $L_{B76}$ |
| 7195. | $L_{A70}$ | $L_{B76}$ |
| 7196. | $L_{A71}$ | $L_{B76}$ |
| 7197. | $L_{A72}$ | $L_{B76}$ |
| 7198. | $L_{A73}$ | $L_{B76}$ |
| 7199. | $L_{A74}$ | $L_{B76}$ |
| 7200. | $L_{A75}$ | $L_{B76}$ |
| 7201. | $L_{A76}$ | $L_{B76}$ |
| 7202. | $L_{A77}$ | $L_{B76}$ |
| 7203. | $L_{A78}$ | $L_{B76}$ |
| 7204. | $L_{A79}$ | $L_{B76}$ |
| 7205. | $L_{A80}$ | $L_{B76}$ |
| 7206. | $L_{A81}$ | $L_{B76}$ |
| 7207. | $L_{A82}$ | $L_{B76}$ |
| 7208. | $L_{A83}$ | $L_{B76}$ |
| 7209. | $L_{A84}$ | $L_{B76}$ |
| 7210. | $L_{A85}$ | $L_{B76}$ |
| 7211. | $L_{A86}$ | $L_{B76}$ |
| 7212. | $L_{A87}$ | $L_{B76}$ |
| 7213. | $L_{A88}$ | $L_{B76}$ |
| 7214. | $L_{A89}$ | $L_{B76}$ |
| 7215. | $L_{A90}$ | $L_{B76}$ |
| 7216. | $L_{A91}$ | $L_{B76}$ |
| 7217. | $L_{A92}$ | $L_{B76}$ |
| 7218. | $L_{A93}$ | $L_{B76}$ |
| 7219. | $L_{A94}$ | $L_{B76}$ |
| 7220. | $L_{A95}$ | $L_{B76}$ |
| 7221. | $L_{A1}$ | $L_{B77}$ |
| 7222. | $L_{A2}$ | $L_{B77}$ |
| 7223. | $L_{A3}$ | $L_{B77}$ |
| 7224. | $L_{A4}$ | $L_{B77}$ |
| 7225. | $L_{A5}$ | $L_{B77}$ |
| 7226. | $L_{A6}$ | $L_{B77}$ |
| 7227. | $L_{A7}$ | $L_{B77}$ |
| 7228. | $L_{A8}$ | $L_{B77}$ |
| 7229. | $L_{A9}$ | $L_{B77}$ |
| 7230. | $L_{A10}$ | $L_{B77}$ |
| 7231. | $L_{A11}$ | $L_{B77}$ |
| 7232. | $L_{A12}$ | $L_{B77}$ |
| 7233. | $L_{A13}$ | $L_{B77}$ |
| 7234. | $L_{A14}$ | $L_{B77}$ |
| 7235. | $L_{A15}$ | $L_{B77}$ |
| 7236. | $L_{A16}$ | $L_{B77}$ |
| 7237. | $L_{A17}$ | $L_{B77}$ |
| 7238. | $L_{A18}$ | $L_{B77}$ |
| 7239. | $L_{A19}$ | $L_{B77}$ |
| 7240. | $L_{A20}$ | $L_{B77}$ |
| 7241. | $L_{A21}$ | $L_{B77}$ |
| 7242. | $L_{A22}$ | $L_{B77}$ |
| 7243. | $L_{A23}$ | $L_{B77}$ |
| 7244. | $L_{A24}$ | $L_{B77}$ |
| 7245. | $L_{A25}$ | $L_{B77}$ |
| 7246. | $L_{A26}$ | $L_{B77}$ |
| 7247. | $L_{A27}$ | $L_{B77}$ |
| 7248. | $L_{A28}$ | $L_{B77}$ |
| 7249. | $L_{A29}$ | $L_{B77}$ |
| 7250. | $L_{A30}$ | $L_{B77}$ |
| 7251. | $L_{A31}$ | $L_{B77}$ |
| 7252. | $L_{A32}$ | $L_{B77}$ |
| 7253. | $L_{A33}$ | $L_{B77}$ |
| 7254. | $L_{A34}$ | $L_{B77}$ |
| 7255. | $L_{A35}$ | $L_{B77}$ |
| 7256. | $L_{A36}$ | $L_{B77}$ |
| 7257. | $L_{A37}$ | $L_{B77}$ |
| 7258. | $L_{A38}$ | $L_{B77}$ |
| 7259. | $L_{A39}$ | $L_{B77}$ |
| 7260. | $L_{A40}$ | $L_{B77}$ |
| 7261. | $L_{A41}$ | $L_{B77}$ |
| 7262. | $L_{A42}$ | $L_{B77}$ |
| 7263. | $L_{A43}$ | $L_{B77}$ |
| 7264. | $L_{A44}$ | $L_{B77}$ |
| 7265. | $L_{A45}$ | $L_{B77}$ |
| 7266. | $L_{A46}$ | $L_{B77}$ |
| 7267. | $L_{A47}$ | $L_{B77}$ |
| 7268. | $L_{A48}$ | $L_{B77}$ |
| 7269. | $L_{A49}$ | $L_{B77}$ |
| 7270. | $L_{A50}$ | $L_{B77}$ |
| 7271. | $L_{A51}$ | $L_{B77}$ |
| 7272. | $L_{A52}$ | $L_{B77}$ |
| 7273. | $L_{A53}$ | $L_{B77}$ |
| 7274. | $L_{A54}$ | $L_{B77}$ |
| 7275. | $L_{A55}$ | $L_{B77}$ |
| 7276. | $L_{A56}$ | $L_{B77}$ |
| 7277. | $L_{A57}$ | $L_{B77}$ |
| 7278. | $L_{A58}$ | $L_{B77}$ |
| 7279. | $L_{A59}$ | $L_{B77}$ |
| 7280. | $L_{A60}$ | $L_{B77}$ |

TABLE 1-continued

| Cpd # | $L_A$ | $L_B$ |
|---|---|---|
| 7281. | $L_{A61}$ | $L_{B77}$ |
| 7282. | $L_{A62}$ | $L_{B77}$ |
| 7283. | $L_{A63}$ | $L_{B77}$ |
| 7284. | $L_{A64}$ | $L_{B77}$ |
| 7285. | $L_{A65}$ | $L_{B77}$ |
| 7286. | $L_{A66}$ | $L_{B77}$ |
| 7287. | $L_{A67}$ | $L_{B77}$ |
| 7288. | $L_{A68}$ | $L_{B77}$ |
| 7289. | $L_{A69}$ | $L_{B77}$ |
| 7290. | $L_{A70}$ | $L_{B77}$ |
| 7291. | $L_{A71}$ | $L_{B77}$ |
| 7292. | $L_{A72}$ | $L_{B77}$ |
| 7293. | $L_{A73}$ | $L_{B77}$ |
| 7294. | $L_{A74}$ | $L_{B77}$ |
| 7295. | $L_{A75}$ | $L_{B77}$ |
| 7296. | $L_{A76}$ | $L_{B77}$ |
| 7297. | $L_{A77}$ | $L_{B77}$ |
| 7298. | $L_{A78}$ | $L_{B77}$ |
| 7299. | $L_{A79}$ | $L_{B77}$ |
| 7300. | $L_{A80}$ | $L_{B77}$ |
| 7301. | $L_{A81}$ | $L_{B77}$ |
| 7302. | $L_{A82}$ | $L_{B77}$ |
| 7303. | $L_{A83}$ | $L_{B77}$ |
| 7304. | $L_{A84}$ | $L_{B77}$ |
| 7305. | $L_{A85}$ | $L_{B77}$ |
| 7306. | $L_{A86}$ | $L_{B77}$ |
| 7307. | $L_{A87}$ | $L_{B77}$ |
| 7308. | $L_{A88}$ | $L_{B77}$ |
| 7309. | $L_{A89}$ | $L_{B77}$ |
| 7310. | $L_{A90}$ | $L_{B77}$ |
| 7311. | $L_{A91}$ | $L_{B77}$ |
| 7312. | $L_{A92}$ | $L_{B77}$ |
| 7313. | $L_{A93}$ | $L_{B77}$ |
| 7314. | $L_{A94}$ | $L_{B77}$ |
| 7315. | $L_{A95}$ | $L_{B77}$ |
| 7316. | $L_{A1}$ | $L_{B78}$ |
| 7317. | $L_{A2}$ | $L_{B78}$ |
| 7318. | $L_{A3}$ | $L_{B78}$ |
| 7319. | $L_{A4}$ | $L_{B78}$ |
| 7320. | $L_{A5}$ | $L_{B78}$ |
| 7321. | $L_{A6}$ | $L_{B78}$ |
| 7322. | $L_{A7}$ | $L_{B78}$ |
| 7323. | $L_{A8}$ | $L_{B78}$ |
| 7324. | $L_{A9}$ | $L_{B78}$ |
| 7325. | $L_{A10}$ | $L_{B78}$ |
| 7326. | $L_{A11}$ | $L_{B78}$ |
| 7327. | $L_{A12}$ | $L_{B78}$ |
| 7328. | $L_{A13}$ | $L_{B78}$ |
| 7329. | $L_{A14}$ | $L_{B78}$ |
| 7330. | $L_{A15}$ | $L_{B78}$ |
| 7331. | $L_{A16}$ | $L_{B78}$ |
| 7332. | $L_{A17}$ | $L_{B78}$ |
| 7333. | $L_{A18}$ | $L_{B78}$ |
| 7334. | $L_{A19}$ | $L_{B78}$ |
| 7335. | $L_{A20}$ | $L_{B78}$ |
| 7336. | $L_{A21}$ | $L_{B78}$ |
| 7337. | $L_{A22}$ | $L_{B78}$ |
| 7338. | $L_{A23}$ | $L_{B78}$ |
| 7339. | $L_{A24}$ | $L_{B78}$ |
| 7340. | $L_{A25}$ | $L_{B78}$ |
| 7341. | $L_{A26}$ | $L_{B78}$ |
| 7342. | $L_{A27}$ | $L_{B78}$ |
| 7343. | $L_{A28}$ | $L_{B78}$ |
| 7344. | $L_{A29}$ | $L_{B78}$ |
| 7345. | $L_{A30}$ | $L_{B78}$ |
| 7346. | $L_{A31}$ | $L_{B78}$ |
| 7347. | $L_{A32}$ | $L_{B78}$ |
| 7348. | $L_{A33}$ | $L_{B78}$ |
| 7349. | $L_{A34}$ | $L_{B78}$ |
| 7350. | $L_{A35}$ | $L_{B78}$ |
| 7351. | $L_{A36}$ | $L_{B78}$ |
| 7352. | $L_{A37}$ | $L_{B78}$ |
| 7353. | $L_{A38}$ | $L_{B78}$ |
| 7354. | $L_{A39}$ | $L_{B78}$ |
| 7355. | $L_{A40}$ | $L_{B78}$ |
| 7356. | $L_{A41}$ | $L_{B78}$ |
| 7357. | $L_{A42}$ | $L_{B78}$ |
| 7358. | $L_{A43}$ | $L_{B78}$ |

TABLE 1-continued

| Cpd # | $L_A$ | $L_B$ |
|---|---|---|
| 7359. | $L_{A44}$ | $L_{B78}$ |
| 7360. | $L_{A45}$ | $L_{B78}$ |
| 7361. | $L_{A46}$ | $L_{B78}$ |
| 7362. | $L_{A47}$ | $L_{B78}$ |
| 7363. | $L_{A48}$ | $L_{B78}$ |
| 7364. | $L_{A49}$ | $L_{B78}$ |
| 7365. | $L_{A50}$ | $L_{B78}$ |
| 7366. | $L_{A51}$ | $L_{B78}$ |
| 7367. | $L_{A52}$ | $L_{B78}$ |
| 7368. | $L_{A53}$ | $L_{B78}$ |
| 7369. | $L_{A54}$ | $L_{B78}$ |
| 7370. | $L_{A55}$ | $L_{B78}$ |
| 7371. | $L_{A56}$ | $L_{B78}$ |
| 7372. | $L_{A57}$ | $L_{B78}$ |
| 7373. | $L_{A58}$ | $L_{B78}$ |
| 7374. | $L_{A59}$ | $L_{B78}$ |
| 7375. | $L_{A60}$ | $L_{B78}$ |
| 7376. | $L_{A61}$ | $L_{B78}$ |
| 7377. | $L_{A62}$ | $L_{B78}$ |
| 7378. | $L_{A63}$ | $L_{B78}$ |
| 7379. | $L_{A64}$ | $L_{B78}$ |
| 7380. | $L_{A65}$ | $L_{B78}$ |
| 7381. | $L_{A66}$ | $L_{B78}$ |
| 7382. | $L_{A67}$ | $L_{B78}$ |
| 7383. | $L_{A68}$ | $L_{B78}$ |
| 7384. | $L_{A69}$ | $L_{B78}$ |
| 7385. | $L_{A70}$ | $L_{B78}$ |
| 7386. | $L_{A71}$ | $L_{B78}$ |
| 7387. | $L_{A72}$ | $L_{B78}$ |
| 7388. | $L_{A73}$ | $L_{B78}$ |
| 7389. | $L_{A74}$ | $L_{B78}$ |
| 7390. | $L_{A75}$ | $L_{B78}$ |
| 7391. | $L_{A76}$ | $L_{B78}$ |
| 7392. | $L_{A77}$ | $L_{B78}$ |
| 7393. | $L_{A78}$ | $L_{B78}$ |
| 7394. | $L_{A79}$ | $L_{B78}$ |
| 7395. | $L_{A80}$ | $L_{B78}$ |
| 7396. | $L_{A81}$ | $L_{B78}$ |
| 7397. | $L_{A82}$ | $L_{B78}$ |
| 7398. | $L_{A83}$ | $L_{B78}$ |
| 7399. | $L_{A84}$ | $L_{B78}$ |
| 7400. | $L_{A85}$ | $L_{B78}$ |
| 7401. | $L_{A86}$ | $L_{B78}$ |
| 7402. | $L_{A87}$ | $L_{B78}$ |
| 7403. | $L_{A88}$ | $L_{B78}$ |
| 7404. | $L_{A89}$ | $L_{B78}$ |
| 7405. | $L_{A90}$ | $L_{B78}$ |
| 7406. | $L_{A91}$ | $L_{B78}$ |
| 7407. | $L_{A92}$ | $L_{B78}$ |
| 7408. | $L_{A93}$ | $L_{B78}$ |
| 7409. | $L_{A94}$ | $L_{B78}$ |
| 7410. | $L_{A95}$ | $L_{B78}$ |
| 7411. | $L_{A1}$ | $L_{B79}$ |
| 7412. | $L_{A2}$ | $L_{B79}$ |
| 7413. | $L_{A3}$ | $L_{B79}$ |
| 7414. | $L_{A4}$ | $L_{B79}$ |
| 7415. | $L_{A5}$ | $L_{B79}$ |
| 7416. | $L_{A6}$ | $L_{B79}$ |
| 7417. | $L_{A7}$ | $L_{B79}$ |
| 7418. | $L_{A8}$ | $L_{B79}$ |
| 7419. | $L_{A9}$ | $L_{B79}$ |
| 7420. | $L_{A10}$ | $L_{B79}$ |
| 7421. | $L_{A11}$ | $L_{B79}$ |
| 7422. | $L_{A12}$ | $L_{B79}$ |
| 7423. | $L_{A13}$ | $L_{B79}$ |
| 7424. | $L_{A14}$ | $L_{B79}$ |
| 7425. | $L_{A15}$ | $L_{B79}$ |
| 7426. | $L_{A16}$ | $L_{B79}$ |
| 7427. | $L_{A17}$ | $L_{B79}$ |
| 7428. | $L_{A18}$ | $L_{B79}$ |
| 7429. | $L_{A19}$ | $L_{B79}$ |
| 7430. | $L_{A20}$ | $L_{B79}$ |
| 7431. | $L_{A21}$ | $L_{B79}$ |
| 7432. | $L_{A22}$ | $L_{B79}$ |
| 7433. | $L_{A23}$ | $L_{B79}$ |
| 7434. | $L_{A24}$ | $L_{B79}$ |
| 7435. | $L_{A25}$ | $L_{B79}$ |
| 7436. | $L_{A26}$ | $L_{B79}$ |

TABLE 1-continued

| Cpd # | $L_A$ | $L_B$ |
|---|---|---|
| 7437. | $L_{A27}$ | $L_{B79}$ |
| 7438. | $L_{A28}$ | $L_{B79}$ |
| 7439. | $L_{A29}$ | $L_{B79}$ |
| 7440. | $L_{A30}$ | $L_{B79}$ |
| 7441. | $L_{A31}$ | $L_{B79}$ |
| 7442. | $L_{A32}$ | $L_{B79}$ |
| 7443. | $L_{A33}$ | $L_{B79}$ |
| 7444. | $L_{A34}$ | $L_{B79}$ |
| 7445. | $L_{A35}$ | $L_{B79}$ |
| 7446. | $L_{A36}$ | $L_{B79}$ |
| 7447. | $L_{A37}$ | $L_{B79}$ |
| 7448. | $L_{A38}$ | $L_{B79}$ |
| 7449. | $L_{A39}$ | $L_{B79}$ |
| 7450. | $L_{A40}$ | $L_{B79}$ |
| 7451. | $L_{A41}$ | $L_{B79}$ |
| 7452. | $L_{A42}$ | $L_{B79}$ |
| 7453. | $L_{A43}$ | $L_{B79}$ |
| 7454. | $L_{A44}$ | $L_{B79}$ |
| 7455. | $L_{A45}$ | $L_{B79}$ |
| 7456. | $L_{A46}$ | $L_{B79}$ |
| 7457. | $L_{A47}$ | $L_{B79}$ |
| 7458. | $L_{A48}$ | $L_{B79}$ |
| 7459. | $L_{A49}$ | $L_{B79}$ |
| 7460. | $L_{A50}$ | $L_{B79}$ |
| 7461. | $L_{A51}$ | $L_{B79}$ |
| 7462. | $L_{A52}$ | $L_{B79}$ |
| 7463. | $L_{A53}$ | $L_{B79}$ |
| 7464. | $L_{A54}$ | $L_{B79}$ |
| 7465. | $L_{A55}$ | $L_{B79}$ |
| 7466. | $L_{A56}$ | $L_{B79}$ |
| 7467. | $L_{A57}$ | $L_{B79}$ |
| 7468. | $L_{A58}$ | $L_{B79}$ |
| 7469. | $L_{A59}$ | $L_{B79}$ |
| 7470. | $L_{A60}$ | $L_{B79}$ |
| 7471. | $L_{A61}$ | $L_{B79}$ |
| 7472. | $L_{A62}$ | $L_{B79}$ |
| 7473. | $L_{A63}$ | $L_{B79}$ |
| 7474. | $L_{A64}$ | $L_{B79}$ |
| 7475. | $L_{A65}$ | $L_{B79}$ |
| 7476. | $L_{A66}$ | $L_{B79}$ |
| 7477. | $L_{A67}$ | $L_{B79}$ |
| 7478. | $L_{A68}$ | $L_{B79}$ |
| 7479. | $L_{A69}$ | $L_{B79}$ |
| 7480. | $L_{A70}$ | $L_{B79}$ |
| 7481. | $L_{A71}$ | $L_{B79}$ |
| 7482. | $L_{A72}$ | $L_{B79}$ |
| 7483. | $L_{A73}$ | $L_{B79}$ |
| 7484. | $L_{A74}$ | $L_{B79}$ |
| 7485. | $L_{A75}$ | $L_{B79}$ |
| 7486. | $L_{A76}$ | $L_{B79}$ |
| 7487. | $L_{A77}$ | $L_{B79}$ |
| 7488. | $L_{A78}$ | $L_{B79}$ |
| 7489. | $L_{A79}$ | $L_{B79}$ |
| 7490. | $L_{A80}$ | $L_{B79}$ |
| 7491. | $L_{A81}$ | $L_{B79}$ |
| 7492. | $L_{A82}$ | $L_{B79}$ |
| 7493. | $L_{A83}$ | $L_{B79}$ |
| 7494. | $L_{A84}$ | $L_{B79}$ |
| 7495. | $L_{A85}$ | $L_{B79}$ |
| 7496. | $L_{A86}$ | $L_{B79}$ |
| 7497. | $L_{A87}$ | $L_{B79}$ |
| 7498. | $L_{A88}$ | $L_{B79}$ |
| 7499. | $L_{A89}$ | $L_{B79}$ |
| 7500. | $L_{A90}$ | $L_{B79}$ |
| 7501. | $L_{A91}$ | $L_{B79}$ |
| 7502. | $L_{A92}$ | $L_{B79}$ |
| 7503. | $L_{A93}$ | $L_{B79}$ |
| 7504. | $L_{A94}$ | $L_{B79}$ |
| 7505. | $L_{A95}$ | $L_{B79}$ |
| 7506. | $L_{A1}$ | $L_{B80}$ |
| 7507. | $L_{A2}$ | $L_{B80}$ |
| 7508. | $L_{A3}$ | $L_{B80}$ |
| 7509. | $L_{A4}$ | $L_{B80}$ |
| 7510. | $L_{A5}$ | $L_{B80}$ |
| 7511. | $L_{A6}$ | $L_{B80}$ |
| 7512. | $L_{A7}$ | $L_{B80}$ |
| 7513. | $L_{A8}$ | $L_{B80}$ |
| 7514. | $L_{A9}$ | $L_{B80}$ |

TABLE 1-continued

| Cpd # | $L_A$ | $L_B$ |
|---|---|---|
| 7515. | $L_{A10}$ | $L_{B80}$ |
| 7516. | $L_{A11}$ | $L_{B80}$ |
| 7517. | $L_{A12}$ | $L_{B80}$ |
| 7518. | $L_{A13}$ | $L_{B80}$ |
| 7519. | $L_{A14}$ | $L_{B80}$ |
| 7520. | $L_{A15}$ | $L_{B80}$ |
| 7521. | $L_{A16}$ | $L_{B80}$ |
| 7522. | $L_{A17}$ | $L_{B80}$ |
| 7523. | $L_{A18}$ | $L_{B80}$ |
| 7524. | $L_{A19}$ | $L_{B80}$ |
| 7525. | $L_{A20}$ | $L_{B80}$ |
| 7526. | $L_{A21}$ | $L_{B80}$ |
| 7527. | $L_{A22}$ | $L_{B80}$ |
| 7528. | $L_{A23}$ | $L_{B80}$ |
| 7529. | $L_{A24}$ | $L_{B80}$ |
| 7530. | $L_{A25}$ | $L_{B80}$ |
| 7531. | $L_{A26}$ | $L_{B80}$ |
| 7532. | $L_{A27}$ | $L_{B80}$ |
| 7533. | $L_{A28}$ | $L_{B80}$ |
| 7534. | $L_{A29}$ | $L_{B80}$ |
| 7535. | $L_{A30}$ | $L_{B80}$ |
| 7536. | $L_{A31}$ | $L_{B80}$ |
| 7537. | $L_{A32}$ | $L_{B80}$ |
| 7538. | $L_{A33}$ | $L_{B80}$ |
| 7539. | $L_{A34}$ | $L_{B80}$ |
| 7540. | $L_{A35}$ | $L_{B80}$ |
| 7541. | $L_{A36}$ | $L_{B80}$ |
| 7542. | $L_{A37}$ | $L_{B80}$ |
| 7543. | $L_{A38}$ | $L_{B80}$ |
| 7544. | $L_{A39}$ | $L_{B80}$ |
| 7545. | $L_{A40}$ | $L_{B80}$ |
| 7546. | $L_{A41}$ | $L_{B80}$ |
| 7547. | $L_{A42}$ | $L_{B80}$ |
| 7548. | $L_{A43}$ | $L_{B80}$ |
| 7549. | $L_{A44}$ | $L_{B80}$ |
| 7550. | $L_{A45}$ | $L_{B80}$ |
| 7551. | $L_{A46}$ | $L_{B80}$ |
| 7552. | $L_{A47}$ | $L_{B80}$ |
| 7553. | $L_{A48}$ | $L_{B80}$ |
| 7554. | $L_{A49}$ | $L_{B80}$ |
| 7555. | $L_{A50}$ | $L_{B80}$ |
| 7556. | $L_{A51}$ | $L_{B80}$ |
| 7557. | $L_{A52}$ | $L_{B80}$ |
| 7558. | $L_{A53}$ | $L_{B80}$ |
| 7559. | $L_{A54}$ | $L_{B80}$ |
| 7560. | $L_{A55}$ | $L_{B80}$ |
| 7561. | $L_{A56}$ | $L_{B80}$ |
| 7562. | $L_{A57}$ | $L_{B80}$ |
| 7563. | $L_{A58}$ | $L_{B80}$ |
| 7564. | $L_{A59}$ | $L_{B80}$ |
| 7565. | $L_{A60}$ | $L_{B80}$ |
| 7566. | $L_{A61}$ | $L_{B80}$ |
| 7567. | $L_{A62}$ | $L_{B80}$ |
| 7568. | $L_{A63}$ | $L_{B80}$ |
| 7569. | $L_{A64}$ | $L_{B80}$ |
| 7570. | $L_{A65}$ | $L_{B80}$ |
| 7571. | $L_{A66}$ | $L_{B80}$ |
| 7572. | $L_{A67}$ | $L_{B80}$ |
| 7573. | $L_{A68}$ | $L_{B80}$ |
| 7574. | $L_{A69}$ | $L_{B80}$ |
| 7575. | $L_{A70}$ | $L_{B80}$ |
| 7576. | $L_{A71}$ | $L_{B80}$ |
| 7577. | $L_{A72}$ | $L_{B80}$ |
| 7578. | $L_{A73}$ | $L_{B80}$ |
| 7579. | $L_{A74}$ | $L_{B80}$ |
| 7580. | $L_{A75}$ | $L_{B80}$ |
| 7581. | $L_{A76}$ | $L_{B80}$ |
| 7582. | $L_{A77}$ | $L_{B80}$ |
| 7583. | $L_{A78}$ | $L_{B80}$ |
| 7584. | $L_{A79}$ | $L_{B80}$ |
| 7585. | $L_{A80}$ | $L_{B80}$ |
| 7586. | $L_{A81}$ | $L_{B80}$ |
| 7587. | $L_{A82}$ | $L_{B80}$ |
| 7588. | $L_{A83}$ | $L_{B80}$ |
| 7589. | $L_{A84}$ | $L_{B80}$ |
| 7590. | $L_{A85}$ | $L_{B80}$ |
| 7591. | $L_{A86}$ | $L_{B80}$ |
| 7592. | $L_{A87}$ | $L_{B80}$ |

TABLE 1-continued

| Cpd # | $L_A$ | $L_B$ |
|---|---|---|
| 7593. | $L_{A88}$ | $L_{B80}$ |
| 7594. | $L_{A89}$ | $L_{B80}$ |
| 7595. | $L_{A90}$ | $L_{B80}$ |
| 7596. | $L_{A91}$ | $L_{B80}$ |
| 7597. | $L_{A92}$ | $L_{B80}$ |
| 7598. | $L_{A93}$ | $L_{B80}$ |
| 7599. | $L_{A94}$ | $L_{B80}$ |
| 7600. | $L_{A95}$ | $L_{B80}$ |
| 7601. | $L_{A1}$ | $L_{B81}$ |
| 7602. | $L_{A2}$ | $L_{B81}$ |
| 7603. | $L_{A3}$ | $L_{B81}$ |
| 7604. | $L_{A4}$ | $L_{B81}$ |
| 7605. | $L_{A5}$ | $L_{B81}$ |
| 7606. | $L_{A6}$ | $L_{B81}$ |
| 7607. | $L_{A7}$ | $L_{B81}$ |
| 7608. | $L_{A8}$ | $L_{B81}$ |
| 7609. | $L_{A9}$ | $L_{B81}$ |
| 7610. | $L_{A10}$ | $L_{B81}$ |
| 7611. | $L_{A11}$ | $L_{B81}$ |
| 7612. | $L_{A12}$ | $L_{B81}$ |
| 7613. | $L_{A13}$ | $L_{B81}$ |
| 7614. | $L_{A14}$ | $L_{B81}$ |
| 7615. | $L_{A15}$ | $L_{B81}$ |
| 7616. | $L_{A16}$ | $L_{B81}$ |
| 7617. | $L_{A17}$ | $L_{B81}$ |
| 7618. | $L_{A18}$ | $L_{B81}$ |
| 7619. | $L_{A19}$ | $L_{B81}$ |
| 7620. | $L_{A20}$ | $L_{B81}$ |
| 7621. | $L_{A21}$ | $L_{B81}$ |
| 7622. | $L_{A22}$ | $L_{B81}$ |
| 7623. | $L_{A23}$ | $L_{B81}$ |
| 7624. | $L_{A24}$ | $L_{B81}$ |
| 7625. | $L_{A25}$ | $L_{B81}$ |
| 7626. | $L_{A26}$ | $L_{B81}$ |
| 7627. | $L_{A27}$ | $L_{B81}$ |
| 7628. | $L_{A28}$ | $L_{B81}$ |
| 7629. | $L_{A29}$ | $L_{B81}$ |
| 7630. | $L_{A30}$ | $L_{B81}$ |
| 7631. | $L_{A31}$ | $L_{B81}$ |
| 7632. | $L_{A32}$ | $L_{B81}$ |
| 7633. | $L_{A33}$ | $L_{B81}$ |
| 7634. | $L_{A34}$ | $L_{B81}$ |
| 7635. | $L_{A35}$ | $L_{B81}$ |
| 7636. | $L_{A36}$ | $L_{B81}$ |
| 7637. | $L_{A37}$ | $L_{B81}$ |
| 7638. | $L_{A38}$ | $L_{B81}$ |
| 7639. | $L_{A39}$ | $L_{B81}$ |
| 7640. | $L_{A40}$ | $L_{B81}$ |
| 7641. | $L_{A41}$ | $L_{B81}$ |
| 7642. | $L_{A42}$ | $L_{B81}$ |
| 7643. | $L_{A43}$ | $L_{B81}$ |
| 7644. | $L_{A44}$ | $L_{B81}$ |
| 7645. | $L_{A45}$ | $L_{B81}$ |
| 7646. | $L_{A46}$ | $L_{B81}$ |
| 7647. | $L_{A47}$ | $L_{B81}$ |
| 7648. | $L_{A48}$ | $L_{B81}$ |
| 7649. | $L_{A49}$ | $L_{B81}$ |
| 7650. | $L_{A50}$ | $L_{B81}$ |
| 7651. | $L_{A51}$ | $L_{B81}$ |
| 7652. | $L_{A52}$ | $L_{B81}$ |
| 7653. | $L_{A53}$ | $L_{B81}$ |
| 7654. | $L_{A54}$ | $L_{B81}$ |
| 7655. | $L_{A55}$ | $L_{B81}$ |
| 7656. | $L_{A56}$ | $L_{B81}$ |
| 7657. | $L_{A57}$ | $L_{B81}$ |
| 7658. | $L_{A58}$ | $L_{B81}$ |
| 7659. | $L_{A59}$ | $L_{B81}$ |
| 7660. | $L_{A60}$ | $L_{B81}$ |
| 7661. | $L_{A61}$ | $L_{B81}$ |
| 7662. | $L_{A62}$ | $L_{B81}$ |
| 7663. | $L_{A63}$ | $L_{B81}$ |
| 7664. | $L_{A64}$ | $L_{B81}$ |
| 7665. | $L_{A65}$ | $L_{B81}$ |
| 7666. | $L_{A66}$ | $L_{B81}$ |
| 7667. | $L_{A67}$ | $L_{B81}$ |
| 7668. | $L_{A68}$ | $L_{B81}$ |
| 7669. | $L_{A69}$ | $L_{B81}$ |
| 7670. | $L_{A70}$ | $L_{B81}$ |
| 7671. | $L_{A71}$ | $L_{B81}$ |
| 7672. | $L_{A72}$ | $L_{B81}$ |
| 7673. | $L_{A73}$ | $L_{B81}$ |
| 7674. | $L_{A74}$ | $L_{B81}$ |
| 7675. | $L_{A75}$ | $L_{B81}$ |
| 7676. | $L_{A76}$ | $L_{B81}$ |
| 7677. | $L_{A77}$ | $L_{B81}$ |
| 7678. | $L_{A78}$ | $L_{B81}$ |
| 7679. | $L_{A79}$ | $L_{B81}$ |
| 7680. | $L_{A80}$ | $L_{B81}$ |
| 7681. | $L_{A81}$ | $L_{B81}$ |
| 7682. | $L_{A82}$ | $L_{B81}$ |
| 7683. | $L_{A83}$ | $L_{B81}$ |
| 7684. | $L_{A84}$ | $L_{B81}$ |
| 7685. | $L_{A85}$ | $L_{B81}$ |
| 7686. | $L_{A86}$ | $L_{B81}$ |
| 7687. | $L_{A87}$ | $L_{B81}$ |
| 7688. | $L_{A88}$ | $L_{B81}$ |
| 7689. | $L_{A89}$ | $L_{B81}$ |
| 7690. | $L_{A90}$ | $L_{B81}$ |
| 7691. | $L_{A91}$ | $L_{B81}$ |
| 7692. | $L_{A92}$ | $L_{B81}$ |
| 7693. | $L_{A93}$ | $L_{B81}$ |
| 7694. | $L_{A94}$ | $L_{B81}$ |
| 7695. | $L_{A95}$ | $L_{B81}$ |
| 7696. | $L_{A1}$ | $L_{B82}$ |
| 7697. | $L_{A2}$ | $L_{B82}$ |
| 7698. | $L_{A3}$ | $L_{B82}$ |
| 7699. | $L_{A4}$ | $L_{B82}$ |
| 7700. | $L_{A5}$ | $L_{B82}$ |
| 7701. | $L_{A6}$ | $L_{B82}$ |
| 7702. | $L_{A7}$ | $L_{B82}$ |
| 7703. | $L_{A8}$ | $L_{B82}$ |
| 7704. | $L_{A9}$ | $L_{B82}$ |
| 7705. | $L_{A10}$ | $L_{B82}$ |
| 7706. | $L_{A11}$ | $L_{B82}$ |
| 7707. | $L_{A12}$ | $L_{B82}$ |
| 7708. | $L_{A13}$ | $L_{B82}$ |
| 7709. | $L_{A14}$ | $L_{B82}$ |
| 7710. | $L_{A15}$ | $L_{B82}$ |
| 7711. | $L_{A16}$ | $L_{B82}$ |
| 7712. | $L_{A17}$ | $L_{B82}$ |
| 7713. | $L_{A18}$ | $L_{B82}$ |
| 7714. | $L_{A19}$ | $L_{B82}$ |
| 7715. | $L_{A20}$ | $L_{B82}$ |
| 7716. | $L_{A21}$ | $L_{B82}$ |
| 7717. | $L_{A22}$ | $L_{B82}$ |
| 7718. | $L_{A23}$ | $L_{B82}$ |
| 7719. | $L_{A24}$ | $L_{B82}$ |
| 7720. | $L_{A25}$ | $L_{B82}$ |
| 7721. | $L_{A26}$ | $L_{B82}$ |
| 7722. | $L_{A27}$ | $L_{B82}$ |
| 7723. | $L_{A28}$ | $L_{B82}$ |
| 7724. | $L_{A29}$ | $L_{B82}$ |
| 7725. | $L_{A30}$ | $L_{B82}$ |
| 7726. | $L_{A31}$ | $L_{B82}$ |
| 7727. | $L_{A32}$ | $L_{B82}$ |
| 7728. | $L_{A33}$ | $L_{B82}$ |
| 7729. | $L_{A34}$ | $L_{B82}$ |
| 7730. | $L_{A35}$ | $L_{B82}$ |
| 7731. | $L_{A36}$ | $L_{B82}$ |
| 7732. | $L_{A37}$ | $L_{B82}$ |
| 7733. | $L_{A38}$ | $L_{B82}$ |
| 7734. | $L_{A39}$ | $L_{B82}$ |
| 7735. | $L_{A40}$ | $L_{B82}$ |
| 7736. | $L_{A41}$ | $L_{B82}$ |
| 7737. | $L_{A42}$ | $L_{B82}$ |
| 7738. | $L_{A43}$ | $L_{B82}$ |
| 7739. | $L_{A44}$ | $L_{B82}$ |
| 7740. | $L_{A45}$ | $L_{B82}$ |
| 7741. | $L_{A46}$ | $L_{B82}$ |
| 7742. | $L_{A47}$ | $L_{B82}$ |
| 7743. | $L_{A48}$ | $L_{B82}$ |
| 7744. | $L_{A49}$ | $L_{B82}$ |
| 7745. | $L_{A50}$ | $L_{B82}$ |
| 7746. | $L_{A51}$ | $L_{B82}$ |
| 7747. | $L_{A52}$ | $L_{B82}$ |
| 7748. | $L_{A53}$ | $L_{B82}$ |

TABLE 1-continued

| Cpd # | $L_A$ | $L_B$ |
|---|---|---|
| 7749. | $L_{A54}$ | $L_{B82}$ |
| 7750. | $L_{A55}$ | $L_{B82}$ |
| 7751. | $L_{A56}$ | $L_{B82}$ |
| 7752. | $L_{A57}$ | $L_{B82}$ |
| 7753. | $L_{A58}$ | $L_{B82}$ |
| 7754. | $L_{A59}$ | $L_{B82}$ |
| 7755. | $L_{A60}$ | $L_{B82}$ |
| 7756. | $L_{A61}$ | $L_{B82}$ |
| 7757. | $L_{A62}$ | $L_{B82}$ |
| 7758. | $L_{A63}$ | $L_{B82}$ |
| 7759. | $L_{A64}$ | $L_{B82}$ |
| 7760. | $L_{A65}$ | $L_{B82}$ |
| 7761. | $L_{A66}$ | $L_{B82}$ |
| 7762. | $L_{A67}$ | $L_{B82}$ |
| 7763. | $L_{A68}$ | $L_{B82}$ |
| 7764. | $L_{A69}$ | $L_{B82}$ |
| 7765. | $L_{A70}$ | $L_{B82}$ |
| 7766. | $L_{A71}$ | $L_{B82}$ |
| 7767. | $L_{A72}$ | $L_{B82}$ |
| 7768. | $L_{A73}$ | $L_{B82}$ |
| 7769. | $L_{A74}$ | $L_{B82}$ |
| 7770. | $L_{A75}$ | $L_{B82}$ |
| 7771. | $L_{A76}$ | $L_{B82}$ |
| 7772. | $L_{A77}$ | $L_{B82}$ |
| 7773. | $L_{A78}$ | $L_{B82}$ |
| 7774. | $L_{A79}$ | $L_{B82}$ |
| 7775. | $L_{A80}$ | $L_{B82}$ |
| 7776. | $L_{A81}$ | $L_{B82}$ |
| 7777. | $L_{A82}$ | $L_{B82}$ |
| 7778. | $L_{A83}$ | $L_{B82}$ |
| 7779. | $L_{A84}$ | $L_{B82}$ |
| 7780. | $L_{A85}$ | $L_{B82}$ |
| 7781. | $L_{A86}$ | $L_{B82}$ |
| 7782. | $L_{A87}$ | $L_{B82}$ |
| 7783. | $L_{A88}$ | $L_{B82}$ |
| 7784. | $L_{A89}$ | $L_{B82}$ |
| 7785. | $L_{A90}$ | $L_{B82}$ |
| 7786. | $L_{A91}$ | $L_{B82}$ |
| 7787. | $L_{A92}$ | $L_{B82}$ |
| 7788. | $L_{A93}$ | $L_{B82}$ |
| 7789. | $L_{A94}$ | $L_{B82}$ |
| 7790. | $L_{A95}$ | $L_{B82}$ |
| 7791. | $L_{A1}$ | $L_{B83}$ |
| 7792. | $L_{A2}$ | $L_{B83}$ |
| 7793. | $L_{A3}$ | $L_{B83}$ |
| 7794. | $L_{A4}$ | $L_{B83}$ |
| 7795. | $L_{A5}$ | $L_{B83}$ |
| 7796. | $L_{A6}$ | $L_{B83}$ |
| 7797. | $L_{A7}$ | $L_{B83}$ |
| 7798. | $L_{A8}$ | $L_{B83}$ |
| 7799. | $L_{A9}$ | $L_{B83}$ |
| 7800. | $L_{A10}$ | $L_{B83}$ |
| 7801. | $L_{A11}$ | $L_{B83}$ |
| 7802. | $L_{A12}$ | $L_{B83}$ |
| 7803. | $L_{A13}$ | $L_{B83}$ |
| 7804. | $L_{A14}$ | $L_{B83}$ |
| 7805. | $L_{A15}$ | $L_{B83}$ |
| 7806. | $L_{A16}$ | $L_{B83}$ |
| 7807. | $L_{A17}$ | $L_{B83}$ |
| 7808. | $L_{A18}$ | $L_{B83}$ |
| 7809. | $L_{A19}$ | $L_{B83}$ |
| 7810. | $L_{A20}$ | $L_{B83}$ |
| 7811. | $L_{A21}$ | $L_{B83}$ |
| 7812. | $L_{A22}$ | $L_{B83}$ |
| 7813. | $L_{A23}$ | $L_{B83}$ |
| 7814. | $L_{A24}$ | $L_{B83}$ |
| 7815. | $L_{A25}$ | $L_{B83}$ |
| 7816. | $L_{A26}$ | $L_{B83}$ |
| 7817. | $L_{A27}$ | $L_{B83}$ |
| 7818. | $L_{A28}$ | $L_{B83}$ |
| 7819. | $L_{A29}$ | $L_{B83}$ |
| 7820. | $L_{A30}$ | $L_{B83}$ |
| 7821. | $L_{A31}$ | $L_{B83}$ |
| 7822. | $L_{A32}$ | $L_{B83}$ |
| 7823. | $L_{A33}$ | $L_{B83}$ |
| 7824. | $L_{A34}$ | $L_{B83}$ |
| 7825. | $L_{A35}$ | $L_{B83}$ |
| 7826. | $L_{A36}$ | $L_{B83}$ |

TABLE 1-continued

| Cpd # | $L_A$ | $L_B$ |
|---|---|---|
| 7827. | $L_{A37}$ | $L_{B83}$ |
| 7828. | $L_{A38}$ | $L_{B83}$ |
| 7829. | $L_{A39}$ | $L_{B83}$ |
| 7830. | $L_{A40}$ | $L_{B83}$ |
| 7831. | $L_{A41}$ | $L_{B83}$ |
| 7832. | $L_{A42}$ | $L_{B83}$ |
| 7833. | $L_{A43}$ | $L_{B83}$ |
| 7834. | $L_{A44}$ | $L_{B83}$ |
| 7835. | $L_{A45}$ | $L_{B83}$ |
| 7836. | $L_{A46}$ | $L_{B83}$ |
| 7837. | $L_{A47}$ | $L_{B83}$ |
| 7838. | $L_{A48}$ | $L_{B83}$ |
| 7839. | $L_{A49}$ | $L_{B83}$ |
| 7840. | $L_{A50}$ | $L_{B83}$ |
| 7841. | $L_{A51}$ | $L_{B83}$ |
| 7842. | $L_{A52}$ | $L_{B83}$ |
| 7843. | $L_{A53}$ | $L_{B83}$ |
| 7844. | $L_{A54}$ | $L_{B83}$ |
| 7845. | $L_{A55}$ | $L_{B83}$ |
| 7846. | $L_{A56}$ | $L_{B83}$ |
| 7847. | $L_{A57}$ | $L_{B83}$ |
| 7848. | $L_{A58}$ | $L_{B83}$ |
| 7849. | $L_{A59}$ | $L_{B83}$ |
| 7850. | $L_{A60}$ | $L_{B83}$ |
| 7851. | $L_{A61}$ | $L_{B83}$ |
| 7852. | $L_{A62}$ | $L_{B83}$ |
| 7853. | $L_{A63}$ | $L_{B83}$ |
| 7854. | $L_{A64}$ | $L_{B83}$ |
| 7855. | $L_{A65}$ | $L_{B83}$ |
| 7856. | $L_{A66}$ | $L_{B83}$ |
| 7857. | $L_{A67}$ | $L_{B83}$ |
| 7858. | $L_{A68}$ | $L_{B83}$ |
| 7859. | $L_{A69}$ | $L_{B83}$ |
| 7860. | $L_{A70}$ | $L_{B83}$ |
| 7861. | $L_{A71}$ | $L_{B83}$ |
| 7862. | $L_{A72}$ | $L_{B83}$ |
| 7863. | $L_{A73}$ | $L_{B83}$ |
| 7864. | $L_{A74}$ | $L_{B83}$ |
| 7865. | $L_{A75}$ | $L_{B83}$ |
| 7866. | $L_{A76}$ | $L_{B83}$ |
| 7867. | $L_{A77}$ | $L_{B83}$ |
| 7868. | $L_{A78}$ | $L_{B83}$ |
| 7869. | $L_{A79}$ | $L_{B83}$ |
| 7870. | $L_{A80}$ | $L_{B83}$ |
| 7871. | $L_{A81}$ | $L_{B83}$ |
| 7872. | $L_{A82}$ | $L_{B83}$ |
| 7873. | $L_{A83}$ | $L_{B83}$ |
| 7874. | $L_{A84}$ | $L_{B83}$ |
| 7875. | $L_{A85}$ | $L_{B83}$ |
| 7876. | $L_{A86}$ | $L_{B83}$ |
| 7877. | $L_{A87}$ | $L_{B83}$ |
| 7878. | $L_{A88}$ | $L_{B83}$ |
| 7879. | $L_{A89}$ | $L_{B83}$ |
| 7880. | $L_{A90}$ | $L_{B83}$ |
| 7881. | $L_{A91}$ | $L_{B83}$ |
| 7882. | $L_{A92}$ | $L_{B83}$ |
| 7883. | $L_{A93}$ | $L_{B83}$ |
| 7884. | $L_{A94}$ | $L_{B83}$ |
| 7885. | $L_{A95}$ | $L_{B83}$ |
| 7886. | $L_{A1}$ | $L_{B84}$ |
| 7887. | $L_{A2}$ | $L_{B84}$ |
| 7888. | $L_{A3}$ | $L_{B84}$ |
| 7889. | $L_{A4}$ | $L_{B84}$ |
| 7890. | $L_{A5}$ | $L_{B84}$ |
| 7891. | $L_{A6}$ | $L_{B84}$ |
| 7892. | $L_{A7}$ | $L_{B84}$ |
| 7893. | $L_{A8}$ | $L_{B84}$ |
| 7894. | $L_{A9}$ | $L_{B84}$ |
| 7895. | $L_{A10}$ | $L_{B84}$ |
| 7896. | $L_{A11}$ | $L_{B84}$ |
| 7897. | $L_{A12}$ | $L_{B84}$ |
| 7898. | $L_{A13}$ | $L_{B84}$ |
| 7899. | $L_{A14}$ | $L_{B84}$ |
| 7900. | $L_{A15}$ | $L_{B84}$ |
| 7901. | $L_{A16}$ | $L_{B84}$ |
| 7902. | $L_{A17}$ | $L_{B84}$ |
| 7903. | $L_{A18}$ | $L_{B84}$ |
| 7904. | $L_{A19}$ | $L_{B84}$ |

TABLE 1-continued

| Cpd # | $L_A$ | $L_B$ |
|---|---|---|
| 7905. | $L_{A20}$ | $L_{B84}$ |
| 7906. | $L_{A21}$ | $L_{B84}$ |
| 7907. | $L_{A22}$ | $L_{B84}$ |
| 7908. | $L_{A23}$ | $L_{B84}$ |
| 7909. | $L_{A24}$ | $L_{B84}$ |
| 7910. | $L_{A25}$ | $L_{B84}$ |
| 7911. | $L_{A26}$ | $L_{B84}$ |
| 7912. | $L_{A27}$ | $L_{B84}$ |
| 7913. | $L_{A28}$ | $L_{B84}$ |
| 7914. | $L_{A29}$ | $L_{B84}$ |
| 7915. | $L_{A30}$ | $L_{B84}$ |
| 7916. | $L_{A31}$ | $L_{B84}$ |
| 7917. | $L_{A32}$ | $L_{B84}$ |
| 7918. | $L_{A33}$ | $L_{B84}$ |
| 7919. | $L_{A34}$ | $L_{B84}$ |
| 7920. | $L_{A35}$ | $L_{B84}$ |
| 7921. | $L_{A36}$ | $L_{B84}$ |
| 7922. | $L_{A37}$ | $L_{B84}$ |
| 7923. | $L_{A38}$ | $L_{B84}$ |
| 7924. | $L_{A39}$ | $L_{B84}$ |
| 7925. | $L_{A40}$ | $L_{B84}$ |
| 7926. | $L_{A41}$ | $L_{B84}$ |
| 7927. | $L_{A42}$ | $L_{B84}$ |
| 7928. | $L_{A43}$ | $L_{B84}$ |
| 7929. | $L_{A44}$ | $L_{B84}$ |
| 7930. | $L_{A45}$ | $L_{B84}$ |
| 7931. | $L_{A46}$ | $L_{B84}$ |
| 7932. | $L_{A47}$ | $L_{B84}$ |
| 7933. | $L_{A48}$ | $L_{B84}$ |
| 7934. | $L_{A49}$ | $L_{B84}$ |
| 7935. | $L_{A50}$ | $L_{B84}$ |
| 7936. | $L_{A51}$ | $L_{B84}$ |
| 7937. | $L_{A52}$ | $L_{B84}$ |
| 7938. | $L_{A53}$ | $L_{B84}$ |
| 7939. | $L_{A54}$ | $L_{B84}$ |
| 7940. | $L_{A55}$ | $L_{B84}$ |
| 7941. | $L_{A56}$ | $L_{B84}$ |
| 7942. | $L_{A57}$ | $L_{B84}$ |
| 7943. | $L_{A58}$ | $L_{B84}$ |
| 7944. | $L_{A59}$ | $L_{B84}$ |
| 7945. | $L_{A60}$ | $L_{B84}$ |
| 7946. | $L_{A61}$ | $L_{B84}$ |
| 7947. | $L_{A62}$ | $L_{B84}$ |
| 7948. | $L_{A63}$ | $L_{B84}$ |
| 7949. | $L_{A64}$ | $L_{B84}$ |
| 7950. | $L_{A65}$ | $L_{B84}$ |
| 7951. | $L_{A66}$ | $L_{B84}$ |
| 7952. | $L_{A67}$ | $L_{B84}$ |
| 7953. | $L_{A68}$ | $L_{B84}$ |
| 7954. | $L_{A69}$ | $L_{B84}$ |
| 7955. | $L_{A70}$ | $L_{B84}$ |
| 7956. | $L_{A71}$ | $L_{B84}$ |
| 7957. | $L_{A72}$ | $L_{B84}$ |
| 7958. | $L_{A73}$ | $L_{B84}$ |
| 7959. | $L_{A74}$ | $L_{B84}$ |
| 7960. | $L_{A75}$ | $L_{B84}$ |
| 7961. | $L_{A76}$ | $L_{B84}$ |
| 7962. | $L_{A77}$ | $L_{B84}$ |
| 7963. | $L_{A78}$ | $L_{B84}$ |
| 7964. | $L_{A79}$ | $L_{B84}$ |
| 7965. | $L_{A80}$ | $L_{B84}$ |
| 7966. | $L_{A81}$ | $L_{B84}$ |
| 7967. | $L_{A82}$ | $L_{B84}$ |
| 7968. | $L_{A83}$ | $L_{B84}$ |
| 7969. | $L_{A84}$ | $L_{B84}$ |
| 7970. | $L_{A85}$ | $L_{B84}$ |
| 7971. | $L_{A86}$ | $L_{B84}$ |
| 7972. | $L_{A87}$ | $L_{B84}$ |
| 7973. | $L_{A88}$ | $L_{B84}$ |
| 7974. | $L_{A89}$ | $L_{B84}$ |
| 7975. | $L_{A90}$ | $L_{B84}$ |
| 7976. | $L_{A91}$ | $L_{B84}$ |
| 7977. | $L_{A92}$ | $L_{B84}$ |
| 7978. | $L_{A93}$ | $L_{B84}$ |
| 7979. | $L_{A94}$ | $L_{B84}$ |
| 7980. | $L_{A95}$ | $L_{B84}$ |
| 7981. | $L_{A1}$ | $L_{B85}$ |
| 7982. | $L_{A2}$ | $L_{B85}$ |
| 7983. | $L_{A3}$ | $L_{B85}$ |
| 7984. | $L_{A4}$ | $L_{B85}$ |
| 7985. | $L_{A5}$ | $L_{B85}$ |
| 7986. | $L_{A6}$ | $L_{B85}$ |
| 7987. | $L_{A7}$ | $L_{B85}$ |
| 7988. | $L_{A8}$ | $L_{B85}$ |
| 7989. | $L_{A9}$ | $L_{B85}$ |
| 7990. | $L_{A10}$ | $L_{B85}$ |
| 7991. | $L_{A11}$ | $L_{B85}$ |
| 7992. | $L_{A12}$ | $L_{B85}$ |
| 7993. | $L_{A13}$ | $L_{B85}$ |
| 7994. | $L_{A14}$ | $L_{B85}$ |
| 7995. | $L_{A15}$ | $L_{B85}$ |
| 7996. | $L_{A16}$ | $L_{B85}$ |
| 7997. | $L_{A17}$ | $L_{B85}$ |
| 7998. | $L_{A18}$ | $L_{B85}$ |
| 7999. | $L_{A19}$ | $L_{B85}$ |
| 8000. | $L_{A20}$ | $L_{B85}$ |
| 8001. | $L_{A21}$ | $L_{B85}$ |
| 8002. | $L_{A22}$ | $L_{B85}$ |
| 8003. | $L_{A23}$ | $L_{B85}$ |
| 8004. | $L_{A24}$ | $L_{B85}$ |
| 8005. | $L_{A25}$ | $L_{B85}$ |
| 8006. | $L_{A26}$ | $L_{B85}$ |
| 8007. | $L_{A27}$ | $L_{B85}$ |
| 8008. | $L_{A28}$ | $L_{B85}$ |
| 8009. | $L_{A29}$ | $L_{B85}$ |
| 8010. | $L_{A30}$ | $L_{B85}$ |
| 8011. | $L_{A31}$ | $L_{B85}$ |
| 8012. | $L_{A32}$ | $L_{B85}$ |
| 8013. | $L_{A33}$ | $L_{B85}$ |
| 8014. | $L_{A34}$ | $L_{B85}$ |
| 8015. | $L_{A35}$ | $L_{B85}$ |
| 8016. | $L_{A36}$ | $L_{B85}$ |
| 8017. | $L_{A37}$ | $L_{B85}$ |
| 8018. | $L_{A38}$ | $L_{B85}$ |
| 8019. | $L_{A39}$ | $L_{B85}$ |
| 8020. | $L_{A40}$ | $L_{B85}$ |
| 8021. | $L_{A41}$ | $L_{B85}$ |
| 8022. | $L_{A42}$ | $L_{B85}$ |
| 8023. | $L_{A43}$ | $L_{B85}$ |
| 8024. | $L_{A44}$ | $L_{B85}$ |
| 8025. | $L_{A45}$ | $L_{B85}$ |
| 8026. | $L_{A46}$ | $L_{B85}$ |
| 8027. | $L_{A47}$ | $L_{B85}$ |
| 8028. | $L_{A48}$ | $L_{B85}$ |
| 8029. | $L_{A49}$ | $L_{B85}$ |
| 8030. | $L_{A50}$ | $L_{B85}$ |
| 8031. | $L_{A51}$ | $L_{B85}$ |
| 8032. | $L_{A52}$ | $L_{B85}$ |
| 8033. | $L_{A53}$ | $L_{B85}$ |
| 8034. | $L_{A54}$ | $L_{B85}$ |
| 8035. | $L_{A55}$ | $L_{B85}$ |
| 8036. | $L_{A56}$ | $L_{B85}$ |
| 8037. | $L_{A57}$ | $L_{B85}$ |
| 8038. | $L_{A58}$ | $L_{B85}$ |
| 8039. | $L_{A59}$ | $L_{B85}$ |
| 8040. | $L_{A60}$ | $L_{B85}$ |
| 8041. | $L_{A61}$ | $L_{B85}$ |
| 8042. | $L_{A62}$ | $L_{B85}$ |
| 8043. | $L_{A63}$ | $L_{B85}$ |
| 8044. | $L_{A64}$ | $L_{B85}$ |
| 8045. | $L_{A65}$ | $L_{B85}$ |
| 8046. | $L_{A66}$ | $L_{B85}$ |
| 8047. | $L_{A67}$ | $L_{B85}$ |
| 8048. | $L_{A68}$ | $L_{B85}$ |
| 8049. | $L_{A69}$ | $L_{B85}$ |
| 8050. | $L_{A70}$ | $L_{B85}$ |
| 8051. | $L_{A71}$ | $L_{B85}$ |
| 8052. | $L_{A72}$ | $L_{B85}$ |
| 8053. | $L_{A73}$ | $L_{B85}$ |
| 8054. | $L_{A74}$ | $L_{B85}$ |
| 8055. | $L_{A75}$ | $L_{B85}$ |
| 8056. | $L_{A76}$ | $L_{B85}$ |
| 8057. | $L_{A77}$ | $L_{B85}$ |
| 8058. | $L_{A78}$ | $L_{B85}$ |
| 8059. | $L_{A79}$ | $L_{B85}$ |
| 8060. | $L_{A80}$ | $L_{B85}$ |

TABLE 1-continued

| Cpd # | $L_A$ | $L_B$ |
|---|---|---|
| 8061. | $L_{A81}$ | $L_{B85}$ |
| 8062. | $L_{A82}$ | $L_{B85}$ |
| 8063. | $L_{A83}$ | $L_{B85}$ |
| 8064. | $L_{A84}$ | $L_{B85}$ |
| 8065. | $L_{A85}$ | $L_{B85}$ |
| 8066. | $L_{A86}$ | $L_{B85}$ |
| 8067. | $L_{A87}$ | $L_{B85}$ |
| 8068. | $L_{A88}$ | $L_{B85}$ |
| 8069. | $L_{A89}$ | $L_{B85}$ |
| 8070. | $L_{A90}$ | $L_{B85}$ |
| 8071. | $L_{A91}$ | $L_{B85}$ |
| 8072. | $L_{A92}$ | $L_{B85}$ |
| 8073. | $L_{A93}$ | $L_{B85}$ |
| 8074. | $L_{A94}$ | $L_{B85}$ |
| 8075. | $L_{A95}$ | $L_{B85}$ |
| 8076. | $L_{A1}$ | $L_{B86}$ |
| 8077. | $L_{A2}$ | $L_{B86}$ |
| 8078. | $L_{A3}$ | $L_{B86}$ |
| 8079. | $L_{A4}$ | $L_{B86}$ |
| 8080. | $L_{A5}$ | $L_{B86}$ |
| 8081. | $L_{A6}$ | $L_{B86}$ |
| 8082. | $L_{A7}$ | $L_{B86}$ |
| 8083. | $L_{A8}$ | $L_{B86}$ |
| 8084. | $L_{A9}$ | $L_{B86}$ |
| 8085. | $L_{A10}$ | $L_{B86}$ |
| 8086. | $L_{A11}$ | $L_{B86}$ |
| 8087. | $L_{A12}$ | $L_{B86}$ |
| 8088. | $L_{A13}$ | $L_{B86}$ |
| 8089. | $L_{A14}$ | $L_{B86}$ |
| 8090. | $L_{A15}$ | $L_{B86}$ |
| 8091. | $L_{A16}$ | $L_{B86}$ |
| 8092. | $L_{A17}$ | $L_{B86}$ |
| 8093. | $L_{A18}$ | $L_{B86}$ |
| 8094. | $L_{A19}$ | $L_{B86}$ |
| 8095. | $L_{A20}$ | $L_{B86}$ |
| 8096. | $L_{A21}$ | $L_{B86}$ |
| 8097. | $L_{A22}$ | $L_{B86}$ |
| 8098. | $L_{A23}$ | $L_{B86}$ |
| 8099. | $L_{A24}$ | $L_{B86}$ |
| 8100. | $L_{A25}$ | $L_{B86}$ |
| 8101. | $L_{A26}$ | $L_{B86}$ |
| 8102. | $L_{A27}$ | $L_{B86}$ |
| 8103. | $L_{A28}$ | $L_{B86}$ |
| 8104. | $L_{A29}$ | $L_{B86}$ |
| 8105. | $L_{A30}$ | $L_{B86}$ |
| 8106. | $L_{A31}$ | $L_{B86}$ |
| 8107. | $L_{A32}$ | $L_{B86}$ |
| 8108. | $L_{A33}$ | $L_{B86}$ |
| 8109. | $L_{A34}$ | $L_{B86}$ |
| 8110. | $L_{A35}$ | $L_{B86}$ |
| 8111. | $L_{A36}$ | $L_{B86}$ |
| 8112. | $L_{A37}$ | $L_{B86}$ |
| 8113. | $L_{A38}$ | $L_{B86}$ |
| 8114. | $L_{A39}$ | $L_{B86}$ |
| 8115. | $L_{A40}$ | $L_{B86}$ |
| 8116. | $L_{A41}$ | $L_{B86}$ |
| 8117. | $L_{A42}$ | $L_{B86}$ |
| 8118. | $L_{A43}$ | $L_{B86}$ |
| 8119. | $L_{A44}$ | $L_{B86}$ |
| 8120. | $L_{A45}$ | $L_{B86}$ |
| 8121. | $L_{A46}$ | $L_{B86}$ |
| 8122. | $L_{A47}$ | $L_{B86}$ |
| 8123. | $L_{A48}$ | $L_{B86}$ |
| 8124. | $L_{A49}$ | $L_{B86}$ |
| 8125. | $L_{A50}$ | $L_{B86}$ |
| 8126. | $L_{A51}$ | $L_{B86}$ |
| 8127. | $L_{A52}$ | $L_{B86}$ |
| 8128. | $L_{A53}$ | $L_{B86}$ |
| 8129. | $L_{A54}$ | $L_{B86}$ |
| 8130. | $L_{A55}$ | $L_{B86}$ |
| 8131. | $L_{A56}$ | $L_{B86}$ |
| 8132. | $L_{A57}$ | $L_{B86}$ |
| 8133. | $L_{A58}$ | $L_{B86}$ |
| 8134. | $L_{A59}$ | $L_{B86}$ |
| 8135. | $L_{A60}$ | $L_{B86}$ |
| 8136. | $L_{A61}$ | $L_{B86}$ |
| 8137. | $L_{A62}$ | $L_{B86}$ |
| 8138. | $L_{A63}$ | $L_{B86}$ |

TABLE 1-continued

| Cpd # | $L_A$ | $L_B$ |
|---|---|---|
| 8139. | $L_{A64}$ | $L_{B86}$ |
| 8140. | $L_{A65}$ | $L_{B86}$ |
| 8141. | $L_{A66}$ | $L_{B86}$ |
| 8142. | $L_{A67}$ | $L_{B86}$ |
| 8143. | $L_{A68}$ | $L_{B86}$ |
| 8144. | $L_{A69}$ | $L_{B86}$ |
| 8145. | $L_{A70}$ | $L_{B86}$ |
| 8146. | $L_{A71}$ | $L_{B86}$ |
| 8147. | $L_{A72}$ | $L_{B86}$ |
| 8148. | $L_{A73}$ | $L_{B86}$ |
| 8149. | $L_{A74}$ | $L_{B86}$ |
| 8150. | $L_{A75}$ | $L_{B86}$ |
| 8151. | $L_{A76}$ | $L_{B86}$ |
| 8152. | $L_{A77}$ | $L_{B86}$ |
| 8153. | $L_{A78}$ | $L_{B86}$ |
| 8154. | $L_{A79}$ | $L_{B86}$ |
| 8155. | $L_{A80}$ | $L_{B86}$ |
| 8156. | $L_{A81}$ | $L_{B86}$ |
| 8157. | $L_{A82}$ | $L_{B86}$ |
| 8158. | $L_{A83}$ | $L_{B86}$ |
| 8159. | $L_{A84}$ | $L_{B86}$ |
| 8160. | $L_{A85}$ | $L_{B86}$ |
| 8161. | $L_{A86}$ | $L_{B86}$ |
| 8162. | $L_{A87}$ | $L_{B86}$ |
| 8163. | $L_{A88}$ | $L_{B86}$ |
| 8164. | $L_{A89}$ | $L_{B86}$ |
| 8165. | $L_{A90}$ | $L_{B86}$ |
| 8166. | $L_{A91}$ | $L_{B86}$ |
| 8167. | $L_{A92}$ | $L_{B86}$ |
| 8168. | $L_{A93}$ | $L_{B86}$ |
| 8169. | $L_{A94}$ | $L_{B86}$ |
| 8170. | $L_{A95}$ | $L_{B86}$ |

According to another aspect of the present disclosure, a first device comprising a first organic light emitting device is disclosed. The first organic light emitting device comprises an anode; a cathode; and an organic layer disposed between the anode and the cathode. The organic layer comprises a compound having the formula $Re(L_A)(L_B)$, wherein Re is a Rhenium(l) metal, wherein $L_A$ is a mono-anionic tridentate ligand, wherein $L_B$ is a neutral tridentate ligand; and wherein $L_A$ and $L_B$ are optionally linked together to form a hexadentate ligand.

In one embodiment, the first device can be a consumer product, such as a light panel, a lamp, etc.

In one embodiment, the organic layer in the first device is an emissive layer and the compound is an emissive dopant. In another embodiment, the organic layer is an emissive layer and the compound is a non-emissive dopant. In one embodiment, the organic layer is a charge transporting layer and the compound is a charge transporting material in the organic layer.

In one embodiment, the organic layer is a charge injecting layer and the compound is a charge injecting material in the organic layer.

In one embodiment, the organic layer is a blocking layer and the compound is a blocking material in the organic layer.

In another embodiment, the organic layer further comprises a host material. The host material can comprise a triphenylene containing benzo-fused thiophene or benzo-fused furan; wherein any substituent in the host material is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}CC_nH_{2n+1}$, $Ar_1$, $Ar_1{-}Ar_2$, $C_nH_{2n}{-}Ar_1$, or no substitution; wherein n is from 1 to 10; and wherein Art and $Ar_2$ are independently selected from the group consisting of benzene, biphenyl, naphthalene, triphenylene, carbazole, and heteroaromatic analogs thereof.

In one embodiment, the host material comprises at least one chemical group selected from the group consisting of carbazole, dibenzothiophene, dibenzofuran, dibenzoselenophene, azacarbazole, aza-dibenzothiophene, aza-dibenzofuran, and aza-dibenzoselenophene.

The "aza" designation in the fragments described above, i.e. aza-dibenzofuran, aza-dibenzonethiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

In one embodiment, the host material is selected from the group consisting of:

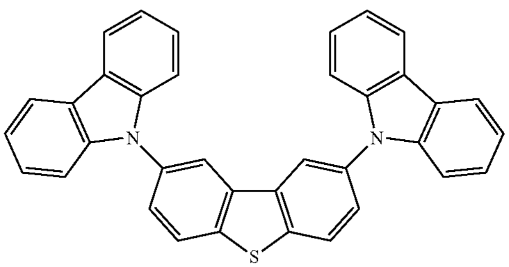

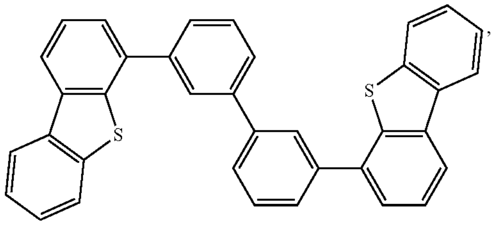

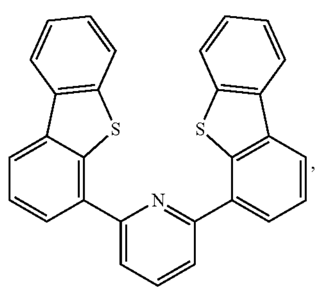

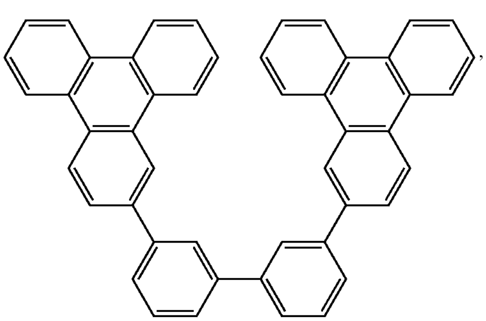

-continued

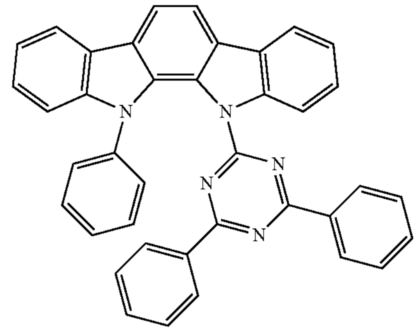

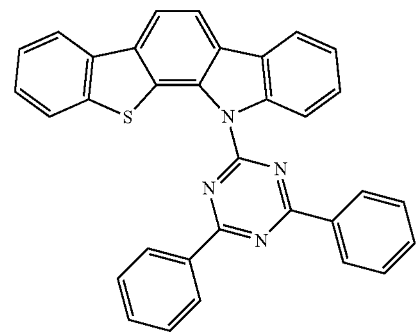

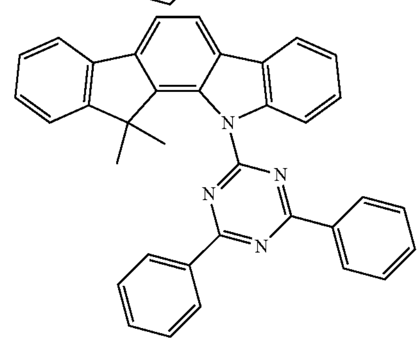

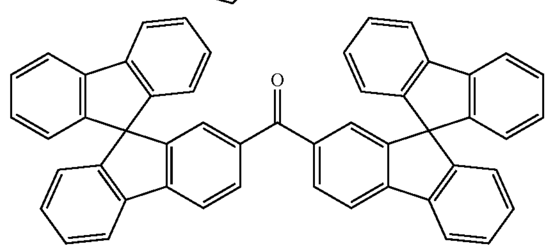

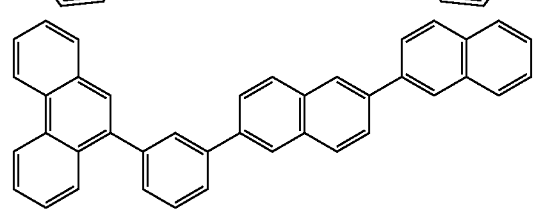

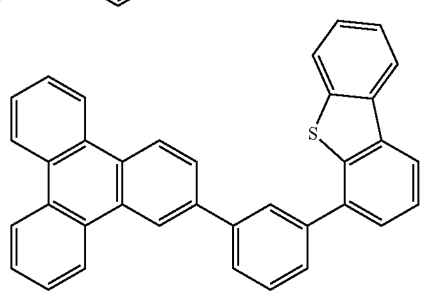

-continued

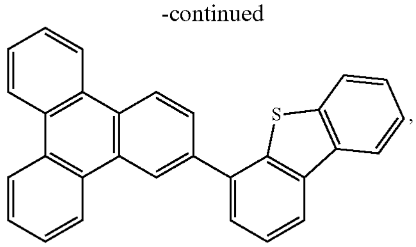

and combinations thereof.

In another aspect, a formulation comprising a compound having the formula $Re(L_A)(L_B)$, wherein Re is a Rhenium(I) metal, wherein $L_A$ is a monoanionic tridentate ligand, wherein $L_B$ is a neutral tridentate ligand; and wherein $L_A$ and $L_B$ are optionally linked together to form a hexadentate ligand is disclosed.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

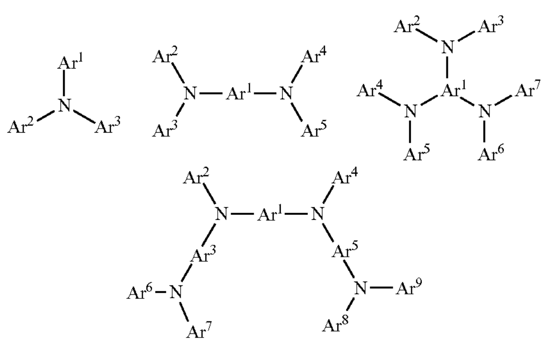

-continued

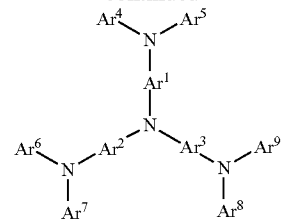

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

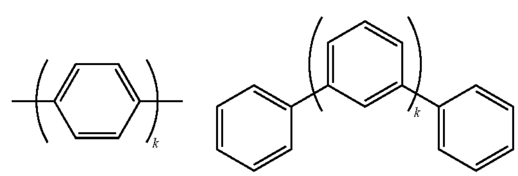

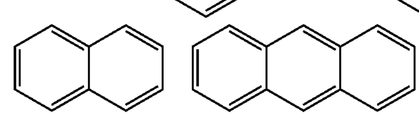

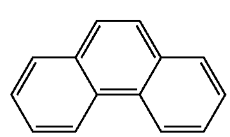

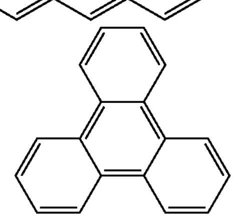

-continued

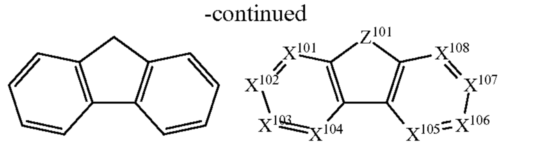

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but not limit to the following general formula:

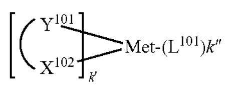

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect. ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

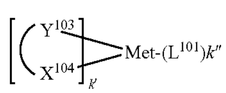

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

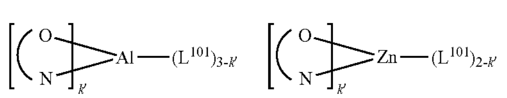

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atome, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

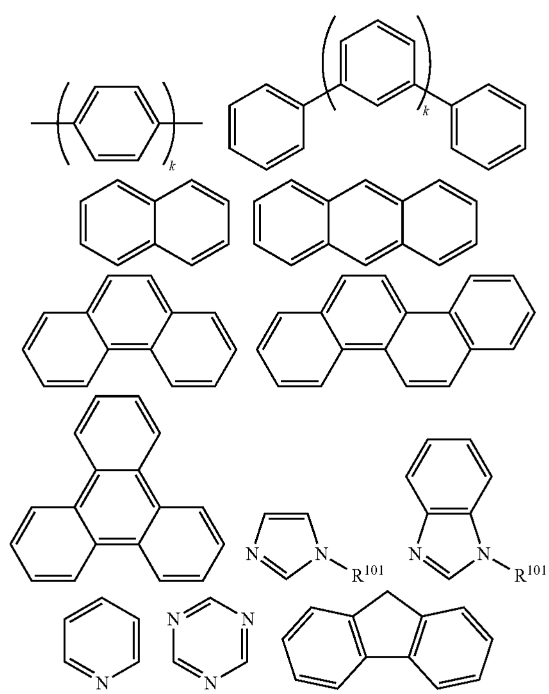

-continued

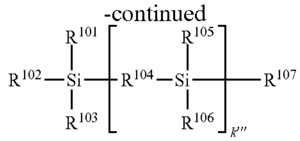

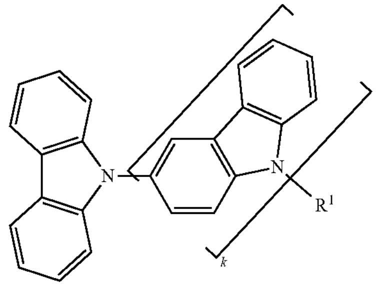

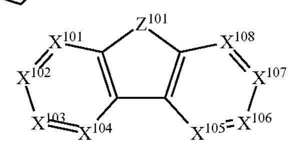

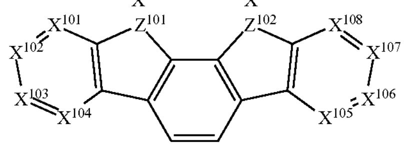

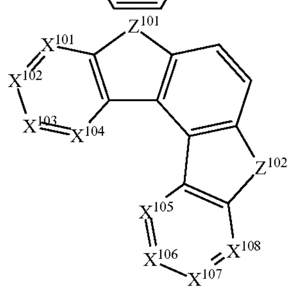

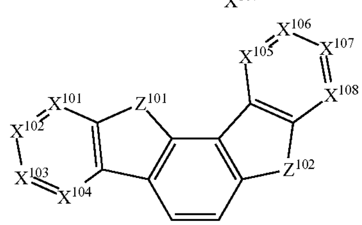

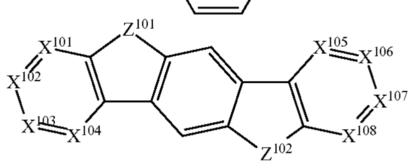

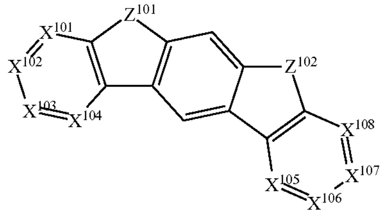

wherein $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N. $Z^{101}$ and $Z^{102}$ is selected from $NR^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule or the same functional groups used as host described above.

In another aspect, compound used in HBL contains at least one of the following groups in the molecule:

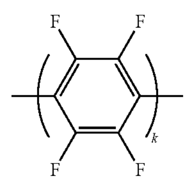

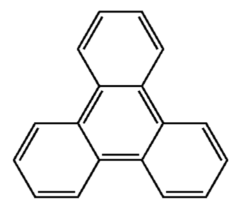

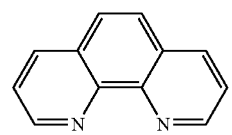

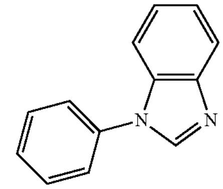

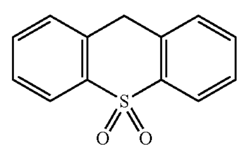

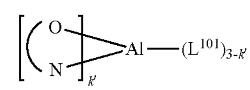

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

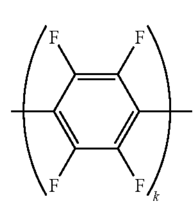

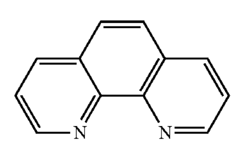

-continued

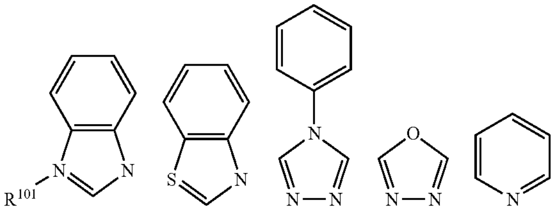

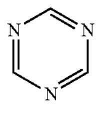

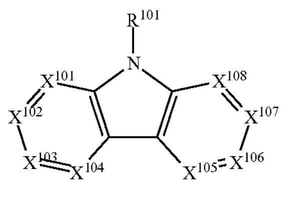

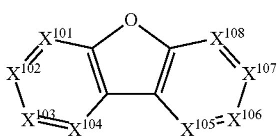

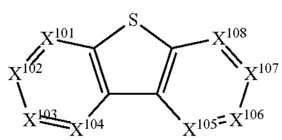

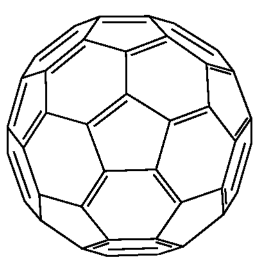

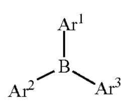

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

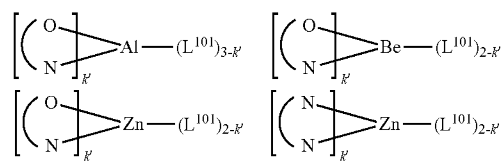

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 2 below. Table 2 lists non-limiting classes of materials, non-limiting examples of compounds for each class, and references that disclose the materials.

TABLE 2

| MATERIAL | EXAMPLES OF MATERIAL | PUBLICATIONS |
|---|---|---|
| | Hole injection materials | |
| Phthalocyanine and porphryin compounds | 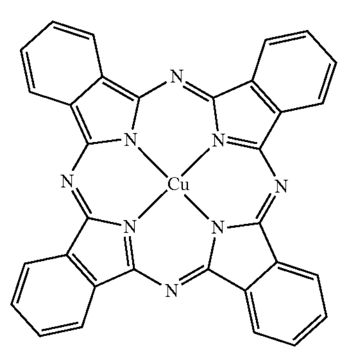 | Appl. Phys. Lett. 69, 2160 (1996) |

TABLE 2-continued
| MATERIAL | EXAMPLES OF MATERIAL | PUBLICATIONS |
|---|---|---|
| Starburst triarylamines | 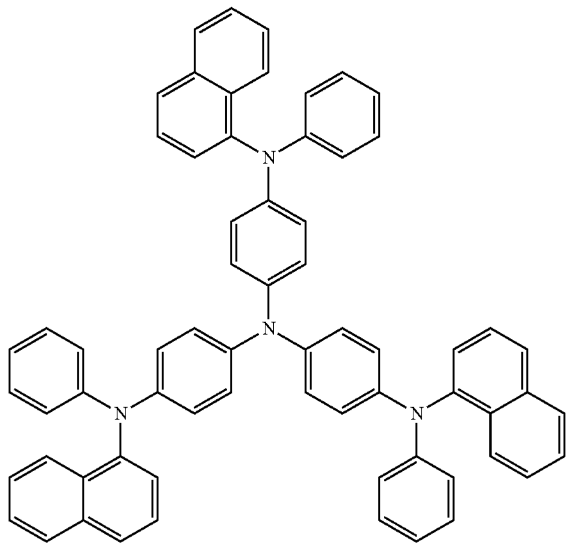 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT:PSS, polyaniline, polythiophene) | 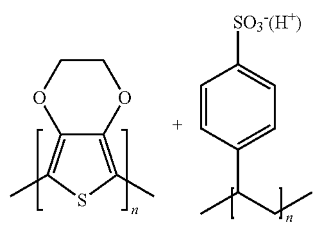 | Synth. Met. 87, 171 (1997) WO2007002683 |
| Phosphonic acid and sliane SAMs | 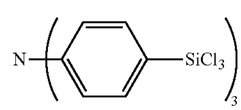 | US20030162053 |
| Triarylamine or polythiophene polymers with conductivity dopants | 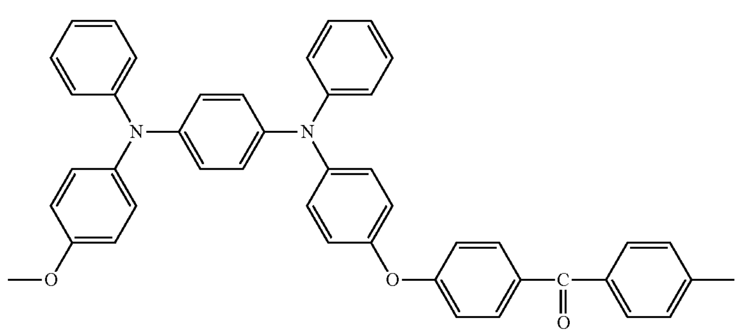 and | EP1725079A1 |

TABLE 2-continued
| MATERIAL | EXAMPLES OF MATERIAL | PUBLICATIONS |
|---|---|---|
| | 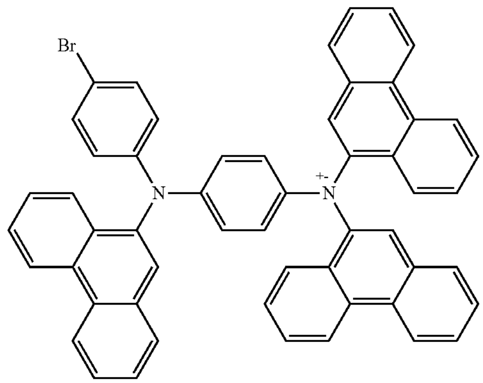 [SMILES: Brc1ccc(N(c2ccc(N(c3cc4ccccc4c4ccccc34)c3cc4ccccc4c4ccccc34)cc2)c2cc3ccccc3c3ccccc23)cc1] | |
| | 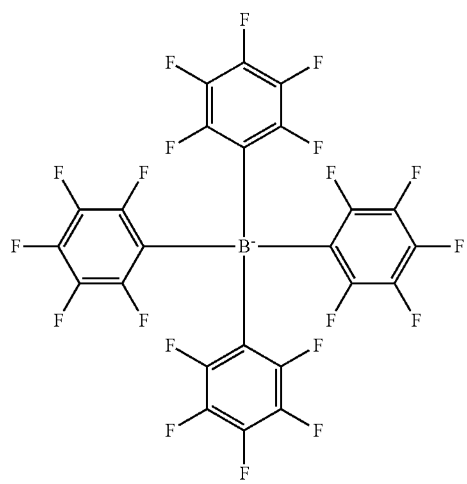 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | |
| Organic compounds with conductive inorganic compounds, such as molybdenum and tungsten oxides | 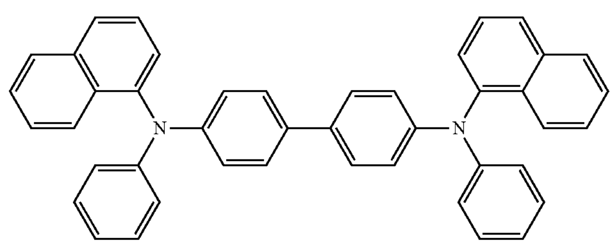 + $MoO_x$ | US20050123751 SID Symposium Digest, 37, 923 (2006) WO2009018009 |
| n-type semiconducting organic complexes | 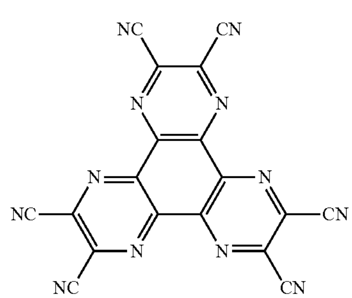 [SMILES: N#Cc1nc2c3nc(C#N)c(C#N)nc3c3nc(C#N)c(C#N)nc3c2nc1C#N] | US20020158242 |

TABLE 2-continued
| MATERIAL | EXAMPLES OF MATERIAL | PUBLICATIONS |
|---|---|---|
| Metal organometallic complexes | 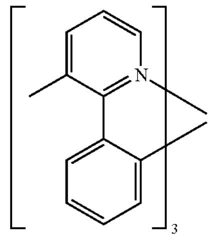 | US20060240279 |
| Cross-linkable compounds | 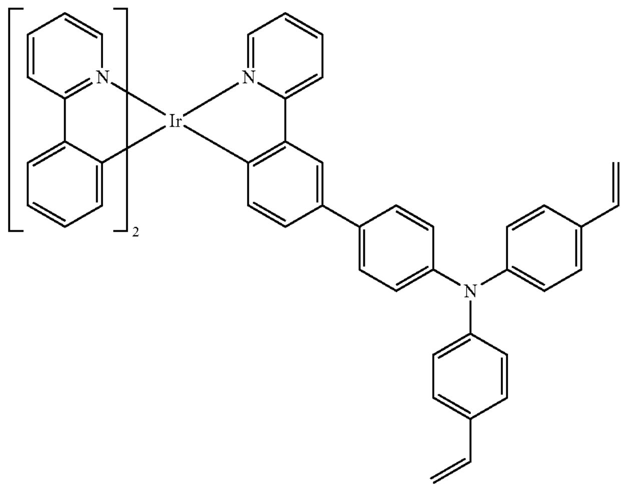 | US20080220265 |
| Polythiophene based polymers and copolymers | 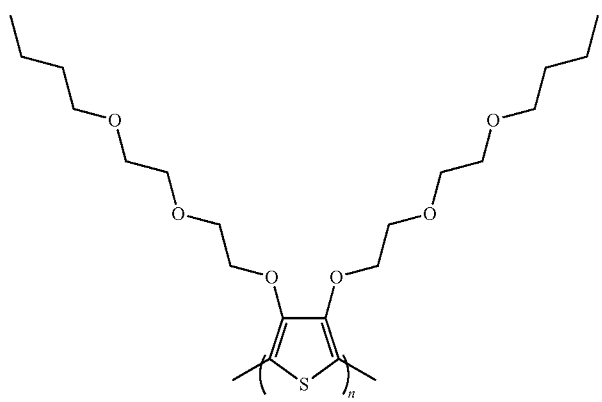 | WO 2011075644 EP2350216 |
| Hole transporting materials | | |
| Triarylamines (e.g., TPD, α-NPD) | 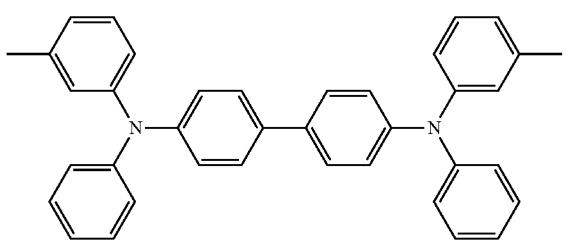 | Appl. Phys. Lett. 51, 913 (1987) |

TABLE 2-continued
| MATERIAL | EXAMPLES OF MATERIAL | PUBLICATIONS |
|---|---|---|
| | 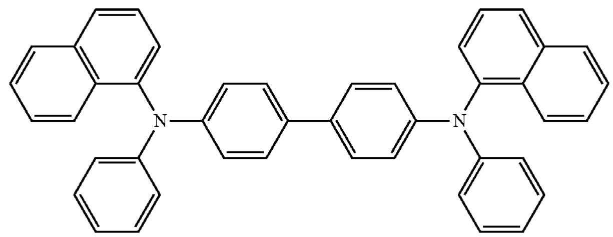 [SMILES: c1ccc(N(c2ccc(-c3ccc(N(c4ccccc4)c4cccc5ccccc45)cc3)cc2)c2cccc3ccccc23)cc1] | US5061569 |
| | 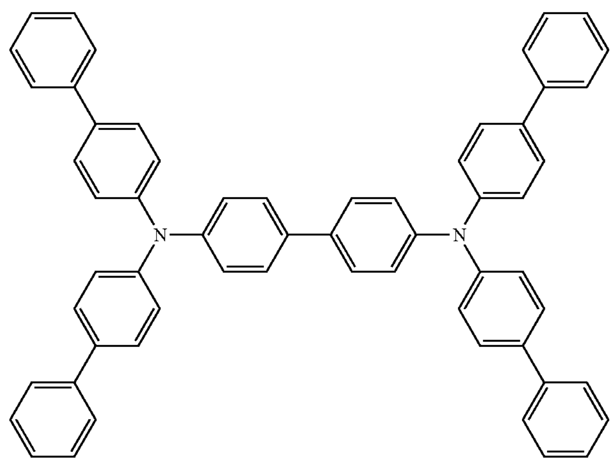 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 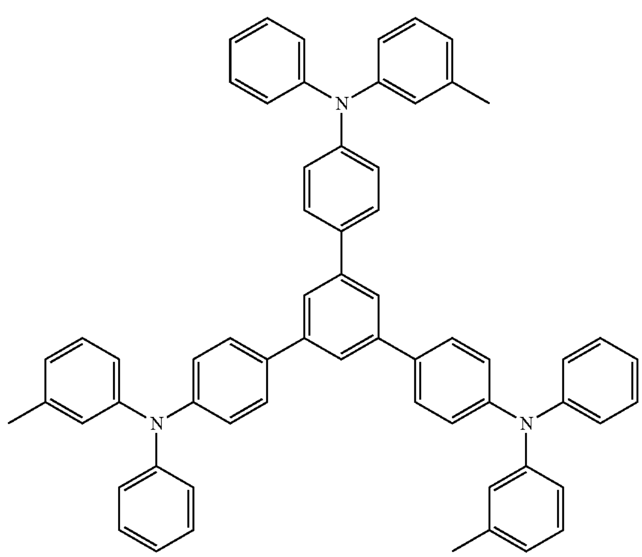 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |

TABLE 2-continued
| MATERIAL | EXAMPLES OF MATERIAL | PUBLICATIONS |
|---|---|---|
| | 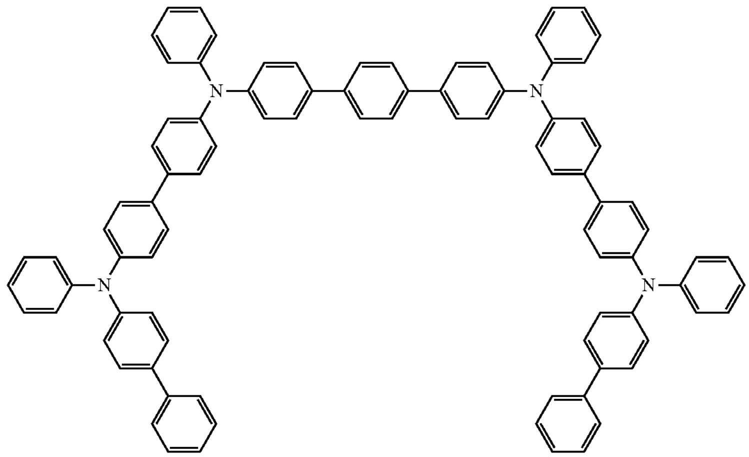 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |
| | 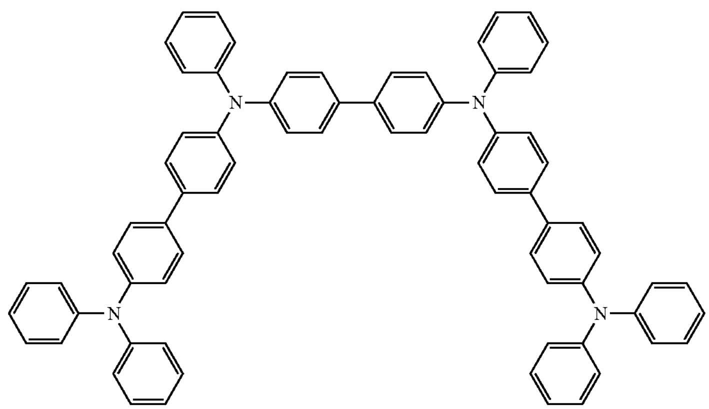 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1] | Appl. Phys. Lett. 90, 183503 (2007) |
| Triaylamine on spirofluorene core | 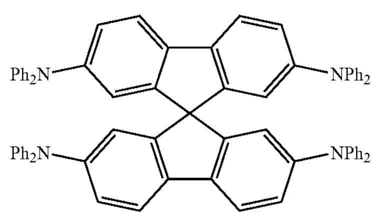 | Synth. Met. 91, 209 (1997) |
| Arylamine carbazole compounds | 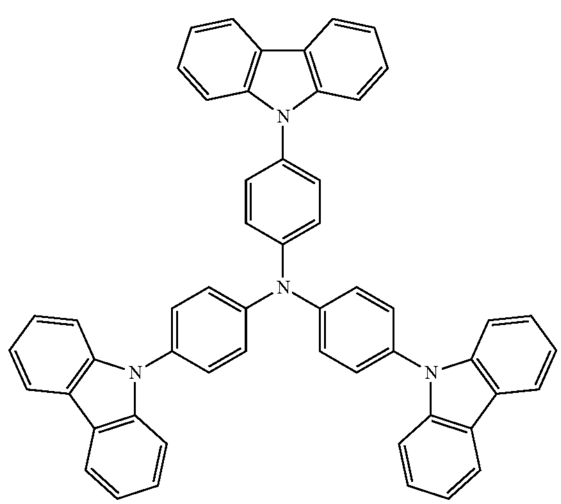 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | Adv. Mater. 6, 677 (1994), US20080124572 |

TABLE 2-continued
| MATERIAL | EXAMPLES OF MATERIAL | PUBLICATIONS |
|---|---|---|
| Triarylamine with (di)benzothiophene/ (di)benzofuran | 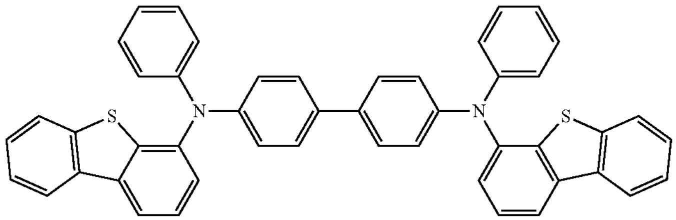 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 US20110163302 |
| Indolocarbazoles | 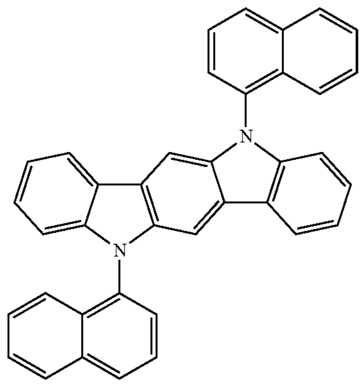 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 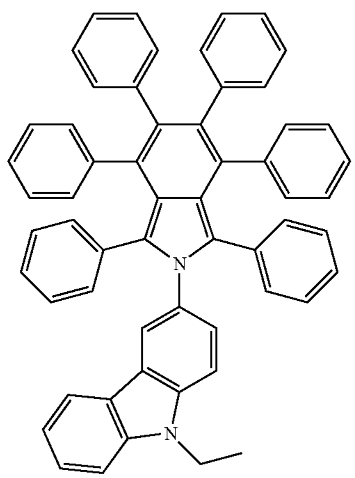 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |
| Metal carbene complexes | 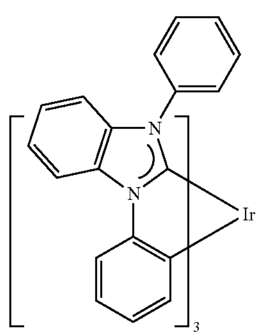 | US20080018221 |
| Phosphorescent OLED host materials | | |
| Red hosts | | |

TABLE 2-continued
| MATERIAL | EXAMPLES OF MATERIAL | PUBLICATIONS |
|---|---|---|
| Arylcarbazoles | 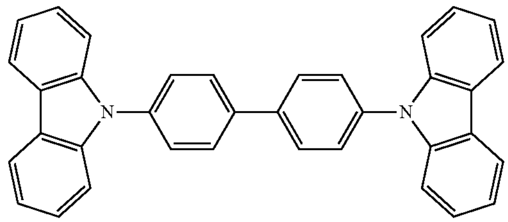 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| Metal 8-hydroxyquinolates (e.g., $Alq_3$, BAlq) | 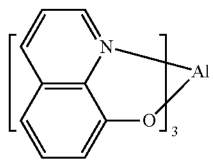 | Nature 395, 151 (1998) |
| | 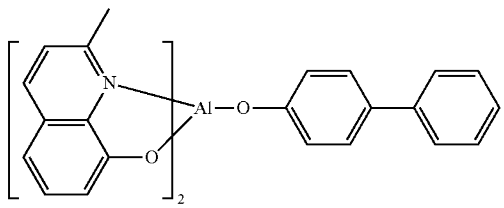 | US20060202194 |
| | 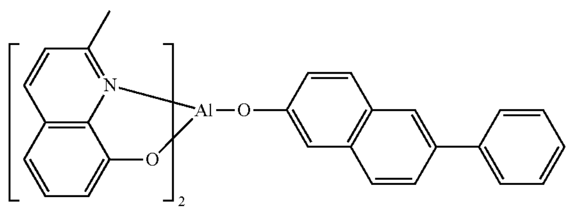 | WO2005014551 |
| | 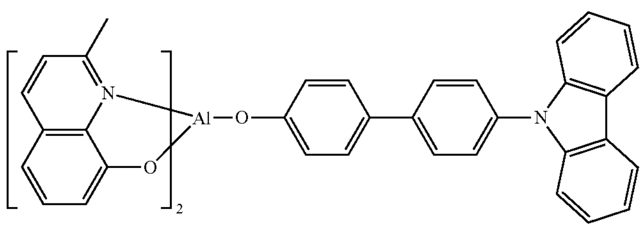 | WO2006072002 |
| Metal phenoxy-benzothiazole compounds | 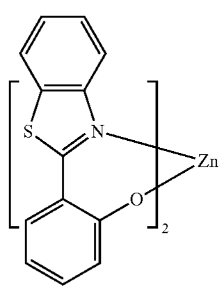 | Appl. Phys. Lett. 90, 123509 (2007) |
| Conjugated oligomers and polymers (e.g., polyfluorene) | 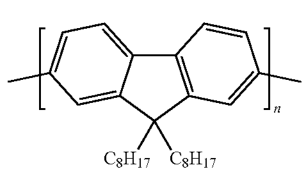 | Org. Electron. 1, 15 (2000) |

TABLE 2-continued
| MATERIAL | EXAMPLES OF MATERIAL | PUBLICATIONS |
|---|---|---|
| Aromatic fused rings | 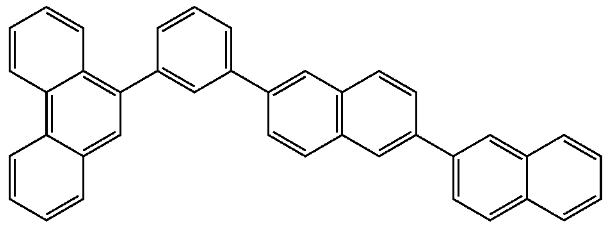 [SMILES: c1cc(-c2ccc3cc(-c4ccc5ccccc5c4)ccc3c2)cc(-c2cc3ccccc3c3ccccc23)c1] | WO2009066779, WO2009066778, WO2009063833, US20090045731, US20090045730, WO2009008311, US20090008605, US20090009065 |
| Zinc complexes | 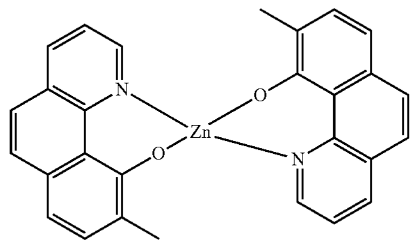 | WO2010056066 |
| Chrysene based compounds | 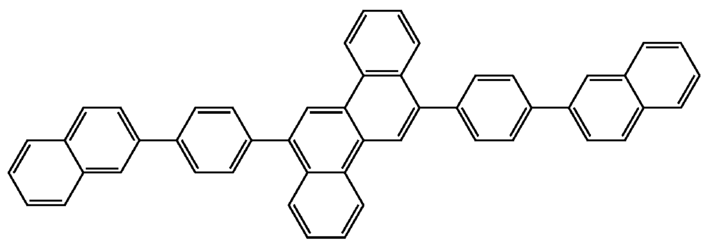 [SMILES: c1ccc2cc(-c3ccc(-c4cc5c6ccccc6c(-c6ccc(-c7ccc8ccccc8c7)cc6)cc5c5ccccc45)cc3)ccc2c1] | WO2011086863 |
| Green hosts | | |
| Arylcarbazoles | 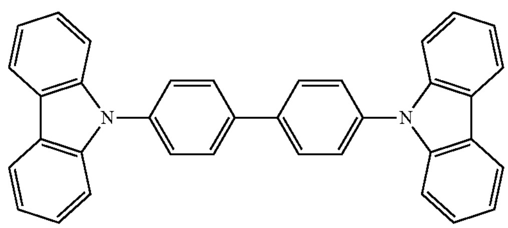 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| | 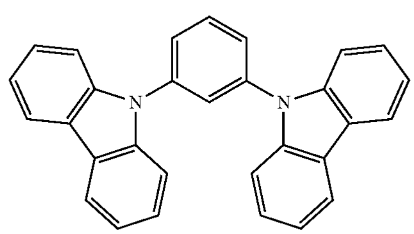 [SMILES: c1cc(-n2c3ccccc3c3ccccc32)cc(-n2c3ccccc3c3ccccc32)c1] | US20030175553 |
| | 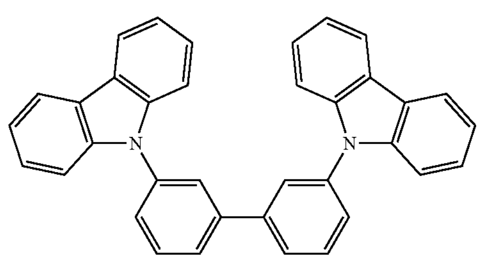 [SMILES: c1cc(-c2cccc(-n3c4ccccc4c4ccccc43)c2)cc(-n2c3ccccc3c3ccccc32)c1] | WO2001039234 |

TABLE 2-continued
| MATERIAL | EXAMPLES OF MATERIAL | PUBLICATIONS |
| --- | --- | --- |
| Aryltriphenylene compounds | 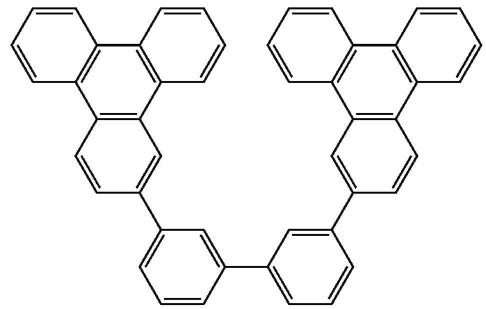 [SMILES: c1cc(-c2cccc(-c3ccc4c5ccccc5c5ccccc5c4c3)c2)cc(-c2ccc3c4ccccc4c4ccccc4c3c2)c1] | US20060280965 |
| | 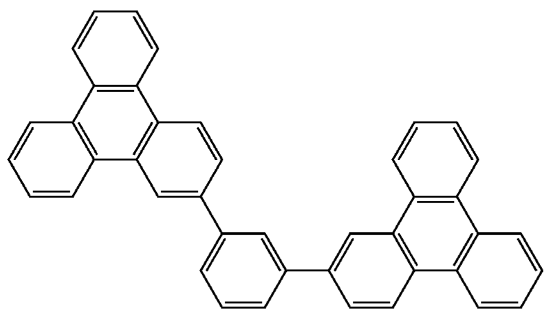 [SMILES: c1cc(-c2ccc3c4ccccc4c4ccccc4c3c2)cc(-c2ccc3c4ccccc4c4ccccc4c3c2)c1] | US20060280965 |
| | 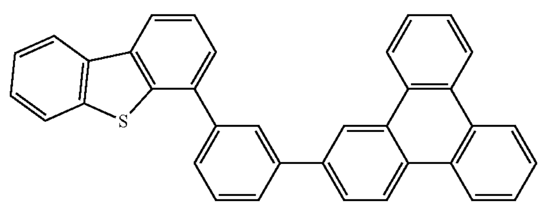 [SMILES: c1cc(-c2ccc3c4ccccc4c4ccccc4c3c2)cc(-c2cccc3c2sc2ccccc23)c1] | WO2009021126 |
| Poly-fused heteroaryl compounds | 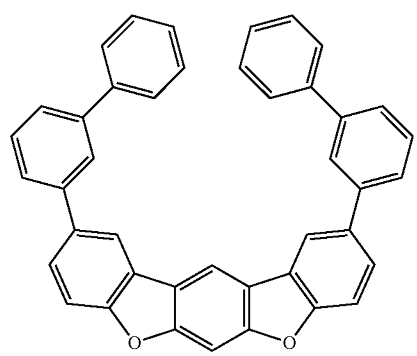 [SMILES: c1ccc(-c2cccc(-c3ccc4oc5cc6oc7ccc(-c8cccc(-c9ccccc9)c8)cc7c6cc5c4c3)c2)cc1] | US20090309488<br>US20090302743<br>US20100012931 |
| Donor acceptor type molecules | 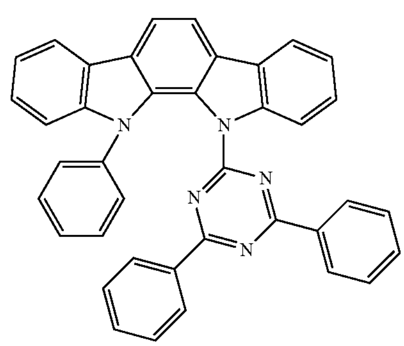 [SMILES: c1ccc(-c2nc(-c3ccccc3)nc(-n3c4ccccc4c4ccc5c6ccccc6n(-c6ccccc6)c5c43)n2)cc1] | WO2008056746 |

TABLE 2-continued
| MATERIAL | EXAMPLES OF MATERIAL | PUBLICATIONS |
|---|---|---|
| | 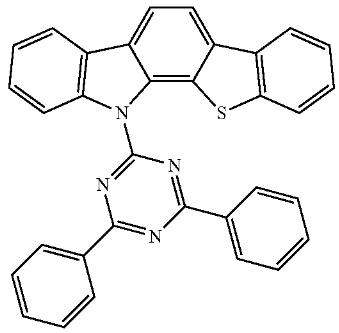 [SMILES: c1ccc(-c2nc(-c3ccccc3)nc(-n3c4ccccc4c4ccc5c6ccccc6sc5c43)n2)cc1] | WO2010107244 |
| Aza-carbazole/ DBT/DBF | 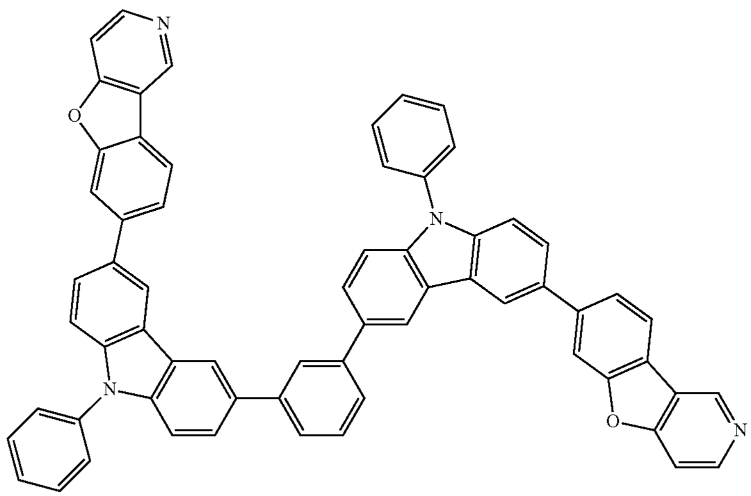 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| | 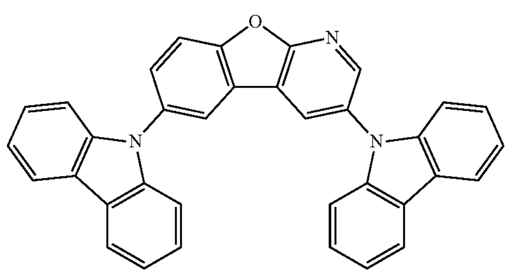 [SMILES: c1ccc2c(c1)c1ccccc1n2-c1ccc2oc3ncc(-n4c5ccccc5c5ccccc54)cc3c2c1] | US2010087984 |
| Polymers (e.g., PVK) | 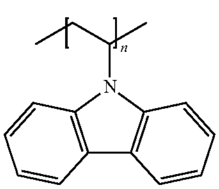 | Appl. Phys. Lett. 77, 2280 (2000) |
| Spirofluorene compounds | 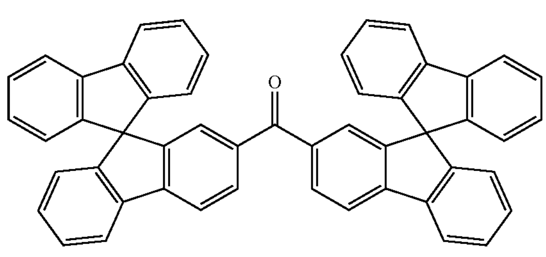 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |

TABLE 2-continued
| MATERIAL | EXAMPLES OF MATERIAL | PUBLICATIONS |
| --- | --- | --- |
| Metal phenoxy-benzooxazole compounds | 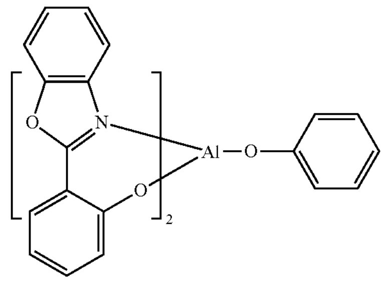 | WO2005089025 |
| | 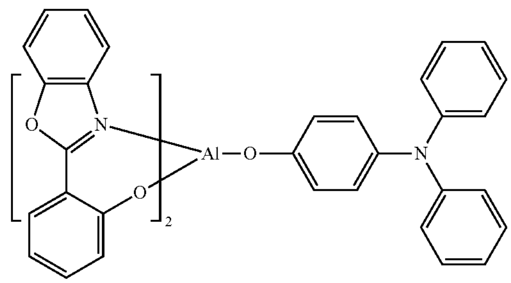 | WO2006132173 |
| | 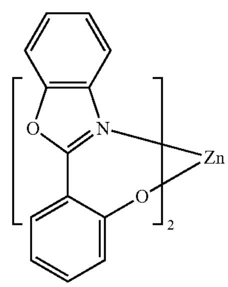 | JP200511610 |
| Spirofluorene-carbazole compounds | 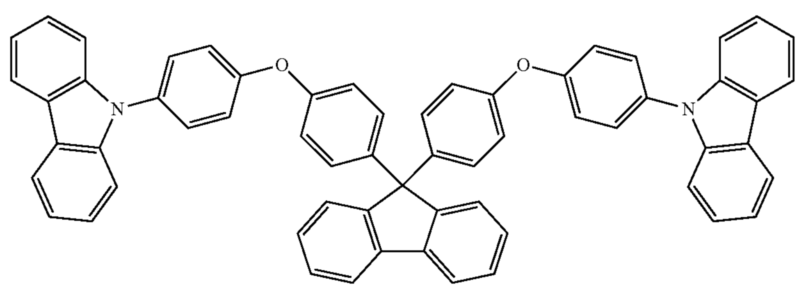 [SMILES: c1ccc2c(c1)-c1ccccc1C2(c1ccc(Oc2ccc(-n3c4ccccc4c4ccccc43)cc2)cc1)c1ccc(Oc2ccc(-n3c4ccccc4c4ccccc43)cc2)cc1] | JP2007254297 |
| | 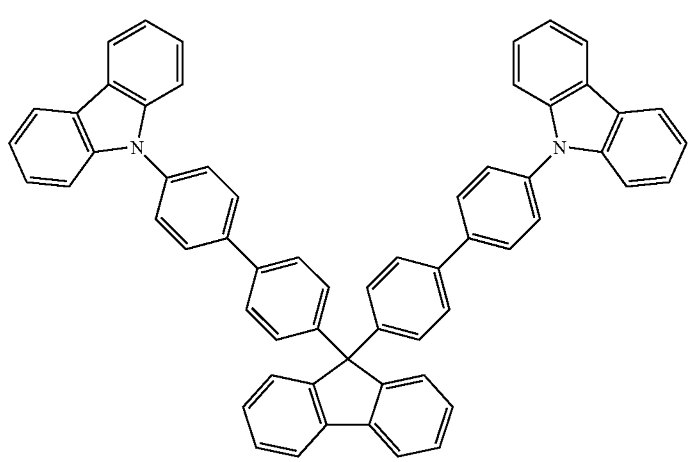 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |

TABLE 2-continued
| MATERIAL | EXAMPLES OF MATERIAL | PUBLICATIONS |
|---|---|---|
| Indolocarbazoles | 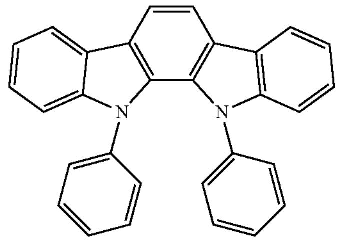 [SMILES: c1ccc(-n2c3ccccc3c3ccc4c5ccccc5n(-c5ccccc5)c4c32)cc1] | WO2007063796 |
| | 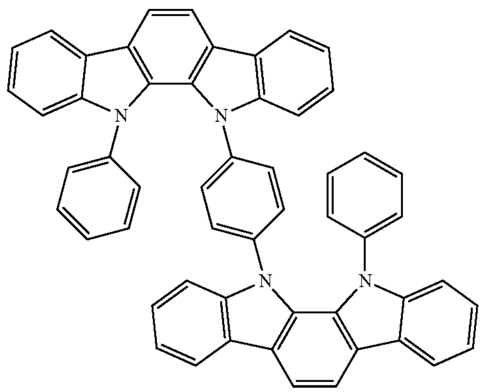 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |
| 5-member ring electron deficient heterocycles (e.g., triazole, oxadiazole) | 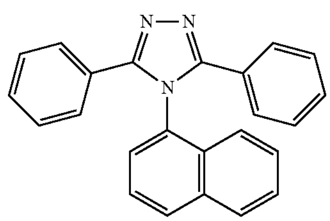 [SMILES: c1ccc(-c2nnc(-c3ccccc3)n2-c2cccc3ccccc23)cc1] | J. Appl. Phys. 90, 5048 (2001) |
| | 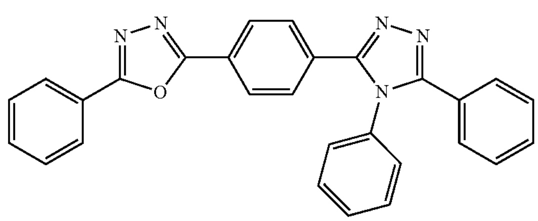 [SMILES: c1ccc(-c2nnc(-c3ccc(-c4nnc(-c5ccccc5)n4-c4ccccc4)cc3)o2)cc1] | WO2004107822 |
| Tetraphenylene complexes | 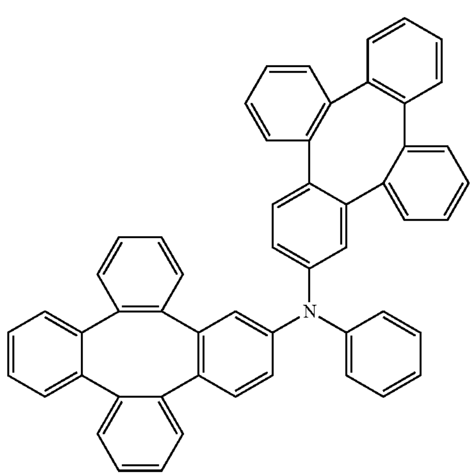 [SMILES: c1ccc(N(c2ccc3c(c2)-c2ccccc2-c2ccccc2-c2ccccc2-3)c2ccc3c(c2)-c2ccccc2-c2ccccc2-c2ccccc2-3)cc1] | US20050112407 |

TABLE 2-continued
| MATERIAL | EXAMPLES OF MATERIAL | PUBLICATIONS |
|---|---|---|
| Metal phenoxypyridine compounds | 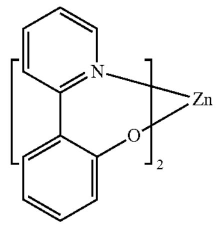 | WO2005030900 |
| Metal coordination complexes (e.g., Zn, Al with N^N ligands) | 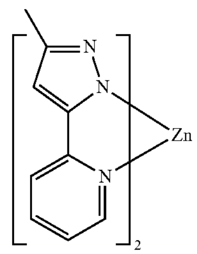 | US20040137268, US20040137267 |
| Blue hosts | | |
| Arylcarbazoles | 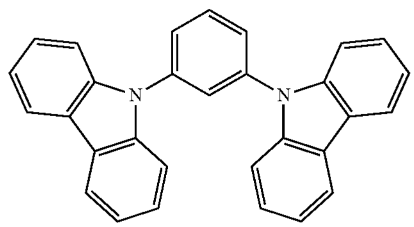 [SMILES: c1cc(-n2c3ccccc3c3ccccc32)cc(-n2c3ccccc3c3ccccc32)c1] | Appl. Phys. Lett, 82, 2422 (2003) |
| | 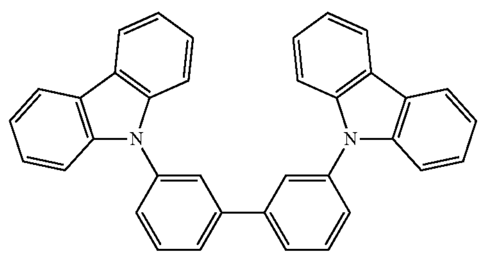 [SMILES: c1cc(-c2cccc(-n3c4ccccc4c4ccccc43)c2)cc(-n2c3ccccc3c3ccccc32)c1] | US20070190359 |
| Dibenzothiophene/ Dibenzofuran-carbazole compounds | 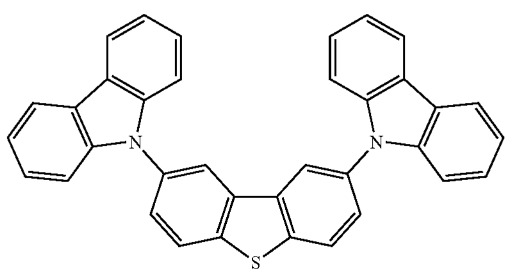 [SMILES: c1ccc2c(c1)c1ccccc1n2-c1ccc2sc3ccc(-n4c5ccccc5c5ccccc54)cc3c2c1] | WO2006114966, US20090167162 |
| | 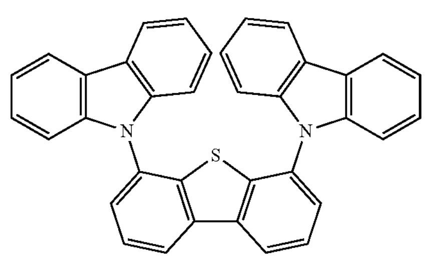 [SMILES: c1cc(-n2c3ccccc3c3ccccc32)c2sc3c(-n4c5ccccc5c5ccccc54)cccc3c2c1] | US20090167162 |

TABLE 2-continued
| MATERIAL | EXAMPLES OF MATERIAL | PUBLICATIONS |
|---|---|---|
| | 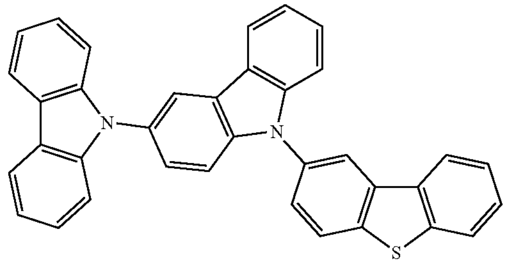 [SMILES: c1ccc2c(c1)sc1ccc(-n3c4ccccc4c4cc(-n5c6ccccc6c6ccccc65)ccc43)cc12] | WO2009086028 |
| | 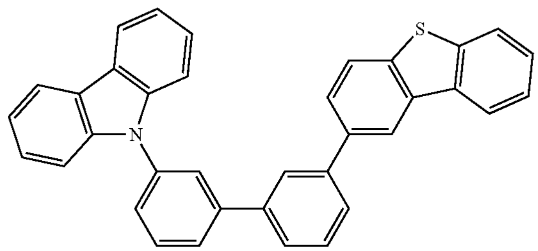 [SMILES: c1cc(-c2cccc(-n3c4ccccc4c4ccccc43)c2)cc(-c2ccc3sc4ccccc4c3c2)c1] | US20090030202, US20090017330 |
| | 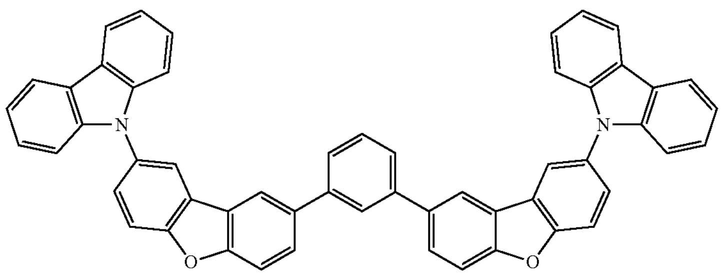 [SMILES: c1cc(-c2ccc3oc4ccc(-n5c6ccccc6c6ccccc65)cc4c3c2)cc(-c2ccc3oc4ccc(-n5c6ccccc6c6ccccc65)cc4c3c2)c1] | US20100084966 |
| Silicon aryl compounds | 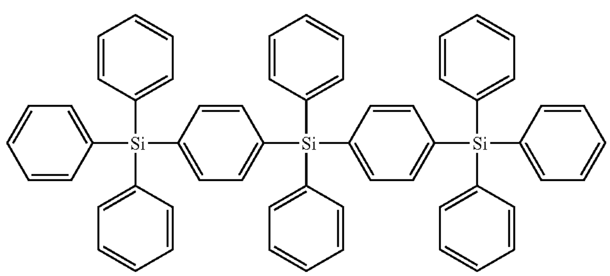 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 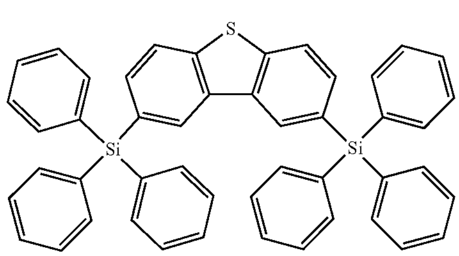 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE 2-continued
| MATERIAL | EXAMPLES OF MATERIAL | PUBLICATIONS |
|---|---|---|
| Silicon/Germanium aryl compounds | 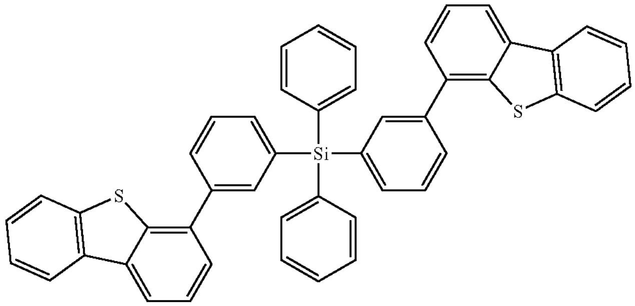 [SMILES: c1ccc([Si](c2ccccc2)(c2cccc(-c3cccc4c3sc3ccccc34)c2)c2cccc(-c3cccc4c3sc3ccccc34)c2)cc1] | EP2034538A |
| Aryl benzoyl ester | 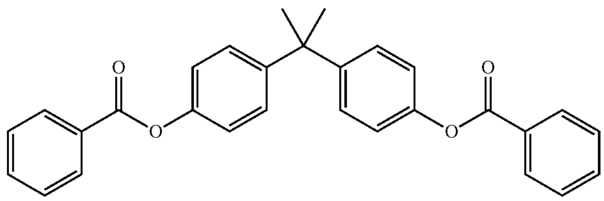 [SMILES: CC(C)(c1ccc(OC(=O)c2ccccc2)cc1)c1ccc(OC(=O)c2ccccc2)cc1] | WO2006100298 |
| Carbazole linked by non-conjugated groups | 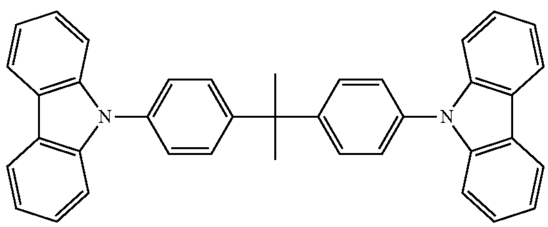 [SMILES: CC(C)(c1ccc(-n2c3ccccc3c3ccccc32)cc1)c1ccc(-n2c3ccccc3c3ccccc32)cc1] | US20040115476 |
| Aza-carbazoles | 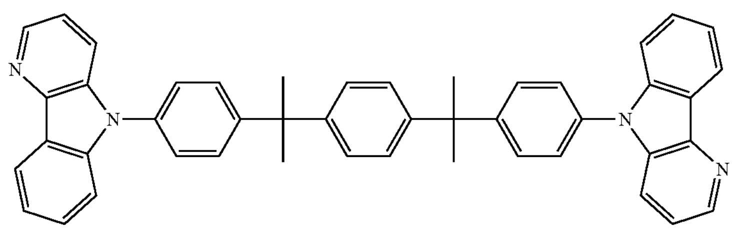 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| High triplet metal organometallic complex | 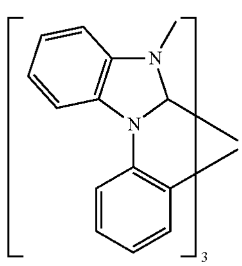 | US7154114 |
| Phosphorescent dopants | | |
| Red dopants | | |

TABLE 2-continued
| MATERIAL | EXAMPLES OF MATERIAL | PUBLICATIONS |
|---|---|---|
| Heavy metal porphyrins (e.g., PtOEP) | 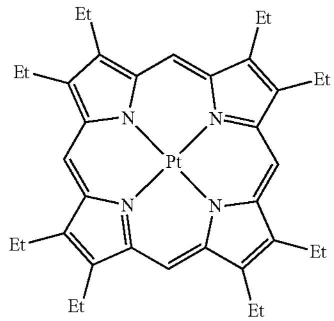 | Nature 395, 151 (1998) |
| Iridium (III) organometallic complexes | 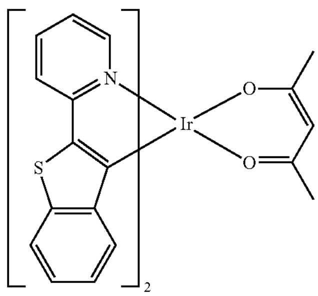 | Appl. Phys. Lett. 78, 1622 (2001) |
| | 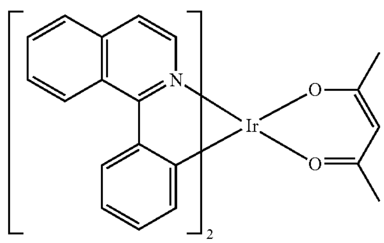 | US2006835469 |
| | 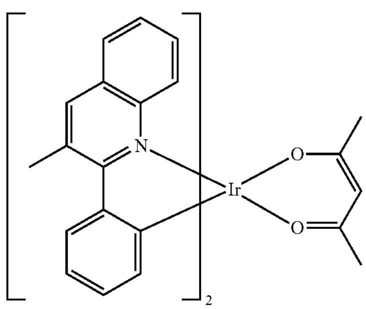 | US2006835469 |
| | 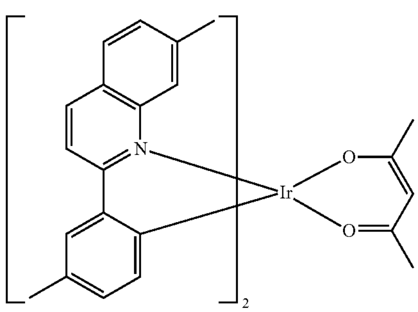 | US20060202914 |

TABLE 2-continued
| MATERIAL | EXAMPLES OF MATERIAL | PUBLICATIONS |
| --- | --- | --- |
| | 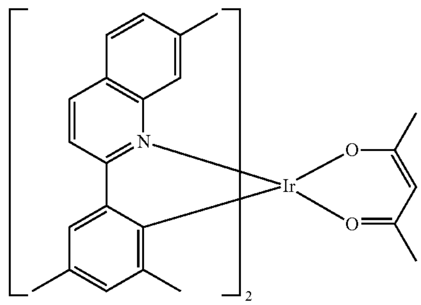 | US20060202914 |
| | 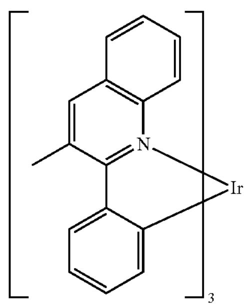 | US20070087321 |
| | 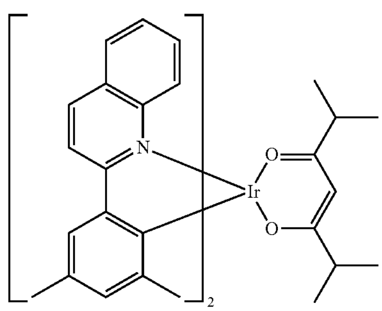 | US20080261076 US20100090591 |
| | 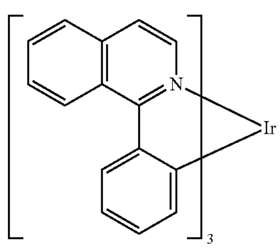 | US20070087321 |
| | 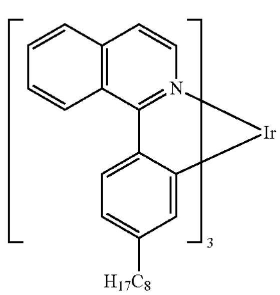 | Adv. Mater. 19, 739 (2007) |

TABLE 2-continued
| MATERIAL | EXAMPLES OF MATERIAL | PUBLICATIONS |
|---|---|---|
| | 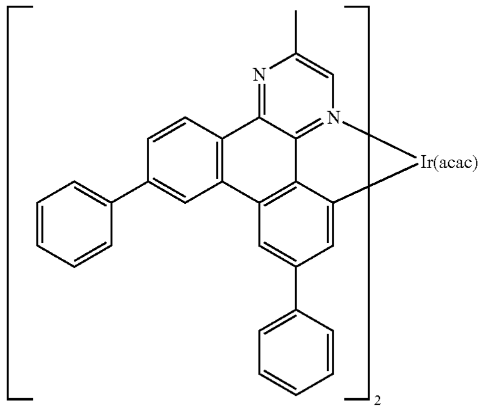 | WO2009100991 |
| | 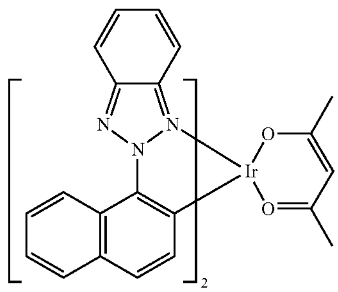 | WO2008101842 |
| | 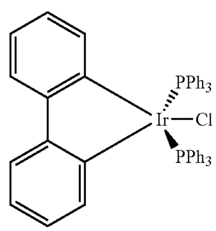 | US7232618 |
| Platinum (II) organometallic complexes | 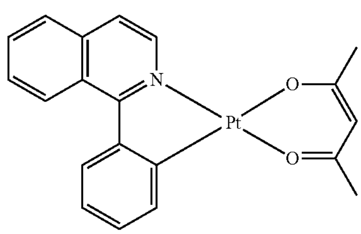 | WO2003040257 |
| | 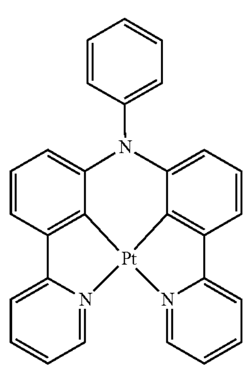 | US20070103060 |

TABLE 2-continued
| MATERIAL | EXAMPLES OF MATERIAL | PUBLICATIONS |
|---|---|---|
| Osminum (III) complexes | 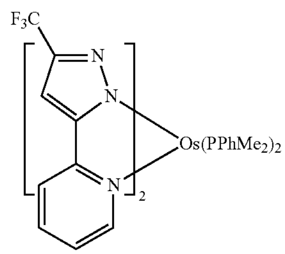 | Chem. Mater. 17, 3532 (2005) |
| Ruthenium (II) complexes | 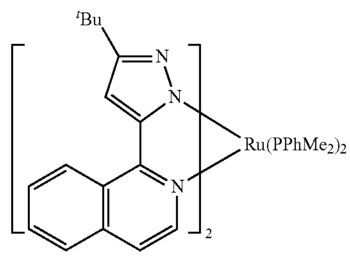 | Adv. Mater. 17, 1059 (2005) |
| Rhenium (I), (II), and (III) complexes | 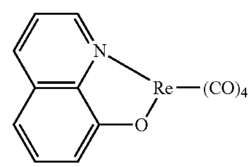 | US20050244673 |
| Green dopants | | |
| Iridium (III) organometallic complexes | 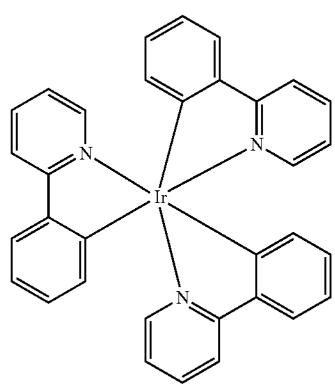 and its derivatives | Inorg. Chem. 40, 1704 (2001) |
| | 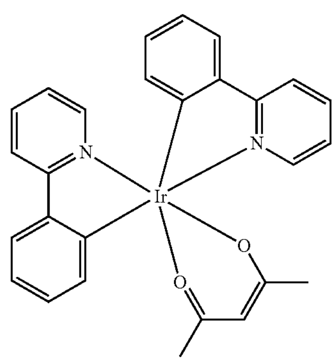 | US20020034656 |

TABLE 2-continued
| MATERIAL | EXAMPLES OF MATERIAL | PUBLICATIONS |
|---|---|---|
| | 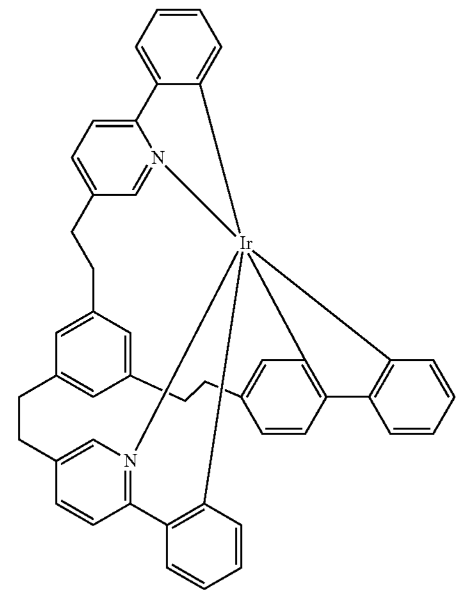 | US7332232 |
| | 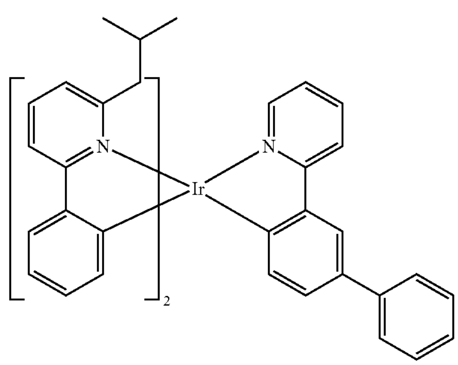 | US20090108737 |
| | 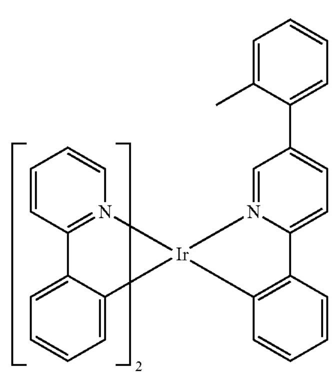 | WO2010028151 |

TABLE 2-continued
| MATERIAL | EXAMPLES OF MATERIAL | PUBLICATIONS |
| --- | --- | --- |
| | 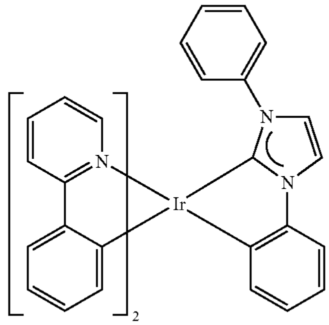 | EP1841834B |
| | 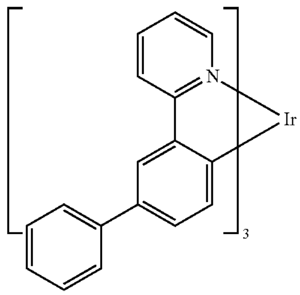 | US20060127696 |
| | 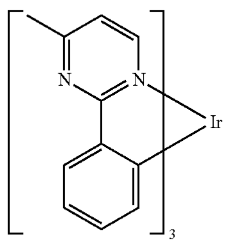 | US20090039776 |
| | 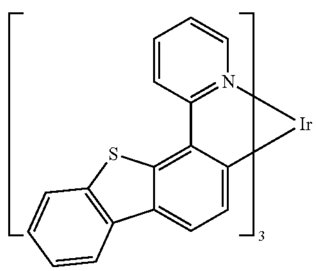 | US6921915 |
| | 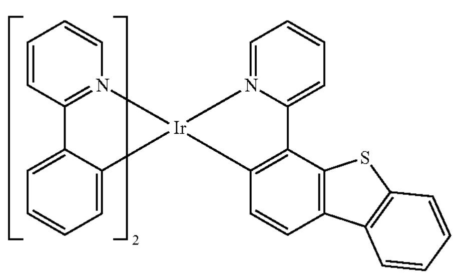 | US20100244004 |

TABLE 2-continued
| MATERIAL | EXAMPLES OF MATERIAL | PUBLICATIONS |
| --- | --- | --- |
| | 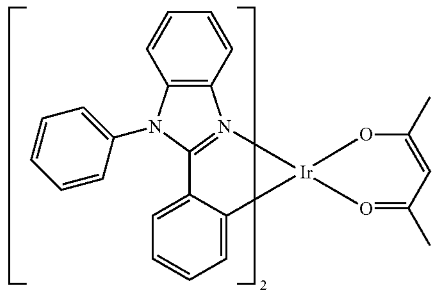 | US6687266 |
| | 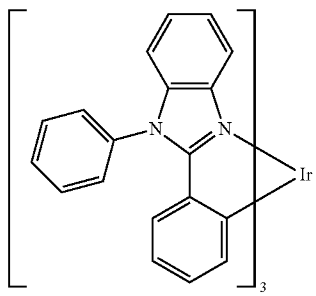 | Chem. Mater. 16, 2480 (2004) |
| | 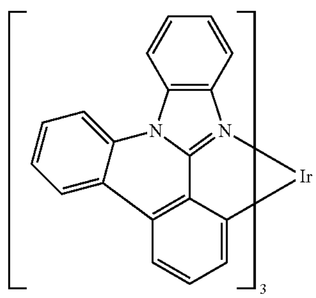 | US20070190359 |
| | 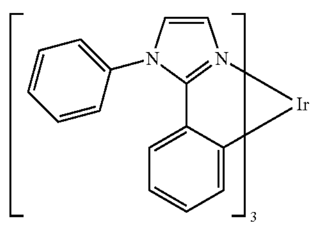 | US 20060008670 JP2007123392 |
| | 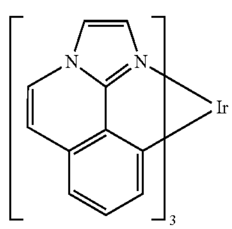 | WO2010086089, WO2011044988 |
| | 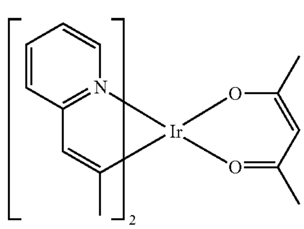 | Adv. Mater. 16, 2003 (2004) |

TABLE 2-continued
| MATERIAL | EXAMPLES OF MATERIAL | PUBLICATIONS |
|---|---|---|
| | 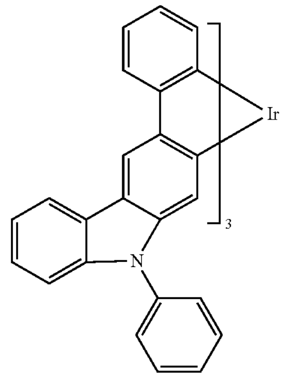 | Angew. Chem. Int. Ed. 2006, 45, 7800 |
| | 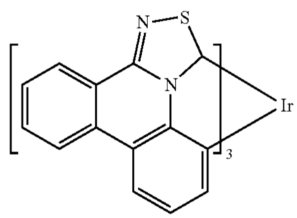 | WO2009050290 |
| | 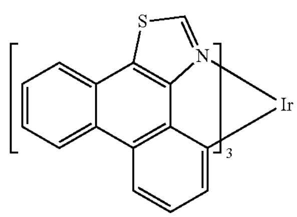 | US20090165846 |
| | 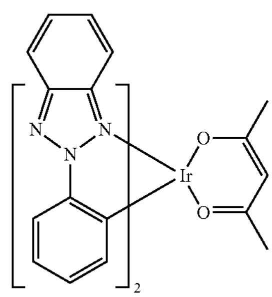 | US20080015355 |
| | 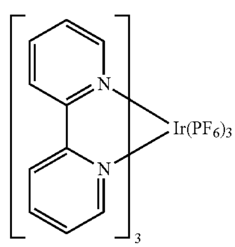 | US20010015432 |
| | 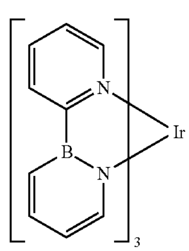 | US20100295032 |

TABLE 2-continued
| MATERIAL | EXAMPLES OF MATERIAL | PUBLICATIONS |
|---|---|---|
| Monomer for polymeric metal organometallic compounds | 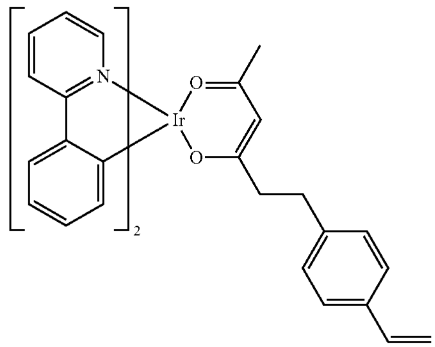 | US7250226, US7396598 |
| Pt (II) organometallic complexes, including polydentated ligands | 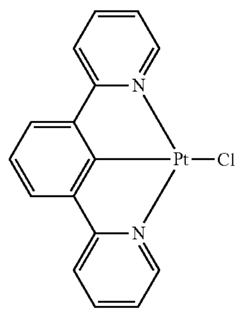 | Appl. Phys. Lett. 86, 153505 (2005) |
| | 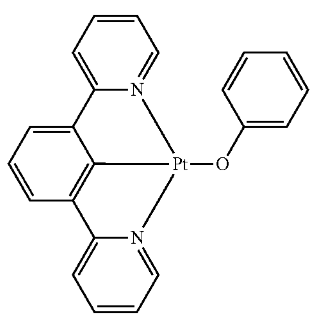 | Appl. Phys. Lett. 86, 153505 (2005) |
| | 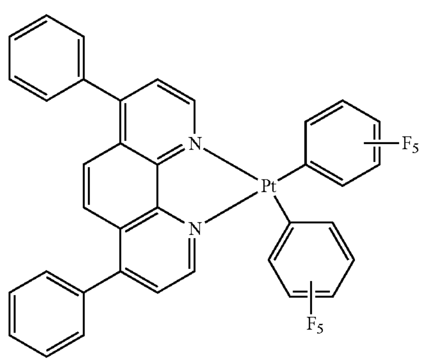 | Chem. Lett. 34, 592 (2005) |
| | 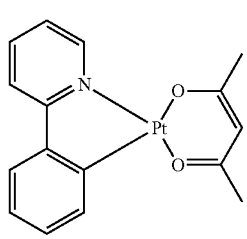 | WO2002015645 |

TABLE 2-continued
| MATERIAL | EXAMPLES OF MATERIAL | PUBLICATIONS |
|---|---|---|
| | 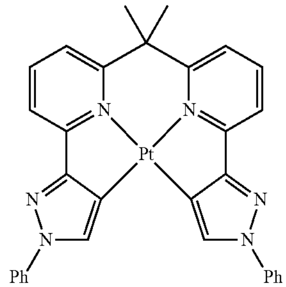 | US20060263635 |
| | 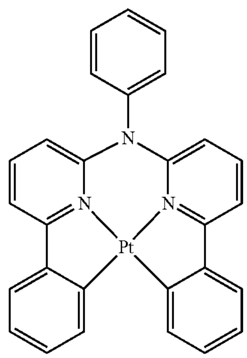 | US20060182992<br>US20070103060 |
| Cu complexes | 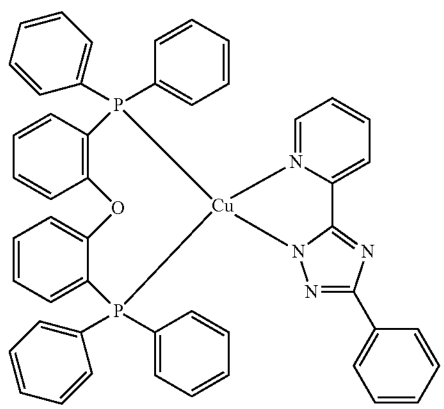 | WO2009000673 |
| | 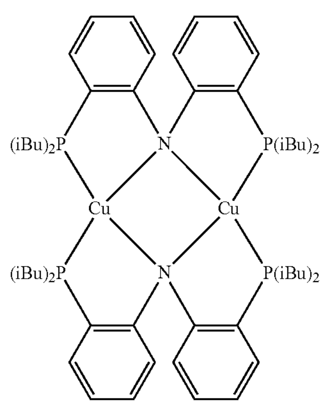 | US20070111026 |

TABLE 2-continued
| MATERIAL | EXAMPLES OF MATERIAL | PUBLICATIONS |
| --- | --- | --- |
| Gold complexes | 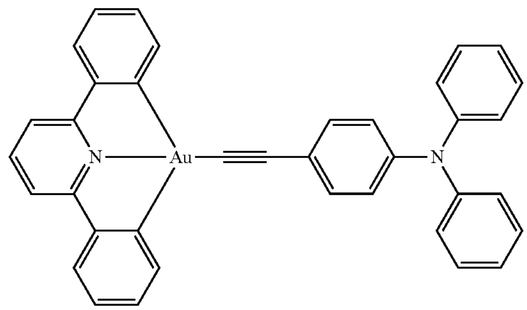 | Chem. Commun. 2906 (2005) |
| Rhenium (III) complexes | 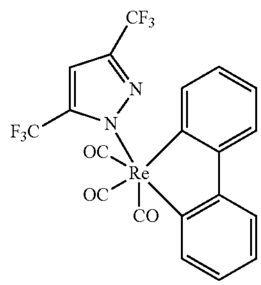 | Inorg. Chem. 42, 1248 (2003) |
| Osmium (II) complexes | 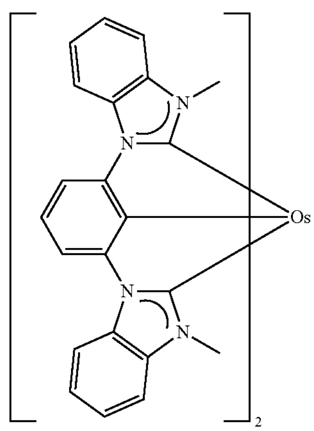 | US7279704 |
| Deuterated organometallic complexes | 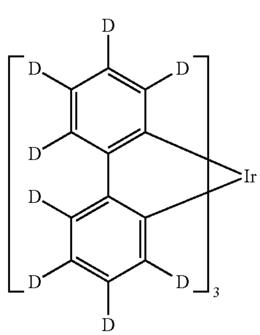 | US20030138657 |

TABLE 2-continued
| MATERIAL | EXAMPLES OF MATERIAL | PUBLICATIONS |
|---|---|---|
| Organometallic complexes with two or more metal centers | 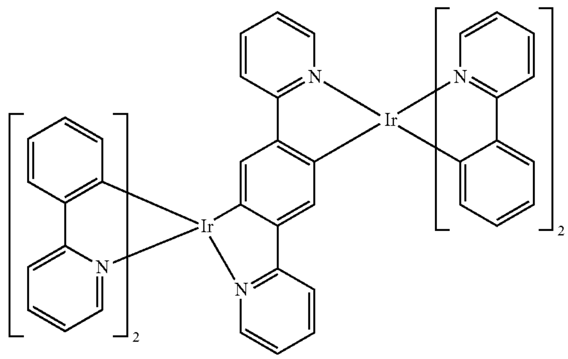 | US20030152802 |
| | 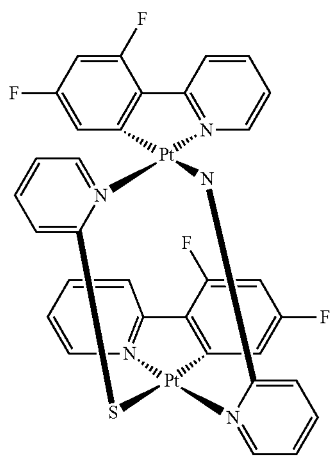 | US7090928 |
| Blue dopants | | |
| Iridium (III) organometallic complexes | 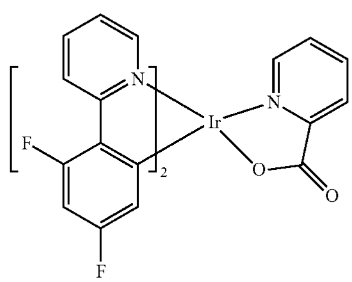 | WO2002002714 |
| | 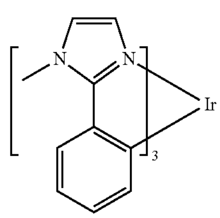 | WO2006009024 |
| | 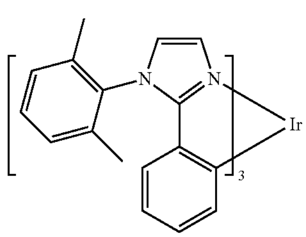 | US20060251923 US20110057559 US20110204333 |

TABLE 2-continued
| MATERIAL | EXAMPLES OF MATERIAL | PUBLICATIONS |
|---|---|---|
| | 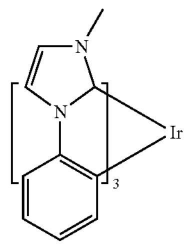 | US7393599, WO2006056418, US20050260441, WO2005019373 |
| | 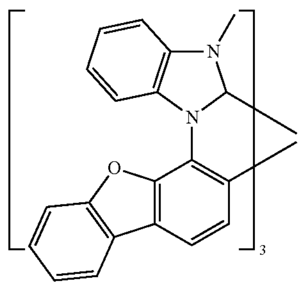 | US7534505 |
| | 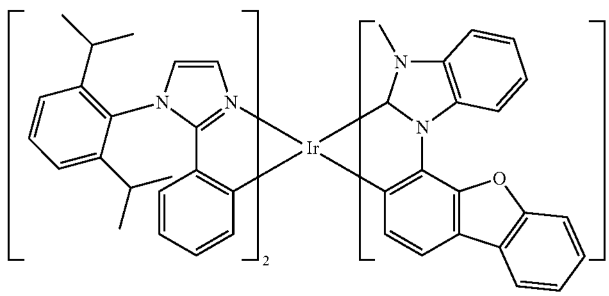 | WO2011051404 |
| | 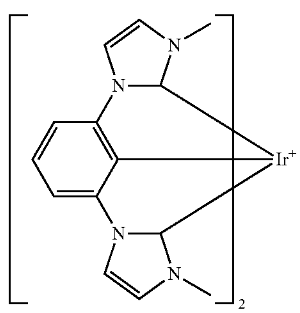 | US7445855 |
| | 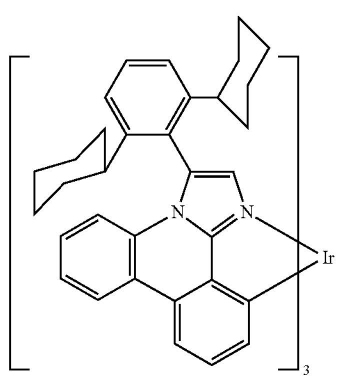 | US20070190359, US20080297033 US20100148663 |

TABLE 2-continued
| MATERIAL | EXAMPLES OF MATERIAL | PUBLICATIONS |
| --- | --- | --- |
| | 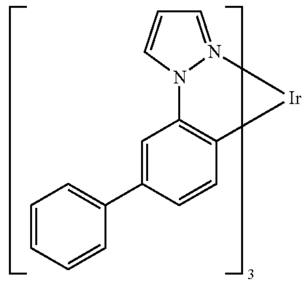 | US7338722 |
| | 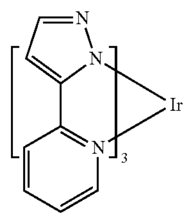 | US20020134984 |
| | 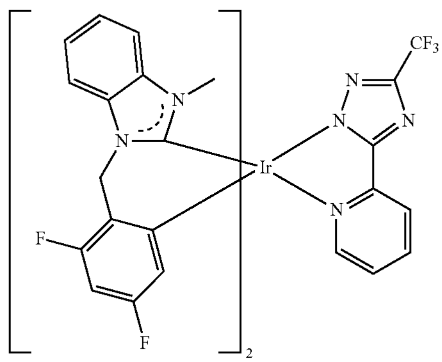 | Angew. Chem. Int. Ed. 47, 4542 (2008) |
| | 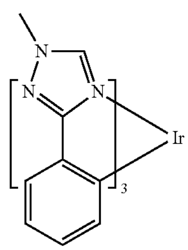 | Chem. Mater. 18, 5119 (2006) |
| | 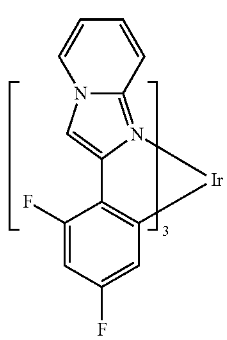 | Inorg. Chem. 46, 4308 (2007) |

TABLE 2-continued
| MATERIAL | EXAMPLES OF MATERIAL | PUBLICATIONS |
|---|---|---|
| | 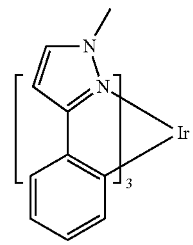 | WO2005123873 |
| | 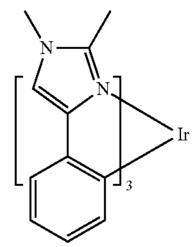 | WO2005123873 |
| | 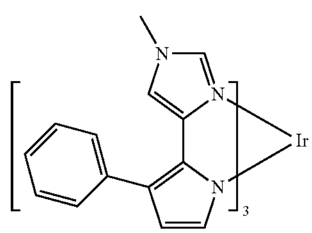 | WO2007004380 |
| | 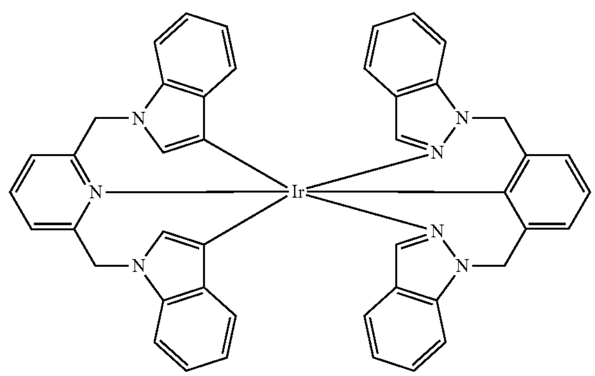 | WO2006082742 |
| Osmium (II) complexes | 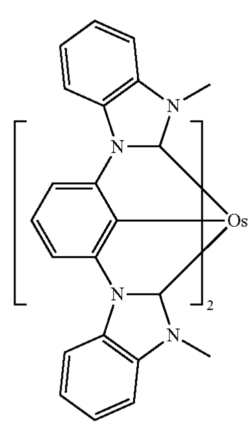 | US7279704 |

TABLE 2-continued
| MATERIAL | EXAMPLES OF MATERIAL | PUBLICATIONS |
| --- | --- | --- |
| | 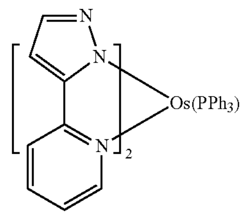 | Organometallics 23, 3745 (2004) |
| Gold complexes | 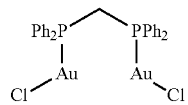 | Appl. Phys. Lett. 74, 1361 (1999) |
| Platinum (II) complexes | 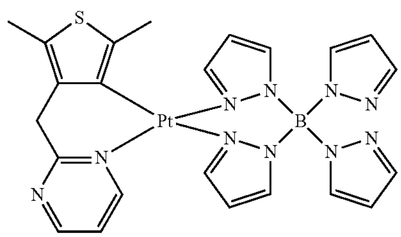 | WO2006098120, WO2006103874 |
| Pt tetradentate complexes with at least one metal-carbene bond | 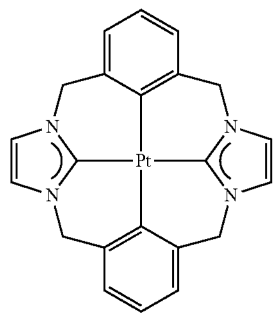 | US7655323 |
| Exciton/hole blocking layer materials | | |
| Bathocuprine compounds (e.g., BCP, Bphen) | 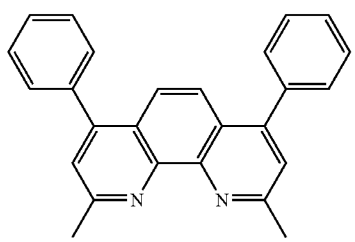 [SMILES: Cc1cc(-c2ccccc2)c2ccc3c(-c4ccccc4)cc(C)nc3c2n1] | Appl. Phys. Lett. 75, 4 (1999) |
| | 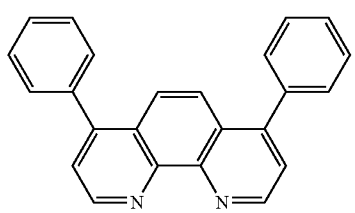 [SMILES: c1ccc(-c2ccnc3c2ccc2c(-c4ccccc4)ccnc23)cc1] | Appl. Phys. Lett. 79, 449 (2001) |
| Metal 8-hydroxy-quinolates (e.g., BAlq) | 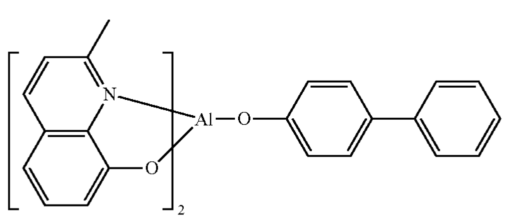 | Appl. Phys. Lett. 81, 162 (2002) |

TABLE 2-continued
| MATERIAL | EXAMPLES OF MATERIAL | PUBLICATIONS |
|---|---|---|
| 5-member ring electron deficient heterocycles such as triazole, oxadiazole, imidazole, benzoimidazole | 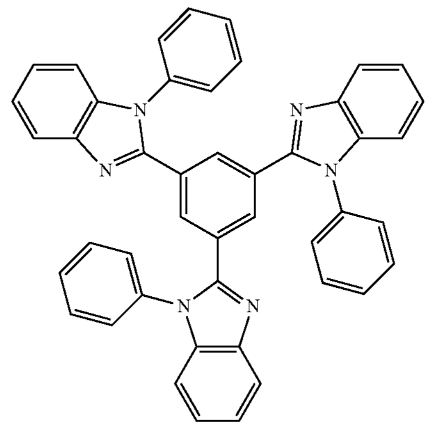 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |
| Triphenylene compounds | 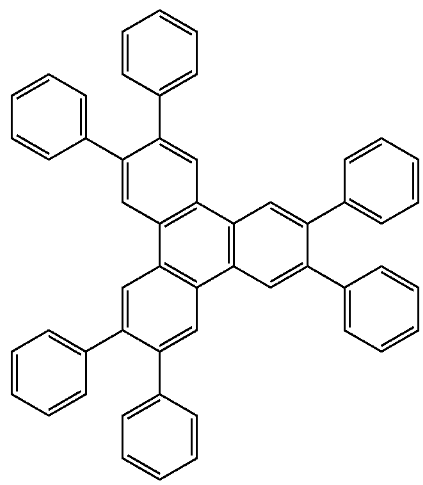 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |
| Fluorinated aromatic compounds | 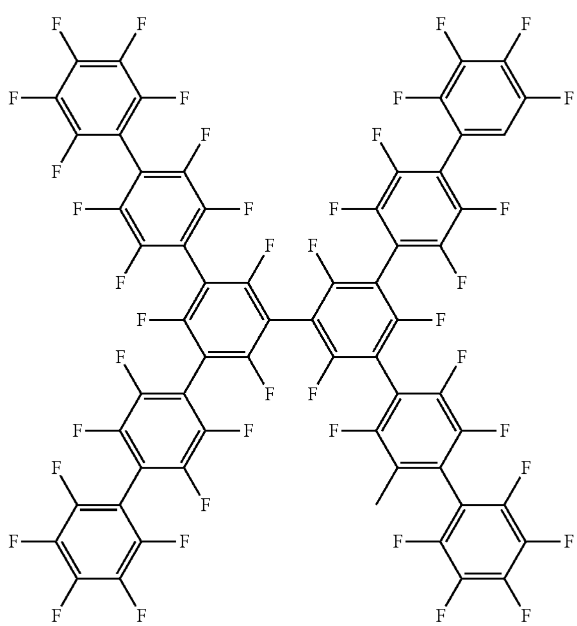 [SMILES: Cc1c(F)c(-c2c(F)c(-c3c(F)c(F)c(-c4cc(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |

TABLE 2-continued
| MATERIAL | EXAMPLES OF MATERIAL | PUBLICATIONS |
|---|---|---|
| Phenothiazine-S-oxide | 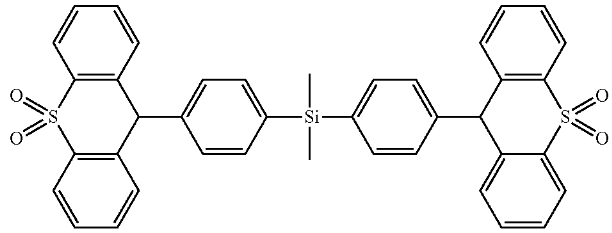 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |
| Silylated five-membered nitrogen, oxygen, sulfur or phosphorus dibenzoheterocycles | 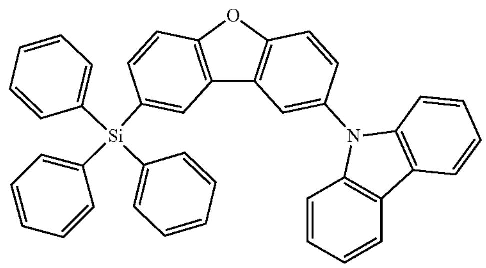 [SMILES: c1ccc([Si](c2ccccc2)(c2ccccc2)c2ccc3oc4ccc(-n5c6ccccc6c6ccccc65)cc4c3c2)cc1] | WO2010079051 |
| Aza-carbazoles | 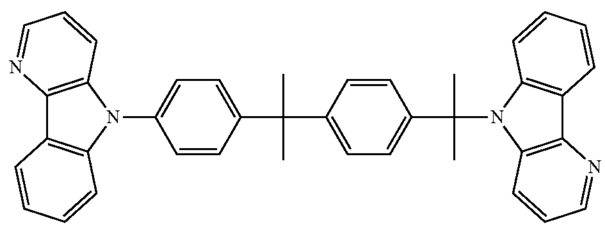 [SMILES: CC(C)(c1ccc(-n2c3ccccc3c3ncccc32)cc1)c1ccc(C(C)(C)n2c3ccccc3c3ncccc32)cc1] | US20060121308 |
| Electron transporting materials | | |
| Anthracene-benzoimidazole compounds | 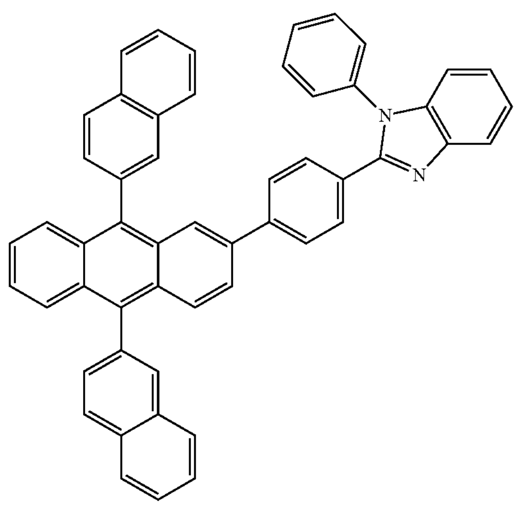 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |
| | 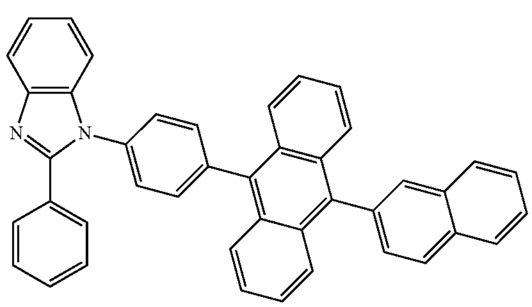 [SMILES: c1ccc(-c2nc3ccccc3n2-c2ccc(-c3c4ccccc4c(-c4ccc5ccccc5c4)c4ccccc34)cc2)cc1] | US20090179554 |

TABLE 2-continued
| MATERIAL | EXAMPLES OF MATERIAL | PUBLICATIONS |
| --- | --- | --- |
| Aza triphenylene derivatives | 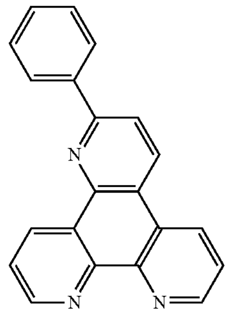 [SMILES: c1ccc(-c2ccc3c4cccnc4c4ncccc4c3n2)cc1] | US20090115316 |
| Anthracene-benzothiazole compounds | 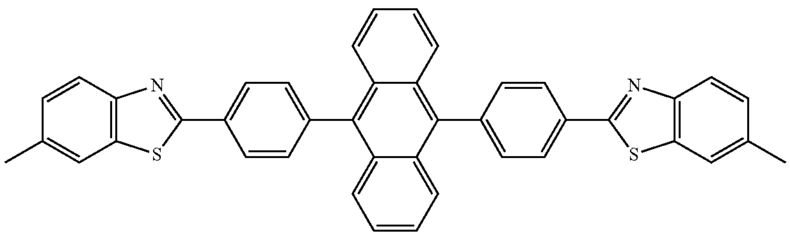 | Appl. Phys. Lett. 89, 063504 (2006) |
| Metal 8-hydroxyquinolates (e.g., $Alq_3$, $Zrq_4$) | 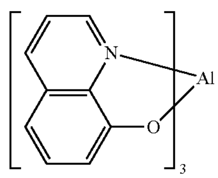 | Appl. Phys. Lett. 51, 913 (1987) US7230107 |
| Metal hydroxy-benoquinolates | 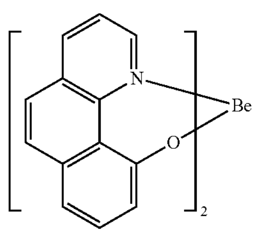 | Chem. Lett. 5, 905 (1993) |
| Bathocuprine compounds such as BCP, BPhen, etc | 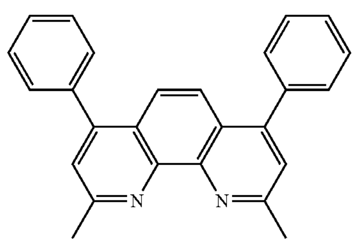 [SMILES: Cc1cc(-c2ccccc2)c2ccc3c(-c4ccccc4)cc(C)nc3c2n1] | Appl. Phys. Lett. 91, 263503 (2007) |
| | 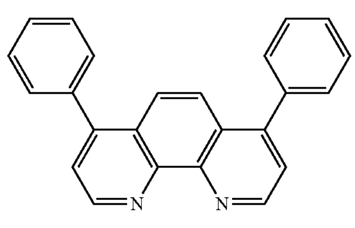 [SMILES: c1ccc(-c2ccnc3c2ccc2c(-c4ccccc4)ccnc23)cc1] | Appl. Phys. Lett. 79, 449 (2001) |

TABLE 2-continued
| MATERIAL | EXAMPLES OF MATERIAL | PUBLICATIONS |
|---|---|---|
| 5-member ring electron deficient heterocycles (e.g., triazole, oxadiazole, imidazole, benzoimidazole) | 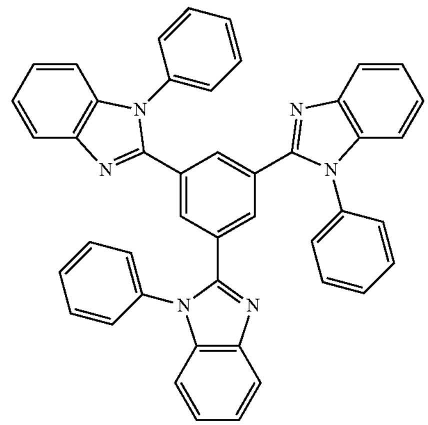 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
| | 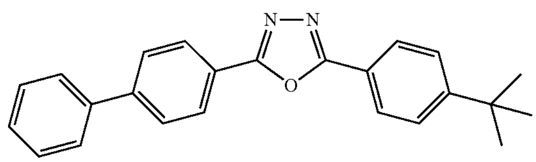 [SMILES: CC(C)(C)c1ccc(-c2nnc(-c3ccc(-c4ccccc4)cc3)o2)cc1] | Appl. Phys. Lett. 55, 1489 (1989) |
| | 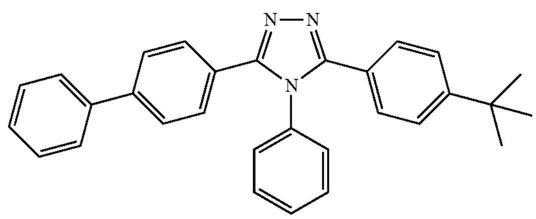 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |
| Silole compounds | 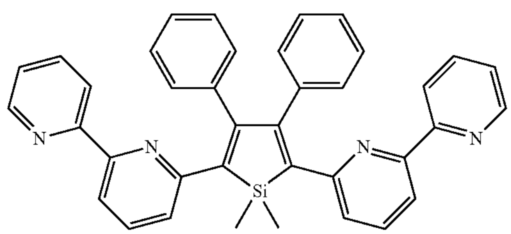 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 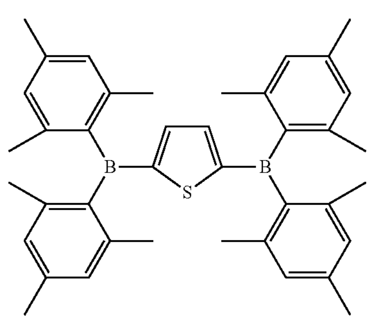 | J. Am. Chem. Soc. 120, 9714 (1998) |
| Fluorinated aromatic compounds | 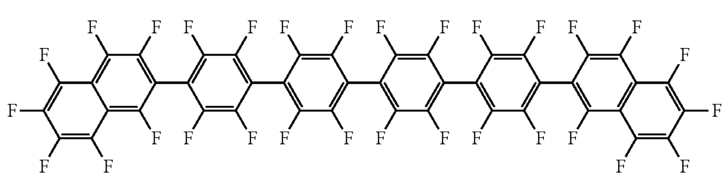 [SMILES: Fc1c(F)c(-c2c(F)c(F)c(-c3c(F)c(F)c4c(F)c(F)c(F)c(F)c4c3F)c(F)c2F)c(F)c(F)c1-c1c(F)c(F)c(-c2c(F)c(F)c(-c3c(F)c(F)c4c(F)c(F)c(F)c(F)c4c3F)c(F)c2F)c(F)c1F] | J. Am. Chem. Soc. 122, 1832 (2000) |

TABLE 2-continued

| MATERIAL | EXAMPLES OF MATERIAL | PUBLICATIONS |
|---|---|---|
| Fullerene (e.g., C60) | 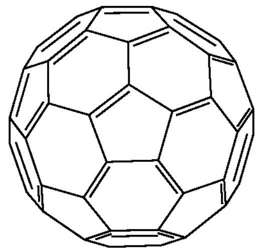 | US20090101870 |
| Triazine complexes | 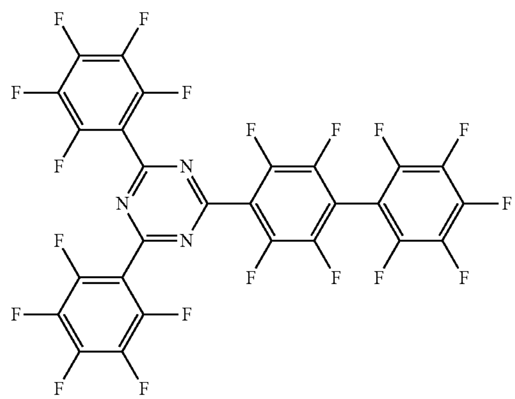 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |
| Zn (N^N) complexes | 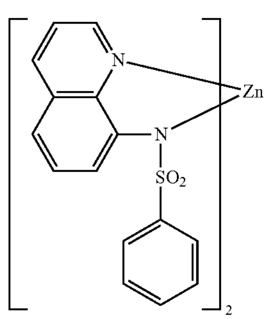 | US6528187 |

Re(I) complexes have been reported as phosphorescent emitters in OLEDs. The compounds reported in literature that were used in OLEDs all contain monodentate ligands such as carbonyl. The stability of the devices with these complexes is low and does not meet the commercial requirements. In this invention, bistridentate Re(I) complexes are disclosed. These complexes should provide much better stability than those with monodentate ligands.

Neutral bistridentate Re(I) complexes are disclosed. One of the tridentate ligand is monoanionic and the other is neutral. These complexes can be used as emitters or other functional materials, such as charge transporting materials, for OLEDs.

DFT (density function theory) calculations were performed for certain example compounds and comparative compounds. The results are shown in Table 3 below. Geometry optimization calculations were performed within the Gaussian 09 software package using the B3LYP hybrid functional and CEP-31g effective core potential basis set.

TABLE 3
Calculation results of inventive compounds
| Compound number | Structure | HOMO (eV) | LUMO (eV) | $S_1$ (nm) | $T_1$ (nm) |
|---|---|---|---|---|---|
| Compound 1 | 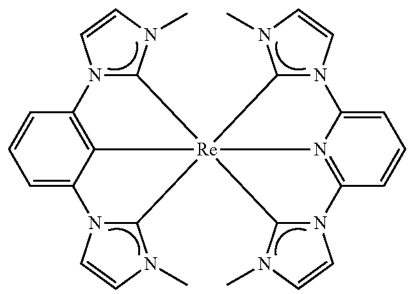 | −3.31 | −0.41 | 584 | 812 |
| Compound 385 | 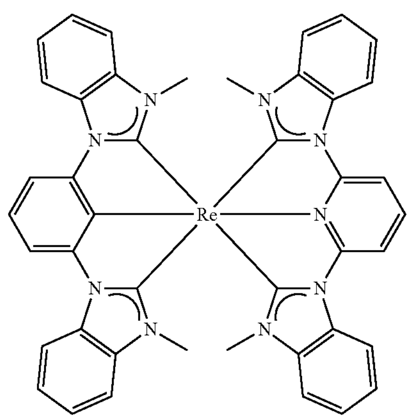 | −3.73 | −0.86 | 583 | 779 |
| Compound 19 | 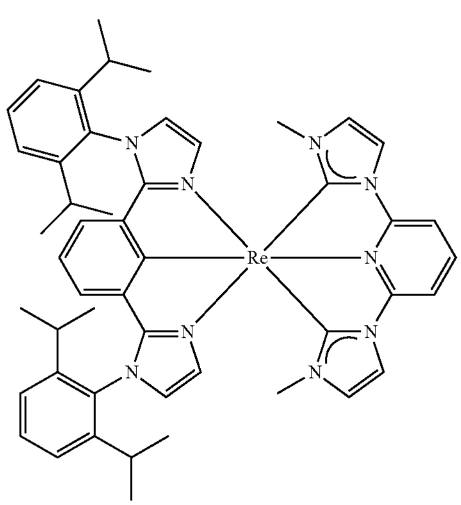 | −3.23 | −0.61 | 701 | 1007 |

TABLE 3-continued
| Calculation results of inventive compounds | | | | | |
|---|---|---|---|---|---|
| Compound number | Structure | HOMO (eV) | LUMO (eV) | $S_1$ (nm) | $T_1$ (nm) |
| Compound 1729 | 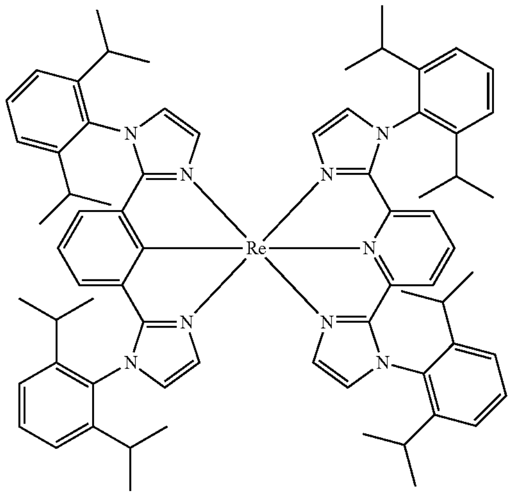 | −2.99 | −0.84 | 854 | 1446 |
| Compound 20 | 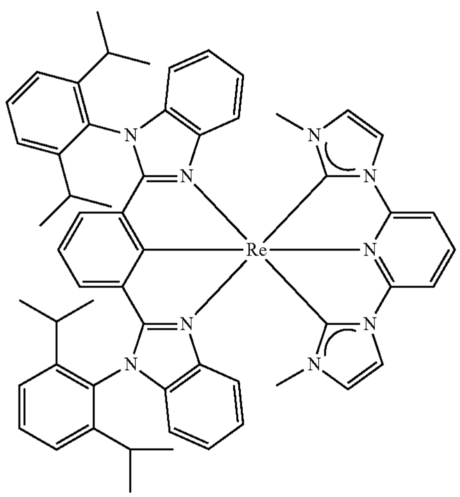 | −3.46 | −1.09 | 718 | 1012 |
| Compound 2017 | 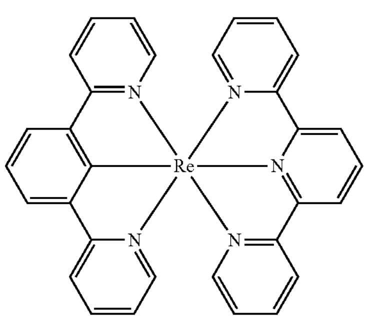 | −3.87 | −1.64 | 862 | 1398 |

TABLE 3-continued

Calculation results of inventive compounds

| Compound number | Structure | HOMO (eV) | LUMO (eV) | $S_1$ (nm) | $T_1$ (nm) |
|---|---|---|---|---|---|
| Compound 2031 | 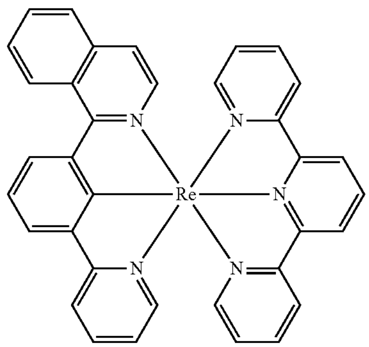 | −3.96 | −2.20 | 294 | 1424 |

Table 3 summarizes the HOMO, LUMO energy levels, singlet energy ($S_1$), and triplet energy ($T_1$) of inventive compounds. The calculated $T_1$ of the compound are in deep red or near IR range. Therefore, the inventive compounds can be used as deep red or near IR emitters for phosphorescent OLEDs. In addition, the calculated HOMO levels of these compounds are very shallow, which make them suitable for change injection or transporting materials, especially for hole injection.

General method of making the $Re(L_A)(L_B)$ complexes: The inventive $Re(L_A)(L_B)$ complexes may be prepared by processes known to those skilled in the art. Suitable processes are mentioned, for example, in *Inorg. Chem.* 1996, 35, 5584-5594 and the literatures cited therein. The inventive complexes can be purified by processes known to those skilled in the art. Typically, the workup and purification are affected by extraction, column chromatography, recrystallization, and/or sublimation by processes known to those skilled in the art. A schematic process that can be used for preparing Compound 2017 embodiment of the inventive $Re(L_A)(L_B)$ complex is detailed below:

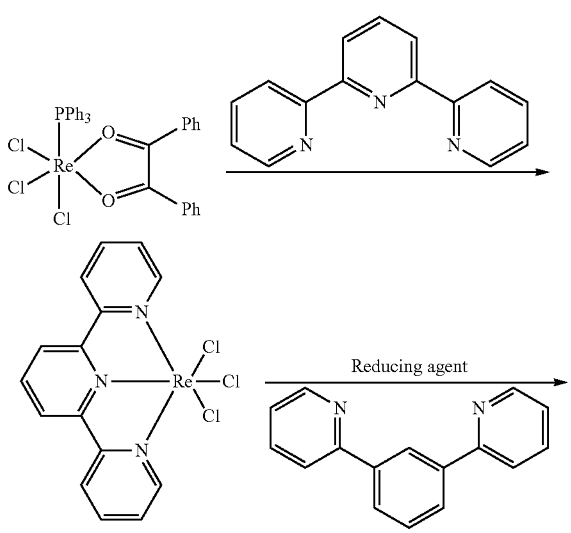

-continued

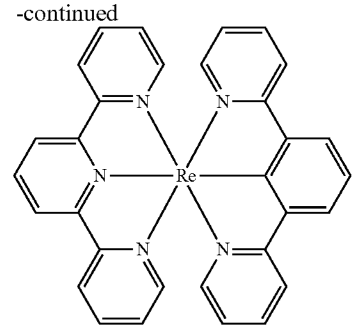

Compound 2017

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having a formula $Re(L_A)(L_B)$, wherein Re is a Rhenium(I) metal;

wherein $L_A$ is a monoanionic tridentate ligand having a formula selected from the group consisting of

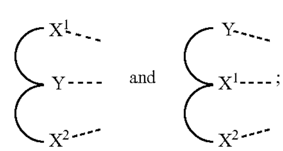

wherein $L_B$ is a neutral tridentate ligand having a formula

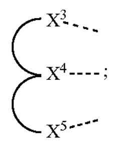

wherein $X^1$, $X^2$, $X^3$, $X^4$, and $X^5$ are each independently a neutral coordinating atom selected from the group consisting of carbon, phosphorus, and nitrogen;

wherein at least one of $X^1$, $X^2$, $X^3$, $X^4$, and $X^5$ is an imidazole derived carbene neutral carbon;

wherein Y is a monoanionic coordinating atom selected from the group consisting of carbon, oxygen, sulfur, and nitrogen;

wherein the dash lines show the connection points to Re; and wherein $L_A$ and $L_B$ are optionally linked together to form a hexadentate ligand.

2. The compound of claim 1, wherein the neutral carbon is imidazole or benzimidazole carbene;

wherein the neutral phosphorus is a phosphorus atom of a trisubstituted phosphine; and wherein the neutral nitrogen is an $sp^2$ nitrogen atom of N-heterocyclic ring selected from the group consisting of pyridine, pyrimidine, imidazole, benzoimidazole, pyrazole, oxazole, and triazole.

3. The compound of claim 1, wherein the monoanionic coordinating carbon is an $sp^2$ carbon atom selected from the group consisting of benzene, pyridine, furan, thiophene, and pyrrole.

4. The compound of claim 1, wherein $L_A$ has a formula selected from the group consisting of:

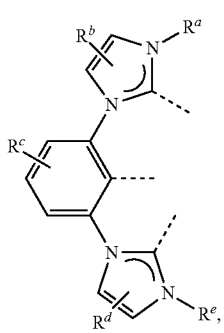

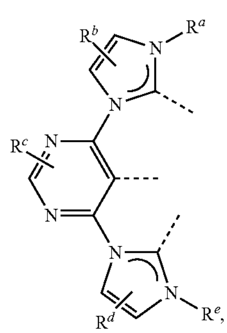

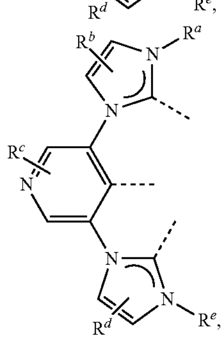

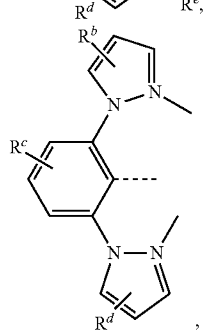

-continued

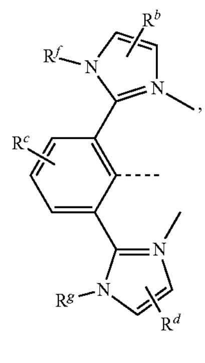

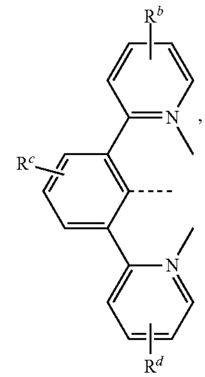

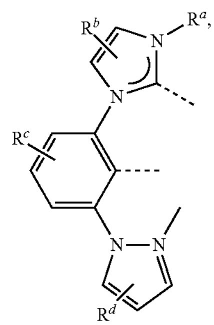

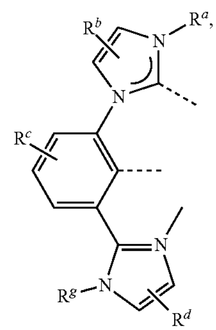

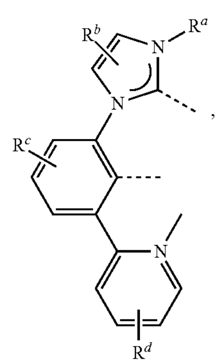

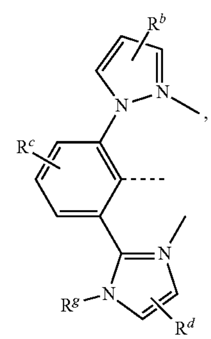

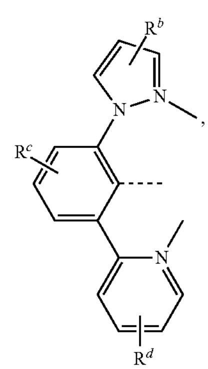

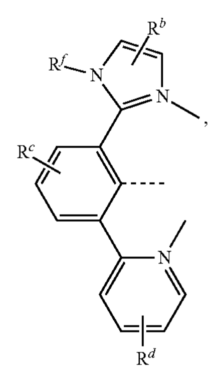

-continued

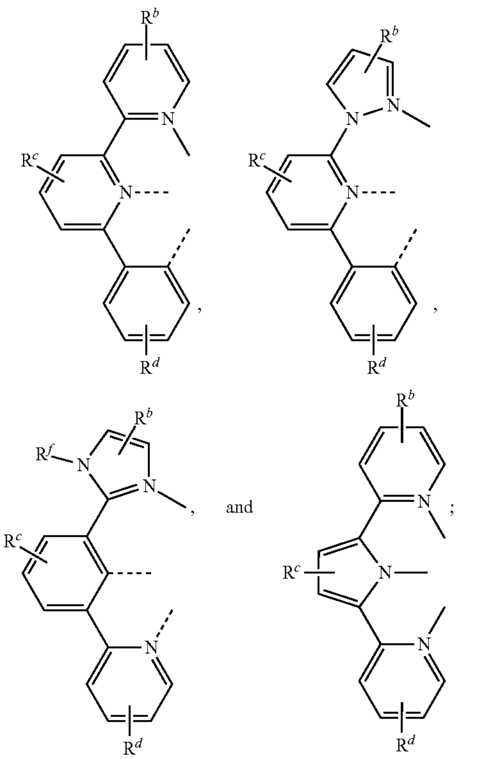

wherein $R^b$, $R^c$, and $R^d$ may represent from mono-substitution to the possible maximum number of substitution, or no substitution;

wherein $R^a$, $R^b$, $R^c$, $R^d$, $R^e$, $R^f$ and $R^g$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein two adjacent substituents of $R^a$, $R^b$, $R^c$, $R^d$, $R^e$, $R^f$ and $R^g$ are optionally joined to form a ring or form a multidentate ligand.

5. The compound of claim 1, wherein $L_A$ has a formula selected from the group consisting of:

$L_{A1}$

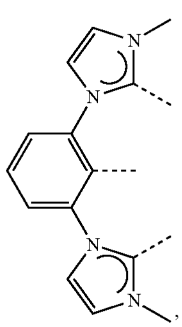

-continued $L_{A2}$

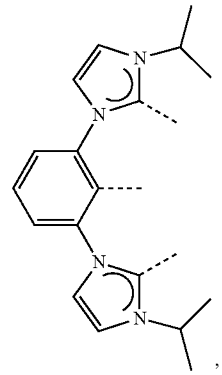

$L_{A3}$

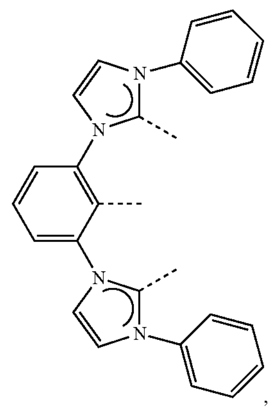

$L_{A4}$

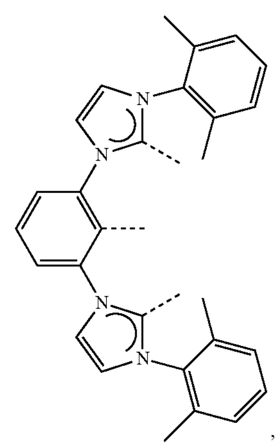

$L_{A5}$

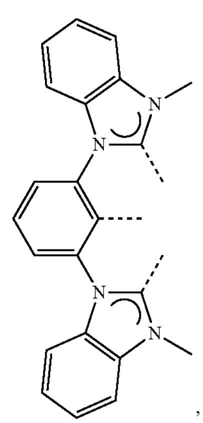

$L_{A6}$
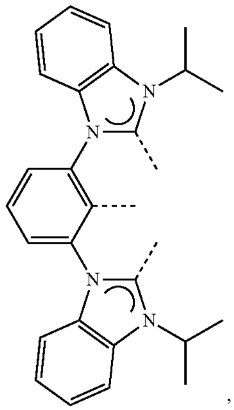
$L_{A7}$
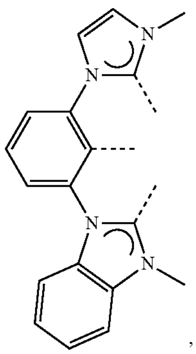
$L_{A8}$
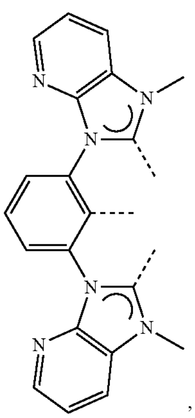
$L_{A9}$
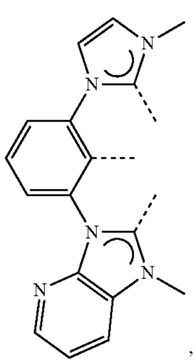
$L_{A10}$
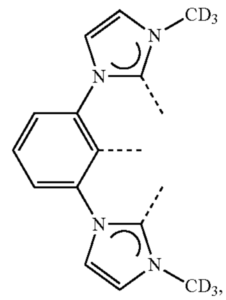
$L_{A11}$
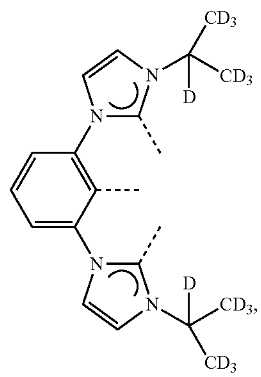
$L_{A12}$
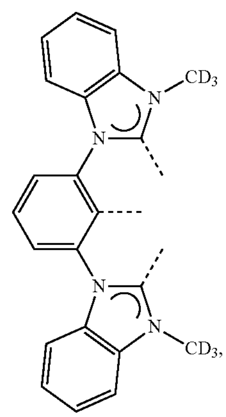
$L_{A13}$
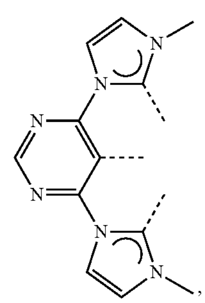

$L_{A14}$
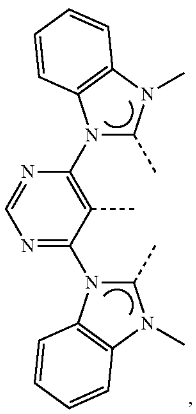
$L_{A15}$
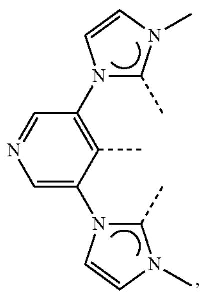
$L_{A16}$
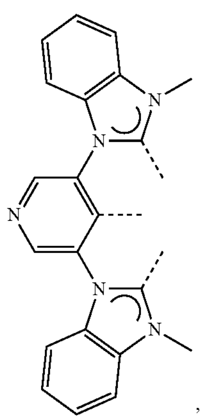
$L_{A17}$
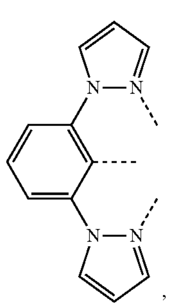
$L_{A18}$
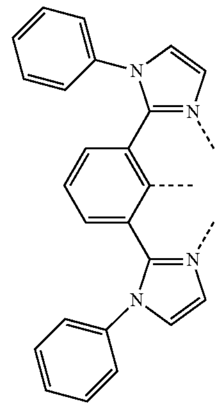
$L_{A19}$
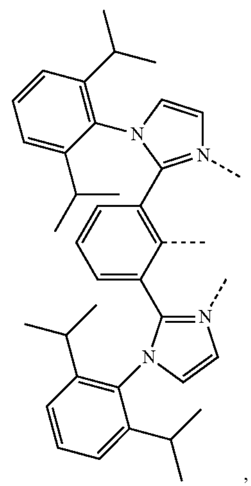
$L_{A20}$
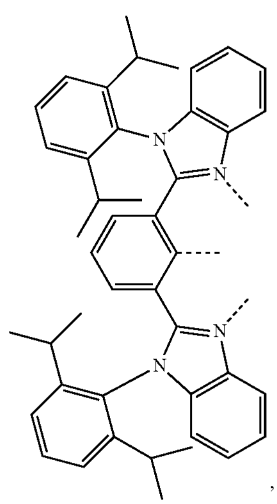

-continued
$L_{A21}$
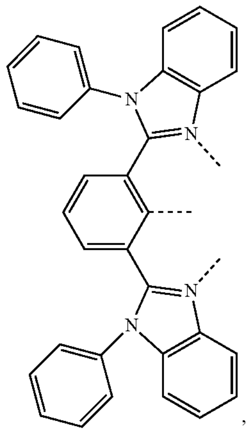
$L_{A22}$
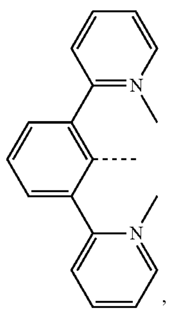
$L_{A23}$
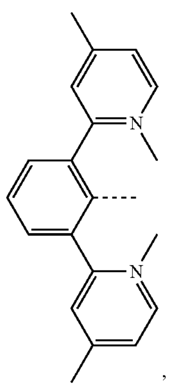
$L_{A24}$
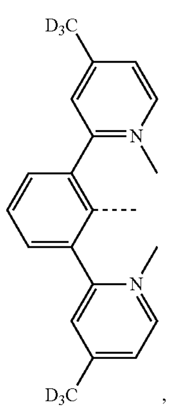
-continued
$L_{A25}$
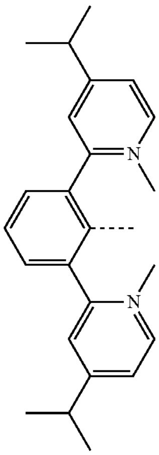
$L_{A26}$
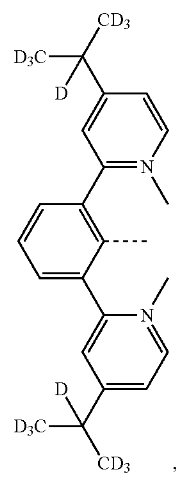
$L_{A27}$
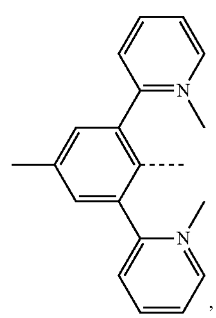

-continued
$L_{A28}$
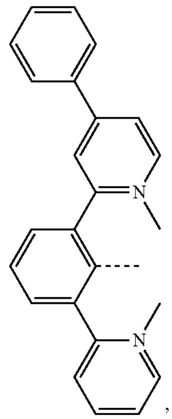
$L_{A29}$
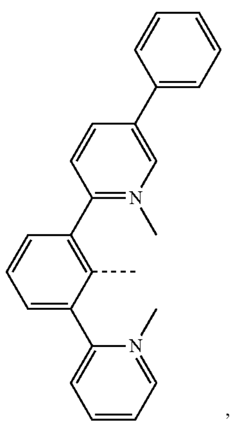
$L_{A30}$
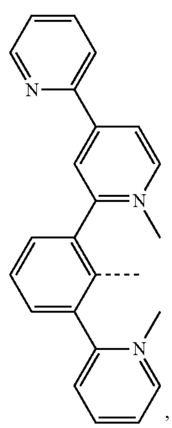
-continued
$L_{A31}$
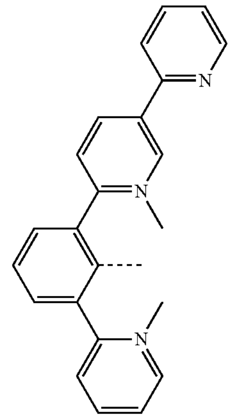
$L_{A32}$
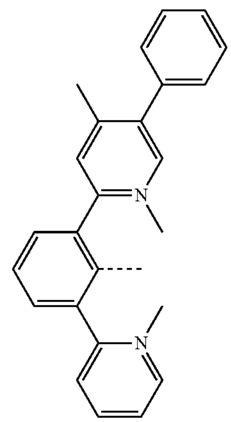
$L_{A33}$
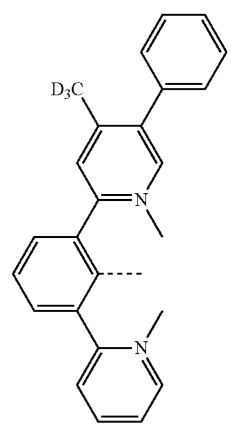
$L_{A34}$
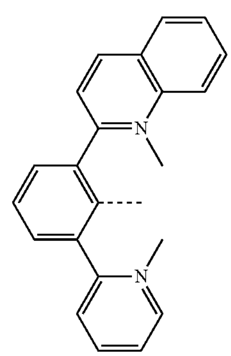

-continued
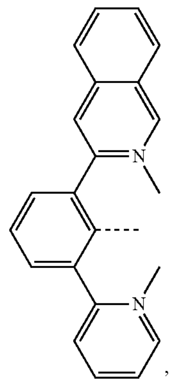
$L_{A35}$
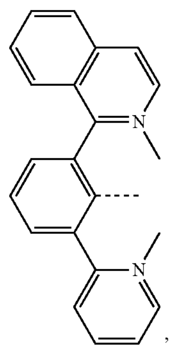
$L_{A36}$
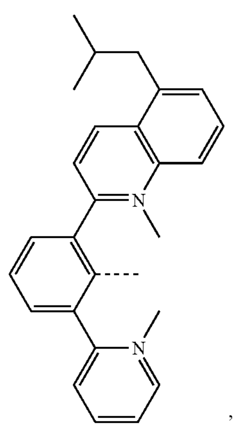
$L_{A37}$
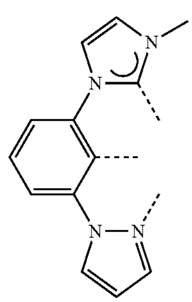
$L_{A38}$
-continued
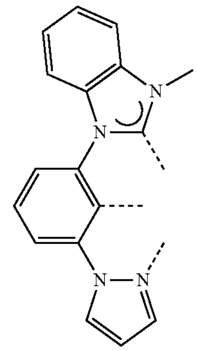
$L_{A39}$
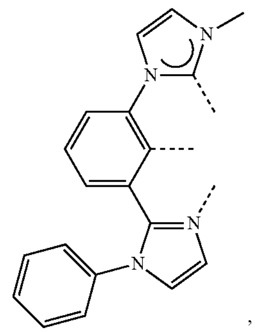
$L_{A40}$
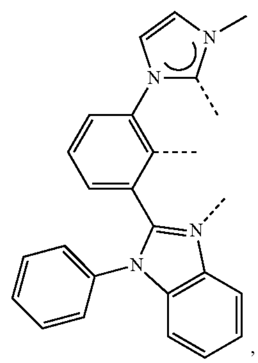
$L_{A41}$
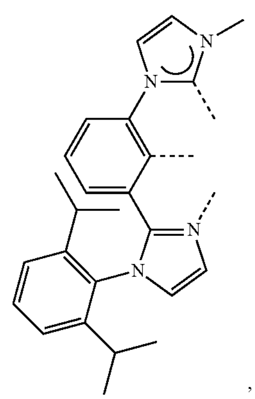
$L_{A42}$ -continued
$L_{A43}$
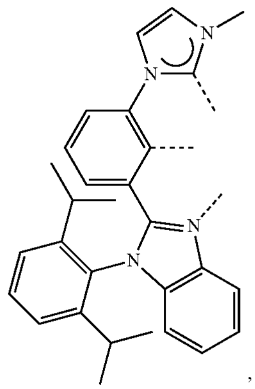
,
$L_{A44}$
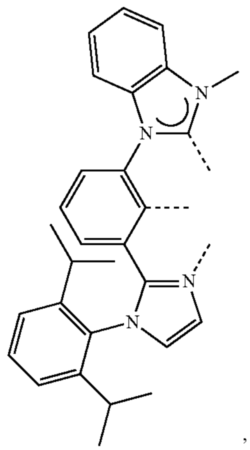
,
$L_{A45}$
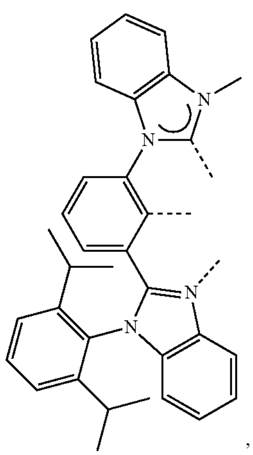
,
$L_{A46}$
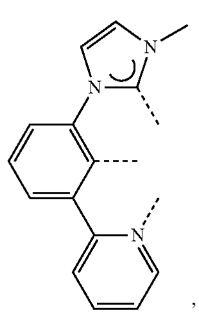
,
-continued
$L_{A47}$
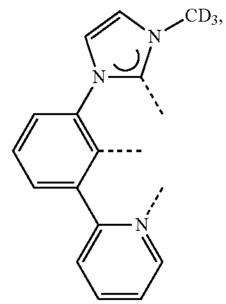
$L_{A48}$
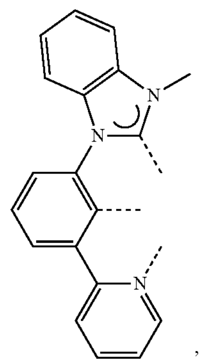
,
$L_{A49}$
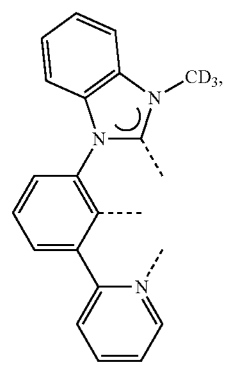
$L_{A50}$
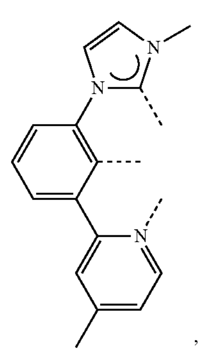
, -continued
$L_{A51}$
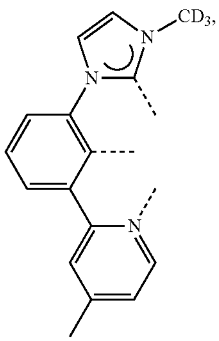
$L_{A52}$
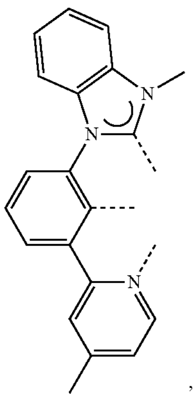
$L_{A53}$
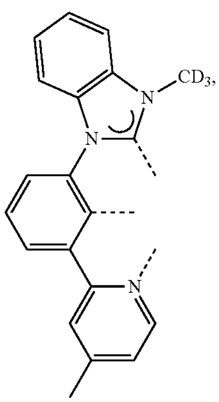
$L_{A54}$
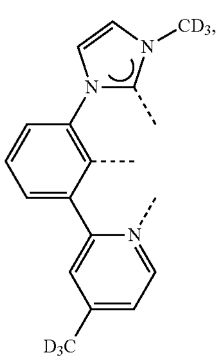
-continued
$L_{A55}$
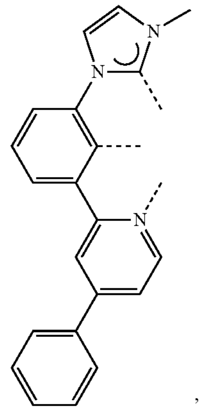
$L_{A56}$
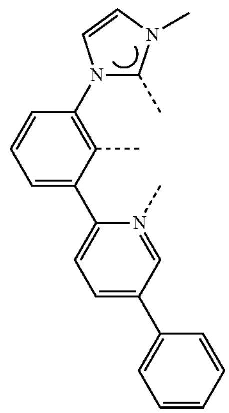
$L_{A57}$
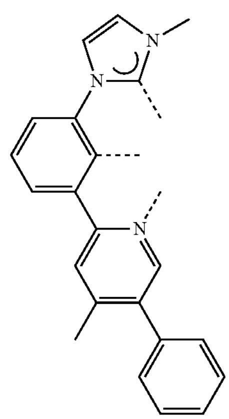
$L_{A58}$
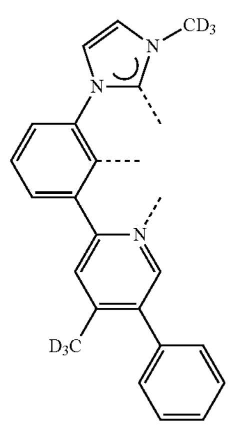

$L_{A59}$
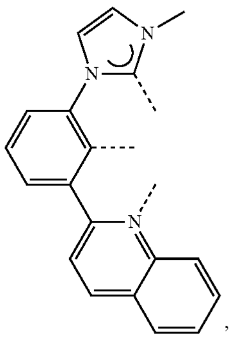
,
$L_{A60}$
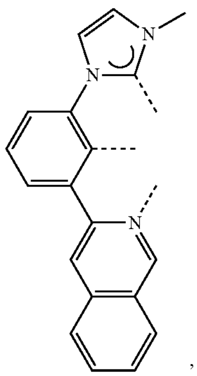
,
$L_{A61}$
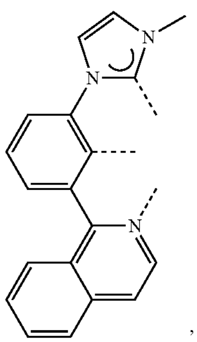
,
$L_{A62}$
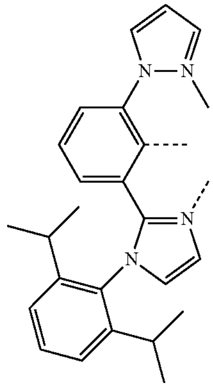
,
$L_{A63}$
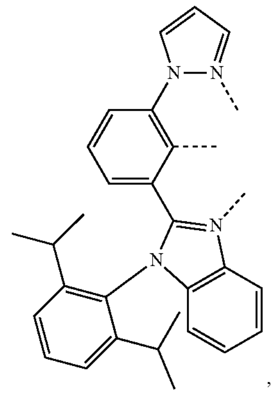
,
$L_{A64}$
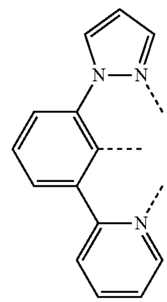
,
$L_{A65}$
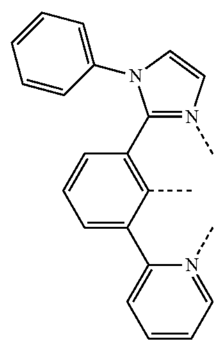
,
$L_{A66}$
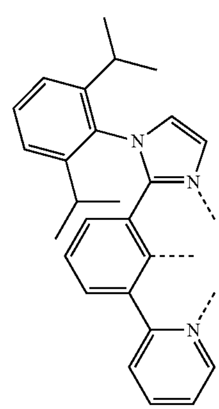
, -continued
$L_{A67}$
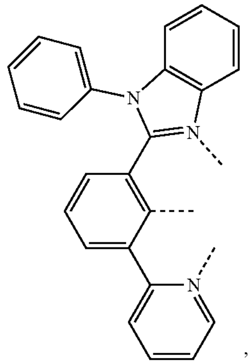
,
$L_{A68}$
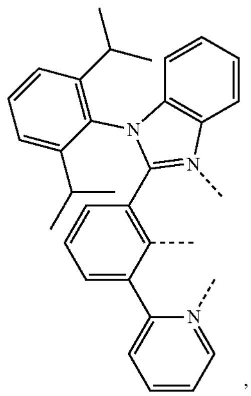
,
$L_{A69}$
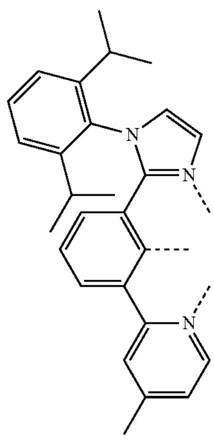
,
$L_{A70}$
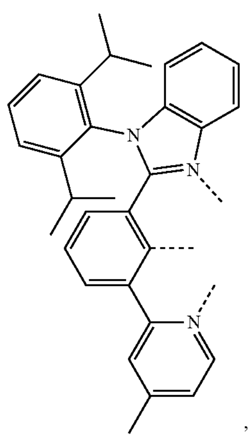
,
-continued
$L_{A71}$
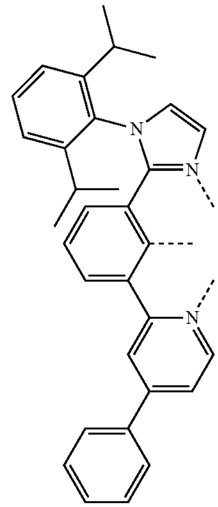
,
$L_{A72}$
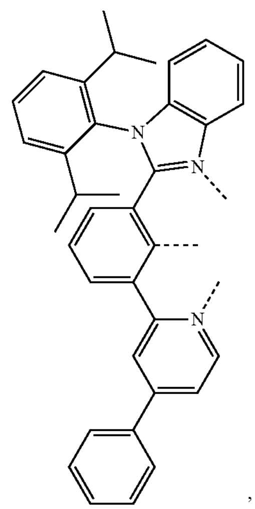
,
$L_{A73}$
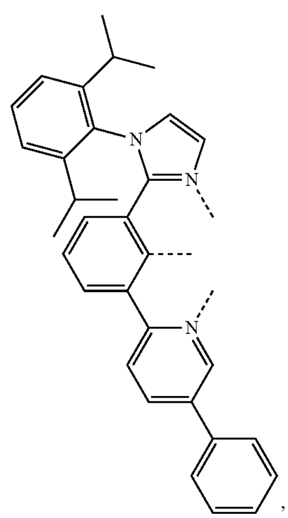
, -continued
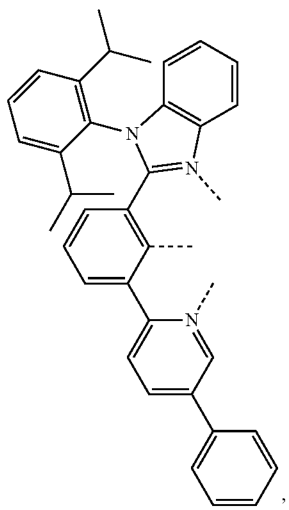
$L_{A74}$
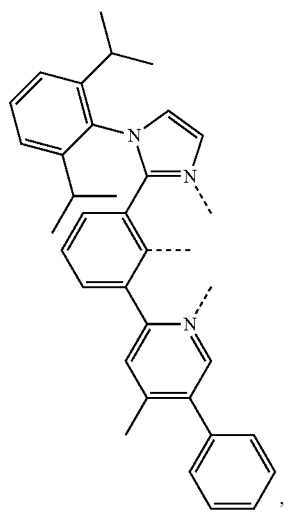
$L_{A75}$
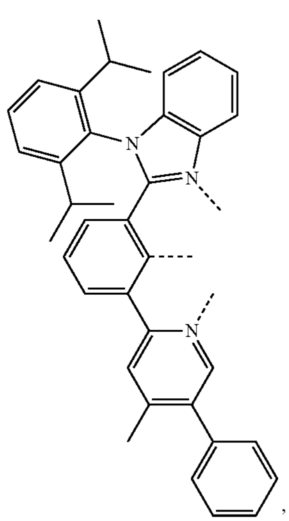
$L_{A76}$
-continued
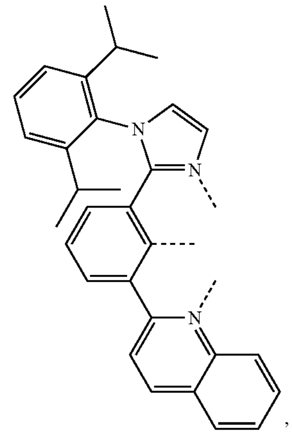
$L_{A77}$
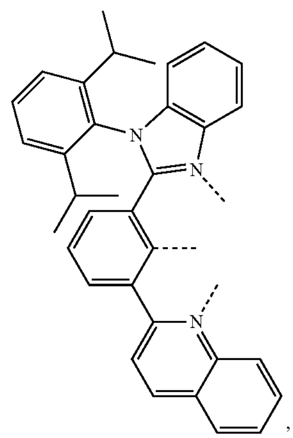
$L_{A78}$
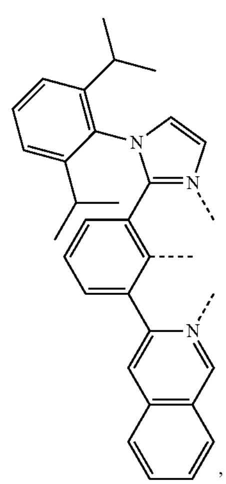
$L_{A79}$ -continued
L$_{A80}$
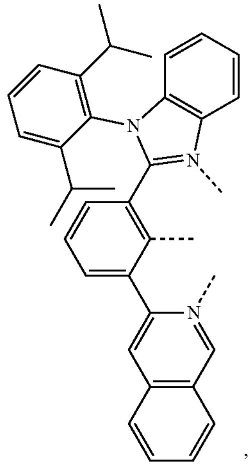
,
L$_{A81}$
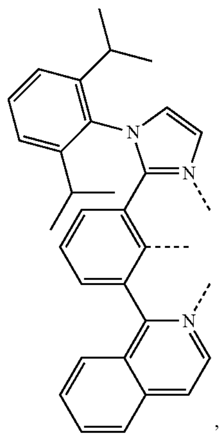
,
L$_{A82}$
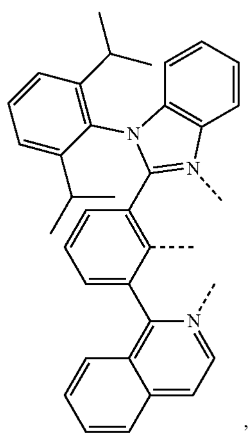
,
L$_{A83}$
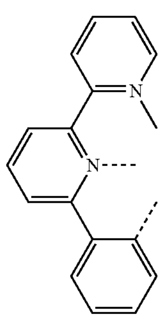
,
-continued
L$_{A84}$
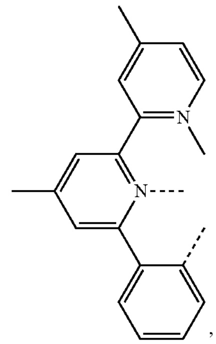
,
L$_{A85}$
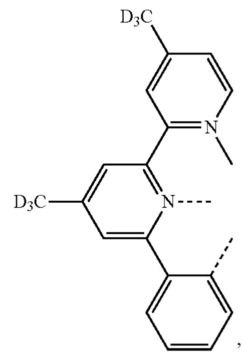
,
L$_{A86}$
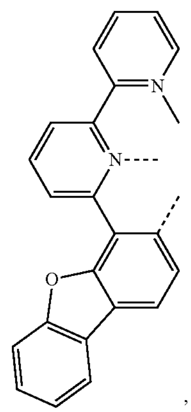
,
L$_{A87}$
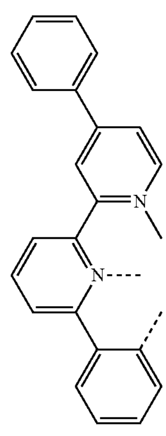
, $L_{A88}$
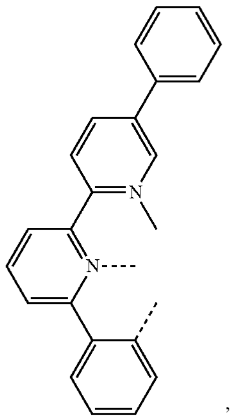
,
$L_{A89}$
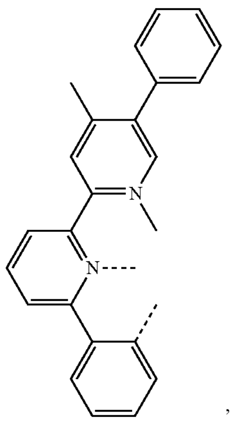
,
$L_{A90}$
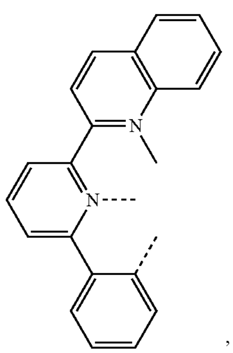
,
$L_{A91}$
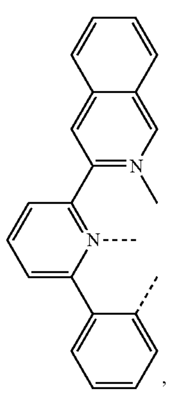
,
$L_{A92}$
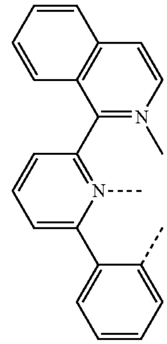
,
$L_{A93}$
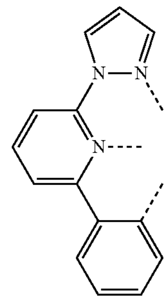
,
$L_{A94}$
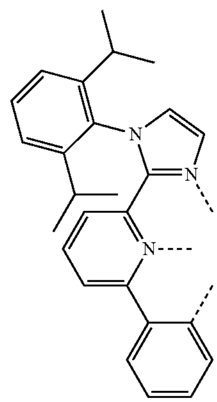
, and
$L_{A95}$
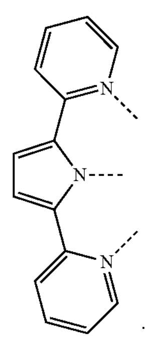
.
6. The compound of claim 1, wherein $L_B$ has a formula selected from the group consisting of:

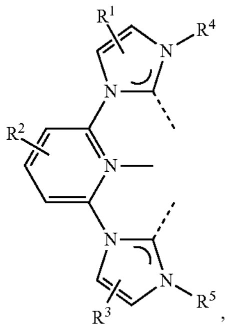

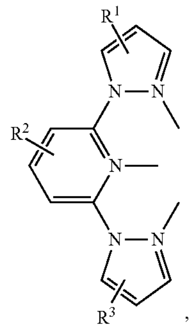

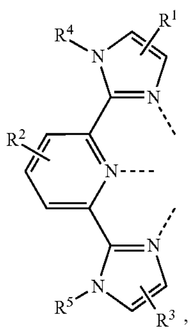

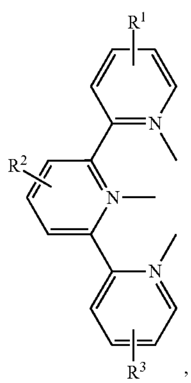

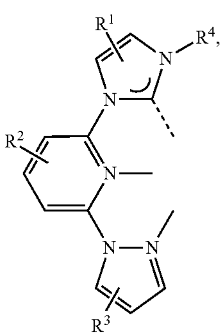

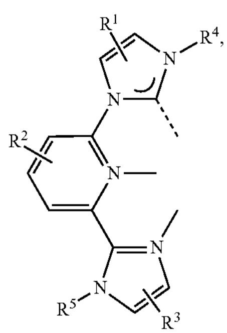

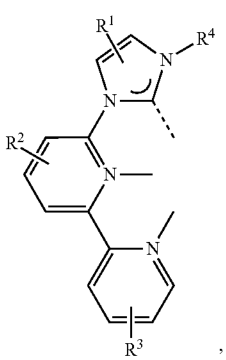

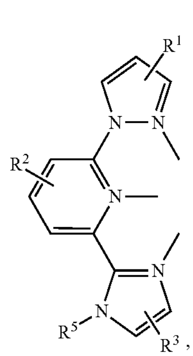

-continued

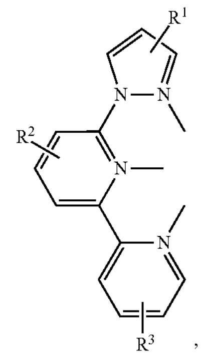

, and

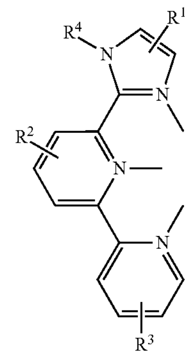

;

wherein $R^1$, $R^2$, and $R^3$ may represent from mono-substitution to the possible maximum number of substitution, or no substitution;

wherein $R^1$, $R^2$, $R^3$, $R^4$, and $R^5$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein two adjacent substituents of $R^1$, $R^2$, $R^3$, $R^4$, and $R^5$ are optionally joined to form a ring or form a multidentate ligand.

7. The compound of claim 1, wherein $L_B$ has a formula selected from the group consisting of:

$L_{B1}$

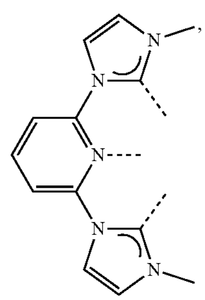

$L_{B2}$

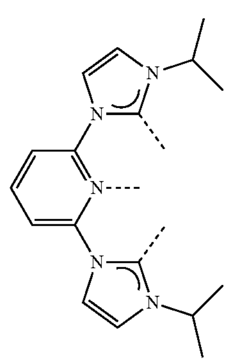

-continued
$L_{B3}$
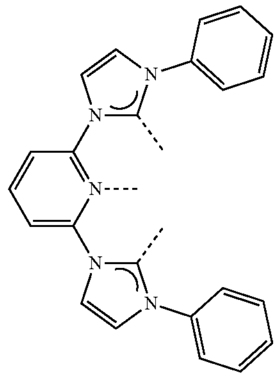
$L_{B4}$
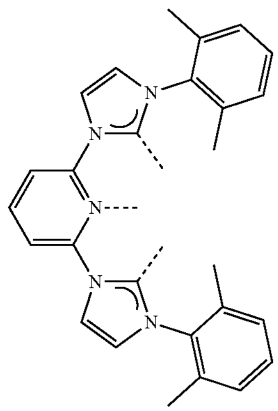
$L_{B5}$
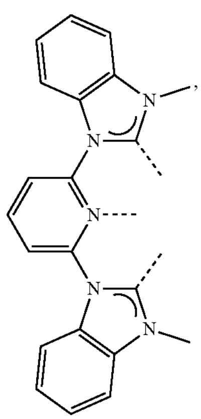
$L_{B6}$
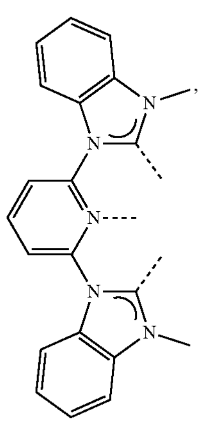
-continued
$L_{B7}$
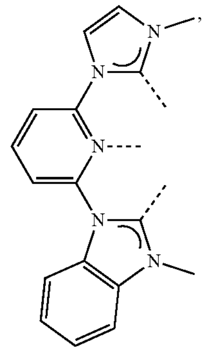
$L_{B8}$
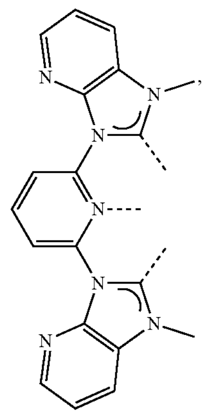
$L_{B9}$
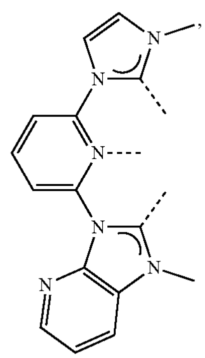
$L_{B10}$
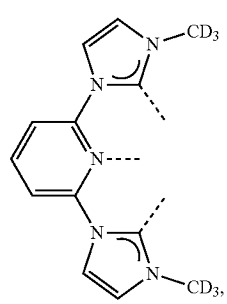

$L_{B11}$
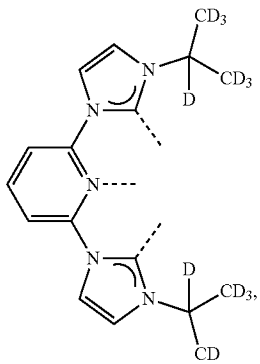
$L_{B12}$
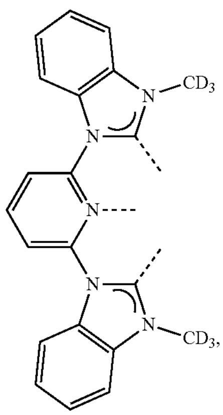
$L_{B13}$
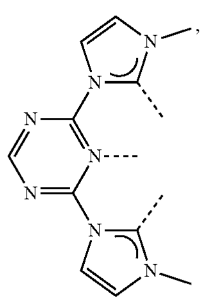
$L_{B14}$
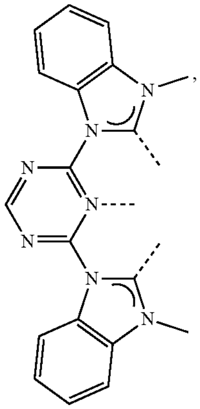
$L_{B15}$
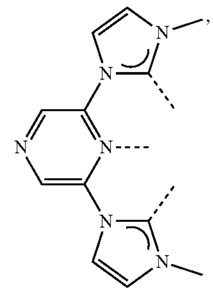
$L_{B16}$
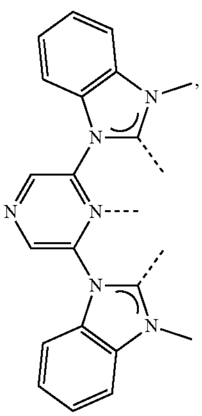
$L_{B17}$
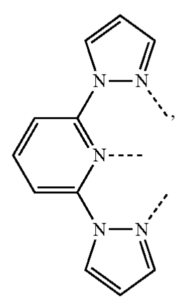
$L_{B18}$
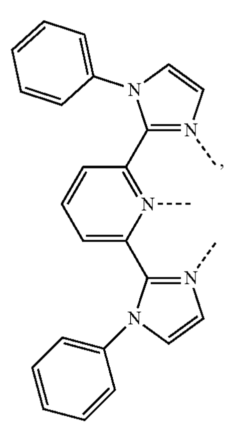

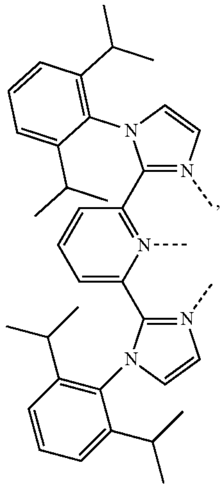
$L_{B19}$
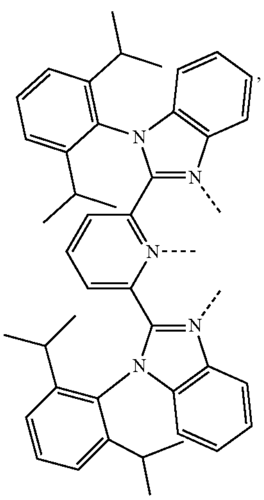
$L_{B20}$
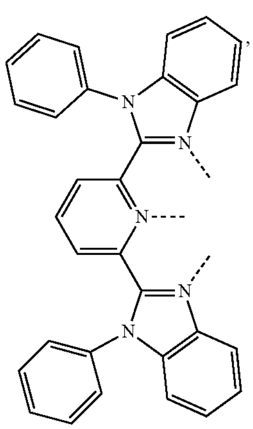
$L_{B21}$
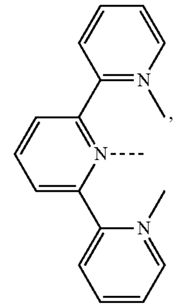
$L_{B22}$
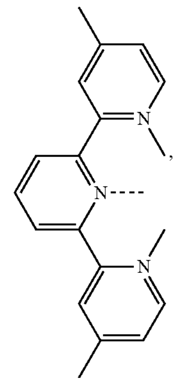
$L_{B23}$
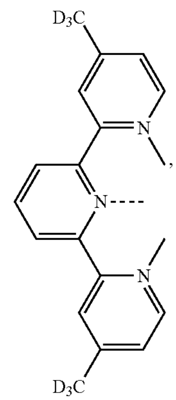
$L_{B24}$
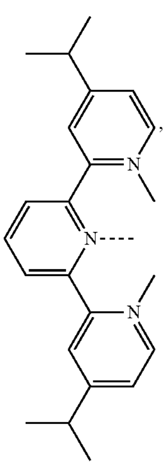
$L_{B25}$ $L_{B26}$
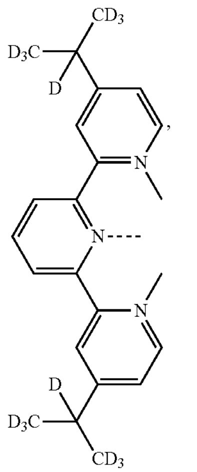
$L_{B27}$
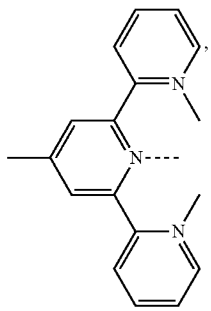
$L_{B28}$
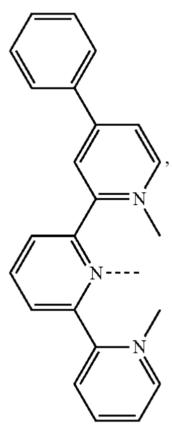
$L_{B29}$
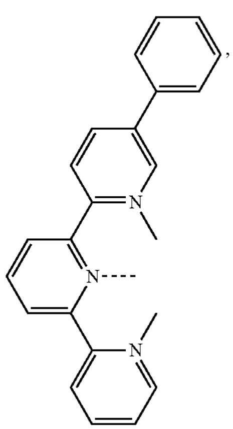
$L_{B30}$
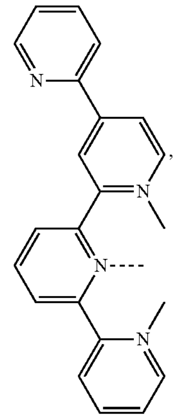
$L_{B31}$
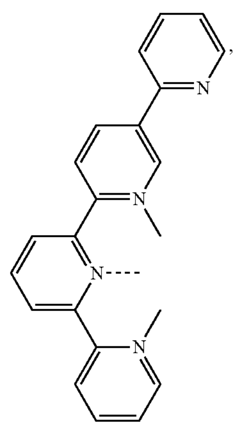
$L_{B32}$
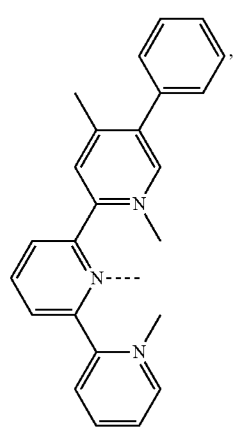

-continued
$L_{B33}$
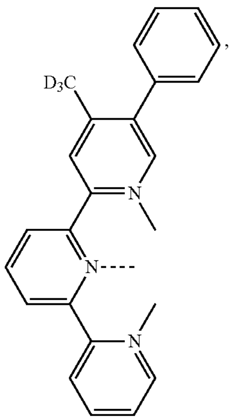
$L_{B34}$
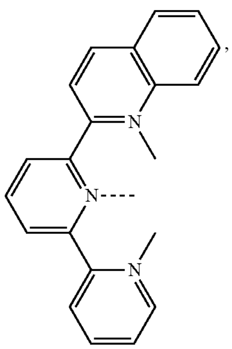
$L_{B35}$
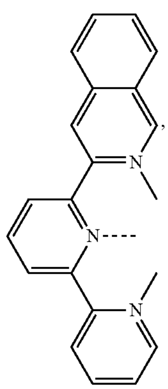
$L_{B36}$
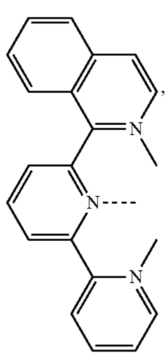
-continued
$L_{B37}$
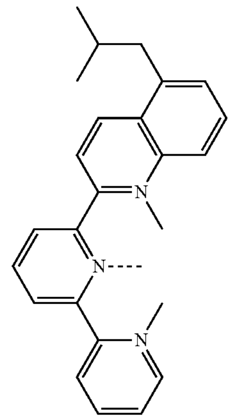
$L_{B38}$
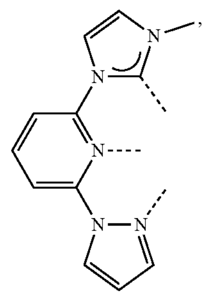
$L_{B39}$
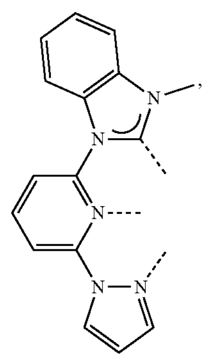
$L_{B40}$
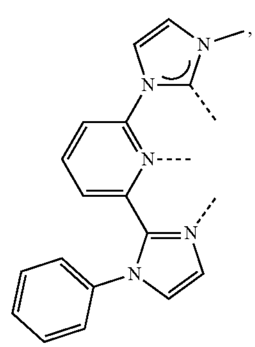

$L_{B41}$
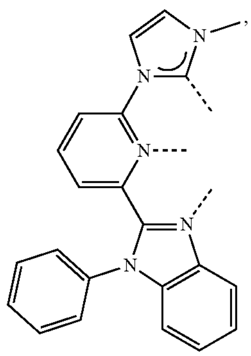
$L_{B42}$
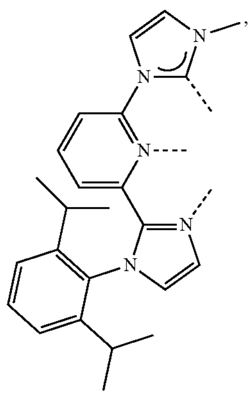
$L_{B43}$
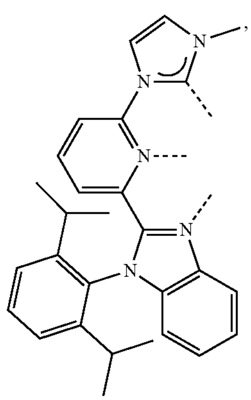
$L_{B44}$
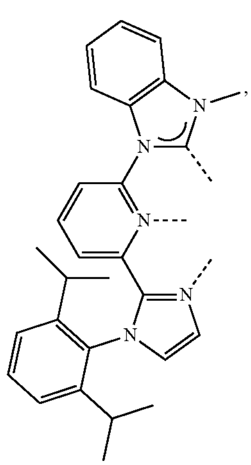
$L_{B45}$
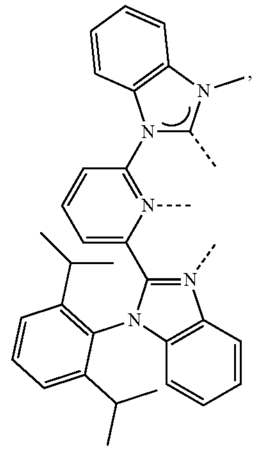
$L_{B46}$
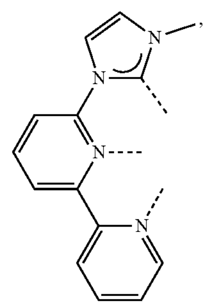
$L_{B47}$
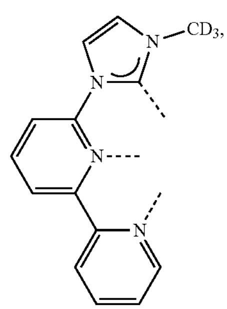
$L_{B48}$
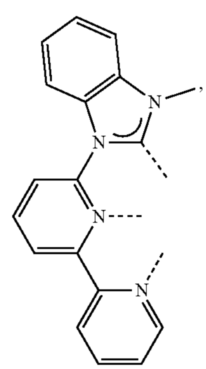

-continued
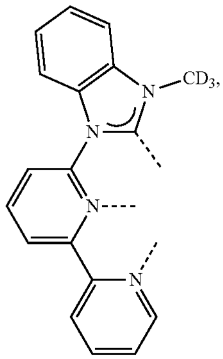
$L_{B49}$
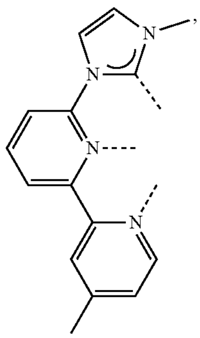
$L_{B50}$
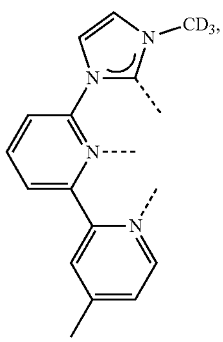
$L_{B51}$
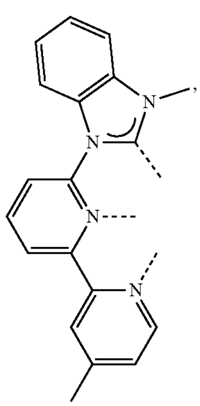
$L_{B52}$
-continued
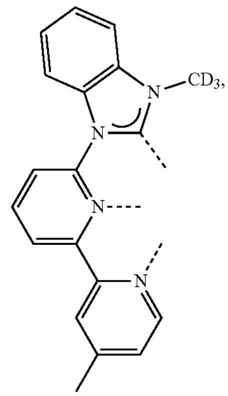
$L_{B53}$
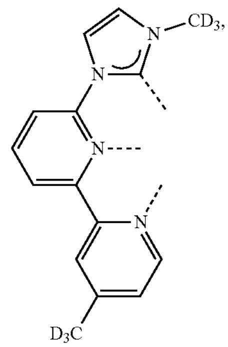
$L_{B54}$
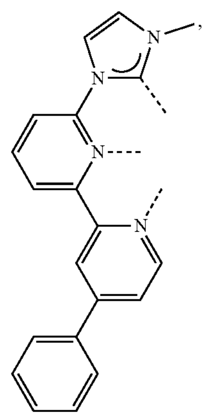
$L_{B55}$
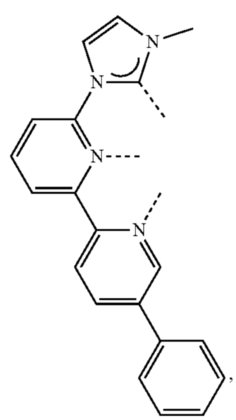
$L_{B56}$ $L_{B57}$
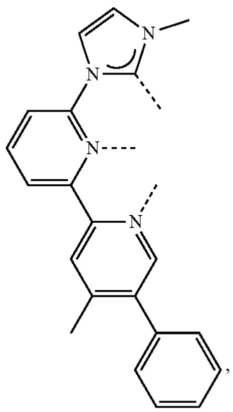
$L_{B58}$
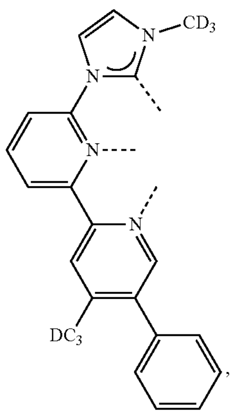
$L_{B59}$
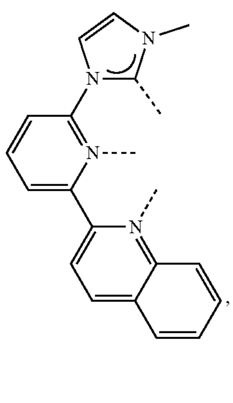
$L_{B60}$
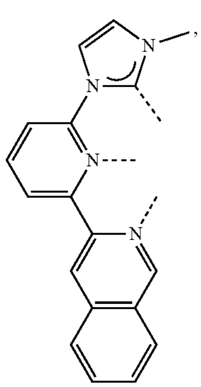
$L_{B61}$
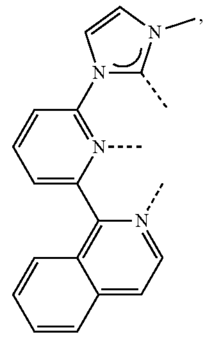
$L_{B62}$
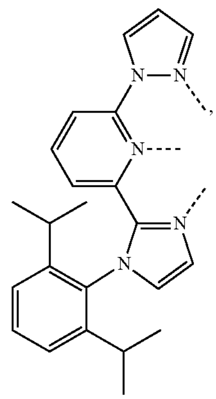
$L_{B63}$
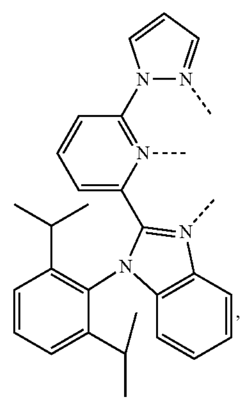
$L_{B64}$
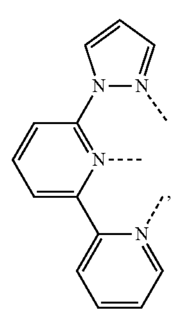

$L_{B65}$
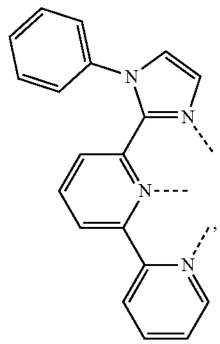
$L_{B66}$
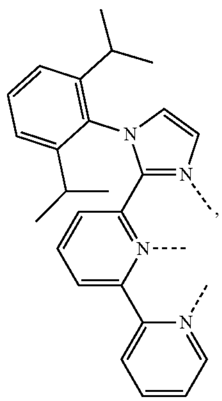
$L_{B67}$
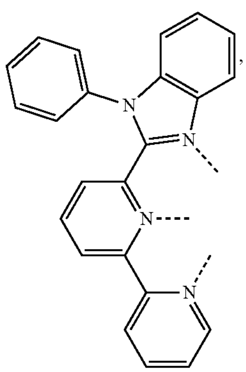
$L_{B68}$
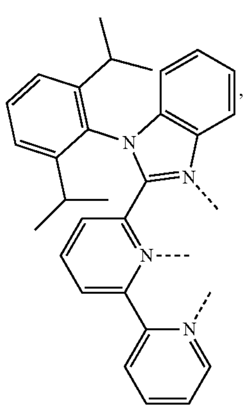
$L_{B69}$
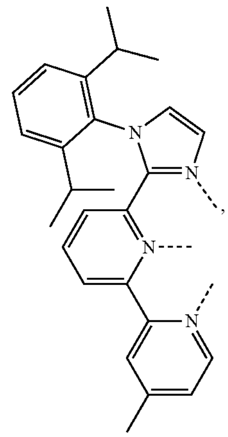
$L_{B70}$
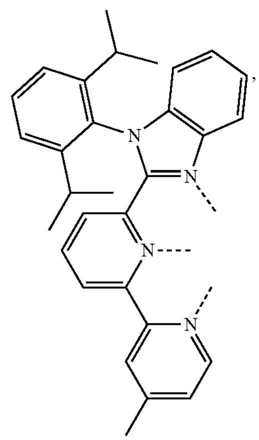
$L_{B71}$
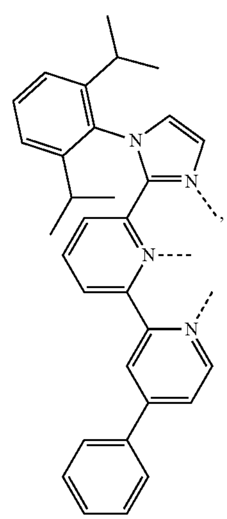

$L_{B72}$
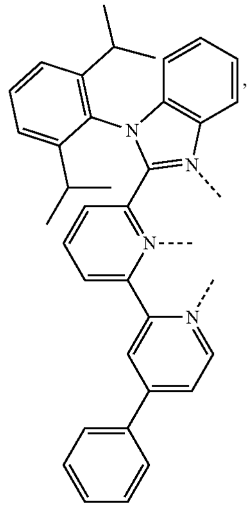
$L_{B73}$
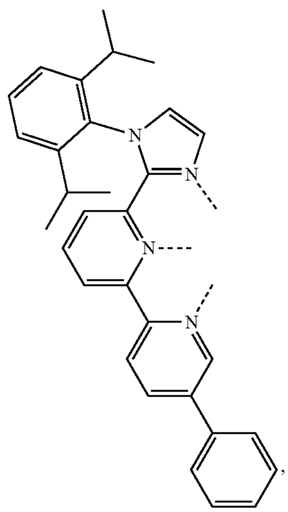
$L_{B74}$
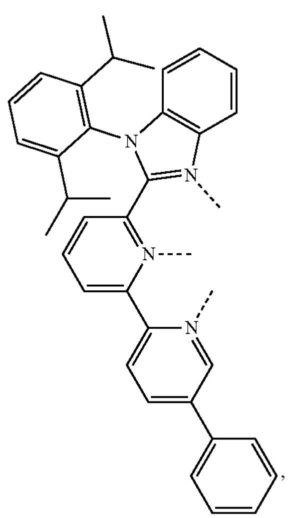
$L_{B75}$
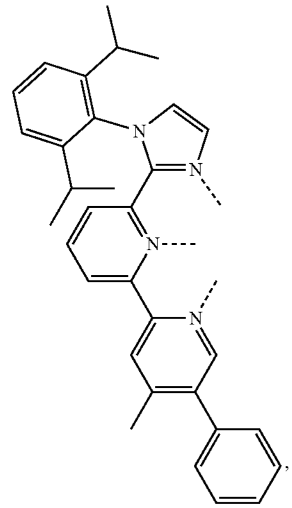
$L_{B76}$
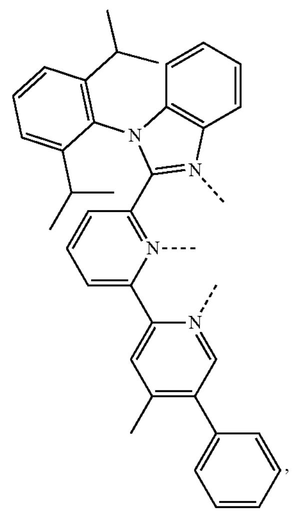
$L_{B77}$
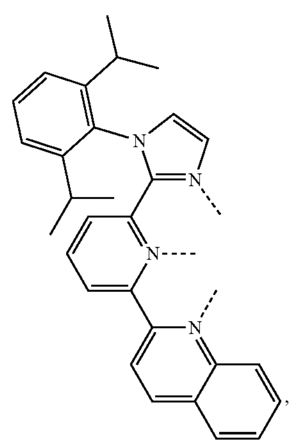

-continued
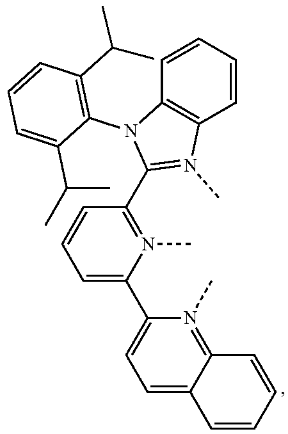
$L_{B78}$
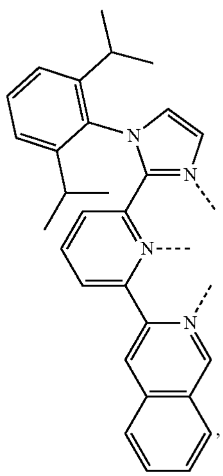
$L_{B79}$
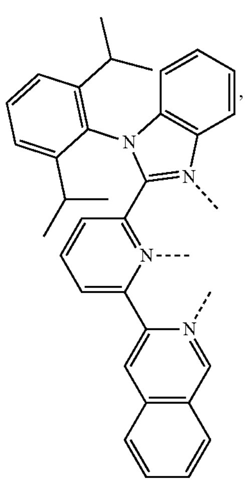
$L_{B80}$
-continued
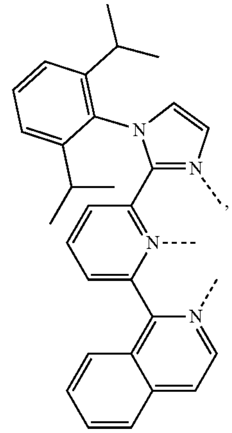
$L_{B81}$
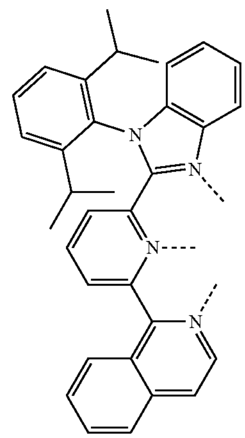
$L_{B82}$
and
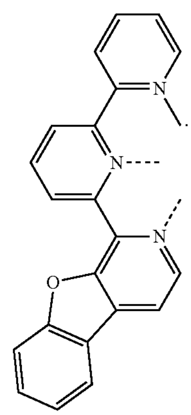
$L_{B86}$
8. The compound of claim 1, wherein the compound is selected from the group consisting of
| Cpd # | $L_A$ | $L_B$ |
|---|---|---|
| 1 | $L_{A1}$ | $L_{B1}$ |
| 2 | $L_{A2}$ | $L_{B1}$ |
| 3 | $L_{A3}$ | $L_{B1}$ |
| 4 | $L_{A4}$ | $L_{B1}$ |
| 5 | $L_{A5}$ | $L_{B1}$ |
| 6 | $L_{A6}$ | $L_{B1}$ |
| 7 | $L_{A7}$ | $L_{B1}$ |
| 8 | $L_{A8}$ | $L_{B1}$ |
| 9 | $L_{A9}$ | $L_{B1}$ |

| Cpd # | $L_A$ | $L_B$ |
|---|---|---|
| 10 | $L_{A10}$ | $L_{B1}$ |
| 11 | $L_{A11}$ | $L_{B1}$ |
| 12 | $L_{A12}$ | $L_{B1}$ |
| 13 | $L_{A13}$ | $L_{B1}$ |
| 14 | $L_{A14}$ | $L_{B1}$ |
| 15 | $L_{A15}$ | $L_{B1}$ |
| 16 | $L_{A16}$ | $L_{B1}$ |
| 17 | $L_{A17}$ | $L_{B1}$ |
| 18 | $L_{A18}$ | $L_{B1}$ |
| 19 | $L_{A19}$ | $L_{B1}$ |
| 20 | $L_{A20}$ | $L_{B1}$ |
| 21 | $L_{A21}$ | $L_{B1}$ |
| 22 | $L_{A22}$ | $L_{B1}$ |
| 23 | $L_{A23}$ | $L_{B1}$ |
| 24 | $L_{A24}$ | $L_{B1}$ |
| 25 | $L_{A25}$ | $L_{B1}$ |
| 26 | $L_{A26}$ | $L_{B1}$ |
| 27 | $L_{A27}$ | $L_{B1}$ |
| 28 | $L_{A28}$ | $L_{B1}$ |
| 29 | $L_{A29}$ | $L_{B1}$ |
| 30 | $L_{A30}$ | $L_{B1}$ |
| 31 | $L_{A31}$ | $L_{B1}$ |
| 32 | $L_{A32}$ | $L_{B1}$ |
| 33 | $L_{A33}$ | $L_{B1}$ |
| 34 | $L_{A34}$ | $L_{B1}$ |
| 35 | $L_{A35}$ | $L_{B1}$ |
| 36 | $L_{A36}$ | $L_{B1}$ |
| 37 | $L_{A37}$ | $L_{B1}$ |
| 38 | $L_{A38}$ | $L_{B1}$ |
| 39 | $L_{A39}$ | $L_{B1}$ |
| 40 | $L_{A40}$ | $L_{B1}$ |
| 41 | $L_{A41}$ | $L_{B1}$ |
| 42 | $L_{A42}$ | $L_{B1}$ |
| 43 | $L_{A43}$ | $L_{B1}$ |
| 44 | $L_{A44}$ | $L_{B1}$ |
| 45 | $L_{A45}$ | $L_{B1}$ |
| 46 | $L_{A46}$ | $L_{B1}$ |
| 47 | $L_{A47}$ | $L_{B1}$ |
| 48 | $L_{A48}$ | $L_{B1}$ |
| 49 | $L_{A49}$ | $L_{B1}$ |
| 50 | $L_{A50}$ | $L_{B1}$ |
| 51 | $L_{A51}$ | $L_{B1}$ |
| 52 | $L_{A52}$ | $L_{B1}$ |
| 53 | $L_{A53}$ | $L_{B1}$ |
| 54 | $L_{A54}$ | $L_{B1}$ |
| 55 | $L_{A55}$ | $L_{B1}$ |
| 56 | $L_{A56}$ | $L_{B1}$ |
| 57 | $L_{A57}$ | $L_{B1}$ |
| 58 | $L_{A58}$ | $L_{B1}$ |
| 59 | $L_{A59}$ | $L_{B1}$ |
| 60 | $L_{A60}$ | $L_{B1}$ |
| 61 | $L_{A61}$ | $L_{B1}$ |
| 62 | $L_{A62}$ | $L_{B1}$ |
| 63 | $L_{A63}$ | $L_{B1}$ |
| 64 | $L_{A64}$ | $L_{B1}$ |
| 65 | $L_{A65}$ | $L_{B1}$ |
| 66 | $L_{A66}$ | $L_{B1}$ |
| 67 | $L_{A67}$ | $L_{B1}$ |
| 68 | $L_{A68}$ | $L_{B1}$ |
| 69 | $L_{A69}$ | $L_{B1}$ |
| 70 | $L_{A70}$ | $L_{B1}$ |
| 71 | $L_{A71}$ | $L_{B1}$ |
| 72 | $L_{A72}$ | $L_{B1}$ |
| 73 | $L_{A73}$ | $L_{B1}$ |
| 74 | $L_{A74}$ | $L_{B1}$ |
| 75 | $L_{A75}$ | $L_{B1}$ |
| 76 | $L_{A76}$ | $L_{B1}$ |
| 77 | $L_{A77}$ | $L_{B1}$ |
| 78 | $L_{A78}$ | $L_{B1}$ |
| 79 | $L_{A79}$ | $L_{B1}$ |
| 80 | $L_{A80}$ | $L_{B1}$ |
| 81 | $L_{A81}$ | $L_{B1}$ |
| 82 | $L_{A82}$ | $L_{B1}$ |
| 83 | $L_{A83}$ | $L_{B1}$ |
| 84 | $L_{A84}$ | $L_{B1}$ |
| 85 | $L_{A85}$ | $L_{B1}$ |
| 86 | $L_{A86}$ | $L_{B1}$ |

| Cpd # | $L_A$ | $L_B$ |
|---|---|---|
| 87 | $L_{A87}$ | $L_{B1}$ |
| 88 | $L_{A88}$ | $L_{B1}$ |
| 89 | $L_{A89}$ | $L_{B1}$ |
| 90 | $L_{A90}$ | $L_{B1}$ |
| 91 | $L_{A91}$ | $L_{B1}$ |
| 92 | $L_{A92}$ | $L_{B1}$ |
| 93 | $L_{A93}$ | $L_{B1}$ |
| 94 | $L_{A94}$ | $L_{B1}$ |
| 95 | $L_{A95}$ | $L_{B1}$ |
| 96 | $L_{A1}$ | $L_{B2}$ |
| 97 | $L_{A2}$ | $L_{B2}$ |
| 98 | $L_{A3}$ | $L_{B2}$ |
| 99 | $L_{A4}$ | $L_{B2}$ |
| 100 | $L_{A5}$ | $L_{B2}$ |
| 101 | $L_{A6}$ | $L_{B2}$ |
| 102 | $L_{A7}$ | $L_{B2}$ |
| 103 | $L_{A8}$ | $L_{B2}$ |
| 104 | $L_{A9}$ | $L_{B2}$ |
| 105 | $L_{A10}$ | $L_{B2}$ |
| 106 | $L_{A11}$ | $L_{B2}$ |
| 107 | $L_{A12}$ | $L_{B2}$ |
| 108 | $L_{A13}$ | $L_{B2}$ |
| 109 | $L_{A14}$ | $L_{B2}$ |
| 110 | $L_{A15}$ | $L_{B2}$ |
| 111 | $L_{A16}$ | $L_{B2}$ |
| 112 | $L_{A17}$ | $L_{B2}$ |
| 113 | $L_{A18}$ | $L_{B2}$ |
| 114 | $L_{A19}$ | $L_{B2}$ |
| 115 | $L_{A20}$ | $L_{B2}$ |
| 116 | $L_{A21}$ | $L_{B2}$ |
| 117 | $L_{A22}$ | $L_{B2}$ |
| 118 | $L_{A23}$ | $L_{B2}$ |
| 119 | $L_{A24}$ | $L_{B2}$ |
| 120 | $L_{A25}$ | $L_{B2}$ |
| 121 | $L_{A26}$ | $L_{B2}$ |
| 122 | $L_{A27}$ | $L_{B2}$ |
| 123 | $L_{A28}$ | $L_{B2}$ |
| 124 | $L_{A29}$ | $L_{B2}$ |
| 125 | $L_{A30}$ | $L_{B2}$ |
| 126 | $L_{A31}$ | $L_{B2}$ |
| 127 | $L_{A32}$ | $L_{B2}$ |
| 128 | $L_{A33}$ | $L_{B2}$ |
| 129 | $L_{A34}$ | $L_{B2}$ |
| 130 | $L_{A35}$ | $L_{B2}$ |
| 131 | $L_{A36}$ | $L_{B2}$ |
| 132 | $L_{A37}$ | $L_{B2}$ |
| 133 | $L_{A38}$ | $L_{B2}$ |
| 134 | $L_{A39}$ | $L_{B2}$ |
| 135 | $L_{A40}$ | $L_{B2}$ |
| 136 | $L_{A41}$ | $L_{B2}$ |
| 137 | $L_{A42}$ | $L_{B2}$ |
| 138 | $L_{A43}$ | $L_{B2}$ |
| 139 | $L_{A44}$ | $L_{B2}$ |
| 140 | $L_{A45}$ | $L_{B2}$ |
| 141 | $L_{A46}$ | $L_{B2}$ |
| 142 | $L_{A47}$ | $L_{B2}$ |
| 143 | $L_{A48}$ | $L_{B2}$ |
| 144 | $L_{A49}$ | $L_{B2}$ |
| 145 | $L_{A50}$ | $L_{B2}$ |
| 146 | $L_{A51}$ | $L_{B2}$ |
| 147 | $L_{A52}$ | $L_{B2}$ |
| 148 | $L_{A53}$ | $L_{B2}$ |
| 149 | $L_{A54}$ | $L_{B2}$ |
| 150 | $L_{A55}$ | $L_{B2}$ |
| 151 | $L_{A56}$ | $L_{B2}$ |
| 152 | $L_{A57}$ | $L_{B2}$ |
| 153 | $L_{A58}$ | $L_{B2}$ |
| 154 | $L_{A59}$ | $L_{B2}$ |
| 155 | $L_{A60}$ | $L_{B2}$ |
| 156 | $L_{A61}$ | $L_{B2}$ |
| 157 | $L_{A62}$ | $L_{B2}$ |
| 158 | $L_{A63}$ | $L_{B2}$ |
| 159 | $L_{A64}$ | $L_{B2}$ |
| 160 | $L_{A65}$ | $L_{B2}$ |
| 161 | $L_{A66}$ | $L_{B2}$ |
| 162 | $L_{A67}$ | $L_{B2}$ |
| 163 | $L_{A68}$ | $L_{B2}$ |

-continued

| Cpd # | $L_A$ | $L_B$ |
|---|---|---|
| 164 | $L_{A69}$ | $L_{B2}$ |
| 165 | $L_{A70}$ | $L_{B2}$ |
| 166 | $L_{A71}$ | $L_{B2}$ |
| 167 | $L_{A72}$ | $L_{B2}$ |
| 168 | $L_{A73}$ | $L_{B2}$ |
| 169 | $L_{A74}$ | $L_{B2}$ |
| 170 | $L_{A75}$ | $L_{B2}$ |
| 171 | $L_{A76}$ | $L_{B2}$ |
| 172 | $L_{A77}$ | $L_{B2}$ |
| 173 | $L_{A78}$ | $L_{B2}$ |
| 174 | $L_{A79}$ | $L_{B2}$ |
| 175 | $L_{A80}$ | $L_{B2}$ |
| 176 | $L_{A81}$ | $L_{B2}$ |
| 177 | $L_{A82}$ | $L_{B2}$ |
| 178 | $L_{A83}$ | $L_{B2}$ |
| 179 | $L_{A84}$ | $L_{B2}$ |
| 180 | $L_{A85}$ | $L_{B2}$ |
| 181 | $L_{A86}$ | $L_{B2}$ |
| 182 | $L_{A87}$ | $L_{B2}$ |
| 183 | $L_{A88}$ | $L_{B2}$ |
| 184 | $L_{A89}$ | $L_{B2}$ |
| 185 | $L_{A90}$ | $L_{B2}$ |
| 186 | $L_{A91}$ | $L_{B2}$ |
| 187 | $L_{A92}$ | $L_{B2}$ |
| 188 | $L_{A93}$ | $L_{B2}$ |
| 189 | $L_{A94}$ | $L_{B2}$ |
| 190 | $L_{A95}$ | $L_{B2}$ |
| 191 | $L_{A1}$ | $L_{B3}$ |
| 192 | $L_{A2}$ | $L_{B3}$ |
| 193 | $L_{A3}$ | $L_{B3}$ |
| 194 | $L_{A4}$ | $L_{B3}$ |
| 195 | $L_{A5}$ | $L_{B3}$ |
| 196 | $L_{A6}$ | $L_{B3}$ |
| 197 | $L_{A7}$ | $L_{B3}$ |
| 198 | $L_{A8}$ | $L_{B3}$ |
| 199 | $L_{A9}$ | $L_{B3}$ |
| 200 | $L_{A10}$ | $L_{B3}$ |
| 201 | $L_{A11}$ | $L_{B3}$ |
| 202 | $L_{A12}$ | $L_{B3}$ |
| 203 | $L_{A13}$ | $L_{B3}$ |
| 204 | $L_{A14}$ | $L_{B3}$ |
| 205 | $L_{A15}$ | $L_{B3}$ |
| 206 | $L_{A16}$ | $L_{B3}$ |
| 207 | $L_{A17}$ | $L_{B3}$ |
| 208 | $L_{A18}$ | $L_{B3}$ |
| 209 | $L_{A19}$ | $L_{B3}$ |
| 210 | $L_{A20}$ | $L_{B3}$ |
| 211 | $L_{A21}$ | $L_{B3}$ |
| 212 | $L_{A22}$ | $L_{B3}$ |
| 213 | $L_{A23}$ | $L_{B3}$ |
| 214 | $L_{A24}$ | $L_{B3}$ |
| 215 | $L_{A25}$ | $L_{B3}$ |
| 216 | $L_{A26}$ | $L_{B3}$ |
| 217 | $L_{A27}$ | $L_{B3}$ |
| 218 | $L_{A28}$ | $L_{B3}$ |
| 219 | $L_{A29}$ | $L_{B3}$ |
| 220 | $L_{A30}$ | $L_{B3}$ |
| 221 | $L_{A31}$ | $L_{B3}$ |
| 222 | $L_{A32}$ | $L_{B3}$ |
| 223 | $L_{A33}$ | $L_{B3}$ |
| 224 | $L_{A34}$ | $L_{B3}$ |
| 225 | $L_{A35}$ | $L_{B3}$ |
| 226 | $L_{A36}$ | $L_{B3}$ |
| 227 | $L_{A37}$ | $L_{B3}$ |
| 228 | $L_{A38}$ | $L_{B3}$ |
| 229 | $L_{A39}$ | $L_{B3}$ |
| 230 | $L_{A40}$ | $L_{B3}$ |
| 231 | $L_{A41}$ | $L_{B3}$ |
| 232 | $L_{A42}$ | $L_{B3}$ |
| 233 | $L_{A43}$ | $L_{B3}$ |
| 234 | $L_{A44}$ | $L_{B3}$ |
| 235 | $L_{A45}$ | $L_{B3}$ |
| 236 | $L_{A46}$ | $L_{B3}$ |
| 237 | $L_{A47}$ | $L_{B3}$ |
| 238 | $L_{A48}$ | $L_{B3}$ |
| 239 | $L_{A49}$ | $L_{B3}$ |
| 240 | $L_{A50}$ | $L_{B3}$ |

-continued

| Cpd # | $L_A$ | $L_B$ |
|---|---|---|
| 241 | $L_{A51}$ | $L_{B3}$ |
| 242 | $L_{A52}$ | $L_{B3}$ |
| 243 | $L_{A53}$ | $L_{B3}$ |
| 244 | $L_{A54}$ | $L_{B3}$ |
| 245 | $L_{A55}$ | $L_{B3}$ |
| 246 | $L_{A56}$ | $L_{B3}$ |
| 247 | $L_{A57}$ | $L_{B3}$ |
| 248 | $L_{A58}$ | $L_{B3}$ |
| 249 | $L_{A59}$ | $L_{B3}$ |
| 250 | $L_{A60}$ | $L_{B3}$ |
| 251 | $L_{A61}$ | $L_{B3}$ |
| 252 | $L_{A62}$ | $L_{B3}$ |
| 253 | $L_{A63}$ | $L_{B3}$ |
| 254 | $L_{A64}$ | $L_{B3}$ |
| 255 | $L_{A65}$ | $L_{B3}$ |
| 256 | $L_{A66}$ | $L_{B3}$ |
| 257 | $L_{A67}$ | $L_{B3}$ |
| 258 | $L_{A68}$ | $L_{B3}$ |
| 259 | $L_{A69}$ | $L_{B3}$ |
| 260 | $L_{A70}$ | $L_{B3}$ |
| 261 | $L_{A71}$ | $L_{B3}$ |
| 262 | $L_{A72}$ | $L_{B3}$ |
| 263 | $L_{A73}$ | $L_{B3}$ |
| 264 | $L_{A74}$ | $L_{B3}$ |
| 265 | $L_{A75}$ | $L_{B3}$ |
| 266 | $L_{A76}$ | $L_{B3}$ |
| 267 | $L_{A77}$ | $L_{B3}$ |
| 268 | $L_{A78}$ | $L_{B3}$ |
| 269 | $L_{A79}$ | $L_{B3}$ |
| 270 | $L_{A80}$ | $L_{B3}$ |
| 271 | $L_{A81}$ | $L_{B3}$ |
| 272 | $L_{A82}$ | $L_{B3}$ |
| 273 | $L_{A83}$ | $L_{B3}$ |
| 274 | $L_{A84}$ | $L_{B3}$ |
| 275 | $L_{A85}$ | $L_{B3}$ |
| 276 | $L_{A86}$ | $L_{B3}$ |
| 277 | $L_{A87}$ | $L_{B3}$ |
| 278 | $L_{A88}$ | $L_{B3}$ |
| 279 | $L_{A89}$ | $L_{B3}$ |
| 280 | $L_{A90}$ | $L_{B3}$ |
| 281 | $L_{A91}$ | $L_{B3}$ |
| 282 | $L_{A92}$ | $L_{B3}$ |
| 283 | $L_{A93}$ | $L_{B3}$ |
| 284 | $L_{A94}$ | $L_{B3}$ |
| 285 | $L_{A95}$ | $L_{B3}$ |
| 286 | $L_{A1}$ | $L_{B4}$ |
| 287 | $L_{A2}$ | $L_{B4}$ |
| 288 | $L_{A3}$ | $L_{B4}$ |
| 289 | $L_{A4}$ | $L_{B4}$ |
| 290 | $L_{A5}$ | $L_{B4}$ |
| 291 | $L_{A6}$ | $L_{B4}$ |
| 292 | $L_{A7}$ | $L_{B4}$ |
| 293 | $L_{A8}$ | $L_{B4}$ |
| 294 | $L_{A9}$ | $L_{B4}$ |
| 295 | $L_{A10}$ | $L_{B4}$ |
| 296 | $L_{A11}$ | $L_{B4}$ |
| 297 | $L_{A12}$ | $L_{B4}$ |
| 298 | $L_{A13}$ | $L_{B4}$ |
| 299 | $L_{A14}$ | $L_{B4}$ |
| 300 | $L_{A15}$ | $L_{B4}$ |
| 301 | $L_{A16}$ | $L_{B4}$ |
| 302 | $L_{A17}$ | $L_{B4}$ |
| 303 | $L_{A18}$ | $L_{B4}$ |
| 304 | $L_{A19}$ | $L_{B4}$ |
| 305 | $L_{A20}$ | $L_{B4}$ |
| 306 | $L_{A21}$ | $L_{B4}$ |
| 307 | $L_{A22}$ | $L_{B4}$ |
| 308 | $L_{A23}$ | $L_{B4}$ |
| 309 | $L_{A24}$ | $L_{B4}$ |
| 310 | $L_{A25}$ | $L_{B4}$ |
| 311 | $L_{A26}$ | $L_{B4}$ |
| 312 | $L_{A27}$ | $L_{B4}$ |
| 313 | $L_{A28}$ | $L_{B4}$ |
| 314 | $L_{A29}$ | $L_{B4}$ |
| 315 | $L_{A30}$ | $L_{B4}$ |
| 316 | $L_{A31}$ | $L_{B4}$ |
| 317 | $L_{A32}$ | $L_{B4}$ |

-continued

| Cpd # | $L_A$ | $L_B$ |
|---|---|---|
| 318 | $L_{A33}$ | $L_{B4}$ |
| 319 | $L_{A34}$ | $L_{B4}$ |
| 320 | $L_{A35}$ | $L_{B4}$ |
| 321 | $L_{A36}$ | $L_{B4}$ |
| 322 | $L_{A37}$ | $L_{B4}$ |
| 323 | $L_{A38}$ | $L_{B4}$ |
| 324 | $L_{A39}$ | $L_{B4}$ |
| 325 | $L_{A40}$ | $L_{B4}$ |
| 326 | $L_{A41}$ | $L_{B4}$ |
| 327 | $L_{A42}$ | $L_{B4}$ |
| 328 | $L_{A43}$ | $L_{B4}$ |
| 329 | $L_{A44}$ | $L_{B4}$ |
| 330 | $L_{A45}$ | $L_{B4}$ |
| 331 | $L_{A46}$ | $L_{B4}$ |
| 332 | $L_{A47}$ | $L_{B4}$ |
| 333 | $L_{A48}$ | $L_{B4}$ |
| 334 | $L_{A49}$ | $L_{B4}$ |
| 335 | $L_{A50}$ | $L_{B4}$ |
| 336 | $L_{A51}$ | $L_{B4}$ |
| 337 | $L_{A52}$ | $L_{B4}$ |
| 338 | $L_{A53}$ | $L_{B4}$ |
| 339 | $L_{A54}$ | $L_{B4}$ |
| 340 | $L_{A55}$ | $L_{B4}$ |
| 341 | $L_{A56}$ | $L_{B4}$ |
| 342 | $L_{A57}$ | $L_{B4}$ |
| 343 | $L_{A58}$ | $L_{B4}$ |
| 344 | $L_{A59}$ | $L_{B4}$ |
| 345 | $L_{A60}$ | $L_{B4}$ |
| 346 | $L_{A61}$ | $L_{B4}$ |
| 347 | $L_{A62}$ | $L_{B4}$ |
| 348 | $L_{A63}$ | $L_{B4}$ |
| 349 | $L_{A64}$ | $L_{B4}$ |
| 350 | $L_{A65}$ | $L_{B4}$ |
| 351 | $L_{A66}$ | $L_{B4}$ |
| 352 | $L_{A67}$ | $L_{B4}$ |
| 353 | $L_{A68}$ | $L_{B4}$ |
| 354 | $L_{A69}$ | $L_{B4}$ |
| 355 | $L_{A70}$ | $L_{B4}$ |
| 356 | $L_{A71}$ | $L_{B4}$ |
| 357 | $L_{A72}$ | $L_{B4}$ |
| 358 | $L_{A73}$ | $L_{B4}$ |
| 359 | $L_{A74}$ | $L_{B4}$ |
| 360 | $L_{A75}$ | $L_{B4}$ |
| 361 | $L_{A76}$ | $L_{B4}$ |
| 362 | $L_{A77}$ | $L_{B4}$ |
| 363 | $L_{A78}$ | $L_{B4}$ |
| 364 | $L_{A79}$ | $L_{B4}$ |
| 365 | $L_{A80}$ | $L_{B4}$ |
| 366 | $L_{A81}$ | $L_{B4}$ |
| 367 | $L_{A82}$ | $L_{B4}$ |
| 368 | $L_{A83}$ | $L_{B4}$ |
| 369 | $L_{A84}$ | $L_{B4}$ |
| 370 | $L_{A85}$ | $L_{B4}$ |
| 371 | $L_{A86}$ | $L_{B4}$ |
| 372 | $L_{A87}$ | $L_{B4}$ |
| 373 | $L_{A88}$ | $L_{B4}$ |
| 374 | $L_{A89}$ | $L_{B4}$ |
| 375 | $L_{A90}$ | $L_{B4}$ |
| 376 | $L_{A91}$ | $L_{B4}$ |
| 377 | $L_{A92}$ | $L_{B4}$ |
| 378 | $L_{A93}$ | $L_{B4}$ |
| 379 | $L_{A94}$ | $L_{B4}$ |
| 380 | $L_{A95}$ | $L_{B4}$ |
| 381 | $L_{A1}$ | $L_{B5}$ |
| 382 | $L_{A2}$ | $L_{B5}$ |
| 383 | $L_{A3}$ | $L_{B5}$ |
| 384 | $L_{A4}$ | $L_{B5}$ |
| 385 | $L_{A5}$ | $L_{B5}$ |
| 386 | $L_{A6}$ | $L_{B5}$ |
| 387 | $L_{A7}$ | $L_{B5}$ |
| 388 | $L_{A8}$ | $L_{B5}$ |
| 389 | $L_{A9}$ | $L_{B5}$ |
| 390 | $L_{A10}$ | $L_{B5}$ |
| 391 | $L_{A11}$ | $L_{B5}$ |
| 392 | $L_{A12}$ | $L_{B5}$ |
| 393 | $L_{A13}$ | $L_{B5}$ |
| 394 | $L_{A14}$ | $L_{B5}$ |

-continued

| Cpd # | $L_A$ | $L_B$ |
|---|---|---|
| 395 | $L_{A15}$ | $L_{B5}$ |
| 396 | $L_{A16}$ | $L_{B5}$ |
| 397 | $L_{A17}$ | $L_{B5}$ |
| 398 | $L_{A18}$ | $L_{B5}$ |
| 399 | $L_{A19}$ | $L_{B5}$ |
| 400 | $L_{A20}$ | $L_{B5}$ |
| 401 | $L_{A21}$ | $L_{B5}$ |
| 402 | $L_{A22}$ | $L_{B5}$ |
| 403 | $L_{A23}$ | $L_{B5}$ |
| 404 | $L_{A24}$ | $L_{B5}$ |
| 405 | $L_{A25}$ | $L_{B5}$ |
| 406 | $L_{A26}$ | $L_{B5}$ |
| 407 | $L_{A27}$ | $L_{B5}$ |
| 408 | $L_{A28}$ | $L_{B5}$ |
| 409 | $L_{A29}$ | $L_{B5}$ |
| 410 | $L_{A30}$ | $L_{B5}$ |
| 411 | $L_{A31}$ | $L_{B5}$ |
| 412 | $L_{A32}$ | $L_{B5}$ |
| 413 | $L_{A33}$ | $L_{B5}$ |
| 414 | $L_{A34}$ | $L_{B5}$ |
| 415 | $L_{A35}$ | $L_{B5}$ |
| 416 | $L_{A36}$ | $L_{B5}$ |
| 417 | $L_{A37}$ | $L_{B5}$ |
| 418 | $L_{A38}$ | $L_{B5}$ |
| 419 | $L_{A39}$ | $L_{B5}$ |
| 420 | $L_{A40}$ | $L_{B5}$ |
| 421 | $L_{A41}$ | $L_{B5}$ |
| 422 | $L_{A42}$ | $L_{B5}$ |
| 423 | $L_{A43}$ | $L_{B5}$ |
| 424 | $L_{A44}$ | $L_{B5}$ |
| 425 | $L_{A45}$ | $L_{B5}$ |
| 426 | $L_{A46}$ | $L_{B5}$ |
| 427 | $L_{A47}$ | $L_{B5}$ |
| 428 | $L_{A48}$ | $L_{B5}$ |
| 429 | $L_{A49}$ | $L_{B5}$ |
| 430 | $L_{A50}$ | $L_{B5}$ |
| 431 | $L_{A51}$ | $L_{B5}$ |
| 432 | $L_{A52}$ | $L_{B5}$ |
| 433 | $L_{A53}$ | $L_{B5}$ |
| 434 | $L_{A54}$ | $L_{B5}$ |
| 435 | $L_{A55}$ | $L_{B5}$ |
| 436 | $L_{A56}$ | $L_{B5}$ |
| 437 | $L_{A57}$ | $L_{B5}$ |
| 438 | $L_{A58}$ | $L_{B5}$ |
| 439 | $L_{A59}$ | $L_{B5}$ |
| 440 | $L_{A60}$ | $L_{B5}$ |
| 441 | $L_{A61}$ | $L_{B5}$ |
| 442 | $L_{A62}$ | $L_{B5}$ |
| 443 | $L_{A63}$ | $L_{B5}$ |
| 444 | $L_{A64}$ | $L_{B5}$ |
| 445 | $L_{A65}$ | $L_{B5}$ |
| 446 | $L_{A66}$ | $L_{B5}$ |
| 447 | $L_{A67}$ | $L_{B5}$ |
| 448 | $L_{A68}$ | $L_{B5}$ |
| 449 | $L_{A69}$ | $L_{B5}$ |
| 450 | $L_{A70}$ | $L_{B5}$ |
| 451 | $L_{A71}$ | $L_{B5}$ |
| 452 | $L_{A72}$ | $L_{B5}$ |
| 453 | $L_{A73}$ | $L_{B5}$ |
| 454 | $L_{A74}$ | $L_{B5}$ |
| 455 | $L_{A75}$ | $L_{B5}$ |
| 456 | $L_{A76}$ | $L_{B5}$ |
| 457 | $L_{A77}$ | $L_{B5}$ |
| 458 | $L_{A78}$ | $L_{B5}$ |
| 459 | $L_{A79}$ | $L_{B5}$ |
| 460 | $L_{A80}$ | $L_{B5}$ |
| 461 | $L_{A81}$ | $L_{B5}$ |
| 462 | $L_{A82}$ | $L_{B5}$ |
| 463 | $L_{A83}$ | $L_{B5}$ |
| 464 | $L_{A84}$ | $L_{B5}$ |
| 465 | $L_{A85}$ | $L_{B5}$ |
| 466 | $L_{A86}$ | $L_{B5}$ |
| 467 | $L_{A87}$ | $L_{B5}$ |
| 468 | $L_{A88}$ | $L_{B5}$ |
| 469 | $L_{A89}$ | $L_{B5}$ |
| 470 | $L_{A90}$ | $L_{B5}$ |
| 471 | $L_{A91}$ | $L_{B5}$ |

-continued

| Cpd # | $L_A$ | $L_B$ |
|---|---|---|
| 472 | $L_{A92}$ | $L_{B5}$ |
| 473 | $L_{A93}$ | $L_{B5}$ |
| 474 | $L_{A94}$ | $L_{B5}$ |
| 475 | $L_{A95}$ | $L_{B5}$ |
| 476 | $L_{A1}$ | $L_{B6}$ |
| 477 | $L_{A2}$ | $L_{B6}$ |
| 478 | $L_{A3}$ | $L_{B6}$ |
| 479 | $L_{A4}$ | $L_{B6}$ |
| 480 | $L_{A5}$ | $L_{B6}$ |
| 481 | $L_{A6}$ | $L_{B6}$ |
| 482 | $L_{A7}$ | $L_{B6}$ |
| 483 | $L_{A8}$ | $L_{B6}$ |
| 484 | $L_{A9}$ | $L_{B6}$ |
| 485 | $L_{A10}$ | $L_{B6}$ |
| 486 | $L_{A11}$ | $L_{B6}$ |
| 487 | $L_{A12}$ | $L_{B6}$ |
| 488 | $L_{A13}$ | $L_{B6}$ |
| 489 | $L_{A14}$ | $L_{B6}$ |
| 490 | $L_{A15}$ | $L_{B6}$ |
| 491 | $L_{A16}$ | $L_{B6}$ |
| 492 | $L_{A17}$ | $L_{B6}$ |
| 493 | $L_{A18}$ | $L_{B6}$ |
| 494 | $L_{A19}$ | $L_{B6}$ |
| 495 | $L_{A20}$ | $L_{B6}$ |
| 496 | $L_{A21}$ | $L_{B6}$ |
| 497 | $L_{A22}$ | $L_{B6}$ |
| 498 | $L_{A23}$ | $L_{B6}$ |
| 499 | $L_{A24}$ | $L_{B6}$ |
| 500 | $L_{A25}$ | $L_{B6}$ |
| 501 | $L_{A26}$ | $L_{B6}$ |
| 502 | $L_{A27}$ | $L_{B6}$ |
| 503 | $L_{A28}$ | $L_{B6}$ |
| 504 | $L_{A29}$ | $L_{B6}$ |
| 505 | $L_{A30}$ | $L_{B6}$ |
| 506 | $L_{A31}$ | $L_{B6}$ |
| 507 | $L_{A32}$ | $L_{B6}$ |
| 508 | $L_{A33}$ | $L_{B6}$ |
| 509 | $L_{A34}$ | $L_{B6}$ |
| 510 | $L_{A35}$ | $L_{B6}$ |
| 511 | $L_{A36}$ | $L_{B6}$ |
| 512 | $L_{A37}$ | $L_{B6}$ |
| 513 | $L_{A38}$ | $L_{B6}$ |
| 514 | $L_{A39}$ | $L_{B6}$ |
| 515 | $L_{A40}$ | $L_{B6}$ |
| 516 | $L_{A41}$ | $L_{B6}$ |
| 517 | $L_{A42}$ | $L_{B6}$ |
| 518 | $L_{A43}$ | $L_{B6}$ |
| 519 | $L_{A44}$ | $L_{B6}$ |
| 520 | $L_{A45}$ | $L_{B6}$ |
| 521 | $L_{A46}$ | $L_{B6}$ |
| 522 | $L_{A47}$ | $L_{B6}$ |
| 523 | $L_{A48}$ | $L_{B6}$ |
| 524 | $L_{A49}$ | $L_{B6}$ |
| 525 | $L_{A50}$ | $L_{B6}$ |
| 526 | $L_{A51}$ | $L_{B6}$ |
| 527 | $L_{A52}$ | $L_{B6}$ |
| 528 | $L_{A53}$ | $L_{B6}$ |
| 529 | $L_{A54}$ | $L_{B6}$ |
| 530 | $L_{A55}$ | $L_{B6}$ |
| 531 | $L_{A56}$ | $L_{B6}$ |
| 532 | $L_{A57}$ | $L_{B6}$ |
| 533 | $L_{A58}$ | $L_{B6}$ |
| 534 | $L_{A59}$ | $L_{B6}$ |
| 535 | $L_{A60}$ | $L_{B6}$ |
| 536 | $L_{A61}$ | $L_{B6}$ |
| 537 | $L_{A62}$ | $L_{B6}$ |
| 538 | $L_{A63}$ | $L_{B6}$ |
| 539 | $L_{A64}$ | $L_{B6}$ |
| 540 | $L_{A65}$ | $L_{B6}$ |
| 541 | $L_{A66}$ | $L_{B6}$ |
| 542 | $L_{A67}$ | $L_{B6}$ |
| 543 | $L_{A68}$ | $L_{B6}$ |
| 544 | $L_{A69}$ | $L_{B6}$ |
| 545 | $L_{A70}$ | $L_{B6}$ |
| 546 | $L_{A71}$ | $L_{B6}$ |
| 547 | $L_{A72}$ | $L_{B6}$ |
| 548 | $L_{A73}$ | $L_{B6}$ |

-continued

| Cpd # | $L_A$ | $L_B$ |
|---|---|---|
| 549 | $L_{A74}$ | $L_{B6}$ |
| 550 | $L_{A75}$ | $L_{B6}$ |
| 551 | $L_{A76}$ | $L_{B6}$ |
| 552 | $L_{A77}$ | $L_{B6}$ |
| 553 | $L_{A78}$ | $L_{B6}$ |
| 554 | $L_{A79}$ | $L_{B6}$ |
| 555 | $L_{A80}$ | $L_{B6}$ |
| 556 | $L_{A81}$ | $L_{B6}$ |
| 557 | $L_{A82}$ | $L_{B6}$ |
| 558 | $L_{A83}$ | $L_{B6}$ |
| 559 | $L_{A84}$ | $L_{B6}$ |
| 560 | $L_{A85}$ | $L_{B6}$ |
| 561 | $L_{A86}$ | $L_{B6}$ |
| 562 | $L_{A87}$ | $L_{B6}$ |
| 563 | $L_{A88}$ | $L_{B6}$ |
| 564 | $L_{A89}$ | $L_{B6}$ |
| 565 | $L_{A90}$ | $L_{B6}$ |
| 566 | $L_{A91}$ | $L_{B6}$ |
| 567 | $L_{A92}$ | $L_{B6}$ |
| 568 | $L_{A93}$ | $L_{B6}$ |
| 569 | $L_{A94}$ | $L_{B6}$ |
| 570 | $L_{A95}$ | $L_{B6}$ |
| 571 | $L_{A1}$ | $L_{B7}$ |
| 572 | $L_{A2}$ | $L_{B7}$ |
| 573 | $L_{A3}$ | $L_{B7}$ |
| 574 | $L_{A4}$ | $L_{B7}$ |
| 575 | $L_{A5}$ | $L_{B7}$ |
| 576 | $L_{A6}$ | $L_{B7}$ |
| 577 | $L_{A7}$ | $L_{B7}$ |
| 578 | $L_{A8}$ | $L_{B7}$ |
| 579 | $L_{A9}$ | $L_{B7}$ |
| 580 | $L_{A10}$ | $L_{B7}$ |
| 581 | $L_{A11}$ | $L_{B7}$ |
| 582 | $L_{A12}$ | $L_{B7}$ |
| 583 | $L_{A13}$ | $L_{B7}$ |
| 584 | $L_{A14}$ | $L_{B7}$ |
| 585 | $L_{A15}$ | $L_{B7}$ |
| 586 | $L_{A16}$ | $L_{B7}$ |
| 587 | $L_{A17}$ | $L_{B7}$ |
| 588 | $L_{A18}$ | $L_{B7}$ |
| 589 | $L_{A19}$ | $L_{B7}$ |
| 590 | $L_{A20}$ | $L_{B7}$ |
| 591 | $L_{A21}$ | $L_{B7}$ |
| 592 | $L_{A22}$ | $L_{B7}$ |
| 593 | $L_{A23}$ | $L_{B7}$ |
| 594 | $L_{A24}$ | $L_{B7}$ |
| 595 | $L_{A25}$ | $L_{B7}$ |
| 596 | $L_{A26}$ | $L_{B7}$ |
| 597 | $L_{A27}$ | $L_{B7}$ |
| 598 | $L_{A28}$ | $L_{B7}$ |
| 599 | $L_{A29}$ | $L_{B7}$ |
| 600 | $L_{A30}$ | $L_{B7}$ |
| 601 | $L_{A31}$ | $L_{B7}$ |
| 602 | $L_{A32}$ | $L_{B7}$ |
| 603 | $L_{A33}$ | $L_{B7}$ |
| 604 | $L_{A34}$ | $L_{B7}$ |
| 605 | $L_{A35}$ | $L_{B7}$ |
| 606 | $L_{A36}$ | $L_{B7}$ |
| 607 | $L_{A37}$ | $L_{B7}$ |
| 608 | $L_{A38}$ | $L_{B7}$ |
| 609 | $L_{A39}$ | $L_{B7}$ |
| 610 | $L_{A40}$ | $L_{B7}$ |
| 611 | $L_{A41}$ | $L_{B7}$ |
| 612 | $L_{A42}$ | $L_{B7}$ |
| 613 | $L_{A43}$ | $L_{B7}$ |
| 614 | $L_{A44}$ | $L_{B7}$ |
| 615 | $L_{A45}$ | $L_{B7}$ |
| 616 | $L_{A46}$ | $L_{B7}$ |
| 617 | $L_{A47}$ | $L_{B7}$ |
| 618 | $L_{A48}$ | $L_{B7}$ |
| 619 | $L_{A49}$ | $L_{B7}$ |
| 620 | $L_{A50}$ | $L_{B7}$ |
| 621 | $L_{A51}$ | $L_{B7}$ |
| 622 | $L_{A52}$ | $L_{B7}$ |
| 623 | $L_{A53}$ | $L_{B7}$ |
| 624 | $L_{A54}$ | $L_{B7}$ |
| 625 | $L_{A55}$ | $L_{B7}$ |

-continued

| Cpd # | $L_A$ | $L_B$ |
|---|---|---|
| 626 | $L_{A56}$ | $L_{B7}$ |
| 627 | $L_{A57}$ | $L_{B7}$ |
| 628 | $L_{A58}$ | $L_{B7}$ |
| 629 | $L_{A59}$ | $L_{B7}$ |
| 630 | $L_{A60}$ | $L_{B7}$ |
| 631 | $L_{A61}$ | $L_{B7}$ |
| 632 | $L_{A62}$ | $L_{B7}$ |
| 633 | $L_{A63}$ | $L_{B7}$ |
| 634 | $L_{A64}$ | $L_{B7}$ |
| 635 | $L_{A65}$ | $L_{B7}$ |
| 636 | $L_{A66}$ | $L_{B7}$ |
| 637 | $L_{A67}$ | $L_{B7}$ |
| 638 | $L_{A68}$ | $L_{B7}$ |
| 639 | $L_{A69}$ | $L_{B7}$ |
| 640 | $L_{A70}$ | $L_{B7}$ |
| 641 | $L_{A71}$ | $L_{B7}$ |
| 642 | $L_{A72}$ | $L_{B7}$ |
| 643 | $L_{A73}$ | $L_{B7}$ |
| 644 | $L_{A74}$ | $L_{B7}$ |
| 645 | $L_{A75}$ | $L_{B7}$ |
| 646 | $L_{A76}$ | $L_{B7}$ |
| 647 | $L_{A77}$ | $L_{B7}$ |
| 648 | $L_{A78}$ | $L_{B7}$ |
| 649 | $L_{A79}$ | $L_{B7}$ |
| 650 | $L_{A80}$ | $L_{B7}$ |
| 651 | $L_{A81}$ | $L_{B7}$ |
| 652 | $L_{A82}$ | $L_{B7}$ |
| 653 | $L_{A83}$ | $L_{B7}$ |
| 654 | $L_{A84}$ | $L_{B7}$ |
| 655 | $L_{A85}$ | $L_{B7}$ |
| 656 | $L_{A86}$ | $L_{B7}$ |
| 657 | $L_{A87}$ | $L_{B7}$ |
| 658 | $L_{A88}$ | $L_{B7}$ |
| 659 | $L_{A89}$ | $L_{B7}$ |
| 660 | $L_{A90}$ | $L_{B7}$ |
| 661 | $L_{A91}$ | $L_{B7}$ |
| 662 | $L_{A92}$ | $L_{B7}$ |
| 663 | $L_{A93}$ | $L_{B7}$ |
| 664 | $L_{A94}$ | $L_{B7}$ |
| 665 | $L_{A95}$ | $L_{B7}$ |
| 666 | $L_{A1}$ | $L_{B8}$ |
| 667 | $L_{A2}$ | $L_{B8}$ |
| 668 | $L_{A3}$ | $L_{B8}$ |
| 669 | $L_{A4}$ | $L_{B8}$ |
| 670 | $L_{A5}$ | $L_{B8}$ |
| 671 | $L_{A6}$ | $L_{B8}$ |
| 672 | $L_{A7}$ | $L_{B8}$ |
| 673 | $L_{A8}$ | $L_{B8}$ |
| 674 | $L_{A9}$ | $L_{B8}$ |
| 675 | $L_{A10}$ | $L_{B8}$ |
| 676 | $L_{A11}$ | $L_{B8}$ |
| 677 | $L_{A12}$ | $L_{B8}$ |
| 678 | $L_{A13}$ | $L_{B8}$ |
| 679 | $L_{A14}$ | $L_{B8}$ |
| 680 | $L_{A15}$ | $L_{B8}$ |
| 681 | $L_{A16}$ | $L_{B8}$ |
| 682 | $L_{A17}$ | $L_{B8}$ |
| 683 | $L_{A18}$ | $L_{B8}$ |
| 684 | $L_{A19}$ | $L_{B8}$ |
| 685 | $L_{A20}$ | $L_{B8}$ |
| 686 | $L_{A21}$ | $L_{B8}$ |
| 687 | $L_{A22}$ | $L_{B8}$ |
| 688 | $L_{A23}$ | $L_{B8}$ |
| 689 | $L_{A24}$ | $L_{B8}$ |
| 690 | $L_{A25}$ | $L_{B8}$ |
| 691 | $L_{A26}$ | $L_{B8}$ |
| 692 | $L_{A27}$ | $L_{B8}$ |
| 693 | $L_{A28}$ | $L_{B8}$ |
| 694 | $L_{A29}$ | $L_{B8}$ |
| 695 | $L_{A30}$ | $L_{B8}$ |
| 696 | $L_{A31}$ | $L_{B8}$ |
| 697 | $L_{A32}$ | $L_{B8}$ |
| 698 | $L_{A33}$ | $L_{B8}$ |
| 699 | $L_{A34}$ | $L_{B8}$ |
| 700 | $L_{A35}$ | $L_{B8}$ |
| 701 | $L_{A36}$ | $L_{B8}$ |
| 702 | $L_{A37}$ | $L_{B8}$ |

-continued

| Cpd # | $L_A$ | $L_B$ |
|---|---|---|
| 703 | $L_{A38}$ | $L_{B8}$ |
| 704 | $L_{A39}$ | $L_{B8}$ |
| 705 | $L_{A40}$ | $L_{B8}$ |
| 706 | $L_{A41}$ | $L_{B8}$ |
| 707 | $L_{A42}$ | $L_{B8}$ |
| 708 | $L_{A43}$ | $L_{B8}$ |
| 709 | $L_{A44}$ | $L_{B8}$ |
| 710 | $L_{A45}$ | $L_{B8}$ |
| 711 | $L_{A46}$ | $L_{B8}$ |
| 712 | $L_{A47}$ | $L_{B8}$ |
| 713 | $L_{A48}$ | $L_{B8}$ |
| 714 | $L_{A49}$ | $L_{B8}$ |
| 715 | $L_{A50}$ | $L_{B8}$ |
| 716 | $L_{A51}$ | $L_{B8}$ |
| 717 | $L_{A52}$ | $L_{B8}$ |
| 718 | $L_{A53}$ | $L_{B8}$ |
| 719 | $L_{A54}$ | $L_{B8}$ |
| 720 | $L_{A55}$ | $L_{B8}$ |
| 721 | $L_{A56}$ | $L_{B8}$ |
| 722 | $L_{A57}$ | $L_{B8}$ |
| 723 | $L_{A58}$ | $L_{B8}$ |
| 724 | $L_{A59}$ | $L_{B8}$ |
| 725 | $L_{A60}$ | $L_{B8}$ |
| 726 | $L_{A61}$ | $L_{B8}$ |
| 727 | $L_{A62}$ | $L_{B8}$ |
| 728 | $L_{A63}$ | $L_{B8}$ |
| 729 | $L_{A64}$ | $L_{B8}$ |
| 730 | $L_{A65}$ | $L_{B8}$ |
| 731 | $L_{A66}$ | $L_{B8}$ |
| 732 | $L_{A67}$ | $L_{B8}$ |
| 733 | $L_{A68}$ | $L_{B8}$ |
| 734 | $L_{A69}$ | $L_{B8}$ |
| 735 | $L_{A70}$ | $L_{B8}$ |
| 736 | $L_{A71}$ | $L_{B8}$ |
| 737 | $L_{A72}$ | $L_{B8}$ |
| 738 | $L_{A73}$ | $L_{B8}$ |
| 739 | $L_{A74}$ | $L_{B8}$ |
| 740 | $L_{A75}$ | $L_{B8}$ |
| 741 | $L_{A76}$ | $L_{B8}$ |
| 742 | $L_{A77}$ | $L_{B8}$ |
| 743 | $L_{A78}$ | $L_{B8}$ |
| 744 | $L_{A79}$ | $L_{B8}$ |
| 745 | $L_{A80}$ | $L_{B8}$ |
| 746 | $L_{A81}$ | $L_{B8}$ |
| 747 | $L_{A82}$ | $L_{B8}$ |
| 748 | $L_{A83}$ | $L_{B8}$ |
| 749 | $L_{A84}$ | $L_{B8}$ |
| 750 | $L_{A85}$ | $L_{B8}$ |
| 751 | $L_{A86}$ | $L_{B8}$ |
| 752 | $L_{A87}$ | $L_{B8}$ |
| 753 | $L_{A88}$ | $L_{B8}$ |
| 754 | $L_{A89}$ | $L_{B8}$ |
| 755 | $L_{A90}$ | $L_{B8}$ |
| 756 | $L_{A91}$ | $L_{B8}$ |
| 757 | $L_{A92}$ | $L_{B8}$ |
| 758 | $L_{A93}$ | $L_{B8}$ |
| 759 | $L_{A94}$ | $L_{B8}$ |
| 760 | $L_{A95}$ | $L_{B8}$ |
| 761 | $L_{A1}$ | $L_{B9}$ |
| 762 | $L_{A2}$ | $L_{B9}$ |
| 763 | $L_{A3}$ | $L_{B9}$ |
| 764 | $L_{A4}$ | $L_{B9}$ |
| 765 | $L_{A5}$ | $L_{B9}$ |
| 766 | $L_{A6}$ | $L_{B9}$ |
| 767 | $L_{A7}$ | $L_{B9}$ |
| 768 | $L_{A8}$ | $L_{B9}$ |
| 769 | $L_{A9}$ | $L_{B9}$ |
| 770 | $L_{A10}$ | $L_{B9}$ |
| 771 | $L_{A11}$ | $L_{B9}$ |
| 772 | $L_{A12}$ | $L_{B9}$ |
| 773 | $L_{A13}$ | $L_{B9}$ |
| 774 | $L_{A14}$ | $L_{B9}$ |
| 775 | $L_{A15}$ | $L_{B9}$ |
| 776 | $L_{A16}$ | $L_{B9}$ |
| 777 | $L_{A17}$ | $L_{B9}$ |
| 778 | $L_{A18}$ | $L_{B9}$ |
| 779 | $L_{A19}$ | $L_{B9}$ |

-continued

| Cpd # | $L_A$ | $L_B$ |
|---|---|---|
| 780 | $L_{A20}$ | $L_{B9}$ |
| 781 | $L_{A21}$ | $L_{B9}$ |
| 782 | $L_{A22}$ | $L_{B9}$ |
| 783 | $L_{A23}$ | $L_{B9}$ |
| 784 | $L_{A24}$ | $L_{B9}$ |
| 785 | $L_{A25}$ | $L_{B9}$ |
| 786 | $L_{A26}$ | $L_{B9}$ |
| 787 | $L_{A27}$ | $L_{B9}$ |
| 788 | $L_{A28}$ | $L_{B9}$ |
| 789 | $L_{A29}$ | $L_{B9}$ |
| 790 | $L_{A30}$ | $L_{B9}$ |
| 791 | $L_{A31}$ | $L_{B9}$ |
| 792 | $L_{A32}$ | $L_{B9}$ |
| 793 | $L_{A33}$ | $L_{B9}$ |
| 794 | $L_{A34}$ | $L_{B9}$ |
| 795 | $L_{A35}$ | $L_{B9}$ |
| 796 | $L_{A36}$ | $L_{B9}$ |
| 797 | $L_{A37}$ | $L_{B9}$ |
| 798 | $L_{A38}$ | $L_{B9}$ |
| 799 | $L_{A39}$ | $L_{B9}$ |
| 800 | $L_{A40}$ | $L_{B9}$ |
| 801 | $L_{A41}$ | $L_{B9}$ |
| 802 | $L_{A42}$ | $L_{B9}$ |
| 803 | $L_{A43}$ | $L_{B9}$ |
| 804 | $L_{A44}$ | $L_{B9}$ |
| 805 | $L_{A45}$ | $L_{B9}$ |
| 806 | $L_{A46}$ | $L_{B9}$ |
| 807 | $L_{A47}$ | $L_{B9}$ |
| 808 | $L_{A48}$ | $L_{B9}$ |
| 809 | $L_{A49}$ | $L_{B9}$ |
| 810 | $L_{A50}$ | $L_{B9}$ |
| 811 | $L_{A51}$ | $L_{B9}$ |
| 812 | $L_{A52}$ | $L_{B9}$ |
| 813 | $L_{A53}$ | $L_{B9}$ |
| 814 | $L_{A54}$ | $L_{B9}$ |
| 815 | $L_{A55}$ | $L_{B9}$ |
| 816 | $L_{A56}$ | $L_{B9}$ |
| 817 | $L_{A57}$ | $L_{B9}$ |
| 818 | $L_{A58}$ | $L_{B9}$ |
| 819 | $L_{A59}$ | $L_{B9}$ |
| 820 | $L_{A60}$ | $L_{B9}$ |
| 821 | $L_{A61}$ | $L_{B9}$ |
| 822 | $L_{A62}$ | $L_{B9}$ |
| 823 | $L_{A63}$ | $L_{B9}$ |
| 824 | $L_{A64}$ | $L_{B9}$ |
| 825 | $L_{A65}$ | $L_{B9}$ |
| 826 | $L_{A66}$ | $L_{B9}$ |
| 827 | $L_{A67}$ | $L_{B9}$ |
| 828 | $L_{A68}$ | $L_{B9}$ |
| 829 | $L_{A69}$ | $L_{B9}$ |
| 830 | $L_{A70}$ | $L_{B9}$ |
| 831 | $L_{A71}$ | $L_{B9}$ |
| 832 | $L_{A72}$ | $L_{B9}$ |
| 833 | $L_{A73}$ | $L_{B9}$ |
| 834 | $L_{A74}$ | $L_{B9}$ |
| 835 | $L_{A75}$ | $L_{B9}$ |
| 836 | $L_{A76}$ | $L_{B9}$ |
| 837 | $L_{A77}$ | $L_{B9}$ |
| 838 | $L_{A78}$ | $L_{B9}$ |
| 839 | $L_{A79}$ | $L_{B9}$ |
| 840 | $L_{A80}$ | $L_{B9}$ |
| 841 | $L_{A81}$ | $L_{B9}$ |
| 842 | $L_{A82}$ | $L_{B9}$ |
| 843 | $L_{A83}$ | $L_{B9}$ |
| 844 | $L_{A84}$ | $L_{B9}$ |
| 845 | $L_{A85}$ | $L_{B9}$ |
| 846 | $L_{A86}$ | $L_{B9}$ |
| 847 | $L_{A87}$ | $L_{B9}$ |
| 848 | $L_{A88}$ | $L_{B9}$ |
| 849 | $L_{A89}$ | $L_{B9}$ |
| 850 | $L_{A90}$ | $L_{B9}$ |
| 851 | $L_{A91}$ | $L_{B9}$ |
| 852 | $L_{A92}$ | $L_{B9}$ |
| 853 | $L_{A93}$ | $L_{B9}$ |
| 854 | $L_{A94}$ | $L_{B9}$ |
| 855 | $L_{A95}$ | $L_{B9}$ |
| 856 | $L_{A1}$ | $L_{B10}$ |

-continued

| Cpd # | $L_A$ | $L_B$ |
|---|---|---|
| 857 | $L_{A2}$ | $L_{B10}$ |
| 858 | $L_{A3}$ | $L_{B10}$ |
| 859 | $L_{A4}$ | $L_{B10}$ |
| 860 | $L_{A5}$ | $L_{B10}$ |
| 861 | $L_{A6}$ | $L_{B10}$ |
| 862 | $L_{A7}$ | $L_{B10}$ |
| 863 | $L_{A8}$ | $L_{B10}$ |
| 864 | $L_{A9}$ | $L_{B10}$ |
| 865 | $L_{A10}$ | $L_{B10}$ |
| 866 | $L_{A11}$ | $L_{B10}$ |
| 867 | $L_{A12}$ | $L_{B10}$ |
| 868 | $L_{A13}$ | $L_{B10}$ |
| 869 | $L_{A14}$ | $L_{B10}$ |
| 870 | $L_{A15}$ | $L_{B10}$ |
| 871 | $L_{A16}$ | $L_{B10}$ |
| 872 | $L_{A17}$ | $L_{B10}$ |
| 873 | $L_{A18}$ | $L_{B10}$ |
| 874 | $L_{A19}$ | $L_{B10}$ |
| 875 | $L_{A20}$ | $L_{B10}$ |
| 876 | $L_{A21}$ | $L_{B10}$ |
| 877 | $L_{A22}$ | $L_{B10}$ |
| 878 | $L_{A23}$ | $L_{B10}$ |
| 879 | $L_{A24}$ | $L_{B10}$ |
| 880 | $L_{A25}$ | $L_{B10}$ |
| 881 | $L_{A26}$ | $L_{B10}$ |
| 882 | $L_{A27}$ | $L_{B10}$ |
| 883 | $L_{A28}$ | $L_{B10}$ |
| 884 | $L_{A29}$ | $L_{B10}$ |
| 885 | $L_{A30}$ | $L_{B10}$ |
| 886 | $L_{A31}$ | $L_{B10}$ |
| 887 | $L_{A32}$ | $L_{B10}$ |
| 888 | $L_{A33}$ | $L_{B10}$ |
| 889 | $L_{A34}$ | $L_{B10}$ |
| 890 | $L_{A35}$ | $L_{B10}$ |
| 891 | $L_{A36}$ | $L_{B10}$ |
| 892 | $L_{A37}$ | $L_{B10}$ |
| 893 | $L_{A38}$ | $L_{B10}$ |
| 894 | $L_{A39}$ | $L_{B10}$ |
| 895 | $L_{A40}$ | $L_{B10}$ |
| 896 | $L_{A41}$ | $L_{B10}$ |
| 897 | $L_{A42}$ | $L_{B10}$ |
| 898 | $L_{A43}$ | $L_{B10}$ |
| 899 | $L_{A44}$ | $L_{B10}$ |
| 900 | $L_{A45}$ | $L_{B10}$ |
| 901 | $L_{A46}$ | $L_{B10}$ |
| 902 | $L_{A47}$ | $L_{B10}$ |
| 903 | $L_{A48}$ | $L_{B10}$ |
| 904 | $L_{A49}$ | $L_{B10}$ |
| 905 | $L_{A50}$ | $L_{B10}$ |
| 906 | $L_{A51}$ | $L_{B10}$ |
| 907 | $L_{A52}$ | $L_{B10}$ |
| 908 | $L_{A53}$ | $L_{B10}$ |
| 909 | $L_{A54}$ | $L_{B10}$ |
| 910 | $L_{A55}$ | $L_{B10}$ |
| 911 | $L_{A56}$ | $L_{B10}$ |
| 912 | $L_{A57}$ | $L_{B10}$ |
| 913 | $L_{A58}$ | $L_{B10}$ |
| 914 | $L_{A59}$ | $L_{B10}$ |
| 915 | $L_{A60}$ | $L_{B10}$ |
| 916 | $L_{A61}$ | $L_{B10}$ |
| 917 | $L_{A62}$ | $L_{B10}$ |
| 918 | $L_{A63}$ | $L_{B10}$ |
| 919 | $L_{A64}$ | $L_{B10}$ |
| 920 | $L_{A65}$ | $L_{B10}$ |
| 921 | $L_{A66}$ | $L_{B10}$ |
| 922 | $L_{A67}$ | $L_{B10}$ |
| 923 | $L_{A68}$ | $L_{B10}$ |
| 924 | $L_{A69}$ | $L_{B10}$ |
| 925 | $L_{A70}$ | $L_{B10}$ |
| 926 | $L_{A71}$ | $L_{B10}$ |
| 927 | $L_{A72}$ | $L_{B10}$ |
| 928 | $L_{A73}$ | $L_{B10}$ |
| 929 | $L_{A74}$ | $L_{B10}$ |
| 930 | $L_{A75}$ | $L_{B10}$ |
| 931 | $L_{A76}$ | $L_{B10}$ |
| 932 | $L_{A77}$ | $L_{B10}$ |
| 933 | $L_{A78}$ | $L_{B10}$ |

-continued

| Cpd # | $L_A$ | $L_B$ |
|---|---|---|
| 934 | $L_{A79}$ | $L_{B10}$ |
| 935 | $L_{A80}$ | $L_{B10}$ |
| 936 | $L_{A81}$ | $L_{B10}$ |
| 937 | $L_{A82}$ | $L_{B10}$ |
| 938 | $L_{A83}$ | $L_{B10}$ |
| 939 | $L_{A84}$ | $L_{B10}$ |
| 940 | $L_{A85}$ | $L_{B10}$ |
| 941 | $L_{A86}$ | $L_{B10}$ |
| 942 | $L_{A87}$ | $L_{B10}$ |
| 943 | $L_{A88}$ | $L_{B10}$ |
| 944 | $L_{A89}$ | $L_{B10}$ |
| 945 | $L_{A90}$ | $L_{B10}$ |
| 946 | $L_{A91}$ | $L_{B10}$ |
| 947 | $L_{A92}$ | $L_{B10}$ |
| 948 | $L_{A93}$ | $L_{B10}$ |
| 949 | $L_{A94}$ | $L_{B10}$ |
| 950 | $L_{A95}$ | $L_{B10}$ |
| 951 | $L_{A1}$ | $L_{B11}$ |
| 952 | $L_{A2}$ | $L_{B11}$ |
| 953 | $L_{A3}$ | $L_{B11}$ |
| 954 | $L_{A4}$ | $L_{B11}$ |
| 955 | $L_{A5}$ | $L_{B11}$ |
| 956 | $L_{A6}$ | $L_{B11}$ |
| 957 | $L_{A7}$ | $L_{B11}$ |
| 958 | $L_{A8}$ | $L_{B11}$ |
| 959 | $L_{A9}$ | $L_{B11}$ |
| 960 | $L_{A10}$ | $L_{B11}$ |
| 961 | $L_{A11}$ | $L_{B11}$ |
| 962 | $L_{A12}$ | $L_{B11}$ |
| 963 | $L_{A13}$ | $L_{B11}$ |
| 964 | $L_{A14}$ | $L_{B11}$ |
| 965 | $L_{A15}$ | $L_{B11}$ |
| 966 | $L_{A16}$ | $L_{B11}$ |
| 967 | $L_{A17}$ | $L_{B11}$ |
| 968 | $L_{A18}$ | $L_{B11}$ |
| 969 | $L_{A19}$ | $L_{B11}$ |
| 970 | $L_{A20}$ | $L_{B11}$ |
| 971 | $L_{A21}$ | $L_{B11}$ |
| 972 | $L_{A22}$ | $L_{B11}$ |
| 973 | $L_{A23}$ | $L_{B11}$ |
| 974 | $L_{A24}$ | $L_{B11}$ |
| 975 | $L_{A25}$ | $L_{B11}$ |
| 976 | $L_{A26}$ | $L_{B11}$ |
| 977 | $L_{A27}$ | $L_{B11}$ |
| 978 | $L_{A28}$ | $L_{B11}$ |
| 979 | $L_{A29}$ | $L_{B11}$ |
| 980 | $L_{A30}$ | $L_{B11}$ |
| 981 | $L_{A31}$ | $L_{B11}$ |
| 982 | $L_{A32}$ | $L_{B11}$ |
| 983 | $L_{A33}$ | $L_{B11}$ |
| 984 | $L_{A34}$ | $L_{B11}$ |
| 985 | $L_{A35}$ | $L_{B11}$ |
| 986 | $L_{A36}$ | $L_{B11}$ |
| 987 | $L_{A37}$ | $L_{B11}$ |
| 988 | $L_{A38}$ | $L_{B11}$ |
| 989 | $L_{A39}$ | $L_{B11}$ |
| 990 | $L_{A40}$ | $L_{B11}$ |
| 991 | $L_{A41}$ | $L_{B11}$ |
| 992 | $L_{A42}$ | $L_{B11}$ |
| 993 | $L_{A43}$ | $L_{B11}$ |
| 994 | $L_{A44}$ | $L_{B11}$ |
| 995 | $L_{A45}$ | $L_{B11}$ |
| 996 | $L_{A46}$ | $L_{B11}$ |
| 997 | $L_{A47}$ | $L_{B11}$ |
| 998 | $L_{A48}$ | $L_{B11}$ |
| 999 | $L_{A49}$ | $L_{B11}$ |
| 1000 | $L_{A50}$ | $L_{B11}$ |
| 1001 | $L_{A51}$ | $L_{B11}$ |
| 1002 | $L_{A52}$ | $L_{B11}$ |
| 1003 | $L_{A53}$ | $L_{B11}$ |
| 1004 | $L_{A54}$ | $L_{B11}$ |
| 1005 | $L_{A55}$ | $L_{B11}$ |
| 1006 | $L_{A56}$ | $L_{B11}$ |
| 1007 | $L_{A57}$ | $L_{B11}$ |
| 1008 | $L_{A58}$ | $L_{B11}$ |
| 1009 | $L_{A59}$ | $L_{B11}$ |
| 1010 | $L_{A60}$ | $L_{B11}$ |

-continued

| Cpd # | $L_A$ | $L_B$ |
|---|---|---|
| 1011 | $L_{A61}$ | $L_{B11}$ |
| 1012 | $L_{A62}$ | $L_{B11}$ |
| 1013 | $L_{A63}$ | $L_{B11}$ |
| 1014 | $L_{A64}$ | $L_{B11}$ |
| 1015 | $L_{A65}$ | $L_{B11}$ |
| 1016 | $L_{A66}$ | $L_{B11}$ |
| 1017 | $L_{A67}$ | $L_{B11}$ |
| 1018 | $L_{A68}$ | $L_{B11}$ |
| 1019 | $L_{A69}$ | $L_{B11}$ |
| 1020 | $L_{A70}$ | $L_{B11}$ |
| 1021 | $L_{A71}$ | $L_{B11}$ |
| 1022 | $L_{A72}$ | $L_{B11}$ |
| 1023 | $L_{A73}$ | $L_{B11}$ |
| 1024 | $L_{A74}$ | $L_{B11}$ |
| 1025 | $L_{A75}$ | $L_{B11}$ |
| 1026 | $L_{A76}$ | $L_{B11}$ |
| 1027 | $L_{A77}$ | $L_{B11}$ |
| 1028 | $L_{A78}$ | $L_{B11}$ |
| 1029 | $L_{A79}$ | $L_{B11}$ |
| 1030 | $L_{A80}$ | $L_{B11}$ |
| 1031 | $L_{A81}$ | $L_{B11}$ |
| 1032 | $L_{A82}$ | $L_{B11}$ |
| 1033 | $L_{A83}$ | $L_{B11}$ |
| 1034 | $L_{A84}$ | $L_{B11}$ |
| 1035 | $L_{A85}$ | $L_{B11}$ |
| 1036 | $L_{A86}$ | $L_{B11}$ |
| 1037 | $L_{A87}$ | $L_{B11}$ |
| 1038 | $L_{A88}$ | $L_{B11}$ |
| 1039 | $L_{A89}$ | $L_{B11}$ |
| 1040 | $L_{A90}$ | $L_{B11}$ |
| 1041 | $L_{A91}$ | $L_{B11}$ |
| 1042 | $L_{A92}$ | $L_{B11}$ |
| 1043 | $L_{A93}$ | $L_{B11}$ |
| 1044 | $L_{A94}$ | $L_{B11}$ |
| 1045 | $L_{A95}$ | $L_{B11}$ |
| 1046 | $L_{A1}$ | $L_{B12}$ |
| 1047 | $L_{A2}$ | $L_{B12}$ |
| 1048 | $L_{A3}$ | $L_{B12}$ |
| 1049 | $L_{A4}$ | $L_{B12}$ |
| 1050 | $L_{A5}$ | $L_{B12}$ |
| 1051 | $L_{A6}$ | $L_{B12}$ |
| 1052 | $L_{A7}$ | $L_{B12}$ |
| 1053 | $L_{A8}$ | $L_{B12}$ |
| 1054 | $L_{A9}$ | $L_{B12}$ |
| 1055 | $L_{A10}$ | $L_{B12}$ |
| 1056 | $L_{A11}$ | $L_{B12}$ |
| 1057 | $L_{A12}$ | $L_{B12}$ |
| 1058 | $L_{A13}$ | $L_{B12}$ |
| 1059 | $L_{A14}$ | $L_{B12}$ |
| 1060 | $L_{A15}$ | $L_{B12}$ |
| 1061 | $L_{A16}$ | $L_{B12}$ |
| 1062 | $L_{A17}$ | $L_{B12}$ |
| 1063 | $L_{A18}$ | $L_{B12}$ |
| 1064 | $L_{A19}$ | $L_{B12}$ |
| 1065 | $L_{A20}$ | $L_{B12}$ |
| 1066 | $L_{A21}$ | $L_{B12}$ |
| 1067 | $L_{A22}$ | $L_{B12}$ |
| 1068 | $L_{A23}$ | $L_{B12}$ |
| 1069 | $L_{A24}$ | $L_{B12}$ |
| 1070 | $L_{A25}$ | $L_{B12}$ |
| 1071 | $L_{A26}$ | $L_{B12}$ |
| 1072 | $L_{A27}$ | $L_{B12}$ |
| 1073 | $L_{A28}$ | $L_{B12}$ |
| 1074 | $L_{A29}$ | $L_{B12}$ |
| 1075 | $L_{A30}$ | $L_{B12}$ |
| 1076 | $L_{A31}$ | $L_{B12}$ |
| 1077 | $L_{A32}$ | $L_{B12}$ |
| 1078 | $L_{A33}$ | $L_{B12}$ |
| 1079 | $L_{A34}$ | $L_{B12}$ |
| 1080 | $L_{A35}$ | $L_{B12}$ |
| 1081 | $L_{A36}$ | $L_{B12}$ |
| 1082 | $L_{A37}$ | $L_{B12}$ |
| 1083 | $L_{A38}$ | $L_{B12}$ |
| 1084 | $L_{A39}$ | $L_{B12}$ |
| 1085 | $L_{A40}$ | $L_{B12}$ |
| 1086 | $L_{A41}$ | $L_{B12}$ |
| 1087 | $L_{A42}$ | $L_{B12}$ |

-continued

| Cpd # | $L_A$ | $L_B$ |
|---|---|---|
| 1088 | $L_{A43}$ | $L_{B12}$ |
| 1089 | $L_{A44}$ | $L_{B12}$ |
| 1090 | $L_{A45}$ | $L_{B12}$ |
| 1091 | $L_{A46}$ | $L_{B12}$ |
| 1092 | $L_{A47}$ | $L_{B12}$ |
| 1093 | $L_{A48}$ | $L_{B12}$ |
| 1094 | $L_{A49}$ | $L_{B12}$ |
| 1095 | $L_{A50}$ | $L_{B12}$ |
| 1096 | $L_{A51}$ | $L_{B12}$ |
| 1097 | $L_{A52}$ | $L_{B12}$ |
| 1098 | $L_{A53}$ | $L_{B12}$ |
| 1099 | $L_{A54}$ | $L_{B12}$ |
| 1100 | $L_{A55}$ | $L_{B12}$ |
| 1101 | $L_{A56}$ | $L_{B12}$ |
| 1102 | $L_{A57}$ | $L_{B12}$ |
| 1103 | $L_{A58}$ | $L_{B12}$ |
| 1104 | $L_{A59}$ | $L_{B12}$ |
| 1105 | $L_{A60}$ | $L_{B12}$ |
| 1106 | $L_{A61}$ | $L_{B12}$ |
| 1107 | $L_{A62}$ | $L_{B12}$ |
| 1108 | $L_{A63}$ | $L_{B12}$ |
| 1109 | $L_{A64}$ | $L_{B12}$ |
| 1110 | $L_{A65}$ | $L_{B12}$ |
| 1111 | $L_{A66}$ | $L_{B12}$ |
| 1112 | $L_{A67}$ | $L_{B12}$ |
| 1113 | $L_{A68}$ | $L_{B12}$ |
| 1114 | $L_{A69}$ | $L_{B12}$ |
| 1115 | $L_{A70}$ | $L_{B12}$ |
| 1116 | $L_{A71}$ | $L_{B12}$ |
| 1117 | $L_{A72}$ | $L_{B12}$ |
| 1118 | $L_{A73}$ | $L_{B12}$ |
| 1119 | $L_{A74}$ | $L_{B12}$ |
| 1120 | $L_{A75}$ | $L_{B12}$ |
| 1121 | $L_{A76}$ | $L_{B12}$ |
| 1122 | $L_{A77}$ | $L_{B12}$ |
| 1123 | $L_{A78}$ | $L_{B12}$ |
| 1124 | $L_{A79}$ | $L_{B12}$ |
| 1125 | $L_{A80}$ | $L_{B12}$ |
| 1126 | $L_{A81}$ | $L_{B12}$ |
| 1127 | $L_{A82}$ | $L_{B12}$ |
| 1128 | $L_{A83}$ | $L_{B12}$ |
| 1129 | $L_{A84}$ | $L_{B12}$ |
| 1130 | $L_{A85}$ | $L_{B12}$ |
| 1131 | $L_{A86}$ | $L_{B12}$ |
| 1132 | $L_{A87}$ | $L_{B12}$ |
| 1133 | $L_{A88}$ | $L_{B12}$ |
| 1134 | $L_{A89}$ | $L_{B12}$ |
| 1135 | $L_{A90}$ | $L_{B12}$ |
| 1136 | $L_{A91}$ | $L_{B12}$ |
| 1137 | $L_{A92}$ | $L_{B12}$ |
| 1138 | $L_{A93}$ | $L_{B12}$ |
| 1139 | $L_{A94}$ | $L_{B12}$ |
| 1140 | $L_{A95}$ | $L_{B12}$ |
| 1141 | $L_{A1}$ | $L_{B13}$ |
| 1142 | $L_{A2}$ | $L_{B13}$ |
| 1143 | $L_{A3}$ | $L_{B13}$ |
| 1144 | $L_{A4}$ | $L_{B13}$ |
| 1145 | $L_{A5}$ | $L_{B13}$ |
| 1146 | $L_{A6}$ | $L_{B13}$ |
| 1147 | $L_{A7}$ | $L_{B13}$ |
| 1148 | $L_{A8}$ | $L_{B13}$ |
| 1149 | $L_{A9}$ | $L_{B13}$ |
| 1150 | $L_{A10}$ | $L_{B13}$ |
| 1151 | $L_{A11}$ | $L_{B13}$ |
| 1152 | $L_{A12}$ | $L_{B13}$ |
| 1153 | $L_{A13}$ | $L_{B13}$ |
| 1154 | $L_{A14}$ | $L_{B13}$ |
| 1155 | $L_{A15}$ | $L_{B13}$ |
| 1156 | $L_{A16}$ | $L_{B13}$ |
| 1157 | $L_{A17}$ | $L_{B13}$ |
| 1158 | $L_{A18}$ | $L_{B13}$ |
| 1159 | $L_{A19}$ | $L_{B13}$ |
| 1160 | $L_{A20}$ | $L_{B13}$ |
| 1161 | $L_{A21}$ | $L_{B13}$ |
| 1162 | $L_{A22}$ | $L_{B13}$ |
| 1163 | $L_{A23}$ | $L_{B13}$ |
| 1164 | $L_{A24}$ | $L_{B13}$ |

-continued

| Cpd # | $L_A$ | $L_B$ |
|---|---|---|
| 1165 | $L_{A25}$ | $L_{B13}$ |
| 1166 | $L_{A26}$ | $L_{B13}$ |
| 1167 | $L_{A27}$ | $L_{B13}$ |
| 1168 | $L_{A28}$ | $L_{B13}$ |
| 1169 | $L_{A29}$ | $L_{B13}$ |
| 1170 | $L_{A30}$ | $L_{B13}$ |
| 1171 | $L_{A31}$ | $L_{B13}$ |
| 1172 | $L_{A32}$ | $L_{B13}$ |
| 1173 | $L_{A33}$ | $L_{B13}$ |
| 1174 | $L_{A34}$ | $L_{B13}$ |
| 1175 | $L_{A35}$ | $L_{B13}$ |
| 1176 | $L_{A36}$ | $L_{B13}$ |
| 1177 | $L_{A37}$ | $L_{B13}$ |
| 1178 | $L_{A38}$ | $L_{B13}$ |
| 1179 | $L_{A39}$ | $L_{B13}$ |
| 1180 | $L_{A40}$ | $L_{B13}$ |
| 1181 | $L_{A41}$ | $L_{B13}$ |
| 1182 | $L_{A42}$ | $L_{B13}$ |
| 1183 | $L_{A43}$ | $L_{B13}$ |
| 1184 | $L_{A44}$ | $L_{B13}$ |
| 1185 | $L_{A45}$ | $L_{B13}$ |
| 1186 | $L_{A46}$ | $L_{B13}$ |
| 1187 | $L_{A47}$ | $L_{B13}$ |
| 1188 | $L_{A48}$ | $L_{B13}$ |
| 1189 | $L_{A49}$ | $L_{B13}$ |
| 1190 | $L_{A50}$ | $L_{B13}$ |
| 1191 | $L_{A51}$ | $L_{B13}$ |
| 1192 | $L_{A52}$ | $L_{B13}$ |
| 1193 | $L_{A53}$ | $L_{B13}$ |
| 1194 | $L_{A54}$ | $L_{B13}$ |
| 1195 | $L_{A55}$ | $L_{B13}$ |
| 1196 | $L_{A56}$ | $L_{B13}$ |
| 1197 | $L_{A57}$ | $L_{B13}$ |
| 1198 | $L_{A58}$ | $L_{B13}$ |
| 1199 | $L_{A59}$ | $L_{B13}$ |
| 1200 | $L_{A60}$ | $L_{B13}$ |
| 1201 | $L_{A61}$ | $L_{B13}$ |
| 1202 | $L_{A62}$ | $L_{B13}$ |
| 1203 | $L_{A63}$ | $L_{B13}$ |
| 1204 | $L_{A64}$ | $L_{B13}$ |
| 1205 | $L_{A65}$ | $L_{B13}$ |
| 1206 | $L_{A66}$ | $L_{B13}$ |
| 1207 | $L_{A67}$ | $L_{B13}$ |
| 1208 | $L_{A68}$ | $L_{B13}$ |
| 1209 | $L_{A69}$ | $L_{B13}$ |
| 1210 | $L_{A70}$ | $L_{B13}$ |
| 1211 | $L_{A71}$ | $L_{B13}$ |
| 1212 | $L_{A72}$ | $L_{B13}$ |
| 1213 | $L_{A73}$ | $L_{B13}$ |
| 1214 | $L_{A74}$ | $L_{B13}$ |
| 1215 | $L_{A75}$ | $L_{B13}$ |
| 1216 | $L_{A76}$ | $L_{B13}$ |
| 1217 | $L_{A77}$ | $L_{B13}$ |
| 1218 | $L_{A78}$ | $L_{B13}$ |
| 1219 | $L_{A79}$ | $L_{B13}$ |
| 1220 | $L_{A80}$ | $L_{B13}$ |
| 1221 | $L_{A81}$ | $L_{B13}$ |
| 1222 | $L_{A82}$ | $L_{B13}$ |
| 1223 | $L_{A83}$ | $L_{B13}$ |
| 1224 | $L_{A84}$ | $L_{B13}$ |
| 1225 | $L_{A85}$ | $L_{B13}$ |
| 1226 | $L_{A86}$ | $L_{B13}$ |
| 1227 | $L_{A87}$ | $L_{B13}$ |
| 1228 | $L_{A88}$ | $L_{B13}$ |
| 1229 | $L_{A89}$ | $L_{B13}$ |
| 1230 | $L_{A90}$ | $L_{B13}$ |
| 1231 | $L_{A91}$ | $L_{B13}$ |
| 1232 | $L_{A92}$ | $L_{B13}$ |
| 1233 | $L_{A93}$ | $L_{B13}$ |
| 1234 | $L_{A94}$ | $L_{B13}$ |
| 1235 | $L_{A95}$ | $L_{B13}$ |
| 1236 | $L_{A1}$ | $L_{B14}$ |
| 1237 | $L_{A2}$ | $L_{B14}$ |
| 1238 | $L_{A3}$ | $L_{B14}$ |
| 1239 | $L_{A4}$ | $L_{B14}$ |
| 1240 | $L_{A5}$ | $L_{B14}$ |
| 1241 | $L_{A6}$ | $L_{B14}$ |

-continued

| Cpd # | $L_A$ | $L_B$ |
|---|---|---|
| 1242 | $L_{A7}$ | $L_{B14}$ |
| 1243 | $L_{A8}$ | $L_{B14}$ |
| 1244 | $L_{A9}$ | $L_{B14}$ |
| 1245 | $L_{A10}$ | $L_{B14}$ |
| 1246 | $L_{A11}$ | $L_{B14}$ |
| 1247 | $L_{A12}$ | $L_{B14}$ |
| 1248 | $L_{A13}$ | $L_{B14}$ |
| 1249 | $L_{A14}$ | $L_{B14}$ |
| 1250 | $L_{A15}$ | $L_{B14}$ |
| 1251 | $L_{A16}$ | $L_{B14}$ |
| 1252 | $L_{A17}$ | $L_{B14}$ |
| 1253 | $L_{A18}$ | $L_{B14}$ |
| 1254 | $L_{A19}$ | $L_{B14}$ |
| 1255 | $L_{A20}$ | $L_{B14}$ |
| 1256 | $L_{A21}$ | $L_{B14}$ |
| 1257 | $L_{A22}$ | $L_{B14}$ |
| 1258 | $L_{A23}$ | $L_{B14}$ |
| 1259 | $L_{A24}$ | $L_{B14}$ |
| 1260 | $L_{A25}$ | $L_{B14}$ |
| 1261 | $L_{A26}$ | $L_{B14}$ |
| 1262 | $L_{A27}$ | $L_{B14}$ |
| 1263 | $L_{A28}$ | $L_{B14}$ |
| 1264 | $L_{A29}$ | $L_{B14}$ |
| 1265 | $L_{A30}$ | $L_{B14}$ |
| 1266 | $L_{A31}$ | $L_{B14}$ |
| 1267 | $L_{A32}$ | $L_{B14}$ |
| 1268 | $L_{A33}$ | $L_{B14}$ |
| 1269 | $L_{A34}$ | $L_{B14}$ |
| 1270 | $L_{A35}$ | $L_{B14}$ |
| 1271 | $L_{A36}$ | $L_{B14}$ |
| 1272 | $L_{A37}$ | $L_{B14}$ |
| 1273 | $L_{A38}$ | $L_{B14}$ |
| 1274 | $L_{A39}$ | $L_{B14}$ |
| 1275 | $L_{A40}$ | $L_{B14}$ |
| 1276 | $L_{A41}$ | $L_{B14}$ |
| 1277 | $L_{A42}$ | $L_{B14}$ |
| 1278 | $L_{A43}$ | $L_{B14}$ |
| 1279 | $L_{A44}$ | $L_{B14}$ |
| 1280 | $L_{A45}$ | $L_{B14}$ |
| 1281 | $L_{A46}$ | $L_{B14}$ |
| 1282 | $L_{A47}$ | $L_{B14}$ |
| 1283 | $L_{A48}$ | $L_{B14}$ |
| 1284 | $L_{A49}$ | $L_{B14}$ |
| 1285 | $L_{A50}$ | $L_{B14}$ |
| 1286 | $L_{A51}$ | $L_{B14}$ |
| 1287 | $L_{A52}$ | $L_{B14}$ |
| 1288 | $L_{A53}$ | $L_{B14}$ |
| 1289 | $L_{A54}$ | $L_{B14}$ |
| 1290 | $L_{A55}$ | $L_{B14}$ |
| 1291 | $L_{A56}$ | $L_{B14}$ |
| 1292 | $L_{A57}$ | $L_{B14}$ |
| 1293 | $L_{A58}$ | $L_{B14}$ |
| 1294 | $L_{A59}$ | $L_{B14}$ |
| 1295 | $L_{A60}$ | $L_{B14}$ |
| 1296 | $L_{A61}$ | $L_{B14}$ |
| 1297 | $L_{A62}$ | $L_{B14}$ |
| 1298 | $L_{A63}$ | $L_{B14}$ |
| 1299 | $L_{A64}$ | $L_{B14}$ |
| 1300 | $L_{A65}$ | $L_{B14}$ |
| 1301 | $L_{A66}$ | $L_{B14}$ |
| 1302 | $L_{A67}$ | $L_{B14}$ |
| 1303 | $L_{A68}$ | $L_{B14}$ |
| 1304 | $L_{A69}$ | $L_{B14}$ |
| 1305 | $L_{A70}$ | $L_{B14}$ |
| 1306 | $L_{A71}$ | $L_{B14}$ |
| 1307 | $L_{A72}$ | $L_{B14}$ |
| 1308 | $L_{A73}$ | $L_{B14}$ |
| 1309 | $L_{A74}$ | $L_{B14}$ |
| 1310 | $L_{A75}$ | $L_{B14}$ |
| 1311 | $L_{A76}$ | $L_{B14}$ |
| 1312 | $L_{A77}$ | $L_{B14}$ |
| 1313 | $L_{A78}$ | $L_{B14}$ |
| 1314 | $L_{A79}$ | $L_{B14}$ |
| 1315 | $L_{A80}$ | $L_{B14}$ |
| 1316 | $L_{A81}$ | $L_{B14}$ |
| 1317 | $L_{A82}$ | $L_{B14}$ |
| 1318 | $L_{A83}$ | $L_{B14}$ |
| 1319 | $L_{A84}$ | $L_{B14}$ |
| 1320 | $L_{A85}$ | $L_{B14}$ |
| 1321 | $L_{A86}$ | $L_{B14}$ |
| 1322 | $L_{A87}$ | $L_{B14}$ |
| 1323 | $L_{A88}$ | $L_{B14}$ |
| 1324 | $L_{A89}$ | $L_{B14}$ |
| 1325 | $L_{A90}$ | $L_{B14}$ |
| 1326 | $L_{A91}$ | $L_{B14}$ |
| 1327 | $L_{A92}$ | $L_{B14}$ |
| 1328 | $L_{A93}$ | $L_{B14}$ |
| 1329 | $L_{A94}$ | $L_{B14}$ |
| 1330 | $L_{A95}$ | $L_{B14}$ |
| 1331 | $L_{A1}$ | $L_{B15}$ |
| 1332 | $L_{A2}$ | $L_{B15}$ |
| 1333 | $L_{A3}$ | $L_{B15}$ |
| 1334 | $L_{A4}$ | $L_{B15}$ |
| 1335 | $L_{A5}$ | $L_{B15}$ |
| 1336 | $L_{A6}$ | $L_{B15}$ |
| 1337 | $L_{A7}$ | $L_{B15}$ |
| 1338 | $L_{A8}$ | $L_{B15}$ |
| 1339 | $L_{A9}$ | $L_{B15}$ |
| 1340 | $L_{A10}$ | $L_{B15}$ |
| 1341 | $L_{A11}$ | $L_{B15}$ |
| 1342 | $L_{A12}$ | $L_{B15}$ |
| 1343 | $L_{A13}$ | $L_{B15}$ |
| 1344 | $L_{A14}$ | $L_{B15}$ |
| 1345 | $L_{A15}$ | $L_{B15}$ |
| 1346 | $L_{A16}$ | $L_{B15}$ |
| 1347 | $L_{A17}$ | $L_{B15}$ |
| 1348 | $L_{A18}$ | $L_{B15}$ |
| 1349 | $L_{A19}$ | $L_{B15}$ |
| 1350 | $L_{A20}$ | $L_{B15}$ |
| 1351 | $L_{A21}$ | $L_{B15}$ |
| 1352 | $L_{A22}$ | $L_{B15}$ |
| 1353 | $L_{A23}$ | $L_{B15}$ |
| 1354 | $L_{A24}$ | $L_{B15}$ |
| 1355 | $L_{A25}$ | $L_{B15}$ |
| 1356 | $L_{A26}$ | $L_{B15}$ |
| 1357 | $L_{A27}$ | $L_{B15}$ |
| 1358 | $L_{A28}$ | $L_{B15}$ |
| 1359 | $L_{A29}$ | $L_{B15}$ |
| 1360 | $L_{A30}$ | $L_{B15}$ |
| 1361 | $L_{A31}$ | $L_{B15}$ |
| 1362 | $L_{A32}$ | $L_{B15}$ |
| 1363 | $L_{A33}$ | $L_{B15}$ |
| 1364 | $L_{A34}$ | $L_{B15}$ |
| 1365 | $L_{A35}$ | $L_{B15}$ |
| 1366 | $L_{A36}$ | $L_{B15}$ |
| 1367 | $L_{A37}$ | $L_{B15}$ |
| 1368 | $L_{A38}$ | $L_{B15}$ |
| 1369 | $L_{A39}$ | $L_{B15}$ |
| 1370 | $L_{A40}$ | $L_{B15}$ |
| 1371 | $L_{A41}$ | $L_{B15}$ |
| 1372 | $L_{A42}$ | $L_{B15}$ |
| 1373 | $L_{A43}$ | $L_{B15}$ |
| 1374 | $L_{A44}$ | $L_{B15}$ |
| 1375 | $L_{A45}$ | $L_{B15}$ |
| 1376 | $L_{A46}$ | $L_{B15}$ |
| 1377 | $L_{A47}$ | $L_{B15}$ |
| 1378 | $L_{A48}$ | $L_{B15}$ |
| 1379 | $L_{A49}$ | $L_{B15}$ |
| 1380 | $L_{A50}$ | $L_{B15}$ |
| 1381 | $L_{A51}$ | $L_{B15}$ |
| 1382 | $L_{A52}$ | $L_{B15}$ |
| 1383 | $L_{A53}$ | $L_{B15}$ |
| 1384 | $L_{A54}$ | $L_{B15}$ |
| 1385 | $L_{A55}$ | $L_{B15}$ |
| 1386 | $L_{A56}$ | $L_{B15}$ |
| 1387 | $L_{A57}$ | $L_{B15}$ |
| 1388 | $L_{A58}$ | $L_{B15}$ |
| 1389 | $L_{A59}$ | $L_{B15}$ |
| 1390 | $L_{A60}$ | $L_{B15}$ |
| 1391 | $L_{A61}$ | $L_{B15}$ |
| 1392 | $L_{A62}$ | $L_{B15}$ |
| 1393 | $L_{A63}$ | $L_{B15}$ |
| 1394 | $L_{A64}$ | $L_{B15}$ |
| 1395 | $L_{A65}$ | $L_{B15}$ |

-continued

| Cpd # | $L_A$ | $L_B$ |
|---|---|---|
| 1396 | $L_{A66}$ | $L_{B15}$ |
| 1397 | $L_{A67}$ | $L_{B15}$ |
| 1398 | $L_{A68}$ | $L_{B15}$ |
| 1399 | $L_{A69}$ | $L_{B15}$ |
| 1400 | $L_{A70}$ | $L_{B15}$ |
| 1401 | $L_{A71}$ | $L_{B15}$ |
| 1402 | $L_{A72}$ | $L_{B15}$ |
| 1403 | $L_{A73}$ | $L_{B15}$ |
| 1404 | $L_{A74}$ | $L_{B15}$ |
| 1405 | $L_{A75}$ | $L_{B15}$ |
| 1406 | $L_{A76}$ | $L_{B15}$ |
| 1407 | $L_{A77}$ | $L_{B15}$ |
| 1408 | $L_{A78}$ | $L_{B15}$ |
| 1409 | $L_{A79}$ | $L_{B15}$ |
| 1410 | $L_{A80}$ | $L_{B15}$ |
| 1411 | $L_{A81}$ | $L_{B15}$ |
| 1412 | $L_{A82}$ | $L_{B15}$ |
| 1413 | $L_{A83}$ | $L_{B15}$ |
| 1414 | $L_{A84}$ | $L_{B15}$ |
| 1415 | $L_{A85}$ | $L_{B15}$ |
| 1416 | $L_{A86}$ | $L_{B15}$ |
| 1417 | $L_{A87}$ | $L_{B15}$ |
| 1418 | $L_{A88}$ | $L_{B15}$ |
| 1419 | $L_{A89}$ | $L_{B15}$ |
| 1420 | $L_{A90}$ | $L_{B15}$ |
| 1421 | $L_{A91}$ | $L_{B15}$ |
| 1422 | $L_{A92}$ | $L_{B15}$ |
| 1423 | $L_{A93}$ | $L_{B15}$ |
| 1424 | $L_{A94}$ | $L_{B15}$ |
| 1425 | $L_{A95}$ | $L_{B15}$ |
| 1426 | $L_{A1}$ | $L_{B16}$ |
| 1427 | $L_{A2}$ | $L_{B16}$ |
| 1428 | $L_{A3}$ | $L_{B16}$ |
| 1429 | $L_{A4}$ | $L_{B16}$ |
| 1430 | $L_{A5}$ | $L_{B16}$ |
| 1431 | $L_{A6}$ | $L_{B16}$ |
| 1432 | $L_{A7}$ | $L_{B16}$ |
| 1433 | $L_{A8}$ | $L_{B16}$ |
| 1434 | $L_{A9}$ | $L_{B16}$ |
| 1435 | $L_{A10}$ | $L_{B16}$ |
| 1436 | $L_{A11}$ | $L_{B16}$ |
| 1437 | $L_{A12}$ | $L_{B16}$ |
| 1438 | $L_{A13}$ | $L_{B16}$ |
| 1439 | $L_{A14}$ | $L_{B16}$ |
| 1440 | $L_{A15}$ | $L_{B16}$ |
| 1441 | $L_{A16}$ | $L_{B16}$ |
| 1442 | $L_{A17}$ | $L_{B16}$ |
| 1443 | $L_{A18}$ | $L_{B16}$ |
| 1444 | $L_{A19}$ | $L_{B16}$ |
| 1445 | $L_{A20}$ | $L_{B16}$ |
| 1446 | $L_{A21}$ | $L_{B16}$ |
| 1447 | $L_{A22}$ | $L_{B16}$ |
| 1448 | $L_{A23}$ | $L_{B16}$ |
| 1449 | $L_{A24}$ | $L_{B16}$ |
| 1450 | $L_{A25}$ | $L_{B16}$ |
| 1451 | $L_{A26}$ | $L_{B16}$ |
| 1452 | $L_{A27}$ | $L_{B16}$ |
| 1453 | $L_{A28}$ | $L_{B16}$ |
| 1454 | $L_{A29}$ | $L_{B16}$ |
| 1455 | $L_{A30}$ | $L_{B16}$ |
| 1456 | $L_{A31}$ | $L_{B16}$ |
| 1457 | $L_{A32}$ | $L_{B16}$ |
| 1458 | $L_{A33}$ | $L_{B16}$ |
| 1459 | $L_{A34}$ | $L_{B16}$ |
| 1460 | $L_{A35}$ | $L_{B16}$ |
| 1461 | $L_{A36}$ | $L_{B16}$ |
| 1462 | $L_{A37}$ | $L_{B16}$ |
| 1463 | $L_{A38}$ | $L_{B16}$ |
| 1464 | $L_{A39}$ | $L_{B16}$ |
| 1465 | $L_{A40}$ | $L_{B16}$ |
| 1466 | $L_{A41}$ | $L_{B16}$ |
| 1467 | $L_{A42}$ | $L_{B16}$ |
| 1468 | $L_{A43}$ | $L_{B16}$ |
| 1469 | $L_{A44}$ | $L_{B16}$ |
| 1470 | $L_{A45}$ | $L_{B16}$ |
| 1471 | $L_{A46}$ | $L_{B16}$ |
| 1472 | $L_{A47}$ | $L_{B16}$ |

-continued

| Cpd # | $L_A$ | $L_B$ |
|---|---|---|
| 1473 | $L_{A48}$ | $L_{B16}$ |
| 1474 | $L_{A49}$ | $L_{B16}$ |
| 1475 | $L_{A50}$ | $L_{B16}$ |
| 1476 | $L_{A51}$ | $L_{B16}$ |
| 1477 | $L_{A52}$ | $L_{B16}$ |
| 1478 | $L_{A53}$ | $L_{B16}$ |
| 1479 | $L_{A54}$ | $L_{B16}$ |
| 1480 | $L_{A55}$ | $L_{B16}$ |
| 1481 | $L_{A56}$ | $L_{B16}$ |
| 1482 | $L_{A57}$ | $L_{B16}$ |
| 1483 | $L_{A58}$ | $L_{B16}$ |
| 1484 | $L_{A59}$ | $L_{B16}$ |
| 1485 | $L_{A60}$ | $L_{B16}$ |
| 1486 | $L_{A61}$ | $L_{B16}$ |
| 1487 | $L_{A62}$ | $L_{B16}$ |
| 1488 | $L_{A63}$ | $L_{B16}$ |
| 1489 | $L_{A64}$ | $L_{B16}$ |
| 1490 | $L_{A65}$ | $L_{B16}$ |
| 1491 | $L_{A66}$ | $L_{B16}$ |
| 1492 | $L_{A67}$ | $L_{B16}$ |
| 1493 | $L_{A68}$ | $L_{B16}$ |
| 1494 | $L_{A69}$ | $L_{B16}$ |
| 1495 | $L_{A70}$ | $L_{B16}$ |
| 1496 | $L_{A71}$ | $L_{B16}$ |
| 1497 | $L_{A72}$ | $L_{B16}$ |
| 1498 | $L_{A73}$ | $L_{B16}$ |
| 1499 | $L_{A74}$ | $L_{B16}$ |
| 1500 | $L_{A75}$ | $L_{B16}$ |
| 1501 | $L_{A76}$ | $L_{B16}$ |
| 1502 | $L_{A77}$ | $L_{B16}$ |
| 1503 | $L_{A78}$ | $L_{B16}$ |
| 1504 | $L_{A79}$ | $L_{B16}$ |
| 1505 | $L_{A80}$ | $L_{B16}$ |
| 1506 | $L_{A81}$ | $L_{B16}$ |
| 1507 | $L_{A82}$ | $L_{B16}$ |
| 1508 | $L_{A83}$ | $L_{B16}$ |
| 1509 | $L_{A84}$ | $L_{B16}$ |
| 1510 | $L_{A85}$ | $L_{B16}$ |
| 1511 | $L_{A86}$ | $L_{B16}$ |
| 1512 | $L_{A87}$ | $L_{B16}$ |
| 1513 | $L_{A88}$ | $L_{B16}$ |
| 1514 | $L_{A89}$ | $L_{B16}$ |
| 1515 | $L_{A90}$ | $L_{B16}$ |
| 1516 | $L_{A91}$ | $L_{B16}$ |
| 1517 | $L_{A92}$ | $L_{B16}$ |
| 1518 | $L_{A93}$ | $L_{B16}$ |
| 1519 | $L_{A94}$ | $L_{B16}$ |
| 1520 | $L_{A95}$ | $L_{B16}$ |
| 1521 | $L_{A1}$ | $L_{B17}$ |
| 1522 | $L_{A2}$ | $L_{B17}$ |
| 1523 | $L_{A3}$ | $L_{B17}$ |
| 1524 | $L_{A4}$ | $L_{B17}$ |
| 1525 | $L_{A5}$ | $L_{B17}$ |
| 1526 | $L_{A6}$ | $L_{B17}$ |
| 1527 | $L_{A7}$ | $L_{B17}$ |
| 1528 | $L_{A8}$ | $L_{B17}$ |
| 1529 | $L_{A9}$ | $L_{B17}$ |
| 1530 | $L_{A10}$ | $L_{B17}$ |
| 1531 | $L_{A11}$ | $L_{B17}$ |
| 1532 | $L_{A12}$ | $L_{B17}$ |
| 1533 | $L_{A13}$ | $L_{B17}$ |
| 1534 | $L_{A14}$ | $L_{B17}$ |
| 1535 | $L_{A15}$ | $L_{B17}$ |
| 1536 | $L_{A16}$ | $L_{B17}$ |
| 1558 | $L_{A38}$ | $L_{B17}$ |
| 1559 | $L_{A39}$ | $L_{B17}$ |
| 1560 | $L_{A40}$ | $L_{B17}$ |
| 1561 | $L_{A41}$ | $L_{B17}$ |
| 1562 | $L_{A42}$ | $L_{B17}$ |
| 1563 | $L_{A43}$ | $L_{B17}$ |
| 1564 | $L_{A44}$ | $L_{B17}$ |
| 1565 | $L_{A45}$ | $L_{B17}$ |
| 1566 | $L_{A46}$ | $L_{B17}$ |
| 1567 | $L_{A47}$ | $L_{B17}$ |
| 1568 | $L_{A48}$ | $L_{B17}$ |
| 1569 | $L_{A49}$ | $L_{B17}$ |
| 1570 | $L_{A50}$ | $L_{B17}$ |

-continued

| Cpd # | $L_A$ | $L_B$ |
|---|---|---|
| 1571 | $L_{A51}$ | $L_{B17}$ |
| 1572 | $L_{A52}$ | $L_{B17}$ |
| 1573 | $L_{A53}$ | $L_{B17}$ |
| 1574 | $L_{A54}$ | $L_{B17}$ |
| 1575 | $L_{A55}$ | $L_{B17}$ |
| 1576 | $L_{A56}$ | $L_{B17}$ |
| 1577 | $L_{A57}$ | $L_{B17}$ |
| 1578 | $L_{A58}$ | $L_{B17}$ |
| 1579 | $L_{A59}$ | $L_{B17}$ |
| 1580 | $L_{A60}$ | $L_{B17}$ |
| 1581 | $L_{A61}$ | $L_{B17}$ |
| 1616 | $L_{A1}$ | $L_{B18}$ |
| 1617 | $L_{A2}$ | $L_{B18}$ |
| 1618 | $L_{A3}$ | $L_{B18}$ |
| 1619 | $L_{A4}$ | $L_{B18}$ |
| 1620 | $L_{A5}$ | $L_{B18}$ |
| 1621 | $L_{A6}$ | $L_{B18}$ |
| 1622 | $L_{A7}$ | $L_{B18}$ |
| 1623 | $L_{A8}$ | $L_{B18}$ |
| 1624 | $L_{A9}$ | $L_{B18}$ |
| 1625 | $L_{A10}$ | $L_{B18}$ |
| 1626 | $L_{A11}$ | $L_{B18}$ |
| 1627 | $L_{A12}$ | $L_{B18}$ |
| 1628 | $L_{A13}$ | $L_{B18}$ |
| 1629 | $L_{A14}$ | $L_{B18}$ |
| 1630 | $L_{A15}$ | $L_{B18}$ |
| 1631 | $L_{A16}$ | $L_{B18}$ |
| 1653 | $L_{A38}$ | $L_{B18}$ |
| 1654 | $L_{A39}$ | $L_{B18}$ |
| 1655 | $L_{A40}$ | $L_{B18}$ |
| 1656 | $L_{A41}$ | $L_{B18}$ |
| 1657 | $L_{A42}$ | $L_{B18}$ |
| 1658 | $L_{A43}$ | $L_{B18}$ |
| 1659 | $L_{A44}$ | $L_{B18}$ |
| 1660 | $L_{A45}$ | $L_{B18}$ |
| 1661 | $L_{A46}$ | $L_{B18}$ |
| 1662 | $L_{A47}$ | $L_{B18}$ |
| 1663 | $L_{A48}$ | $L_{B18}$ |
| 1664 | $L_{A49}$ | $L_{B18}$ |
| 1665 | $L_{A50}$ | $L_{B18}$ |
| 1666 | $L_{A51}$ | $L_{B18}$ |
| 1667 | $L_{A52}$ | $L_{B18}$ |
| 1668 | $L_{A53}$ | $L_{B18}$ |
| 1669 | $L_{A54}$ | $L_{B18}$ |
| 1670 | $L_{A55}$ | $L_{B18}$ |
| 1671 | $L_{A56}$ | $L_{B18}$ |
| 1672 | $L_{A57}$ | $L_{B18}$ |
| 1673 | $L_{A58}$ | $L_{B18}$ |
| 1674 | $L_{A59}$ | $L_{B18}$ |
| 1675 | $L_{A60}$ | $L_{B18}$ |
| 1676 | $L_{A61}$ | $L_{B18}$ |
| 1711 | $L_{A1}$ | $L_{B19}$ |
| 1712 | $L_{A2}$ | $L_{B19}$ |
| 1713 | $L_{A3}$ | $L_{B19}$ |
| 1714 | $L_{A4}$ | $L_{B19}$ |
| 1715 | $L_{A5}$ | $L_{B19}$ |
| 1716 | $L_{A6}$ | $L_{B19}$ |
| 1717 | $L_{A7}$ | $L_{B19}$ |
| 1718 | $L_{A8}$ | $L_{B19}$ |
| 1719 | $L_{A9}$ | $L_{B19}$ |
| 1720 | $L_{A10}$ | $L_{B19}$ |
| 1721 | $L_{A11}$ | $L_{B19}$ |
| 1722 | $L_{A12}$ | $L_{B19}$ |
| 1723 | $L_{A13}$ | $L_{B19}$ |
| 1724 | $L_{A14}$ | $L_{B19}$ |
| 1725 | $L_{A15}$ | $L_{B19}$ |
| 1726 | $L_{A16}$ | $L_{B19}$ |
| 1748 | $L_{A38}$ | $L_{B19}$ |
| 1749 | $L_{A39}$ | $L_{B19}$ |
| 1750 | $L_{A40}$ | $L_{B19}$ |
| 1751 | $L_{A41}$ | $L_{B19}$ |
| 1752 | $L_{A42}$ | $L_{B19}$ |
| 1753 | $L_{A43}$ | $L_{B19}$ |
| 1754 | $L_{A44}$ | $L_{B19}$ |
| 1755 | $L_{A45}$ | $L_{B19}$ |
| 1756 | $L_{A46}$ | $L_{B19}$ |
| 1757 | $L_{A47}$ | $L_{B19}$ |

-continued

| Cpd # | $L_A$ | $L_B$ |
|---|---|---|
| 1758 | $L_{A48}$ | $L_{B19}$ |
| 1759 | $L_{A49}$ | $L_{B19}$ |
| 1760 | $L_{A50}$ | $L_{B19}$ |
| 1761 | $L_{A51}$ | $L_{B19}$ |
| 1762 | $L_{A52}$ | $L_{B19}$ |
| 1763 | $L_{A53}$ | $L_{B19}$ |
| 1764 | $L_{A54}$ | $L_{B19}$ |
| 1765 | $L_{A55}$ | $L_{B19}$ |
| 1766 | $L_{A56}$ | $L_{B19}$ |
| 1767 | $L_{A57}$ | $L_{B19}$ |
| 1768 | $L_{A58}$ | $L_{B19}$ |
| 1769 | $L_{A59}$ | $L_{B19}$ |
| 1770 | $L_{A60}$ | $L_{B19}$ |
| 1771 | $L_{A61}$ | $L_{B19}$ |
| 1806 | $L_{A1}$ | $L_{B20}$ |
| 1807 | $L_{A2}$ | $L_{B20}$ |
| 1808 | $L_{A3}$ | $L_{B20}$ |
| 1809 | $L_{A4}$ | $L_{B20}$ |
| 1810 | $L_{A5}$ | $L_{B20}$ |
| 1811 | $L_{A6}$ | $L_{B20}$ |
| 1812 | $L_{A7}$ | $L_{B20}$ |
| 1813 | $L_{A8}$ | $L_{B20}$ |
| 1814 | $L_{A9}$ | $L_{B20}$ |
| 1815 | $L_{A10}$ | $L_{B20}$ |
| 1816 | $L_{A11}$ | $L_{B20}$ |
| 1817 | $L_{A12}$ | $L_{B20}$ |
| 1818 | $L_{A13}$ | $L_{B20}$ |
| 1819 | $L_{A14}$ | $L_{B20}$ |
| 1820 | $L_{A15}$ | $L_{B20}$ |
| 1821 | $L_{A16}$ | $L_{B20}$ |
| 1843 | $L_{A38}$ | $L_{B20}$ |
| 1844 | $L_{A39}$ | $L_{B20}$ |
| 1845 | $L_{A40}$ | $L_{B20}$ |
| 1846 | $L_{A41}$ | $L_{B20}$ |
| 1847 | $L_{A42}$ | $L_{B20}$ |
| 1848 | $L_{A43}$ | $L_{B20}$ |
| 1849 | $L_{A44}$ | $L_{B20}$ |
| 1850 | $L_{A45}$ | $L_{B20}$ |
| 1851 | $L_{A46}$ | $L_{B20}$ |
| 1852 | $L_{A47}$ | $L_{B20}$ |
| 1853 | $L_{A48}$ | $L_{B20}$ |
| 1854 | $L_{A49}$ | $L_{B20}$ |
| 1855 | $L_{A50}$ | $L_{B20}$ |
| 1856 | $L_{A51}$ | $L_{B20}$ |
| 1857 | $L_{A52}$ | $L_{B20}$ |
| 1858 | $L_{A53}$ | $L_{B20}$ |
| 1859 | $L_{A54}$ | $L_{B20}$ |
| 1860 | $L_{A55}$ | $L_{B20}$ |
| 1861 | $L_{A56}$ | $L_{B20}$ |
| 1862 | $L_{A57}$ | $L_{B20}$ |
| 1863 | $L_{A58}$ | $L_{B20}$ |
| 1864 | $L_{A59}$ | $L_{B20}$ |
| 1865 | $L_{A60}$ | $L_{B20}$ |
| 1866 | $L_{A61}$ | $L_{B20}$ |
| 1901 | $L_{A1}$ | $L_{B21}$ |
| 1902 | $L_{A2}$ | $L_{B21}$ |
| 1903 | $L_{A3}$ | $L_{B21}$ |
| 1904 | $L_{A4}$ | $L_{B21}$ |
| 1905 | $L_{A5}$ | $L_{B21}$ |
| 1906 | $L_{A6}$ | $L_{B21}$ |
| 1907 | $L_{A7}$ | $L_{B21}$ |
| 1908 | $L_{A8}$ | $L_{B21}$ |
| 1909 | $L_{A9}$ | $L_{B21}$ |
| 1910 | $L_{A10}$ | $L_{B21}$ |
| 1911 | $L_{A11}$ | $L_{B21}$ |
| 1912 | $L_{A12}$ | $L_{B21}$ |
| 1913 | $L_{A13}$ | $L_{B21}$ |
| 1914 | $L_{A14}$ | $L_{B21}$ |
| 1915 | $L_{A15}$ | $L_{B21}$ |
| 1916 | $L_{A16}$ | $L_{B21}$ |
| 1938 | $L_{A38}$ | $L_{B21}$ |
| 1939 | $L_{A39}$ | $L_{B21}$ |
| 1940 | $L_{A40}$ | $L_{B21}$ |
| 1941 | $L_{A41}$ | $L_{B21}$ |
| 1942 | $L_{A42}$ | $L_{B21}$ |
| 1943 | $L_{A43}$ | $L_{B21}$ |
| 1944 | $L_{A44}$ | $L_{B21}$ |

-continued

| Cpd # | $L_A$ | $L_B$ |
|---|---|---|
| 1945 | $L_{A45}$ | $L_{B21}$ |
| 1946 | $L_{A46}$ | $L_{B21}$ |
| 1947 | $L_{A47}$ | $L_{B21}$ |
| 1948 | $L_{A48}$ | $L_{B21}$ |
| 1949 | $L_{A49}$ | $L_{B21}$ |
| 1950 | $L_{A50}$ | $L_{B21}$ |
| 1951 | $L_{A51}$ | $L_{B21}$ |
| 1952 | $L_{A52}$ | $L_{B21}$ |
| 1953 | $L_{A53}$ | $L_{B21}$ |
| 1954 | $L_{A54}$ | $L_{B21}$ |
| 1955 | $L_{A55}$ | $L_{B21}$ |
| 1956 | $L_{A56}$ | $L_{B21}$ |
| 1957 | $L_{A57}$ | $L_{B21}$ |
| 1958 | $L_{A58}$ | $L_{B21}$ |
| 1959 | $L_{A59}$ | $L_{B21}$ |
| 1960 | $L_{A60}$ | $L_{B21}$ |
| 1961 | $L_{A61}$ | $L_{B21}$ |
| 1996 | $L_{A1}$ | $L_{B22}$ |
| 1997 | $L_{A2}$ | $L_{B22}$ |
| 1998 | $L_{A3}$ | $L_{B22}$ |
| 1999 | $L_{A4}$ | $L_{B22}$ |
| 2000 | $L_{A5}$ | $L_{B22}$ |
| 2001 | $L_{A6}$ | $L_{B22}$ |
| 2002 | $L_{A7}$ | $L_{B22}$ |
| 2003 | $L_{A8}$ | $L_{B22}$ |
| 2004 | $L_{A9}$ | $L_{B22}$ |
| 2005 | $L_{A10}$ | $L_{B22}$ |
| 2006 | $L_{A11}$ | $L_{B22}$ |
| 2007 | $L_{A12}$ | $L_{B22}$ |
| 2008 | $L_{A13}$ | $L_{B22}$ |
| 2009 | $L_{A14}$ | $L_{B22}$ |
| 2010 | $L_{A15}$ | $L_{B22}$ |
| 2011 | $L_{A16}$ | $L_{B22}$ |
| 2033 | $L_{A38}$ | $L_{B22}$ |
| 2034 | $L_{A39}$ | $L_{B22}$ |
| 2035 | $L_{A40}$ | $L_{B22}$ |
| 2036 | $L_{A41}$ | $L_{B22}$ |
| 2037 | $L_{A42}$ | $L_{B22}$ |
| 2038 | $L_{A43}$ | $L_{B22}$ |
| 2039 | $L_{A44}$ | $L_{B22}$ |
| 2040 | $L_{A45}$ | $L_{B22}$ |
| 2041 | $L_{A46}$ | $L_{B22}$ |
| 2042 | $L_{A47}$ | $L_{B22}$ |
| 2043 | $L_{A48}$ | $L_{B22}$ |
| 2044 | $L_{A49}$ | $L_{B22}$ |
| 2045 | $L_{A50}$ | $L_{B22}$ |
| 2046 | $L_{A51}$ | $L_{B22}$ |
| 2047 | $L_{A52}$ | $L_{B22}$ |
| 2048 | $L_{A53}$ | $L_{B22}$ |
| 2049 | $L_{A54}$ | $L_{B22}$ |
| 2050 | $L_{A55}$ | $L_{B22}$ |
| 2051 | $L_{A56}$ | $L_{B22}$ |
| 2052 | $L_{A57}$ | $L_{B22}$ |
| 2053 | $L_{A58}$ | $L_{B22}$ |
| 2054 | $L_{A59}$ | $L_{B22}$ |
| 2055 | $L_{A60}$ | $L_{B22}$ |
| 2056 | $L_{A61}$ | $L_{B22}$ |
| 2091 | $L_{A1}$ | $L_{B23}$ |
| 2092 | $L_{A2}$ | $L_{B23}$ |
| 2093 | $L_{A3}$ | $L_{B23}$ |
| 2094 | $L_{A4}$ | $L_{B23}$ |
| 2095 | $L_{A5}$ | $L_{B23}$ |
| 2096 | $L_{A6}$ | $L_{B23}$ |
| 2097 | $L_{A7}$ | $L_{B23}$ |
| 2098 | $L_{A8}$ | $L_{B23}$ |
| 2099 | $L_{A9}$ | $L_{B23}$ |
| 2100 | $L_{A10}$ | $L_{B23}$ |
| 2101 | $L_{A11}$ | $L_{B23}$ |
| 2102 | $L_{A12}$ | $L_{B23}$ |
| 2103 | $L_{A13}$ | $L_{B23}$ |
| 2104 | $L_{A14}$ | $L_{B23}$ |
| 2105 | $L_{A15}$ | $L_{B23}$ |
| 2106 | $L_{A16}$ | $L_{B23}$ |
| 2128 | $L_{A38}$ | $L_{B23}$ |
| 2129 | $L_{A39}$ | $L_{B23}$ |
| 2130 | $L_{A40}$ | $L_{B23}$ |
| 2131 | $L_{A41}$ | $L_{B23}$ |

-continued

| Cpd # | $L_A$ | $L_B$ |
|---|---|---|
| 2132 | $L_{A42}$ | $L_{B23}$ |
| 2133 | $L_{A43}$ | $L_{B23}$ |
| 2134 | $L_{A44}$ | $L_{B23}$ |
| 2135 | $L_{A45}$ | $L_{B23}$ |
| 2136 | $L_{A46}$ | $L_{B23}$ |
| 2137 | $L_{A47}$ | $L_{B23}$ |
| 2138 | $L_{A48}$ | $L_{B23}$ |
| 2139 | $L_{A49}$ | $L_{B23}$ |
| 2140 | $L_{A50}$ | $L_{B23}$ |
| 2141 | $L_{A51}$ | $L_{B23}$ |
| 2142 | $L_{A52}$ | $L_{B23}$ |
| 2143 | $L_{A53}$ | $L_{B23}$ |
| 2144 | $L_{A54}$ | $L_{B23}$ |
| 2145 | $L_{A55}$ | $L_{B23}$ |
| 2146 | $L_{A56}$ | $L_{B23}$ |
| 2147 | $L_{A57}$ | $L_{B23}$ |
| 2148 | $L_{A58}$ | $L_{B23}$ |
| 2149 | $L_{A59}$ | $L_{B23}$ |
| 2150 | $L_{A60}$ | $L_{B23}$ |
| 2151 | $L_{A61}$ | $L_{B23}$ |
| 2186 | $L_{A1}$ | $L_{B24}$ |
| 2187 | $L_{A2}$ | $L_{B24}$ |
| 2188 | $L_{A3}$ | $L_{B24}$ |
| 2189 | $L_{A4}$ | $L_{B24}$ |
| 2190 | $L_{A5}$ | $L_{B24}$ |
| 2191 | $L_{A6}$ | $L_{B24}$ |
| 2192 | $L_{A7}$ | $L_{B24}$ |
| 2193 | $L_{A8}$ | $L_{B24}$ |
| 2194 | $L_{A9}$ | $L_{B24}$ |
| 2195 | $L_{A10}$ | $L_{B24}$ |
| 2196 | $L_{A11}$ | $L_{B24}$ |
| 2197 | $L_{A12}$ | $L_{B24}$ |
| 2198 | $L_{A13}$ | $L_{B24}$ |
| 2199 | $L_{A14}$ | $L_{B24}$ |
| 2200 | $L_{A15}$ | $L_{B24}$ |
| 2201 | $L_{A16}$ | $L_{B24}$ |
| 2223 | $L_{A38}$ | $L_{B24}$ |
| 2224 | $L_{A39}$ | $L_{B24}$ |
| 2225 | $L_{A40}$ | $L_{B24}$ |
| 2226 | $L_{A41}$ | $L_{B24}$ |
| 2227 | $L_{A42}$ | $L_{B24}$ |
| 2228 | $L_{A43}$ | $L_{B24}$ |
| 2229 | $L_{A44}$ | $L_{B24}$ |
| 2230 | $L_{A45}$ | $L_{B24}$ |
| 2231 | $L_{A46}$ | $L_{B24}$ |
| 2232 | $L_{A47}$ | $L_{B24}$ |
| 2233 | $L_{A48}$ | $L_{B24}$ |
| 2234 | $L_{A49}$ | $L_{B24}$ |
| 2235 | $L_{A50}$ | $L_{B24}$ |
| 2236 | $L_{A51}$ | $L_{B24}$ |
| 2237 | $L_{A52}$ | $L_{B24}$ |
| 2238 | $L_{A53}$ | $L_{B24}$ |
| 2239 | $L_{A54}$ | $L_{B24}$ |
| 2240 | $L_{A55}$ | $L_{B24}$ |
| 2241 | $L_{A56}$ | $L_{B24}$ |
| 2242 | $L_{A57}$ | $L_{B24}$ |
| 2243 | $L_{A58}$ | $L_{B24}$ |
| 2244 | $L_{A59}$ | $L_{B24}$ |
| 2245 | $L_{A60}$ | $L_{B24}$ |
| 2246 | $L_{A61}$ | $L_{B24}$ |
| 2281 | $L_{A1}$ | $L_{B25}$ |
| 2282 | $L_{A2}$ | $L_{B25}$ |
| 2283 | $L_{A3}$ | $L_{B25}$ |
| 2284 | $L_{A4}$ | $L_{B25}$ |
| 2285 | $L_{A5}$ | $L_{B25}$ |
| 2286 | $L_{A6}$ | $L_{B25}$ |
| 2287 | $L_{A7}$ | $L_{B25}$ |
| 2288 | $L_{A8}$ | $L_{B25}$ |
| 2289 | $L_{A9}$ | $L_{B25}$ |
| 2290 | $L_{A10}$ | $L_{B25}$ |
| 2291 | $L_{A11}$ | $L_{B25}$ |
| 2292 | $L_{A12}$ | $L_{B25}$ |
| 2293 | $L_{A13}$ | $L_{B25}$ |
| 2294 | $L_{A14}$ | $L_{B25}$ |
| 2295 | $L_{A15}$ | $L_{B25}$ |
| 2296 | $L_{A16}$ | $L_{B25}$ |
| 2318 | $L_{A38}$ | $L_{B25}$ |

-continued

| Cpd # | $L_A$ | $L_B$ |
|---|---|---|
| 2319 | $L_{A39}$ | $L_{B25}$ |
| 2320 | $L_{A40}$ | $L_{B25}$ |
| 2321 | $L_{A41}$ | $L_{B25}$ |
| 2322 | $L_{A42}$ | $L_{B25}$ |
| 2323 | $L_{A43}$ | $L_{B25}$ |
| 2324 | $L_{A44}$ | $L_{B25}$ |
| 2325 | $L_{A45}$ | $L_{B25}$ |
| 2326 | $L_{A46}$ | $L_{B25}$ |
| 2327 | $L_{A47}$ | $L_{B25}$ |
| 2328 | $L_{A48}$ | $L_{B25}$ |
| 2329 | $L_{A49}$ | $L_{B25}$ |
| 2330 | $L_{A50}$ | $L_{B25}$ |
| 2331 | $L_{A51}$ | $L_{B25}$ |
| 2332 | $L_{A52}$ | $L_{B25}$ |
| 2333 | $L_{A53}$ | $L_{B25}$ |
| 2334 | $L_{A54}$ | $L_{B25}$ |
| 2335 | $L_{A55}$ | $L_{B25}$ |
| 2336 | $L_{A56}$ | $L_{B25}$ |
| 2337 | $L_{A57}$ | $L_{B25}$ |
| 2338 | $L_{A58}$ | $L_{B25}$ |
| 2339 | $L_{A59}$ | $L_{B25}$ |
| 2340 | $L_{A60}$ | $L_{B25}$ |
| 2341 | $L_{A61}$ | $L_{B25}$ |
| 2376 | $L_{A1}$ | $L_{B26}$ |
| 2377 | $L_{A2}$ | $L_{B26}$ |
| 2378 | $L_{A3}$ | $L_{B26}$ |
| 2379 | $L_{A4}$ | $L_{B26}$ |
| 2380 | $L_{A5}$ | $L_{B26}$ |
| 2381 | $L_{A6}$ | $L_{B26}$ |
| 2382 | $L_{A7}$ | $L_{B26}$ |
| 2383 | $L_{A8}$ | $L_{B26}$ |
| 2384 | $L_{A9}$ | $L_{B26}$ |
| 2385 | $L_{A10}$ | $L_{B26}$ |
| 2386 | $L_{A11}$ | $L_{B26}$ |
| 2387 | $L_{A12}$ | $L_{B26}$ |
| 2388 | $L_{A13}$ | $L_{B26}$ |
| 2389 | $L_{A14}$ | $L_{B26}$ |
| 2390 | $L_{A15}$ | $L_{B26}$ |
| 2391 | $L_{A16}$ | $L_{B26}$ |
| 2413 | $L_{A38}$ | $L_{B26}$ |
| 2414 | $L_{A39}$ | $L_{B26}$ |
| 2415 | $L_{A40}$ | $L_{B26}$ |
| 2416 | $L_{A41}$ | $L_{B26}$ |
| 2417 | $L_{A42}$ | $L_{B26}$ |
| 2418 | $L_{A43}$ | $L_{B26}$ |
| 2419 | $L_{A44}$ | $L_{B26}$ |
| 2420 | $L_{A45}$ | $L_{B26}$ |
| 2421 | $L_{A46}$ | $L_{B26}$ |
| 2422 | $L_{A47}$ | $L_{B26}$ |
| 2423 | $L_{A48}$ | $L_{B26}$ |
| 2424 | $L_{A49}$ | $L_{B26}$ |
| 2425 | $L_{A50}$ | $L_{B26}$ |
| 2426 | $L_{A51}$ | $L_{B26}$ |
| 2427 | $L_{A52}$ | $L_{B26}$ |
| 2428 | $L_{A53}$ | $L_{B26}$ |
| 2429 | $L_{A54}$ | $L_{B26}$ |
| 2430 | $L_{A55}$ | $L_{B26}$ |
| 2431 | $L_{A56}$ | $L_{B26}$ |
| 2432 | $L_{A57}$ | $L_{B26}$ |
| 2433 | $L_{A58}$ | $L_{B26}$ |
| 2434 | $L_{A59}$ | $L_{B26}$ |
| 2435 | $L_{A60}$ | $L_{B26}$ |
| 2436 | $L_{A61}$ | $L_{B26}$ |
| 2471 | $L_{A1}$ | $L_{B27}$ |
| 2472 | $L_{A2}$ | $L_{B27}$ |
| 2473 | $L_{A3}$ | $L_{B27}$ |
| 2474 | $L_{A4}$ | $L_{B27}$ |
| 2475 | $L_{A5}$ | $L_{B27}$ |
| 2476 | $L_{A6}$ | $L_{B27}$ |
| 2477 | $L_{A7}$ | $L_{B27}$ |
| 2478 | $L_{A8}$ | $L_{B27}$ |
| 2479 | $L_{A9}$ | $L_{B27}$ |
| 2480 | $L_{A10}$ | $L_{B27}$ |
| 2481 | $L_{A11}$ | $L_{B27}$ |
| 2482 | $L_{A12}$ | $L_{B27}$ |
| 2483 | $L_{A13}$ | $L_{B27}$ |
| 2484 | $L_{A14}$ | $L_{B27}$ |
| 2485 | $L_{A15}$ | $L_{B27}$ |
| 2486 | $L_{A16}$ | $L_{B27}$ |
| 2508 | $L_{A38}$ | $L_{B27}$ |
| 2509 | $L_{A39}$ | $L_{B27}$ |
| 2510 | $L_{A40}$ | $L_{B27}$ |
| 2511 | $L_{A41}$ | $L_{B27}$ |
| 2512 | $L_{A42}$ | $L_{B27}$ |
| 2513 | $L_{A43}$ | $L_{B27}$ |
| 2514 | $L_{A44}$ | $L_{B27}$ |
| 2515 | $L_{A45}$ | $L_{B27}$ |
| 2516 | $L_{A46}$ | $L_{B27}$ |
| 2517 | $L_{A47}$ | $L_{B27}$ |
| 2518 | $L_{A48}$ | $L_{B27}$ |
| 2519 | $L_{A49}$ | $L_{B27}$ |
| 2520 | $L_{A50}$ | $L_{B27}$ |
| 2521 | $L_{A51}$ | $L_{B27}$ |
| 2522 | $L_{A52}$ | $L_{B27}$ |
| 2523 | $L_{A53}$ | $L_{B27}$ |
| 2524 | $L_{A54}$ | $L_{B27}$ |
| 2525 | $L_{A55}$ | $L_{B27}$ |
| 2526 | $L_{A56}$ | $L_{B27}$ |
| 2527 | $L_{A57}$ | $L_{B27}$ |
| 2528 | $L_{A58}$ | $L_{B27}$ |
| 2529 | $L_{A59}$ | $L_{B27}$ |
| 2530 | $L_{A60}$ | $L_{B27}$ |
| 2531 | $L_{A61}$ | $L_{B27}$ |
| 2566 | $L_{A1}$ | $L_{B28}$ |
| 2567 | $L_{A2}$ | $L_{B28}$ |
| 2568 | $L_{A3}$ | $L_{B28}$ |
| 2569 | $L_{A4}$ | $L_{B28}$ |
| 2570 | $L_{A5}$ | $L_{B28}$ |
| 2571 | $L_{A6}$ | $L_{B28}$ |
| 2572 | $L_{A7}$ | $L_{B28}$ |
| 2573 | $L_{A8}$ | $L_{B28}$ |
| 2574 | $L_{A9}$ | $L_{B28}$ |
| 2575 | $L_{A10}$ | $L_{B28}$ |
| 2576 | $L_{A11}$ | $L_{B28}$ |
| 2577 | $L_{A12}$ | $L_{B28}$ |
| 2578 | $L_{A13}$ | $L_{B28}$ |
| 2579 | $L_{A14}$ | $L_{B28}$ |
| 2580 | $L_{A15}$ | $L_{B28}$ |
| 2581 | $L_{A16}$ | $L_{B28}$ |
| 2603 | $L_{A38}$ | $L_{B28}$ |
| 2604 | $L_{A39}$ | $L_{B28}$ |
| 2605 | $L_{A40}$ | $L_{B28}$ |
| 2606 | $L_{A41}$ | $L_{B28}$ |
| 2607 | $L_{A42}$ | $L_{B28}$ |
| 2608 | $L_{A43}$ | $L_{B28}$ |
| 2609 | $L_{A44}$ | $L_{B28}$ |
| 2610 | $L_{A45}$ | $L_{B28}$ |
| 2611 | $L_{A46}$ | $L_{B28}$ |
| 2612 | $L_{A47}$ | $L_{B28}$ |
| 2613 | $L_{A48}$ | $L_{B28}$ |
| 2614 | $L_{A49}$ | $L_{B28}$ |
| 2615 | $L_{A50}$ | $L_{B28}$ |
| 2616 | $L_{A51}$ | $L_{B28}$ |
| 2617 | $L_{A52}$ | $L_{B28}$ |
| 2618 | $L_{A53}$ | $L_{B28}$ |
| 2619 | $L_{A54}$ | $L_{B28}$ |
| 2620 | $L_{A55}$ | $L_{B28}$ |
| 2621 | $L_{A56}$ | $L_{B28}$ |
| 2622 | $L_{A57}$ | $L_{B28}$ |
| 2623 | $L_{A58}$ | $L_{B28}$ |
| 2624 | $L_{A59}$ | $L_{B28}$ |
| 2625 | $L_{A60}$ | $L_{B28}$ |
| 2626 | $L_{A61}$ | $L_{B28}$ |
| 2661 | $L_{A1}$ | $L_{B29}$ |
| 2662 | $L_{A2}$ | $L_{B29}$ |
| 2663 | $L_{A3}$ | $L_{B29}$ |
| 2664 | $L_{A4}$ | $L_{B29}$ |
| 2665 | $L_{A5}$ | $L_{B29}$ |
| 2666 | $L_{A6}$ | $L_{B29}$ |
| 2667 | $L_{A7}$ | $L_{B29}$ |
| 2668 | $L_{A8}$ | $L_{B29}$ |
| 2669 | $L_{A9}$ | $L_{B29}$ |
| 2670 | $L_{A10}$ | $L_{B29}$ |
| 2671 | $L_{A11}$ | $L_{B29}$ |

-continued

| Cpd # | $L_A$ | $L_B$ |
|---|---|---|
| 2672 | $L_{A12}$ | $L_{B29}$ |
| 2673 | $L_{A13}$ | $L_{B29}$ |
| 2674 | $L_{A14}$ | $L_{B29}$ |
| 2675 | $L_{A15}$ | $L_{B29}$ |
| 2379 | $L_{A4}$ | $L_{B26}$ |
| 2380 | $L_{A5}$ | $L_{B26}$ |
| 2381 | $L_{A6}$ | $L_{B26}$ |
| 2382 | $L_{A7}$ | $L_{B26}$ |
| 2383 | $L_{A8}$ | $L_{B26}$ |
| 2384 | $L_{A9}$ | $L_{B26}$ |
| 2385 | $L_{A10}$ | $L_{B26}$ |
| 2386 | $L_{A11}$ | $L_{B26}$ |
| 2387 | $L_{A12}$ | $L_{B26}$ |
| 2388 | $L_{A13}$ | $L_{B26}$ |
| 2389 | $L_{A14}$ | $L_{B26}$ |
| 2390 | $L_{A15}$ | $L_{B26}$ |
| 2391 | $L_{A16}$ | $L_{B26}$ |
| 2413 | $L_{A38}$ | $L_{B26}$ |
| 2414 | $L_{A39}$ | $L_{B26}$ |
| 2415 | $L_{A40}$ | $L_{B26}$ |
| 2416 | $L_{A41}$ | $L_{B26}$ |
| 2417 | $L_{A42}$ | $L_{B26}$ |
| 2418 | $L_{A43}$ | $L_{B26}$ |
| 2419 | $L_{A44}$ | $L_{B26}$ |
| 2420 | $L_{A45}$ | $L_{B26}$ |
| 2421 | $L_{A46}$ | $L_{B26}$ |
| 2422 | $L_{A47}$ | $L_{B26}$ |
| 2423 | $L_{A48}$ | $L_{B26}$ |
| 2424 | $L_{A49}$ | $L_{B26}$ |
| 2425 | $L_{A50}$ | $L_{B26}$ |
| 2426 | $L_{A51}$ | $L_{B26}$ |
| 2427 | $L_{A52}$ | $L_{B26}$ |
| 2428 | $L_{A53}$ | $L_{B26}$ |
| 2429 | $L_{A54}$ | $L_{B26}$ |
| 2430 | $L_{A55}$ | $L_{B26}$ |
| 2431 | $L_{A56}$ | $L_{B26}$ |
| 2432 | $L_{A57}$ | $L_{B26}$ |
| 2433 | $L_{A58}$ | $L_{B26}$ |
| 2434 | $L_{A59}$ | $L_{B26}$ |
| 2435 | $L_{A60}$ | $L_{B26}$ |
| 2436 | $L_{A61}$ | $L_{B26}$ |
| 2471 | $L_{A1}$ | $L_{B27}$ |
| 2472 | $L_{A2}$ | $L_{B27}$ |
| 2473 | $L_{A3}$ | $L_{B27}$ |
| 2474 | $L_{A4}$ | $L_{B27}$ |
| 2475 | $L_{A5}$ | $L_{B27}$ |
| 2476 | $L_{A6}$ | $L_{B27}$ |
| 2477 | $L_{A7}$ | $L_{B27}$ |
| 2478 | $L_{A8}$ | $L_{B27}$ |
| 2479 | $L_{A9}$ | $L_{B27}$ |
| 2480 | $L_{A10}$ | $L_{B27}$ |
| 2481 | $L_{A11}$ | $L_{B27}$ |
| 2482 | $L_{A12}$ | $L_{B27}$ |
| 2483 | $L_{A13}$ | $L_{B27}$ |
| 2484 | $L_{A14}$ | $L_{B27}$ |
| 2485 | $L_{A15}$ | $L_{B27}$ |
| 2486 | $L_{A16}$ | $L_{B27}$ |
| 2508 | $L_{A38}$ | $L_{B27}$ |
| 2509 | $L_{A39}$ | $L_{B27}$ |
| 2510 | $L_{A40}$ | $L_{B27}$ |
| 2511 | $L_{A41}$ | $L_{B27}$ |
| 2512 | $L_{A42}$ | $L_{B27}$ |
| 2513 | $L_{A43}$ | $L_{B27}$ |
| 2514 | $L_{A44}$ | $L_{B27}$ |
| 2515 | $L_{A45}$ | $L_{B27}$ |
| 2516 | $L_{A46}$ | $L_{B27}$ |
| 2517 | $L_{A47}$ | $L_{B27}$ |
| 2518 | $L_{A48}$ | $L_{B27}$ |
| 2519 | $L_{A49}$ | $L_{B27}$ |
| 2520 | $L_{A50}$ | $L_{B27}$ |
| 2521 | $L_{A51}$ | $L_{B27}$ |
| 2522 | $L_{A52}$ | $L_{B27}$ |
| 2523 | $L_{A53}$ | $L_{B27}$ |
| 2524 | $L_{A54}$ | $L_{B27}$ |
| 2525 | $L_{A55}$ | $L_{B27}$ |
| 2526 | $L_{A56}$ | $L_{B27}$ |
| 2527 | $L_{A57}$ | $L_{B27}$ |

-continued

| Cpd # | $L_A$ | $L_B$ |
|---|---|---|
| 2528 | $L_{A58}$ | $L_{B27}$ |
| 2529 | $L_{A59}$ | $L_{B27}$ |
| 2530 | $L_{A60}$ | $L_{B27}$ |
| 2531 | $L_{A61}$ | $L_{B27}$ |
| 2566 | $L_{A1}$ | $L_{B28}$ |
| 2567 | $L_{A2}$ | $L_{B28}$ |
| 2568 | $L_{A3}$ | $L_{B28}$ |
| 2569 | $L_{A4}$ | $L_{B28}$ |
| 2570 | $L_{A5}$ | $L_{B28}$ |
| 2571 | $L_{A6}$ | $L_{B28}$ |
| 2572 | $L_{A7}$ | $L_{B28}$ |
| 2573 | $L_{A8}$ | $L_{B28}$ |
| 2574 | $L_{A9}$ | $L_{B28}$ |
| 2575 | $L_{A10}$ | $L_{B28}$ |
| 2576 | $L_{A11}$ | $L_{B28}$ |
| 2577 | $L_{A12}$ | $L_{B28}$ |
| 2578 | $L_{A13}$ | $L_{B28}$ |
| 2579 | $L_{A14}$ | $L_{B28}$ |
| 2580 | $L_{A15}$ | $L_{B28}$ |
| 2581 | $L_{A16}$ | $L_{B28}$ |
| 2603 | $L_{A38}$ | $L_{B28}$ |
| 2604 | $L_{A39}$ | $L_{B28}$ |
| 2605 | $L_{A40}$ | $L_{B28}$ |
| 2606 | $L_{A41}$ | $L_{B28}$ |
| 2607 | $L_{A42}$ | $L_{B28}$ |
| 2608 | $L_{A43}$ | $L_{B28}$ |
| 2609 | $L_{A44}$ | $L_{B28}$ |
| 2610 | $L_{A45}$ | $L_{B28}$ |
| 2611 | $L_{A46}$ | $L_{B28}$ |
| 2612 | $L_{A47}$ | $L_{B28}$ |
| 2613 | $L_{A48}$ | $L_{B28}$ |
| 2614 | $L_{A49}$ | $L_{B28}$ |
| 2615 | $L_{A50}$ | $L_{B28}$ |
| 2616 | $L_{A51}$ | $L_{B28}$ |
| 2617 | $L_{A52}$ | $L_{B28}$ |
| 2618 | $L_{A53}$ | $L_{B28}$ |
| 2619 | $L_{A54}$ | $L_{B28}$ |
| 2620 | $L_{A55}$ | $L_{B28}$ |
| 2621 | $L_{A56}$ | $L_{B28}$ |
| 2622 | $L_{A57}$ | $L_{B28}$ |
| 2623 | $L_{A58}$ | $L_{B28}$ |
| 2624 | $L_{A59}$ | $L_{B28}$ |
| 2625 | $L_{A60}$ | $L_{B28}$ |
| 2626 | $L_{A61}$ | $L_{B28}$ |
| 2661 | $L_{A1}$ | $L_{B29}$ |
| 2662 | $L_{A2}$ | $L_{B29}$ |
| 2663 | $L_{A3}$ | $L_{B29}$ |
| 2664 | $L_{A4}$ | $L_{B29}$ |
| 2665 | $L_{A5}$ | $L_{B29}$ |
| 2666 | $L_{A6}$ | $L_{B29}$ |
| 2667 | $L_{A7}$ | $L_{B29}$ |
| 2668 | $L_{A8}$ | $L_{B29}$ |
| 2669 | $L_{A9}$ | $L_{B29}$ |
| 2670 | $L_{A10}$ | $L_{B29}$ |
| 2671 | $L_{A11}$ | $L_{B29}$ |
| 2672 | $L_{A12}$ | $L_{B29}$ |
| 2673 | $L_{A13}$ | $L_{B29}$ |
| 2674 | $L_{A14}$ | $L_{B29}$ |
| 2675 | $L_{A15}$ | $L_{B29}$ |
| 2676 | $L_{A16}$ | $L_{B29}$ |
| 2698 | $L_{A38}$ | $L_{B29}$ |
| 2699 | $L_{A39}$ | $L_{B29}$ |
| 2700 | $L_{A40}$ | $L_{B29}$ |
| 2701 | $L_{A41}$ | $L_{B29}$ |
| 2702 | $L_{A42}$ | $L_{B29}$ |
| 2703 | $L_{A43}$ | $L_{B29}$ |
| 2704 | $L_{A44}$ | $L_{B29}$ |
| 2705 | $L_{A45}$ | $L_{B29}$ |
| 2706 | $L_{A46}$ | $L_{B29}$ |
| 2707 | $L_{A47}$ | $L_{B29}$ |
| 2708 | $L_{A48}$ | $L_{B29}$ |
| 2709 | $L_{A49}$ | $L_{B29}$ |
| 2710 | $L_{A50}$ | $L_{B29}$ |
| 2711 | $L_{A51}$ | $L_{B29}$ |
| 2712 | $L_{A52}$ | $L_{B29}$ |
| 2713 | $L_{A53}$ | $L_{B29}$ |
| 2714 | $L_{A54}$ | $L_{B29}$ |

-continued

| Cpd # | $L_A$ | $L_B$ |
|---|---|---|
| 2715 | $L_{A55}$ | $L_{B29}$ |
| 2716 | $L_{A56}$ | $L_{B29}$ |
| 2717 | $L_{A57}$ | $L_{B29}$ |
| 2718 | $L_{A58}$ | $L_{B29}$ |
| 2719 | $L_{A59}$ | $L_{B29}$ |
| 2720 | $L_{A60}$ | $L_{B29}$ |
| 2721 | $L_{A61}$ | $L_{B29}$ |
| 2756 | $L_{A1}$ | $L_{B30}$ |
| 2757 | $L_{A2}$ | $L_{B30}$ |
| 2758 | $L_{A3}$ | $L_{B30}$ |
| 2759 | $L_{A4}$ | $L_{B30}$ |
| 2760 | $L_{A5}$ | $L_{B30}$ |
| 2761 | $L_{A6}$ | $L_{B30}$ |
| 2762 | $L_{A7}$ | $L_{B30}$ |
| 2763 | $L_{A8}$ | $L_{B30}$ |
| 2764 | $L_{A9}$ | $L_{B30}$ |
| 2765 | $L_{A10}$ | $L_{B30}$ |
| 2766 | $L_{A11}$ | $L_{B30}$ |
| 2767 | $L_{A12}$ | $L_{B30}$ |
| 2768 | $L_{A13}$ | $L_{B30}$ |
| 2769 | $L_{A14}$ | $L_{B30}$ |
| 2770 | $L_{A15}$ | $L_{B30}$ |
| 2771 | $L_{A16}$ | $L_{B30}$ |
| 2793 | $L_{A38}$ | $L_{B30}$ |
| 2794 | $L_{A39}$ | $L_{B30}$ |
| 2795 | $L_{A40}$ | $L_{B30}$ |
| 2796 | $L_{A41}$ | $L_{B30}$ |
| 2797 | $L_{A42}$ | $L_{B30}$ |
| 2798 | $L_{A43}$ | $L_{B30}$ |
| 2799 | $L_{A44}$ | $L_{B30}$ |
| 2800 | $L_{A45}$ | $L_{B30}$ |
| 2801 | $L_{A46}$ | $L_{B30}$ |
| 2802 | $L_{A47}$ | $L_{B30}$ |
| 2803 | $L_{A48}$ | $L_{B30}$ |
| 2804 | $L_{A49}$ | $L_{B30}$ |
| 2805 | $L_{A50}$ | $L_{B30}$ |
| 2806 | $L_{A51}$ | $L_{B30}$ |
| 2807 | $L_{A52}$ | $L_{B30}$ |
| 2808 | $L_{A53}$ | $L_{B30}$ |
| 2809 | $L_{A54}$ | $L_{B30}$ |
| 2810 | $L_{A55}$ | $L_{B30}$ |
| 2811 | $L_{A56}$ | $L_{B30}$ |
| 2812 | $L_{A57}$ | $L_{B30}$ |
| 2813 | $L_{A58}$ | $L_{B30}$ |
| 2814 | $L_{A59}$ | $L_{B30}$ |
| 2815 | $L_{A60}$ | $L_{B30}$ |
| 2816 | $L_{A61}$ | $L_{B30}$ |
| 2851 | $L_{A1}$ | $L_{B31}$ |
| 2852 | $L_{A2}$ | $L_{B31}$ |
| 2853 | $L_{A3}$ | $L_{B31}$ |
| 2854 | $L_{A4}$ | $L_{B31}$ |
| 2855 | $L_{A5}$ | $L_{B31}$ |
| 2856 | $L_{A6}$ | $L_{B31}$ |
| 2857 | $L_{A7}$ | $L_{B31}$ |
| 2858 | $L_{A8}$ | $L_{B31}$ |
| 2859 | $L_{A9}$ | $L_{B31}$ |
| 2860 | $L_{A10}$ | $L_{B31}$ |
| 2861 | $L_{A11}$ | $L_{B31}$ |
| 2862 | $L_{A12}$ | $L_{B31}$ |
| 2863 | $L_{A13}$ | $L_{B31}$ |
| 2864 | $L_{A14}$ | $L_{B31}$ |
| 2865 | $L_{A15}$ | $L_{B31}$ |
| 2866 | $L_{A16}$ | $L_{B31}$ |
| 2888 | $L_{A38}$ | $L_{B31}$ |
| 2889 | $L_{A39}$ | $L_{B31}$ |
| 2890 | $L_{A40}$ | $L_{B31}$ |
| 2891 | $L_{A41}$ | $L_{B31}$ |
| 2892 | $L_{A42}$ | $L_{B31}$ |
| 2893 | $L_{A43}$ | $L_{B31}$ |
| 2894 | $L_{A44}$ | $L_{B31}$ |
| 2895 | $L_{A45}$ | $L_{B31}$ |
| 2896 | $L_{A46}$ | $L_{B31}$ |
| 2897 | $L_{A47}$ | $L_{B31}$ |
| 2898 | $L_{A48}$ | $L_{B31}$ |
| 2899 | $L_{A49}$ | $L_{B31}$ |
| 2900 | $L_{A50}$ | $L_{B31}$ |
| 2901 | $L_{A51}$ | $L_{B31}$ |

-continued

| Cpd # | $L_A$ | $L_B$ |
|---|---|---|
| 2902 | $L_{A52}$ | $L_{B31}$ |
| 2903 | $L_{A53}$ | $L_{B31}$ |
| 2904 | $L_{A54}$ | $L_{B31}$ |
| 2905 | $L_{A55}$ | $L_{B31}$ |
| 2906 | $L_{A56}$ | $L_{B31}$ |
| 2907 | $L_{A57}$ | $L_{B31}$ |
| 2908 | $L_{A58}$ | $L_{B31}$ |
| 2909 | $L_{A59}$ | $L_{B31}$ |
| 2910 | $L_{A60}$ | $L_{B31}$ |
| 2911 | $L_{A61}$ | $L_{B31}$ |
| 2946 | $L_{A1}$ | $L_{B32}$ |
| 2947 | $L_{A2}$ | $L_{B32}$ |
| 2948 | $L_{A3}$ | $L_{B32}$ |
| 2949 | $L_{A4}$ | $L_{B32}$ |
| 2950 | $L_{A5}$ | $L_{B32}$ |
| 2951 | $L_{A6}$ | $L_{B32}$ |
| 2952 | $L_{A7}$ | $L_{B32}$ |
| 2953 | $L_{A8}$ | $L_{B32}$ |
| 2954 | $L_{A9}$ | $L_{B32}$ |
| 2955 | $L_{A10}$ | $L_{B32}$ |
| 2956 | $L_{A11}$ | $L_{B32}$ |
| 2957 | $L_{A12}$ | $L_{B32}$ |
| 2958 | $L_{A13}$ | $L_{B32}$ |
| 2959 | $L_{A14}$ | $L_{B32}$ |
| 2960 | $L_{A15}$ | $L_{B32}$ |
| 2961 | $L_{A16}$ | $L_{B32}$ |
| 2983 | $L_{A38}$ | $L_{B32}$ |
| 2984 | $L_{A39}$ | $L_{B32}$ |
| 2985 | $L_{A40}$ | $L_{B32}$ |
| 2986 | $L_{A41}$ | $L_{B32}$ |
| 2987 | $L_{A42}$ | $L_{B32}$ |
| 2988 | $L_{A43}$ | $L_{B32}$ |
| 2989 | $L_{A44}$ | $L_{B32}$ |
| 2990 | $L_{A45}$ | $L_{B32}$ |
| 2991 | $L_{A46}$ | $L_{B32}$ |
| 2992 | $L_{A47}$ | $L_{B32}$ |
| 2993 | $L_{A48}$ | $L_{B32}$ |
| 2994 | $L_{A49}$ | $L_{B32}$ |
| 2995 | $L_{A50}$ | $L_{B32}$ |
| 2996 | $L_{A51}$ | $L_{B32}$ |
| 2997 | $L_{A52}$ | $L_{B32}$ |
| 2998 | $L_{A53}$ | $L_{B32}$ |
| 2999 | $L_{A54}$ | $L_{B32}$ |
| 3000 | $L_{A55}$ | $L_{B32}$ |
| 3001 | $L_{A56}$ | $L_{B32}$ |
| 3002 | $L_{A57}$ | $L_{B32}$ |
| 3003 | $L_{A58}$ | $L_{B32}$ |
| 3004 | $L_{A59}$ | $L_{B32}$ |
| 3005 | $L_{A60}$ | $L_{B32}$ |
| 3006 | $L_{A61}$ | $L_{B32}$ |
| 3041 | $L_{A1}$ | $L_{B33}$ |
| 3042 | $L_{A2}$ | $L_{B33}$ |
| 3043 | $L_{A3}$ | $L_{B33}$ |
| 3044 | $L_{A4}$ | $L_{B33}$ |
| 3045 | $L_{A5}$ | $L_{B33}$ |
| 3046 | $L_{A6}$ | $L_{B33}$ |
| 3047 | $L_{A7}$ | $L_{B33}$ |
| 3048 | $L_{A8}$ | $L_{B33}$ |
| 3049 | $L_{A9}$ | $L_{B33}$ |
| 3050 | $L_{A10}$ | $L_{B33}$ |
| 3051 | $L_{A11}$ | $L_{B33}$ |
| 3052 | $L_{A12}$ | $L_{B33}$ |
| 3053 | $L_{A13}$ | $L_{B33}$ |
| 3054 | $L_{A14}$ | $L_{B33}$ |
| 3055 | $L_{A15}$ | $L_{B33}$ |
| 3056 | $L_{A16}$ | $L_{B33}$ |
| 3078 | $L_{A38}$ | $L_{B33}$ |
| 3079 | $L_{A39}$ | $L_{B33}$ |
| 3080 | $L_{A40}$ | $L_{B33}$ |
| 3081 | $L_{A41}$ | $L_{B33}$ |
| 3082 | $L_{A42}$ | $L_{B33}$ |
| 3083 | $L_{A43}$ | $L_{B33}$ |
| 3084 | $L_{A44}$ | $L_{B33}$ |
| 3085 | $L_{A45}$ | $L_{B33}$ |
| 3086 | $L_{A46}$ | $L_{B33}$ |
| 3087 | $L_{A47}$ | $L_{B33}$ |
| 3088 | $L_{A48}$ | $L_{B33}$ |

-continued

| Cpd # | $L_A$ | $L_B$ |
|---|---|---|
| 3089 | $L_{A49}$ | $L_{B33}$ |
| 3090 | $L_{A50}$ | $L_{B33}$ |
| 3091 | $L_{A51}$ | $L_{B33}$ |
| 3092 | $L_{A52}$ | $L_{B33}$ |
| 3093 | $L_{A53}$ | $L_{B33}$ |
| 3094 | $L_{A54}$ | $L_{B33}$ |
| 3095 | $L_{A55}$ | $L_{B33}$ |
| 3096 | $L_{A56}$ | $L_{B33}$ |
| 3097 | $L_{A57}$ | $L_{B33}$ |
| 3098 | $L_{A58}$ | $L_{B33}$ |
| 3099 | $L_{A59}$ | $L_{B33}$ |
| 3100 | $L_{A60}$ | $L_{B33}$ |
| 3101 | $L_{A61}$ | $L_{B33}$ |
| 3136 | $L_{A1}$ | $L_{B34}$ |
| 3137 | $L_{A2}$ | $L_{B34}$ |
| 3138 | $L_{A3}$ | $L_{B34}$ |
| 3139 | $L_{A4}$ | $L_{B34}$ |
| 3140 | $L_{A5}$ | $L_{B34}$ |
| 3141 | $L_{A6}$ | $L_{B34}$ |
| 3142 | $L_{A7}$ | $L_{B34}$ |
| 3143 | $L_{A8}$ | $L_{B34}$ |
| 3144 | $L_{A9}$ | $L_{B34}$ |
| 3145 | $L_{A10}$ | $L_{B34}$ |
| 3146 | $L_{A11}$ | $L_{B34}$ |
| 3147 | $L_{A12}$ | $L_{B34}$ |
| 3148 | $L_{A13}$ | $L_{B34}$ |
| 3149 | $L_{A14}$ | $L_{B34}$ |
| 3150 | $L_{A15}$ | $L_{B34}$ |
| 3151 | $L_{A16}$ | $L_{B34}$ |
| 3173 | $L_{A38}$ | $L_{B34}$ |
| 3174 | $L_{A39}$ | $L_{B34}$ |
| 3175 | $L_{A40}$ | $L_{B34}$ |
| 3176 | $L_{A41}$ | $L_{B34}$ |
| 3177 | $L_{A42}$ | $L_{B34}$ |
| 3178 | $L_{A43}$ | $L_{B34}$ |
| 3179 | $L_{A44}$ | $L_{B34}$ |
| 3180 | $L_{A45}$ | $L_{B34}$ |
| 3181 | $L_{A46}$ | $L_{B34}$ |
| 3182 | $L_{A47}$ | $L_{B34}$ |
| 3183 | $L_{A48}$ | $L_{B34}$ |
| 3184 | $L_{A49}$ | $L_{B34}$ |
| 3185 | $L_{A50}$ | $L_{B34}$ |
| 3186 | $L_{A51}$ | $L_{B34}$ |
| 3187 | $L_{A52}$ | $L_{B34}$ |
| 3188 | $L_{A53}$ | $L_{B34}$ |
| 3189 | $L_{A54}$ | $L_{B34}$ |
| 3190 | $L_{A55}$ | $L_{B34}$ |
| 3191 | $L_{A56}$ | $L_{B34}$ |
| 3192 | $L_{A57}$ | $L_{B34}$ |
| 3193 | $L_{A58}$ | $L_{B34}$ |
| 3194 | $L_{A59}$ | $L_{B34}$ |
| 3195 | $L_{A60}$ | $L_{B34}$ |
| 3196 | $L_{A61}$ | $L_{B34}$ |
| 3231 | $L_{A1}$ | $L_{B35}$ |
| 3232 | $L_{A2}$ | $L_{B35}$ |
| 3233 | $L_{A3}$ | $L_{B35}$ |
| 3234 | $L_{A4}$ | $L_{B35}$ |
| 3235 | $L_{A5}$ | $L_{B35}$ |
| 3236 | $L_{A6}$ | $L_{B35}$ |
| 3237 | $L_{A7}$ | $L_{B35}$ |
| 3238 | $L_{A8}$ | $L_{B35}$ |
| 3239 | $L_{A9}$ | $L_{B35}$ |
| 3240 | $L_{A10}$ | $L_{B35}$ |
| 3241 | $L_{A11}$ | $L_{B35}$ |
| 3242 | $L_{A12}$ | $L_{B35}$ |
| 3243 | $L_{A13}$ | $L_{B35}$ |
| 3244 | $L_{A14}$ | $L_{B35}$ |
| 3245 | $L_{A15}$ | $L_{B35}$ |
| 3246 | $L_{A16}$ | $L_{B35}$ |
| 3268 | $L_{A38}$ | $L_{B35}$ |
| 3269 | $L_{A39}$ | $L_{B35}$ |
| 3270 | $L_{A40}$ | $L_{B35}$ |
| 3271 | $L_{A41}$ | $L_{B35}$ |
| 3272 | $L_{A42}$ | $L_{B35}$ |
| 3273 | $L_{A43}$ | $L_{B35}$ |
| 3274 | $L_{A44}$ | $L_{B35}$ |
| 3275 | $L_{A45}$ | $L_{B35}$ |

-continued

| Cpd # | $L_A$ | $L_B$ |
|---|---|---|
| 3276 | $L_{A46}$ | $L_{B35}$ |
| 3277 | $L_{A47}$ | $L_{B35}$ |
| 3278 | $L_{A48}$ | $L_{B35}$ |
| 3279 | $L_{A49}$ | $L_{B35}$ |
| 3280 | $L_{A50}$ | $L_{B35}$ |
| 3281 | $L_{A51}$ | $L_{B35}$ |
| 3282 | $L_{A52}$ | $L_{B35}$ |
| 3283 | $L_{A53}$ | $L_{B35}$ |
| 3284 | $L_{A54}$ | $L_{B35}$ |
| 3285 | $L_{A55}$ | $L_{B35}$ |
| 3286 | $L_{A56}$ | $L_{B35}$ |
| 3287 | $L_{A57}$ | $L_{B35}$ |
| 3288 | $L_{A58}$ | $L_{B35}$ |
| 3289 | $L_{A59}$ | $L_{B35}$ |
| 3290 | $L_{A60}$ | $L_{B35}$ |
| 3291 | $L_{A61}$ | $L_{B35}$ |
| 3326 | $L_{A1}$ | $L_{B36}$ |
| 3327 | $L_{A2}$ | $L_{B36}$ |
| 3328 | $L_{A3}$ | $L_{B36}$ |
| 3329 | $L_{A4}$ | $L_{B36}$ |
| 3330 | $L_{A5}$ | $L_{B36}$ |
| 3331 | $L_{A6}$ | $L_{B36}$ |
| 3332 | $L_{A7}$ | $L_{B36}$ |
| 3333 | $L_{A8}$ | $L_{B36}$ |
| 3334 | $L_{A9}$ | $L_{B36}$ |
| 3335 | $L_{A10}$ | $L_{B36}$ |
| 3336 | $L_{A11}$ | $L_{B36}$ |
| 3337 | $L_{A12}$ | $L_{B36}$ |
| 3338 | $L_{A13}$ | $L_{B36}$ |
| 3339 | $L_{A14}$ | $L_{B36}$ |
| 3340 | $L_{A15}$ | $L_{B36}$ |
| 3341 | $L_{A16}$ | $L_{B36}$ |
| 3363 | $L_{A38}$ | $L_{B36}$ |
| 3364 | $L_{A39}$ | $L_{B36}$ |
| 3365 | $L_{A40}$ | $L_{B36}$ |
| 3366 | $L_{A41}$ | $L_{B36}$ |
| 3367 | $L_{A42}$ | $L_{B36}$ |
| 3368 | $L_{A43}$ | $L_{B36}$ |
| 3369 | $L_{A44}$ | $L_{B36}$ |
| 3370 | $L_{A45}$ | $L_{B36}$ |
| 3371 | $L_{A46}$ | $L_{B36}$ |
| 3372 | $L_{A47}$ | $L_{B36}$ |
| 3373 | $L_{A48}$ | $L_{B36}$ |
| 3374 | $L_{A49}$ | $L_{B36}$ |
| 3375 | $L_{A50}$ | $L_{B36}$ |
| 3376 | $L_{A51}$ | $L_{B36}$ |
| 3377 | $L_{A52}$ | $L_{B36}$ |
| 3378 | $L_{A53}$ | $L_{B36}$ |
| 3379 | $L_{A54}$ | $L_{B36}$ |
| 3380 | $L_{A55}$ | $L_{B36}$ |
| 3381 | $L_{A56}$ | $L_{B36}$ |
| 3382 | $L_{A57}$ | $L_{B36}$ |
| 3383 | $L_{A58}$ | $L_{B36}$ |
| 3384 | $L_{A59}$ | $L_{B36}$ |
| 3385 | $L_{A60}$ | $L_{B36}$ |
| 3386 | $L_{A61}$ | $L_{B36}$ |
| 3421 | $L_{A1}$ | $L_{B37}$ |
| 3422 | $L_{A2}$ | $L_{B37}$ |
| 3423 | $L_{A3}$ | $L_{B37}$ |
| 3424 | $L_{A4}$ | $L_{B37}$ |
| 3425 | $L_{A5}$ | $L_{B37}$ |
| 3426 | $L_{A6}$ | $L_{B37}$ |
| 3427 | $L_{A7}$ | $L_{B37}$ |
| 3428 | $L_{A8}$ | $L_{B37}$ |
| 3429 | $L_{A9}$ | $L_{B37}$ |
| 3430 | $L_{A10}$ | $L_{B37}$ |
| 3431 | $L_{A11}$ | $L_{B37}$ |
| 3432 | $L_{A12}$ | $L_{B37}$ |
| 3433 | $L_{A13}$ | $L_{B37}$ |
| 3434 | $L_{A14}$ | $L_{B37}$ |
| 3435 | $L_{A15}$ | $L_{B37}$ |
| 3436 | $L_{A16}$ | $L_{B37}$ |
| 3458 | $L_{A38}$ | $L_{B37}$ |
| 3459 | $L_{A39}$ | $L_{B37}$ |
| 3460 | $L_{A40}$ | $L_{B37}$ |
| 3461 | $L_{A41}$ | $L_{B37}$ |
| 3462 | $L_{A42}$ | $L_{B37}$ |

-continued

| Cpd # | $L_A$ | $L_B$ |
|---|---|---|
| 3463 | $L_{A43}$ | $L_{B37}$ |
| 3464 | $L_{A44}$ | $L_{B37}$ |
| 3465 | $L_{A45}$ | $L_{B37}$ |
| 3466 | $L_{A46}$ | $L_{B37}$ |
| 3467 | $L_{A47}$ | $L_{B37}$ |
| 3468 | $L_{A48}$ | $L_{B37}$ |
| 3469 | $L_{A49}$ | $L_{B37}$ |
| 3470 | $L_{A50}$ | $L_{B37}$ |
| 3471 | $L_{A51}$ | $L_{B37}$ |
| 3472 | $L_{A52}$ | $L_{B37}$ |
| 3473 | $L_{A53}$ | $L_{B37}$ |
| 3474 | $L_{A54}$ | $L_{B37}$ |
| 3475 | $L_{A55}$ | $L_{B37}$ |
| 3476 | $L_{A56}$ | $L_{B37}$ |
| 3477 | $L_{A57}$ | $L_{B37}$ |
| 3478 | $L_{A58}$ | $L_{B37}$ |
| 3479 | $L_{A59}$ | $L_{B37}$ |
| 3480 | $L_{A60}$ | $L_{B37}$ |
| 3481 | $L_{A61}$ | $L_{B37}$ |
| 3516 | $L_{A1}$ | $L_{B38}$ |
| 3517 | $L_{A2}$ | $L_{B38}$ |
| 3518 | $L_{A3}$ | $L_{B38}$ |
| 3519 | $L_{A4}$ | $L_{B38}$ |
| 3520 | $L_{A5}$ | $L_{B38}$ |
| 3521 | $L_{A6}$ | $L_{B38}$ |
| 3522 | $L_{A7}$ | $L_{B38}$ |
| 3523 | $L_{A8}$ | $L_{B38}$ |
| 3524 | $L_{A9}$ | $L_{B38}$ |
| 3525 | $L_{A10}$ | $L_{B38}$ |
| 3526 | $L_{A11}$ | $L_{B38}$ |
| 3527 | $L_{A12}$ | $L_{B38}$ |
| 3528 | $L_{A13}$ | $L_{B38}$ |
| 3529 | $L_{A14}$ | $L_{B38}$ |
| 3530 | $L_{A15}$ | $L_{B38}$ |
| 3531 | $L_{A16}$ | $L_{B38}$ |
| 3532 | $L_{A17}$ | $L_{B38}$ |
| 3533 | $L_{A18}$ | $L_{B38}$ |
| 3534 | $L_{A19}$ | $L_{B38}$ |
| 3535 | $L_{A20}$ | $L_{B38}$ |
| 3536 | $L_{A21}$ | $L_{B38}$ |
| 3537 | $L_{A22}$ | $L_{B38}$ |
| 3538 | $L_{A23}$ | $L_{B38}$ |
| 3539 | $L_{A24}$ | $L_{B38}$ |
| 3540 | $L_{A25}$ | $L_{B38}$ |
| 3541 | $L_{A26}$ | $L_{B38}$ |
| 3542 | $L_{A27}$ | $L_{B38}$ |
| 3543 | $L_{A28}$ | $L_{B38}$ |
| 3544 | $L_{A29}$ | $L_{B38}$ |
| 3545 | $L_{A30}$ | $L_{B38}$ |
| 3546 | $L_{A31}$ | $L_{B38}$ |
| 3547 | $L_{A32}$ | $L_{B38}$ |
| 3548 | $L_{A33}$ | $L_{B38}$ |
| 3549 | $L_{A34}$ | $L_{B38}$ |
| 3550 | $L_{A35}$ | $L_{B38}$ |
| 3551 | $L_{A36}$ | $L_{B38}$ |
| 3552 | $L_{A37}$ | $L_{B38}$ |
| 3553 | $L_{A38}$ | $L_{B38}$ |
| 3554 | $L_{A39}$ | $L_{B38}$ |
| 3555 | $L_{A40}$ | $L_{B38}$ |
| 3556 | $L_{A41}$ | $L_{B38}$ |
| 3557 | $L_{A42}$ | $L_{B38}$ |
| 3558 | $L_{A43}$ | $L_{B38}$ |
| 3559 | $L_{A44}$ | $L_{B38}$ |
| 3560 | $L_{A45}$ | $L_{B38}$ |
| 3561 | $L_{A46}$ | $L_{B38}$ |
| 3562 | $L_{A47}$ | $L_{B38}$ |
| 3563 | $L_{A48}$ | $L_{B38}$ |
| 3564 | $L_{A49}$ | $L_{B38}$ |
| 3565 | $L_{A50}$ | $L_{B38}$ |
| 3566 | $L_{A51}$ | $L_{B38}$ |
| 3567 | $L_{A52}$ | $L_{B38}$ |
| 3568 | $L_{A53}$ | $L_{B38}$ |
| 3569 | $L_{A54}$ | $L_{B38}$ |
| 3570 | $L_{A55}$ | $L_{B38}$ |
| 3571 | $L_{A56}$ | $L_{B38}$ |
| 3572 | $L_{A57}$ | $L_{B38}$ |
| 3573 | $L_{A58}$ | $L_{B38}$ |

-continued

| Cpd # | $L_A$ | $L_B$ |
|---|---|---|
| 3574 | $L_{A59}$ | $L_{B38}$ |
| 3575 | $L_{A60}$ | $L_{B38}$ |
| 3576 | $L_{A61}$ | $L_{B38}$ |
| 3577 | $L_{A62}$ | $L_{B38}$ |
| 3578 | $L_{A63}$ | $L_{B38}$ |
| 3579 | $L_{A64}$ | $L_{B38}$ |
| 3580 | $L_{A65}$ | $L_{B38}$ |
| 3581 | $L_{A66}$ | $L_{B38}$ |
| 3582 | $L_{A67}$ | $L_{B38}$ |
| 3583 | $L_{A68}$ | $L_{B38}$ |
| 3584 | $L_{A69}$ | $L_{B38}$ |
| 3585 | $L_{A70}$ | $L_{B38}$ |
| 3586 | $L_{A71}$ | $L_{B38}$ |
| 3587 | $L_{A72}$ | $L_{B38}$ |
| 3588 | $L_{A73}$ | $L_{B38}$ |
| 3589 | $L_{A74}$ | $L_{B38}$ |
| 3590 | $L_{A75}$ | $L_{B38}$ |
| 3591 | $L_{A76}$ | $L_{B38}$ |
| 3592 | $L_{A77}$ | $L_{B38}$ |
| 3593 | $L_{A78}$ | $L_{B38}$ |
| 3594 | $L_{A79}$ | $L_{B38}$ |
| 3595 | $L_{A80}$ | $L_{B38}$ |
| 3596 | $L_{A81}$ | $L_{B38}$ |
| 3597 | $L_{A82}$ | $L_{B38}$ |
| 3598 | $L_{A83}$ | $L_{B38}$ |
| 3599 | $L_{A84}$ | $L_{B38}$ |
| 3600 | $L_{A85}$ | $L_{B38}$ |
| 3601 | $L_{A86}$ | $L_{B38}$ |
| 3602 | $L_{A87}$ | $L_{B38}$ |
| 3603 | $L_{A88}$ | $L_{B38}$ |
| 3604 | $L_{A89}$ | $L_{B38}$ |
| 3605 | $L_{A90}$ | $L_{B38}$ |
| 3606 | $L_{A91}$ | $L_{B38}$ |
| 3607 | $L_{A92}$ | $L_{B38}$ |
| 3608 | $L_{A93}$ | $L_{B38}$ |
| 3609 | $L_{A94}$ | $L_{B38}$ |
| 3610 | $L_{A95}$ | $L_{B38}$ |
| 3611 | $L_{A1}$ | $L_{B39}$ |
| 3612 | $L_{A2}$ | $L_{B39}$ |
| 3613 | $L_{A3}$ | $L_{B39}$ |
| 3614 | $L_{A4}$ | $L_{B39}$ |
| 3615 | $L_{A5}$ | $L_{B39}$ |
| 3616 | $L_{A6}$ | $L_{B39}$ |
| 3617 | $L_{A7}$ | $L_{B39}$ |
| 3618 | $L_{A8}$ | $L_{B39}$ |
| 3619 | $L_{A9}$ | $L_{B39}$ |
| 3620 | $L_{A10}$ | $L_{B39}$ |
| 3621 | $L_{A11}$ | $L_{B39}$ |
| 3622 | $L_{A12}$ | $L_{B39}$ |
| 3623 | $L_{A13}$ | $L_{B39}$ |
| 3624 | $L_{A14}$ | $L_{B39}$ |
| 3625 | $L_{A15}$ | $L_{B39}$ |
| 3626 | $L_{A16}$ | $L_{B39}$ |
| 3627 | $L_{A17}$ | $L_{B39}$ |
| 3628 | $L_{A18}$ | $L_{B39}$ |
| 3629 | $L_{A19}$ | $L_{B39}$ |
| 3630 | $L_{A20}$ | $L_{B39}$ |
| 3631 | $L_{A21}$ | $L_{B39}$ |
| 3632 | $L_{A22}$ | $L_{B39}$ |
| 3633 | $L_{A23}$ | $L_{B39}$ |
| 3634 | $L_{A24}$ | $L_{B39}$ |
| 3635 | $L_{A25}$ | $L_{B39}$ |
| 3636 | $L_{A26}$ | $L_{B39}$ |
| 3637 | $L_{A27}$ | $L_{B39}$ |
| 3638 | $L_{A28}$ | $L_{B39}$ |
| 3639 | $L_{A29}$ | $L_{B39}$ |
| 3640 | $L_{A30}$ | $L_{B39}$ |
| 3641 | $L_{A31}$ | $L_{B39}$ |
| 3642 | $L_{A32}$ | $L_{B39}$ |
| 3643 | $L_{A33}$ | $L_{B39}$ |
| 3644 | $L_{A34}$ | $L_{B39}$ |
| 3645 | $L_{A35}$ | $L_{B39}$ |
| 3646 | $L_{A36}$ | $L_{B39}$ |
| 3647 | $L_{A37}$ | $L_{B39}$ |
| 3648 | $L_{A38}$ | $L_{B39}$ |
| 3649 | $L_{A39}$ | $L_{B39}$ |
| 3650 | $L_{A40}$ | $L_{B39}$ |

-continued

| Cpd # | $L_A$ | $L_B$ |
|---|---|---|
| 3651 | $L_{A441}$ | $L_{B39}$ |
| 3652 | $L_{A442}$ | $L_{B39}$ |
| 3653 | $L_{A443}$ | $L_{B39}$ |
| 3654 | $L_{A444}$ | $L_{B39}$ |
| 3655 | $L_{A445}$ | $L_{B39}$ |
| 3656 | $L_{A446}$ | $L_{B39}$ |
| 3657 | $L_{A447}$ | $L_{B39}$ |
| 3658 | $L_{A448}$ | $L_{B39}$ |
| 3659 | $L_{A449}$ | $L_{B39}$ |
| 3660 | $L_{A450}$ | $L_{B39}$ |
| 3661 | $L_{A451}$ | $L_{B39}$ |
| 3662 | $L_{A452}$ | $L_{B39}$ |
| 3663 | $L_{A453}$ | $L_{B39}$ |
| 3664 | $L_{A454}$ | $L_{B39}$ |
| 3665 | $L_{A455}$ | $L_{B39}$ |
| 3666 | $L_{A456}$ | $L_{B39}$ |
| 3667 | $L_{A457}$ | $L_{B39}$ |
| 3668 | $L_{A458}$ | $L_{B39}$ |
| 3669 | $L_{A459}$ | $L_{B39}$ |
| 3670 | $L_{A460}$ | $L_{B39}$ |
| 3671 | $L_{A461}$ | $L_{B39}$ |
| 3672 | $L_{A462}$ | $L_{B39}$ |
| 3673 | $L_{A463}$ | $L_{B39}$ |
| 3674 | $L_{A464}$ | $L_{B39}$ |
| 3675 | $L_{A465}$ | $L_{B39}$ |
| 3676 | $L_{A466}$ | $L_{B39}$ |
| 3677 | $L_{A467}$ | $L_{B39}$ |
| 3678 | $L_{A468}$ | $L_{B39}$ |
| 3679 | $L_{A469}$ | $L_{B39}$ |
| 3680 | $L_{A470}$ | $L_{B39}$ |
| 3681 | $L_{A471}$ | $L_{B39}$ |
| 3682 | $L_{A472}$ | $L_{B39}$ |
| 3683 | $L_{A473}$ | $L_{B39}$ |
| 3684 | $L_{A474}$ | $L_{B39}$ |
| 3685 | $L_{A475}$ | $L_{B39}$ |
| 3686 | $L_{A476}$ | $L_{B39}$ |
| 3687 | $L_{A477}$ | $L_{B39}$ |
| 3688 | $L_{A478}$ | $L_{B39}$ |
| 3689 | $L_{A479}$ | $L_{B39}$ |
| 3690 | $L_{A480}$ | $L_{B39}$ |
| 3691 | $L_{A481}$ | $L_{B39}$ |
| 3692 | $L_{A482}$ | $L_{B39}$ |
| 3693 | $L_{A483}$ | $L_{B39}$ |
| 3694 | $L_{A484}$ | $L_{B39}$ |
| 3695 | $L_{A485}$ | $L_{B39}$ |
| 3696 | $L_{A486}$ | $L_{B39}$ |
| 3697 | $L_{A487}$ | $L_{B39}$ |
| 3698 | $L_{A488}$ | $L_{B39}$ |
| 3699 | $L_{A489}$ | $L_{B39}$ |
| 3700 | $L_{A490}$ | $L_{B39}$ |
| 3701 | $L_{A491}$ | $L_{B39}$ |
| 3702 | $L_{A492}$ | $L_{B39}$ |
| 3703 | $L_{A493}$ | $L_{B39}$ |
| 3704 | $L_{A494}$ | $L_{B39}$ |
| 3705 | $L_{A495}$ | $L_{B39}$ |
| 3706 | $L_{A1}$ | $L_{B40}$ |
| 3707 | $L_{A2}$ | $L_{B40}$ |
| 3708 | $L_{A3}$ | $L_{B40}$ |
| 3709 | $L_{A4}$ | $L_{B40}$ |
| 3710 | $L_{A5}$ | $L_{B40}$ |
| 3711 | $L_{A6}$ | $L_{B40}$ |
| 3712 | $L_{A7}$ | $L_{B40}$ |
| 3713 | $L_{A8}$ | $L_{B40}$ |
| 3714 | $L_{A9}$ | $L_{B40}$ |
| 3715 | $L_{A10}$ | $L_{B40}$ |
| 3716 | $L_{A11}$ | $L_{B40}$ |
| 3717 | $L_{A12}$ | $L_{B40}$ |
| 3718 | $L_{A13}$ | $L_{B40}$ |
| 3719 | $L_{A14}$ | $L_{B40}$ |
| 3720 | $L_{A15}$ | $L_{B40}$ |
| 3721 | $L_{A16}$ | $L_{B40}$ |
| 3722 | $L_{A17}$ | $L_{B40}$ |
| 3723 | $L_{A18}$ | $L_{B40}$ |
| 3724 | $L_{A19}$ | $L_{B40}$ |
| 3725 | $L_{A20}$ | $L_{B40}$ |
| 3726 | $L_{A21}$ | $L_{B40}$ |
| 3727 | $L_{A22}$ | $L_{B40}$ |

-continued

| Cpd # | $L_A$ | $L_B$ |
|---|---|---|
| 3728 | $L_{A23}$ | $L_{B40}$ |
| 3729 | $L_{A24}$ | $L_{B40}$ |
| 3730 | $L_{A25}$ | $L_{B40}$ |
| 3731 | $L_{A26}$ | $L_{B40}$ |
| 3732 | $L_{A27}$ | $L_{B40}$ |
| 3733 | $L_{A28}$ | $L_{B40}$ |
| 3734 | $L_{A29}$ | $L_{B40}$ |
| 3735 | $L_{A30}$ | $L_{B40}$ |
| 3736 | $L_{A31}$ | $L_{B40}$ |
| 3737 | $L_{A32}$ | $L_{B40}$ |
| 3738 | $L_{A33}$ | $L_{B40}$ |
| 3739 | $L_{A34}$ | $L_{B40}$ |
| 3740 | $L_{A35}$ | $L_{B40}$ |
| 3741 | $L_{A36}$ | $L_{B40}$ |
| 3742 | $L_{A37}$ | $L_{B40}$ |
| 3743 | $L_{A38}$ | $L_{B40}$ |
| 3744 | $L_{A39}$ | $L_{B40}$ |
| 3745 | $L_{A40}$ | $L_{B40}$ |
| 3746 | $L_{A41}$ | $L_{B40}$ |
| 3747 | $L_{A42}$ | $L_{B40}$ |
| 3748 | $L_{A43}$ | $L_{B40}$ |
| 3749 | $L_{A44}$ | $L_{B40}$ |
| 3750 | $L_{A45}$ | $L_{B40}$ |
| 3751 | $L_{A46}$ | $L_{B40}$ |
| 3752 | $L_{A47}$ | $L_{B40}$ |
| 3753 | $L_{A48}$ | $L_{B40}$ |
| 3754 | $L_{A49}$ | $L_{B40}$ |
| 3755 | $L_{A50}$ | $L_{B40}$ |
| 3756 | $L_{A51}$ | $L_{B40}$ |
| 3757 | $L_{A52}$ | $L_{B40}$ |
| 3758 | $L_{A53}$ | $L_{B40}$ |
| 3759 | $L_{A54}$ | $L_{B40}$ |
| 3760 | $L_{A55}$ | $L_{B40}$ |
| 3761 | $L_{A56}$ | $L_{B40}$ |
| 3762 | $L_{A57}$ | $L_{B40}$ |
| 3763 | $L_{A58}$ | $L_{B40}$ |
| 3764 | $L_{A59}$ | $L_{B40}$ |
| 3765 | $L_{A60}$ | $L_{B40}$ |
| 3766 | $L_{A61}$ | $L_{B40}$ |
| 3767 | $L_{A62}$ | $L_{B40}$ |
| 3768 | $L_{A63}$ | $L_{B40}$ |
| 3769 | $L_{A64}$ | $L_{B40}$ |
| 3770 | $L_{A65}$ | $L_{B40}$ |
| 3771 | $L_{A66}$ | $L_{B40}$ |
| 3772 | $L_{A67}$ | $L_{B40}$ |
| 3773 | $L_{A68}$ | $L_{B40}$ |
| 3774 | $L_{A69}$ | $L_{B40}$ |
| 3775 | $L_{A70}$ | $L_{B40}$ |
| 3776 | $L_{A71}$ | $L_{B40}$ |
| 3777 | $L_{A72}$ | $L_{B40}$ |
| 3778 | $L_{A73}$ | $L_{B40}$ |
| 3779 | $L_{A74}$ | $L_{B40}$ |
| 3780 | $L_{A75}$ | $L_{B40}$ |
| 3781 | $L_{A76}$ | $L_{B40}$ |
| 3782 | $L_{A77}$ | $L_{B40}$ |
| 3783 | $L_{A78}$ | $L_{B40}$ |
| 3784 | $L_{A79}$ | $L_{B40}$ |
| 3785 | $L_{A80}$ | $L_{B40}$ |
| 3786 | $L_{A81}$ | $L_{B40}$ |
| 3787 | $L_{A82}$ | $L_{B40}$ |
| 3788 | $L_{A83}$ | $L_{B40}$ |
| 3789 | $L_{A84}$ | $L_{B40}$ |
| 3790 | $L_{A85}$ | $L_{B40}$ |
| 3791 | $L_{A86}$ | $L_{B40}$ |
| 3792 | $L_{A87}$ | $L_{B40}$ |
| 3793 | $L_{A88}$ | $L_{B40}$ |
| 3794 | $L_{A89}$ | $L_{B40}$ |
| 3795 | $L_{A90}$ | $L_{B40}$ |
| 3796 | $L_{A91}$ | $L_{B40}$ |
| 3797 | $L_{A92}$ | $L_{B40}$ |
| 3798 | $L_{A93}$ | $L_{B40}$ |
| 3799 | $L_{A94}$ | $L_{B40}$ |
| 3800 | $L_{A95}$ | $L_{B40}$ |
| 3801 | $L_{A1}$ | $L_{B41}$ |
| 3802 | $L_{A2}$ | $L_{B41}$ |
| 3803 | $L_{A3}$ | $L_{B41}$ |
| 3804 | $L_{A4}$ | $L_{B41}$ |

-continued

| Cpd # | $L_A$ | $L_B$ |
|---|---|---|
| 3805 | $L_{A5}$ | $L_{B41}$ |
| 3806 | $L_{A6}$ | $L_{B41}$ |
| 3807 | $L_{A7}$ | $L_{B41}$ |
| 3808 | $L_{A8}$ | $L_{B41}$ |
| 3809 | $L_{A9}$ | $L_{B41}$ |
| 3810 | $L_{A10}$ | $L_{B41}$ |
| 3811 | $L_{A11}$ | $L_{B41}$ |
| 3812 | $L_{A12}$ | $L_{B41}$ |
| 3813 | $L_{A13}$ | $L_{B41}$ |
| 3814 | $L_{A14}$ | $L_{B41}$ |
| 3815 | $L_{A15}$ | $L_{B41}$ |
| 3816 | $L_{A16}$ | $L_{B41}$ |
| 3817 | $L_{A17}$ | $L_{B41}$ |
| 3818 | $L_{A18}$ | $L_{B41}$ |
| 3819 | $L_{A19}$ | $L_{B41}$ |
| 3820 | $L_{A20}$ | $L_{B41}$ |
| 3821 | $L_{A21}$ | $L_{B41}$ |
| 3822 | $L_{A22}$ | $L_{B41}$ |
| 3823 | $L_{A23}$ | $L_{B41}$ |
| 3824 | $L_{A24}$ | $L_{B41}$ |
| 3825 | $L_{A25}$ | $L_{B41}$ |
| 3826 | $L_{A26}$ | $L_{B41}$ |
| 3827 | $L_{A27}$ | $L_{B41}$ |
| 3828 | $L_{A28}$ | $L_{B41}$ |
| 3829 | $L_{A29}$ | $L_{B41}$ |
| 3830 | $L_{A30}$ | $L_{B41}$ |
| 3831 | $L_{A31}$ | $L_{B41}$ |
| 3832 | $L_{A32}$ | $L_{B41}$ |
| 3833 | $L_{A33}$ | $L_{B41}$ |
| 3834 | $L_{A34}$ | $L_{B41}$ |
| 3835 | $L_{A35}$ | $L_{B41}$ |
| 3836 | $L_{A36}$ | $L_{B41}$ |
| 3837 | $L_{A37}$ | $L_{B41}$ |
| 3838 | $L_{A38}$ | $L_{B41}$ |
| 3839 | $L_{A39}$ | $L_{B41}$ |
| 3840 | $L_{A40}$ | $L_{B41}$ |
| 3841 | $L_{A41}$ | $L_{B41}$ |
| 3842 | $L_{A42}$ | $L_{B41}$ |
| 3843 | $L_{A43}$ | $L_{B41}$ |
| 3844 | $L_{A44}$ | $L_{B41}$ |
| 3845 | $L_{A45}$ | $L_{B41}$ |
| 3846 | $L_{A46}$ | $L_{B41}$ |
| 3847 | $L_{A47}$ | $L_{B41}$ |
| 3848 | $L_{A48}$ | $L_{B41}$ |
| 3849 | $L_{A49}$ | $L_{B41}$ |
| 3850 | $L_{A50}$ | $L_{B41}$ |
| 3851 | $L_{A51}$ | $L_{B41}$ |
| 3852 | $L_{A52}$ | $L_{B41}$ |
| 3853 | $L_{A53}$ | $L_{B41}$ |
| 3854 | $L_{A54}$ | $L_{B41}$ |
| 3855 | $L_{A55}$ | $L_{B41}$ |
| 3856 | $L_{A56}$ | $L_{B41}$ |
| 3857 | $L_{A57}$ | $L_{B41}$ |
| 3858 | $L_{A58}$ | $L_{B41}$ |
| 3859 | $L_{A59}$ | $L_{B41}$ |
| 3860 | $L_{A60}$ | $L_{B41}$ |
| 3861 | $L_{A61}$ | $L_{B41}$ |
| 3862 | $L_{A62}$ | $L_{B41}$ |
| 3863 | $L_{A63}$ | $L_{B41}$ |
| 3864 | $L_{A64}$ | $L_{B41}$ |
| 3865 | $L_{A65}$ | $L_{B41}$ |
| 3866 | $L_{A66}$ | $L_{B41}$ |
| 3867 | $L_{A67}$ | $L_{B41}$ |
| 3868 | $L_{A68}$ | $L_{B41}$ |
| 3869 | $L_{A69}$ | $L_{B41}$ |
| 3870 | $L_{A70}$ | $L_{B41}$ |
| 3871 | $L_{A71}$ | $L_{B41}$ |
| 3872 | $L_{A72}$ | $L_{B41}$ |
| 3873 | $L_{A73}$ | $L_{B41}$ |
| 3874 | $L_{A74}$ | $L_{B41}$ |
| 3875 | $L_{A75}$ | $L_{B41}$ |
| 3876 | $L_{A76}$ | $L_{B41}$ |
| 3877 | $L_{A77}$ | $L_{B41}$ |
| 3878 | $L_{A78}$ | $L_{B41}$ |
| 3879 | $L_{A79}$ | $L_{B41}$ |
| 3880 | $L_{A80}$ | $L_{B41}$ |
| 3881 | $L_{A81}$ | $L_{B41}$ |

-continued

| Cpd # | $L_A$ | $L_B$ |
|---|---|---|
| 3882 | $L_{A82}$ | $L_{B41}$ |
| 3883 | $L_{A83}$ | $L_{B41}$ |
| 3884 | $L_{A84}$ | $L_{B41}$ |
| 3885 | $L_{A85}$ | $L_{B41}$ |
| 3886 | $L_{A86}$ | $L_{B41}$ |
| 3887 | $L_{A87}$ | $L_{B41}$ |
| 3888 | $L_{A88}$ | $L_{B41}$ |
| 3889 | $L_{A89}$ | $L_{B41}$ |
| 3890 | $L_{A90}$ | $L_{B41}$ |
| 3891 | $L_{A91}$ | $L_{B41}$ |
| 3892 | $L_{A92}$ | $L_{B41}$ |
| 3893 | $L_{A93}$ | $L_{B41}$ |
| 3894 | $L_{A94}$ | $L_{B41}$ |
| 3895 | $L_{A95}$ | $L_{B41}$ |
| 3896 | $L_{A1}$ | $L_{B42}$ |
| 3897 | $L_{A2}$ | $L_{B42}$ |
| 3898 | $L_{A3}$ | $L_{B42}$ |
| 3899 | $L_{A4}$ | $L_{B42}$ |
| 3900 | $L_{A5}$ | $L_{B42}$ |
| 3901 | $L_{A6}$ | $L_{B42}$ |
| 3902 | $L_{A7}$ | $L_{B42}$ |
| 3903 | $L_{A8}$ | $L_{B42}$ |
| 3904 | $L_{A9}$ | $L_{B42}$ |
| 3905 | $L_{A10}$ | $L_{B42}$ |
| 3906 | $L_{A11}$ | $L_{B42}$ |
| 3907 | $L_{A12}$ | $L_{B42}$ |
| 3908 | $L_{A13}$ | $L_{B42}$ |
| 3909 | $L_{A14}$ | $L_{B42}$ |
| 3910 | $L_{A15}$ | $L_{B42}$ |
| 3911 | $L_{A16}$ | $L_{B42}$ |
| 3912 | $L_{A17}$ | $L_{B42}$ |
| 3913 | $L_{A18}$ | $L_{B42}$ |
| 3914 | $L_{A19}$ | $L_{B42}$ |
| 3915 | $L_{A20}$ | $L_{B42}$ |
| 3916 | $L_{A21}$ | $L_{B42}$ |
| 3917 | $L_{A22}$ | $L_{B42}$ |
| 3918 | $L_{A23}$ | $L_{B42}$ |
| 3919 | $L_{A24}$ | $L_{B42}$ |
| 3920 | $L_{A25}$ | $L_{B42}$ |
| 3921 | $L_{A26}$ | $L_{B42}$ |
| 3922 | $L_{A27}$ | $L_{B42}$ |
| 3923 | $L_{A28}$ | $L_{B42}$ |
| 3924 | $L_{A29}$ | $L_{B42}$ |
| 3925 | $L_{A30}$ | $L_{B42}$ |
| 3926 | $L_{A31}$ | $L_{B42}$ |
| 3927 | $L_{A32}$ | $L_{B42}$ |
| 3928 | $L_{A33}$ | $L_{B42}$ |
| 3929 | $L_{A34}$ | $L_{B42}$ |
| 3930 | $L_{A35}$ | $L_{B42}$ |
| 3931 | $L_{A36}$ | $L_{B42}$ |
| 3932 | $L_{A37}$ | $L_{B42}$ |
| 3933 | $L_{A38}$ | $L_{B42}$ |
| 3934 | $L_{A39}$ | $L_{B42}$ |
| 3935 | $L_{A40}$ | $L_{B42}$ |
| 3936 | $L_{A41}$ | $L_{B42}$ |
| 3937 | $L_{A42}$ | $L_{B42}$ |
| 3938 | $L_{A43}$ | $L_{B42}$ |
| 3939 | $L_{A44}$ | $L_{B42}$ |
| 3940 | $L_{A45}$ | $L_{B42}$ |
| 3941 | $L_{A46}$ | $L_{B42}$ |
| 3942 | $L_{A47}$ | $L_{B42}$ |
| 3943 | $L_{A48}$ | $L_{B42}$ |
| 3944 | $L_{A49}$ | $L_{B42}$ |
| 3945 | $L_{A50}$ | $L_{B42}$ |
| 3946 | $L_{A51}$ | $L_{B42}$ |
| 3947 | $L_{A52}$ | $L_{B42}$ |
| 3948 | $L_{A53}$ | $L_{B42}$ |
| 3949 | $L_{A54}$ | $L_{B42}$ |
| 3950 | $L_{A55}$ | $L_{B42}$ |
| 3951 | $L_{A56}$ | $L_{B42}$ |
| 3952 | $L_{A57}$ | $L_{B42}$ |
| 3953 | $L_{A58}$ | $L_{B42}$ |
| 3954 | $L_{A59}$ | $L_{B42}$ |
| 3955 | $L_{A60}$ | $L_{B42}$ |
| 3956 | $L_{A61}$ | $L_{B42}$ |
| 3957 | $L_{A62}$ | $L_{B42}$ |
| 3958 | $L_{A63}$ | $L_{B42}$ |

-continued

| Cpd # | $L_A$ | $L_B$ |
|---|---|---|
| 3959 | $L_{A64}$ | $L_{B42}$ |
| 3960 | $L_{A65}$ | $L_{B42}$ |
| 3961 | $L_{A66}$ | $L_{B42}$ |
| 3962 | $L_{A67}$ | $L_{B42}$ |
| 3963 | $L_{A68}$ | $L_{B42}$ |
| 3964 | $L_{A69}$ | $L_{B42}$ |
| 3965 | $L_{A70}$ | $L_{B42}$ |
| 3966 | $L_{A71}$ | $L_{B42}$ |
| 3967 | $L_{A72}$ | $L_{B42}$ |
| 3968 | $L_{A73}$ | $L_{B42}$ |
| 3969 | $L_{A74}$ | $L_{B42}$ |
| 3970 | $L_{A75}$ | $L_{B42}$ |
| 3971 | $L_{A76}$ | $L_{B42}$ |
| 3972 | $L_{A77}$ | $L_{B42}$ |
| 3973 | $L_{A78}$ | $L_{B42}$ |
| 3974 | $L_{A79}$ | $L_{B42}$ |
| 3975 | $L_{A80}$ | $L_{B42}$ |
| 3976 | $L_{A81}$ | $L_{B42}$ |
| 3977 | $L_{A82}$ | $L_{B42}$ |
| 3978 | $L_{A83}$ | $L_{B42}$ |
| 3979 | $L_{A84}$ | $L_{B42}$ |
| 3980 | $L_{A85}$ | $L_{B42}$ |
| 3981 | $L_{A86}$ | $L_{B42}$ |
| 3982 | $L_{A87}$ | $L_{B42}$ |
| 3983 | $L_{A88}$ | $L_{B42}$ |
| 3984 | $L_{A89}$ | $L_{B42}$ |
| 3985 | $L_{A90}$ | $L_{B42}$ |
| 3986 | $L_{A91}$ | $L_{B42}$ |
| 3987 | $L_{A92}$ | $L_{B42}$ |
| 3988 | $L_{A93}$ | $L_{B42}$ |
| 3989 | $L_{A94}$ | $L_{B42}$ |
| 3990 | $L_{A95}$ | $L_{B42}$ |
| 3991 | $L_{A1}$ | $L_{B43}$ |
| 3992 | $L_{A2}$ | $L_{B43}$ |
| 3993 | $L_{A3}$ | $L_{B43}$ |
| 3994 | $L_{A4}$ | $L_{B43}$ |
| 3995 | $L_{A5}$ | $L_{B43}$ |
| 3996 | $L_{A6}$ | $L_{B43}$ |
| 3997 | $L_{A7}$ | $L_{B43}$ |
| 3998 | $L_{A8}$ | $L_{B43}$ |
| 3999 | $L_{A9}$ | $L_{B43}$ |
| 4000 | $L_{A10}$ | $L_{B43}$ |
| 4001 | $L_{A11}$ | $L_{B43}$ |
| 4002 | $L_{A12}$ | $L_{B43}$ |
| 4003 | $L_{A13}$ | $L_{B43}$ |
| 4004 | $L_{A14}$ | $L_{B43}$ |
| 4005 | $L_{A15}$ | $L_{B43}$ |
| 4006 | $L_{A16}$ | $L_{B43}$ |
| 4007 | $L_{A17}$ | $L_{B43}$ |
| 4008 | $L_{A18}$ | $L_{B43}$ |
| 4009 | $L_{A19}$ | $L_{B43}$ |
| 4010 | $L_{A20}$ | $L_{B43}$ |
| 4011 | $L_{A21}$ | $L_{B43}$ |
| 4012 | $L_{A22}$ | $L_{B43}$ |
| 4013 | $L_{A23}$ | $L_{B43}$ |
| 4014 | $L_{A24}$ | $L_{B43}$ |
| 4015 | $L_{A25}$ | $L_{B43}$ |
| 4016 | $L_{A26}$ | $L_{B43}$ |
| 4017 | $L_{A27}$ | $L_{B43}$ |
| 4018 | $L_{A28}$ | $L_{B43}$ |
| 4019 | $L_{A29}$ | $L_{B43}$ |
| 4020 | $L_{A30}$ | $L_{B43}$ |
| 4021 | $L_{A31}$ | $L_{B43}$ |
| 4022 | $L_{A32}$ | $L_{B43}$ |
| 4023 | $L_{A33}$ | $L_{B43}$ |
| 4024 | $L_{A34}$ | $L_{B43}$ |
| 4025 | $L_{A35}$ | $L_{B43}$ |
| 4026 | $L_{A36}$ | $L_{B43}$ |
| 4027 | $L_{A37}$ | $L_{B43}$ |
| 4028 | $L_{A38}$ | $L_{B43}$ |
| 4029 | $L_{A39}$ | $L_{B43}$ |
| 4030 | $L_{A40}$ | $L_{B43}$ |
| 4031 | $L_{A41}$ | $L_{B43}$ |
| 4032 | $L_{A42}$ | $L_{B43}$ |
| 4033 | $L_{A43}$ | $L_{B43}$ |
| 4034 | $L_{A44}$ | $L_{B43}$ |
| 4035 | $L_{A45}$ | $L_{B43}$ |

-continued

| Cpd # | $L_A$ | $L_B$ |
|---|---|---|
| 4036 | $L_{A46}$ | $L_{B43}$ |
| 4037 | $L_{A47}$ | $L_{B43}$ |
| 4038 | $L_{A48}$ | $L_{B43}$ |
| 4039 | $L_{A49}$ | $L_{B43}$ |
| 4040 | $L_{A50}$ | $L_{B43}$ |
| 4041 | $L_{A51}$ | $L_{B43}$ |
| 4042 | $L_{A52}$ | $L_{B43}$ |
| 4043 | $L_{A53}$ | $L_{B43}$ |
| 4044 | $L_{A54}$ | $L_{B43}$ |
| 4045 | $L_{A55}$ | $L_{B43}$ |
| 4046 | $L_{A56}$ | $L_{B43}$ |
| 4047 | $L_{A57}$ | $L_{B43}$ |
| 4048 | $L_{A58}$ | $L_{B43}$ |
| 4049 | $L_{A59}$ | $L_{B43}$ |
| 4050 | $L_{A60}$ | $L_{B43}$ |
| 4051 | $L_{A61}$ | $L_{B43}$ |
| 4052 | $L_{A62}$ | $L_{B43}$ |
| 4053 | $L_{A63}$ | $L_{B43}$ |
| 4054 | $L_{A64}$ | $L_{B43}$ |
| 4055 | $L_{A65}$ | $L_{B43}$ |
| 4056 | $L_{A66}$ | $L_{B43}$ |
| 4057 | $L_{A67}$ | $L_{B43}$ |
| 4058 | $L_{A68}$ | $L_{B43}$ |
| 4059 | $L_{A69}$ | $L_{B43}$ |
| 4060 | $L_{A70}$ | $L_{B43}$ |
| 4061 | $L_{A71}$ | $L_{B43}$ |
| 4062 | $L_{A72}$ | $L_{B43}$ |
| 4063 | $L_{A73}$ | $L_{B43}$ |
| 4064 | $L_{A74}$ | $L_{B43}$ |
| 4065 | $L_{A75}$ | $L_{B43}$ |
| 4066 | $L_{A76}$ | $L_{B43}$ |
| 4067 | $L_{A77}$ | $L_{B43}$ |
| 4068 | $L_{A78}$ | $L_{B43}$ |
| 4069 | $L_{A79}$ | $L_{B43}$ |
| 4070 | $L_{A80}$ | $L_{B43}$ |
| 4071 | $L_{A81}$ | $L_{B43}$ |
| 4072 | $L_{A82}$ | $L_{B43}$ |
| 4073 | $L_{A83}$ | $L_{B43}$ |
| 4074 | $L_{A84}$ | $L_{B43}$ |
| 4075 | $L_{A85}$ | $L_{B43}$ |
| 4076 | $L_{A86}$ | $L_{B43}$ |
| 4077 | $L_{A87}$ | $L_{B43}$ |
| 4078 | $L_{A88}$ | $L_{B43}$ |
| 4079 | $L_{A89}$ | $L_{B43}$ |
| 4080 | $L_{A90}$ | $L_{B43}$ |
| 4081 | $L_{A91}$ | $L_{B43}$ |
| 4082 | $L_{A92}$ | $L_{B43}$ |
| 4083 | $L_{A93}$ | $L_{B43}$ |
| 4084 | $L_{A94}$ | $L_{B43}$ |
| 4085 | $L_{A95}$ | $L_{B43}$ |
| 4086 | $L_{A1}$ | $L_{B44}$ |
| 4087 | $L_{A2}$ | $L_{B44}$ |
| 4088 | $L_{A3}$ | $L_{B44}$ |
| 4089 | $L_{A4}$ | $L_{B44}$ |
| 4090 | $L_{A5}$ | $L_{B44}$ |
| 4091 | $L_{A6}$ | $L_{B44}$ |
| 4092 | $L_{A7}$ | $L_{B44}$ |
| 4093 | $L_{A8}$ | $L_{B44}$ |
| 4094 | $L_{A9}$ | $L_{B44}$ |
| 4095 | $L_{A10}$ | $L_{B44}$ |
| 4096 | $L_{A11}$ | $L_{B44}$ |
| 4097 | $L_{A12}$ | $L_{B44}$ |
| 4098 | $L_{A13}$ | $L_{B44}$ |
| 4099 | $L_{A14}$ | $L_{B44}$ |
| 4100 | $L_{A15}$ | $L_{B44}$ |
| 4101 | $L_{A16}$ | $L_{B44}$ |
| 4102 | $L_{A17}$ | $L_{B44}$ |
| 4103 | $L_{A18}$ | $L_{B44}$ |
| 4104 | $L_{A19}$ | $L_{B44}$ |
| 4105 | $L_{A20}$ | $L_{B44}$ |
| 4106 | $L_{A21}$ | $L_{B44}$ |
| 4107 | $L_{A22}$ | $L_{B44}$ |
| 4108 | $L_{A23}$ | $L_{B44}$ |
| 4109 | $L_{A24}$ | $L_{B44}$ |
| 4110 | $L_{A25}$ | $L_{B44}$ |
| 4111 | $L_{A26}$ | $L_{B44}$ |
| 4112 | $L_{A27}$ | $L_{B44}$ |

-continued

| Cpd # | $L_A$ | $L_B$ |
|---|---|---|
| 4113 | $L_{A28}$ | $L_{B44}$ |
| 4114 | $L_{A29}$ | $L_{B44}$ |
| 4115 | $L_{A30}$ | $L_{B44}$ |
| 4116 | $L_{A31}$ | $L_{B44}$ |
| 4117 | $L_{A32}$ | $L_{B44}$ |
| 4118 | $L_{A33}$ | $L_{B44}$ |
| 4119 | $L_{A34}$ | $L_{B44}$ |
| 4120 | $L_{A35}$ | $L_{B44}$ |
| 4121 | $L_{A36}$ | $L_{B44}$ |
| 4122 | $L_{A37}$ | $L_{B44}$ |
| 4123 | $L_{A38}$ | $L_{B44}$ |
| 4124 | $L_{A39}$ | $L_{B44}$ |
| 4125 | $L_{A40}$ | $L_{B44}$ |
| 4126 | $L_{A41}$ | $L_{B44}$ |
| 4127 | $L_{A42}$ | $L_{B44}$ |
| 4128 | $L_{A43}$ | $L_{B44}$ |
| 4129 | $L_{A44}$ | $L_{B44}$ |
| 4130 | $L_{A45}$ | $L_{B44}$ |
| 4131 | $L_{A46}$ | $L_{B44}$ |
| 4132 | $L_{A47}$ | $L_{B44}$ |
| 4133 | $L_{A48}$ | $L_{B44}$ |
| 4134 | $L_{A49}$ | $L_{B44}$ |
| 4135 | $L_{A50}$ | $L_{B44}$ |
| 4136 | $L_{A51}$ | $L_{B44}$ |
| 4137 | $L_{A52}$ | $L_{B44}$ |
| 4138 | $L_{A53}$ | $L_{B44}$ |
| 4139 | $L_{A54}$ | $L_{B44}$ |
| 4140 | $L_{A55}$ | $L_{B44}$ |
| 4141 | $L_{A56}$ | $L_{B44}$ |
| 4142 | $L_{A57}$ | $L_{B44}$ |
| 4143 | $L_{A58}$ | $L_{B44}$ |
| 4144 | $L_{A59}$ | $L_{B44}$ |
| 4145 | $L_{A60}$ | $L_{B44}$ |
| 4146 | $L_{A61}$ | $L_{B44}$ |
| 4147 | $L_{A62}$ | $L_{B44}$ |
| 4148 | $L_{A63}$ | $L_{B44}$ |
| 4149 | $L_{A64}$ | $L_{B44}$ |
| 4150 | $L_{A65}$ | $L_{B44}$ |
| 4151 | $L_{A66}$ | $L_{B44}$ |
| 4152 | $L_{A67}$ | $L_{B44}$ |
| 4153 | $L_{A68}$ | $L_{B44}$ |
| 4154 | $L_{A69}$ | $L_{B44}$ |
| 4155 | $L_{A70}$ | $L_{B44}$ |
| 4156 | $L_{A71}$ | $L_{B44}$ |
| 4157 | $L_{A72}$ | $L_{B44}$ |
| 4158 | $L_{A73}$ | $L_{B44}$ |
| 4159 | $L_{A74}$ | $L_{B44}$ |
| 4160 | $L_{A75}$ | $L_{B44}$ |
| 4161 | $L_{A76}$ | $L_{B44}$ |
| 4162 | $L_{A77}$ | $L_{B44}$ |
| 4163 | $L_{A78}$ | $L_{B44}$ |
| 4164 | $L_{A79}$ | $L_{B44}$ |
| 4165 | $L_{A80}$ | $L_{B44}$ |
| 4166 | $L_{A81}$ | $L_{B44}$ |
| 4167 | $L_{A82}$ | $L_{B44}$ |
| 4168 | $L_{A83}$ | $L_{B44}$ |
| 4169 | $L_{A84}$ | $L_{B44}$ |
| 4170 | $L_{A85}$ | $L_{B44}$ |
| 4171 | $L_{A86}$ | $L_{B44}$ |
| 4172 | $L_{A87}$ | $L_{B44}$ |
| 4173 | $L_{A88}$ | $L_{B44}$ |
| 4174 | $L_{A89}$ | $L_{B44}$ |
| 4175 | $L_{A90}$ | $L_{B44}$ |
| 4176 | $L_{A91}$ | $L_{B44}$ |
| 4177 | $L_{A92}$ | $L_{B44}$ |
| 4178 | $L_{A93}$ | $L_{B44}$ |
| 4179 | $L_{A94}$ | $L_{B44}$ |
| 4180 | $L_{A95}$ | $L_{B44}$ |
| 4181 | $L_{A1}$ | $L_{B45}$ |
| 4182 | $L_{A2}$ | $L_{B45}$ |
| 4183 | $L_{A3}$ | $L_{B45}$ |
| 4184 | $L_{A4}$ | $L_{B45}$ |
| 4185 | $L_{A5}$ | $L_{B45}$ |
| 4186 | $L_{A6}$ | $L_{B45}$ |
| 4187 | $L_{A7}$ | $L_{B45}$ |
| 4188 | $L_{A8}$ | $L_{B45}$ |
| 4189 | $L_{A9}$ | $L_{B45}$ |

-continued

| Cpd # | $L_A$ | $L_B$ |
|---|---|---|
| 4190 | $L_{A10}$ | $L_{B45}$ |
| 4191 | $L_{A11}$ | $L_{B45}$ |
| 4192 | $L_{A12}$ | $L_{B45}$ |
| 4193 | $L_{A13}$ | $L_{B45}$ |
| 4194 | $L_{A14}$ | $L_{B45}$ |
| 4195 | $L_{A15}$ | $L_{B45}$ |
| 4196 | $L_{A16}$ | $L_{B45}$ |
| 4197 | $L_{A17}$ | $L_{B45}$ |
| 4198 | $L_{A18}$ | $L_{B45}$ |
| 4199 | $L_{A19}$ | $L_{B45}$ |
| 4200 | $L_{A20}$ | $L_{B45}$ |
| 4201 | $L_{A21}$ | $L_{B45}$ |
| 4202 | $L_{A22}$ | $L_{B45}$ |
| 4203 | $L_{A23}$ | $L_{B45}$ |
| 4204 | $L_{A24}$ | $L_{B45}$ |
| 4205 | $L_{A25}$ | $L_{B45}$ |
| 4206 | $L_{A26}$ | $L_{B45}$ |
| 4207 | $L_{A27}$ | $L_{B45}$ |
| 4208 | $L_{A28}$ | $L_{B45}$ |
| 4209 | $L_{A29}$ | $L_{B45}$ |
| 4210 | $L_{A30}$ | $L_{B45}$ |
| 4211 | $L_{A31}$ | $L_{B45}$ |
| 4212 | $L_{A32}$ | $L_{B45}$ |
| 4213 | $L_{A33}$ | $L_{B45}$ |
| 4214 | $L_{A34}$ | $L_{B45}$ |
| 4215 | $L_{A35}$ | $L_{B45}$ |
| 4216 | $L_{A36}$ | $L_{B45}$ |
| 4217 | $L_{A37}$ | $L_{B45}$ |
| 4218 | $L_{A38}$ | $L_{B45}$ |
| 4219 | $L_{A39}$ | $L_{B45}$ |
| 4220 | $L_{A40}$ | $L_{B45}$ |
| 4221 | $L_{A41}$ | $L_{B45}$ |
| 4222 | $L_{A42}$ | $L_{B45}$ |
| 4223 | $L_{A43}$ | $L_{B45}$ |
| 4224 | $L_{A44}$ | $L_{B45}$ |
| 4225 | $L_{A45}$ | $L_{B45}$ |
| 4226 | $L_{A46}$ | $L_{B45}$ |
| 4227 | $L_{A47}$ | $L_{B45}$ |
| 4228 | $L_{A48}$ | $L_{B45}$ |
| 4229 | $L_{A49}$ | $L_{B45}$ |
| 4230 | $L_{A50}$ | $L_{B45}$ |
| 4231 | $L_{A51}$ | $L_{B45}$ |
| 4232 | $L_{A52}$ | $L_{B45}$ |
| 4233 | $L_{A53}$ | $L_{B45}$ |
| 4234 | $L_{A54}$ | $L_{B45}$ |
| 4235 | $L_{A55}$ | $L_{B45}$ |
| 4236 | $L_{A56}$ | $L_{B45}$ |
| 4237 | $L_{A57}$ | $L_{B45}$ |
| 4238 | $L_{A58}$ | $L_{B45}$ |
| 4239 | $L_{A59}$ | $L_{B45}$ |
| 4240 | $L_{A60}$ | $L_{B45}$ |
| 4241 | $L_{A61}$ | $L_{B45}$ |
| 4242 | $L_{A62}$ | $L_{B45}$ |
| 4243 | $L_{A63}$ | $L_{B45}$ |
| 4244 | $L_{A64}$ | $L_{B45}$ |
| 4245 | $L_{A65}$ | $L_{B45}$ |
| 4246 | $L_{A66}$ | $L_{B45}$ |
| 4247 | $L_{A67}$ | $L_{B45}$ |
| 4248 | $L_{A68}$ | $L_{B45}$ |
| 4249 | $L_{A69}$ | $L_{B45}$ |
| 4250 | $L_{A70}$ | $L_{B45}$ |
| 4251 | $L_{A71}$ | $L_{B45}$ |
| 4252 | $L_{A72}$ | $L_{B45}$ |
| 4253 | $L_{A73}$ | $L_{B45}$ |
| 4254 | $L_{A74}$ | $L_{B45}$ |
| 4255 | $L_{A75}$ | $L_{B45}$ |
| 4256 | $L_{A76}$ | $L_{B45}$ |
| 4257 | $L_{A77}$ | $L_{B45}$ |
| 4258 | $L_{A78}$ | $L_{B45}$ |
| 4259 | $L_{A79}$ | $L_{B45}$ |
| 4260 | $L_{A80}$ | $L_{B45}$ |
| 4261 | $L_{A81}$ | $L_{B45}$ |
| 4262 | $L_{A82}$ | $L_{B45}$ |
| 4263 | $L_{A83}$ | $L_{B45}$ |
| 4264 | $L_{A84}$ | $L_{B45}$ |
| 4265 | $L_{A85}$ | $L_{B45}$ |
| 4266 | $L_{A86}$ | $L_{B45}$ |

-continued

| Cpd # | $L_A$ | $L_B$ |
|---|---|---|
| 4267 | $L_{A87}$ | $L_{B45}$ |
| 4268 | $L_{A88}$ | $L_{B45}$ |
| 4269 | $L_{A89}$ | $L_{B45}$ |
| 4270 | $L_{A90}$ | $L_{B45}$ |
| 4271 | $L_{A91}$ | $L_{B45}$ |
| 4272 | $L_{A92}$ | $L_{B45}$ |
| 4273 | $L_{A93}$ | $L_{B45}$ |
| 4274 | $L_{A94}$ | $L_{B45}$ |
| 4275 | $L_{A95}$ | $L_{B45}$ |
| 4276 | $L_{A1}$ | $L_{B46}$ |
| 4277 | $L_{A2}$ | $L_{B46}$ |
| 4278 | $L_{A3}$ | $L_{B46}$ |
| 4279 | $L_{A4}$ | $L_{B46}$ |
| 4280 | $L_{A5}$ | $L_{B46}$ |
| 4281 | $L_{A6}$ | $L_{B46}$ |
| 4282 | $L_{A7}$ | $L_{B46}$ |
| 4283 | $L_{A8}$ | $L_{B46}$ |
| 4284 | $L_{A9}$ | $L_{B46}$ |
| 4285 | $L_{A10}$ | $L_{B46}$ |
| 4286 | $L_{A11}$ | $L_{B46}$ |
| 4287 | $L_{A12}$ | $L_{B46}$ |
| 4288 | $L_{A13}$ | $L_{B46}$ |
| 4289 | $L_{A14}$ | $L_{B46}$ |
| 4290 | $L_{A15}$ | $L_{B46}$ |
| 4291 | $L_{A16}$ | $L_{B46}$ |
| 4292 | $L_{A17}$ | $L_{B46}$ |
| 4293 | $L_{A18}$ | $L_{B46}$ |
| 4294 | $L_{A19}$ | $L_{B46}$ |
| 4295 | $L_{A20}$ | $L_{B46}$ |
| 4296 | $L_{A21}$ | $L_{B46}$ |
| 4297 | $L_{A22}$ | $L_{B46}$ |
| 4298 | $L_{A23}$ | $L_{B46}$ |
| 4299 | $L_{A24}$ | $L_{B46}$ |
| 4300 | $L_{A25}$ | $L_{B46}$ |
| 4301 | $L_{A26}$ | $L_{B46}$ |
| 4302 | $L_{A27}$ | $L_{B46}$ |
| 4303 | $L_{A28}$ | $L_{B46}$ |
| 4304 | $L_{A29}$ | $L_{B46}$ |
| 4305 | $L_{A30}$ | $L_{B46}$ |
| 4306 | $L_{A31}$ | $L_{B46}$ |
| 4307 | $L_{A32}$ | $L_{B46}$ |
| 4308 | $L_{A33}$ | $L_{B46}$ |
| 4309 | $L_{A34}$ | $L_{B46}$ |
| 4310 | $L_{A35}$ | $L_{B46}$ |
| 4311 | $L_{A36}$ | $L_{B46}$ |
| 4312 | $L_{A37}$ | $L_{B46}$ |
| 4313 | $L_{A38}$ | $L_{B46}$ |
| 4314 | $L_{A39}$ | $L_{B46}$ |
| 4315 | $L_{A40}$ | $L_{B46}$ |
| 4316 | $L_{A41}$ | $L_{B46}$ |
| 4317 | $L_{A42}$ | $L_{B46}$ |
| 4318 | $L_{A43}$ | $L_{B46}$ |
| 4319 | $L_{A44}$ | $L_{B46}$ |
| 4320 | $L_{A45}$ | $L_{B46}$ |
| 4321 | $L_{A46}$ | $L_{B46}$ |
| 4322 | $L_{A47}$ | $L_{B46}$ |
| 4323 | $L_{A48}$ | $L_{B46}$ |
| 4324 | $L_{A49}$ | $L_{B46}$ |
| 4325 | $L_{A50}$ | $L_{B46}$ |
| 4326 | $L_{A51}$ | $L_{B46}$ |
| 4327 | $L_{A52}$ | $L_{B46}$ |
| 4328 | $L_{A53}$ | $L_{B46}$ |
| 4329 | $L_{A54}$ | $L_{B46}$ |
| 4330 | $L_{A55}$ | $L_{B46}$ |
| 4331 | $L_{A56}$ | $L_{B46}$ |
| 4332 | $L_{A57}$ | $L_{B46}$ |
| 4333 | $L_{A58}$ | $L_{B46}$ |
| 4334 | $L_{A59}$ | $L_{B46}$ |
| 4335 | $L_{A60}$ | $L_{B46}$ |
| 4336 | $L_{A61}$ | $L_{B46}$ |
| 4337 | $L_{A62}$ | $L_{B46}$ |
| 4338 | $L_{A63}$ | $L_{B46}$ |
| 4339 | $L_{A64}$ | $L_{B46}$ |
| 4340 | $L_{A65}$ | $L_{B46}$ |
| 4341 | $L_{A66}$ | $L_{B46}$ |
| 4342 | $L_{A67}$ | $L_{B46}$ |
| 4343 | $L_{A68}$ | $L_{B46}$ |

-continued

| Cpd # | $L_A$ | $L_B$ |
|---|---|---|
| 4344 | $L_{A69}$ | $L_{B46}$ |
| 4345 | $L_{A70}$ | $L_{B46}$ |
| 4346 | $L_{A71}$ | $L_{B46}$ |
| 4347 | $L_{A72}$ | $L_{B46}$ |
| 4348 | $L_{A73}$ | $L_{B46}$ |
| 4349 | $L_{A74}$ | $L_{B46}$ |
| 4350 | $L_{A75}$ | $L_{B46}$ |
| 4351 | $L_{A76}$ | $L_{B46}$ |
| 4352 | $L_{A77}$ | $L_{B46}$ |
| 4353 | $L_{A78}$ | $L_{B46}$ |
| 4354 | $L_{A79}$ | $L_{B46}$ |
| 4355 | $L_{A80}$ | $L_{B46}$ |
| 4356 | $L_{A81}$ | $L_{B46}$ |
| 4357 | $L_{A82}$ | $L_{B46}$ |
| 4358 | $L_{A83}$ | $L_{B46}$ |
| 4359 | $L_{A84}$ | $L_{B46}$ |
| 4360 | $L_{A85}$ | $L_{B46}$ |
| 4361 | $L_{A86}$ | $L_{B46}$ |
| 4362 | $L_{A87}$ | $L_{B46}$ |
| 4363 | $L_{A88}$ | $L_{B46}$ |
| 4364 | $L_{A89}$ | $L_{B46}$ |
| 4365 | $LA_{90}$ | $L_{B46}$ |
| 4366 | $LA_{91}$ | $L_{B46}$ |
| 4367 | $L_{A92}$ | $L_{B46}$ |
| 4368 | $L_{A93}$ | $L_{B46}$ |
| 4369 | $L_{A94}$ | $L_{B46}$ |
| 4370 | $L_{A95}$ | $L_{B46}$ |
| 4371 | $L_{A1}$ | $L_{B47}$ |
| 4372 | $L_{A2}$ | $L_{B47}$ |
| 4373 | $L_{A3}$ | $L_{B47}$ |
| 4374 | $L_{A4}$ | $L_{B47}$ |
| 4375 | $L_{A5}$ | $L_{B47}$ |
| 4376 | $L_{A6}$ | $L_{B47}$ |
| 4377 | $L_{A7}$ | $L_{B47}$ |
| 4378 | $L_{A8}$ | $L_{B47}$ |
| 4379 | $L_{A9}$ | $L_{B47}$ |
| 4380 | $L_{A10}$ | $L_{B47}$ |
| 4381 | $L_{A11}$ | $L_{B47}$ |
| 4382 | $L_{A12}$ | $L_{B47}$ |
| 4383 | $L_{A13}$ | $L_{B47}$ |
| 4384 | $L_{A14}$ | $L_{B47}$ |
| 4385 | $L_{A15}$ | $L_{B47}$ |
| 4386 | $L_{A16}$ | $L_{B47}$ |
| 4387 | $L_{A17}$ | $L_{B47}$ |
| 4388 | $L_{A18}$ | $L_{B47}$ |
| 4389 | $L_{A19}$ | $L_{B47}$ |
| 4390 | $L_{A20}$ | $L_{B47}$ |
| 4391 | $L_{A21}$ | $L_{B47}$ |
| 4392 | $L_{A22}$ | $L_{B47}$ |
| 4393 | $L_{A23}$ | $L_{B47}$ |
| 4394 | $L_{A24}$ | $L_{B47}$ |
| 4395 | $L_{A25}$ | $L_{B47}$ |
| 4396 | $L_{A26}$ | $L_{B47}$ |
| 4397 | $L_{A27}$ | $L_{B47}$ |
| 4398 | $L_{A28}$ | $L_{B47}$ |
| 4399 | $L_{A29}$ | $L_{B47}$ |
| 4400 | $L_{A30}$ | $L_{B47}$ |
| 4401 | $L_{A31}$ | $L_{B47}$ |
| 4402 | $L_{A32}$ | $L_{B47}$ |
| 4403 | $L_{A33}$ | $L_{B47}$ |
| 4404 | $L_{A34}$ | $L_{B47}$ |
| 4405 | $L_{A35}$ | $L_{B47}$ |
| 4406 | $L_{A36}$ | $L_{B47}$ |
| 4407 | $L_{A37}$ | $L_{B47}$ |
| 4408 | $L_{A38}$ | $L_{B47}$ |
| 4409 | $L_{A39}$ | $L_{B47}$ |
| 4410 | $L_{A40}$ | $L_{B47}$ |
| 4411 | $L_{A41}$ | $L_{B47}$ |
| 4412 | $L_{A42}$ | $L_{B47}$ |
| 4413 | $L_{A43}$ | $L_{B47}$ |
| 4414 | $L_{A44}$ | $L_{B47}$ |
| 4415 | $L_{A45}$ | $L_{B47}$ |
| 4416 | $L_{A46}$ | $L_{B47}$ |
| 4417 | $L_{A47}$ | $L_{B47}$ |
| 4418 | $L_{A48}$ | $L_{B47}$ |
| 4419 | $L_{A49}$ | $L_{B47}$ |
| 4420 | $L_{A50}$ | $L_{B47}$ |

| Cpd # | $L_A$ | $L_B$ |
|---|---|---|
| 4421 | $L_{A51}$ | $L_{B47}$ |
| 4422 | $L_{A52}$ | $L_{B47}$ |
| 4423 | $L_{A53}$ | $L_{B47}$ |
| 4424 | $L_{A54}$ | $L_{B47}$ |
| 4425 | $L_{A55}$ | $L_{B47}$ |
| 4426 | $L_{A56}$ | $L_{B47}$ |
| 4427 | $L_{A57}$ | $L_{B47}$ |
| 4428 | $L_{A58}$ | $L_{B47}$ |
| 4429 | $L_{A59}$ | $L_{B47}$ |
| 4430 | $L_{A60}$ | $L_{B47}$ |
| 4431 | $L_{A61}$ | $L_{B47}$ |
| 4432 | $L_{A62}$ | $L_{B47}$ |
| 4433 | $L_{A63}$ | $L_{B47}$ |
| 4434 | $L_{A64}$ | $L_{B47}$ |
| 4435 | $L_{A65}$ | $L_{B47}$ |
| 4436 | $L_{A66}$ | $L_{B47}$ |
| 4437 | $L_{A67}$ | $L_{B47}$ |
| 4438 | $L_{A68}$ | $L_{B47}$ |
| 4439 | $L_{A69}$ | $L_{B47}$ |
| 4440 | $L_{A70}$ | $L_{B47}$ |
| 4441 | $L_{A71}$ | $L_{B47}$ |
| 4442 | $L_{A72}$ | $L_{B47}$ |
| 4443 | $L_{A73}$ | $L_{B47}$ |
| 4444 | $L_{A74}$ | $L_{B47}$ |
| 4445 | $L_{A75}$ | $L_{B47}$ |
| 4446 | $L_{A76}$ | $L_{B47}$ |
| 4447 | $L_{A77}$ | $L_{B47}$ |
| 4448 | $L_{A78}$ | $L_{B47}$ |
| 4449 | $L_{A79}$ | $L_{B47}$ |
| 4450 | $L_{A80}$ | $L_{B47}$ |
| 4451 | $L_{A81}$ | $L_{B47}$ |
| 4452 | $L_{A82}$ | $L_{B47}$ |
| 4453 | $L_{A83}$ | $L_{B47}$ |
| 4454 | $L_{A84}$ | $L_{B47}$ |
| 4455 | $L_{A85}$ | $L_{B47}$ |
| 4456 | $L_{A86}$ | $L_{B47}$ |
| 4457 | $L_{A87}$ | $L_{B47}$ |
| 4458 | $L_{A88}$ | $L_{B47}$ |
| 4459 | $L_{A89}$ | $L_{B47}$ |
| 4460 | $L_{A90}$ | $L_{B47}$ |
| 4461 | $L_{A91}$ | $L_{B47}$ |
| 4462 | $L_{A92}$ | $L_{B47}$ |
| 4463 | $L_{A93}$ | $L_{B47}$ |
| 4464 | $L_{A94}$ | $L_{B47}$ |
| 4465 | $L_{A95}$ | $L_{B47}$ |
| 4466 | $L_{A1}$ | $L_{B48}$ |
| 4467 | $L_{A2}$ | $L_{B48}$ |
| 4468 | $L_{A3}$ | $L_{B48}$ |
| 4469 | $L_{A4}$ | $L_{B48}$ |
| 4470 | $L_{A5}$ | $L_{B48}$ |
| 4471 | $L_{A6}$ | $L_{B48}$ |
| 4472 | $L_{A7}$ | $L_{B48}$ |
| 4473 | $L_{A8}$ | $L_{B48}$ |
| 4474 | $L_{A9}$ | $L_{B48}$ |
| 4475 | $L_{A10}$ | $L_{B48}$ |
| 4476 | $L_{A11}$ | $L_{B48}$ |
| 4477 | $L_{A12}$ | $L_{B48}$ |
| 4478 | $L_{A13}$ | $L_{B48}$ |
| 4479 | $L_{A14}$ | $L_{B48}$ |
| 4480 | $L_{A15}$ | $L_{B48}$ |
| 4481 | $L_{A16}$ | $L_{B48}$ |
| 4482 | $L_{A17}$ | $L_{B48}$ |
| 4483 | $L_{A18}$ | $L_{B48}$ |
| 4484 | $L_{A19}$ | $L_{B48}$ |
| 4485 | $L_{A20}$ | $L_{B48}$ |
| 4486 | $L_{A21}$ | $L_{B48}$ |
| 4487 | $L_{A22}$ | $L_{B48}$ |
| 4488 | $L_{A23}$ | $L_{B48}$ |
| 4489 | $L_{A24}$ | $L_{B48}$ |
| 4490 | $L_{A25}$ | $L_{B48}$ |
| 4491 | $L_{A26}$ | $L_{B48}$ |
| 4492 | $L_{A27}$ | $L_{B48}$ |
| 4493 | $L_{A28}$ | $L_{B48}$ |
| 4494 | $L_{A29}$ | $L_{B48}$ |
| 4495 | $L_{A30}$ | $L_{B48}$ |
| 4496 | $L_{A31}$ | $L_{B48}$ |
| 4497 | $L_{A32}$ | $L_{B48}$ |

| Cpd # | $L_A$ | $L_B$ |
|---|---|---|
| 4498 | $L_{A33}$ | $L_{B48}$ |
| 4499 | $L_{A34}$ | $L_{B48}$ |
| 4500 | $L_{A35}$ | $L_{B48}$ |
| 4501 | $L_{A36}$ | $L_{B48}$ |
| 4502 | $L_{A37}$ | $L_{B48}$ |
| 4503 | $L_{A38}$ | $L_{B48}$ |
| 4504 | $L_{A39}$ | $L_{B48}$ |
| 4505 | $L_{A40}$ | $L_{B48}$ |
| 4506 | $L_{A41}$ | $L_{B48}$ |
| 4507 | $L_{A42}$ | $L_{B48}$ |
| 4508 | $L_{A43}$ | $L_{B48}$ |
| 4509 | $L_{A44}$ | $L_{B48}$ |
| 4510 | $L_{A45}$ | $L_{B48}$ |
| 4511 | $L_{A46}$ | $L_{B48}$ |
| 4512 | $L_{A47}$ | $L_{B48}$ |
| 4513 | $L_{A48}$ | $L_{B48}$ |
| 4514 | $L_{A49}$ | $L_{B48}$ |
| 4515 | $L_{A50}$ | $L_{B48}$ |
| 4516 | $L_{A51}$ | $L_{B48}$ |
| 4517 | $L_{A52}$ | $L_{B48}$ |
| 4518 | $L_{A53}$ | $L_{B48}$ |
| 4519 | $L_{A54}$ | $L_{B48}$ |
| 4520 | $L_{A55}$ | $L_{B48}$ |
| 4521 | $L_{A56}$ | $L_{B48}$ |
| 4522 | $L_{A57}$ | $L_{B48}$ |
| 4523 | $L_{A58}$ | $L_{B48}$ |
| 4524 | $L_{A59}$ | $L_{B48}$ |
| 4525 | $L_{A60}$ | $L_{B48}$ |
| 4526 | $L_{A61}$ | $L_{B48}$ |
| 4527 | $L_{A62}$ | $L_{B48}$ |
| 4528 | $L_{A63}$ | $L_{B48}$ |
| 4529 | $L_{A64}$ | $L_{B48}$ |
| 4530 | $L_{A65}$ | $L_{B48}$ |
| 4531 | $L_{A66}$ | $L_{B48}$ |
| 4532 | $L_{A67}$ | $L_{B48}$ |
| 4533 | $L_{A68}$ | $L_{B48}$ |
| 4534 | $L_{A69}$ | $L_{B48}$ |
| 4535 | $L_{A70}$ | $L_{B48}$ |
| 4536 | $L_{A71}$ | $L_{B48}$ |
| 4537 | $L_{A72}$ | $L_{B48}$ |
| 4538 | $L_{A73}$ | $L_{B48}$ |
| 4539 | $L_{A74}$ | $L_{B48}$ |
| 4540 | $L_{A75}$ | $L_{B48}$ |
| 4541 | $L_{A76}$ | $L_{B48}$ |
| 4542 | $L_{A77}$ | $L_{B48}$ |
| 4543 | $L_{A78}$ | $L_{B48}$ |
| 4544 | $L_{A79}$ | $L_{B48}$ |
| 4545 | $L_{A80}$ | $L_{B48}$ |
| 4546 | $L_{A81}$ | $L_{B48}$ |
| 4547 | $L_{A82}$ | $L_{B48}$ |
| 4548 | $L_{A83}$ | $L_{B48}$ |
| 4549 | $L_{A84}$ | $L_{B48}$ |
| 4550 | $L_{A85}$ | $L_{B48}$ |
| 4551 | $L_{A86}$ | $L_{B48}$ |
| 4552 | $L_{A87}$ | $L_{B48}$ |
| 4553 | $L_{A88}$ | $L_{B48}$ |
| 4554 | $L_{A89}$ | $L_{B48}$ |
| 4555 | $L_{A90}$ | $L_{B48}$ |
| 4556 | $L_{A91}$ | $L_{B48}$ |
| 4557 | $L_{A92}$ | $L_{B48}$ |
| 4558 | $L_{A93}$ | $L_{B48}$ |
| 4559 | $L_{A94}$ | $L_{B48}$ |
| 4560 | $L_{A95}$ | $L_{B48}$ |
| 4561 | $L_{A1}$ | $L_{B49}$ |
| 4562 | $L_{A2}$ | $L_{B49}$ |
| 4563 | $L_{A3}$ | $L_{B49}$ |
| 4564 | $L_{A4}$ | $L_{B49}$ |
| 4565 | $L_{A5}$ | $L_{B49}$ |
| 4566 | $L_{A6}$ | $L_{B49}$ |
| 4567 | $L_{A7}$ | $L_{B49}$ |
| 4568 | $L_{A8}$ | $L_{B49}$ |
| 4569 | $L_{A9}$ | $L_{B49}$ |
| 4570 | $L_{A10}$ | $L_{B49}$ |
| 4571 | $L_{A11}$ | $L_{B49}$ |
| 4572 | $L_{A12}$ | $L_{B49}$ |
| 4573 | $L_{A13}$ | $L_{B49}$ |
| 4574 | $L_{A14}$ | $L_{B49}$ |

-continued

| Cpd # | $L_A$ | $L_B$ |
|---|---|---|
| 4575 | $L_{A15}$ | $L_{B49}$ |
| 4576 | $L_{A16}$ | $L_{B49}$ |
| 4577 | $L_{A17}$ | $L_{B49}$ |
| 4578 | $L_{A18}$ | $L_{B49}$ |
| 4579 | $L_{A19}$ | $L_{B49}$ |
| 4580 | $L_{A20}$ | $L_{B49}$ |
| 4581 | $L_{A21}$ | $L_{B49}$ |
| 4582 | $L_{A22}$ | $L_{B49}$ |
| 4583 | $L_{A23}$ | $L_{B49}$ |
| 4584 | $L_{A24}$ | $L_{B49}$ |
| 4585 | $L_{A25}$ | $L_{B49}$ |
| 4586 | $L_{A26}$ | $L_{B49}$ |
| 4587 | $L_{A27}$ | $L_{B49}$ |
| 4588 | $L_{A28}$ | $L_{B49}$ |
| 4589 | $L_{A29}$ | $L_{B49}$ |
| 4590 | $L_{A30}$ | $L_{B49}$ |
| 4591 | $L_{A31}$ | $L_{B49}$ |
| 4592 | $L_{A32}$ | $L_{B49}$ |
| 4593 | $L_{A33}$ | $L_{B49}$ |
| 4594 | $L_{A34}$ | $L_{B49}$ |
| 4595 | $L_{A35}$ | $L_{B49}$ |
| 4596 | $L_{A36}$ | $L_{B49}$ |
| 4597 | $L_{A37}$ | $L_{B49}$ |
| 4598 | $L_{A38}$ | $L_{B49}$ |
| 4599 | $L_{A39}$ | $L_{B49}$ |
| 4600 | $L_{A40}$ | $L_{B49}$ |
| 4601 | $L_{A41}$ | $L_{B49}$ |
| 4602 | $L_{A42}$ | $L_{B49}$ |
| 4603 | $L_{A43}$ | $L_{B49}$ |
| 4604 | $L_{A44}$ | $L_{B49}$ |
| 4605 | $L_{A45}$ | $L_{B49}$ |
| 4606 | $L_{A46}$ | $L_{B49}$ |
| 4607 | $L_{A47}$ | $L_{B49}$ |
| 4608 | $L_{A48}$ | $L_{B49}$ |
| 4609 | $L_{A49}$ | $L_{B49}$ |
| 4610 | $L_{A50}$ | $L_{B49}$ |
| 4611 | $L_{A51}$ | $L_{B49}$ |
| 4612 | $L_{A52}$ | $L_{B49}$ |
| 4613 | $L_{A53}$ | $L_{B49}$ |
| 4614 | $L_{A54}$ | $L_{B49}$ |
| 4615 | $L_{A55}$ | $L_{B49}$ |
| 4616 | $L_{A56}$ | $L_{B49}$ |
| 4617 | $L_{A57}$ | $L_{B49}$ |
| 4618 | $L_{A58}$ | $L_{B49}$ |
| 4619 | $L_{A59}$ | $L_{B49}$ |
| 4620 | $L_{A60}$ | $L_{B49}$ |
| 4621 | $L_{A61}$ | $L_{B49}$ |
| 4622 | $L_{A62}$ | $L_{B49}$ |
| 4623 | $L_{A63}$ | $L_{B49}$ |
| 4624 | $L_{A64}$ | $L_{B49}$ |
| 4625 | $L_{A65}$ | $L_{B49}$ |
| 4626 | $L_{A66}$ | $L_{B49}$ |
| 4627 | $L_{A67}$ | $L_{B49}$ |
| 4628 | $L_{A68}$ | $L_{B49}$ |
| 4629 | $L_{A69}$ | $L_{B49}$ |
| 4630 | $L_{A70}$ | $L_{B49}$ |
| 4631 | $L_{A71}$ | $L_{B49}$ |
| 4632 | $L_{A72}$ | $L_{B49}$ |
| 4633 | $L_{A73}$ | $L_{B49}$ |
| 4634 | $L_{A74}$ | $L_{B49}$ |
| 4635 | $L_{A75}$ | $L_{B49}$ |
| 4636 | $L_{A76}$ | $L_{B49}$ |
| 4637 | $L_{A77}$ | $L_{B49}$ |
| 4638 | $L_{A78}$ | $L_{B49}$ |
| 4639 | $L_{A79}$ | $L_{B49}$ |
| 4640 | $L_{A80}$ | $L_{B49}$ |
| 4641 | $L_{A81}$ | $L_{B49}$ |
| 4642 | $L_{A82}$ | $L_{B49}$ |
| 4643 | $L_{A83}$ | $L_{B49}$ |
| 4644 | $L_{A84}$ | $L_{B49}$ |
| 4645 | $L_{A85}$ | $L_{B49}$ |
| 4646 | $L_{A86}$ | $L_{B49}$ |
| 4647 | $L_{A87}$ | $L_{B49}$ |
| 4648 | $L_{A88}$ | $L_{B49}$ |
| 4649 | $L_{A89}$ | $L_{B49}$ |
| 4650 | $L_{A90}$ | $L_{B49}$ |
| 4651 | $L_{A91}$ | $L_{B49}$ |

-continued

| Cpd # | $L_A$ | $L_B$ |
|---|---|---|
| 4652 | $L_{A92}$ | $L_{B49}$ |
| 4653 | $L_{A93}$ | $L_{B49}$ |
| 4654 | $L_{A94}$ | $L_{B49}$ |
| 4655 | $L_{A95}$ | $L_{B49}$ |
| 4656 | $L_{A1}$ | $L_{B50}$ |
| 4657 | $L_{A2}$ | $L_{B50}$ |
| 4658 | $L_{A3}$ | $L_{B50}$ |
| 4659 | $L_{A4}$ | $L_{B50}$ |
| 4660 | $L_{A5}$ | $L_{B50}$ |
| 4661 | $L_{A6}$ | $L_{B50}$ |
| 4662 | $L_{A7}$ | $L_{B50}$ |
| 4663 | $L_{A8}$ | $L_{B50}$ |
| 4664 | $L_{A9}$ | $L_{B50}$ |
| 4665 | $L_{A10}$ | $L_{B50}$ |
| 4666 | $L_{A11}$ | $L_{B50}$ |
| 4667 | $L_{A12}$ | $L_{B50}$ |
| 4668 | $L_{A13}$ | $L_{B50}$ |
| 4669 | $L_{A14}$ | $L_{B50}$ |
| 4670 | $L_{A15}$ | $L_{B50}$ |
| 4671 | $L_{A16}$ | $L_{B50}$ |
| 4672 | $L_{A17}$ | $L_{B50}$ |
| 4673 | $L_{A18}$ | $L_{B50}$ |
| 4674 | $L_{A19}$ | $L_{B50}$ |
| 4675 | $L_{A20}$ | $L_{B50}$ |
| 4676 | $L_{A21}$ | $L_{B50}$ |
| 4677 | $L_{A22}$ | $L_{B50}$ |
| 4678 | $L_{A23}$ | $L_{B50}$ |
| 4679 | $L_{A24}$ | $L_{B50}$ |
| 4680 | $L_{A25}$ | $L_{B50}$ |
| 4681 | $L_{A26}$ | $L_{B50}$ |
| 4682 | $L_{A27}$ | $L_{B50}$ |
| 4683 | $L_{A28}$ | $L_{B50}$ |
| 4684 | $L_{A29}$ | $L_{B50}$ |
| 4685 | $L_{A30}$ | $L_{B50}$ |
| 4686 | $L_{A31}$ | $L_{B50}$ |
| 4687 | $L_{A32}$ | $L_{B50}$ |
| 4688 | $L_{A33}$ | $L_{B50}$ |
| 4689 | $L_{A34}$ | $L_{B50}$ |
| 4690 | $L_{A35}$ | $L_{B50}$ |
| 4691 | $L_{A36}$ | $L_{B50}$ |
| 4692 | $L_{A37}$ | $L_{B50}$ |
| 4693 | $L_{A38}$ | $L_{B50}$ |
| 4694 | $L_{A39}$ | $L_{B50}$ |
| 4695 | $L_{A40}$ | $L_{B50}$ |
| 4696 | $L_{A41}$ | $L_{B50}$ |
| 4697 | $L_{A42}$ | $L_{B50}$ |
| 4698 | $L_{A43}$ | $L_{B50}$ |
| 4699 | $L_{A44}$ | $L_{B50}$ |
| 4700 | $L_{A45}$ | $L_{B50}$ |
| 4701 | $L_{A46}$ | $L_{B50}$ |
| 4702 | $L_{A47}$ | $L_{B50}$ |
| 4703 | $L_{A48}$ | $L_{B50}$ |
| 4704 | $L_{A49}$ | $L_{B50}$ |
| 4705 | $L_{A50}$ | $L_{B50}$ |
| 4706 | $L_{A51}$ | $L_{B50}$ |
| 4707 | $L_{A52}$ | $L_{B50}$ |
| 4708 | $L_{A53}$ | $L_{B50}$ |
| 4709 | $L_{A54}$ | $L_{B50}$ |
| 4710 | $L_{A55}$ | $L_{B50}$ |
| 4711 | $L_{A56}$ | $L_{B50}$ |
| 4712 | $L_{A57}$ | $L_{B50}$ |
| 4713 | $L_{A58}$ | $L_{B50}$ |
| 4714 | $L_{A59}$ | $L_{B50}$ |
| 4715 | $L_{A60}$ | $L_{B50}$ |
| 4716 | $L_{A61}$ | $L_{B50}$ |
| 4717 | $L_{A62}$ | $L_{B50}$ |
| 4718 | $L_{A63}$ | $L_{B50}$ |
| 4719 | $L_{A64}$ | $L_{B50}$ |
| 4720 | $L_{A65}$ | $L_{B50}$ |
| 4721 | $L_{A66}$ | $L_{B50}$ |
| 4722 | $L_{A67}$ | $L_{B50}$ |
| 4723 | $L_{A68}$ | $L_{B50}$ |
| 4724 | $L_{A69}$ | $L_{B50}$ |
| 4725 | $L_{A70}$ | $L_{B50}$ |
| 4726 | $L_{A71}$ | $L_{B50}$ |
| 4727 | $L_{A72}$ | $L_{B50}$ |
| 4728 | $L_{A73}$ | $L_{B50}$ |

-continued

| Cpd # | $L_A$ | $L_B$ |
|---|---|---|
| 4729 | $L_{A74}$ | $L_{B50}$ |
| 4730 | $L_{A75}$ | $L_{B50}$ |
| 4731 | $L_{A76}$ | $L_{B50}$ |
| 4732 | $L_{A77}$ | $L_{B50}$ |
| 4733 | $L_{A78}$ | $L_{B50}$ |
| 4734 | $L_{A79}$ | $L_{B50}$ |
| 4735 | $L_{A80}$ | $L_{B50}$ |
| 4736 | $L_{A81}$ | $L_{B50}$ |
| 4737 | $L_{A82}$ | $L_{B50}$ |
| 4738 | $L_{A83}$ | $L_{B50}$ |
| 4739 | $L_{A84}$ | $L_{B50}$ |
| 4740 | $L_{A85}$ | $L_{B50}$ |
| 4741 | $L_{A86}$ | $L_{B50}$ |
| 4742 | $L_{A87}$ | $L_{B50}$ |
| 4743 | $L_{A88}$ | $L_{B50}$ |
| 4744 | $L_{A89}$ | $L_{B50}$ |
| 4745 | $L_{A90}$ | $L_{B50}$ |
| 4746 | $L_{A91}$ | $L_{B50}$ |
| 4747 | $L_{A92}$ | $L_{B50}$ |
| 4748 | $L_{A93}$ | $L_{B50}$ |
| 4749 | $L_{A94}$ | $L_{B50}$ |
| 4750 | $L_{A95}$ | $L_{B50}$ |
| 4751 | $L_{A1}$ | $L_{B51}$ |
| 4752 | $L_{A2}$ | $L_{B51}$ |
| 4753 | $L_{A3}$ | $L_{B51}$ |
| 4754 | $L_{A4}$ | $L_{B51}$ |
| 4755 | $L_{A5}$ | $L_{B51}$ |
| 4756 | $L_{A6}$ | $L_{B51}$ |
| 4757 | $L_{A7}$ | $L_{B51}$ |
| 4758 | $L_{A8}$ | $L_{B51}$ |
| 4759 | $L_{A9}$ | $L_{B51}$ |
| 4760 | $L_{A10}$ | $L_{B51}$ |
| 4761 | $L_{A11}$ | $L_{B51}$ |
| 4762 | $L_{A12}$ | $L_{B51}$ |
| 4763 | $L_{A13}$ | $L_{B51}$ |
| 4764 | $L_{A14}$ | $L_{B51}$ |
| 4765 | $L_{A15}$ | $L_{B51}$ |
| 4766 | $L_{A16}$ | $L_{B51}$ |
| 4767 | $L_{A17}$ | $L_{B51}$ |
| 4768 | $L_{A18}$ | $L_{B51}$ |
| 4769 | $L_{A19}$ | $L_{B51}$ |
| 4770 | $L_{A20}$ | $L_{B51}$ |
| 4771 | $L_{A21}$ | $L_{B51}$ |
| 4772 | $L_{A22}$ | $L_{B51}$ |
| 4773 | $L_{A23}$ | $L_{B51}$ |
| 4774 | $L_{A24}$ | $L_{B51}$ |
| 4775 | $L_{A25}$ | $L_{B51}$ |
| 4776 | $L_{A26}$ | $L_{B51}$ |
| 4777 | $L_{A27}$ | $L_{B51}$ |
| 4778 | $L_{A28}$ | $L_{B51}$ |
| 4779 | $L_{A29}$ | $L_{B51}$ |
| 4780 | $L_{A30}$ | $L_{B51}$ |
| 4781 | $L_{A31}$ | $L_{B51}$ |
| 4782 | $L_{A32}$ | $L_{B51}$ |
| 4783 | $L_{A33}$ | $L_{B51}$ |
| 4784 | $L_{A34}$ | $L_{B51}$ |
| 4785 | $L_{A35}$ | $L_{B51}$ |
| 4786 | $L_{A36}$ | $L_{B51}$ |
| 4787 | $L_{A37}$ | $L_{B51}$ |
| 4788 | $L_{A38}$ | $L_{B51}$ |
| 4789 | $L_{A39}$ | $L_{B51}$ |
| 4790 | $L_{A40}$ | $L_{B51}$ |
| 4791 | $L_{A41}$ | $L_{B51}$ |
| 4792 | $L_{A42}$ | $L_{B51}$ |
| 4793 | $L_{A43}$ | $L_{B51}$ |
| 4794 | $L_{A44}$ | $L_{B51}$ |
| 4795 | $L_{A45}$ | $L_{B51}$ |
| 4796 | $L_{A46}$ | $L_{B51}$ |
| 4797 | $L_{A47}$ | $L_{B51}$ |
| 4798 | $L_{A48}$ | $L_{B51}$ |
| 4799 | $L_{A49}$ | $L_{B51}$ |
| 4800 | $L_{A50}$ | $L_{B51}$ |
| 4801 | $L_{A51}$ | $L_{B51}$ |
| 4802 | $L_{A52}$ | $L_{B51}$ |
| 4803 | $L_{A53}$ | $L_{B51}$ |
| 4804 | $L_{A54}$ | $L_{B51}$ |
| 4805 | $L_{A55}$ | $L_{B51}$ |

-continued

| Cpd # | $L_A$ | $L_B$ |
|---|---|---|
| 4806 | $L_{A56}$ | $L_{B51}$ |
| 4807 | $L_{A57}$ | $L_{B51}$ |
| 4808 | $L_{A58}$ | $L_{B51}$ |
| 4809 | $L_{A59}$ | $L_{B51}$ |
| 4810 | $L_{A60}$ | $L_{B51}$ |
| 4811 | $L_{A61}$ | $L_{B51}$ |
| 4812 | $L_{A62}$ | $L_{B51}$ |
| 4813 | $L_{A63}$ | $L_{B51}$ |
| 4814 | $L_{A64}$ | $L_{B51}$ |
| 4815 | $L_{A65}$ | $L_{B51}$ |
| 4816 | $L_{A66}$ | $L_{B51}$ |
| 4817 | $L_{A67}$ | $L_{B51}$ |
| 4818 | $L_{A68}$ | $L_{B51}$ |
| 4819 | $L_{A69}$ | $L_{B51}$ |
| 4820 | $L_{A70}$ | $L_{B51}$ |
| 4821 | $L_{A71}$ | $L_{B51}$ |
| 4822 | $L_{A72}$ | $L_{B51}$ |
| 4823 | $L_{A73}$ | $L_{B51}$ |
| 4824 | $L_{A74}$ | $L_{B51}$ |
| 4825 | $L_{A75}$ | $L_{B51}$ |
| 4826 | $L_{A76}$ | $L_{B51}$ |
| 4827 | $L_{A77}$ | $L_{B51}$ |
| 4828 | $L_{A78}$ | $L_{B51}$ |
| 4829 | $L_{A79}$ | $L_{B51}$ |
| 4830 | $L_{A80}$ | $L_{B51}$ |
| 4831 | $L_{A81}$ | $L_{B51}$ |
| 4832 | $L_{A82}$ | $L_{B51}$ |
| 4833 | $L_{A83}$ | $L_{B51}$ |
| 4834 | $L_{A84}$ | $L_{B51}$ |
| 4835 | $L_{A85}$ | $L_{B51}$ |
| 4836 | $L_{A86}$ | $L_{B51}$ |
| 4837 | $L_{A87}$ | $L_{B51}$ |
| 4838 | $L_{A88}$ | $L_{B51}$ |
| 4839 | $L_{A89}$ | $L_{B51}$ |
| 4840 | $L_{A90}$ | $L_{B51}$ |
| 4841 | $L_{A91}$ | $L_{B51}$ |
| 4842 | $L_{A92}$ | $L_{B51}$ |
| 4843 | $L_{A93}$ | $L_{B51}$ |
| 4844 | $L_{A94}$ | $L_{B51}$ |
| 4845 | $L_{A95}$ | $L_{B51}$ |
| 4846 | $L_{A1}$ | $L_{B52}$ |
| 4847 | $L_{A2}$ | $L_{B52}$ |
| 4848 | $L_{A3}$ | $L_{B52}$ |
| 4849 | $L_{A4}$ | $L_{B52}$ |
| 4850 | $L_{A5}$ | $L_{B52}$ |
| 4851 | $L_{A6}$ | $L_{B52}$ |
| 4852 | $L_{A7}$ | $L_{B52}$ |
| 4853 | $L_{A8}$ | $L_{B52}$ |
| 4854 | $L_{A9}$ | $L_{B52}$ |
| 4855 | $L_{A10}$ | $L_{B52}$ |
| 4856 | $L_{A11}$ | $L_{B52}$ |
| 4857 | $L_{A12}$ | $L_{B52}$ |
| 4858 | $L_{A13}$ | $L_{B52}$ |
| 4859 | $L_{A14}$ | $L_{B52}$ |
| 4860 | $L_{A15}$ | $L_{B52}$ |
| 4861 | $L_{A16}$ | $L_{B52}$ |
| 4862 | $L_{A17}$ | $L_{B52}$ |
| 4863 | $L_{A18}$ | $L_{B52}$ |
| 4864 | $L_{A19}$ | $L_{B52}$ |
| 4865 | $L_{A20}$ | $L_{B52}$ |
| 4866 | $L_{A21}$ | $L_{B52}$ |
| 4867 | $L_{A22}$ | $L_{B52}$ |
| 4868 | $L_{A23}$ | $L_{B52}$ |
| 4869 | $L_{A24}$ | $L_{B52}$ |
| 4870 | $L_{A25}$ | $L_{B52}$ |
| 4871 | $L_{A26}$ | $L_{B52}$ |
| 4872 | $L_{A27}$ | $L_{B52}$ |
| 4873 | $L_{A28}$ | $L_{B52}$ |
| 4874 | $L_{A29}$ | $L_{B52}$ |
| 4875 | $L_{A30}$ | $L_{B52}$ |
| 4876 | $L_{A31}$ | $L_{B52}$ |
| 4877 | $L_{A32}$ | $L_{B52}$ |
| 4878 | $L_{A33}$ | $L_{B52}$ |
| 4879 | $L_{A34}$ | $L_{B52}$ |
| 4880 | $L_{A35}$ | $L_{B52}$ |
| 4881 | $L_{A36}$ | $L_{B52}$ |
| 4882 | $L_{A37}$ | $L_{B52}$ |

-continued

| Cpd # | $L_A$ | $L_B$ |
|---|---|---|
| 4883 | $L_{A38}$ | $L_{B52}$ |
| 4884 | $L_{A39}$ | $L_{B52}$ |
| 4885 | $L_{A40}$ | $L_{B52}$ |
| 4886 | $L_{A41}$ | $L_{B52}$ |
| 4887 | $L_{A42}$ | $L_{B52}$ |
| 4888 | $L_{A43}$ | $L_{B52}$ |
| 4889 | $L_{A44}$ | $L_{B52}$ |
| 4890 | $L_{A45}$ | $L_{B52}$ |
| 4891 | $L_{A46}$ | $L_{B52}$ |
| 4892 | $L_{A47}$ | $L_{B52}$ |
| 4893 | $L_{A48}$ | $L_{B52}$ |
| 4894 | $L_{A49}$ | $L_{B52}$ |
| 4895 | $L_{A50}$ | $L_{B52}$ |
| 4896 | $L_{A51}$ | $L_{B52}$ |
| 4897 | $L_{A52}$ | $L_{B52}$ |
| 4898 | $L_{A53}$ | $L_{B52}$ |
| 4899 | $L_{A54}$ | $L_{B52}$ |
| 4900 | $L_{A55}$ | $L_{B52}$ |
| 4901 | $L_{A56}$ | $L_{B52}$ |
| 4902 | $L_{A57}$ | $L_{B52}$ |
| 4903 | $L_{A58}$ | $L_{B52}$ |
| 4904 | $L_{A59}$ | $L_{B52}$ |
| 4905 | $L_{A60}$ | $L_{B52}$ |
| 4906 | $L_{A61}$ | $L_{B52}$ |
| 4907 | $L_{A62}$ | $L_{B52}$ |
| 4908 | $L_{A63}$ | $L_{B52}$ |
| 4909 | $L_{A64}$ | $L_{B52}$ |
| 4910 | $L_{A65}$ | $L_{B52}$ |
| 4911 | $L_{A66}$ | $L_{B52}$ |
| 4912 | $L_{A67}$ | $L_{B52}$ |
| 4913 | $L_{A68}$ | $L_{B52}$ |
| 4914 | $L_{A69}$ | $L_{B52}$ |
| 4915 | $L_{A70}$ | $L_{B52}$ |
| 4916 | $L_{A71}$ | $L_{B52}$ |
| 4917 | $L_{A72}$ | $L_{B52}$ |
| 4918 | $L_{A73}$ | $L_{B52}$ |
| 4919 | $L_{A74}$ | $L_{B52}$ |
| 4920 | $L_{A75}$ | $L_{B52}$ |
| 4921 | $L_{A76}$ | $L_{B52}$ |
| 4922 | $L_{A77}$ | $L_{B52}$ |
| 4923 | $L_{A78}$ | $L_{B52}$ |
| 4924 | $L_{A79}$ | $L_{B52}$ |
| 4925 | $L_{A80}$ | $L_{B52}$ |
| 4926 | $L_{A81}$ | $L_{B52}$ |
| 4927 | $L_{A82}$ | $L_{B52}$ |
| 4928 | $L_{A83}$ | $L_{B52}$ |
| 4929 | $L_{A84}$ | $L_{B52}$ |
| 4930 | $L_{A85}$ | $L_{B52}$ |
| 4931 | $L_{A86}$ | $L_{B52}$ |
| 4932 | $L_{A87}$ | $L_{B52}$ |
| 4933 | $L_{A88}$ | $L_{B52}$ |
| 4934 | $L_{A89}$ | $L_{B52}$ |
| 4935 | $L_{A90}$ | $L_{B52}$ |
| 4936 | $L_{A91}$ | $L_{B52}$ |
| 4937 | $L_{A92}$ | $L_{B52}$ |
| 4938 | $L_{A93}$ | $L_{B52}$ |
| 4939 | $L_{A94}$ | $L_{B52}$ |
| 4940 | $L_{A95}$ | $L_{B52}$ |
| 4941 | $L_{A1}$ | $L_{B53}$ |
| 4942 | $L_{A2}$ | $L_{B53}$ |
| 4943 | $L_{A3}$ | $L_{B53}$ |
| 4944 | $L_{A4}$ | $L_{B53}$ |
| 4945 | $L_{A5}$ | $L_{B53}$ |
| 4946 | $L_{A6}$ | $L_{B53}$ |
| 4947 | $L_{A7}$ | $L_{B53}$ |
| 4948 | $L_{A8}$ | $L_{B53}$ |
| 4949 | $L_{A9}$ | $L_{B53}$ |
| 4950 | $L_{A10}$ | $L_{B53}$ |
| 4951 | $L_{A11}$ | $L_{B53}$ |
| 4952 | $L_{A12}$ | $L_{B53}$ |
| 4953 | $L_{A13}$ | $L_{B53}$ |
| 4954 | $L_{A14}$ | $L_{B53}$ |
| 4955 | $L_{A15}$ | $L_{B53}$ |
| 4956 | $L_{A16}$ | $L_{B53}$ |
| 4957 | $L_{A17}$ | $L_{B53}$ |
| 4958 | $L_{A18}$ | $L_{B53}$ |
| 4959 | $L_{A19}$ | $L_{B53}$ |

-continued

| Cpd # | $L_A$ | $L_B$ |
|---|---|---|
| 4960 | $L_{A20}$ | $L_{B53}$ |
| 4961 | $L_{A21}$ | $L_{B53}$ |
| 4962 | $L_{A22}$ | $L_{B53}$ |
| 4963 | $L_{A23}$ | $L_{B53}$ |
| 4964 | $L_{A24}$ | $L_{B53}$ |
| 4965 | $L_{A25}$ | $L_{B53}$ |
| 4966 | $L_{A26}$ | $L_{B53}$ |
| 4967 | $L_{A27}$ | $L_{B53}$ |
| 4968 | $L_{A28}$ | $L_{B53}$ |
| 4969 | $L_{A29}$ | $L_{B53}$ |
| 4970 | $L_{A30}$ | $L_{B53}$ |
| 4971 | $L_{A31}$ | $L_{B53}$ |
| 4972 | $L_{A32}$ | $L_{B53}$ |
| 4973 | $L_{A33}$ | $L_{B53}$ |
| 4974 | $L_{A34}$ | $L_{B53}$ |
| 4975 | $L_{A35}$ | $L_{B53}$ |
| 4976 | $L_{A36}$ | $L_{B53}$ |
| 4977 | $L_{A37}$ | $L_{B53}$ |
| 4978 | $L_{A38}$ | $L_{B53}$ |
| 4979 | $L_{A39}$ | $L_{B53}$ |
| 4980 | $L_{A40}$ | $L_{B53}$ |
| 4981 | $L_{A41}$ | $L_{B53}$ |
| 4982 | $L_{A42}$ | $L_{B53}$ |
| 4983 | $L_{A43}$ | $L_{B53}$ |
| 4984 | $L_{A44}$ | $L_{B53}$ |
| 4985 | $L_{A45}$ | $L_{B53}$ |
| 4986 | $L_{A46}$ | $L_{B53}$ |
| 4987 | $L_{A47}$ | $L_{B53}$ |
| 4988 | $L_{A48}$ | $L_{B53}$ |
| 4989 | $L_{A49}$ | $L_{B53}$ |
| 4990 | $L_{A50}$ | $L_{B53}$ |
| 4991 | $L_{A51}$ | $L_{B53}$ |
| 4992 | $L_{A52}$ | $L_{B53}$ |
| 4993 | $L_{A53}$ | $L_{B53}$ |
| 4994 | $L_{A54}$ | $L_{B53}$ |
| 4995 | $L_{A55}$ | $L_{B53}$ |
| 4996 | $L_{A56}$ | $L_{B53}$ |
| 4997 | $L_{A57}$ | $L_{B53}$ |
| 4998 | $L_{A58}$ | $L_{B53}$ |
| 4999 | $L_{A59}$ | $L_{B53}$ |
| 5000 | $L_{A60}$ | $L_{B53}$ |
| 5001 | $L_{A61}$ | $L_{B53}$ |
| 5002 | $L_{A62}$ | $L_{B53}$ |
| 5003 | $L_{A63}$ | $L_{B53}$ |
| 5004 | $L_{A64}$ | $L_{B53}$ |
| 5005 | $L_{A65}$ | $L_{B53}$ |
| 5006 | $L_{A66}$ | $L_{B53}$ |
| 5007 | $L_{A67}$ | $L_{B53}$ |
| 5008 | $L_{A68}$ | $L_{B53}$ |
| 5009 | $L_{A69}$ | $L_{B53}$ |
| 5010 | $L_{A70}$ | $L_{B53}$ |
| 5011 | $L_{A71}$ | $L_{B53}$ |
| 5012 | $L_{A72}$ | $L_{B53}$ |
| 5013 | $L_{A73}$ | $L_{B53}$ |
| 5014 | $L_{A74}$ | $L_{B53}$ |
| 5015 | $L_{A75}$ | $L_{B53}$ |
| 5016 | $L_{A76}$ | $L_{B53}$ |
| 5017 | $L_{A77}$ | $L_{B53}$ |
| 5018 | $L_{A78}$ | $L_{B53}$ |
| 5019 | $L_{A79}$ | $L_{B53}$ |
| 5020 | $L_{A80}$ | $L_{B53}$ |
| 5021 | $L_{A81}$ | $L_{B53}$ |
| 5022 | $L_{A82}$ | $L_{B53}$ |
| 5023 | $L_{A83}$ | $L_{B53}$ |
| 5024 | $L_{A84}$ | $L_{B53}$ |
| 5025 | $L_{A85}$ | $L_{B53}$ |
| 5026 | $L_{A86}$ | $L_{B53}$ |
| 5027 | $L_{A87}$ | $L_{B53}$ |
| 5028 | $L_{A88}$ | $L_{B53}$ |
| 5029 | $L_{A89}$ | $L_{B53}$ |
| 5030 | $L_{A90}$ | $L_{B53}$ |
| 5031 | $L_{A91}$ | $L_{B53}$ |
| 5032 | $L_{A92}$ | $L_{B53}$ |
| 5033 | $L_{A93}$ | $L_{B53}$ |
| 5034 | $L_{A94}$ | $L_{B53}$ |
| 5035 | $L_{A95}$ | $L_{B53}$ |
| 5036 | $L_{A1}$ | $L_{B54}$ |

-continued

| Cpd # | $L_A$ | $L_B$ |
|---|---|---|
| 5037 | $L_{A2}$ | $L_{B54}$ |
| 5038 | $L_{A3}$ | $L_{B54}$ |
| 5039 | $L_{A4}$ | $L_{B54}$ |
| 5040 | $L_{A5}$ | $L_{B54}$ |
| 5041 | $L_{A6}$ | $L_{B54}$ |
| 5042 | $L_{A7}$ | $L_{B54}$ |
| 5043 | $L_{A8}$ | $L_{B54}$ |
| 5044 | $L_{A9}$ | $L_{B54}$ |
| 5045 | $L_{A10}$ | $L_{B54}$ |
| 5046 | $L_{A11}$ | $L_{B54}$ |
| 5047 | $L_{A12}$ | $L_{B54}$ |
| 5048 | $L_{A13}$ | $L_{B54}$ |
| 5049 | $L_{A14}$ | $L_{B54}$ |
| 5050 | $L_{A15}$ | $L_{B54}$ |
| 5051 | $L_{A16}$ | $L_{B54}$ |
| 5052 | $L_{A17}$ | $L_{B54}$ |
| 5053 | $L_{A18}$ | $L_{B54}$ |
| 5054 | $L_{A19}$ | $L_{B54}$ |
| 5055 | $L_{A20}$ | $L_{B54}$ |
| 5056 | $L_{A21}$ | $L_{B54}$ |
| 5057 | $L_{A22}$ | $L_{B54}$ |
| 5058 | $L_{A23}$ | $L_{B54}$ |
| 5059 | $L_{A24}$ | $L_{B54}$ |
| 5060 | $L_{A25}$ | $L_{B54}$ |
| 5061 | $L_{A26}$ | $L_{B54}$ |
| 5062 | $L_{A27}$ | $L_{B54}$ |
| 5063 | $L_{A28}$ | $L_{B54}$ |
| 5064 | $L_{A29}$ | $L_{B54}$ |
| 5065 | $L_{A30}$ | $L_{B54}$ |
| 5066 | $L_{A31}$ | $L_{B54}$ |
| 5067 | $L_{A32}$ | $L_{B54}$ |
| 5068 | $L_{A33}$ | $L_{B54}$ |
| 5069 | $L_{A34}$ | $L_{B54}$ |
| 5070 | $L_{A35}$ | $L_{B54}$ |
| 5071 | $L_{A36}$ | $L_{B54}$ |
| 5072 | $L_{A37}$ | $L_{B54}$ |
| 5073 | $L_{A38}$ | $L_{B54}$ |
| 5074 | $L_{A39}$ | $L_{B54}$ |
| 5075 | $L_{A40}$ | $L_{B54}$ |
| 5076 | $L_{A41}$ | $L_{B54}$ |
| 5077 | $L_{A42}$ | $L_{B54}$ |
| 5078 | $L_{A43}$ | $L_{B54}$ |
| 5079 | $L_{A44}$ | $L_{B54}$ |
| 5080 | $L_{A45}$ | $L_{B54}$ |
| 5081 | $L_{A46}$ | $L_{B54}$ |
| 5082 | $L_{A47}$ | $L_{B54}$ |
| 5083 | $L_{A48}$ | $L_{B54}$ |
| 5084 | $L_{A49}$ | $L_{B54}$ |
| 5085 | $L_{A50}$ | $L_{B54}$ |
| 5086 | $L_{A51}$ | $L_{B54}$ |
| 5087 | $L_{A52}$ | $L_{B54}$ |
| 5088 | $L_{A53}$ | $L_{B54}$ |
| 5089 | $L_{A54}$ | $L_{B54}$ |
| 5090 | $L_{A55}$ | $L_{B54}$ |
| 5091 | $L_{A56}$ | $L_{B54}$ |
| 5092 | $L_{A57}$ | $L_{B54}$ |
| 5093 | $L_{A58}$ | $L_{B54}$ |
| 5094 | $L_{A59}$ | $L_{B54}$ |
| 5095 | $L_{A60}$ | $L_{B54}$ |
| 5096 | $L_{A61}$ | $L_{B54}$ |
| 5097 | $L_{A62}$ | $L_{B54}$ |
| 5098 | $L_{A63}$ | $L_{B54}$ |
| 5099 | $L_{A64}$ | $L_{B54}$ |
| 5100 | $L_{A65}$ | $L_{B54}$ |
| 5101 | $L_{A66}$ | $L_{B54}$ |
| 5102 | $L_{A67}$ | $L_{B54}$ |
| 5103 | $L_{A68}$ | $L_{B54}$ |
| 5104 | $L_{A69}$ | $L_{B54}$ |
| 5105 | $L_{A70}$ | $L_{B54}$ |
| 5106 | $L_{A71}$ | $L_{B54}$ |
| 5107 | $L_{A72}$ | $L_{B54}$ |
| 5108 | $L_{A73}$ | $L_{B54}$ |
| 5109 | $L_{A74}$ | $L_{B54}$ |
| 5110 | $L_{A75}$ | $L_{B54}$ |
| 5111 | $L_{A76}$ | $L_{B54}$ |
| 5112 | $L_{A77}$ | $L_{B54}$ |
| 5113 | $L_{A78}$ | $L_{B54}$ |

-continued

| Cpd # | $L_A$ | $L_B$ |
|---|---|---|
| 5114 | $L_{A79}$ | $L_{B54}$ |
| 5115 | $L_{A80}$ | $L_{B54}$ |
| 5116 | $L_{A81}$ | $L_{B54}$ |
| 5117 | $L_{A82}$ | $L_{B54}$ |
| 5118 | $L_{A83}$ | $L_{B54}$ |
| 5119 | $L_{A84}$ | $L_{B54}$ |
| 5120 | $L_{A85}$ | $L_{B54}$ |
| 5121 | $L_{A86}$ | $L_{B54}$ |
| 5122 | $L_{A87}$ | $L_{B54}$ |
| 5123 | $L_{A88}$ | $L_{B54}$ |
| 5124 | $L_{A89}$ | $L_{B54}$ |
| 5125 | $L_{A90}$ | $L_{B54}$ |
| 5126 | $L_{A91}$ | $L_{B54}$ |
| 5127 | $L_{A92}$ | $L_{B54}$ |
| 5128 | $L_{A93}$ | $L_{B54}$ |
| 5129 | $L_{A94}$ | $L_{B54}$ |
| 5130 | $L_{A95}$ | $L_{B54}$ |
| 5131 | $L_{A1}$ | $L_{B55}$ |
| 5132 | $L_{A2}$ | $L_{B55}$ |
| 5133 | $L_{A3}$ | $L_{B55}$ |
| 5134 | $L_{A4}$ | $L_{B55}$ |
| 5135 | $L_{A5}$ | $L_{B55}$ |
| 5136 | $L_{A6}$ | $L_{B55}$ |
| 5137 | $L_{A7}$ | $L_{B55}$ |
| 5138 | $L_{A8}$ | $L_{B55}$ |
| 5139 | $L_{A9}$ | $L_{B55}$ |
| 5140 | $L_{A10}$ | $L_{B55}$ |
| 5141 | $L_{A11}$ | $L_{B55}$ |
| 5142 | $L_{A12}$ | $L_{B55}$ |
| 5143 | $L_{A13}$ | $L_{B55}$ |
| 5144 | $L_{A14}$ | $L_{B55}$ |
| 5145 | $L_{A15}$ | $L_{B55}$ |
| 5146 | $L_{A16}$ | $L_{B55}$ |
| 5147 | $L_{A17}$ | $L_{B55}$ |
| 5148 | $L_{A18}$ | $L_{B55}$ |
| 5149 | $L_{A19}$ | $L_{B55}$ |
| 5150 | $L_{A20}$ | $L_{B55}$ |
| 5151 | $L_{A21}$ | $L_{B55}$ |
| 5152 | $L_{A22}$ | $L_{B55}$ |
| 5153 | $L_{A23}$ | $L_{B55}$ |
| 5154 | $L_{A24}$ | $L_{B55}$ |
| 5155 | $L_{A25}$ | $L_{B55}$ |
| 5156 | $L_{A26}$ | $L_{B55}$ |
| 5157 | $L_{A27}$ | $L_{B55}$ |
| 5158 | $L_{A28}$ | $L_{B55}$ |
| 5159 | $L_{A29}$ | $L_{B55}$ |
| 5160 | $L_{A30}$ | $L_{B55}$ |
| 5161 | $L_{A31}$ | $L_{B55}$ |
| 5162 | $L_{A32}$ | $L_{B55}$ |
| 5163 | $L_{A33}$ | $L_{B55}$ |
| 5164 | $L_{A34}$ | $L_{B55}$ |
| 5165 | $L_{A35}$ | $L_{B55}$ |
| 5166 | $L_{A36}$ | $L_{B55}$ |
| 5167 | $L_{A37}$ | $L_{B55}$ |
| 5168 | $L_{A38}$ | $L_{B55}$ |
| 5169 | $L_{A39}$ | $L_{B55}$ |
| 5170 | $L_{A40}$ | $L_{B55}$ |
| 5171 | $L_{A41}$ | $L_{B55}$ |
| 5172 | $L_{A42}$ | $L_{B55}$ |
| 5173 | $L_{A43}$ | $L_{B55}$ |
| 5174 | $L_{A44}$ | $L_{B55}$ |
| 5175 | $L_{A45}$ | $L_{B55}$ |
| 5176 | $L_{A46}$ | $L_{B55}$ |
| 5177 | $L_{A47}$ | $L_{B55}$ |
| 5178 | $L_{A48}$ | $L_{B55}$ |
| 5179 | $L_{A49}$ | $L_{B55}$ |
| 5180 | $L_{A50}$ | $L_{B55}$ |
| 5181 | $L_{A51}$ | $L_{B55}$ |
| 5182 | $L_{A52}$ | $L_{B55}$ |
| 5183 | $L_{A53}$ | $L_{B55}$ |
| 5184 | $L_{A54}$ | $L_{B55}$ |
| 5185 | $L_{A55}$ | $L_{B55}$ |
| 5186 | $L_{A56}$ | $L_{B55}$ |
| 5187 | $L_{A57}$ | $L_{B55}$ |
| 5188 | $L_{A58}$ | $L_{B55}$ |
| 5189 | $L_{A59}$ | $L_{B55}$ |
| 5190 | $L_{A60}$ | $L_{B55}$ |

-continued

| Cpd # | $L_A$ | $L_B$ |
|---|---|---|
| 5191 | $L_{A61}$ | $L_{B55}$ |
| 5192 | $L_{A62}$ | $L_{B55}$ |
| 5193 | $L_{A63}$ | $L_{B55}$ |
| 5194 | $L_{A64}$ | $L_{B55}$ |
| 5195 | $L_{A65}$ | $L_{B55}$ |
| 5196 | $L_{A66}$ | $L_{B55}$ |
| 5197 | $L_{A67}$ | $L_{B55}$ |
| 5198 | $L_{A68}$ | $L_{B55}$ |
| 5199 | $L_{A69}$ | $L_{B55}$ |
| 5200 | $L_{A70}$ | $L_{B55}$ |
| 5201 | $L_{A71}$ | $L_{B55}$ |
| 5202 | $L_{A72}$ | $L_{B55}$ |
| 5203 | $L_{A73}$ | $L_{B55}$ |
| 5204 | $L_{A74}$ | $L_{B55}$ |
| 5205 | $L_{A75}$ | $L_{B55}$ |
| 5206 | $L_{A76}$ | $L_{B55}$ |
| 5207 | $L_{A77}$ | $L_{B55}$ |
| 5208 | $L_{A78}$ | $L_{B55}$ |
| 5209 | $L_{A79}$ | $L_{B55}$ |
| 5210 | $L_{A80}$ | $L_{B55}$ |
| 5211 | $L_{A81}$ | $L_{B55}$ |
| 5212 | $L_{A82}$ | $L_{B55}$ |
| 5213 | $L_{A83}$ | $L_{B55}$ |
| 5214 | $L_{A84}$ | $L_{B55}$ |
| 5215 | $L_{A85}$ | $L_{B55}$ |
| 5216 | $L_{A86}$ | $L_{B55}$ |
| 5217 | $L_{A87}$ | $L_{B55}$ |
| 5218 | $L_{A88}$ | $L_{B55}$ |
| 5219 | $L_{A89}$ | $L_{B55}$ |
| 5220 | $L_{A90}$ | $L_{B55}$ |
| 5221 | $L_{A91}$ | $L_{B55}$ |
| 5222 | $L_{A92}$ | $L_{B55}$ |
| 5223 | $L_{A93}$ | $L_{B55}$ |
| 5224 | $L_{A94}$ | $L_{B55}$ |
| 5225 | $L_{A95}$ | $L_{B55}$ |
| 5226 | $L_{A1}$ | $L_{B56}$ |
| 5227 | $L_{A2}$ | $L_{B56}$ |
| 5228 | $L_{A3}$ | $L_{B56}$ |
| 5229 | $L_{A4}$ | $L_{B56}$ |
| 5230 | $L_{A5}$ | $L_{B56}$ |
| 5231 | $L_{A6}$ | $L_{B56}$ |
| 5232 | $L_{A7}$ | $L_{B56}$ |
| 5233 | $L_{A8}$ | $L_{B56}$ |
| 5234 | $L_{A9}$ | $L_{B56}$ |
| 5235 | $L_{A10}$ | $L_{B56}$ |
| 5236 | $L_{A11}$ | $L_{B56}$ |
| 5237 | $L_{A12}$ | $L_{B56}$ |
| 5238 | $L_{A13}$ | $L_{B56}$ |
| 5239 | $L_{A14}$ | $L_{B56}$ |
| 5240 | $L_{A15}$ | $L_{B56}$ |
| 5241 | $L_{A16}$ | $L_{B56}$ |
| 5242 | $L_{A17}$ | $L_{B56}$ |
| 5243 | $L_{A18}$ | $L_{B56}$ |
| 5244 | $L_{A19}$ | $L_{B56}$ |
| 5245 | $L_{A20}$ | $L_{B56}$ |
| 5246 | $L_{A21}$ | $L_{B56}$ |
| 5247 | $L_{A22}$ | $L_{B56}$ |
| 5248 | $L_{A23}$ | $L_{B56}$ |
| 5249 | $L_{A24}$ | $L_{B56}$ |
| 5250 | $L_{A25}$ | $L_{B56}$ |
| 5251 | $L_{A26}$ | $L_{B56}$ |
| 5252 | $L_{A27}$ | $L_{B56}$ |
| 5253 | $L_{A28}$ | $L_{B56}$ |
| 5254 | $L_{A29}$ | $L_{B56}$ |
| 5255 | $L_{A30}$ | $L_{B56}$ |
| 5256 | $L_{A31}$ | $L_{B56}$ |
| 5257 | $L_{A32}$ | $L_{B56}$ |
| 5258 | $L_{A33}$ | $L_{B56}$ |
| 5259 | $L_{A34}$ | $L_{B56}$ |
| 5260 | $L_{A35}$ | $L_{B56}$ |
| 5261 | $L_{A36}$ | $L_{B56}$ |
| 5262 | $L_{A37}$ | $L_{B56}$ |
| 5263 | $L_{A38}$ | $L_{B56}$ |
| 5264 | $L_{A39}$ | $L_{B56}$ |
| 5265 | $L_{A40}$ | $L_{B56}$ |
| 5266 | $L_{A41}$ | $L_{B56}$ |
| 5267 | $L_{A42}$ | $L_{B56}$ |

-continued

| Cpd # | $L_A$ | $L_B$ |
|---|---|---|
| 5268 | $L_{A43}$ | $L_{B56}$ |
| 5269 | $L_{A44}$ | $L_{B56}$ |
| 5270 | $L_{A45}$ | $L_{B56}$ |
| 5271 | $L_{A46}$ | $L_{B56}$ |
| 5272 | $L_{A47}$ | $L_{B56}$ |
| 5273 | $L_{A48}$ | $L_{B56}$ |
| 5274 | $L_{A49}$ | $L_{B56}$ |
| 5275 | $L_{A50}$ | $L_{B56}$ |
| 5276 | $L_{A51}$ | $L_{B56}$ |
| 5277 | $L_{A52}$ | $L_{B56}$ |
| 5278 | $L_{A53}$ | $L_{B56}$ |
| 5279 | $L_{A54}$ | $L_{B56}$ |
| 5280 | $L_{A55}$ | $L_{B56}$ |
| 5281 | $L_{A56}$ | $L_{B56}$ |
| 5282 | $L_{A57}$ | $L_{B56}$ |
| 5283 | $L_{A58}$ | $L_{B56}$ |
| 5284 | $L_{A59}$ | $L_{B56}$ |
| 5285 | $L_{A60}$ | $L_{B56}$ |
| 5286 | $L_{A61}$ | $L_{B56}$ |
| 5287 | $L_{A62}$ | $L_{B56}$ |
| 5288 | $L_{A63}$ | $L_{B56}$ |
| 5289 | $L_{A64}$ | $L_{B56}$ |
| 5290 | $L_{A65}$ | $L_{B56}$ |
| 5291 | $L_{A66}$ | $L_{B56}$ |
| 5292 | $L_{A67}$ | $L_{B56}$ |
| 5293 | $L_{A68}$ | $L_{B56}$ |
| 5294 | $L_{A69}$ | $L_{B56}$ |
| 5295 | $L_{A70}$ | $L_{B56}$ |
| 5296 | $L_{A71}$ | $L_{B56}$ |
| 5297 | $L_{A72}$ | $L_{B56}$ |
| 5298 | $L_{A73}$ | $L_{B56}$ |
| 5299 | $L_{A74}$ | $L_{B56}$ |
| 5300 | $L_{A75}$ | $L_{B56}$ |
| 5301 | $L_{A76}$ | $L_{B56}$ |
| 5302 | $L_{A77}$ | $L_{B56}$ |
| 5303 | $L_{A78}$ | $L_{B56}$ |
| 5304 | $L_{A79}$ | $L_{B56}$ |
| 5305 | $L_{A80}$ | $L_{B56}$ |
| 5306 | $L_{A81}$ | $L_{B56}$ |
| 5307 | $L_{A82}$ | $L_{B56}$ |
| 5308 | $L_{A83}$ | $L_{B56}$ |
| 5309 | $L_{A84}$ | $L_{B56}$ |
| 5310 | $L_{A85}$ | $L_{B56}$ |
| 5311 | $L_{A86}$ | $L_{B56}$ |
| 5312 | $L_{A87}$ | $L_{B56}$ |
| 5313 | $L_{A88}$ | $L_{B56}$ |
| 5314 | $L_{A89}$ | $L_{B56}$ |
| 5315 | $L_{A90}$ | $L_{B56}$ |
| 5316 | $L_{A91}$ | $L_{B56}$ |
| 5317 | $L_{A92}$ | $L_{B56}$ |
| 5318 | $L_{A93}$ | $L_{B56}$ |
| 5319 | $L_{A94}$ | $L_{B56}$ |
| 5320 | $L_{A95}$ | $L_{B56}$ |
| 5321 | $L_{A1}$ | $L_{B57}$ |
| 5322 | $L_{A2}$ | $L_{B57}$ |
| 5323 | $L_{A3}$ | $L_{B57}$ |
| 5324 | $L_{A4}$ | $L_{B57}$ |
| 5325 | $L_{A5}$ | $L_{B57}$ |
| 5326 | $L_{A6}$ | $L_{B57}$ |
| 5327 | $L_{A7}$ | $L_{B57}$ |
| 5328 | $L_{A8}$ | $L_{B57}$ |
| 5329 | $L_{A9}$ | $L_{B57}$ |
| 5330 | $L_{A10}$ | $L_{B57}$ |
| 5331 | $L_{A11}$ | $L_{B57}$ |
| 5332 | $L_{A12}$ | $L_{B57}$ |
| 5333 | $L_{A13}$ | $L_{B57}$ |
| 5334 | $L_{A14}$ | $L_{B57}$ |
| 5335 | $L_{A15}$ | $L_{B57}$ |
| 5336 | $L_{A16}$ | $L_{B57}$ |
| 5337 | $L_{A17}$ | $L_{B57}$ |
| 5338 | $L_{A18}$ | $L_{B57}$ |
| 5339 | $L_{A19}$ | $L_{B57}$ |
| 5340 | $L_{A20}$ | $L_{B57}$ |
| 5341 | $L_{A21}$ | $L_{B57}$ |
| 5342 | $L_{A22}$ | $L_{B57}$ |
| 5343 | $L_{A23}$ | $L_{B57}$ |
| 5344 | $L_{A24}$ | $L_{B57}$ |

-continued

| Cpd # | $L_A$ | $L_B$ |
|---|---|---|
| 5345 | $L_{A25}$ | $L_{B57}$ |
| 5346 | $L_{A26}$ | $L_{B57}$ |
| 5347 | $L_{A27}$ | $L_{B57}$ |
| 5348 | $L_{A28}$ | $L_{B57}$ |
| 5349 | $L_{A29}$ | $L_{B57}$ |
| 5350 | $L_{A30}$ | $L_{B57}$ |
| 5351 | $L_{A31}$ | $L_{B57}$ |
| 5352 | $L_{A32}$ | $L_{B57}$ |
| 5353 | $L_{A33}$ | $L_{B57}$ |
| 5354 | $L_{A34}$ | $L_{B57}$ |
| 5355 | $L_{A35}$ | $L_{B57}$ |
| 5356 | $L_{A36}$ | $L_{B57}$ |
| 5357 | $L_{A37}$ | $L_{B57}$ |
| 5358 | $L_{A38}$ | $L_{B57}$ |
| 5359 | $L_{A39}$ | $L_{B57}$ |
| 5360 | $L_{A40}$ | $L_{B57}$ |
| 5361 | $L_{A41}$ | $L_{B57}$ |
| 5362 | $L_{A42}$ | $L_{B57}$ |
| 5363 | $L_{A43}$ | $L_{B57}$ |
| 5364 | $L_{A44}$ | $L_{B57}$ |
| 5365 | $L_{A45}$ | $L_{B57}$ |
| 5366 | $L_{A46}$ | $L_{B57}$ |
| 5367 | $L_{A47}$ | $L_{B57}$ |
| 5368 | $L_{A48}$ | $L_{B57}$ |
| 5369 | $L_{A49}$ | $L_{B57}$ |
| 5370 | $L_{A50}$ | $L_{B57}$ |
| 5371 | $L_{A51}$ | $L_{B57}$ |
| 5372 | $L_{A52}$ | $L_{B57}$ |
| 5373 | $L_{A53}$ | $L_{B57}$ |
| 5374 | $L_{A54}$ | $L_{B57}$ |
| 5375 | $L_{A55}$ | $L_{B57}$ |
| 5376 | $L_{A56}$ | $L_{B57}$ |
| 5377 | $L_{A57}$ | $L_{B57}$ |
| 5378 | $L_{A58}$ | $L_{B57}$ |
| 5379 | $L_{A59}$ | $L_{B57}$ |
| 5380 | $L_{A60}$ | $L_{B57}$ |
| 5381 | $L_{A61}$ | $L_{B57}$ |
| 5382 | $L_{A62}$ | $L_{B57}$ |
| 5383 | $L_{A63}$ | $L_{B57}$ |
| 5384 | $L_{A64}$ | $L_{B57}$ |
| 5385 | $L_{A65}$ | $L_{B57}$ |
| 5386 | $L_{A66}$ | $L_{B57}$ |
| 5387 | $L_{A67}$ | $L_{B57}$ |
| 5388 | $L_{A68}$ | $L_{B57}$ |
| 5389 | $L_{A69}$ | $L_{B57}$ |
| 5390 | $L_{A70}$ | $L_{B57}$ |
| 5391 | $L_{A71}$ | $L_{B57}$ |
| 5392 | $L_{A72}$ | $L_{B57}$ |
| 5393 | $L_{A73}$ | $L_{B57}$ |
| 5394 | $L_{A74}$ | $L_{B57}$ |
| 5395 | $L_{A75}$ | $L_{B57}$ |
| 5396 | $L_{A76}$ | $L_{B57}$ |
| 5397 | $L_{A77}$ | $L_{B57}$ |
| 5398 | $L_{A78}$ | $L_{B57}$ |
| 5399 | $L_{A79}$ | $L_{B57}$ |
| 5400 | $L_{A80}$ | $L_{B57}$ |
| 5401 | $L_{A81}$ | $L_{B57}$ |
| 5402 | $L_{A82}$ | $L_{B57}$ |
| 5403 | $L_{A83}$ | $L_{B57}$ |
| 5404 | $L_{A84}$ | $L_{B57}$ |
| 5405 | $L_{A85}$ | $L_{B57}$ |
| 5406 | $L_{A86}$ | $L_{B57}$ |
| 5407 | $L_{A87}$ | $L_{B57}$ |
| 5408 | $L_{A88}$ | $L_{B57}$ |
| 5409 | $L_{A89}$ | $L_{B57}$ |
| 5410 | $L_{A90}$ | $L_{B57}$ |
| 5411 | $L_{A91}$ | $L_{B57}$ |
| 5412 | $L_{A92}$ | $L_{B57}$ |
| 5413 | $L_{A93}$ | $L_{B57}$ |
| 5414 | $L_{A94}$ | $L_{B57}$ |
| 5415 | $L_{A95}$ | $L_{B57}$ |
| 5416 | $L_{A1}$ | $L_{B58}$ |
| 5417 | $L_{A2}$ | $L_{B58}$ |
| 5418 | $L_{A3}$ | $L_{B58}$ |
| 5419 | $L_{A4}$ | $L_{B58}$ |
| 5420 | $L_{A5}$ | $L_{B58}$ |
| 5421 | $L_{A6}$ | $L_{B58}$ |

-continued

| Cpd # | $L_A$ | $L_B$ |
|---|---|---|
| 5422 | $L_{A7}$ | $L_{B58}$ |
| 5423 | $L_{A8}$ | $L_{B58}$ |
| 5424 | $L_{A9}$ | $L_{B58}$ |
| 5425 | $L_{A10}$ | $L_{B58}$ |
| 5426 | $L_{A11}$ | $L_{B58}$ |
| 5427 | $L_{A12}$ | $L_{B58}$ |
| 5428 | $L_{A13}$ | $L_{B58}$ |
| 5429 | $L_{A14}$ | $L_{B58}$ |
| 5430 | $L_{A15}$ | $L_{B58}$ |
| 5431 | $L_{A16}$ | $L_{B58}$ |
| 5432 | $L_{A17}$ | $L_{B58}$ |
| 5433 | $L_{A18}$ | $L_{B58}$ |
| 5434 | $L_{A19}$ | $L_{B58}$ |
| 5435 | $L_{A20}$ | $L_{B58}$ |
| 5436 | $L_{A21}$ | $L_{B58}$ |
| 5437 | $L_{A22}$ | $L_{B58}$ |
| 5438 | $L_{A23}$ | $L_{B58}$ |
| 5439 | $L_{A24}$ | $L_{B58}$ |
| 5440 | $L_{A25}$ | $L_{B58}$ |
| 5441 | $L_{A26}$ | $L_{B58}$ |
| 5442 | $L_{A27}$ | $L_{B58}$ |
| 5443 | $L_{A28}$ | $L_{B58}$ |
| 5444 | $L_{A29}$ | $L_{B58}$ |
| 5445 | $L_{A30}$ | $L_{B58}$ |
| 5446 | $L_{A31}$ | $L_{B58}$ |
| 5447 | $L_{A32}$ | $L_{B58}$ |
| 5448 | $L_{A33}$ | $L_{B58}$ |
| 5449 | $L_{A34}$ | $L_{B58}$ |
| 5450 | $L_{A35}$ | $L_{B58}$ |
| 5451 | $L_{A36}$ | $L_{B58}$ |
| 5452 | $L_{A37}$ | $L_{B58}$ |
| 5453 | $L_{A38}$ | $L_{B58}$ |
| 5454 | $L_{A39}$ | $L_{B58}$ |
| 5455 | $L_{A40}$ | $L_{B58}$ |
| 5456 | $L_{A41}$ | $L_{B58}$ |
| 5457 | $L_{A42}$ | $L_{B58}$ |
| 5458 | $L_{A43}$ | $L_{B58}$ |
| 5459 | $L_{A44}$ | $L_{B58}$ |
| 5460 | $L_{A45}$ | $L_{B58}$ |
| 5461 | $L_{A46}$ | $L_{B58}$ |
| 5462 | $L_{A47}$ | $L_{B58}$ |
| 5463 | $L_{A48}$ | $L_{B58}$ |
| 5464 | $L_{A49}$ | $L_{B58}$ |
| 5465 | $L_{A50}$ | $L_{B58}$ |
| 5466 | $L_{A51}$ | $L_{B58}$ |
| 5467 | $L_{A52}$ | $L_{B58}$ |
| 5468 | $L_{A53}$ | $L_{B58}$ |
| 5469 | $L_{A54}$ | $L_{B58}$ |
| 5470 | $L_{A55}$ | $L_{B58}$ |
| 5471 | $L_{A56}$ | $L_{B58}$ |
| 5472 | $L_{A57}$ | $L_{B58}$ |
| 5473 | $L_{A58}$ | $L_{B58}$ |
| 5474 | $L_{A59}$ | $L_{B58}$ |
| 5475 | $L_{A60}$ | $L_{B58}$ |
| 5476 | $L_{A61}$ | $L_{B58}$ |
| 5477 | $L_{A62}$ | $L_{B58}$ |
| 5478 | $L_{A63}$ | $L_{B58}$ |
| 5479 | $L_{A64}$ | $L_{B58}$ |
| 5480 | $L_{A65}$ | $L_{B58}$ |
| 5481 | $L_{A66}$ | $L_{B58}$ |
| 5482 | $L_{A67}$ | $L_{B58}$ |
| 5483 | $L_{A68}$ | $L_{B58}$ |
| 5484 | $L_{A69}$ | $L_{B58}$ |
| 5485 | $L_{A70}$ | $L_{B58}$ |
| 5486 | $L_{A71}$ | $L_{B58}$ |
| 5487 | $L_{A72}$ | $L_{B58}$ |
| 5488 | $L_{A73}$ | $L_{B58}$ |
| 5489 | $L_{A74}$ | $L_{B58}$ |
| 5490 | $L_{A75}$ | $L_{B58}$ |
| 5491 | $L_{A76}$ | $L_{B58}$ |
| 5492 | $L_{A77}$ | $L_{B58}$ |
| 5493 | $L_{A78}$ | $L_{B58}$ |
| 5494 | $L_{A79}$ | $L_{B58}$ |
| 5495 | $L_{A80}$ | $L_{B58}$ |
| 5496 | $L_{A81}$ | $L_{B58}$ |
| 5497 | $L_{A82}$ | $L_{B58}$ |
| 5498 | $L_{A83}$ | $L_{B58}$ |

-continued

| Cpd # | $L_A$ | $L_B$ |
|---|---|---|
| 5499 | $L_{A84}$ | $L_{B58}$ |
| 5500 | $L_{A85}$ | $L_{B58}$ |
| 5501 | $L_{A86}$ | $L_{B58}$ |
| 5502 | $L_{A87}$ | $L_{B58}$ |
| 5503 | $L_{A88}$ | $L_{B58}$ |
| 5504 | $L_{A89}$ | $L_{B58}$ |
| 5505 | $L_{A90}$ | $L_{B58}$ |
| 5506 | $L_{A91}$ | $L_{B58}$ |
| 5507 | $L_{A92}$ | $L_{B58}$ |
| 5508 | $L_{A93}$ | $L_{B58}$ |
| 5509 | $L_{A94}$ | $L_{B58}$ |
| 5510 | $L_{A95}$ | $L_{B58}$ |
| 5511 | $L_{A1}$ | $L_{B59}$ |
| 5512 | $L_{A2}$ | $L_{B59}$ |
| 5513 | $L_{A3}$ | $L_{B59}$ |
| 5514 | $L_{A4}$ | $L_{B59}$ |
| 5515 | $L_{A5}$ | $L_{B59}$ |
| 5516 | $L_{A6}$ | $L_{B59}$ |
| 5517 | $L_{A7}$ | $L_{B59}$ |
| 5518 | $L_{A8}$ | $L_{B59}$ |
| 5519 | $L_{A9}$ | $L_{B59}$ |
| 5520 | $L_{A10}$ | $L_{B59}$ |
| 5521 | $L_{A11}$ | $L_{B59}$ |
| 5522 | $L_{A12}$ | $L_{B59}$ |
| 5523 | $L_{A13}$ | $L_{B59}$ |
| 5524 | $L_{A14}$ | $L_{B59}$ |
| 5525 | $L_{A15}$ | $L_{B59}$ |
| 5526 | $L_{A16}$ | $L_{B59}$ |
| 5527 | $L_{A17}$ | $L_{B59}$ |
| 5528 | $L_{A18}$ | $L_{B59}$ |
| 5529 | $L_{A19}$ | $L_{B59}$ |
| 5530 | $L_{A20}$ | $L_{B59}$ |
| 5531 | $L_{A21}$ | $L_{B59}$ |
| 5532 | $L_{A22}$ | $L_{B59}$ |
| 5533 | $L_{A23}$ | $L_{B59}$ |
| 5534 | $L_{A24}$ | $L_{B59}$ |
| 5535 | $L_{A25}$ | $L_{B59}$ |
| 5536 | $L_{A26}$ | $L_{B59}$ |
| 5537 | $L_{A27}$ | $L_{B59}$ |
| 5538 | $L_{A28}$ | $L_{B59}$ |
| 5539 | $L_{A29}$ | $L_{B59}$ |
| 5540 | $L_{A30}$ | $L_{B59}$ |
| 5541 | $L_{A31}$ | $L_{B59}$ |
| 5542 | $L_{A32}$ | $L_{B59}$ |
| 5543 | $L_{A33}$ | $L_{B59}$ |
| 5544 | $L_{A34}$ | $L_{B59}$ |
| 5545 | $L_{A35}$ | $L_{B59}$ |
| 5546 | $L_{A36}$ | $L_{B59}$ |
| 5547 | $L_{A37}$ | $L_{B59}$ |
| 5548 | $L_{A38}$ | $L_{B59}$ |
| 5549 | $L_{A39}$ | $L_{B59}$ |
| 5550 | $L_{A40}$ | $L_{B59}$ |
| 5551 | $L_{A41}$ | $L_{B59}$ |
| 5552 | $L_{A42}$ | $L_{B59}$ |
| 5553 | $L_{A43}$ | $L_{B59}$ |
| 5554 | $L_{A44}$ | $L_{B59}$ |
| 5555 | $L_{A45}$ | $L_{B59}$ |
| 5556 | $L_{A46}$ | $L_{B59}$ |
| 5557 | $L_{A47}$ | $L_{B59}$ |
| 5558 | $L_{A48}$ | $L_{B59}$ |
| 5559 | $L_{A49}$ | $L_{B59}$ |
| 5560 | $L_{A50}$ | $L_{B59}$ |
| 5561 | $L_{A51}$ | $L_{B59}$ |
| 5562 | $L_{A52}$ | $L_{B59}$ |
| 5563 | $L_{A53}$ | $L_{B59}$ |
| 5564 | $L_{A54}$ | $L_{B59}$ |
| 5565 | $L_{A55}$ | $L_{B59}$ |
| 5566 | $L_{A56}$ | $L_{B59}$ |
| 5567 | $L_{A57}$ | $L_{B59}$ |
| 5568 | $L_{A58}$ | $L_{B59}$ |
| 5569 | $L_{A59}$ | $L_{B59}$ |
| 5570 | $L_{A60}$ | $L_{B59}$ |
| 5571 | $L_{A61}$ | $L_{B59}$ |
| 5572 | $L_{A62}$ | $L_{B59}$ |
| 5573 | $L_{A63}$ | $L_{B59}$ |
| 5574 | $L_{A64}$ | $L_{B59}$ |
| 5575 | $L_{A65}$ | $L_{B59}$ |
| 5576 | $L_{A66}$ | $L_{B59}$ |
| 5577 | $L_{A67}$ | $L_{B59}$ |
| 5578 | $L_{A68}$ | $L_{B59}$ |
| 5579 | $L_{A69}$ | $L_{B59}$ |
| 5580 | $L_{A70}$ | $L_{B59}$ |
| 5581 | $L_{A71}$ | $L_{B59}$ |
| 5582 | $L_{A72}$ | $L_{B59}$ |
| 5583 | $L_{A73}$ | $L_{B59}$ |
| 5584 | $L_{A74}$ | $L_{B59}$ |
| 5585 | $L_{A75}$ | $L_{B59}$ |
| 5586 | $L_{A76}$ | $L_{B59}$ |
| 5587 | $L_{A77}$ | $L_{B59}$ |
| 5588 | $L_{A78}$ | $L_{B59}$ |
| 5589 | $L_{A79}$ | $L_{B59}$ |
| 5590 | $L_{A80}$ | $L_{B59}$ |
| 5591 | $L_{A81}$ | $L_{B59}$ |
| 5592 | $L_{A82}$ | $L_{B59}$ |
| 5593 | $L_{A83}$ | $L_{B59}$ |
| 5594 | $L_{A84}$ | $L_{B59}$ |
| 5595 | $L_{A85}$ | $L_{B59}$ |
| 5596 | $L_{A86}$ | $L_{B59}$ |
| 5597 | $L_{A87}$ | $L_{B59}$ |
| 5598 | $L_{A88}$ | $L_{B59}$ |
| 5599 | $L_{A89}$ | $L_{B59}$ |
| 5600 | $L_{A90}$ | $L_{B59}$ |
| 5601 | $L_{A91}$ | $L_{B59}$ |
| 5602 | $L_{A92}$ | $L_{B59}$ |
| 5603 | $L_{A93}$ | $L_{B59}$ |
| 5604 | $L_{A94}$ | $L_{B59}$ |
| 5605 | $L_{A95}$ | $L_{B59}$ |
| 5606 | $L_{A1}$ | $L_{B60}$ |
| 5607 | $L_{A2}$ | $L_{B60}$ |
| 5608 | $L_{A3}$ | $L_{B60}$ |
| 5609 | $L_{A4}$ | $L_{B60}$ |
| 5610 | $L_{A5}$ | $L_{B60}$ |
| 5611 | $L_{A6}$ | $L_{B60}$ |
| 5612 | $L_{A7}$ | $L_{B60}$ |
| 5613 | $L_{A8}$ | $L_{B60}$ |
| 5614 | $L_{A9}$ | $L_{B60}$ |
| 5615 | $L_{A10}$ | $L_{B60}$ |
| 5616 | $L_{A11}$ | $L_{B60}$ |
| 5617 | $L_{A12}$ | $L_{B60}$ |
| 5618 | $L_{A13}$ | $L_{B60}$ |
| 5619 | $L_{A14}$ | $L_{B60}$ |
| 5620 | $L_{A15}$ | $L_{B60}$ |
| 5621 | $L_{A16}$ | $L_{B60}$ |
| 5622 | $L_{A17}$ | $L_{B60}$ |
| 5623 | $L_{A18}$ | $L_{B60}$ |
| 5624 | $L_{A19}$ | $L_{B60}$ |
| 5625 | $L_{A20}$ | $L_{B60}$ |
| 5626 | $L_{A21}$ | $L_{B60}$ |
| 5627 | $L_{A22}$ | $L_{B60}$ |
| 5628 | $L_{A23}$ | $L_{B60}$ |
| 5629 | $L_{A24}$ | $L_{B60}$ |
| 5630 | $L_{A25}$ | $L_{B60}$ |
| 5631 | $L_{A26}$ | $L_{B60}$ |
| 5632 | $L_{A27}$ | $L_{B60}$ |
| 5633 | $L_{A28}$ | $L_{B60}$ |
| 5634 | $L_{A29}$ | $L_{B60}$ |
| 5635 | $L_{A30}$ | $L_{B60}$ |
| 5636 | $L_{A31}$ | $L_{B60}$ |
| 5637 | $L_{A32}$ | $L_{B60}$ |
| 5638 | $L_{A33}$ | $L_{B60}$ |
| 5639 | $L_{A34}$ | $L_{B60}$ |
| 5640 | $L_{A35}$ | $L_{B60}$ |
| 5641 | $L_{A36}$ | $L_{B60}$ |
| 5642 | $L_{A37}$ | $L_{B60}$ |
| 5643 | $L_{A38}$ | $L_{B60}$ |
| 5644 | $L_{A39}$ | $L_{B60}$ |
| 5645 | $L_{A40}$ | $L_{B60}$ |
| 5646 | $L_{A41}$ | $L_{B60}$ |
| 5647 | $L_{A42}$ | $L_{B60}$ |
| 5648 | $L_{A43}$ | $L_{B60}$ |
| 5649 | $L_{A44}$ | $L_{B60}$ |
| 5650 | $L_{A45}$ | $L_{B60}$ |
| 5651 | $L_{A46}$ | $L_{B60}$ |
| 5652 | $L_{A47}$ | $L_{B60}$ |

| Cpd # | $L_A$ | $L_B$ |
|---|---|---|
| 5653 | $L_{A48}$ | $L_{B60}$ |
| 5654 | $L_{A49}$ | $L_{B60}$ |
| 5655 | $L_{A50}$ | $L_{B60}$ |
| 5656 | $L_{A51}$ | $L_{B60}$ |
| 5657 | $L_{A52}$ | $L_{B60}$ |
| 5658 | $L_{A53}$ | $L_{B60}$ |
| 5659 | $L_{A54}$ | $L_{B60}$ |
| 5660 | $L_{A55}$ | $L_{B60}$ |
| 5661 | $L_{A56}$ | $L_{B60}$ |
| 5662 | $L_{A57}$ | $L_{B60}$ |
| 5663 | $L_{A58}$ | $L_{B60}$ |
| 5664 | $L_{A59}$ | $L_{B60}$ |
| 5665 | $L_{A60}$ | $L_{B60}$ |
| 5666 | $L_{A61}$ | $L_{B60}$ |
| 5667 | $L_{A62}$ | $L_{B60}$ |
| 5668 | $L_{A63}$ | $L_{B60}$ |
| 5669 | $L_{A64}$ | $L_{B60}$ |
| 5670 | $L_{A65}$ | $L_{B60}$ |
| 5671 | $L_{A66}$ | $L_{B60}$ |
| 5672 | $L_{A67}$ | $L_{B60}$ |
| 5673 | $L_{A68}$ | $L_{B60}$ |
| 5674 | $L_{A69}$ | $L_{B60}$ |
| 5675 | $L_{A70}$ | $L_{B60}$ |
| 5676 | $L_{A71}$ | $L_{B60}$ |
| 5677 | $L_{A72}$ | $L_{B60}$ |
| 5678 | $L_{A73}$ | $L_{B60}$ |
| 5679 | $L_{A74}$ | $L_{B60}$ |
| 5680 | $L_{A75}$ | $L_{B60}$ |
| 5681 | $L_{A76}$ | $L_{B60}$ |
| 5682 | $L_{A77}$ | $L_{B60}$ |
| 5683 | $L_{A78}$ | $L_{B60}$ |
| 5684 | $L_{A79}$ | $L_{B60}$ |
| 5685 | $L_{A80}$ | $L_{B60}$ |
| 5686 | $L_{A81}$ | $L_{B60}$ |
| 5687 | $L_{A82}$ | $L_{B60}$ |
| 5688 | $L_{A83}$ | $L_{B60}$ |
| 5689 | $L_{A84}$ | $L_{B60}$ |
| 5690 | $L_{A85}$ | $L_{B60}$ |
| 5691 | $L_{A86}$ | $L_{B60}$ |
| 5692 | $L_{A87}$ | $L_{B60}$ |
| 5693 | $L_{A88}$ | $L_{B60}$ |
| 5694 | $L_{A89}$ | $L_{B60}$ |
| 5695 | $L_{A90}$ | $L_{B60}$ |
| 5696 | $L_{A91}$ | $L_{B60}$ |
| 5697 | $L_{A92}$ | $L_{B60}$ |
| 5698 | $L_{A93}$ | $L_{B60}$ |
| 5699 | $L_{A94}$ | $L_{B60}$ |
| 5700 | $L_{A95}$ | $L_{B60}$ |
| 5701 | $L_{A1}$ | $L_{B61}$ |
| 5702 | $L_{A2}$ | $L_{B61}$ |
| 5703 | $L_{A3}$ | $L_{B61}$ |
| 5704 | $L_{A4}$ | $L_{B61}$ |
| 5705 | $L_{A5}$ | $L_{B61}$ |
| 5706 | $L_{A6}$ | $L_{B61}$ |
| 5707 | $L_{A7}$ | $L_{B61}$ |
| 5708 | $L_{A8}$ | $L_{B61}$ |
| 5709 | $L_{A9}$ | $L_{B61}$ |
| 5710 | $L_{A10}$ | $L_{B61}$ |
| 5711 | $L_{A11}$ | $L_{B61}$ |
| 5712 | $L_{A12}$ | $L_{B61}$ |
| 5713 | $L_{A13}$ | $L_{B61}$ |
| 5714 | $L_{A14}$ | $L_{B61}$ |
| 5715 | $L_{A15}$ | $L_{B61}$ |
| 5716 | $L_{A16}$ | $L_{B61}$ |
| 5717 | $L_{A17}$ | $L_{B61}$ |
| 5718 | $L_{A18}$ | $L_{B61}$ |
| 5719 | $L_{A19}$ | $L_{B61}$ |
| 5720 | $L_{A20}$ | $L_{B61}$ |
| 5721 | $L_{A21}$ | $L_{B61}$ |
| 5722 | $L_{A22}$ | $L_{B61}$ |
| 5723 | $L_{A23}$ | $L_{B61}$ |
| 5724 | $L_{A24}$ | $L_{B61}$ |
| 5725 | $L_{A25}$ | $L_{B61}$ |
| 5726 | $L_{A26}$ | $L_{B61}$ |
| 5727 | $L_{A27}$ | $L_{B61}$ |
| 5728 | $L_{A28}$ | $L_{B61}$ |
| 5729 | $L_{A29}$ | $L_{B61}$ |

| Cpd # | $L_A$ | $L_B$ |
|---|---|---|
| 5730 | $L_{A30}$ | $L_{B61}$ |
| 5731 | $L_{A31}$ | $L_{B61}$ |
| 5732 | $L_{A32}$ | $L_{B61}$ |
| 5733 | $L_{A33}$ | $L_{B61}$ |
| 5734 | $L_{A34}$ | $L_{B61}$ |
| 5735 | $L_{A35}$ | $L_{B61}$ |
| 5736 | $L_{A36}$ | $L_{B61}$ |
| 5737 | $L_{A37}$ | $L_{B61}$ |
| 5738 | $L_{A38}$ | $L_{B61}$ |
| 5739 | $L_{A39}$ | $L_{B61}$ |
| 5740 | $L_{A40}$ | $L_{B61}$ |
| 5741 | $L_{A41}$ | $L_{B61}$ |
| 5742 | $L_{A42}$ | $L_{B61}$ |
| 5743 | $L_{A43}$ | $L_{B61}$ |
| 5744 | $L_{A44}$ | $L_{B61}$ |
| 5745 | $L_{A45}$ | $L_{B61}$ |
| 5746 | $L_{A46}$ | $L_{B61}$ |
| 5747 | $L_{A47}$ | $L_{B61}$ |
| 5748 | $L_{A48}$ | $L_{B61}$ |
| 5749 | $L_{A49}$ | $L_{B61}$ |
| 5750 | $L_{A50}$ | $L_{B61}$ |
| 5751 | $L_{A51}$ | $L_{B61}$ |
| 5752 | $L_{A52}$ | $L_{B61}$ |
| 5753 | $L_{A53}$ | $L_{B61}$ |
| 5754 | $L_{A54}$ | $L_{B61}$ |
| 5755 | $L_{A55}$ | $L_{B61}$ |
| 5756 | $L_{A56}$ | $L_{B61}$ |
| 5757 | $L_{A57}$ | $L_{B61}$ |
| 5758 | $L_{A58}$ | $L_{B61}$ |
| 5759 | $L_{A59}$ | $L_{B61}$ |
| 5760 | $L_{A60}$ | $L_{B61}$ |
| 5761 | $L_{A61}$ | $L_{B61}$ |
| 5762 | $L_{A62}$ | $L_{B61}$ |
| 5763 | $L_{A63}$ | $L_{B61}$ |
| 5764 | $L_{A64}$ | $L_{B61}$ |
| 5765 | $L_{A65}$ | $L_{B61}$ |
| 5766 | $L_{A66}$ | $L_{B61}$ |
| 5767 | $L_{A67}$ | $L_{B61}$ |
| 5768 | $L_{A68}$ | $L_{B61}$ |
| 5769 | $L_{A69}$ | $L_{B61}$ |
| 5770 | $L_{A70}$ | $L_{B61}$ |
| 5771 | $L_{A71}$ | $L_{B61}$ |
| 5772 | $L_{A72}$ | $L_{B61}$ |
| 5773 | $L_{A73}$ | $L_{B61}$ |
| 5774 | $L_{A74}$ | $L_{B61}$ |
| 5775 | $L_{A75}$ | $L_{B61}$ |
| 5776 | $L_{A76}$ | $L_{B61}$ |
| 5777 | $L_{A77}$ | $L_{B61}$ |
| 5778 | $L_{A78}$ | $L_{B61}$ |
| 5779 | $L_{A79}$ | $L_{B61}$ |
| 5780 | $L_{A80}$ | $L_{B61}$ |
| 5781 | $L_{A81}$ | $L_{B61}$ |
| 5782 | $L_{A82}$ | $L_{B61}$ |
| 5783 | $L_{A83}$ | $L_{B61}$ |
| 5784 | $L_{A84}$ | $L_{B61}$ |
| 5785 | $L_{A85}$ | $L_{B61}$ |
| 5786 | $L_{A86}$ | $L_{B61}$ |
| 5787 | $L_{A87}$ | $L_{B61}$ |
| 5788 | $L_{A88}$ | $L_{B61}$ |
| 5789 | $L_{A89}$ | $L_{B61}$ |
| 5790 | $L_{A90}$ | $L_{B61}$ |
| 5791 | $L_{A91}$ | $L_{B61}$ |
| 5792 | $L_{A92}$ | $L_{B61}$ |
| 5793 | $L_{A93}$ | $L_{B61}$ |
| 5794 | $L_{A94}$ | $L_{B61}$ |
| 5795 | $L_{A95}$ | $L_{B61}$ |
| 5796 | $L_{A1}$ | $L_{B62}$ |
| 5797 | $L_{A2}$ | $L_{B62}$ |
| 5798 | $L_{A3}$ | $L_{B62}$ |
| 5799 | $L_{A4}$ | $L_{B62}$ |
| 5800 | $L_{A5}$ | $L_{B62}$ |
| 5801 | $L_{A6}$ | $L_{B62}$ |
| 5802 | $L_{A7}$ | $L_{B62}$ |
| 5803 | $L_{A8}$ | $L_{B62}$ |
| 5804 | $L_{A9}$ | $L_{B62}$ |
| 5805 | $L_{A10}$ | $L_{B62}$ |
| 5806 | $L_{A11}$ | $L_{B62}$ |

-continued

| Cpd # | $L_A$ | $L_B$ |
|---|---|---|
| 5807 | $L_{A12}$ | $L_{B62}$ |
| 5808 | $L_{A13}$ | $L_{B62}$ |
| 5809 | $L_{A14}$ | $L_{B62}$ |
| 5810 | $L_{A15}$ | $L_{B62}$ |
| 5811 | $L_{A16}$ | $L_{B62}$ |
| 5833 | $L_{A38}$ | $L_{B62}$ |
| 5834 | $L_{A39}$ | $L_{B62}$ |
| 5835 | $L_{A40}$ | $L_{B62}$ |
| 5836 | $L_{A41}$ | $L_{B62}$ |
| 5837 | $L_{A42}$ | $L_{B62}$ |
| 5838 | $L_{A43}$ | $L_{B62}$ |
| 5839 | $L_{A44}$ | $L_{B62}$ |
| 5840 | $L_{A45}$ | $L_{B62}$ |
| 5841 | $L_{A46}$ | $L_{B62}$ |
| 5842 | $L_{A47}$ | $L_{B62}$ |
| 5843 | $L_{A48}$ | $L_{B62}$ |
| 5844 | $L_{A49}$ | $L_{B62}$ |
| 5845 | $L_{A50}$ | $L_{B62}$ |
| 5846 | $L_{A51}$ | $L_{B62}$ |
| 5847 | $L_{A52}$ | $L_{B62}$ |
| 5848 | $L_{A53}$ | $L_{B62}$ |
| 5849 | $L_{A54}$ | $L_{B62}$ |
| 5850 | $L_{A55}$ | $L_{B62}$ |
| 5851 | $L_{A56}$ | $L_{B62}$ |
| 5852 | $L_{A57}$ | $L_{B62}$ |
| 5853 | $L_{A58}$ | $L_{B62}$ |
| 5854 | $L_{A59}$ | $L_{B62}$ |
| 5855 | $L_{A60}$ | $L_{B62}$ |
| 5856 | $L_{A61}$ | $L_{B62}$ |
| 5891 | $L_{A1}$ | $L_{B63}$ |
| 5892 | $L_{A2}$ | $L_{B63}$ |
| 5893 | $L_{A3}$ | $L_{B63}$ |
| 5894 | $L_{A4}$ | $L_{B63}$ |
| 5895 | $L_{A5}$ | $L_{B63}$ |
| 5896 | $L_{A6}$ | $L_{B63}$ |
| 5897 | $L_{A7}$ | $L_{B63}$ |
| 5898 | $L_{A8}$ | $L_{B63}$ |
| 5899 | $L_{A9}$ | $L_{B63}$ |
| 5900 | $L_{A10}$ | $L_{B63}$ |
| 5901 | $L_{A11}$ | $L_{B63}$ |
| 5902 | $L_{A12}$ | $L_{B63}$ |
| 5903 | $L_{A13}$ | $L_{B63}$ |
| 5904 | $L_{A14}$ | $L_{B63}$ |
| 5905 | $L_{A15}$ | $L_{B63}$ |
| 5906 | $L_{A16}$ | $L_{B63}$ |
| 5928 | $L_{A38}$ | $L_{B63}$ |
| 5929 | $L_{A39}$ | $L_{B63}$ |
| 5930 | $L_{A40}$ | $L_{B63}$ |
| 5931 | $L_{A41}$ | $L_{B63}$ |
| 5932 | $L_{A42}$ | $L_{B63}$ |
| 5933 | $L_{A43}$ | $L_{B63}$ |
| 5934 | $L_{A44}$ | $L_{B63}$ |
| 5935 | $L_{A45}$ | $L_{B63}$ |
| 5936 | $L_{A46}$ | $L_{B63}$ |
| 5937 | $L_{A47}$ | $L_{B63}$ |
| 5938 | $L_{A48}$ | $L_{B63}$ |
| 5939 | $L_{A49}$ | $L_{B63}$ |
| 5940 | $L_{A50}$ | $L_{B63}$ |
| 5941 | $L_{A51}$ | $L_{B63}$ |
| 5942 | $L_{A52}$ | $L_{B63}$ |
| 5943 | $L_{A53}$ | $L_{B63}$ |
| 5944 | $L_{A54}$ | $L_{B63}$ |
| 5945 | $L_{A55}$ | $L_{B63}$ |
| 5946 | $L_{A56}$ | $L_{B63}$ |
| 5947 | $L_{A57}$ | $L_{B63}$ |
| 5948 | $L_{A58}$ | $L_{B63}$ |
| 5949 | $L_{A59}$ | $L_{B63}$ |
| 5950 | $L_{A60}$ | $L_{B63}$ |
| 5951 | $L_{A61}$ | $L_{B63}$ |
| 5986 | $L_{A1}$ | $L_{B64}$ |
| 5987 | $L_{A2}$ | $L_{B64}$ |
| 5988 | $L_{A3}$ | $L_{B64}$ |
| 5989 | $L_{A4}$ | $L_{B64}$ |
| 5990 | $L_{A5}$ | $L_{B64}$ |
| 5991 | $L_{A6}$ | $L_{B64}$ |
| 5992 | $L_{A7}$ | $L_{B64}$ |
| 5993 | $L_{A8}$ | $L_{B64}$ |
| 5994 | $L_{A9}$ | $L_{B64}$ |
| 5995 | $L_{A10}$ | $L_{B64}$ |
| 5996 | $L_{A11}$ | $L_{B64}$ |
| 5997 | $L_{A12}$ | $L_{B64}$ |
| 5998 | $L_{A13}$ | $L_{B64}$ |
| 5999 | $L_{A14}$ | $L_{B64}$ |
| 6000 | $L_{A15}$ | $L_{B64}$ |
| 6001 | $L_{A16}$ | $L_{B64}$ |
| 6023 | $L_{A38}$ | $L_{B64}$ |
| 6024 | $L_{A39}$ | $L_{B64}$ |
| 6025 | $L_{A40}$ | $L_{B64}$ |
| 6026 | $L_{A41}$ | $L_{B64}$ |
| 6027 | $L_{A42}$ | $L_{B64}$ |
| 6028 | $L_{A43}$ | $L_{B64}$ |
| 6029 | $L_{A44}$ | $L_{B64}$ |
| 6030 | $L_{A45}$ | $L_{B64}$ |
| 6031 | $L_{A46}$ | $L_{B64}$ |
| 6032 | $L_{A47}$ | $L_{B64}$ |
| 6033 | $L_{A48}$ | $L_{B64}$ |
| 6034 | $L_{A49}$ | $L_{B64}$ |
| 6035 | $L_{A50}$ | $L_{B64}$ |
| 6036 | $L_{A51}$ | $L_{B64}$ |
| 6037 | $L_{A52}$ | $L_{B64}$ |
| 6038 | $L_{A53}$ | $L_{B64}$ |
| 6039 | $L_{A54}$ | $L_{B64}$ |
| 6040 | $L_{A55}$ | $L_{B64}$ |
| 6041 | $L_{A56}$ | $L_{B64}$ |
| 6042 | $L_{A57}$ | $L_{B64}$ |
| 6043 | $L_{A58}$ | $L_{B64}$ |
| 6044 | $L_{A59}$ | $L_{B64}$ |
| 6045 | $L_{A60}$ | $L_{B64}$ |
| 6046 | $L_{A61}$ | $L_{B64}$ |
| 6081 | $L_{A1}$ | $L_{B65}$ |
| 6082 | $L_{A2}$ | $L_{B65}$ |
| 6083 | $L_{A3}$ | $L_{B65}$ |
| 6084 | $L_{A4}$ | $L_{B65}$ |
| 6085 | $L_{A5}$ | $L_{B65}$ |
| 6086 | $L_{A6}$ | $L_{B65}$ |
| 6087 | $L_{A7}$ | $L_{B65}$ |
| 6088 | $L_{A8}$ | $L_{B65}$ |
| 6089 | $L_{A9}$ | $L_{B65}$ |
| 6090 | $L_{A10}$ | $L_{B65}$ |
| 6091 | $L_{A11}$ | $L_{B65}$ |
| 6092 | $L_{A12}$ | $L_{B65}$ |
| 6093 | $L_{A13}$ | $L_{B65}$ |
| 6094 | $L_{A14}$ | $L_{B65}$ |
| 6095 | $L_{A15}$ | $L_{B65}$ |
| 6096 | $L_{A16}$ | $L_{B65}$ |
| 6118 | $L_{A38}$ | $L_{B65}$ |
| 6119 | $L_{A39}$ | $L_{B65}$ |
| 6120 | $L_{A40}$ | $L_{B65}$ |
| 6121 | $L_{A41}$ | $L_{B65}$ |
| 6122 | $L_{A42}$ | $L_{B65}$ |
| 6123 | $L_{A43}$ | $L_{B65}$ |
| 6124 | $L_{A44}$ | $L_{B65}$ |
| 6125 | $L_{A45}$ | $L_{B65}$ |
| 6126 | $L_{A46}$ | $L_{B65}$ |
| 6127 | $L_{A47}$ | $L_{B65}$ |
| 6128 | $L_{A48}$ | $L_{B65}$ |
| 6129 | $L_{A49}$ | $L_{B65}$ |
| 6130 | $L_{A50}$ | $L_{B65}$ |
| 6131 | $L_{A51}$ | $L_{B65}$ |
| 6132 | $L_{A52}$ | $L_{B65}$ |
| 6133 | $L_{A53}$ | $L_{B65}$ |
| 6134 | $L_{A54}$ | $L_{B65}$ |
| 6135 | $L_{A55}$ | $L_{B65}$ |
| 6136 | $L_{A56}$ | $L_{B65}$ |
| 6137 | $L_{A57}$ | $L_{B65}$ |
| 6138 | $L_{A58}$ | $L_{B65}$ |
| 6139 | $L_{A59}$ | $L_{B65}$ |
| 6140 | $L_{A60}$ | $L_{B65}$ |
| 6141 | $L_{A61}$ | $L_{B65}$ |
| 6176 | $L_{A1}$ | $L_{B66}$ |
| 6177 | $L_{A2}$ | $L_{B66}$ |
| 6178 | $L_{A3}$ | $L_{B66}$ |
| 6179 | $L_{A4}$ | $L_{B66}$ |
| 6180 | $L_{A5}$ | $L_{B66}$ |

-continued

| Cpd # | $L_A$ | $L_B$ |
|---|---|---|
| 6181 | $L_{A6}$ | $L_{B66}$ |
| 6182 | $L_{A7}$ | $L_{B66}$ |
| 6183 | $L_{A8}$ | $L_{B66}$ |
| 6184 | $L_{A9}$ | $L_{B66}$ |
| 6185 | $L_{A10}$ | $L_{B66}$ |
| 6186 | $L_{A11}$ | $L_{B66}$ |
| 6187 | $L_{A12}$ | $L_{B66}$ |
| 6188 | $L_{A13}$ | $L_{B66}$ |
| 6189 | $L_{A14}$ | $L_{B66}$ |
| 6190 | $L_{A15}$ | $L_{B66}$ |
| 6191 | $L_{A16}$ | $L_{B66}$ |
| 6213 | $L_{A38}$ | $L_{B66}$ |
| 6214 | $L_{A39}$ | $L_{B66}$ |
| 6215 | $L_{A40}$ | $L_{B66}$ |
| 6216 | $L_{A41}$ | $L_{B66}$ |
| 6217 | $L_{A42}$ | $L_{B66}$ |
| 6218 | $L_{A43}$ | $L_{B66}$ |
| 6219 | $L_{A44}$ | $L_{B66}$ |
| 6220 | $L_{A45}$ | $L_{B66}$ |
| 6221 | $L_{A46}$ | $L_{B66}$ |
| 6222 | $L_{A47}$ | $L_{B66}$ |
| 6223 | $L_{A48}$ | $L_{B66}$ |
| 6224 | $L_{A49}$ | $L_{B66}$ |
| 6225 | $L_{A50}$ | $L_{B66}$ |
| 6226 | $L_{A51}$ | $L_{B66}$ |
| 6227 | $L_{A52}$ | $L_{B66}$ |
| 6228 | $L_{A53}$ | $L_{B66}$ |
| 6229 | $L_{A54}$ | $L_{B66}$ |
| 6230 | $L_{A55}$ | $L_{B66}$ |
| 6231 | $L_{A56}$ | $L_{B66}$ |
| 6232 | $L_{A57}$ | $L_{B66}$ |
| 6233 | $L_{A58}$ | $L_{B66}$ |
| 6234 | $L_{A59}$ | $L_{B66}$ |
| 6235 | $L_{A60}$ | $L_{B66}$ |
| 6236 | $L_{A61}$ | $L_{B66}$ |
| 6271 | $L_{A1}$ | $L_{B67}$ |
| 6272 | $L_{A2}$ | $L_{B67}$ |
| 6273 | $L_{A3}$ | $L_{B67}$ |
| 6274 | $L_{A4}$ | $L_{B67}$ |
| 6275 | $L_{A5}$ | $L_{B67}$ |
| 6276 | $L_{A6}$ | $L_{B67}$ |
| 6277 | $L_{A7}$ | $L_{B67}$ |
| 6278 | $L_{A8}$ | $L_{B67}$ |
| 6279 | $L_{A9}$ | $L_{B67}$ |
| 6280 | $L_{A10}$ | $L_{B67}$ |
| 6281 | $L_{A11}$ | $L_{B67}$ |
| 6282 | $L_{A12}$ | $L_{B67}$ |
| 6283 | $L_{A13}$ | $L_{B67}$ |
| 6284 | $L_{A14}$ | $L_{B67}$ |
| 6285 | $L_{A15}$ | $L_{B67}$ |
| 6286 | $L_{A16}$ | $L_{B67}$ |
| 6308 | $L_{A38}$ | $L_{B67}$ |
| 6309 | $L_{A39}$ | $L_{B67}$ |
| 6310 | $L_{A40}$ | $L_{B67}$ |
| 6311 | $L_{A41}$ | $L_{B67}$ |
| 6312 | $L_{A42}$ | $L_{B67}$ |
| 6313 | $L_{A43}$ | $L_{B67}$ |
| 6314 | $L_{A44}$ | $L_{B67}$ |
| 6315 | $L_{A45}$ | $L_{B67}$ |
| 6316 | $L_{A46}$ | $L_{B67}$ |
| 6317 | $L_{A47}$ | $L_{B67}$ |
| 6318 | $L_{A48}$ | $L_{B67}$ |
| 6319 | $L_{A49}$ | $L_{B67}$ |
| 6320 | $L_{A50}$ | $L_{B67}$ |
| 6321 | $L_{A51}$ | $L_{B67}$ |
| 6322 | $L_{A52}$ | $L_{B67}$ |
| 6323 | $L_{A53}$ | $L_{B67}$ |
| 6324 | $L_{A54}$ | $L_{B67}$ |
| 6325 | $L_{A55}$ | $L_{B67}$ |
| 6326 | $L_{A56}$ | $L_{B67}$ |
| 6327 | $L_{A57}$ | $L_{B67}$ |
| 6328 | $L_{A58}$ | $L_{B67}$ |
| 6329 | $L_{A59}$ | $L_{B67}$ |
| 6330 | $L_{A60}$ | $L_{B67}$ |
| 6331 | $L_{A61}$ | $L_{B67}$ |
| 6366 | $L_{A1}$ | $L_{B68}$ |
| 6367 | $L_{A2}$ | $L_{B68}$ |

-continued

| Cpd # | $L_A$ | $L_B$ |
|---|---|---|
| 6368 | $L_{A3}$ | $L_{B68}$ |
| 6369 | $L_{A4}$ | $L_{B68}$ |
| 6370 | $L_{A5}$ | $L_{B68}$ |
| 6371 | $L_{A6}$ | $L_{B68}$ |
| 6372 | $L_{A7}$ | $L_{B68}$ |
| 6373 | $L_{A8}$ | $L_{B68}$ |
| 6374 | $L_{A9}$ | $L_{B68}$ |
| 6375 | $L_{A10}$ | $L_{B68}$ |
| 6376 | $L_{A11}$ | $L_{B68}$ |
| 6377 | $L_{A12}$ | $L_{B68}$ |
| 6378 | $L_{A13}$ | $L_{B68}$ |
| 6379 | $L_{A14}$ | $L_{B68}$ |
| 6380 | $L_{A15}$ | $L_{B68}$ |
| 6381 | $L_{A16}$ | $L_{B68}$ |
| 6403 | $L_{A38}$ | $L_{B68}$ |
| 6404 | $L_{A39}$ | $L_{B68}$ |
| 6405 | $L_{A40}$ | $L_{B68}$ |
| 6406 | $L_{A41}$ | $L_{B68}$ |
| 6407 | $L_{A42}$ | $L_{B68}$ |
| 6408 | $L_{A43}$ | $L_{B68}$ |
| 6409 | $L_{A44}$ | $L_{B68}$ |
| 6410 | $L_{A45}$ | $L_{B68}$ |
| 6411 | $L_{A46}$ | $L_{B68}$ |
| 6412 | $L_{A47}$ | $L_{B68}$ |
| 6413 | $L_{A48}$ | $L_{B68}$ |
| 6414 | $L_{A49}$ | $L_{B68}$ |
| 6415 | $L_{A50}$ | $L_{B68}$ |
| 6416 | $L_{A51}$ | $L_{B68}$ |
| 6417 | $L_{A52}$ | $L_{B68}$ |
| 6418 | $L_{A53}$ | $L_{B68}$ |
| 6419 | $L_{A54}$ | $L_{B68}$ |
| 6420 | $L_{A55}$ | $L_{B68}$ |
| 6421 | $L_{A56}$ | $L_{B68}$ |
| 6422 | $L_{A57}$ | $L_{B68}$ |
| 6423 | $L_{A58}$ | $L_{B68}$ |
| 6424 | $L_{A59}$ | $L_{B68}$ |
| 6425 | $L_{A60}$ | $L_{B68}$ |
| 6426 | $L_{A61}$ | $L_{B68}$ |
| 6461 | $L_{A1}$ | $L_{B69}$ |
| 6462 | $L_{A2}$ | $L_{B69}$ |
| 6463 | $L_{A3}$ | $L_{B69}$ |
| 6464 | $L_{A4}$ | $L_{B69}$ |
| 6465 | $L_{A5}$ | $L_{B69}$ |
| 6466 | $L_{A6}$ | $L_{B69}$ |
| 6467 | $L_{A7}$ | $L_{B69}$ |
| 6468 | $L_{A8}$ | $L_{B69}$ |
| 6469 | $L_{A9}$ | $L_{B69}$ |
| 6470 | $L_{A10}$ | $L_{B69}$ |
| 6471 | $L_{A11}$ | $L_{B69}$ |
| 6472 | $L_{A12}$ | $L_{B69}$ |
| 6473 | $L_{A13}$ | $L_{B69}$ |
| 6474 | $L_{A14}$ | $L_{B69}$ |
| 6475 | $L_{A15}$ | $L_{B69}$ |
| 6476 | $L_{A16}$ | $L_{B69}$ |
| 6498 | $L_{A38}$ | $L_{B69}$ |
| 6499 | $L_{A39}$ | $L_{B69}$ |
| 6500 | $L_{A40}$ | $L_{B69}$ |
| 6501 | $L_{A41}$ | $L_{B69}$ |
| 6502 | $L_{A42}$ | $L_{B69}$ |
| 6503 | $L_{A43}$ | $L_{B69}$ |
| 6504 | $L_{A44}$ | $L_{B69}$ |
| 6505 | $L_{A45}$ | $L_{B69}$ |
| 6506 | $L_{A46}$ | $L_{B69}$ |
| 6507 | $L_{A47}$ | $L_{B69}$ |
| 6508 | $L_{A48}$ | $L_{B69}$ |
| 6509 | $L_{A49}$ | $L_{B69}$ |
| 6510 | $L_{A50}$ | $L_{B69}$ |
| 6511 | $L_{A51}$ | $L_{B69}$ |
| 6512 | $L_{A52}$ | $L_{B69}$ |
| 6513 | $L_{A53}$ | $L_{B69}$ |
| 6514 | $L_{A54}$ | $L_{B69}$ |
| 6515 | $L_{A55}$ | $L_{B69}$ |
| 6516 | $L_{A56}$ | $L_{B69}$ |
| 6517 | $L_{A57}$ | $L_{B69}$ |
| 6518 | $L_{A58}$ | $L_{B69}$ |
| 6519 | $L_{A59}$ | $L_{B69}$ |
| 6520 | $L_{A60}$ | $L_{B69}$ |

-continued

| Cpd # | $L_A$ | $L_B$ |
|---|---|---|
| 6521 | $L_{A61}$ | $L_{B69}$ |
| 6556 | $L_{A1}$ | $L_{B70}$ |
| 6557 | $L_{A2}$ | $L_{B70}$ |
| 6558 | $L_{A3}$ | $L_{B70}$ |
| 6559 | $L_{A4}$ | $L_{B70}$ |
| 6560 | $L_{A5}$ | $L_{B70}$ |
| 6561 | $L_{A6}$ | $L_{B70}$ |
| 6562 | $L_{A7}$ | $L_{B70}$ |
| 6563 | $L_{A8}$ | $L_{B70}$ |
| 6564 | $L_{A9}$ | $L_{B70}$ |
| 6565 | $L_{A10}$ | $L_{B70}$ |
| 6566 | $L_{A11}$ | $L_{B70}$ |
| 6567 | $L_{A12}$ | $L_{B70}$ |
| 6568 | $L_{A13}$ | $L_{B70}$ |
| 6569 | $L_{A14}$ | $L_{B70}$ |
| 6570 | $L_{A15}$ | $L_{B70}$ |
| 6571 | $L_{A16}$ | $L_{B70}$ |
| 6593 | $L_{A38}$ | $L_{B70}$ |
| 6594 | $L_{A39}$ | $L_{B70}$ |
| 6595 | $L_{A40}$ | $L_{B70}$ |
| 6596 | $L_{A41}$ | $L_{B70}$ |
| 6597 | $L_{A42}$ | $L_{B70}$ |
| 6598 | $L_{A43}$ | $L_{B70}$ |
| 6599 | $L_{A44}$ | $L_{B70}$ |
| 6600 | $L_{A45}$ | $L_{B70}$ |
| 6601 | $L_{A46}$ | $L_{B70}$ |
| 6602 | $L_{A47}$ | $L_{B70}$ |
| 6603 | $L_{A48}$ | $L_{B70}$ |
| 6604 | $L_{A49}$ | $L_{B70}$ |
| 6605 | $L_{A50}$ | $L_{B70}$ |
| 6606 | $L_{A51}$ | $L_{B70}$ |
| 6607 | $L_{A52}$ | $L_{B70}$ |
| 6608 | $L_{A53}$ | $L_{B70}$ |
| 6609 | $L_{A54}$ | $L_{B70}$ |
| 6610 | $L_{A55}$ | $L_{B70}$ |
| 6611 | $L_{A56}$ | $L_{B70}$ |
| 6612 | $L_{A57}$ | $L_{B70}$ |
| 6613 | $L_{A58}$ | $L_{B70}$ |
| 6614 | $L_{A59}$ | $L_{B70}$ |
| 6615 | $L_{A60}$ | $L_{B70}$ |
| 6616 | $L_{A61}$ | $L_{B70}$ |
| 6651 | $L_{A1}$ | $L_{B71}$ |
| 6652 | $L_{A2}$ | $L_{B71}$ |
| 6653 | $L_{A3}$ | $L_{B71}$ |
| 6654 | $L_{A4}$ | $L_{B71}$ |
| 6655 | $L_{A5}$ | $L_{B71}$ |
| 6656 | $L_{A6}$ | $L_{B71}$ |
| 6657 | $L_{A7}$ | $L_{B71}$ |
| 6658 | $L_{A8}$ | $L_{B71}$ |
| 6659 | $L_{A9}$ | $L_{B71}$ |
| 6660 | $L_{A10}$ | $L_{B71}$ |
| 6661 | $L_{A11}$ | $L_{B71}$ |
| 6662 | $L_{A12}$ | $L_{B71}$ |
| 6663 | $L_{A13}$ | $L_{B71}$ |
| 6664 | $L_{A14}$ | $L_{B71}$ |
| 6665 | $L_{A15}$ | $L_{B71}$ |
| 6666 | $L_{A16}$ | $L_{B71}$ |
| 6688 | $L_{A38}$ | $L_{B71}$ |
| 6689 | $L_{A39}$ | $L_{B71}$ |
| 6690 | $L_{A40}$ | $L_{B71}$ |
| 6691 | $L_{A41}$ | $L_{B71}$ |
| 6692 | $L_{A42}$ | $L_{B71}$ |
| 6693 | $L_{A43}$ | $L_{B71}$ |
| 6694 | $L_{A44}$ | $L_{B71}$ |
| 6695 | $L_{A45}$ | $L_{B71}$ |
| 6696 | $L_{A46}$ | $L_{B71}$ |
| 6697 | $L_{A47}$ | $L_{B71}$ |
| 6698 | $L_{A48}$ | $L_{B71}$ |
| 6699 | $L_{A49}$ | $L_{B71}$ |
| 6700 | $L_{A50}$ | $L_{B71}$ |
| 6701 | $L_{A51}$ | $L_{B71}$ |
| 6702 | $L_{A52}$ | $L_{B71}$ |
| 6703 | $L_{A53}$ | $L_{B71}$ |
| 6704 | $L_{A54}$ | $L_{B71}$ |
| 6705 | $L_{A55}$ | $L_{B71}$ |
| 6706 | $L_{A56}$ | $L_{B71}$ |
| 6707 | $L_{A57}$ | $L_{B71}$ |

-continued

| Cpd # | $L_A$ | $L_B$ |
|---|---|---|
| 6708 | $L_{A58}$ | $L_{B71}$ |
| 6709 | $L_{A59}$ | $L_{B71}$ |
| 6710 | $L_{A60}$ | $L_{B71}$ |
| 6711 | $L_{A61}$ | $L_{B71}$ |
| 6746 | $L_{A1}$ | $L_{B72}$ |
| 6747 | $L_{A2}$ | $L_{B72}$ |
| 6748 | $L_{A3}$ | $L_{B72}$ |
| 6749 | $L_{A4}$ | $L_{B72}$ |
| 6750 | $L_{A5}$ | $L_{B72}$ |
| 6751 | $L_{A6}$ | $L_{B72}$ |
| 6752 | $L_{A7}$ | $L_{B72}$ |
| 6753 | $L_{A8}$ | $L_{B72}$ |
| 6754 | $L_{A9}$ | $L_{B72}$ |
| 6755 | $L_{A10}$ | $L_{B72}$ |
| 6756 | $L_{A11}$ | $L_{B72}$ |
| 6757 | $L_{A12}$ | $L_{B72}$ |
| 6758 | $L_{A13}$ | $L_{B72}$ |
| 6759 | $L_{A14}$ | $L_{B72}$ |
| 6760 | $L_{A15}$ | $L_{B72}$ |
| 6761 | $L_{A16}$ | $L_{B72}$ |
| 6783 | $L_{A38}$ | $L_{B72}$ |
| 6784 | $L_{A39}$ | $L_{B72}$ |
| 6785 | $L_{A40}$ | $L_{B72}$ |
| 6786 | $L_{A41}$ | $L_{B72}$ |
| 6787 | $L_{A42}$ | $L_{B72}$ |
| 6788 | $L_{A43}$ | $L_{B72}$ |
| 6789 | $L_{A44}$ | $L_{B72}$ |
| 6790 | $L_{A45}$ | $L_{B72}$ |
| 6791 | $L_{A46}$ | $L_{B72}$ |
| 6792 | $L_{A47}$ | $L_{B72}$ |
| 6793 | $L_{A48}$ | $L_{B72}$ |
| 6794 | $L_{A49}$ | $L_{B72}$ |
| 6795 | $L_{A50}$ | $L_{B72}$ |
| 6796 | $L_{A51}$ | $L_{B72}$ |
| 6797 | $L_{A52}$ | $L_{B72}$ |
| 6798 | $L_{A53}$ | $L_{B72}$ |
| 6799 | $L_{A54}$ | $L_{B72}$ |
| 6800 | $L_{A55}$ | $L_{B72}$ |
| 6801 | $L_{A56}$ | $L_{B72}$ |
| 6802 | $L_{A57}$ | $L_{B72}$ |
| 6803 | $L_{A58}$ | $L_{B72}$ |
| 6804 | $L_{A59}$ | $L_{B72}$ |
| 6805 | $L_{A60}$ | $L_{B72}$ |
| 6806 | $L_{A61}$ | $L_{B72}$ |
| 6841 | $L_{A1}$ | $L_{B73}$ |
| 6842 | $L_{A2}$ | $L_{B73}$ |
| 6843 | $L_{A3}$ | $L_{B73}$ |
| 6844 | $L_{A4}$ | $L_{B73}$ |
| 6845 | $L_{A5}$ | $L_{B73}$ |
| 6846 | $L_{A6}$ | $L_{B73}$ |
| 6847 | $L_{A7}$ | $L_{B73}$ |
| 6848 | $L_{A8}$ | $L_{B73}$ |
| 6849 | $L_{A9}$ | $L_{B73}$ |
| 6850 | $L_{A10}$ | $L_{B73}$ |
| 6851 | $L_{A11}$ | $L_{B73}$ |
| 6852 | $L_{A12}$ | $L_{B73}$ |
| 6853 | $L_{A13}$ | $L_{B73}$ |
| 6854 | $L_{A14}$ | $L_{B73}$ |
| 6855 | $L_{A15}$ | $L_{B73}$ |
| 6856 | $L_{A16}$ | $L_{B73}$ |
| 6878 | $L_{A38}$ | $L_{B73}$ |
| 6879 | $L_{A39}$ | $L_{B73}$ |
| 6880 | $L_{A40}$ | $L_{B73}$ |
| 6881 | $L_{A41}$ | $L_{B73}$ |
| 6882 | $L_{A42}$ | $L_{B73}$ |
| 6883 | $L_{A43}$ | $L_{B73}$ |
| 6884 | $L_{A44}$ | $L_{B73}$ |
| 6885 | $L_{A45}$ | $L_{B73}$ |
| 6886 | $L_{A46}$ | $L_{B73}$ |
| 6887 | $L_{A47}$ | $L_{B73}$ |
| 6888 | $L_{A48}$ | $L_{B73}$ |
| 6889 | $L_{A49}$ | $L_{B73}$ |
| 6890 | $L_{A50}$ | $L_{B73}$ |
| 6891 | $L_{A51}$ | $L_{B73}$ |
| 6892 | $L_{A52}$ | $L_{B73}$ |
| 6893 | $L_{A53}$ | $L_{B73}$ |
| 6894 | $L_{A54}$ | $L_{B73}$ |

-continued

| Cpd # | $L_A$ | $L_B$ |
|---|---|---|
| 6895 | $L_{A55}$ | $L_{B73}$ |
| 6896 | $L_{A56}$ | $L_{B73}$ |
| 6897 | $L_{A57}$ | $L_{B73}$ |
| 6898 | $L_{A58}$ | $L_{B73}$ |
| 6899 | $L_{A59}$ | $L_{B73}$ |
| 6900 | $L_{A60}$ | $L_{B73}$ |
| 6901 | $L_{A61}$ | $L_{B73}$ |
| 6936 | $L_{A1}$ | $L_{B74}$ |
| 6937 | $L_{A2}$ | $L_{B74}$ |
| 6938 | $L_{A3}$ | $L_{B74}$ |
| 6939 | $L_{A4}$ | $L_{B74}$ |
| 6940 | $L_{A5}$ | $L_{B74}$ |
| 6941 | $L_{A6}$ | $L_{B74}$ |
| 6942 | $L_{A7}$ | $L_{B74}$ |
| 6943 | $L_{A8}$ | $L_{B74}$ |
| 6944 | $L_{A9}$ | $L_{B74}$ |
| 6945 | $L_{A10}$ | $L_{B74}$ |
| 6946 | $L_{A11}$ | $L_{B74}$ |
| 6947 | $L_{A12}$ | $L_{B74}$ |
| 6948 | $L_{A13}$ | $L_{B74}$ |
| 6949 | $L_{A14}$ | $L_{B74}$ |
| 6950 | $L_{A15}$ | $L_{B74}$ |
| 6951 | $L_{A16}$ | $L_{B74}$ |
| 6973 | $L_{A38}$ | $L_{B74}$ |
| 6974 | $L_{A39}$ | $L_{B74}$ |
| 6975 | $L_{A40}$ | $L_{B74}$ |
| 6976 | $L_{A41}$ | $L_{B74}$ |
| 6977 | $L_{A42}$ | $L_{B74}$ |
| 6978 | $L_{A43}$ | $L_{B74}$ |
| 6979 | $L_{A44}$ | $L_{B74}$ |
| 6980 | $L_{A45}$ | $L_{B74}$ |
| 6981 | $L_{A46}$ | $L_{B74}$ |
| 6982 | $L_{A47}$ | $L_{B74}$ |
| 6983 | $L_{A48}$ | $L_{B74}$ |
| 6984 | $L_{A49}$ | $L_{B74}$ |
| 6985 | $L_{A50}$ | $L_{B74}$ |
| 6986 | $L_{A51}$ | $L_{B74}$ |
| 6987 | $L_{A52}$ | $L_{B74}$ |
| 6988 | $L_{A53}$ | $L_{B74}$ |
| 6989 | $L_{A54}$ | $L_{B74}$ |
| 6990 | $L_{A55}$ | $L_{B74}$ |
| 6991 | $L_{A56}$ | $L_{B74}$ |
| 6992 | $L_{A57}$ | $L_{B74}$ |
| 6993 | $L_{A58}$ | $L_{B74}$ |
| 6994 | $L_{A59}$ | $L_{B74}$ |
| 6995 | $L_{A60}$ | $L_{B74}$ |
| 6996 | $L_{A61}$ | $L_{B74}$ |
| 7031 | $L_{A1}$ | $L_{B75}$ |
| 7032 | $L_{A2}$ | $L_{B75}$ |
| 7033 | $L_{A3}$ | $L_{B75}$ |
| 7034 | $L_{A4}$ | $L_{B75}$ |
| 7035 | $L_{A5}$ | $L_{B75}$ |
| 7036 | $L_{A6}$ | $L_{B75}$ |
| 7037 | $L_{A7}$ | $L_{B75}$ |
| 7038 | $L_{A8}$ | $L_{B75}$ |
| 7039 | $L_{A9}$ | $L_{B75}$ |
| 7040 | $L_{A10}$ | $L_{B75}$ |
| 7041 | $L_{A11}$ | $L_{B75}$ |
| 7042 | $L_{A12}$ | $L_{B75}$ |
| 7043 | $L_{A13}$ | $L_{B75}$ |
| 7044 | $L_{A14}$ | $L_{B75}$ |
| 7045 | $L_{A15}$ | $L_{B75}$ |
| 7046 | $L_{A16}$ | $L_{B75}$ |
| 7068 | $L_{A38}$ | $L_{B75}$ |
| 7069 | $L_{A39}$ | $L_{B75}$ |
| 7070 | $L_{A40}$ | $L_{B75}$ |
| 7071 | $L_{A41}$ | $L_{B75}$ |
| 7072 | $L_{A42}$ | $L_{B75}$ |
| 7073 | $L_{A43}$ | $L_{B75}$ |
| 7074 | $L_{A44}$ | $L_{B75}$ |
| 7075 | $L_{A45}$ | $L_{B75}$ |
| 7076 | $L_{A46}$ | $L_{B75}$ |
| 7077 | $L_{A47}$ | $L_{B75}$ |
| 7078 | $L_{A48}$ | $L_{B75}$ |
| 7079 | $L_{A49}$ | $L_{B75}$ |
| 7080 | $L_{A50}$ | $L_{B75}$ |
| 7081 | $L_{A51}$ | $L_{B75}$ |

-continued

| Cpd # | $L_A$ | $L_B$ |
|---|---|---|
| 7082 | $L_{A52}$ | $L_{B75}$ |
| 7083 | $L_{A53}$ | $L_{B75}$ |
| 7084 | $L_{A54}$ | $L_{B75}$ |
| 7085 | $L_{A55}$ | $L_{B75}$ |
| 7086 | $L_{A56}$ | $L_{B75}$ |
| 7087 | $L_{A57}$ | $L_{B75}$ |
| 7088 | $L_{A58}$ | $L_{B75}$ |
| 7089 | $L_{A59}$ | $L_{B75}$ |
| 7090 | $L_{A60}$ | $L_{B75}$ |
| 7091 | $L_{A61}$ | $L_{B75}$ |
| 7126 | $L_{A1}$ | $L_{B76}$ |
| 7127 | $L_{A2}$ | $L_{B76}$ |
| 7128 | $L_{A3}$ | $L_{B76}$ |
| 7129 | $L_{A4}$ | $L_{B76}$ |
| 7130 | $L_{A5}$ | $L_{B76}$ |
| 7131 | $L_{A6}$ | $L_{B76}$ |
| 7132 | $L_{A7}$ | $L_{B76}$ |
| 7133 | $L_{A8}$ | $L_{B76}$ |
| 7134 | $L_{A9}$ | $L_{B76}$ |
| 7135 | $L_{A10}$ | $L_{B76}$ |
| 7136 | $L_{A11}$ | $L_{B76}$ |
| 7137 | $L_{A12}$ | $L_{B76}$ |
| 7138 | $L_{A13}$ | $L_{B76}$ |
| 7139 | $L_{A14}$ | $L_{B76}$ |
| 7140 | $L_{A15}$ | $L_{B76}$ |
| 7141 | $L_{A16}$ | $L_{B76}$ |
| 7163 | $L_{A38}$ | $L_{B76}$ |
| 7164 | $L_{A39}$ | $L_{B76}$ |
| 7165 | $L_{A40}$ | $L_{B76}$ |
| 7166 | $L_{A41}$ | $L_{B76}$ |
| 7167 | $L_{A42}$ | $L_{B76}$ |
| 7168 | $L_{A43}$ | $L_{B76}$ |
| 7169 | $L_{A44}$ | $L_{B76}$ |
| 7170 | $L_{A45}$ | $L_{B76}$ |
| 7171 | $L_{A46}$ | $L_{B76}$ |
| 7172 | $L_{A47}$ | $L_{B76}$ |
| 7173 | $L_{A48}$ | $L_{B76}$ |
| 7174 | $L_{A49}$ | $L_{B76}$ |
| 7175 | $L_{A50}$ | $L_{B76}$ |
| 7176 | $L_{A51}$ | $L_{B76}$ |
| 7177 | $L_{A52}$ | $L_{B76}$ |
| 7178 | $L_{A53}$ | $L_{B76}$ |
| 7179 | $L_{A54}$ | $L_{B76}$ |
| 7180 | $L_{A55}$ | $L_{B76}$ |
| 7181 | $L_{A56}$ | $L_{B76}$ |
| 7182 | $L_{A57}$ | $L_{B76}$ |
| 7183 | $L_{A58}$ | $L_{B76}$ |
| 7184 | $L_{A59}$ | $L_{B76}$ |
| 7185 | $L_{A60}$ | $L_{B76}$ |
| 7186 | $L_{A61}$ | $L_{B76}$ |
| 7221 | $L_{A1}$ | $L_{B77}$ |
| 7222 | $L_{A2}$ | $L_{B77}$ |
| 7223 | $L_{A3}$ | $L_{B77}$ |
| 7224 | $L_{A4}$ | $L_{B77}$ |
| 7225 | $L_{A5}$ | $L_{B77}$ |
| 7226 | $L_{A6}$ | $L_{B77}$ |
| 7227 | $L_{A7}$ | $L_{B77}$ |
| 7228 | $L_{A8}$ | $L_{B77}$ |
| 7229 | $L_{A9}$ | $L_{B77}$ |
| 7230 | $L_{A10}$ | $L_{B77}$ |
| 7231 | $L_{A11}$ | $L_{B77}$ |
| 7232 | $L_{A12}$ | $L_{B77}$ |
| 7233 | $L_{A13}$ | $L_{B77}$ |
| 7234 | $L_{A14}$ | $L_{B77}$ |
| 7235 | $L_{A15}$ | $L_{B77}$ |
| 7236 | $L_{A16}$ | $L_{B77}$ |
| 7258 | $L_{A38}$ | $L_{B77}$ |
| 7259 | $L_{A39}$ | $L_{B77}$ |
| 7260 | $L_{A40}$ | $L_{B77}$ |
| 7261 | $L_{A41}$ | $L_{B77}$ |
| 7262 | $L_{A42}$ | $L_{B77}$ |
| 7263 | $L_{A43}$ | $L_{B77}$ |
| 7264 | $L_{A44}$ | $L_{B77}$ |
| 7265 | $L_{A45}$ | $L_{B77}$ |
| 7266 | $L_{A46}$ | $L_{B77}$ |
| 7267 | $L_{A47}$ | $L_{B77}$ |
| 7268 | $L_{A48}$ | $L_{B77}$ |

-continued

| Cpd # | $L_A$ | $L_B$ |
|---|---|---|
| 7269 | $L_{A49}$ | $L_{B77}$ |
| 7270 | $L_{A50}$ | $L_{B77}$ |
| 7271 | $L_{A51}$ | $L_{B77}$ |
| 7272 | $L_{A52}$ | $L_{B77}$ |
| 7273 | $L_{A53}$ | $L_{B77}$ |
| 7274 | $L_{A54}$ | $L_{B77}$ |
| 7275 | $L_{A55}$ | $L_{B77}$ |
| 7276 | $L_{A56}$ | $L_{B77}$ |
| 7277 | $L_{A57}$ | $L_{B77}$ |
| 7278 | $L_{A58}$ | $L_{B77}$ |
| 7279 | $L_{A59}$ | $L_{B77}$ |
| 7280 | $L_{A60}$ | $L_{B77}$ |
| 7281 | $L_{A61}$ | $L_{B77}$ |
| 7316 | $L_{A1}$ | $L_{B78}$ |
| 7317 | $L_{A2}$ | $L_{B78}$ |
| 7318 | $L_{A3}$ | $L_{B78}$ |
| 7319 | $L_{A4}$ | $L_{B78}$ |
| 7320 | $L_{A5}$ | $L_{B78}$ |
| 7321 | $L_{A6}$ | $L_{B78}$ |
| 7322 | $L_{A7}$ | $L_{B78}$ |
| 7323 | $L_{A8}$ | $L_{B78}$ |
| 7324 | $L_{A9}$ | $L_{B78}$ |
| 7325 | $L_{A10}$ | $L_{B78}$ |
| 7326 | $L_{A11}$ | $L_{B78}$ |
| 7327 | $L_{A12}$ | $L_{B78}$ |
| 7328 | $L_{A13}$ | $L_{B78}$ |
| 7329 | $L_{A14}$ | $L_{B78}$ |
| 7330 | $L_{A15}$ | $L_{B78}$ |
| 7331 | $L_{A16}$ | $L_{B78}$ |
| 7353 | $L_{A38}$ | $L_{B78}$ |
| 7354 | $L_{A39}$ | $L_{B78}$ |
| 7355 | $L_{A40}$ | $L_{B78}$ |
| 7356 | $L_{A41}$ | $L_{B78}$ |
| 7357 | $L_{A42}$ | $L_{B78}$ |
| 7358 | $L_{A43}$ | $L_{B78}$ |
| 7359 | $L_{A44}$ | $L_{B78}$ |
| 7360 | $L_{A45}$ | $L_{B78}$ |
| 7361 | $L_{A46}$ | $L_{B78}$ |
| 7362 | $L_{A47}$ | $L_{B78}$ |
| 7363 | $L_{A48}$ | $L_{B78}$ |
| 7364 | $L_{A49}$ | $L_{B78}$ |
| 7365 | $L_{A50}$ | $L_{B78}$ |
| 7366 | $L_{A51}$ | $L_{B78}$ |
| 7367 | $L_{A52}$ | $L_{B78}$ |
| 7368 | $L_{A53}$ | $L_{B78}$ |
| 7369 | $L_{A54}$ | $L_{B78}$ |
| 7370 | $L_{A55}$ | $L_{B78}$ |
| 7371 | $L_{A56}$ | $L_{B78}$ |
| 7372 | $L_{A57}$ | $L_{B78}$ |
| 7373 | $L_{A58}$ | $L_{B78}$ |
| 7374 | $L_{A59}$ | $L_{B78}$ |
| 7375 | $L_{A60}$ | $L_{B78}$ |
| 7376 | $L_{A61}$ | $L_{B78}$ |
| 7411 | $L_{A1}$ | $L_{B79}$ |
| 7412 | $L_{A2}$ | $L_{B79}$ |
| 7413 | $L_{A3}$ | $L_{B79}$ |
| 7414 | $L_{A4}$ | $L_{B79}$ |
| 7415 | $L_{A5}$ | $L_{B79}$ |
| 7416 | $L_{A6}$ | $L_{B79}$ |
| 7417 | $L_{A7}$ | $L_{B79}$ |
| 7418 | $L_{A8}$ | $L_{B79}$ |
| 7419 | $L_{A9}$ | $L_{B79}$ |
| 7420 | $L_{A10}$ | $L_{B79}$ |
| 7421 | $L_{A11}$ | $L_{B79}$ |
| 7422 | $L_{A12}$ | $L_{B79}$ |
| 7423 | $L_{A13}$ | $L_{B79}$ |
| 7424 | $L_{A14}$ | $L_{B79}$ |
| 7425 | $L_{A15}$ | $L_{B79}$ |
| 7426 | $L_{A16}$ | $L_{B79}$ |
| 7448 | $L_{A38}$ | $L_{B79}$ |
| 7449 | $L_{A39}$ | $L_{B79}$ |
| 7450 | $L_{A40}$ | $L_{B79}$ |
| 7451 | $L_{A41}$ | $L_{B79}$ |
| 7452 | $L_{A42}$ | $L_{B79}$ |
| 7453 | $L_{A43}$ | $L_{B79}$ |
| 7454 | $L_{A44}$ | $L_{B79}$ |
| 7455 | $L_{A45}$ | $L_{B79}$ |

-continued

| Cpd # | $L_A$ | $L_B$ |
|---|---|---|
| 7456 | $L_{A46}$ | $L_{B79}$ |
| 7457 | $L_{A47}$ | $L_{B79}$ |
| 7458 | $L_{A48}$ | $L_{B79}$ |
| 7459 | $L_{A49}$ | $L_{B79}$ |
| 7460 | $L_{A50}$ | $L_{B79}$ |
| 7461 | $L_{A51}$ | $L_{B79}$ |
| 7462 | $L_{A52}$ | $L_{B79}$ |
| 7463 | $L_{A53}$ | $L_{B79}$ |
| 7464 | $L_{A54}$ | $L_{B79}$ |
| 7465 | $L_{A55}$ | $L_{B79}$ |
| 7466 | $L_{A56}$ | $L_{B79}$ |
| 7467 | $L_{A57}$ | $L_{B79}$ |
| 7468 | $L_{A58}$ | $L_{B79}$ |
| 7469 | $L_{A59}$ | $L_{B79}$ |
| 7470 | $L_{A60}$ | $L_{B79}$ |
| 7471 | $L_{A61}$ | $L_{B79}$ |
| 7506 | $L_{A1}$ | $L_{B80}$ |
| 7507 | $L_{A2}$ | $L_{B80}$ |
| 7508 | $L_{A3}$ | $L_{B80}$ |
| 7509 | $L_{A4}$ | $L_{B80}$ |
| 7510 | $L_{A5}$ | $L_{B80}$ |
| 7511 | $L_{A6}$ | $L_{B80}$ |
| 7512 | $L_{A7}$ | $L_{B80}$ |
| 7513 | $L_{A8}$ | $L_{B80}$ |
| 7514 | $L_{A9}$ | $L_{B80}$ |
| 7515 | $L_{A10}$ | $L_{B80}$ |
| 7516 | $L_{A11}$ | $L_{B80}$ |
| 7517 | $L_{A12}$ | $L_{B80}$ |
| 7518 | $L_{A13}$ | $L_{B80}$ |
| 7519 | $L_{A14}$ | $L_{B80}$ |
| 7520 | $L_{A15}$ | $L_{B80}$ |
| 7521 | $L_{A16}$ | $L_{B80}$ |
| 7543 | $L_{A38}$ | $L_{B80}$ |
| 7544 | $L_{A39}$ | $L_{B80}$ |
| 7545 | $L_{A40}$ | $L_{B80}$ |
| 7546 | $L_{A41}$ | $L_{B80}$ |
| 7547 | $L_{A42}$ | $L_{B80}$ |
| 7548 | $L_{A43}$ | $L_{B80}$ |
| 7549 | $L_{A44}$ | $L_{B80}$ |
| 7550 | $L_{A45}$ | $L_{B80}$ |
| 7551 | $L_{A46}$ | $L_{B80}$ |
| 7552 | $L_{A47}$ | $L_{B80}$ |
| 7553 | $L_{A48}$ | $L_{B80}$ |
| 7554 | $L_{A49}$ | $L_{B80}$ |
| 7555 | $L_{A50}$ | $L_{B80}$ |
| 7556 | $L_{A51}$ | $L_{B80}$ |
| 7557 | $L_{A52}$ | $L_{B80}$ |
| 7558 | $L_{A53}$ | $L_{B80}$ |
| 7559 | $L_{A54}$ | $L_{B80}$ |
| 7560 | $L_{A55}$ | $L_{B80}$ |
| 7561 | $L_{A56}$ | $L_{B80}$ |
| 7562 | $L_{A57}$ | $L_{B80}$ |
| 7563 | $L_{A58}$ | $L_{B80}$ |
| 7564 | $L_{A59}$ | $L_{B80}$ |
| 7565 | $L_{A60}$ | $L_{B80}$ |
| 7566 | $L_{A61}$ | $L_{B80}$ |
| 7601 | $L_{A1}$ | $L_{B81}$ |
| 7602 | $L_{A2}$ | $L_{B81}$ |
| 7603 | $L_{A3}$ | $L_{B81}$ |
| 7604 | $L_{A4}$ | $L_{B81}$ |
| 7605 | $L_{A5}$ | $L_{B81}$ |
| 7606 | $L_{A6}$ | $L_{B81}$ |
| 7607 | $L_{A7}$ | $L_{B81}$ |
| 7608 | $L_{A8}$ | $L_{B81}$ |
| 7609 | $L_{A9}$ | $L_{B81}$ |
| 7610 | $L_{A10}$ | $L_{B81}$ |
| 7611 | $L_{A11}$ | $L_{B81}$ |
| 7612 | $L_{A12}$ | $L_{B81}$ |
| 7613 | $L_{A13}$ | $L_{B81}$ |
| 7614 | $L_{A14}$ | $L_{B81}$ |
| 7615 | $L_{A15}$ | $L_{B81}$ |
| 7616 | $L_{A16}$ | $L_{B81}$ |
| 7638 | $L_{A38}$ | $L_{B81}$ |
| 7639 | $L_{A39}$ | $L_{B81}$ |
| 7640 | $L_{A40}$ | $L_{B81}$ |
| 7641 | $L_{A41}$ | $L_{B81}$ |
| 7642 | $L_{A42}$ | $L_{B81}$ |

-continued

| Cpd # | $L_A$ | $L_B$ |
|---|---|---|
| 7643 | $L_{A43}$ | $L_{B81}$ |
| 7644 | $L_{A44}$ | $L_{B81}$ |
| 7645 | $L_{A45}$ | $L_{B81}$ |
| 7646 | $L_{A46}$ | $L_{B81}$ |
| 7647 | $L_{A47}$ | $L_{B81}$ |
| 7648 | $L_{A48}$ | $L_{B81}$ |
| 7649 | $L_{A49}$ | $L_{B81}$ |
| 7650 | $L_{A50}$ | $L_{B81}$ |
| 7651 | $L_{A51}$ | $L_{B81}$ |
| 7652 | $L_{A52}$ | $L_{B81}$ |
| 7653 | $L_{A53}$ | $L_{B81}$ |
| 7654 | $L_{A54}$ | $L_{B81}$ |
| 7655 | $L_{A55}$ | $L_{B81}$ |
| 7656 | $L_{A56}$ | $L_{B81}$ |
| 7657 | $L_{A57}$ | $L_{B81}$ |
| 7658 | $L_{A58}$ | $L_{B81}$ |
| 7659 | $L_{A59}$ | $L_{B81}$ |
| 7660 | $L_{A60}$ | $L_{B81}$ |
| 7661 | $L_{A61}$ | $L_{B81}$ |
| 7696 | $L_{A1}$ | $L_{B82}$ |
| 7697 | $L_{A2}$ | $L_{B82}$ |
| 7698 | $L_{A3}$ | $L_{B82}$ |
| 7699 | $L_{A4}$ | $L_{B82}$ |
| 7700 | $L_{A5}$ | $L_{B82}$ |
| 7701 | $L_{A6}$ | $L_{B82}$ |
| 7702 | $L_{A7}$ | $L_{B82}$ |
| 7703 | $L_{A8}$ | $L_{B82}$ |
| 7704 | $L_{A9}$ | $L_{B82}$ |
| 7705 | $L_{A10}$ | $L_{B82}$ |
| 7706 | $L_{A11}$ | $L_{B82}$ |
| 7707 | $L_{A12}$ | $L_{B82}$ |
| 7708 | $L_{A13}$ | $L_{B82}$ |
| 7709 | $L_{A14}$ | $L_{B82}$ |
| 7710 | $L_{A15}$ | $L_{B82}$ |
| 7711 | $L_{A16}$ | $L_{B82}$ |
| 7733 | $L_{A38}$ | $L_{B82}$ |
| 7734 | $L_{A39}$ | $L_{B82}$ |
| 7735 | $L_{A40}$ | $L_{B82}$ |
| 7736 | $L_{A41}$ | $L_{B82}$ |
| 7737 | $L_{A42}$ | $L_{B82}$ |
| 7738 | $L_{A43}$ | $L_{B82}$ |
| 7739 | $L_{A44}$ | $L_{B82}$ |
| 7740 | $L_{A45}$ | $L_{B82}$ |
| 7741 | $L_{A46}$ | $L_{B82}$ |
| 7742 | $L_{A47}$ | $L_{B82}$ |
| 7743 | $L_{A48}$ | $L_{B82}$ |
| 7744 | $L_{A49}$ | $L_{B82}$ |
| 7745 | $L_{A50}$ | $L_{B82}$ |
| 7746 | $L_{A51}$ | $L_{B82}$ |
| 7747 | $L_{A52}$ | $L_{B82}$ |
| 7748 | $L_{A53}$ | $L_{B82}$ |
| 7749 | $L_{A54}$ | $L_{B82}$ |
| 7750 | $L_{A55}$ | $L_{B82}$ |
| 7751 | $L_{A56}$ | $L_{B82}$ |
| 7752 | $L_{A57}$ | $L_{B82}$ |
| 7753 | $L_{A58}$ | $L_{B82}$ |
| 7754 | $L_{A59}$ | $L_{B82}$ |
| 7755 | $L_{A60}$ | $L_{B82}$ |
| 7756 | $L_{A61}$ | $L_{B82}$ |
| 8076 | $L_{A1}$ | $L_{B86}$ |
| 8077 | $L_{A2}$ | $L_{B86}$ |
| 8078 | $L_{A3}$ | $L_{B86}$ |
| 8079 | $L_{A4}$ | $L_{B86}$ |
| 8080 | $L_{A5}$ | $L_{B86}$ |
| 8081 | $L_{A6}$ | $L_{B86}$ |
| 8082 | $L_{A7}$ | $L_{B86}$ |
| 8083 | $L_{A8}$ | $L_{B86}$ |
| 8084 | $L_{A9}$ | $L_{B86}$ |
| 8085 | $L_{A10}$ | $L_{B86}$ |
| 8086 | $L_{A11}$ | $L_{B86}$ |
| 8087 | $L_{A12}$ | $L_{B86}$ |
| 8088 | $L_{A13}$ | $L_{B86}$ |
| 8089 | $L_{A14}$ | $L_{B86}$ |
| 8090 | $L_{A15}$ | $L_{B86}$ |
| 8091 | $L_{A16}$ | $L_{B86}$ |
| 8113 | $L_{A38}$ | $L_{B86}$ |
| 8114 | $L_{A39}$ | $L_{B86}$ |

-continued

| Cpd # | $L_A$ | $L_B$ |
|---|---|---|
| 8115 | $L_{A40}$ | $L_{B86}$ |
| 8116 | $L_{A41}$ | $L_{B86}$ |
| 8117 | $L_{A42}$ | $L_{B86}$ |
| 8118 | $L_{A43}$ | $L_{B86}$ |
| 8119 | $L_{A44}$ | $L_{B86}$ |
| 8120 | $L_{A45}$ | $L_{B86}$ |
| 8121 | $L_{A46}$ | $L_{B86}$ |
| 8122 | $L_{A47}$ | $L_{B86}$ |
| 8123 | $L_{A48}$ | $L_{B86}$ |
| 8124 | $L_{A49}$ | $L_{B86}$ |
| 8125 | $L_{A50}$ | $L_{B86}$ |
| 8126 | $L_{A51}$ | $L_{B86}$ |
| 8127 | $L_{A52}$ | $L_{B86}$ |
| 8128 | $L_{A53}$ | $L_{B86}$ |
| 8129 | $L_{A54}$ | $L_{B86}$ |
| 8130 | $L_{A55}$ | $L_{B86}$ |
| 8131 | $L_{A56}$ | $L_{B86}$ |
| 8132 | $L_{A57}$ | $L_{B86}$ |
| 8133 | $L_{A58}$ | $L_{B86}$ |
| 8134 | $L_{A59}$ | $L_{B86}$ |
| 8135 | $L_{A60}$ | $L_{B86}$ |
| 8136 | $L_{A61}$ | $L_{B86}$. |

9. The compound of claim 1, wherein each of $X^3$ and $X^4$ is an imidazole derived carbene neutral carbon.

10. The compound of claim 1, wherein each of $X^3$ and $X^5$ is an imidazole derived carbene neutral carbon.

11. The compound of claim 10, wherein $X^4$ is a neutral nitrogen is an $sp^2$ nitrogen atom of an N-heterocyclic ring selected from the group consisting of pyridine, pyrimidine, imidazole, benzoimidazole, pyrazole, oxazole, and triazole; and wherein each of $X^1$ and $X^2$ is an imidazole derived carbene neutral carbon.

12. A first device comprising a first organic light emitting device, the first organic light emitting device comprising:

an anode;

a cathode; and an organic layer, disposed between the anode and the cathode, comprising a compound having a formula $Re(L_A)(L_B)$:

wherein Re is a Rhenium(I) metal;

wherein $L_A$ is a monoanionic tridentate ligand having a formula selected from the group

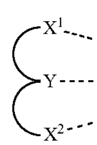

and

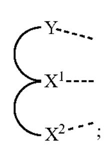

wherein $L_B$ is a neutral tridentate ligand having a formula

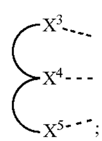

wherein $X^1$, $X^2$, $X^3$, $X^4$, and $X^5$ are each independently a neutral coordinating atom selected from the group consisting of carbon, phosphorus, and nitrogen;

wherein at least one of $X^1$, $X^2$, $X^3$, $X^4$, and $X^5$ is an imidazole derived carbene neutral carbon;

wherein Y is a monoanionic coordinating atom selected from the group consisting of carbon, oxygen, sulfur, and nitrogen;

wherein the dash lines show the connection points to Re; and wherein $L_A$ and $L_B$ are optionally linked together to form a hexadentate ligand.

13. The first device of claim 12, wherein the organic layer is an emissive layer and the compound is an emissive dopant.

14. The first device of claim 12, wherein the organic layer is an emissive layer and the compound is a non-emissive dopant.

15. The first device of claim 12, wherein the organic layer is a charge transporting layer and the compound is a charge transporting material in the organic layer.

16. The first device of claim 12, wherein the organic layer is a charge injecting layer and the compound is a charge injecting material in the organic layer.

17. The first device of claim 12, wherein the organic layer is a blocking layer and the compound is a blocking material in the organic layer.

18. The first device of claim 12, wherein the organic layer further comprises a host material.

19. The first device of claim 18, wherein the host material comprises a triphenylene containing benzo-fused thiophene or benzo-fused furan;

wherein any substituent in the host material is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}CC_nH_{2n+1}$, $Ar_1$, $Ar_1$-$Ar_2$, $C_nH_{2n}$-$Ar_1$, or no substitution;

wherein n is from 1 to 10; and wherein $Ar_1$ and $Ar_2$ are independently selected from the group consisting of benzene, biphenyl, naphthalene, triphenylene, carbazole, and heteroaromatic analogs thereof.

20. A formulation comprising a compound having the formula $Re(L_A)(L_B)$:

wherein Re is a Rhenium(I) metal;

wherein $L_A$ is a monoanionic tridentate ligand having a formula selected from the group consisting of

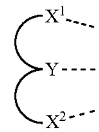

and

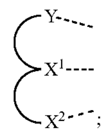

;

wherein $L_B$ is a neutral tridentate ligand having a formula

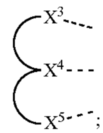

;

wherein $X^1$, $X^2$, $X^3$, $X^4$, and $X^5$ are each independently a neutral coordinating atom selected from the group consisting of carbon, phosphorus, and nitrogen;

wherein at least one of $X^1$, $X^2$, $X^3$, $X^4$, and $X^5$ is an imidazole derived carbene neutral carbon;

wherein Y is a monoanionic coordinating atom selected from the group consisting of carbon, oxygen, sulfur, and nitrogen;

wherein the dash lines show the connection points to Re; and wherein $L_A$ and $L_B$ are optionally linked together to form a hexadentate ligand.

* * * * *